US012735638B2

(12) United States Patent
Seifermann et al.

(10) Patent No.: US 12,735,638 B2
(45) **Date of Patent: *Sep. 15, 2026**

(54) ORGANIC MOLECULES IN PARTICULAR FOR USE IN OPTOELECTRONIC DEVICES

(71) Applicant: Samsung Display Co., LTD., Yongin-si (KR)

(72) Inventors: Stefan Seifermann, Buehl (DE); Harald Fluegge, Karlsruhe (DE); Sandra Bonus, Cologne (DE)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/418,076

(22) Filed: Jan. 19, 2024

(65) Prior Publication Data

US 2024/0188426 A1 Jun. 6, 2024

Related U.S. Application Data

(63) Continuation of application No. 16/936,494, filed on Jul. 23, 2020, now Pat. No. 11,944,005.

(30) Foreign Application Priority Data

Jul. 30, 2019 (EP) .................................... 19189024

(51) Int. Cl.

| | |
|---|---|
| ***H10K 85/60*** | (2023.01) |
| ***C07F 5/02*** | (2006.01) |
| ***C09K 11/06*** | (2006.01) |
| *H10K 50/11* | (2023.01) |
| *H10K 101/20* | (2023.01) |
| *H10K 101/30* | (2023.01) |

(52) U.S. Cl.

CPC .............. *C09K 11/06* (2013.01); *C07F 5/027* (2013.01); *H10K 85/654* (2023.02); *H10K 85/6572* (2023.02); *H10K 85/658* (2023.02); *C09K 2211/1007* (2013.01); *C09K 2211/1018* (2013.01); *H10K 50/11* (2023.02); *H10K 2101/20* (2023.02); *H10K 2101/30* (2023.02)

(58) Field of Classification Search

CPC ........................... H10K 85/322; H10K 85/658

See application file for complete search history.

(56) References Cited

U.S. PATENT DOCUMENTS 7,829,204 B2 * 11/2010 Iwakuma ............... H05B 33/14 548/440
11,165,035 B2 11/2021 Liaptsis et al.
11,462,692 B2 10/2022 Fluegge et al.
11,545,632 B2 1/2023 Seifermann
11,683,978 B2 * 6/2023 Dück ..................... C09K 11/06 428/690
11,944,005 B2 * 3/2024 Seifermann .......... H10K 85/658
2015/0236274 A1 * 8/2015 Hatakeyama ........ H10K 85/631 548/405
2017/0183360 A1 6/2017 Ishii et al.
2018/0062085 A1 * 3/2018 Bergmann ......... H10K 85/6572
2018/0301629 A1 10/2018 Hatakeyama et al.
2019/0378982 A1 12/2019 He et al.
2020/0035922 A1 1/2020 Ogiwara et al.
2020/0176679 A1 6/2020 Jeong et al.
2020/0203617 A1 6/2020 Duan et al.
2020/0203651 A1 6/2020 Duan et al.
2020/0203652 A1 6/2020 Duan et al.
2020/0303662 A1 9/2020 Seifermann
2020/0347081 A1 * 11/2020 Gao ..................... H10K 85/657

(Continued)

FOREIGN PATENT DOCUMENTS

CN 108358905 A 8/2018
CN 109192874 A 1/2019

(Continued)

OTHER PUBLICATIONS

M. Colella et al., 10 ACS Applied Materials & Interfaces, 40001-40007 (2018) (Year: 2018).*
F. Dias et al., 5 Methods and Applications in Fluorescence, 1-25 (2017) (Year: 2017).*
M. Mamada et al., 3 ACS Central Science, 769-777 (2017) (Year: 2017).*
H. Uoyama et al., 492 Nature (2012) (Year: 2012).*
A. Arjona-Esteban et al., Chapter 15, Status and next steps of TADF technology: An industrial perspective, in Highly Efficient OLEDS: Materials Based on Thermally Activated Delayed Fluorescence, 543-572 (2018) (Year: 2018).*
Chen et al., 9 The Journal of Physical Chemistry Letters, 5240-5245 (2018) (Year: 2018).*

(Continued)

*Primary Examiner* — Alexander R Pagano

(74) *Attorney, Agent, or Firm* — Womble Bond Dickinson (US) LLP

(57) ABSTRACT

The invention relates to an organic molecule, comprising or consisting of Formula A:

Formula A

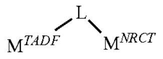

wherein $M^{TADF}$ represents a TADF moiety, $M^{NRCT}$ represents a near-range charge transfer (NRCT) emitter moiety, and L represents a divalent bridging unit that links $M^{TADF}$ and $M^{NRCT}$ and is linked to $M^{TADF}$ and to $M^{NRCT}$ via a single bond each. Furthermore, the present invention relates to the use of such organic molecule as a luminescent emitter in an optoelectronic device.

19 Claims, No Drawings

(56) References Cited

U.S. PATENT DOCUMENTS

| | | | | |
|---|---|---|---|---|
| 2020/0361961 | A1 | 11/2020 | Zink et al. | |
| 2021/0013413 | A1* | 1/2021 | Dück | H10K 85/631 |
| 2021/0277026 | A1* | 9/2021 | Geum | C09K 11/06 |
| 2022/0052266 | A1 | 2/2022 | Li et al. | |
| 2023/0033974 | A1 | 2/2023 | Fluegge et al. | |
| 2023/0157169 | A1 | 5/2023 | Zink et al. | |

FOREIGN PATENT DOCUMENTS

| | | | | | |
|---|---|---|---|---|---|
| CN | 110003258 | A | * | 7/2019 | C09K 11/06 |
| EP | 2 182 040 | A2 | | 5/2010 | |
| EP | 3 109 253 | A1 | | 12/2016 | |
| EP | 19185839 | A | * | 7/2019 | |
| JP | 2017126606 | A | * | 7/2017 | |
| JP | 2018-061029 | A | | 4/2018 | |
| KR | 10-1876763 | B1 | | 7/2018 | |
| KR | 1020180085936 | | * | 7/2018 | |
| WO | WO 2018/095394 | A1 | | 5/2018 | |
| WO | WO 2018/181188 | A1 | | 10/2018 | |
| WO | WO-2019002355 | A1 | * | 1/2019 | C07D 401/14 |
| WO | WO 2019/052939 | A1 | | 3/2019 | |
| WO | WO 2019/120125 | A1 | | 6/2019 | |
| WO | WO 2020/022770 | A1 | | 1/2020 | |
| WO | WO 2021/008374 | A1 | | 1/2021 | |

OTHER PUBLICATIONS

J. Lakowicz, Instrumentation for fluorescence spectroscopy, in Principles of fluorescence spectroscopy, 25-61 (1999) (Year: 1999).*

Hatakeyama, Takuji et al.; "Ultrapure Blue Thermally Activated Delayed Fluorescence Molecules: Efficient HOMO-LUMO Separation by the Multiple Resonance Effect"; Adv. Mater.; 2016; 28(14); pp. 2777-2781.

Liang, Xiao et al.; "Peripheral Amplification of Multi-Resonance Induced Thermally Activated Delayed Fluorescence for Highly Efficient OLEDs"; Angew. Chem. Int. Ed.; 2018; 57(35); pp. 11316-11320.

Okinaka, Keiji et al.; New Fluorescent Blue Host Materials for Achieving Low Voltage in OLEDs; SID 2015 Digest; pp. 312-315.

* cited by examiner

ORGANIC MOLECULES IN PARTICULAR FOR USE IN OPTOELECTRONIC DEVICES

CROSS REFERENCE TO RELATED APPLICATIONS

This application is a continuation of U.S. patent application Ser. No. 16/936,494, filed Jul. 23, 2020, which claims the priority to and benefit of European Patent Application No. 19189024.3, filed Jul. 30, 2019, the contents of both of which are hereby included by reference.

BACKGROUND

1. Field

The invention relates to light-emitting organic molecules and their use in organic light-emitting diodes (OLEDs) and in other optoelectronic devices.

2. Description of the Related Art

Organic electroluminescent devices containing one or more light-emitting layers based on organics such as, e.g., organic light emitting diodes (OLEDs), light emitting electrochemical cells (LECs) and light-emitting transistors gain increasing importance. In particular, OLEDs are promising devices for electronic products such as e.g. screens, displays and illumination devices. In contrast to most electroluminescent devices essentially based on inorganics, organic electroluminescent devices based on organics are often rather flexible and producible in particularly thin layers. The OLED-based screens and displays already available today bear particularly beneficial brilliant colors, contrasts and are comparably efficient with respect to their energy consumption.

A central element of an organic electroluminescent device for generating light is a light-emitting layer placed between an anode and a cathode. When a voltage (and current) is applied to an organic electroluminescent device, holes and electrons are injected from an anode and a cathode, respectively, to the light-emitting layer. Typically, a hole transport layer is located between light-emitting layer and the anode, and an electron transport layer is located between light-emitting layer and the cathode. The different layers are sequentially disposed. Excitons of high energy are then generated by recombination of the holes and the electrons. The decay of such excited states (e.g., singlet states such as S1 and/or triplet states such as T1) to the ground state (S0) desirably leads to light emission.

In order to enable efficient energy transport and emission, an organic electroluminescent device comprises one or more host compounds and one or more emitter compounds as dopants. Challenges when generating organic electroluminescent devices are thus the improvement of the illumination level of the devices (i.e., brightness per current), obtaining a desired light spectrum and achieving suitable (long) lifespans.

There is still a need for efficient and stable OLEDs, in particular efficient and stable OLEDs that emit in the blue region of the visible light spectrum, which would be expressed by a small CIEy value. Accordingly, there is still the unmet technical need for organic electroluminescent devices which have a long lifetime and high quantum yields, in particular in the blue range.

Exciton-polaron interaction (triplet-polaron and singlet-polaron interaction) as well as exciton-exciton interaction (singlet-singlet, triplet-singlet, and triplet-triplet interaction) are major pathways for device degradation. Degradation pathways such as triplet-triplet annihilation (TTA) and triplet-polaron quenching (TPQ) are of particular interest for blue emitting devices, as high energy states are generated. In particular, charged emitter molecules are prone to high energy excitons and/or polarons.

A suitable way to avoid the described degradation pathways and to enable an efficient energy transfer within the emission layer are the so-called "Hyper-" approaches, in which a TADF material is employed to up-convert triplet excitons to singlet excitons, which are then transferred to the emitter, which emits light upon the decay of the singlet excited states to the ground state. As singlet emitters e.g. fluorescence emitters (Hyper-fluorescence), NRCT emitters (Hyper-NRCT) or TADF emitters (Hyper-TADF) can be employed.

The efficiencies and lifetimes of OLEDs employing "Hyper-" approaches available in the state of the art are limited due to several factors. To ensure efficient energy transfer, the radiation-free transfer of singlet excitons from the TADF material to the singlet emitter a sufficient, called Forster Resonance Energy Transfer (FRET), has to be realized. The FRET rate strongly depends on the distance between the TADF material and the singlet emitter and the so-called Forster radius. The Förster radius strongly depends on the emission wavelength of the singlet-exciton-donating molecule and decreases with shorter, i.e. blue-shifted, wavelength. A known way to ensure efficient Forster transfer in Hyper-systems is to increase the concentration of either the singlet emitter or the singlet-exciton-donating TADF material (FRET-donor) in the emission layer to increase the probability that a singlet emitter is located within the Forster radius of the singlet-exciton-donating TADF material. Increasing the singlet emitter, in particular the fluorescence or NRCT, concentration leads to π-stacking and/or exciplex formation of the singlet emitter resulting in emission shifting and/or broadening. In addition, with increasing concentration, the charges, in particular holes, are more likely to get trapped on the singlet emitter causing stress and potentially leading to degradation, e.g. hole trapping can lead to undesired direct charge recombination on the emitter acting as a trap. In addition, increasing the singlet emitter concentration leads to losses in efficiency due to quenching.

Analogously, increasing the TADF material concentration leads to losses in efficiency due to quenching. In addition, in case of higher concentrations triplet excitons can be transferred from the TADF material to the singlet emitter (Dexter transfer) before these are up-converted to singlet-excitons by the TADF material. Triplet excitons on the singlet emitter may decay without emission or be up-converted via a less efficient mechanism than TADF (e.g. triplet-triplet annihilation, TTA), in case the singlet emitter is a fluorescence emitter, which will result in reduced efficiency. On the other hand, NRCT emitters are more prone to degradation by triplet excitons compared to TADF materials.

Surprisingly, it has been found that the organic molecules according to the invention, which combine a thermally activated delayed fluorescence (TADF) material moiety and a NRCT emitter moiety $M^{NRCT}$ in one molecule, exhibit the advantageous effects without the described limitations of the Hyper-NRCT approach. The TADF moiety $M^{TADF}$ and the NRCT emitter moiety $M^{NRCT}$ are bridged via a bridging unit L, which is chosen to enable a sufficient FRET from the TADF moiety to the NRCT emitter moiety $M^{NRCT}$ while inhibiting undesired Dexter transfer and, at the same time, leaving both the TADF properties of $M^{TADF}$ and the NRCT properties of $M^{NRCT}$ intact. Consequently, an emission layer comprising the organic molecules according to the invention provides an organic electroluminescent device having good lifetime and quantum yields and exhibiting blue emission.

One further advantageous effect of the molecules according to the invention is the reduced number of molecules to be processed during the production of an organic electroluminescent device, such as an OLED display, employing the Hyper-NRCT approach, as both the TADF and the NRCT function are combined in one molecule. In an evaporation process, the number of sources and complexity in the regulation of evaporation rates can thus advantageously be reduced.

According to the present invention, the organic molecules preferably exhibit emission maxima in the blue, sky-blue or green spectral range. The organic molecules exhibit in particular emission maxima between 420 nm and 520 nm, preferably between 440 nm and 495 nm, more preferably between 450 nm and 470 nm. The photoluminescence quantum yields of the organic molecules according to the invention are, in particular, 60% or more.

The organic light-emitting molecules according to the invention consist of a structure according to Formula A:

Formula A

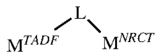

$M^{TADF}$ represents a TADF moiety.

$M^{NRCT}$ represents a near-range charge transfer (NRCT) emitter moiety.

L represents a divalent bridging unit that links $M^{TADF}$ and $M^{NRCT}$ and is linked to $M^{TADF}$ and to $M^{NRCT}$ via a single bond each.

Selection Criteria:

Preferably, the combination of TADF moiety $M^{TADF}$ and NRCT emitter moiety $M^{NRCT}$ should be chosen to meet the following criteria:

Equation 1 is met (emission maxima relation):

$$\lambda_{max}(TADF)<\lambda_{max}(NRCT) \quad \text{Equation 1}$$

$\lambda_{max}$(TADF) represents the emission maximum of the spectrum of a poly(methyl methacrylate) (PMMA) film with 10% by weight of the isolated; i.e. the substituent which represents the binding site of the single bond connecting the TADF moiety $M^{TADF}$ and bridging unit L of $M^{TADF}$ is replaced by a hydrogen (H) substituent; TADF material ($M^{TADF}$-H). All $\lambda_{max}$ are given in nanometers.

$\lambda_{max}$(NRCT) represents the emission maximum of the spectrum of a PMMA film with 10% by weight of the isolated; i.e. the substituent which represents the binding site of the single bond connecting $M^{NRCT}$ and bridging unit L of $M^{NRCT}$ is replaced by a hydrogen (H) substituent; NRCT material ($M^{NRCT}$-H).

Spectral Overlap of TADF Emission and NRCT Absorption:

$M^{TADF}$ and $M^{NRCT}$ are chosen to give a maximum resonance. The resonance between $M^{TADF}$ and $M^{NRCT}$ is represented by the spectral overlap integral:

$$J=\int_0^\infty f(\lambda)\in(\lambda)\lambda_{max}^4(TADF)d\lambda$$

wherein f(λ) is the normalized emission spectrum F(λ) of the isolated TADF material:

$$f(\lambda)=F(\lambda)/\int_0^\infty F(\lambda)d\lambda$$

ε(a) is the molar extinction coefficient of the isolated NRCT material.

The Bridging Unit L:

The bridging unit L is chosen to enable sufficient FRET between $M^{TADF}$ and $M^{NRCT}$ while inhibiting undesired Dexter transfer. The FRET rate depends on the distance between the singlet exciton donor, i.e. $M^{TADF}$, and the singlet exciton acceptor, i.e. $M^{NRCT}$, to the inverse of the power of six. The Dexter transfer rate exponentially decays with the distance between the singlet exciton donor, i.e. the TADF moiety $M^{TADF}$, and the singlet exciton acceptor, i.e. the NRCT emitter moiety. The length of the bridging unit L thus should be chosen to provide a distance between the $M^{TADF}$ and $M^{NRCT}$ that minimizes the ratio of Dexter transfer rate to FRET rate.

In one embodiment of the invention, L comprises or consists of one or more consecutively linked divalent moieties selected from the group consisting of:

$C_6$-$C_{60}$-arylene, which is optionally substituted with one or more substituents $R^L$;

$C_3$-$C_{57}$-heteroarylene, which is optionally substituted with one or more substituents $R^L$;

$R^LSi(R^L_2)$;

$Si(R^L_2)R^L$;

$Si(R^L_2)$; and $R^LSi(R^L_2)R^L$;

wherein $R^L$ is at each occurrence independently from another selected from the group consisting of:

Ph, which is optionally substituted with one or more substituents independently from each other selected from the group consisting of $C_1$-$C_4$ alkyl, $C_1$-$C_4$ haloalkyl, CN, $CF_3$ and Ph;

$C_1$-$C_4$ alkyl, $C_1$-$C_4$ haloalkyl, CN, $CF_3$ or Ph;

pyridinyl or pyridinylene, which is optionally substituted with one or more substituents independently from each other selected from the group consisting of $C_1$-$C_4$ alkyl, $C_1$-$C_4$ haloalkyl, CN, $CF_3$ or Ph;

pyrimidinyl or pyrimidinylene, which is optionally substituted with one or more substituents independently from each other selected from the group consisting of $C_1$-$C_4$ alkyl, $C_1$-$C_4$ haloalkyl, CN, $CF_3$ and Ph;

carbazolyl or carbazolylene, which is optionally substituted with one or more substituents independently from each other selected from the group consisting of $C_1$-$C_4$ alkyl, $C_1$-$C_4$ haloalkyl, CN, $CF_3$ and Ph;

triazinyl or triazinylene, which is optionally substituted with one or more substituents independently from each other selected from the group consisting of Me, $C_1$-$C_4$ alkyl, $C_1$-$C_4$ haloalkyl, CN, $CF_3$ and Ph; and $N(Ph)_2$.

In one embodiment of the invention, L is selected from the group consisting of:

$C_6$-$C_{60}$-arylene, which is optionally substituted with one or more substituents $R^L$;

$C_3$-$C_{57}$-heteroarylene, which is optionally substituted with one or more substituents $R^L$;

$C_6$-$C_{60}$-arylene-$C_3$-$C_{57}$-heteroarylene, which is optionally substituted with one or more substituents $R^L$;

$C_3$-$C_{57}$-heteroarylene-$C_6$-$C_{60}$-arylene, which is optionally substituted with one or more substituents $R^L$;

$C_6$-$C_{60}$-arylene-$C_6$-$C_{60}$-arylene, which is optionally substituted with one or more substituents $R^L$;

$C_3$-$C_{57}$-heteroarylene-$C_3$-$C_{57}$-heteroarylene, which is optionally substituted with one or more substituents $R^L$;

$C_6$-$C_{60}$-arylene-$C_3$-$C_{57}$-heteroarylene-$C_6$-$C_{60}$-arylene, which is optionally substituted with one or more substituents $R^L$;

$C_3$-$C_{57}$-heteroarylene-$C_6$-$C_{60}$-arylene-$C_3$-$C_{57}$-heteroarylene, which is optionally substituted with one or more substituents $R^L$;

$C_6$-$C_{60}$-arylene-$C_6$-$C_{60}$-arylene-$C_6$-$C_{60}$-arylene, which is optionally substituted with one or more substituents $R^L$;

$C_3$-$C_{57}$-heteroarylene-$C_3$-$C_{57}$-heteroarylene-$C_3$-$C_{57}$-heteroarylene, which is optionally substituted with one or more substituents $R^L$;

$R^LSi(R^L_2)$;

$Si(R^L_2)R^L$;

$Si(R^L_2)$; and $R^LSi(R^L_2)R^L$—.

In this embodiment, $R^L$ is at each occurrence independently from another selected from the group consisting of:

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$ and Ph;

pyridinyl or pyridinylene, which is optionally substituted with one or more substituents independently from each other selected from the group consisting of Me, $^i$Pr, $^t$Bu, CN, $CF_3$ and Ph;

pyrimidinyl or pyrimidinylene, which is optionally substituted with one or more substituents independently from each other selected from the group consisting of Me, $^i$Pr, $^t$Bu, CN, $CF_3$ and Ph;

carbazolyl or carbazolylene, which is optionally substituted with one or more substituents independently from each other selected from the group consisting of Me, $^i$Pr, $^t$Bu, CN, $CF_3$ and Ph;

triazinyl or triazinylene, which is optionally substituted with one or more substituents independently from each other selected from the group consisting of Me, $^i$Pr, $^t$Bu, CN, $CF_3$, and Ph; and $N(Ph)_2$.

In one embodiment, L is selected from the group consisting of structures of Formula L1 to L46:

Formula L1

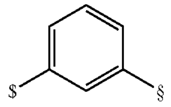

Formula L2

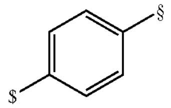

Formula L3

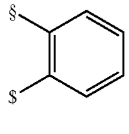

-continued

Formula L4

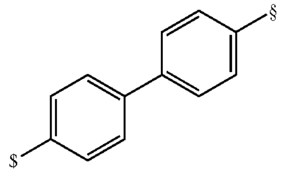

Formula L5

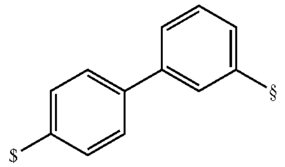

Formula L6

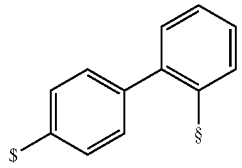

Formula L7

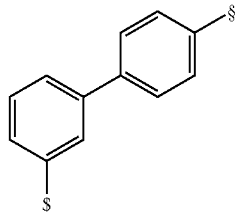

Formula L8

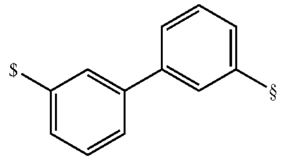

Formula L9

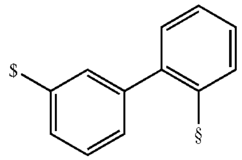

Formula L10

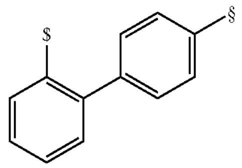

Formula L11

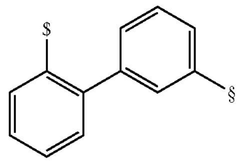

Formula L12

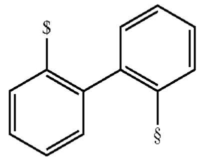

-continued
Formula L13
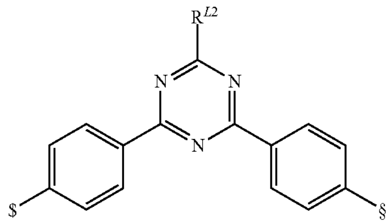
Formula L14
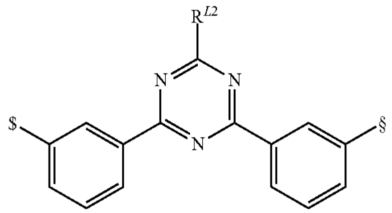
Formula L15
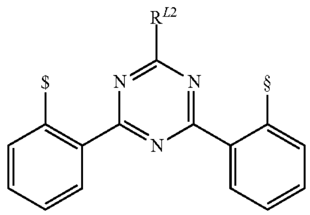
Formula L16
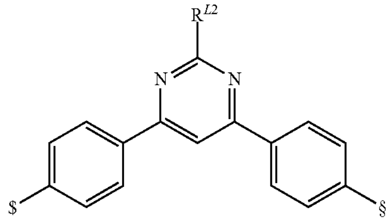
Formula L17
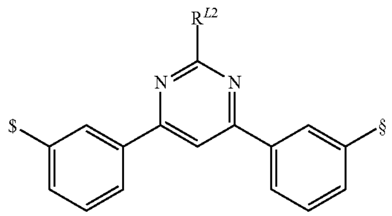
Formula L18
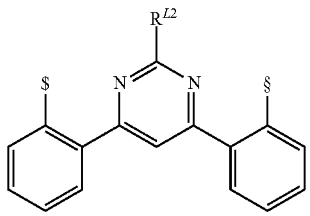
Formula L19
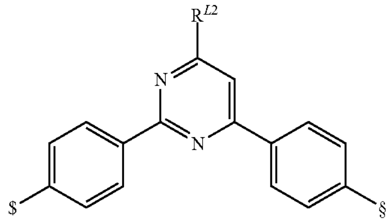
-continued
Formula L20
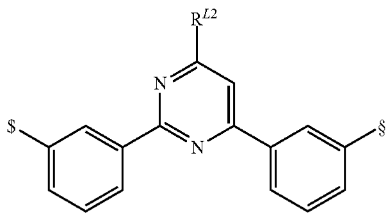
Formula L21
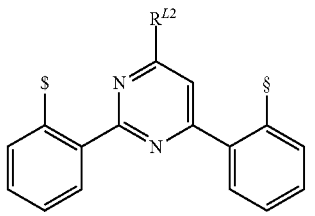
Formula L22
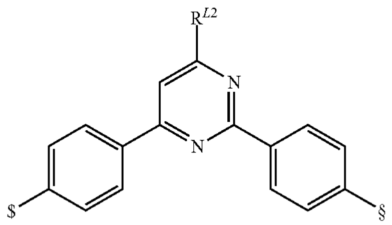
Formula L23
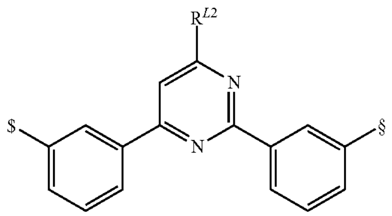
Formula L24
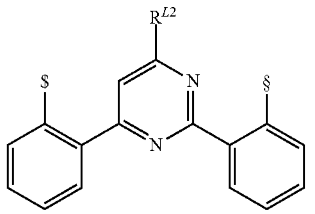
Formula L25
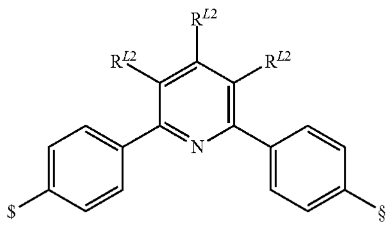
Formula L26
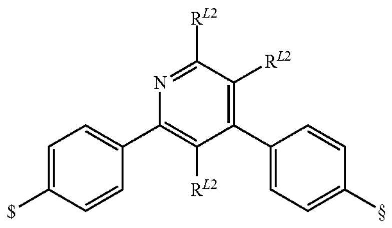

-continued
Formula L27
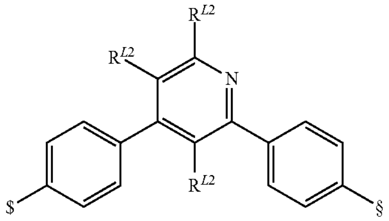
Formula L28
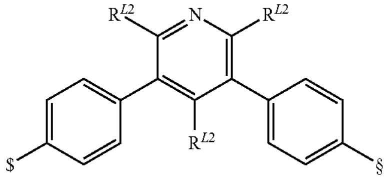
Formula L29
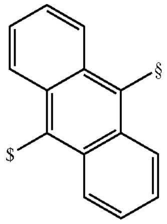
Formula L30
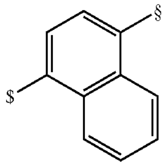
Formula L31
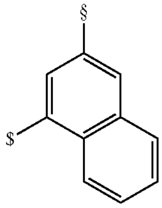
Formula L32
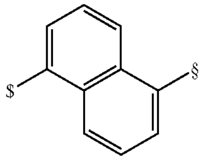
Formula L33
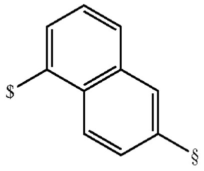
Formula L34
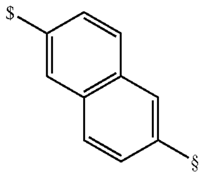
-continued
Formula L35
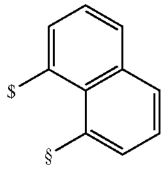
Formula L36
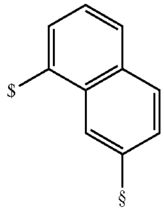
Formula L37
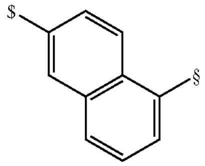
Formula L38
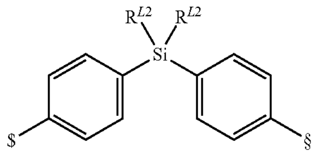
Formula L39
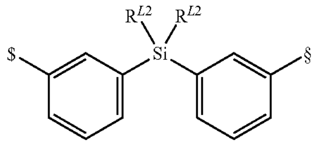
Formula L40
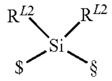
Formula L41
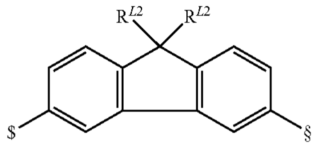
Formula L42
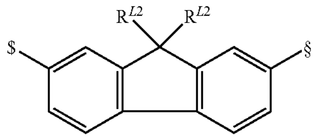
Formula L43
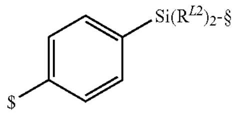
Formula L44
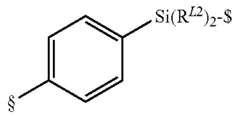

-continued

Formula L45

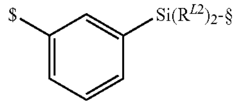

Formula L46

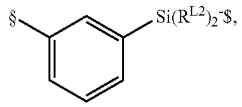

wherein $ represents the binding site of the single bond linking L and $M^{TADF}$.

§ represents the binding site of the single bond linking L and $M^{NRCT}$.

$R^{L}_{2}$ is at each occurrence independently selected from the group consisting of H, deuterium, Me, $^{t}$Bu, $^{i}$Pr, Ph and pyridyl.

In a further embodiment, L is selected from the group consisting of structures of Formula L1, L2, L4, L8, L12, L38, L39, L40, L43, L44, L45 or L46:

Formula L1

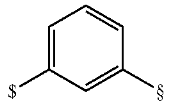

Formula L2

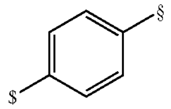

Formula L4

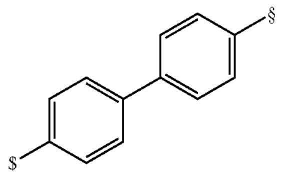

Formula L8

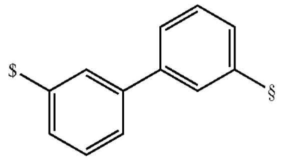

Formula L12

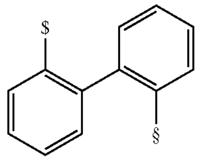

Formula L38

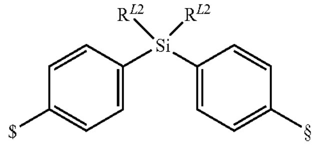

Formula L39

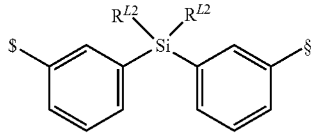

-continued

Formula L40

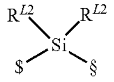

Formula L43

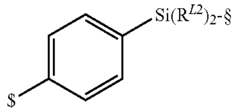

Formula L44

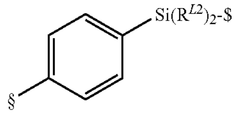

Formula L45

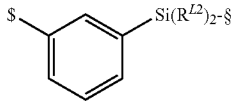

Formula L46

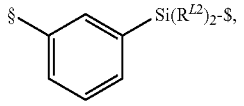

In a further embodiment, $R^{L}_{2}$ is at each occurrence independently selected from the group consisting of H, Me, $^{t}$Bu and Ph.

The NRCT emitter moiety $M^{NRCT}$:

The near-range-charge-transfer (NRCT) emitter moiety $M^{NRCT}$ is derived from a NRCT emitter. According to the invention, a NRCT emitter shows a delayed component in the time-resolved photoluminescence spectrum and exhibits a near-range HOMO-LUMO separation as described by Hatakeyama et al. (Advanced Materials, 2016, 28(14):2777-2781, DOI: 10.1002/adma.201505491). In one embodiment, the NRCT emitter moiety $M^{NRCT}$ is derived from a blue boron containing NRCT emitter.

In a preferred embodiment, the NRCT emitter moiety $M^{NRCT}$ is derived from comprises or consists of a polycyclic aromatic compound.

In a preferred embodiment, the small FWHM emitter $S^{B}$ comprises or consists of a polycyclic aromatic compound according to Formula NRCT I or a specific example described in US-A 2015/236274. US-A 2015/236274 also describes examples for synthesis of such compounds.

In one embodiment, NRCT emitter moiety $M^{NRCT}$ consists of a structure according to Formula NRCT I:

Formula NRCT I

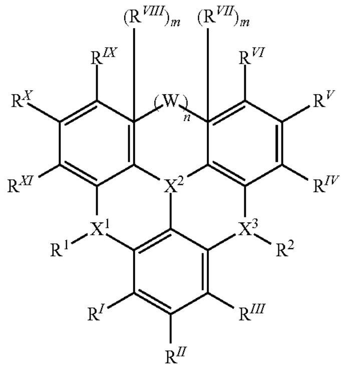

.

n is 0 or 1.

m=1-n.

$X^1$ is N or B.

$X^2$ is N or B.

$X^3$ is N or B.

W, if present, is selected from the group consisting of $Si(R^{NRCT3})_2$, $C(R^{NRCT3})_2$ and $BR^{NRCT3}$.

Each of $R^1$, $R^2$ and $R^{NRCT3}$ is independently from each other selected from the group consisting of:

$C_1$-$C_5$-alkyl, which is optionally substituted with one or more substituents $R^{NRCT6}$;

$C_6$-$C_{60}$-aryl, which is optionally substituted with one or more substituents $R^{NRCT6}$; and $C_3$-$C_{57}$-heteroaryl, which is optionally substituted with one or more substituents $R^{NRCT6}$, wherein at least one of $R^I$, $R^{II}$, $R^{III}$, $R^{IV}$, $R^V$, $R^{VI}$, $R^{VI}$, $R^{VII}$, $R^{IX}$, $R^X$, and $R^{XI}$ is a binding site of a single bond linking the NRCT emitter moiety $M^{NRCT}$ to the bridging unit L;

the further residues $R^I$, $R^{II}$, $R^{III}$, $R^{IV}$, $R^V$, $R^{VI}$, $R^{IX}$, $R^X$, and $R^{XI}$ and, as far as present, $R^{VII}$ and $R^{VIII}$, are each independently from another selected from the group consisting of:

a further binding site of a single bond linking the NRCT emitter moiety $M^{NRCT}$ to the bridging unit L, hydrogen (H), deuterium, $N(R^{NRCT5})_2$, $OR^{NRCT5}$, $Si(R^{NRCT5})_3$, $B(OR^{NRCT5})_2$, $OSO_2R^{NRCT5}$, $CF_3$,

CN, halogen, $C_1$-$C_{40}$-alkyl, which is optionally substituted with one or more substituents $R^{NRCT5}$ and wherein one $CH_2$-group or more than one non-adjacent $CH_2$-groups are each optionally substituted by $R^{NRCT5}C{=}CR^{NRCT5}$, C≡C, $Si(R^{NRCT5})_2$, $Ge(R^{NRCT5})_2$, $Sn(R^{NRCT5})_2$, C=O, C=S, C=Se, $C{=}NR^{NRCT5}$, $P({=}O)(R^{NRCT5})$, SO, $SO_2$, $NR^{NRCT5}$, O, S or $CONR^{NRCT5}$;

$C_1$-$C_{40}$-alkoxy, which is optionally substituted with one or more substituents $R^{NRCT5}$ and wherein one $CH_2$-group or more than one non-adjacent $CH_2$-groups are each optionally substituted by $R^{NRCT5}C{=}CR^{NRCT5}$, C≡C, $Si(R^{NRCT5})_2$, $Ge(R^{NRCT5})_2$, $Sn(R^{NRCT5})_2$, C=O, C=S, C=Se, $C{=}NR^{NRCT5}$, $P({=}O)(R^{NRCT5})$, SO, $SO_2$, $NR^{NRCT5}$, O, S or $CONR^{NRCT5}$;

$C_1$-$C_{40}$-thioalkoxy, which is optionally substituted with one or more substituents $R^{NRCT5}$ and wherein one $CH_2$-group or more than one non-adjacent $CH_2$-groups are each optionally substituted by $R^{NRCT5}C{=}CR^{NRCT5}$, GG, $Si(R^{NRCT5})_2$, $Ge(R^{NRCT5})_2$, $Sn(R^{NRCT5})_2$, C=O, C=S, C=Se, $C{=}NR^{NRCT5}$, $P({=}O)(R^{NRCT5})$, SO, $SO_2$, $NR^{NRCT5}$, O, S or $CONR^{NRCT5}$;

$C_2$-$C_{40}$-alkenyl, which is optionally substituted with one or more substituents $R^{NRCT5}$ and wherein one $CH_2$-group or more than one non-adjacent $CH_2$-groups are each optionally substituted by $R^{NRCT5}C{=}CR^{NRCT5}$, GG, $Si(R^{NRCT5})_2$, $Ge(R^{NRCT5})_2$, $Sn(R^{NRCT5})_2$, C=O, C=S, C=Se, $C{=}NR^{NRCT5}$, $P({=}O)(R^{NRCT5})$, SO, $SO_2$, $NR^{NRCT5}$, O, S or $CONR^{NRCT5}$;

$C_2$-$C_{40}$-alkynyl, which is optionally substituted with one or more substituents $R^{NRCT5}$ and wherein one $CH_2$-group or more than one non-adjacent $CH_2$-groups are each optionally substituted by $R^{NRCT5}C{=}CR^{NRCT5}$, GG, $Si(R^{NRCT5})_2$, $Ge(R^{NRCT5})_2$, $Sn(R^{NRCT5})_2$, C=O, C=S, C=Se, $C{=}NR^{NRCT5}$, $P({=}O)(R^{NRCT5})$, SO, $SO_2$, $NR^{NRCT5}$, O, S or $CONR^{NRCT5}$;

$C_6$-$C_{60}$-aryl, which is optionally substituted with one or more substituents $R^{NRCT5}$; and $C_3$-$C_{57}$-heteroaryl, which is optionally substituted with one or more substituents $R^{NRCT5}$.

$R^{NRCT5}$ is at each occurrence independently from another selected from the group consisting of: hydrogen, deuterium, OPh, $CF_3$, CN, F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)(C_6$-$C_{18}$-aryl$)$, $N(C_3$-$C_{17}$-heteroaryl$)(C_3$-$C_{17}$-heteroaryl$)$; and $N(C_3$-$C_{17}$-heteroaryl$)(C_6$-$C_{18}$-aryl$)$.

$R^{NRCT6}$ is at each occurrence independently from another selected from the group consisting of hydrogen, deuterium, OPh, $CF_3$, CN, F, the binding site of a single bond linking the NRCT emitter moiety $M^{NRCT}$ to the bridging unit L, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)(C_6$-$C_{18}$-aryl$)$, $N(C_3$-$C_{17}$-heteroaryl$)(C_3$-$C_{17}$-heteroaryl$)$; and $N(C_3$-$C_{17}$-heteroaryl$)(C_6$-$C_{18}$-aryl$)$.

According to this embodiment of the invention, two or more of the substituents selected from the group consisting of $R^1$, $R^2$, $R^I$, $R^{II}$, $R^{III}$, $R^{IV}$, $R^V$, $R^{VI}$, $R^{IX}$, $R^X$, and RXI and, as far as present, $R^{VII}$ and $R^{VIII}$ that are positioned adjacent to another may each form a mono- or polycyclic, (hetero) aliphatic, (hetero)aromatic and/or benzo-fused ring system with another, in particular $R^1$ and $R^{XI}$ may form a ring system and/or $R^2$ and $R^{IV}$ may form a ring system (thereby, for example, forming an unsubstituted or substituted carbazolene ring bound to the rest of Formula NRCT I via two single bonds each).

According to this embodiment of the invention, at least one of $X^1$, $X^2$ and $X^3$ is B and at least one of $X^1$, $X^2$ and $X^3$ is N.

According to this embodiment of the invention, exactly one more of the substituents selected from the group consisting of $R^{NRCT6}$, $R^I$, $R^{II}$, $R^{III}$, $R^{IV}$, $R^V$, $R^{VI}$, $R^{IX}$, $R^X$, and $R^{XI}$ and, as far as present, $R^{VII}$ and $R^{VIII}$ represents the binding site of a single bond linking the NRCT emitter moiety $M^{NRCT}$ to the bridging unit L.

In a particular embodiment, n=0 and $R^1$ and $R^{XI}$ may a ring system and $R^2$ and $R^{IV}$ may form a ring system yielding a structure according to Formula NRCT-Cbz:

Formula NRCT-Cbz

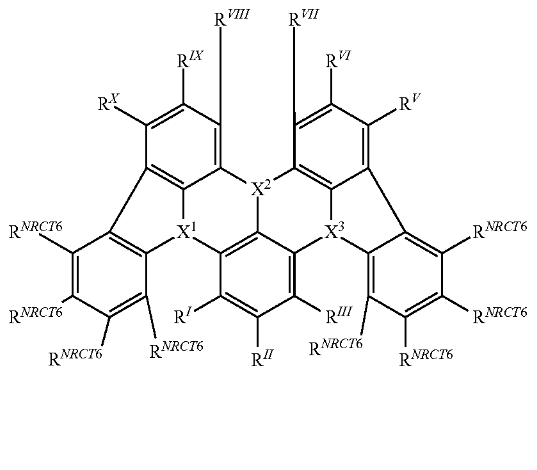

In one embodiment of the invention, $X^1$ and $X^3$ each are N and $X^2$ is B.

In one embodiment of the invention, $X^1$ and $X^3$ each are B and $X^2$ is N.

In a further embodiment of the invention, n=0.

In one embodiment of the invention, each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is independently from another selected from the group consisting of:

the binding site of the single bond linking the NRCT emitter moiety $M^{NRCT}$ to the bridging unit L;

hydrogen, deuterium, halogen,

Me, $^i$Pr, $^t$Bu,

CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$; and $R^1$ and $R^2$ is each independently from each other selected from the group consisting of:

$C_1$-$C_5$-alkyl, which is optionally substituted with one or more substituents $R^{NRCT6}$;

$C_6$-$C_{30}$-aryl, which is optionally substituted with one or more substituents $R^{NRCT6}$; and $C_5$-$C_{30}$-heteroaryl, which is optionally substituted with one or more substituents $R^{NRCT6}$;

And wherein the further residues such as $R^{NRCT6}$ are defined as defined in the context of Formula NRCT I.

According to this embodiment of the invention, exactly one more of the substituents selected from the group consisting of $R^{NRCT6}$, $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ represents the binding site of a single bond linking the NRCT emitter moiety $M^{NRCT}$ to the bridging unit L.

In one embodiment of the invention, $R^I$ or $R^{II}$ represents the binding site of the single bond linking the NRCT emitter moiety $M^{NRCT}$ to the bridging unit L.

In one embodiment of the invention, $R^I$ represents the binding site of the single bond linking the NRCT emitter moiety $M^{NRCT}$ to the bridging unit L.

In one embodiment of the invention, $R^{II}$ represents the binding site of the single bond linking the NRCT emitter moiety $M^{NRCT}$ to the bridging unit L.

In one embodiment, the NRCT emitter moiety $M^{NRCT}$ is derived, i.e. a hydrogen atom of one of the phenyl-rings in the core structure of the shown boron-containing NRCT emitter (i.e., a phenyl ring binding to B as well as to at least one N) is replaced by the binding site of the single bond linking the NRCT emitter moiety $M^{NRCT}$ to the bridging unit L; from a blue boron-containing NRCT emitter selected from the following group:

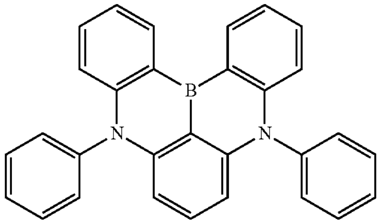

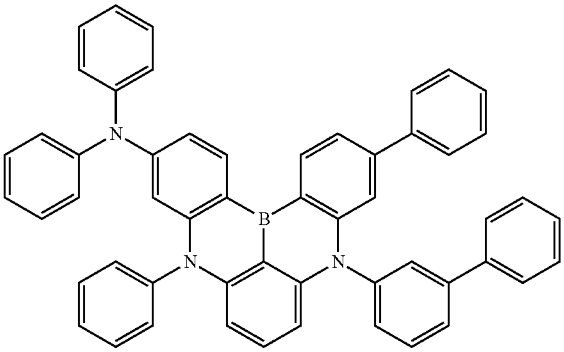

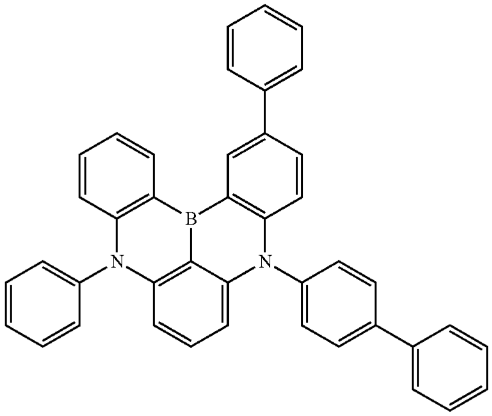

-continued

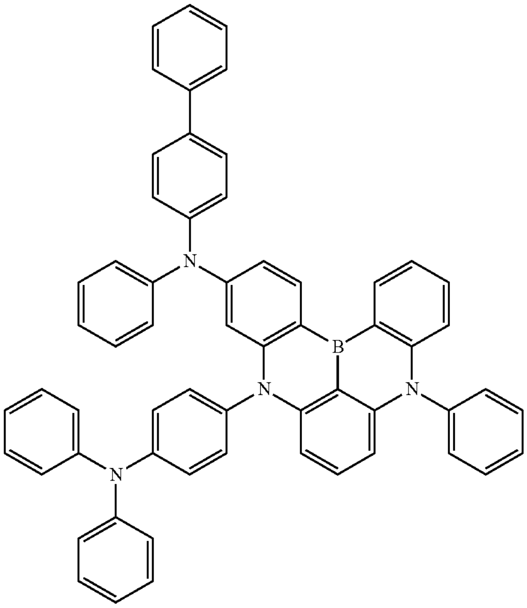

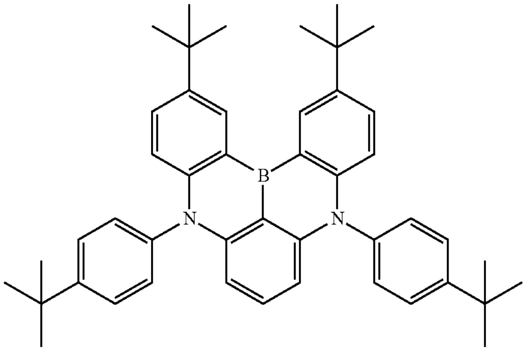

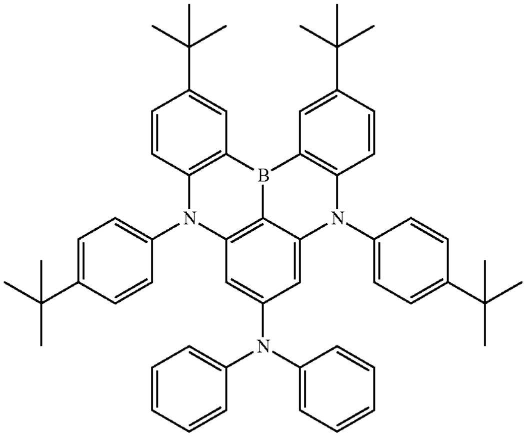

-continued

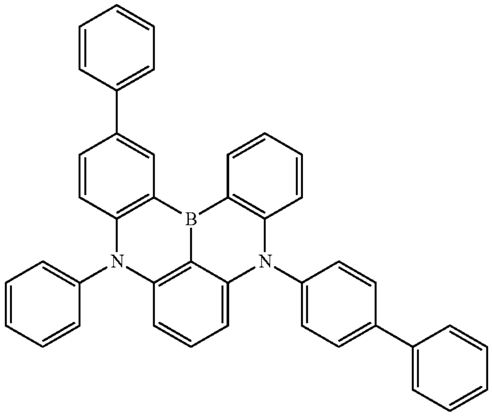

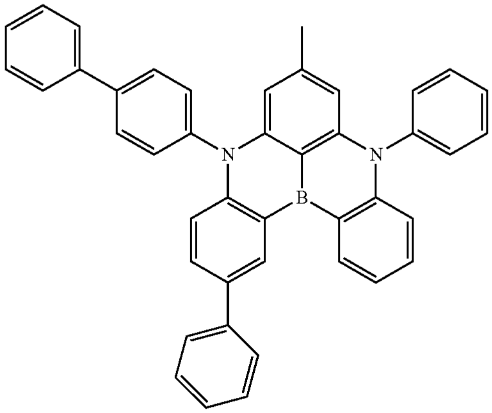

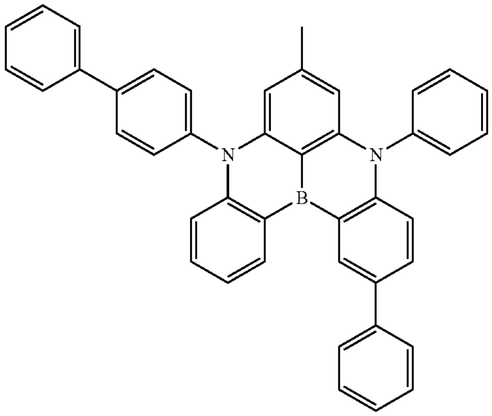

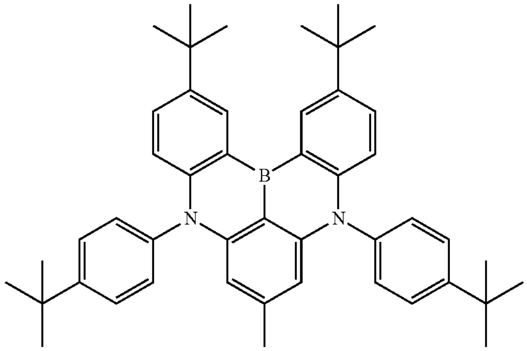

-continued

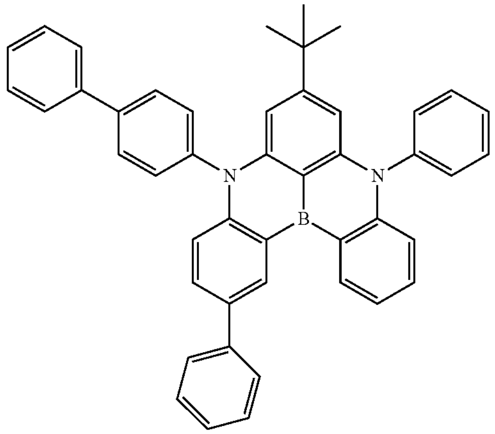

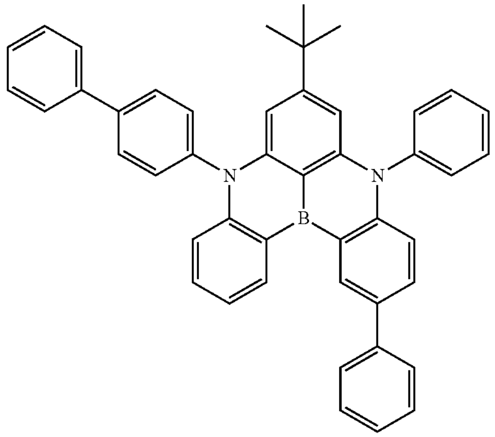

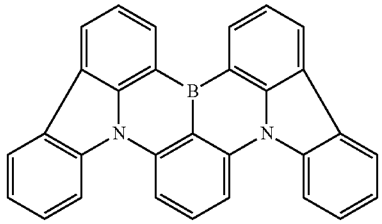

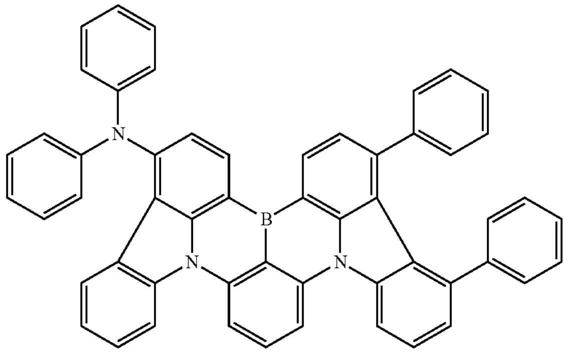

The person skilled in the art will immediately notice which hydrogen atoms of the phenyl-rings in the core structure of the shown boron-containing NRCT emitter (i.e., a phenyl ring binding to B as well as to at least one N) can be replaced by the binding site of the single bond linking the NRCT emitter moiety $M^{NRCT}$ to the bridging unit L. As one example, a structure can be depicted as follows, when explicitly depicting the hydrogen atoms:

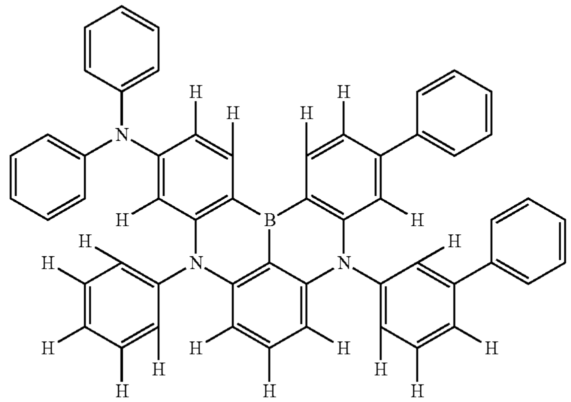 [SMILES: c1ccc(-c2cccc(N3c4cc(-c5ccccc5)ccc4B4c5ccc(N(c6ccccc6)c6ccccc6)cc5N(c5ccccc5)c5cccc3c54)c2)cc1]

Accordingly, in this structure, the NRCT emitter moiety $M^{NRCT}$ may be derived from a blue boron-containing NRCT emitter, wherein in the structure one of the explicitly shown H-atoms is replaced by the binding site of the single bond linking the NRCT emitter moiety $M^{NRCT}$ to the bridging unit L. In the other structures as depicted above, one of the corresponding hydrogen atoms may be replaced by the binding site of the single bond linking the NRCT emitter moiety $M^{NRCT}$ to the bridging unit L accordingly.

In a preferred embodiment, $M^{NRCT}$ is selected from one of the structures according to one of Formulas $M^{NRCT}$-1 to $M^{NRCT}$-18:

Formula $M^{NRCT}$-1

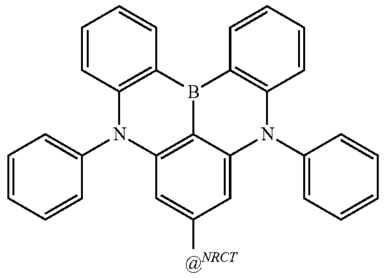

Formula $M^{NRCT}$-2

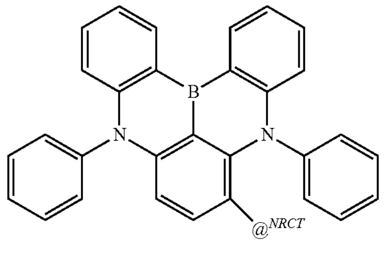

Formula $M^{NRCT}$-3

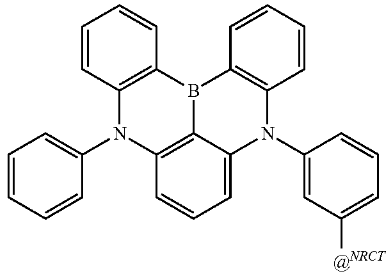

-continued

Formula $M^{NRCT}$-4

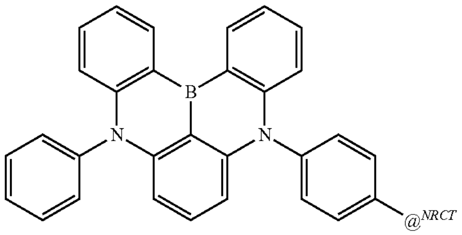

Formula $M^{NRCT}$-5

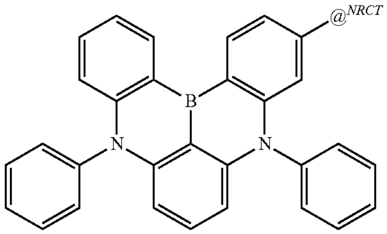

Formula $M^{NRCT}$-6

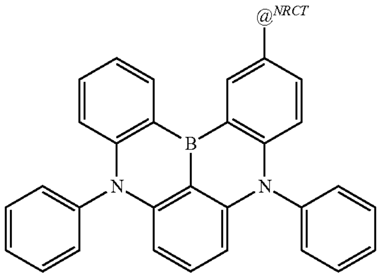

Formula $M^{NRCT}$-7

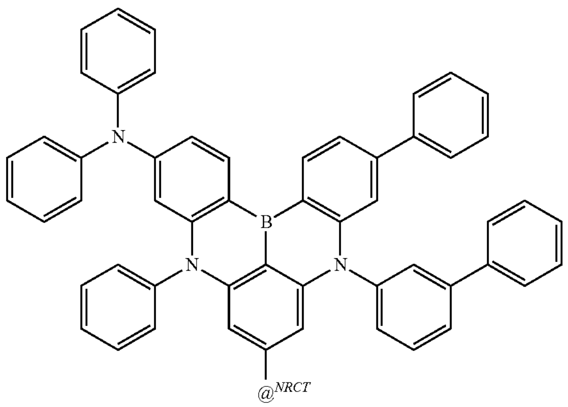

-continued
Formula M$^{NRCT}$-8
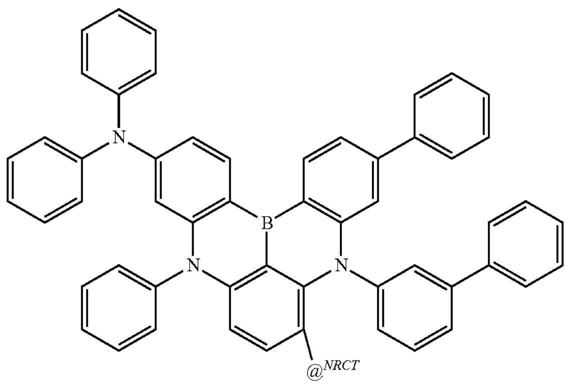
Formula M$^{NRCT}$-9
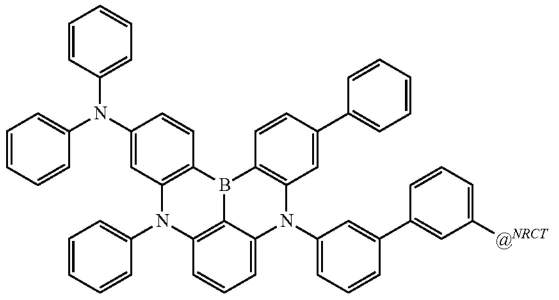
Formula M$^{NRCT}$-10
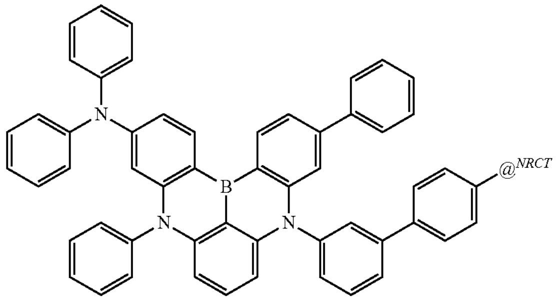
Formula M$^{NRCT}$-11
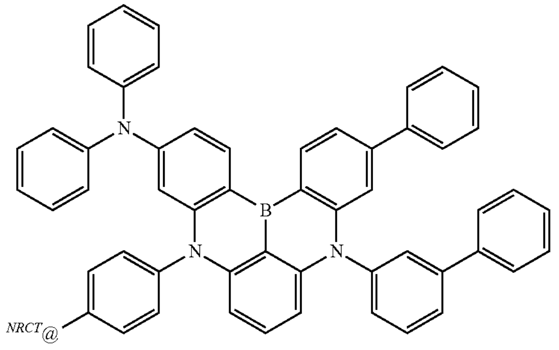
-continued
Formula M$^{NRCT}$-12
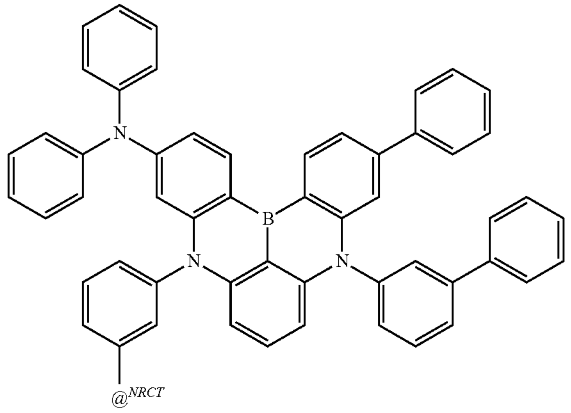
Formula M$^{NRCT}$-13
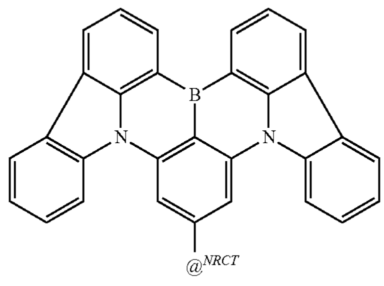
Formula M$^{NRCT}$-14
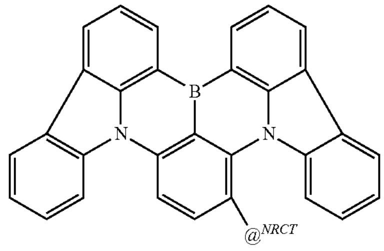
Formula M$^{NRCT}$-15
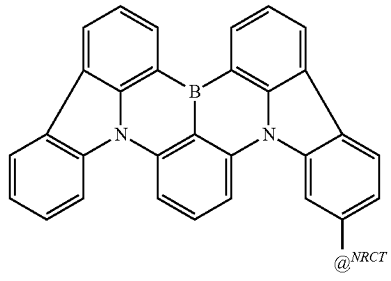
Formula M$^{NRCT}$-16
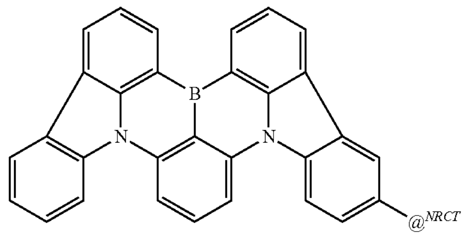

-continued

Formula $M^{NRCT}$-17

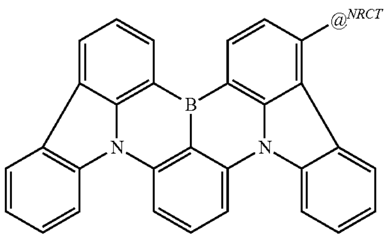

Formula $M^{NRCT}$-18

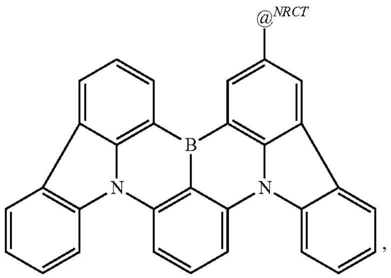

, wherein $@^{NRCT}$ represents the single bond linking the NRCT emitter moiety $M^{NRCT}$ to the bridging unit L.

The TADF Moiety $M^{TADF}$:

The thermally activated delayed fluorescence (TADF) material moiety $M^{TADF}$ is derived from a TADF material. According to the present invention, a TADF material is characterized in that it exhibits a $\Delta E^{ST}$ value, which corresponds to the energy difference between the lowermost excited singlet state (S1) and the lowermost excited triplet state (T1), of less than 0.4 eV, preferably less than 0.3 eV, more preferably less than 0.2 eV, even more preferably less than 0.1 eV or even less than 0.05 eV.

In one embodiment of the invention, $M^{TADF}$ consists of a first chemical moiety consisting of a structure according to Formula I, Formula I

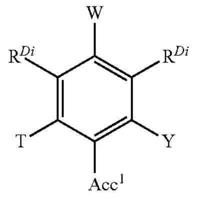

and one second chemical moiety consisting of a structure according to Formula II, Formula II

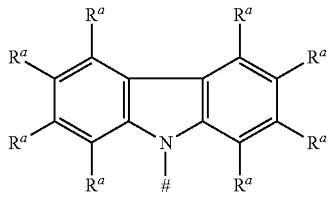

The first chemical moiety is linked to the second chemical moiety via a single bond.

T is selected from the group consisting of:

the binding site of a single bond linking the first chemical moiety to the second chemical moiety, hydrogen (H), deuterium (D), and $R^{TADF1}$.

W is selected from the group consisting of:

the binding site of a single bond linking the first chemical moiety to the second chemical moiety, and H, D, $R^{TADF1}$, and the binding site of a single bond linking the TADF moiety $M^{TADF}$ to the bridging unit L.

Y is selected from the group consisting of H, D, $R^{TADF1}$, and the binding site of a single bond linking the TADF moiety $M^{TADF}$ to the bridging unit L.

$Acc^1$ is selected from the group consisting of:

CN, $CF_3$,

Ph, which is optionally substituted with one or more substituents selected from the group consisting of CN, $CF_3$ and F;

triazinyl, which is optionally substituted with one or more substituents $R^6$;

pyridyl, which is optionally substituted with one or more substituents $R^6$; and pyrimidyl, which is optionally substituted with one or more substituents $R^6$.

# represents the binding site of a single bond linking the second chemical moieties to the first chemical moiety.

$R^{Di}$ is selected from the group consisting of H, D, Me, $^i$Pr, $^t$Bu, $SiPh_3$, CN, $CF_3$, Ph, which is optionally substituted with one or more substituents independently from each other selected from the group consisting of Me, $^i$Pr, $^t$Bu, and Ph, the binding site of the single bond linking the TADF moiety $M^{TADF}$ to the bridging unit L, and a third chemical moiety consisting of a structure of Formula Q:

Formula Q

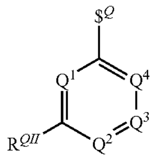

$Q^1$ is selected from the group consisting of N and C—$R^{QI}$.

$Q^2$ is selected from the group consisting of N and C—$R^{QIII}$.

$Q^3$ is selected from the group consisting of N and C—$R^{QIV}$.

$Q^4$ is selected from the group consisting of N and C—$R^{QV}$.

$\$^Q$ represents the binding site of a single bond linking the third chemical moiety to the first chemical moiety.

$R^{QI}$ is selected from the group consisting of:

H, D, CN, $CF_3$, $SiPh_3$, F, Ph, and a fourth chemical moiety comprising or consisting of a structure of Formula IIQ:

Formula IIQ

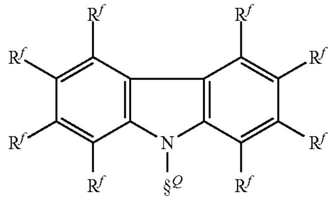

§ $^{Q}$ represents the binding site of a single bond linking the fourth chemical moiety to the third chemical moiety.

$R^{QI}$ is selected from the group consisting of:

the binding site of the single bond linking the TADF moiety $M^{TADF}$ to the bridging unit L, H, D, Me, $^{i}$Pr, $^{t}$Bu, $SiPh_3$, and Ph, which is optionally substituted with one or more substituents independently from each other selected from the group consisting of Me, $^{i}$Pr, $^{t}$Bu, and Ph.

$R^{QIII}$ is selected from the group consisting of:

the binding site of the single bond linking the TADF moiety $M^{TADF}$ to the bridging unit L, H, D, CN, $CF_3$, $SiPh_3$, F, Ph, which is optionally substituted with one or more substituents $R^6$;

triazinyl, which is optionally substituted with one or more substituents $R^6$;

pyridyl, which is optionally substituted with one or more substituents $R^6$; and pyrimidyl, which is optionally substituted with one or more substituents $R^6$;

$R^{QIV}$ is selected from the group consisting of:

the binding site of the single bond linking the TADF moiety $M^{TADF}$ to the bridging unit L, H, D, CN, $CF_3$, $SiPh_3$, F, Ph, which is optionally substituted with one or more substituents $R^6$;

triazinyl, which is optionally substituted with one or more substituents $R^6$;

pyridyl, which is optionally substituted with one or more substituents $R^6$; and pyrimidyl, which is optionally substituted with one or more substituents $R^6$.

$R^{QV}$ is selected from the group consisting of:

the binding site of the single bond linking the TADF moiety $M^{TADF}$ to the bridging unit L, H, D, Me, $^{i}$Pr, $^{t}$Bu, $SiPh_3$, and Ph, which is optionally substituted with one or more substituents independently from each other selected from the group consisting of Me, $^{i}$Pr, $^{t}$Bu, and Ph.

In one embodiment, all of $Q^1$, $Q^2$ and $Q^4$ are each N, thereby forming a triazine moiety. In another embodiment, two of $Q^1$, $Q^2$ and $Q^4$ are each N, thereby forming a pyrimidine moiety. In another embodiment, only one of $Q^1$, $Q^2$ and $Q^4$ are each N, thereby forming a pyridine moiety. In another embodiment, all of $Q^1$, $Q^2$ $Q^3$, and $Q^4$, as far as present, are each an optionally substituted carbon atom (C—$R^{QI}$, C—$R^{QIII}$, C—$R^{QIV}$, C—$R^{QV}$), thereby forming a phenyl moiety.

According to the invention, in case one $R^{Di}$ represents the third chemical moiety comprising or consisting of a structure of Formula Q, the other $R^{Di}$ is selected from the group consisting of H, D, Me, $^{i}$Pr, $^{t}$Bu, $SiPh_3$, Ph, which is optionally substituted with one or more substituents independently from each other selected from the group consisting of Me, $^{i}$Pr, $^{t}$Bu, and Ph, and the binding site of the single bond linking the TADF moiety $M^{TADF}$ to the bridging unit L.

$R^{TADF1}$ is selected from the group consisting of:

Me, $^{i}$Pr, $^{t}$Bu, $SiPh_3$, and

Ph, which is optionally substituted with one or more substituents independently from each other selected from the group consisting of Me, $^{i}$Pr, $^{t}$Bu, and Ph.

$R^a$ at each occurrence independently from another selected from the group consisting of hydrogen, deuterium, $N(R^5)_2$, $OR^5$, $Si(R^5)_3$, $B(OR^5)_2$, $OSO_2R^5$, $CF_3$, CN, F, Br, I, $C_1$-$C_{40}$-alkyl, which is optionally substituted with one or more substituents $R^5$ and wherein one $CH_2$-group or more than one non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_1$-$C_{40}$-alkoxy, which is optionally substituted with one or more substituents $R^5$ and wherein one $CH_2$-group or more than one non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_1$-$C_{40}$-thioalkoxy, which is optionally substituted with one or more substituents $R^5$ and wherein one $CH_2$-group or more than one non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_2$-$C_{40}$-alkenyl, which is optionally substituted with one or more substituents $R^5$ and wherein one $CH_2$-group or more than one non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_2$-$C_{40}$-alkynyl, which is optionally substituted with one or more substituents $R^5$ and wherein one $CH_2$-group or more than one non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$.

$R^5$ is at each occurrence independently from another selected from the group consisting of hydrogen, deuterium, $N(R^6)_2$, $OR^6$, $Si(R^6)_3$, $B(OR^6)_2$, $OSO_2R^6$, $CF_3$, CN, F, Br, I, $C_1$-$C_{40}$-alkyl, which is optionally substituted with one or more substituents $R^6$ and wherein one $CH_2$-group or more than one non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, C═$NR^6$, P(═O)($R^6$), SO, $SO_2$, $NR^6$, O, S or $CONR^6$;

$C_1$-$C_{40}$-alkoxy, which is optionally substituted with one or more substituents $R^6$ and wherein one $CH_2$-group or more than one non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$;

$C_1$-$C_{40}$-thioalkoxy, which is optionally substituted with one or more substituents $R^6$ and wherein one $CH_2$-group or more than one non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$;

$C_2$-$C_{40}$-alkenyl, which is optionally substituted with one or more substituents $R^6$ and wherein one $CH_2$-group or more than one non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$;

$C_2$-$C_{40}$-alkynyl, which is optionally substituted with one or more substituents $R^6$ and wherein one $CH_2$-group or more than one non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$;

$C_6$-$C_{60}$-aryl, which is optionally substituted with one or more substituents $R^6$; and $C_3$-$C_{57}$-heteroaryl, which is optionally substituted with one or more substituents $R^6$.

$R^6$ is at each occurrence independently from another selected from the group consisting of hydrogen, deuterium, OPh, $CF_3$, CN, F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)(C_6$-$C_{18}$-aryl);

$N(C_3$-$C_{17}$-heteroaryl$)(C_3$-$C_{17}$-heteroaryl); and $N(C_3$-$C_{17}$-heteroaryl$)(C_6$-$C_{18}$-aryl).

According to the invention, two or more of the substituents $R^a$ and/or $R^5$ independently from each other optionally form a mono- or polycyclic, (hetero)aliphatic, (hetero)aromatic and/or benzo-fused ring system with one or more substituents $R^a$ or $R^5$.

$R^f$ is at each occurrence independently from another selected from the group consisting of hydrogen, deuterium, $N(R^{5f})_2$, $OR^{5f}$, $Si(R^{5f})_3$, $B(OR^{5f})_2$, $OSO_2R^{3f}$, $CF_3$, CN, F, Br, I, $C_1$-$C_{40}$-alkyl, which is optionally substituted with one or more substituents $R^{5f}$ and wherein one $CH_2$-group or more than one non-adjacent $CH_2$-groups are optionally substituted by $R^{5f}C{=}CR^{5f}$, C≡C, $Si(R^{5f})_2$, $Ge(R^{5f})_2$, $Sn(R^{5f})_2$, C=O, C=S, C=Se, $C{=}NR^{5f}$, $P({=}O)(R^{5f})$, SO, $SO_2$, $NR^{5f}$, O, S or $CONR^{5f}$;

$C_1$-$C_{40}$-alkoxy, which is optionally substituted with one or more substituents $R^{5f}$ and wherein one $CH_2$-group or more than one non-adjacent $CH_2$-groups are optionally substituted by $R^{5f}C{=}CR^{5f}$, C≡C, $Si(R^{5f})_2$, $Ge(R^{5f})_2$, $Sn(R^{5f})_2$, C=O, C=S, C=Se, $C{=}NR^{5f}$, $P({=}O)(R^{5f})$, SO, $SO_2$, $NR^{5f}$, O, S or $CONR^{5f}$;

$C_1$-$C_{40}$-thioalkoxy, which is optionally substituted with one or more substituents $R^{5f}$ and wherein one $CH_2$-group or more than one non-adjacent $CH_2$-groups are optionally substituted by $R^{5f}C{=}CR^{5f}$, C≡C, $Si(R^{5f})_2$, $Ge(R^{5f})_2$, $Sn(R^{5f})_2$, C=O, C=S, C=Se, $C{=}NR^{5f}$, $P({=}O)(R^{5f})$, SO, $SO_2$, $NR^{5f}$, O, S or $CONR^{5f}$;

$C_2$-$C_{40}$-alkenyl, which is optionally substituted with one or more substituents $R^{5f}$ and wherein one $CH_2$-group or more than one non-adjacent $CH_2$-groups are optionally substituted by $R^{5f}C{=}CR^{5f}$, C≡C, $Si(R^{5f})_2$, $Ge(R^{5f})_2$, $Sn(R^{5f})_2$, C=O, C=S, C=Se, $C{=}NR^{5f}$, $P({=}O)(R^{5f})$, SO, $SO_2$, $NR^{5f}$, O, S or $CONR^{5f}$;

$C_2$-$C_{40}$-alkynyl, which is optionally substituted with one or more substituents $R^{5f}$ and wherein one $CH_2$-group or more than one non-adjacent $CH_2$-groups are optionally substituted by $R^{5f}C{=}CR^{5f}$, C≡C, $Si(R^{5f})_2$, $Ge(R^{5f})_2$, $Sn(R^{5f})_2$, C=O, C=S, C=Se, $C{=}NR^{5f}$, $P({=}O)(R^{5f})$, SO, $SO_2$, $NR^{5f}$, O, S or $CONR^{5f}$;

$C_6$-$C_{60}$-aryl, which is optionally substituted with one or more substituents $R^{5f}$; and $C_3$-$C_{57}$-heteroaryl, which is optionally substituted with one or more substituents $R^{5f}$.

$R^{5f}$ is at each occurrence independently from another selected from the group consisting of hydrogen, deuterium, $N(R^{6f})_2$, $OR^{6f}$, $Si(R^{6f})_3$, $B(OR^{6f})_2$, $OSO_2R^{6f}$, $CF_3$, CN, F, Br, I, $C_1$-$C_{40}$-alkyl, which is optionally substituted with one or more substituents $R^{6f}$ and wherein one $CH_2$-group or more than one non-adjacent $CH_2$-groups are optionally substituted by $R^{6f}C{=}CR^{6f}$, C≡C, $Si(R^{6f})_2$, $Ge(R^{6f})_2$, $Sn(R^{6f})_2$, C=O, C=S, C=Se, $C{=}NR^{6f}$, $P({=}O)(R^{6f})$, SO, $SO_2$, $NR^{6f}$, O, S or $CONR^{6f}$;

$C_1$-$C_{40}$-alkoxy, which is optionally substituted with one or more substituents $R^{6f}$ and wherein one $CH_2$-group or more than one non-adjacent $CH_2$-groups are optionally substituted by $R^{6f}C{=}CR^{6f}$, C≡C, $Si(R^{6f})_2$, $Ge(R^{6f})_2$, $Sn(R^{6f})_2$, C=O, C=S, C=Se, $C{=}NR^{6f}$, $P({=}O)(R^{6f})$, SO, $SO_2$, $NR^{6f}$, O, S or $CONR^{6f}$;

$C_1$-$C_{40}$-thioalkoxy, which is optionally substituted with one or more substituents $R^{6f}$ and wherein one $CH_2$-group or more than one non-adjacent $CH_2$-groups are optionally substituted by $R^{6f}C{=}CR^{6f}$, C≡C, $Si(R^{6f})_2$, $Ge(R^{6f})_2$, $Sn(R^{6f})_2$, C=O, C=S, C=Se, $C{=}NR^{6f}$, $P({=}O)(R^{6f})$, SO, $SO_2$, $NR^{6f}$, O, S or $CONR^{6f}$;

$C_2$-$C_{40}$-alkenyl, which is optionally substituted with one or more substituents $R^{6f}$ and wherein one $CH_2$-group or more than one non-adjacent $CH_2$-groups are optionally substituted by $R^{6f}C{=}CR^{6f}$, C≡C, $Si(R^{6f})_2$, $Ge(R^{6f})_2$, $Sn(R^{6f})_2$, C=O, C=S, C=Se, $C{=}NR^{6f}$, $P({=}O)(R^{6f})$, SO, $SO_2$, $NR^{6f}$, O, S or $CONR^{6f}$;

$C_2$-$C_{40}$-alkynyl, which is optionally substituted with one or more substituents $R^{6f}$ and wherein one $CH_2$-group or more than one non-adjacent $CH_2$-groups are optionally substituted by $R^{6f}C{=}CR^{6f}$, C≡C, $Si(R^{6f})_2$, $Ge(R^{6f})_2$, $Sn(R^{6f})_2$, C=O, C=S, C=Se, $C{=}NR^{6f}$, $P({=}O)(R^{6f})$, SO, $SO_2$, $NR^{6f}$, O, S or $CONR^{6f}$;

$C_6$-$C_{60}$-aryl, which is optionally substituted with one or more substituents $R^{6f}$; and $C_3$-$C_{57}$-heteroaryl, which is optionally substituted with one or more substituents $R^{6f}$.

$R^{6f}$ is at each occurrence independently from another selected from the group consisting of hydrogen, deuterium, OPh, $CF_3$, CN, F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)(C_6$-$C_{18}$-aryl$)$;

$N(C_3$-$C_{17}$-heteroaryl$)(C_3$-$C_{17}$-heteroaryl$)$; and $N(C_3$-$C_{17}$-heteroaryl$)(C_6$-$C_{18}$-aryl$)$.

According to the invention, two or more of the substituents $R^f$ and/or $R^{5f}$ independently from each other optionally form a mono- or polycyclic, (hetero)aliphatic, (hetero)aromatic and/or benzo-fused ring system with one or more substituents $R^f$ or $R^{5f}$.

According to the invention, the TADF moiety $M^{TADF}$ contains exactly one binding site of the single bond linking the TADF moiety $M^{TADF}$ to the bridging unit L.

According to the invention, one selected from the group consisting of T, W, and Y represents the binding site of a single bond linking the first chemical moiety and the second chemical moiety.

In one embodiment of the invention, $Acc^1$ is selected from a structure according to one of Formulas A1 to A23:

Formula A1

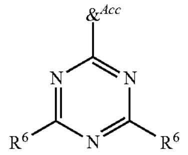

Formula A2

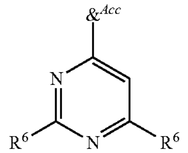

Formula A3

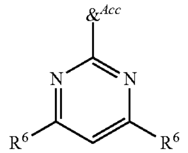

Formula A4

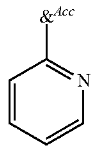

Formula A5

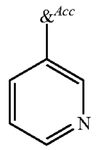

Formula A6

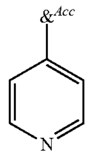

Formula A7

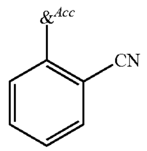

-continued
Formula A8
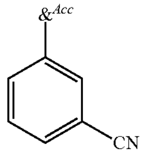
Formula A9
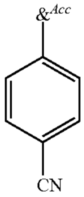
Formula A10
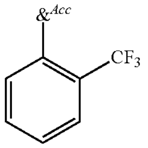
Formula A11
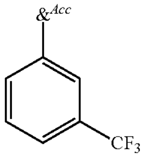
Formula A12
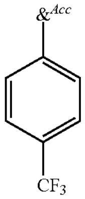
Formula A13
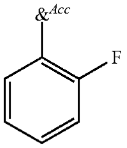
Formula A14
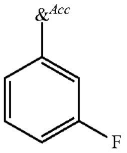
Formula A15
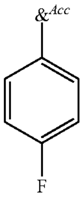
Formula A16
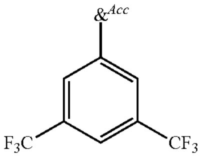
-continued
Formula A17
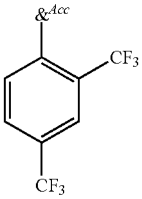
Formula A18
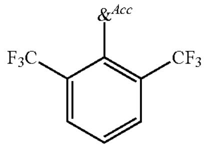
Formula A19
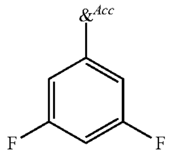
Formula A20
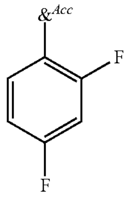
Formula A21
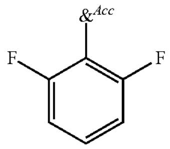
Formula A22
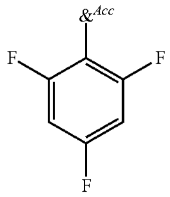
Formula A23
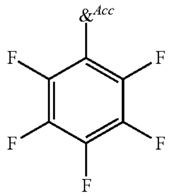
wherein $\&^{Acc}$ represents the binding site of a single bond linking $Acc^1$ to the first chemical moiety.

First Chemical Moiety

In one embodiment, the first chemical moiety comprises or consists of a structure of Formula Ia:

Formula Ia

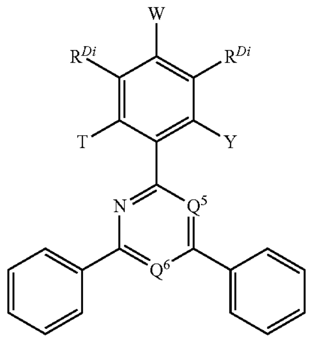

For $R^{Di}$, T, W and Y the aforementioned definitions apply.

$Q^5$ is selected from the group consisting of N and C—H.

$Q^5$ is selected from the group consisting of N and C—H.

According to this embodiment of the invention, at least one of $Q^5$ and $Q^6$ is N.

According to this embodiment of the invention, exactly one substituent selected from the group consisting of T and W represents the binding site of a single bond linking the first chemical moiety and the second chemical moiety.

In one embodiment, T represents the binding site of a single bond linking the first chemical moiety and to the second chemical moiety.

In one embodiment, W represents the binding site of a single bond linking the first chemical moiety and to the second chemical moiety.

Formula LWo

In one embodiment, the first chemical moiety consists of a structure of Formula LWo:

Formula LWo

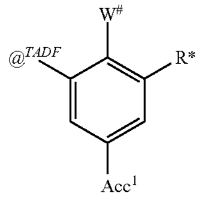

For $Acc^1$ the aforementioned definition applies.

R* is selected from the group consisting of H, D, Me, $^i$Pr, $^t$Bu, $SiPh_3$, CN, $CF_3$, Ph, which is optionally substituted with one or more substituents independently from each other selected from the group consisting of Me, $^i$Pr, $^t$Bu, and Ph, and a third chemical moiety consisting of a structure of Formula Q.

$@^{TADF}$ represents the binding site of the single bond linking the TADF moiety $M^{TADF}$ to the bridging unit L.

$W^{\#}$ represents the binding site of a single bond linking the first chemical moiety to the second chemical moiety.

In a further embodiment, the first chemical moiety consists of a structure of Formula LWo, and R* represents a third chemical moiety consisting of a structure of Formula Q.

In a further embodiment, the first chemical moiety consists of a structure of Formula LWo, and R* represents a third chemical moiety consisting of a structure according to one of Formulas B1 to B9:

Formula B1

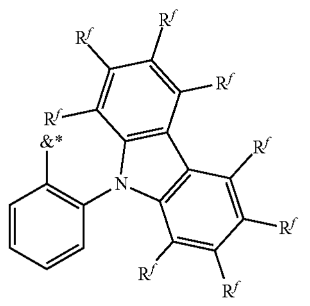

Formula B2

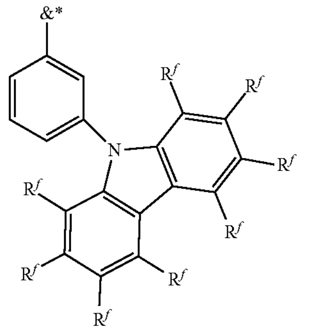

Formula B3

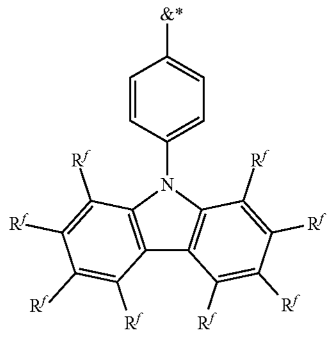

Formula B4

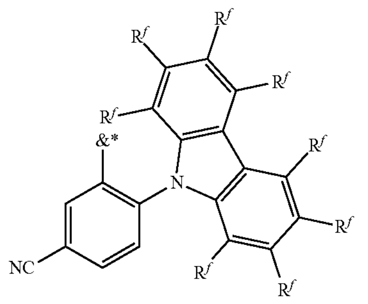

-continued

Formula B5

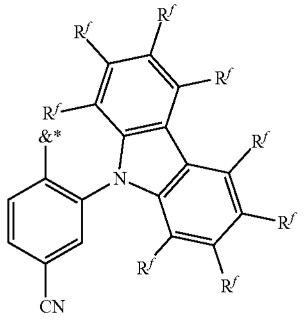

Formula B6

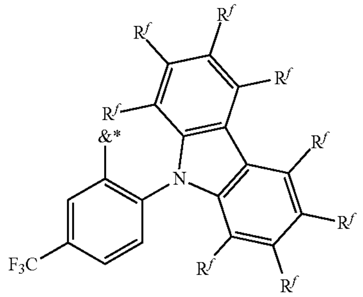

Formula B7

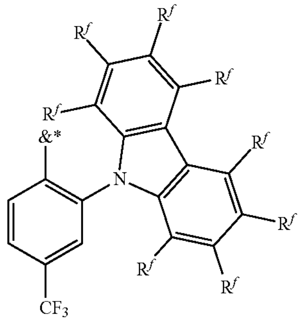

Formula B8

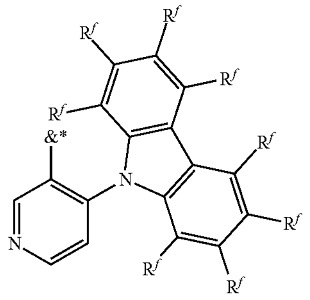

Formula B9

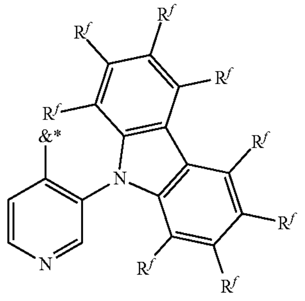

wherein &* represents the binding site of a single bond linking R* to the first chemical moiety and for $R^f$ the aforementioned definition applies.

In a further embodiment, the first chemical moiety consists of a structure of Formula LWo, and R* represents a third chemical moiety consisting of a structure according to one of Formulas A1* to A23*:

Formula A1*

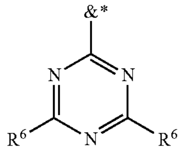

Formula A2*

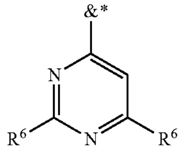

Formula A3*

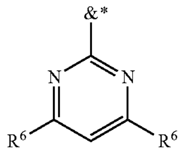

Formula A4*

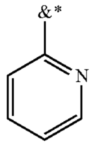

Formula A5*

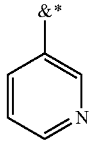

Formula A6*

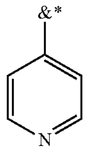

Formula A7*

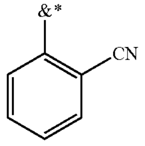

Formula A8*

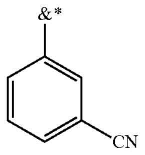

Formula A9*

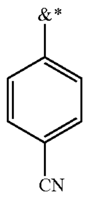

-continued

Formula A10*

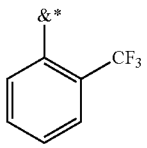

Formula A11*

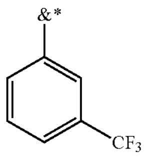

Formula A12*

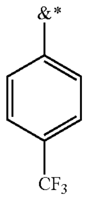

Formula A13*

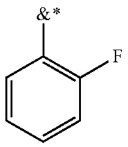

Formula A14*

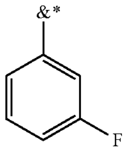

Formula A15*

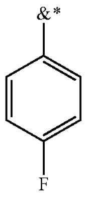

Formula A16*

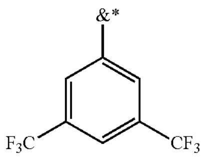

Formula A17*

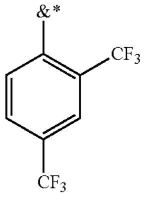

Formula A18*

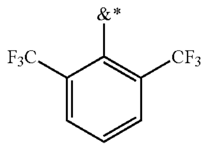

-continued

Formula A19*

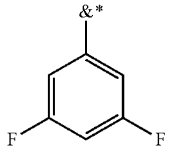

Formula A20*

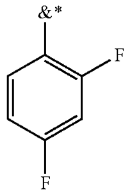

Formula A21*

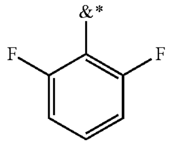

Formula A22*

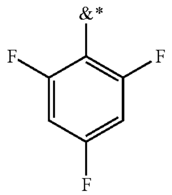

Formula A23*

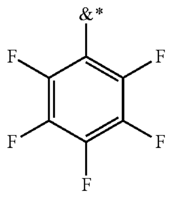

wherein &* represents the binding site of a single bond linking R* to the first chemical moiety.

In one embodiment, the first chemical moiety consists of a structure of Formula LWo-I:

Formula LWo-I

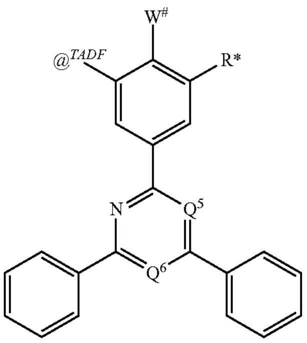

wherein for R*, $@^{TADF}$, $W^{\#}$, $Q^5$ and $Q^6$ the aforementioned definitions apply and at least one of $Q^5$ and $Q^6$ is N.

In a further embodiment, the first chemical moiety consists of a structure of Formula LWo-I, and R* represents a third chemical moiety consisting of a structure according to one of Formulas B1 to B9.

In a further embodiment, the first chemical moiety consists of a structure of Formula LWo-I, and R* represents a third chemical moiety consisting of a structure according to one of Formulas A1* to A23*:

Formula WoL

In one embodiment, the first chemical moiety consists of a structure of Formula LWo:

Formula WoL

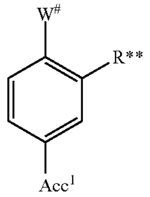

For Acc[1] the aforementioned definition applies.

R** represents a third chemical moiety consisting of a structure of Formula Q.

@$^{TADF}$ represents the binding site of the single bond linking the TADF moiety M$^{TADF}$ to the bridging unit L.

W$^{\#}$ represents the binding site of a single bond linking the first chemical moiety to the second chemical moiety.

In a further embodiment, the first chemical moiety consists of a structure of Formula WoL, and R** represents a third chemical moiety consisting of a structure according to one of Formulas B1* to B9*:

Formula B1*

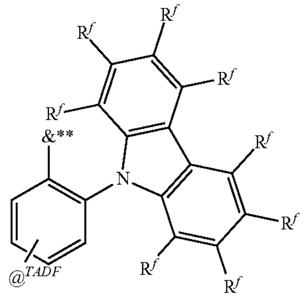

Formula B2*

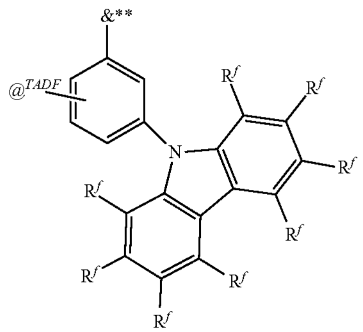

-continued

Formula B3*

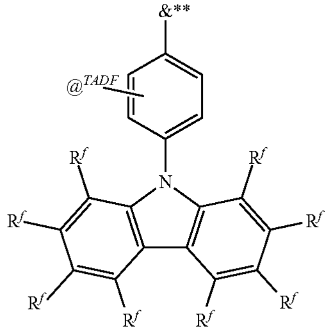

Formula B4*

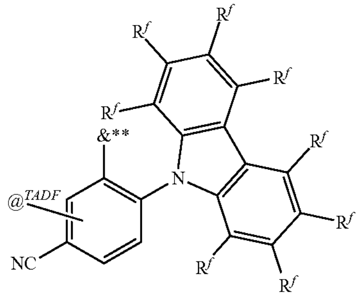

Formula B5*

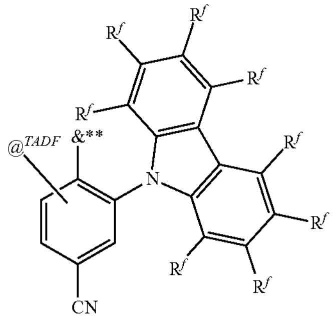

Formula B6*

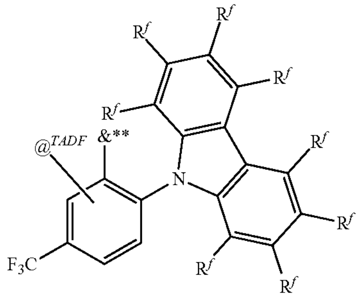

Formula B7*

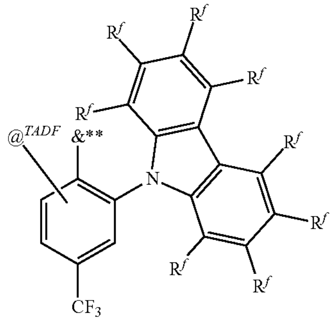

-continued

Formula B8*

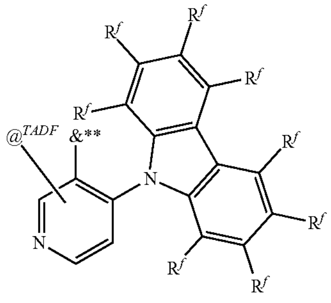

Formula B9*

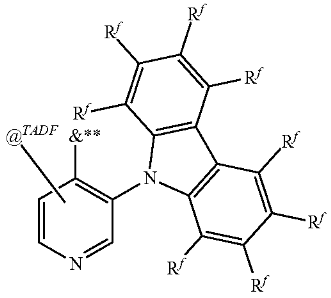

wherein & represents the binding site of a single bond linking R to the first chemical moiety;

$@^{TADF}$ represents the binding site of the single bond linking the TADF moiety $M^{TADF}$ to the bridging unit L;

and for $R^f$ the aforementioned definition applies.

In one embodiment, the first chemical moiety consists of a structure of Formula WoL-I:

Formula WoL-I

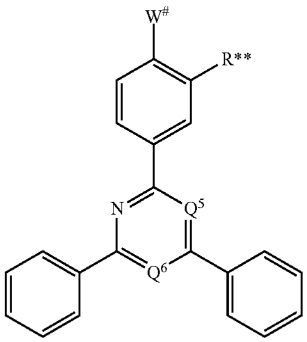

wherein for R**, $@^{TADF}$, $W^{\#}$, $Q^5$ and $Q^6$ the aforementioned definitions apply and at least one of $Q^5$ and $Q^6$ is N.

In a further embodiment, the first chemical moiety consists of a structure of Formula LWo-I, and R* represents a third chemical moiety consisting of a structure according to one of Formulas B1 to B9.

Formula LTp

In one embodiment, the first chemical moiety consists of a structure of Formula LTp:

Formula LTp

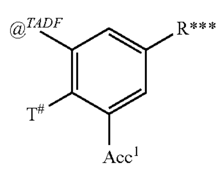

For $Acc^1$ the aforementioned definition applies.

R*** is selected from the group consisting of H, D, Me, $^i$Pr, $^t$Bu, $SiPh_3$, CN, $CF_3$, Ph, which is optionally substituted with one or more substituents independently from each other selected from the group consisting of Me, $^i$Pr, $^t$Bu, and Ph, and a third chemical moiety consisting of a structure of Formula Q.

$@^{TADF}$ represents the binding site of the single bond linking the TADF moiety $M^{TADF}$ to the bridging unit L.

$T^{\#}$ represents the binding site of a single bond linking the first chemical moiety to the second chemical moiety.

In a further embodiment, the first chemical moiety consists of a structure of Formula LTP, and R*** represents a third chemical moiety consisting of a structure of Formula Q.

In a further embodiment, the first chemical moiety consists of a structure of Formula LWo, and R* represents a third chemical moiety consisting of a structure according to one of Formulas B1 to B9**:

Formula B1**

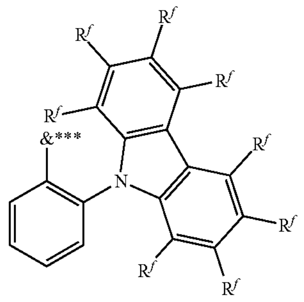

Formula B2**

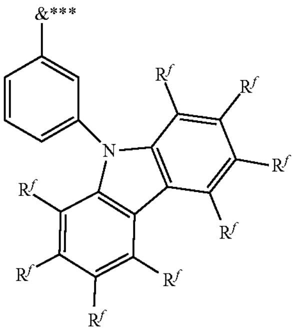

-continued

Formula B3**

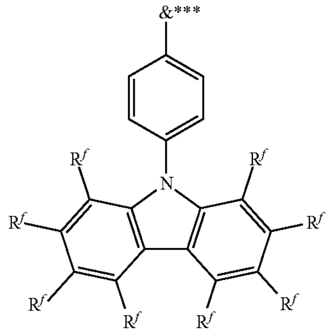

Formula B4**

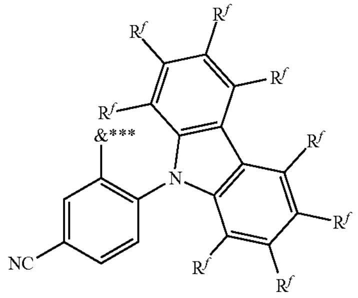

Formula B5**

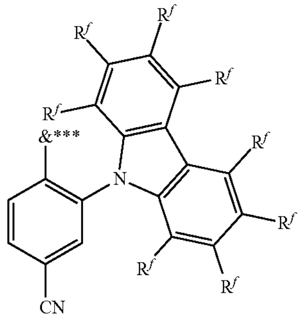

Formula B6**

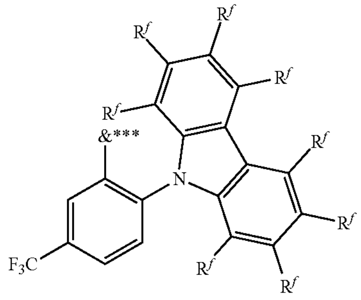

Formula B7**

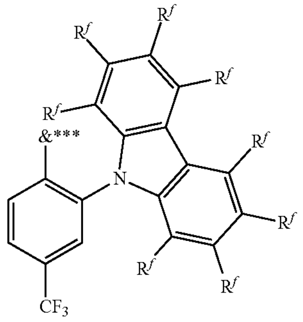

-continued

Formula B8**

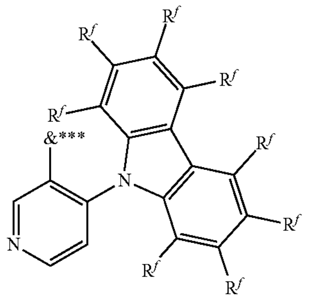

Formula B9**

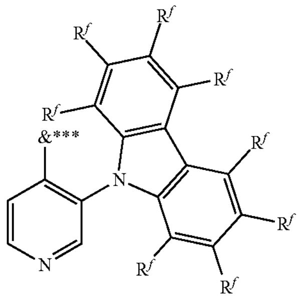

wherein &* represents the binding site of a single bond linking R* to the first chemical moiety and for $R^f$ the aforementioned definition applies.

In a further embodiment, the first chemical moiety consists of a structure of Formula LWo, and R* represents a third chemical moiety consisting of a structure according to one of Formulas A1 to A23**:

Formula A1**

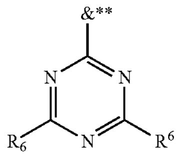

Formula A2**

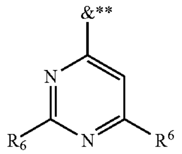

Formula A3**

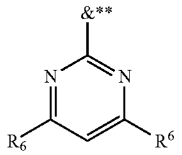

Formula A4**

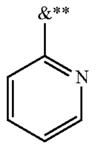

-continued
Formula A5**
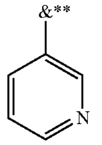
Formula A6**
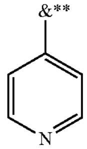
Formula A7**
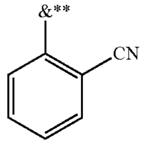
Formula A8**
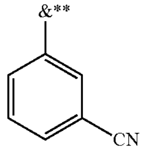
Formula A9**
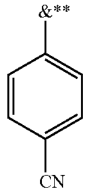
Formula A10**
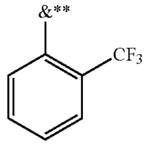
Formula A11**
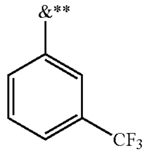
Formula A12**
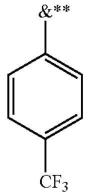
Formula A13**
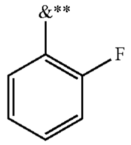
-continued
Formula A14**
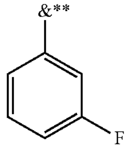
Formula A15**
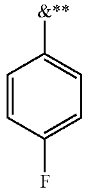
Formula A16**
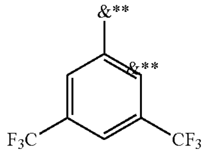
Formula A17**
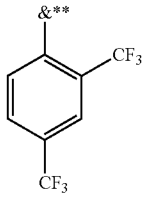
Formula A18**
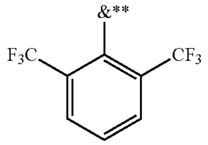
Formula A19**
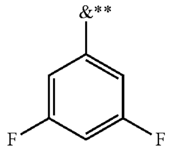
Formula A20**
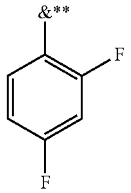
Formula A21**
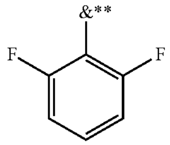
Formula A22**
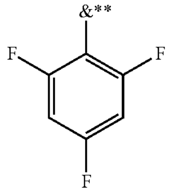

-continued

Formula A23**

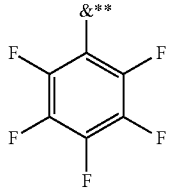

wherein &* represents the binding site of a single bond linking R* to the first chemical moiety.

In one embodiment, the first chemical moiety consists of a structure of Formula LTP-I:

Formula LTp-I

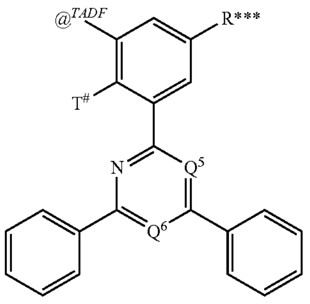

wherein for R***, $@^{TADF}$, $T^{\#}$, $Q^5$ and $Q^6$ the aforementioned definitions apply and at least one of $Q^5$ and $Q^6$ is N.

In a further embodiment, the first chemical moiety consists of a structure of Formula LTP-I, and R* represents a third chemical moiety consisting of a structure according to one of Formulas B1 to B9**:

In a further embodiment, the first chemical moiety consists of a structure of Formula LTP-I, and R* represents a third chemical moiety consisting of a structure according to one of Formulas A1 to A23**.

Formula TpL

In one embodiment, the first chemical moiety consists of a structure of Formula TpL:

Formula TpL

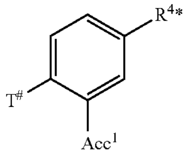

For $Acc^1$ the aforementioned definition applies.

$R^{4*}$ represents a third chemical moiety consisting of a structure of Formula Q.

$@^{TADF}$ represents the binding site of the single bond linking the TADF moiety $M^{TADF}$ to the bridging unit L.

$T^{\#}$ represents the binding site of a single bond linking the first chemical moiety to the second chemical moiety.

In a further embodiment, the first chemical moiety consists of a structure of Formula TpL, and $R^{4*}$ represents a third chemical moiety consisting of a structure according to one of Formulas $B1^{4*}$ to $B9^{4*}$:

Formula $B1^{4*}$

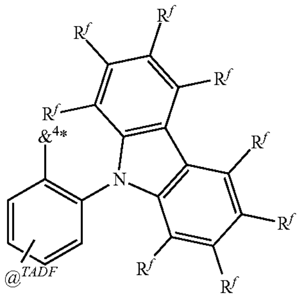

Formula $B2^{4*}$

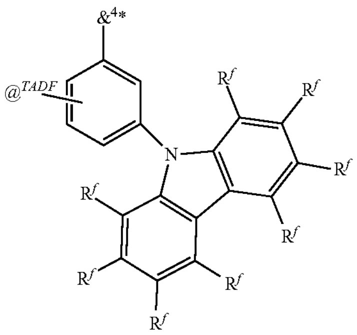

Formula $B3^{4*}$

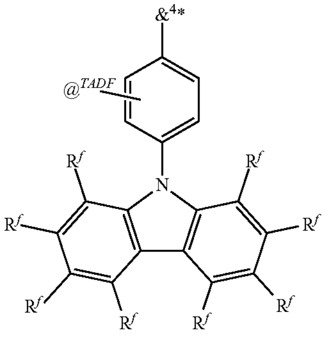

Formula $B4^{4*}$

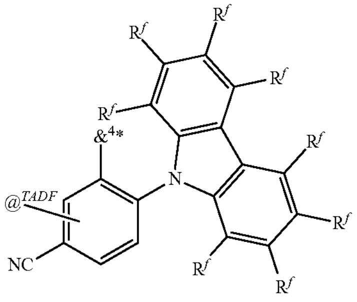

Formula $B5^{4*}$

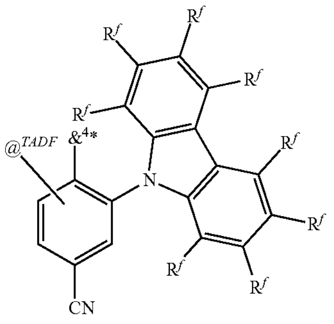

-continued

Formula $B6^{4*}$

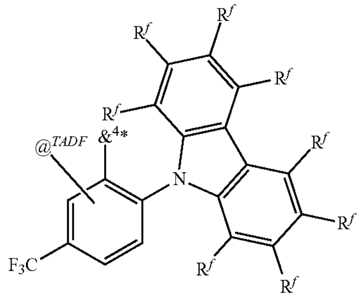

Formula $B7^{4*}$

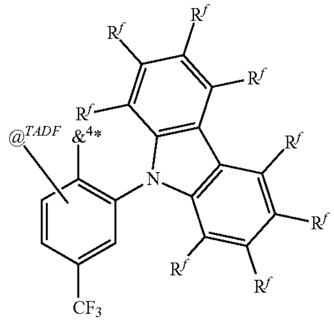

Formula $B8^{4*}$

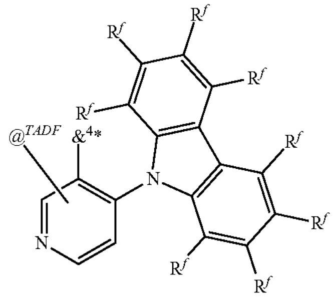

Formula $B9^{4*}$

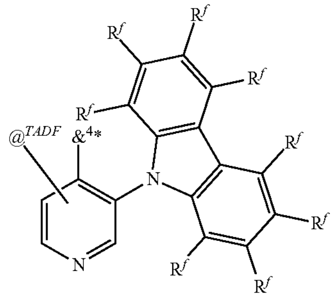

wherein &4* represents the binding site of a single bond linking $R^{4*}$ to the first chemical moiety @TADF represents the binding site of the single bond linking the TADF moiety $M^{TADF}$ to the bridging unit L, and for R the aforementioned definition applies.

In one embodiment, the first chemical moiety consists of a structure of Formula TpL-I:

Formula TpL-I

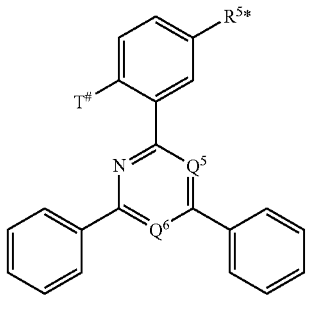

wherein for $R^{5*}$, $@^{TADF}$, $T^{\#}$, $Q^5$ and $Q^6$ the aforementioned definitions apply and at least one of $Q^5$ and $Q^6$ is N.

In a further embodiment, the first chemical moiety consists of a structure of Formula TpL-I, and $R^{5*}$ represents a third chemical moiety consisting of a structure according to one of Formulas $B1^{4*}$ to $B9^{4*}$.

Formula LoT

In one embodiment, the first chemical moiety consists of a structure of Formula LoT:

Formula LoT

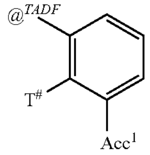

For $Acc^1$, $@^{TADF}$, $T^{\#}$ the aforementioned definitions apply.

In one embodiment, the first chemical moiety consists of a structure of Formula LoT-I:

Formula LoT-I

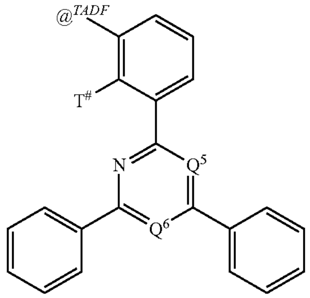

wherein for $@^{TADF}$, $T^{\#}$ $Q^5$ and $Q^6$ the aforementioned definitions apply and at least one of $Q^5$ and $Q^6$ is N.

Formula LmT

In one embodiment, the first chemical moiety consists of a structure of Formula LmT:

Formula LmT

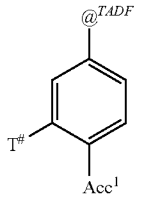

For $Acc^1$, $@^{TADF}$, $T^{\#}$ the aforementioned definitions apply.

In one embodiment, the first chemical moiety consists of a structure of Formula LmT-I:

Formula LmT-I

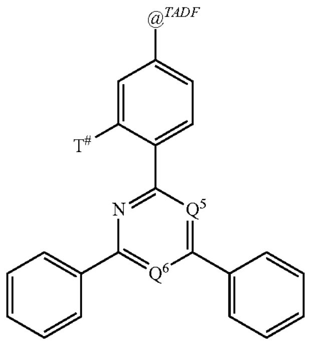

wherein for $@^{TADF}$, $T^{\#}$, $Q^5$ and $Q^6$ the aforementioned definitions apply and at least one of $Q^5$ and $Q^6$ is N.

Formula LpT

In one embodiment, the first chemical moiety consists of a structure of Formula LpT:

Formula LpT

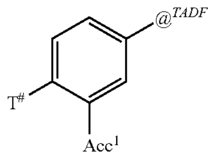

For $Acc^1$, $@^{TADF}$, $T^{\#}$ the aforementioned definitions apply.

In one embodiment, the first chemical moiety consists of a structure of Formula LpT-I:

Formula LpT-I

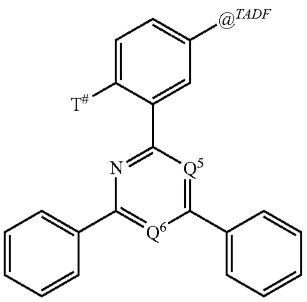

wherein for $@^{TADF}$, $T^{\#}$, $Q^5$ and $Q^6$ the aforementioned definitions apply and at least one of $Q^5$ and $Q^6$ is N.

Formula TmL

In one embodiment, the first chemical moiety consists of a structure of Formula TmL:

Formula TmL

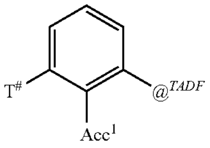

For $Acc^1$, $@^{TADF}$, $T^{\#}$ the aforementioned definitions apply.

In one embodiment, the first chemical moiety consists of a structure of Formula TmL-I:

Formula TmL-I

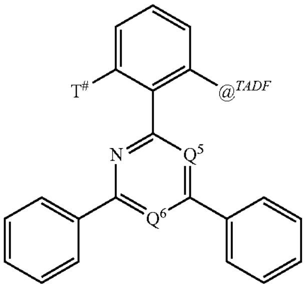

wherein for $@^{TADF}$, $T^{\#}$, $Q^5$ and $Q^6$ the aforementioned definitions apply and at least one of $Q^5$ and $Q^6$ is N.

Formula WoT

In one embodiment, the first chemical moiety consists of a structure of Formula WoT:

Formula WoT

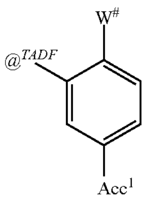

For $Acc^1$, $@^{TADF}$, $W^{\#}$ the aforementioned definitions apply.

In one embodiment, the first chemical moiety consists of a structure of Formula WoT-I:

Formula WoT-I

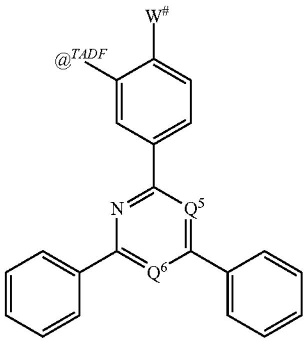

wherein for $@^{TADF}$, $W^{\#}$, $Q^5$ and $Q^6$ the aforementioned definitions apply and at least one of $Q^5$ and $Q^6$ is N.

Formula WmL

In one embodiment, the first chemical moiety consists of a structure of Formula WmL:

Formula WmL

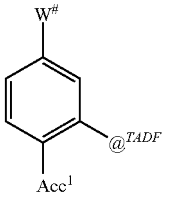

For $Acc^1$, $@^{TADF}$, $W^{\#}$ the aforementioned definitions apply.

In one embodiment, the first chemical moiety consists of a structure of Formula WmL-I:

Formula WmL-I

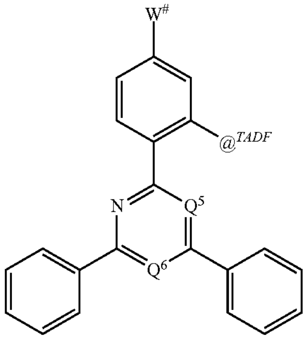

wherein for $@^{TADF}$, $W^{\#}$, $Q^5$ and $Q^6$ the aforementioned definitions apply and at least one of $Q^5$ and $Q^6$ is N.

In one embodiment, the first chemical moiety consists of a structure of Formula Iaa:

Formula Iaa

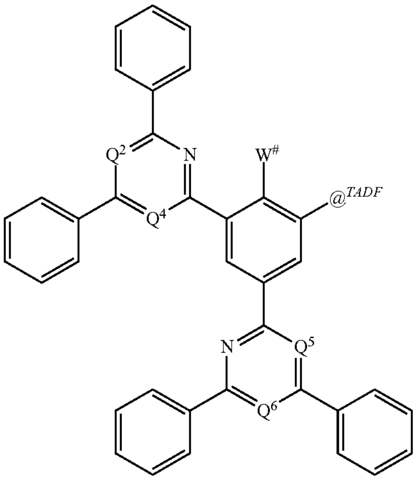

wherein for $@^{TADF}$, $W^{\#}$, $Q^2$ and $Q^4$, $Q^5$ and $Q^6$ the aforementioned definitions apply, at least one of $Q^2$ and $Q^4$ is N and at least one of $Q^5$ and $Q^6$ is N.

In a preferred embodiment both of $Q^2$ and $Q^4$ are N, thereby forming a triazine moiety. In a preferred embodiment both of $Q^5$ and $Q^6$ are N, thereby forming a triazine moiety. In a preferred embodiment all of $Q^2$ and $Q^4$, and as far as present, $Q^1$, $Q^5$ and/or $Q^4$, are each N, thereby forming one or two or more triazine moieties.

In one embodiment, the first chemical moiety consists of a structure of Formula Iab:

Formula Iab

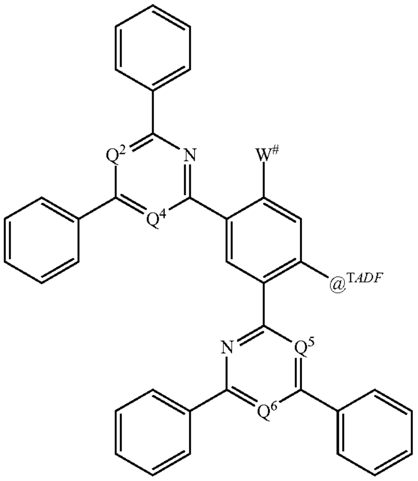

wherein for $@^{TADF}$, $W^{\#}$, $Q^2$ and $Q^4$, $Q^5$ and $Q^6$ the aforementioned definitions apply, at least one of $Q^2$ and $Q^4$ is N and at least one of $Q^5$ and $Q^6$ is N.

Second Chemical Moiety

In a further embodiment of the invention, the second chemical moiety comprises or consists of a structure of Formula IIb Formula IIb

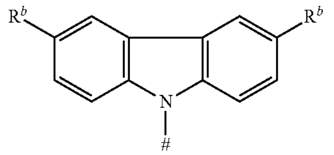

wherein $R^b$ is at each occurrence independently from another selected from the group consisting of hydrogen, deuterium, $N(R^5)_2$, $OR^5$, $Si(R^5)_3$, $B(OR^5)_2$, $OSO_2R^5$, $CF_3$, CN, F, Br, I, $C_1$-$C_{40}$-alkyl, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-alkoxy, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{40}$-alkenyl, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{40}$-alkynyl, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$;

and wherein apart from the aforementioned definitions apply.

In a further embodiment of the invention the second chemical moiety comprises or consists of a structure of formula IIc:

Formula IIc

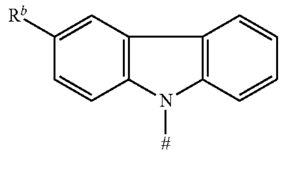

wherein $R^b$ is at each occurrence independently from another selected from the group consisting of hydrogen, deuterium, $N(R^5)_2$, $OR^5$, $Si(R^5)_3$, $B(OR^5)_2$, $OSO_2R^5$, $CF_3$, CN, F, Br, I, $C_1$-$C_{40}$-alkyl, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-alkoxy, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{40}$-alkenyl, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{40}$-alkynyl, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$;

and wherein apart from that the aforementioned definitions apply.

In one embodiment of the invention, $R^b$ is at each occurrence independently from another selected from the group consisting of:

hydrogen, deuterium,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$ and Ph;

pyridinyl, which is optionally substituted with one or more substituents independently from each other selected from the group consisting of Me, $^i$Pr, $^t$Bu, CN, $CF_3$ and Ph;

pyrimidinyl, which is optionally substituted with one or more substituents independently from each other selected from the group consisting of Me, $^i$Pr, $^t$Bu, CN, $CF_3$ and Ph;

carbazolyl, which is optionally substituted with one or more substituents independently from each other selected from the group consisting of Me, $^i$Pr, $^t$Bu, CN, $CF_3$ and Ph;

triazinyl, which is optionally substituted with one or more substituents independently from each other selected from the group consisting of Me, $^i$Pr, $^t$Bu, CN, $CF_3$, and Ph; and $N(Ph)_2$.

In one embodiment, the fourth chemical moiety consisting of a structure of Formula IIQ is identical to the one or two second chemical moieties comprising or consisting of a structure of Formula II.

In one embodiment, the fourth chemical moiety consisting of a structure of Formula IIQ is different to the one or two second chemical moieties comprising or consisting of a structure of Formula II.

In a further embodiment of the invention, $R^a$ is at each occurrence independently from another selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, $R^a$ is at each occurrence independently from another selected from the group consisting of hydrogen, Me, $^i$Pr, $^t$Bu, CN, $CF_3$, Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a further embodiment of the invention, the second chemical moiety consists of a structure of Formula IIb, a structure of Formula IIb-2, a structure of Formula IIb-3 or a structure of Formula IIb-4:

Formula IIb

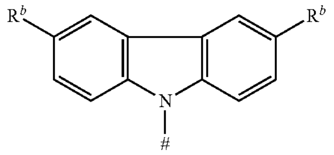

Formula IIb-2

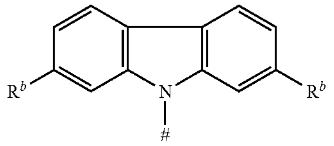

Formula IIb-3

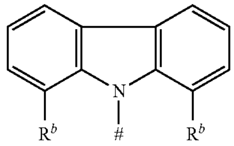

Formula IIb-4

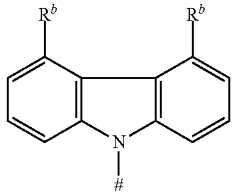

wherein $R^b$ is at each occurrence independently from another selected from the group consisting of:

hydrogen, deuterium, $N(R^5)_2$, $OR^5$, $Si(R^5)_3$, $B(OR^5)_2$, $OSO_2R^5$, $CF_3$, CN, F, Br, I, $C_1$-$C_{40}$-alkyl, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-alkoxy, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{40}$-alkenyl, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{40}$-alkynyl, which is optionally substituted with one or more substituents $R^5$ and wherein one $CH_2$-group or more than one non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$.

For additional variables, the aforementioned definitions apply.

In one additional embodiment of the invention, the second chemical moiety consists of a structure of Formula IIc, a structure of Formula IIc-2, a structure of Formula IIc-3 or a structure of Formula IIc-4:

Formula IIc

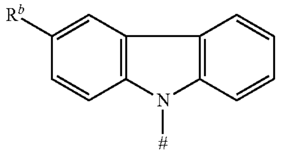

Formula IIc-2

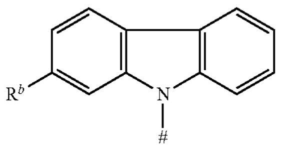

Formula IIc-3

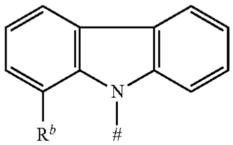

Formula IIc-4

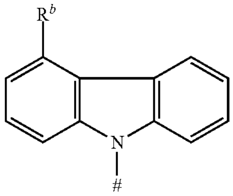

wherein the aforementioned definitions apply.

In a further embodiment of the invention, $R^b$ is at each occurrence independently from another selected from the group consisting of:

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, $R^b$ is at each occurrence independently from another selected from the group consisting of:

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In the following, examples of the second chemical moiety are shown:

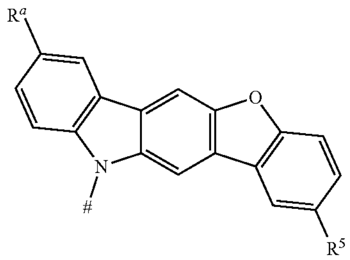

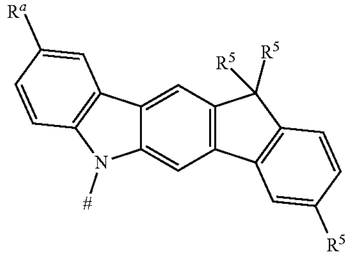

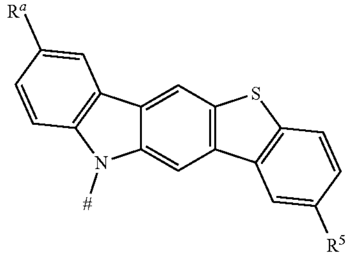

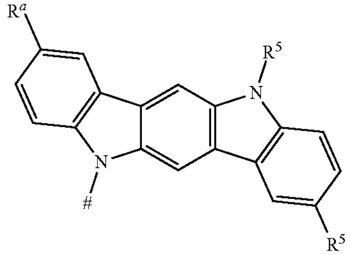

-continued
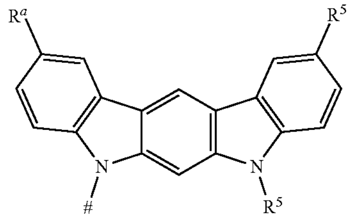
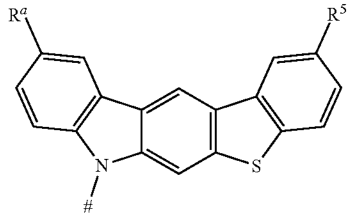
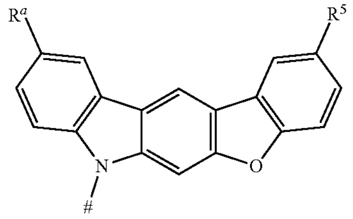
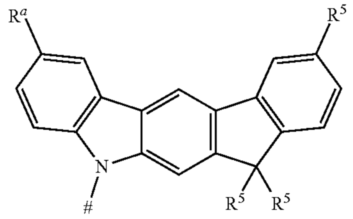
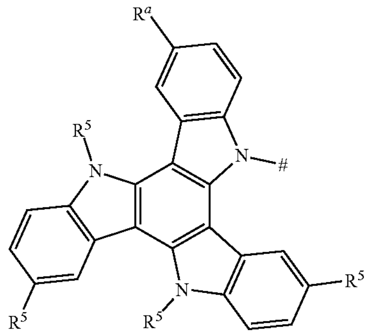
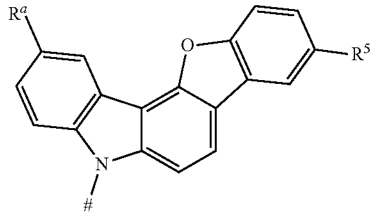
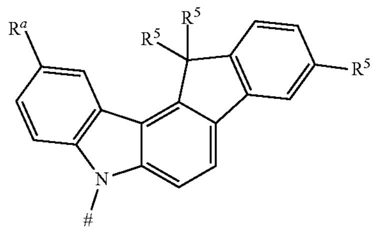
-continued
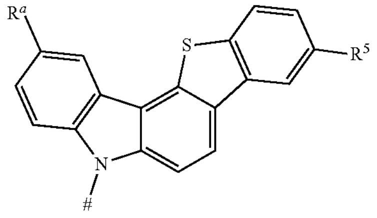
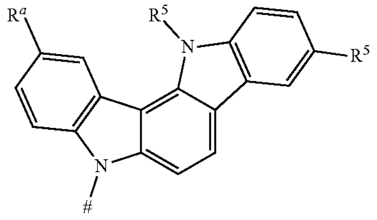
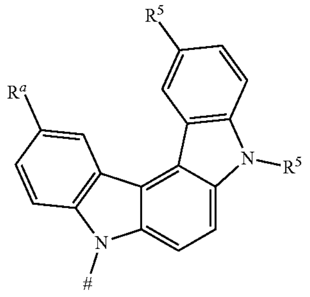
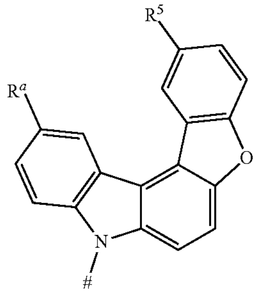
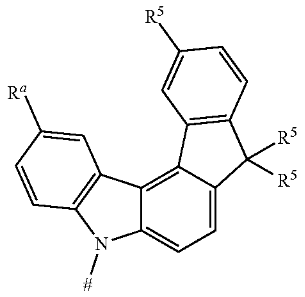
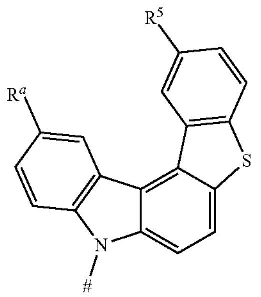

-continued

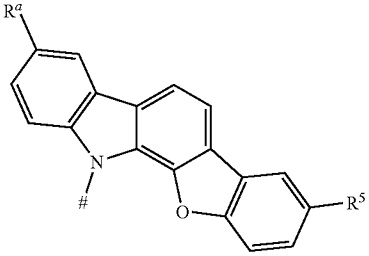

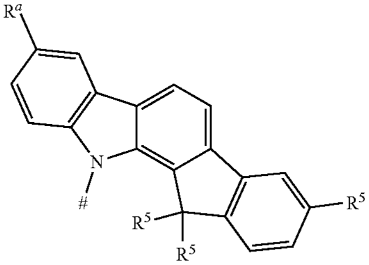

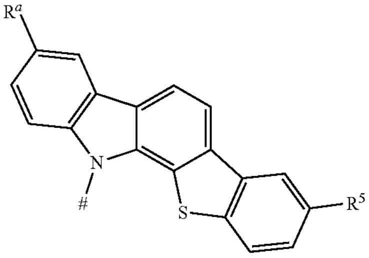

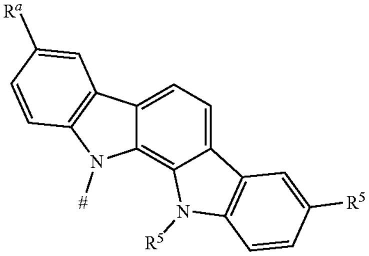

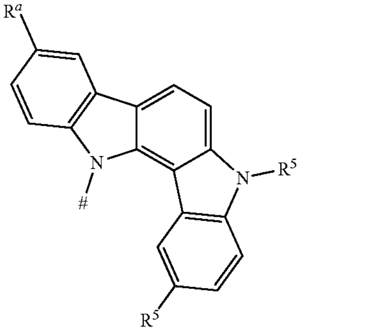

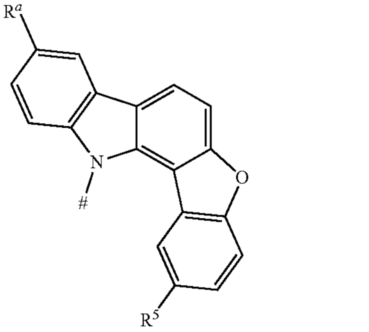

-continued

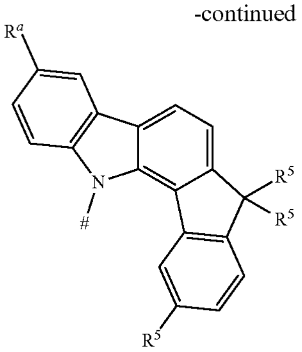

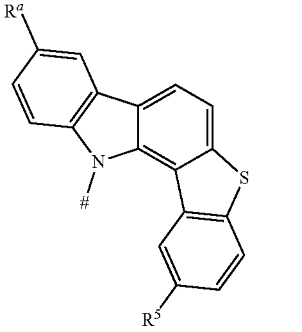

For each of the above-given second chemical moieties, the aforementioned definitions apply for #, Z, $R^a$, and $R^5$.

In one embodiment, $R^a$ and $R^5$ is at each occurrence independently from another selected from the group consisting of hydrogen (H), methyl (Me), i-propyl (CH $(CH_3)_2$) ($^i$Pr), t-butyl ($^t$Bu), phenyl (Ph), triazinyl, which is optionally substituted with one or more substituents independently from each other selected from the group consisting of Me, $^i$Pr, $^t$Bu, CN, $CF_3$, and Ph; and diphenylamine ($NPh_2$).

Fourth Chemical Moiety

In a further embodiment of the invention, the fourth chemical moiety comprises or consists of a structure of Formula IIq:

Formula IIq

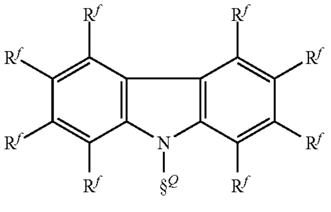

wherein § $^Q$ and $R^f$ are defined as above.

In a further embodiment of the invention, $R^f$ is at each occurrence independently from another selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, carbazolyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

In a further embodiment of the invention, $R^f$ is at each occurrence independently from another selected from the group consisting of:

hydrogen, Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, and triazinyl, which is optionally substituted with one or more substituents independently from each other selected from the group consisting of Me, $^{i}$Pr, $^{t}$Bu, CN, $CF_3$, and Ph.

In a further embodiment of the invention, the fourth chemical moiety consists of a structure of Formula IIbq, a structure of Formula IIbq-2, a structure of Formula IIbq-3 or a structure of Formula IIbq-4:

Formula IIbq

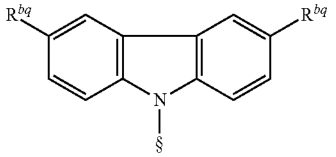

Formula IIbq-2

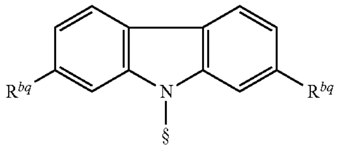

Formula IIbq-3

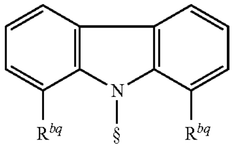

Formula IIbq-4

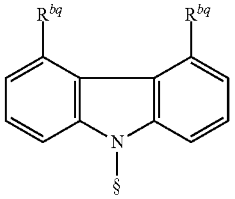

wherein $R^{bq}$ is at each occurrence independently from another selected from the group consisting of:

hydrogen, deuterium, $N(R^{5f})_2$, $OR^{5f}$, $Si(R^{5f})_3$, $B(OR^{5f})_2$, $OSO_2R^{5f}$, $CF_3$, CN, F, Br, I, $C_1$-$C_{40}$-alkyl, which is optionally substituted with one or more substituents $R^{5f}$ and wherein one $CH_2$-group or more than one non-adjacent $CH_2$-groups are optionally substituted by $R^{5f}C{=}CR^{5f}$, C≡C, $Si(R^{5f})_2$, $Ge(R^{5f})_2$, $Sn(R^{5f})_2$, C═O, C═S, C═Se, C═$NR^{5f}$, P(═O)($R^{5f}$), SO, $SO_2$, $NR^{5f}$, O, S or $CONR^{5f}$;

$C_1$-$C_{40}$-alkoxy, which is optionally substituted with one or more substituents $R^{5f}$ and wherein one $CH_2$-group or more than one non-adjacent $CH_2$-groups are optionally substituted by $R^{5f}C{=}CR^{5f}$, C≡C, $Si(R^{5f})_2$, $Ge(R^{5f})_2$, $Sn(R^{5f})_2$, C═O, C═S, C═Se, C═$NR^{5f}$, P(═O)($R^{5f}$), SO, $SO_2$, $NR^{5f}$, O, S or $CONR^{5f}$;

$C_1$-$C_{40}$-thioalkoxy, which is optionally substituted with one or more substituents $R^{5f}$ and wherein one $CH_2$-group or more than one non-adjacent $CH_2$-groups are optionally substituted by $R^{5f}C{=}CR^{5f}$, C≡C, $Si(R^{5f})_2$, $Ge(R^{5f})_2$, $Sn(R^{5f})_2$, C═O, C═S, C═Se, C═$NR^{5f}$, P(═O)($R^{5f}$), SO, $SO_2$, $NR^{5f}$, O, S or $CONR^{5f}$;

$C_2$-$C_{40}$-alkenyl, which is optionally substituted with one or more substituents $R^{5f}$ and wherein one $CH_2$-group or more than one non-adjacent $CH_2$-groups are optionally substituted by $R^{5f}C{=}CR^{5f}$, C≡C, $Si(R^{5f})_2$, $Ge(R^{5f})_2$, $Sn(R^{5f})_2$, C═O, C═S, C═Se, C═$NR^{5f}$, P(═O)($R^{5f}$), SO, $SO_2$, $NR^{5f}$, O, S or $CONR^{5f}$;

$C_2$-$C_{40}$-alkynyl, which is optionally substituted with one or more substituents $R^{5f}$ and wherein one $CH_2$-group or more than one non-adjacent $CH_2$-groups are optionally substituted by $R^{5f}C{=}CR^{5f}$, C≡C, $Si(R^{5f})_2$, $Ge(R^{5f})_2$, $Sn(R^{5f})_2$, C═O, C═S, C═Se, C═$NR^{5f}$, P(═O)($R^{5f}$), SO, $SO_2$, $NR^{5f}$, O, S or $CONR^{5f}$;

$C_6$-$C_{60}$-aryl, which is optionally substituted with one or more substituents $R^{5f}$; and $C_3$-$C_{57}$-heteroaryl, which is optionally substituted with one or more substituents $R^{5f}$.

For additional variables, the aforementioned definitions apply.

In one additional embodiment of the invention, the fourth chemical moiety consists of a structure of Formula IIcq, a structure of Formula IIcq-2, a structure of Formula IIcq-3 or a structure of Formula IIcq-4:

Formula IIcq

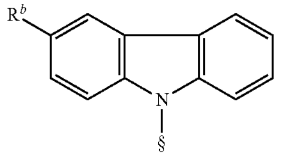

-continued

Formula IIcq-2

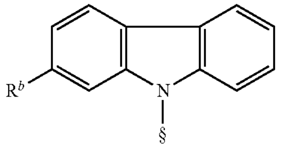

Formula IIcq-3

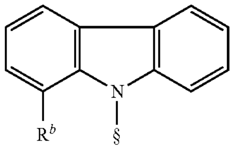

Formula IIcq-4

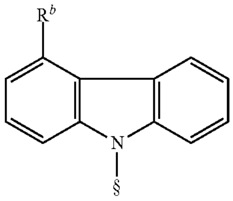

wherein the aforementioned definitions apply.

In a further embodiment of the invention, $R^{bq}$ is at each occurrence independently from another selected from the group consisting of Me, $^{i}$Pr, $^{t}$Bu, CN, $CF_3$,

- Ph, which is optionally substituted with one or more substituents independently from each other selected from the group consisting of Me, $^{i}$Pr, $^{t}$Bu, CN, $CF_3$, and Ph,
- pyridinyl, which is optionally substituted with one or more substituents independently from each other selected from the group consisting of Me, $^{i}$Pr, $^{t}$Bu, CN, $CF_3$, and Ph,
- pyrimidinyl, which is optionally substituted with one or more substituents independently from each other selected from the group consisting of Me, $^{i}$Pr, $^{t}$Bu, CN, $CF_3$, and Ph,
- carbazolyl, which is optionally substituted with one or more substituents independently from each other selected from the group consisting of Me, $^{i}$Pr, $^{t}$Bu, CN, $CF_3$, and Ph,
- triazinyl, which is optionally substituted with one or more substituents independently from each other selected from the group consisting of Me, $^{i}$Pr, $^{t}$Bu, CN, $CF_3$, and Ph,
- and $N(Ph)_2$.

In a further embodiment of the invention, $R^{bq}$ is at each occurrence independently from another selected from the group consisting of:

- Me, $^{i}$Pr, $^{t}$Bu, CN, $CF_3$,
- Ph, which is optionally substituted with one or more substituents independently from each other selected from the group consisting of Me, $^{i}$Pr, $^{t}$Bu, CN, $CF_3$, and Ph,
- pyridinyl, which is optionally substituted with one or more substituents independently from each other selected from the group consisting of Me, $^{i}$Pr, $^{t}$Bu, CN, $CF_3$, and Ph,
- pyrimidinyl, which is optionally substituted with one or more substituents independently from each other selected from the group consisting of Me, $^{i}$Pr, $^{t}$Bu, CN, $CF_3$, and Ph, and
- triazinyl, which is optionally substituted with one or more substituents independently from each other selected from the group consisting of Me, $^{i}$Pr, $^{t}$Bu, CN, $CF_3$, and Ph.

In one embodiment of the invention, $R^{bq}$ is at each occurrence independently from another selected from the group consisting of:

- Me, $^{i}$Pr, $^{t}$Bu, Ph, which is optionally substituted with one or more substituents independently from each other selected from the group consisting of Me, $^{i}$Pr, $^{t}$Bu, CN, $CF_3$ and Ph; and
- triazinyl, which is optionally substituted with one or more substituents independently from each other selected from the group consisting of Me, $^{i}$Pr, $^{t}$Bu, CN, $CF_3$ and Ph.

In the following, exemplary embodiments of the fourth chemical moiety are shown:

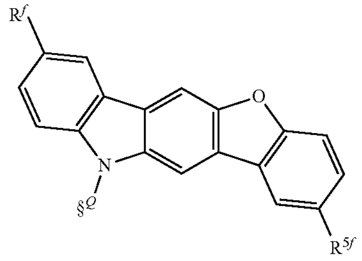

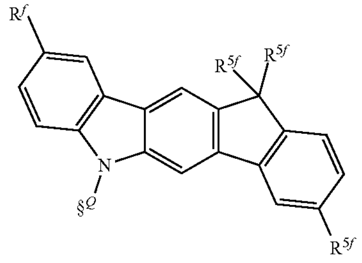

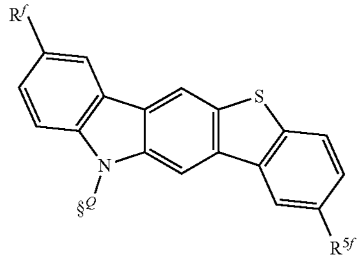

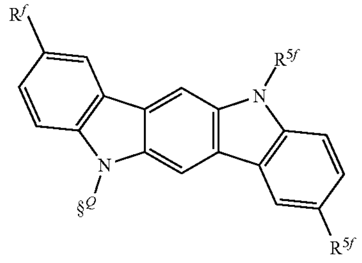

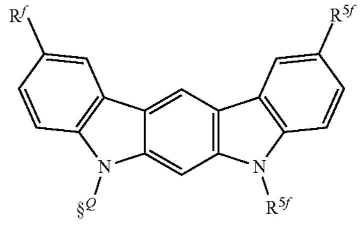

-continued
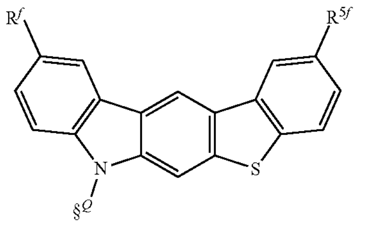
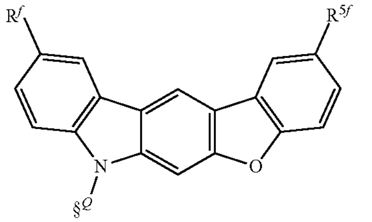
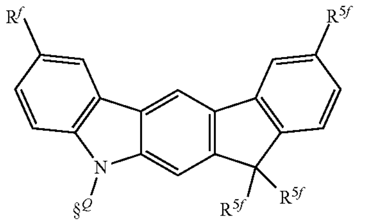
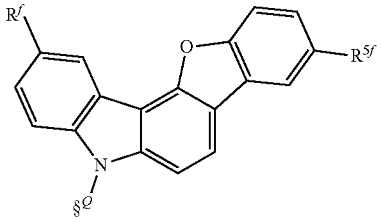
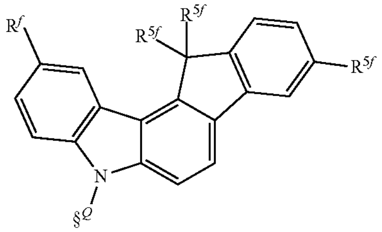
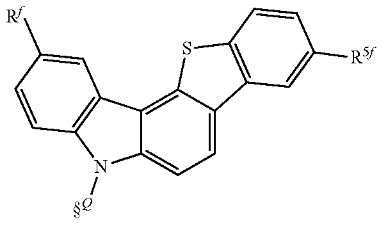
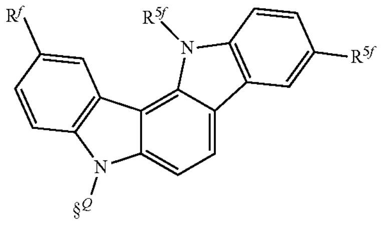
-continued
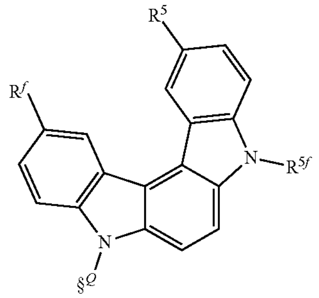
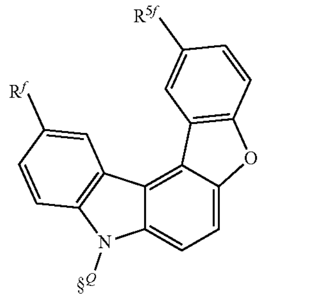
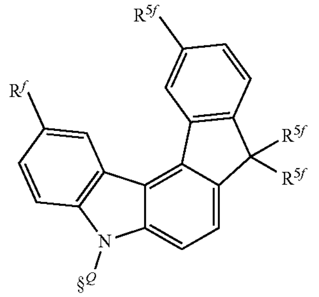
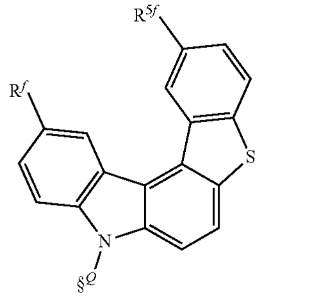
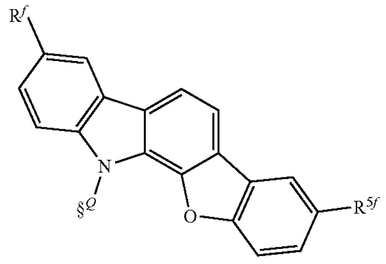
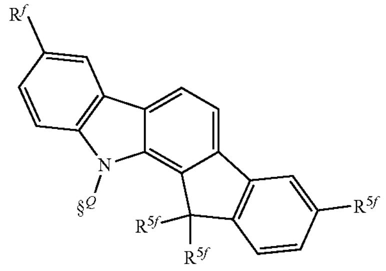

-continued

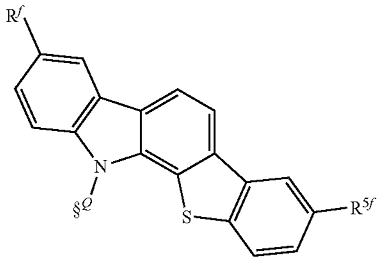

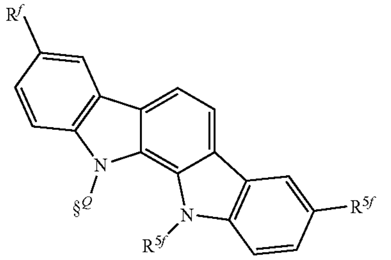

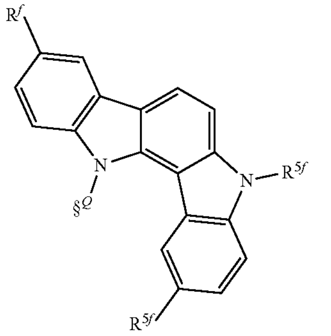

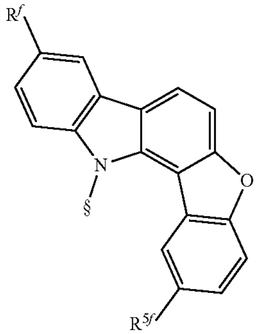

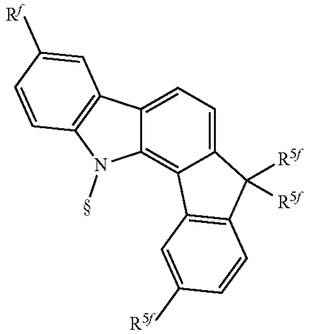

-continued

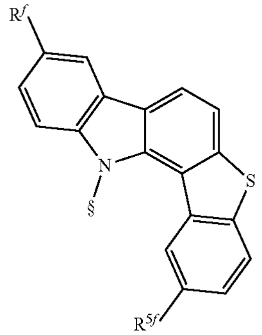

For $\$^{Q}$, $Z^{\$}$, $R^f$, and $R^5$ of the fourth chemical moiety shown above, the aforementioned definitions apply.

In one embodiment, $R^{af}$ and $R^{5f}$ is at each occurrence independently from another selected from the group consisting of hydrogen (H), methyl (Me), i-propyl ($CH(CH_3)_2$) ($^i$Pr), t-butyl ($^t$Bu), phenyl (Ph), triazinyl, which is optionally substituted with one or more substituents independently from each other selected from the group consisting of Me, $^i$Pr, $^t$Bu, CN, $CF_3$, and Ph; and diphenylamine ($NPh_2$).

Examples of the TADF Moiety $M^{TADF}$

In a preferred embodiment, $M^{TADF}$ is selected from one of the structures according to one of Formulas $M^{TADF}$-1 to $M^{TADF}$-48:

Formula $M^{TADF}$-1

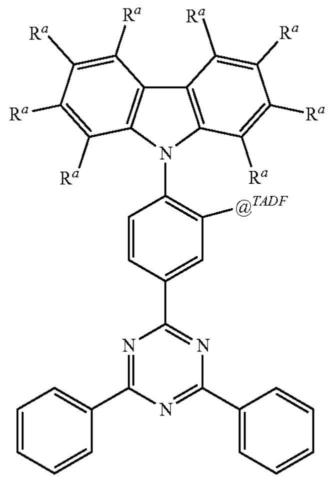

Formula $M^{TADF}$-2
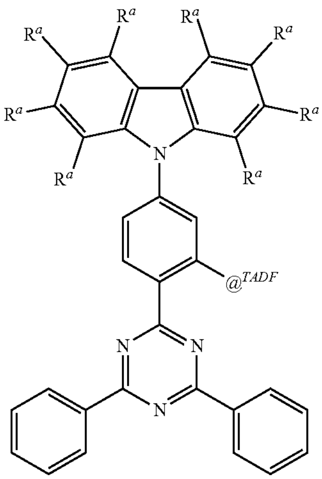
Formula $M^{TADF}$-3
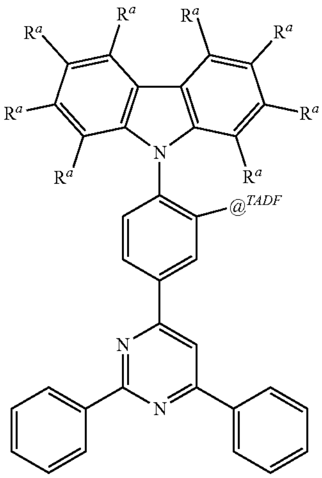
Formula $M^{TADF}$-4
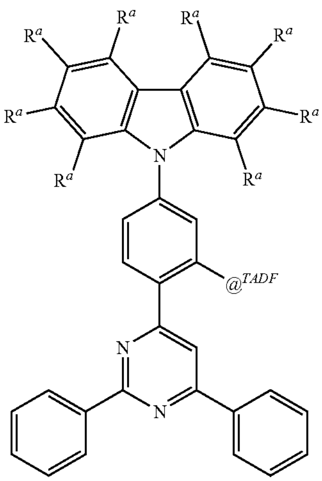
Formula $M^{TADF}$-5
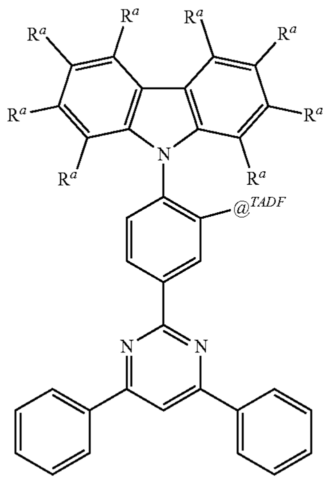
Formula $M^{TADF}$-6
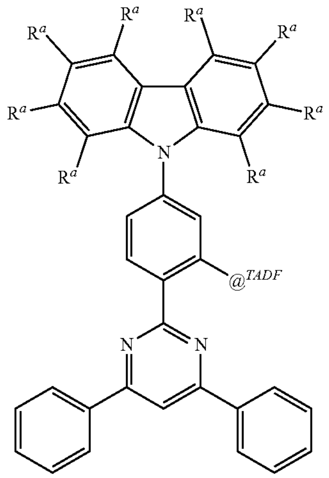
Formula $M^{TADF}$-7
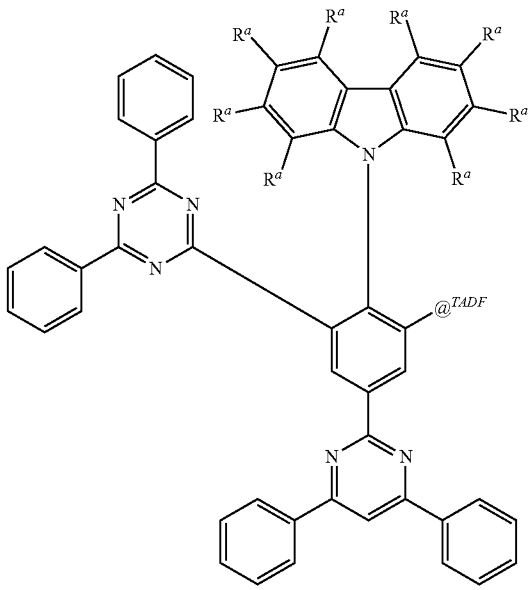

-continued
Formula $M^{TADF}$-8
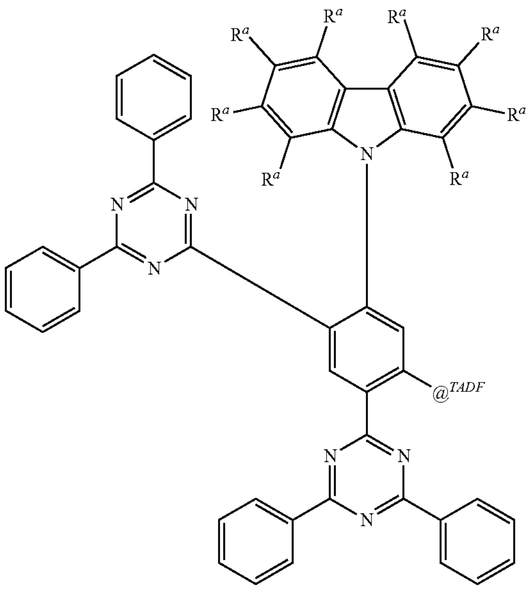
Formula $M^{TADF}$-9
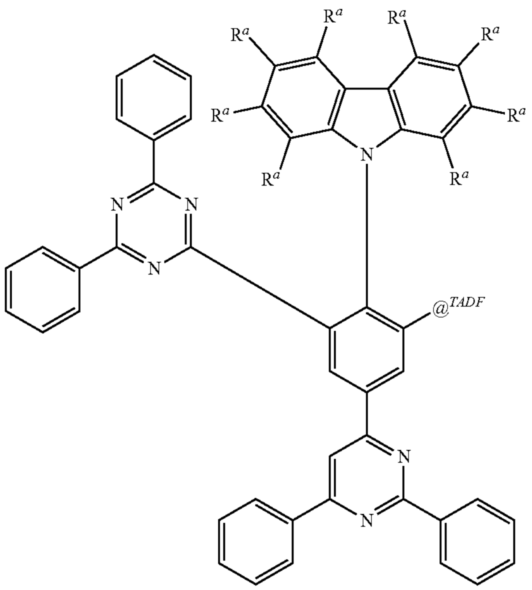
-continued
Formula $M^{TADF}$-10
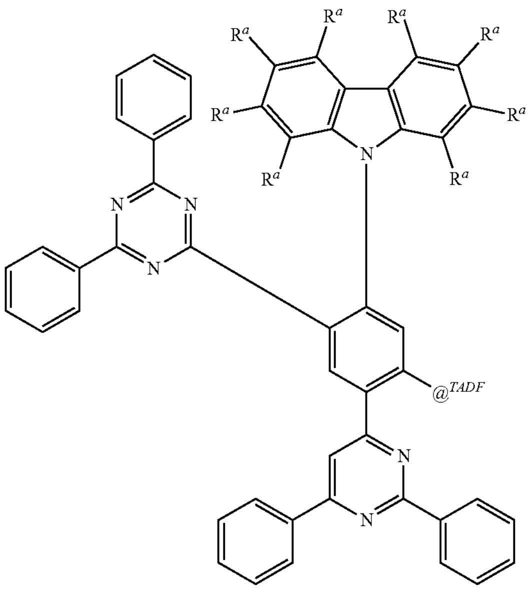
Formula $M^{TADF}$-11
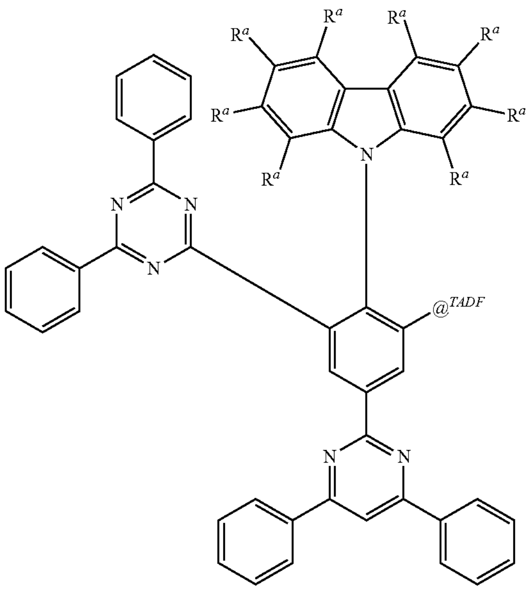

-continued
Formula $M^{TADF}$-12
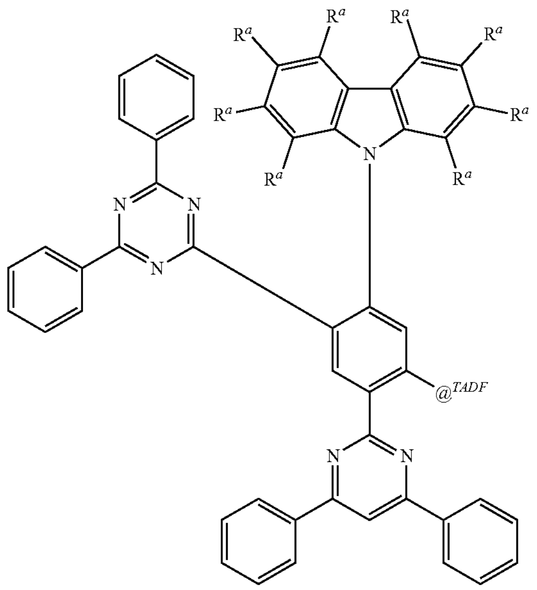
Formula $M^{TADF}$-13
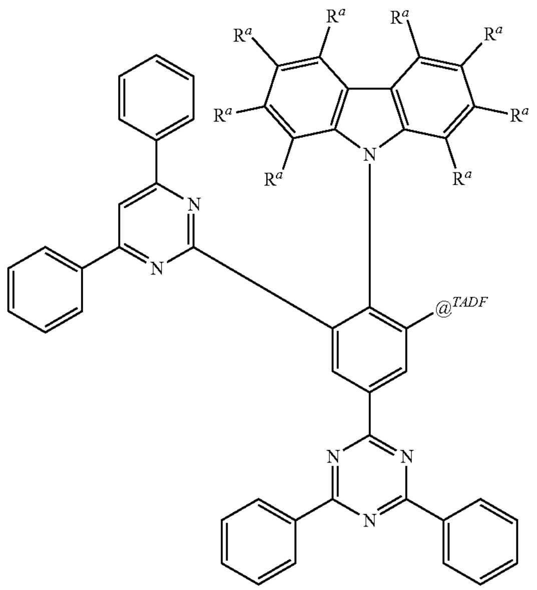
-continued
Formula $M^{TADF}$-14
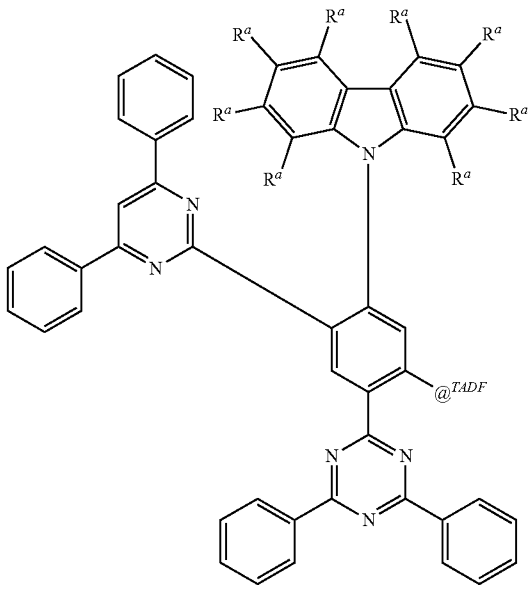
Formula $M^{TADF}$-15
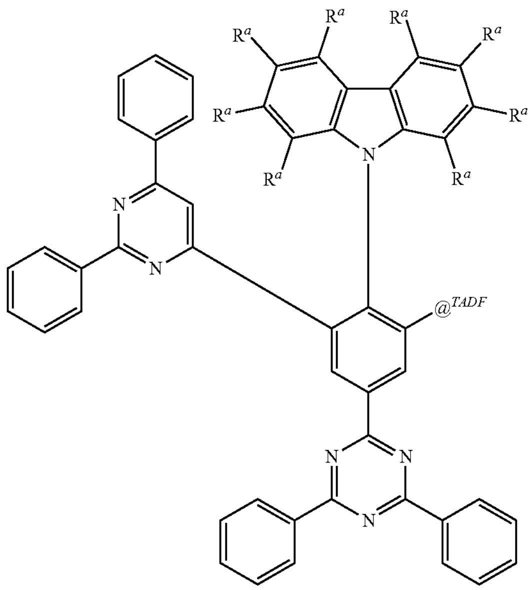

-continued
Formula $M^{TADF}$-16
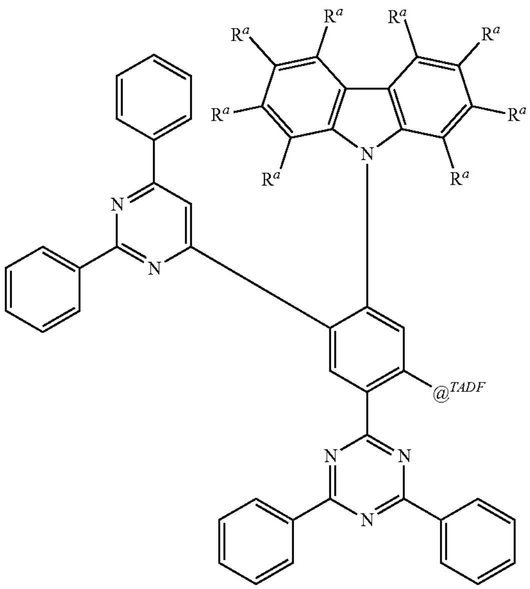
Formula $M^{TADF}$-17
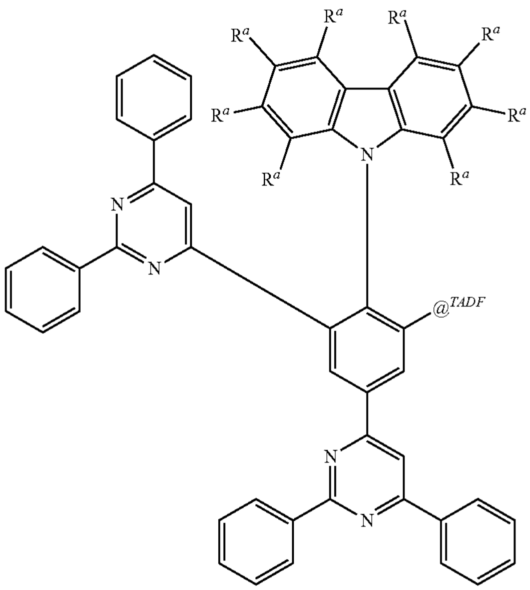
-continued
Formula $M^{TADF}$-18
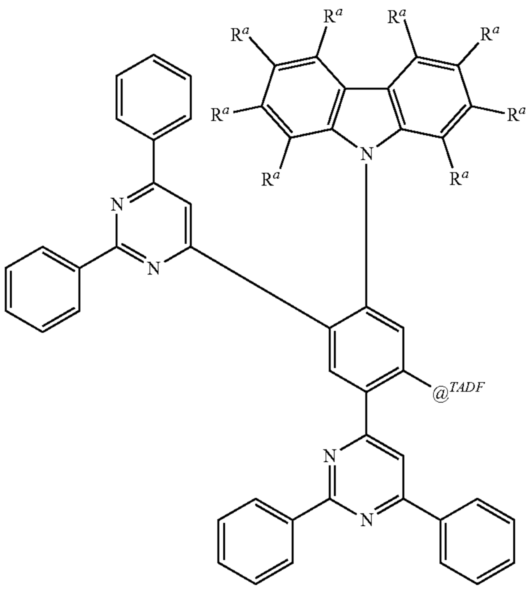
Formula $M^{TADF}$-19
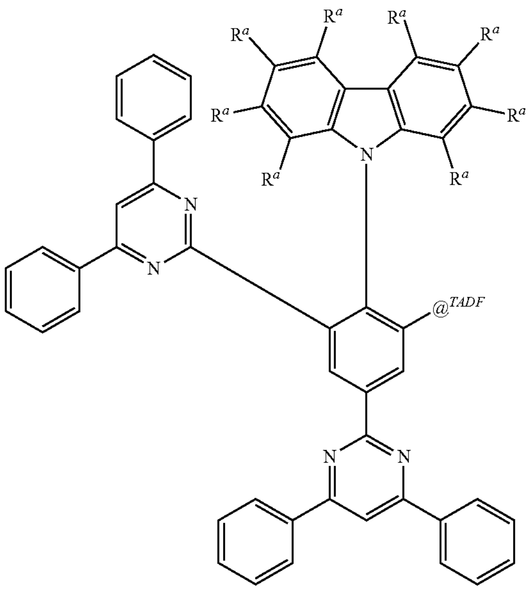

-continued
Formula $M^{TADF}$-20
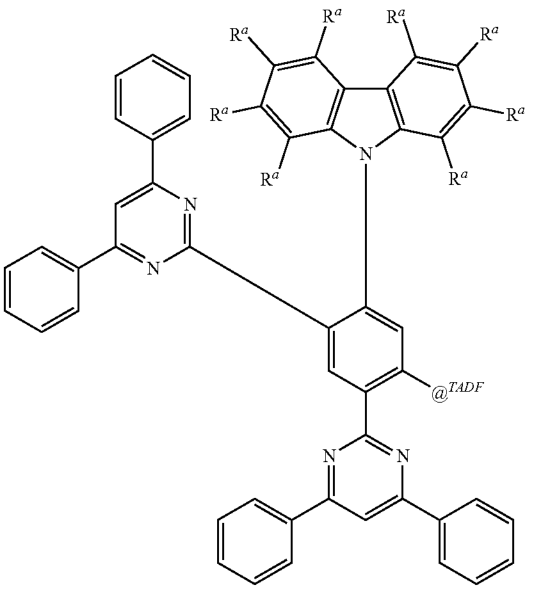
Formula $M^{TADF}$-21
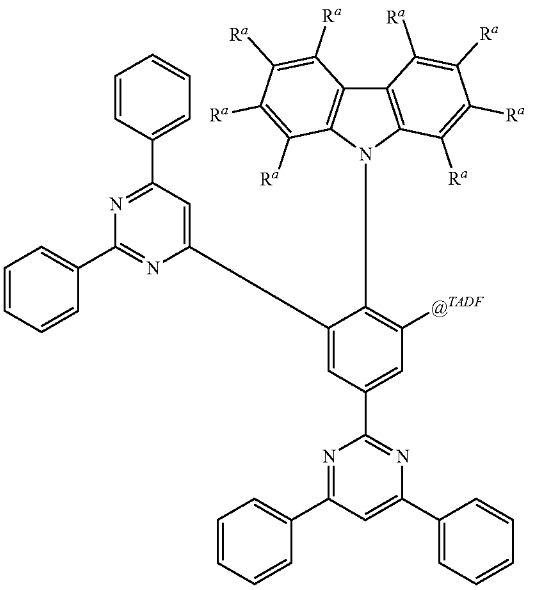
-continued
Formula $M^{TADF}$-22
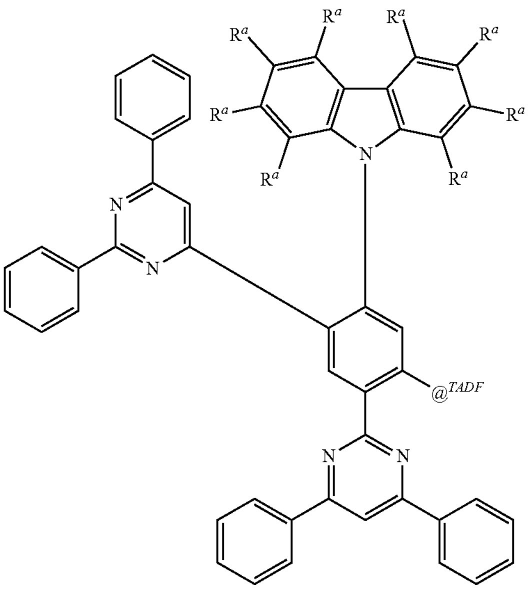
Formula $M^{TADF}$-23
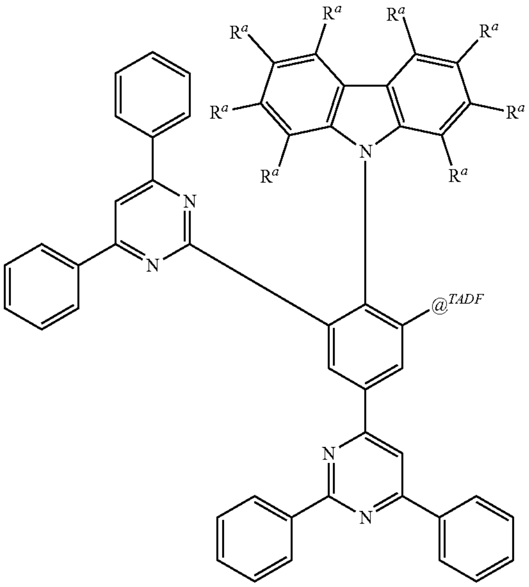

-continued
Formula $M^{TADF}$-24
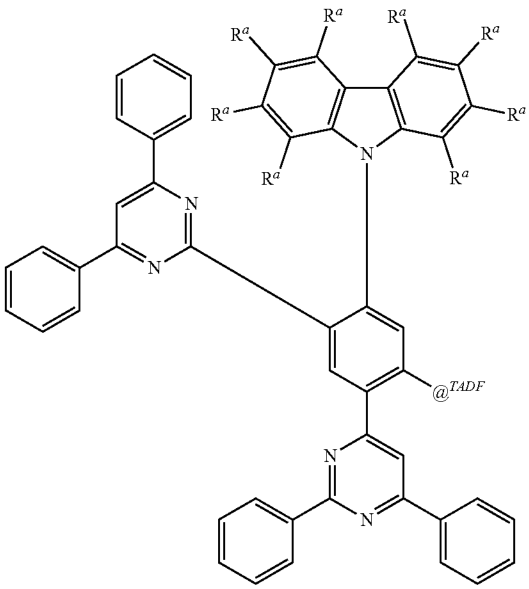
Formula $M^{TADF}$-25
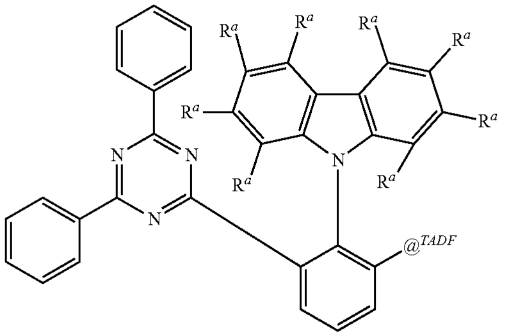
Formula $M^{TADF}$-26
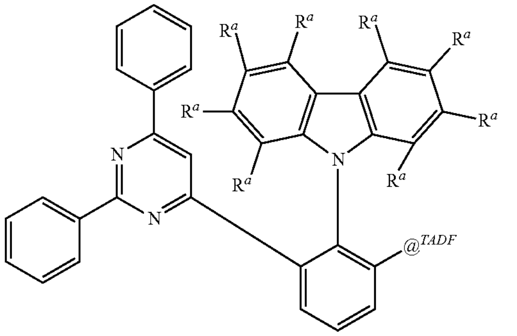
-continued
Formula $M^{TADF}$-27
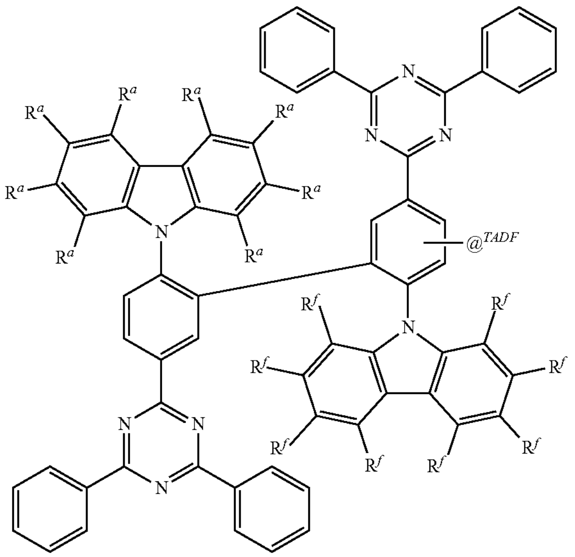
Formula $M^{TADF}$-28
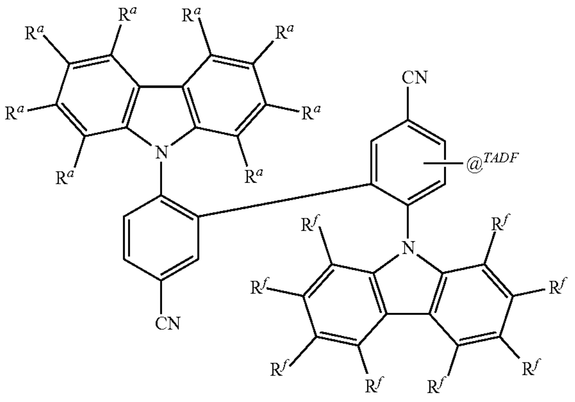
Formula $M^{TADF}$-29
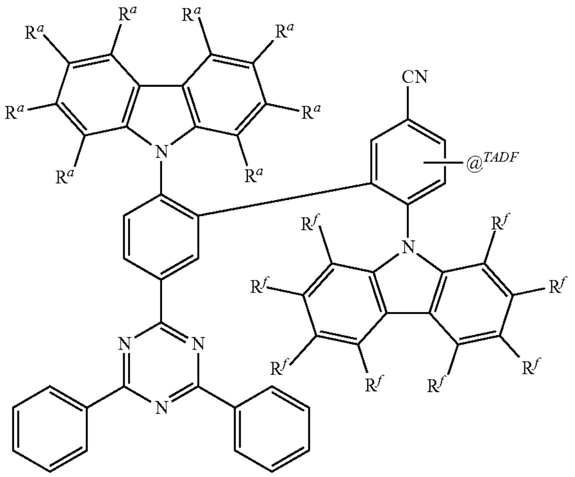

-continued
Formula $M^{TADF}$-30
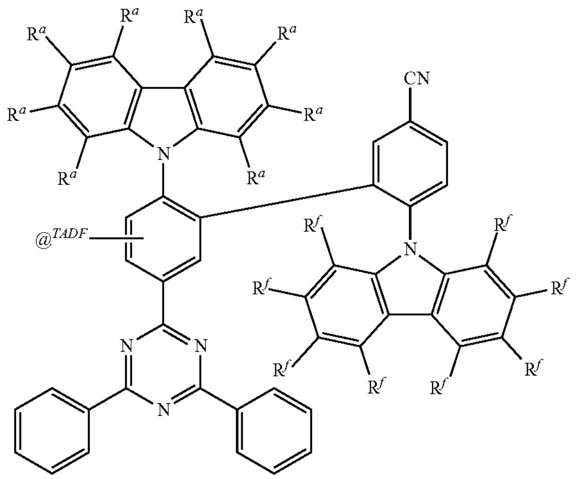
Formula $M^{TADF}$-31
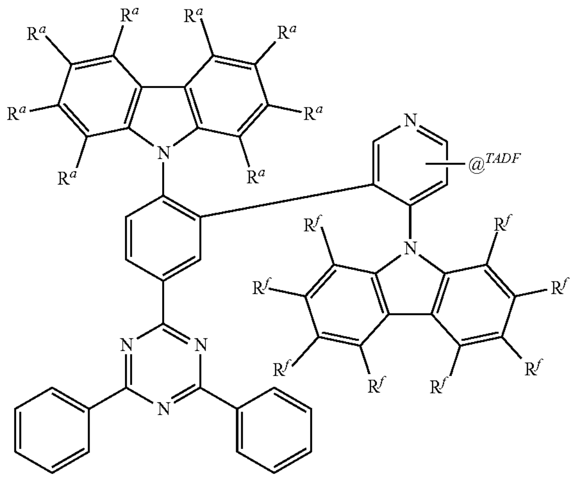
Formula $M^{TADF}$-32
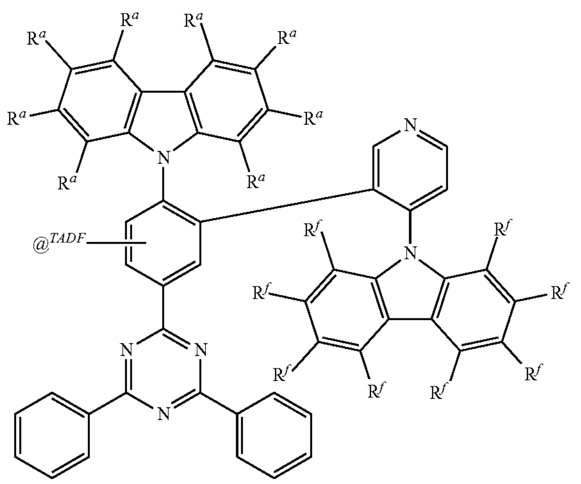
-continued
Formula $M^{TADF}$-33
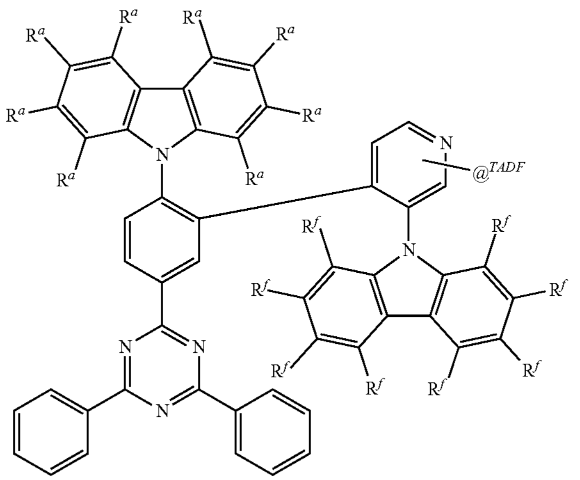
Formula $M^{TADF}$-34
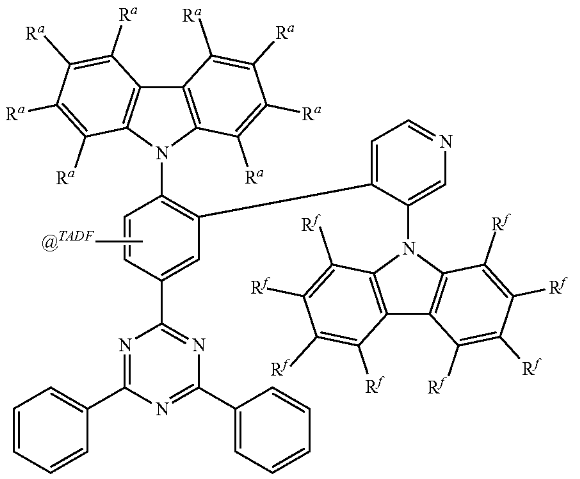
Formula $M^{TADF}$-35
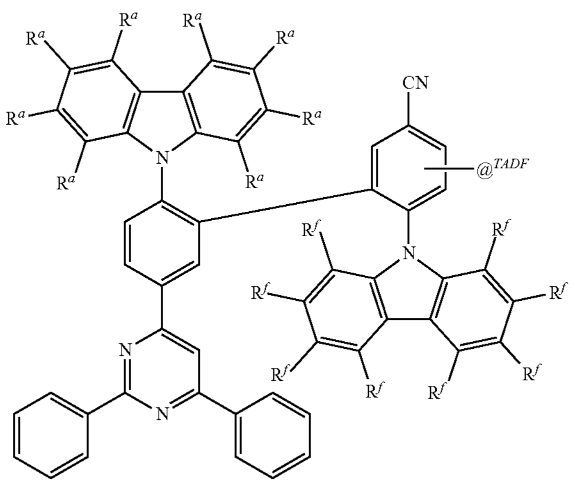

-continued
Formula $M^{TADF}$-36
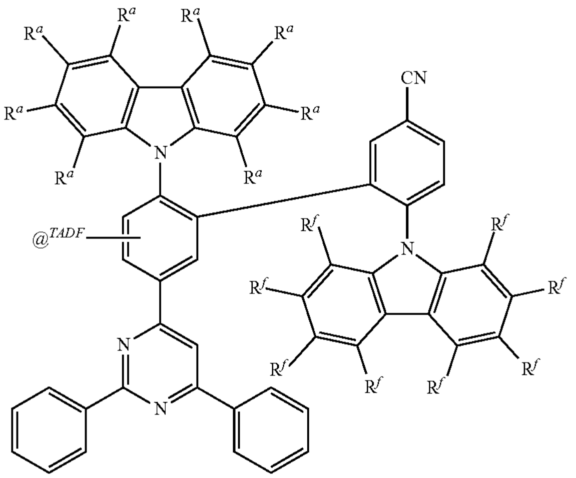
Formula $M^{TADF}$-37
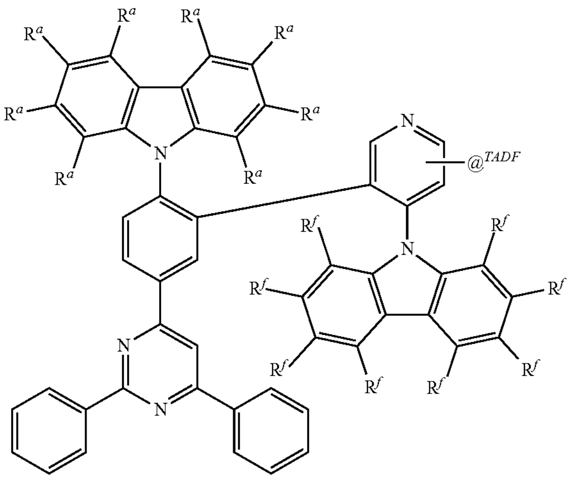
Formula $M^{TADF}$-38
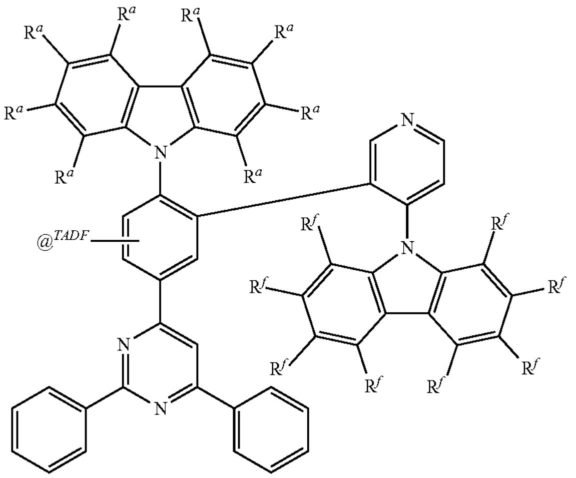
-continued
Formula $M^{TADF}$-39
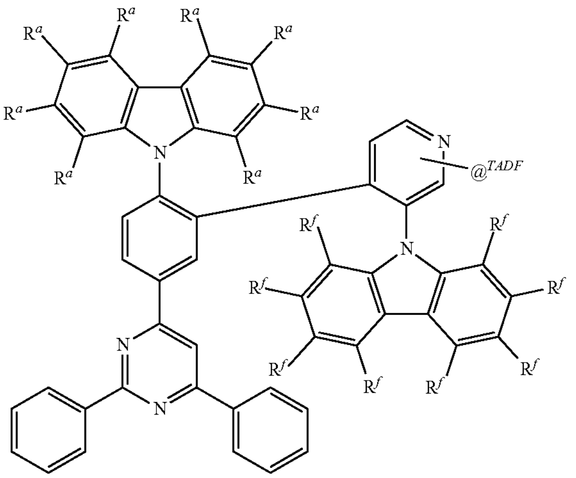
Formula $M^{TADF}$-40
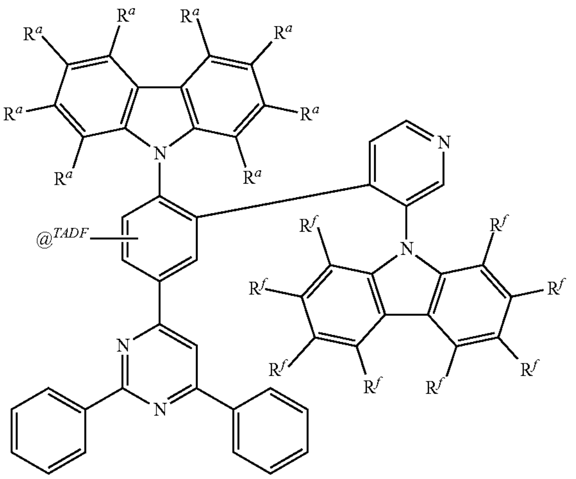
Formula $M^{TADF}$-41
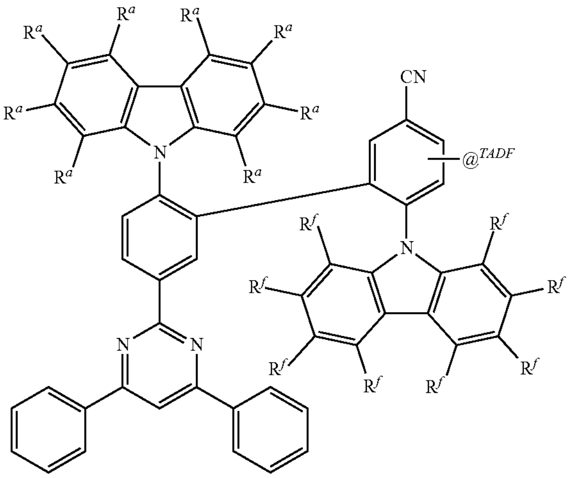

-continued
Formula $M^{TADF}$-42
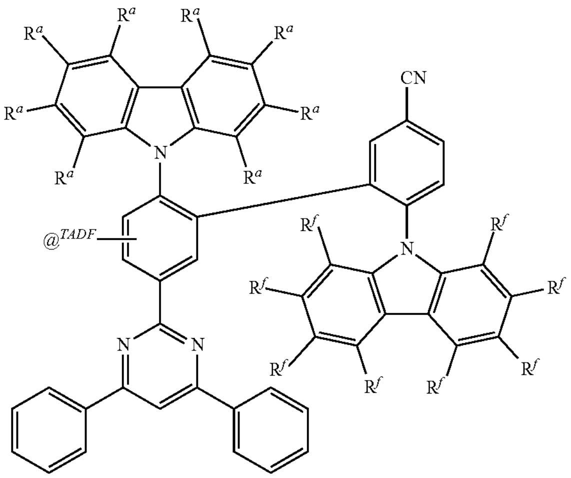
Formula $M^{TADF}$-43
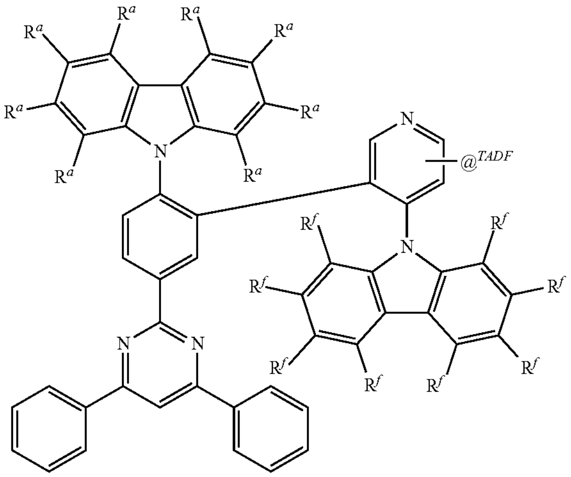
Formula $M^{TADF}$-44
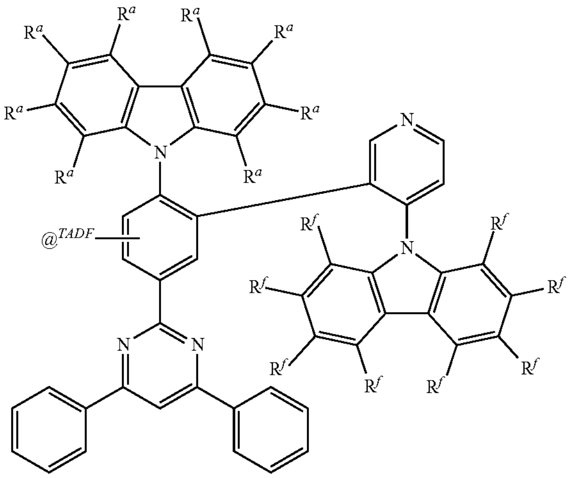
-continued
Formula $M^{TADF}$-45
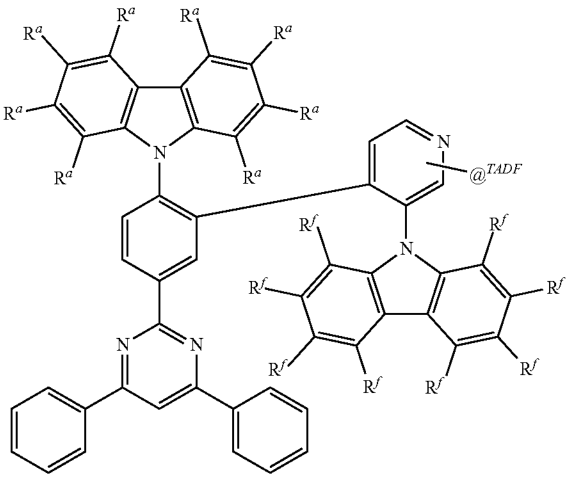
Formula $M^{TADF}$-46
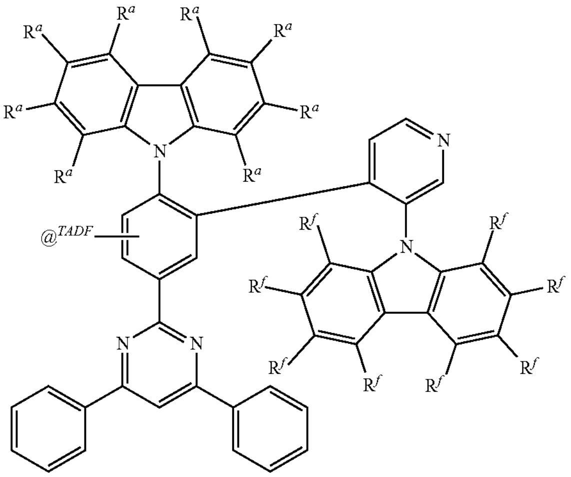
Formula $M^{TADF}$-47
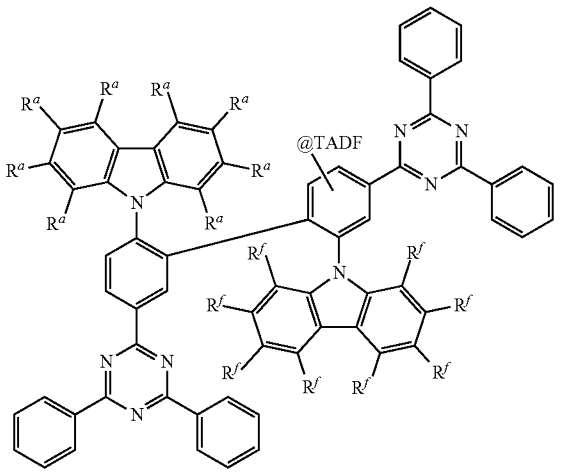

-continued

Formula $M^{TADF}$-48

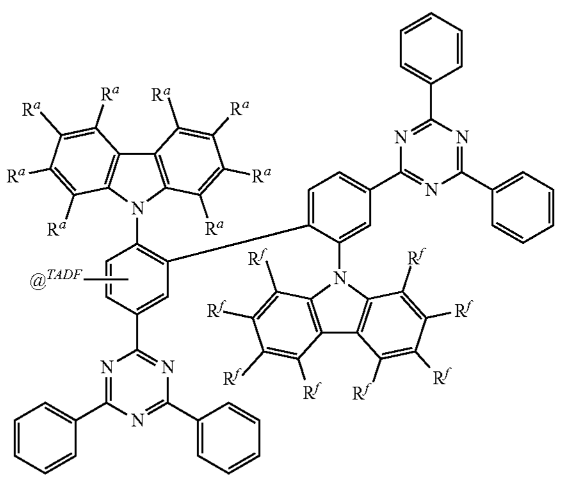

wherein for $R^a$ and $@^{TADF}$ the aforementioned definitions apply.

As used throughout the present application, the terms "aryl" and "aromatic" may be understood in the broadest sense as any mono-, bi- or polycyclic aromatic moieties. Accordingly, an aryl group contains 6 to 60 aromatic ring atoms, and a heteroaryl group contains 5 to 60 aromatic ring atoms, of which at least one is a heteroatom. Notwithstanding, throughout the application the number of aromatic ring atoms may be given as subscripted number in the definition of certain substituents. In particular, the heteroaromatic ring includes one to three heteroatoms. Again, the terms "heteroaryl" and "heteroaromatic" may be understood in the broadest sense as any mono-, bi- or polycyclic heteroaromatic moieties that include at least one heteroatom. The heteroatoms may at each occurrence be the same or different and be individually selected from the group consisting of N, O and S. Accordingly, the term "arylene" refers to a divalent substituent that bears two binding sites to other molecular structures and thereby serving as a linker structure. In case, a group in the exemplary embodiments is defined differently from the definitions given here, for example, the number of aromatic ring atoms or number of heteroatoms differs from the given definition, the definition in the exemplary embodiments is to be applied. According to the invention, a condensed (annulated) aromatic or heteroaromatic polycycle is built of two or more single aromatic or heteroaromatic cycles, which formed the polycycle via a condensation reaction.

In particular, as used throughout the present application the term aryl group or heteroaryl group comprises groups which can be bound via any position of the aromatic or heteroaromatic group, derived from benzene, naphthaline, anthracene, phenanthrene, pyrene, dihydropyrene, chrysene, perylene, fluoranthene, benzanthracene, benzphenanthrene, tetracene, pentacene, benzpyrene, furan, benzofuran, isobenzofuran, dibenzofuran, thiophene, benzothiophene, isobenzothiophene, dibenzothiophene; pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthoimidazole, phenanthroimidazole, pyridoimidazole, pyrazinoimidazole, quinoxalinoimidazole, oxazole, benzoxazole, napthooxazole, anthroxazol, phenanthroxazol, isoxazole, 1,2-thiazole, 1,3-thiazole, benzothiazole, pyridazine, benzopyridazine, pyrimidine, benzopyrimidine, 1,3,5-triazine, quinoxaline, pyrazine, phenazine, naphthyridine, carboline, benzocarboline, phenanthroline, 1,2,3-triazole, 1,2,4-triazole, benzotriazole, 1,2,3-oxadiazole, 1,2,4-oxadiazole, 1,2,5-oxadiazole, 1,2,3,4-tetrazine, purine, pteridine, indolizine und benzothiadiazole or combinations of the abovementioned groups.

As used throughout the present application the term cyclic group may be understood in the broadest sense as any mono-, bi- or polycyclic moieties.

As used throughout the present application the term alkyl group may be understood in the broadest sense as any linear, branched, or cyclic alkyl substituent. In particular, the term alkyl comprises the substituents methyl (Me), ethyl (Et), n-propyl ($^n$Pr), i-propyl ($^i$Pr), cyclopropyl, n-butyl ($^n$Bu), i-butyl ($^i$Bu), s-butyl ($^s$Bu), t-butyl ($^t$Bu), cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neo-hexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2,2,2]octyl, 2-bicyclo[2,2,2]-octyl, 2-(2,6-dimethyl)octyl, 3-(3,7-dimethyl)octyl, adamantyl, 2,2,2-trifluorethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyln-n-hexadec-1-yl, 1,1-diethyl-n-octadec-1-yl, 1-(n-propyl)-cyclohex-1-yl, 1-(n-butyl)-cyclohex-1-yl, 1-(n-hexyl)-cyclohex-1-yl, 1-(n-octyl)-cyclohex-1-yl und 1-(n-decyl)-cyclohex-1-yl.

As used throughout the present application the term alkenyl comprises linear, branched, and cyclic alkenyl substituents. The term alkenyl group exemplarily comprises the substituents ethenyl, propenyl, butenyl, pentenyl, cyclopentenyl, hexenyl, cyclohexenyl, heptenyl, cycloheptenyl, octenyl, cyclooctenyl or cyclooctadienyl.

As used throughout the present application the term alkynyl comprises linear, branched, and cyclic alkynyl substituents. The term alkynyl group exemplarily comprises ethynyl, propynyl, butynyl, pentynyl, hexynyl, heptynyl or octynyl.

As used throughout the present application the term alkoxy comprises linear, branched, and cyclic alkoxy substituents. The term alkoxy group exemplarily comprises methoxy, ethoxy, n-propoxy, i-propoxy, n-butoxy, i-butoxy, s-butoxy, t-butoxy and 2-methylbutoxy.

As used throughout the present application the term thioalkoxy comprises linear, branched, and cyclic thioalkoxy substituents, in which the O of the exemplarily alkoxy groups is replaced by S.

As used throughout the present application, the terms "halogen" and "halo" may be understood in the broadest sense as being preferably fluorine, chlorine, bromine or iodine.

Whenever hydrogen is mentioned herein, it could also be replaced by deuterium at each occurrence.

It is understood that when a molecular fragment is described as being a substituent or otherwise attached to another moiety, its name may be written as if it were a fragment (e.g. naphtyl, dibenzofuryl) or as if it were the whole molecule (e.g. naphthalene, dibenzofuran). As used herein, these different ways of designating a substituent or attached fragment are considered to be equivalent.

In one embodiment, the organic molecules according to the invention have an excited state lifetime of not more than 150 μs, of not more than 100 μs, in particular of not more than 50 μs, more preferably of not more than 10 μs or not more than 7 μs in a film of poly(methyl methacrylate) (PMMA) with 10% by weight of organic molecule at room temperature.

In one embodiment of the invention, the organic molecules according to the invention represent thermally-activated delayed fluorescence (TADF) emitters, which exhibit a $\Delta E_{ST}$ value, which corresponds to the energy difference between the first excited singlet state (S1) and the first excited triplet state (T1), of less than 5000 $cm^{-1}$, preferably less than 3000 $cm^{-1}$, more preferably less than 1500 $cm^{-1}$, even more preferably less than 1000 $cm^{-1}$ or even less than 500 $cm^{-1}$.

In a further embodiment of the invention, the organic molecules according to the invention have an emission peak in the visible or nearest ultraviolet range, i.e., in the range of a wavelength of from 380 to 800 nm, with a full width at half maximum of less than 0.50 eV, preferably less than 0.48 eV, more preferably less than 0.45 eV, even more preferably less than 0.43 eV or even less than 0.40 eV in a film of poly(methyl methacrylate) (PMMA) with 10% by weight of organic molecule at room temperature.

In a further embodiment of the invention, the organic molecules according to the invention have a "blue material index" (BMI), calculated by dividing the photoluminescence quantum yield (PLQY) in % by the CIEy color coordinate of the emitted light, of more than 150, in particular more than 200, preferably more than 250, more preferably of more than 300 or even more than 500.

In a further embodiment of the invention, the organic molecules according to the invention have a highest occupied molecular orbital with the energy $E^{HO}$MO, which is higher in energy than −6.2 eV, preferably higher in energy than −6.1 eV and even more preferably higher in energy than −6.0 eV or even −5.9 eV.

Orbital and excited state energies can be determined either by means of experimental methods or by calculations employing quantum-chemical methods, in particular density functional theory calculations. The energy of the highest occupied molecular orbital $E^{HOMO}$ is determined by methods known to the person skilled in the art from cyclic voltammetry measurements with an accuracy of 0.1 eV. The energy of the lowest unoccupied molecular orbital $E^{LUMO}$ is determined as the onset of the absorption spectrum.

The onset of an absorption spectrum is determined by computing the intersection of the tangent to the absorption spectrum with the x-axis. The tangent to the absorption spectrum is set at the low-energy side of the absorption band and at the point at half maximum of the maximum intensity of the absorption spectrum.

The energy of the first excited triplet state T1 is determined from the onset of the emission spectrum at low temperature, typically at 77 K. For host compounds, where the first excited singlet state and the lowest triplet state are energetically separated by >0.4 eV, the phosphorescence is usually visible in a steady-state spectrum in 2-Me-THF. The triplet energy can thus be determined as the onset of the phosphorescence spectrum. For TADF emitter molecules, the energy of the first excited triplet state T1 is determined from the onset of the delayed emission spectrum at 77 K, if not otherwise stated measured in a film of) PMMA with 10% by weight of emitter. Both for host and emitter compounds, the energy of the first excited singlet state S1 is determined from the onset of the emission spectrum, if not otherwise stated measured in a film of PMMA with 10% by weight of host or emitter compound. The onset of an emission spectrum is determined by computing the intersection of the tangent to the emission spectrum with the x-axis. The tangent to the emission spectrum is set at the high-energy side of the emission band, i.e., where the emission band rises by going from higher energy values to lower energy values, and at the point at half maximum of the maximum intensity of the emission spectrum.

A further aspect of the invention relates to the use of an organic molecule according to the invention as a luminescent emitter in an optoelectronic device.

The optoelectronic device may be understood in the broadest sense as any device based on organic materials that is suitable for emitting light in the visible or nearest ultraviolet (UV) range, i.e., in the range of a wavelength of from 380 to 800 nm. More preferably, the optoelectronic device may be able to emit light in the visible range, i.e., of from 400 to 800 nm.

In the context of such use, the optoelectronic device is more particularly selected from the group consisting of:

- organic light-emitting diodes (OLEDs),
- light-emitting electrochemical cells,
- OLED sensors (also: OLED-sensor), especially in gas and vapour sensors not hermetically externally shielded (also non-hermetically shielded gas and vapor sensors),
- organic diodes,
- organic solar cells,
- organic transistors,
- organic field-effect transistors,
- organic lasers and
- down-conversion elements.

In a preferred embodiment in the context of such use, the optoelectronic device is a device selected from the group consisting of an organic light emitting diode (OLED), a light emitting electrochemical cell (LEC), and a light-emitting transistor.

In the case of the use, the fraction of the organic molecule according to the invention in the emission layer in an optoelectronic device, more particularly in OLEDs, is 1% to 99% by weight, more particularly 5% to 80% by weight. In an alternative embodiment, the proportion of the organic molecule in the emission layer is 100% by weight.

In one embodiment, the light-emitting layer comprises not only the organic molecules according to the invention but also a host material whose triplet (T1) and singlet (S1) energy levels are energetically higher than the triplet (T1) and singlet (S1) energy levels of the organic molecule.

Light-Emitting Layer EML

In one embodiment, the light-emitting layer EML of an organic light-emitting diode of the invention comprises (or essentially consists of) a composition comprising or consisting of:

(i) 1-50% by weight, preferably 5-40% by weight, in particular 10-30% by weight, of one or more organic molecules according to the invention;

(ii) 5-99% by weight, preferably 30-94.9% by weight, in particular 40-89% by weight, of at least one host compound H; and (iii) optionally 0-94% by weight, preferably 0.1-65% by weight, in particular 1-50% by weight, of at least one further host compound D with a structure differing from the structure of the molecules according to the invention; and (iv) optionally 0-94% by weight, preferably 0-65% by weight, in particular 0-50% by weight, of a solvent; and (v) optionally 0-30% by weight, in particular 0-20% by weight, preferably 0-5% by weight, of at least one further emitter molecule F with a structure differing from the structure of the molecules according to the invention.

Preferably, energy can be transferred from the host compound H to the one or more organic molecules of the invention, in particular transferred from the first excited triplet state T1 (H) of the host compound H to the first excited triplet state T1 (E) of the one or more organic molecules according to the invention and/or from the first excited singlet state S1(H) of the host compound H to the first excited singlet state S1(E) of the one or more organic molecules according to the invention.

In one embodiment, the host compound H has a highest occupied molecular orbital HOMO(H) having an energy $E^{HOMO}$(H) in the range of from −5 eV to −6.5 eV and one organic molecule according to the invention E has a highest occupied molecular orbital HOMO(E) having an energy $E^{HOMO}$(E), wherein $E^{HOMO}$(H)>$E^{HOMO}$(E).

In a further embodiment, the host compound H has a lowest unoccupied molecular orbital LUMO(H) having an energy $E^{LUMO}$(H) and the one organic molecule according to the invention E has a lowest unoccupied molecular orbital LUMO(E) having an energy $E^{LUMO}$(E), wherein $E^{LUMO}$(H) >$E^{LUMO}$(E).

Light-Emitting Layer EML Comprising at Least One Further Host Compound D

In a further embodiment, the light-emitting layer EML of an organic light-emitting diode of the invention comprises (or essentially consists of) a composition comprising or consisting of:

(i) 1-50% by weight, preferably 5-40% by weight, in particular 10-30% by weight, of one organic molecule according to the invention;

(ii) 5-99% by weight, preferably 30-94.9% by weight, in particular 40-89% by weight, of one host compound H; and (iii) 0-94% by weight, preferably 0.1-65% by weight, in particular 1-50% by weight, of at least one further host compound D with a structure differing from the structure of the molecules according to the invention; and (iv) optionally 0-94% by weight, preferably 0-65% by weight, in particular 0-50% by weight, of a solvent; and (v) optionally 0-30% by weight, in particular 0-20% by weight, preferably 0-5% by weight, of at least one further emitter molecule F with a structure differing from the structure of the molecules according to the invention.

In one embodiment of the organic light-emitting diode of the invention, the host compound H has a highest occupied molecular orbital HOMO(H) having an energy $E^{HOMO}$(H) in the range of from −5 eV to −6.5 eV and the at least one further host compound D has a highest occupied molecular orbital HOMO(D) having an energy $E^{HOMO}$(D), wherein $E^{HOMO}$(H)>$E^{HOMO}$(D). The relation $E^{HOMO}$(H)>$E^{HOMO}$(D) favors an efficient hole transport.

In a further embodiment, the host compound H has a lowest unoccupied molecular orbital LUMO(H) having an energy $E^{LUMO}$(H) and the at least one further host compound D has a lowest unoccupied molecular orbital LUMO(D) having an energy $E^{LUMO}$(D), wherein $E^{LUMO}$(H)>$E^{LUMO}$(D). The relation $E^{LUMO}$(H)>$E^{LUMO}$(D) favors an efficient electron transport.

In one embodiment of the organic light-emitting diode of the invention, the host compound H has a highest occupied molecular orbital HOMO(H) having an energy $E^{HOMO}$(H) and a lowest unoccupied molecular orbital LUMO(H) having an energy $E^{LUMO}$(H), and the at least one further host compound D has a highest occupied molecular orbital HOMO(D) having an energy $E^{HOMO}$(D) and a lowest unoccupied molecular orbital LUMO(D) having an energy $E^{LUMO}$(D), the organic molecule E of the invention has a highest occupied molecular orbital HOMO(E) having an energy $E^{HOMO}$(E) and a lowest unoccupied molecular orbital LUMO(E) having an energy $E^{LUMO}$(E), wherein $E^{HOMO}$(H)>$E^{HOMO}$(D) and the difference between the energy level of the highest occupied molecular orbital HOMO(E) of organic molecule according to the invention ($E^{HOMO}$(E)) and the energy level of the highest occupied molecular orbital HOMO (H) of the host compound H ($E^{HOMO}$(H)) is between −0.5 eV and 0.5 eV, more preferably between −0.3 eV and 0.3 eV, even more preferably between −0.2 eV and 0.2 eV or even between −0.1 eV and 0.1 eV; and $E^{LUMO}$(H)>$E^{LUMO}$(D) and the difference between the energy level of the lowest unoccupied molecular orbital LUMO(E) of organic molecule according to the invention ($E^{LUMO}$(E)) and the lowest unoccupied molecular orbital LUMO(D) of the at least one further host compound D ($E^{LUMO}$(D)) is between −0.5 eV and 0.5 eV, more preferably between −0.3 eV and 0.3 eV, even more preferably between −0.2 eV and 0.2 eV or even between −0.1 eV and 0.1 eV.

Optoelectronic Devices

In a further aspect, the invention relates to an optoelectronic device comprising an organic molecule or a composition as described herein, more particularly in the form of a device selected from the group consisting of organic light-emitting diode (OLED), light-emitting electrochemical cell, OLED sensor, more particularly gas and vapour sensors not hermetically externally shielded (non-hermetically shielded gas and vapor sensor), organic diode, organic solar cell, organic transistor, organic field-effect transistor, organic laser, and down-conversion element.

In a preferred embodiment, the optoelectronic device is a device selected from the group consisting of an organic light emitting diode (OLED), a light emitting electrochemical cell (LEC), and a light-emitting transistor.

In one embodiment of the optoelectronic device of the invention, the organic molecule according to the invention is used as emission material in a light-emitting layer EML.

In one embodiment of the optoelectronic device of the invention, the light-emitting layer EML consists of the composition according to the invention described herein.

When the optoelectronic device is an OLED, it may, for example, exhibit the following layer structure:

1. substrate
2. anode layer A
3. hole injection layer, HIL
4. hole transport layer, HTL
5. electron blocking layer, EBL
6. emitting layer, EML
7. hole blocking layer, HBL
8. electron transport layer, ETL
9. electron injection layer, EIL
10. cathode layer, wherein the OLED comprises each layer only optionally, different layers may be merged and the OLED may comprise more than one layer of each layer type defined above.

Furthermore, the optoelectronic device may optionally comprise one or more protective layers protecting the device from damaging exposure to harmful species in the environment including, exemplarily moisture, vapor and/or gases.

In one embodiment of the invention, the optoelectronic device is an OLED, which exhibits the following inverted layer structure:

1. substrate
2. cathode layer
3. electron injection layer, EIL
4. electron transport layer, ETL
5. hole blocking layer, HBL
6. emitting layer, B
7. electron blocking layer, EBL
8. hole transport layer, HTL
9. hole injection layer, HIL
10. anode layer A wherein the OLED with an inverted layer structure comprises each layer only optionally, different layers may be merged and the OLED may comprise more than one layer of each layer types defined above.

In one embodiment of the invention, the optoelectronic device is an OLED, which may exhibit stacked architecture. In this architecture, contrary to the typical arrangement, where the OLEDs are placed side by side, the individual units are stacked on top of each other. Blended light may be generated with OLEDs exhibiting a stacked architecture, in particular white light may be generated by stacking blue, green and red OLEDs. Furthermore, the OLED exhibiting a stacked architecture may optionally comprise a charge generation layer (CGL), which is typically located between two OLED subunits and typically consists of a n-doped and p-doped layer with the n-doped layer of one CGL being typically located closer to the anode layer.

In one embodiment of the invention, the optoelectronic device is an OLED, which comprises two or more emission layers between anode and cathode. In particular, this so-called tandem OLED comprises three emission layers, wherein one emission layer emits red light, one emission layer emits green light and one emission layer emits blue light, and optionally may comprise further layers such as charge generation layers, blocking or transporting layers between the individual emission layers. In a further embodiment, the emission layers are adjacently stacked. In a further embodiment, the tandem OLED comprises a charge generation layer between each two emission layers. In addition, adjacent emission layers or emission layers separated by a charge generation layer may be merged.

The substrate may be formed by any material or composition of materials. Most frequently, glass slides are used as substrates. Alternatively, thin metal layers (e.g., copper, gold, silver or aluminum films) or plastic films or slides may be used. This may allow a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C is transparent. Preferably, the anode layer A comprises a large content or even consists of transparent conductive oxides (TCOs). Such anode layer A may exemplarily comprise indium tin oxide, aluminum zinc oxide, fluorine doped tin oxide, indium zinc oxide, PbO, SnO, zirconium oxide, molybdenum oxide, vanadium oxide, wolfram oxide, graphite, doped Si, doped Ge, doped GaAs, doped polyaniline, doped polypyrrol and/or doped polythiophene.

Preferably, the anode layer A (essentially) consists of indium tin oxide (ITO). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may comprise poly-3,4-ethylendioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL). The HIL may exemplarily comprise PEDOT:PSS (poly-3,4-ethylendioxy thiophene: polystyrene sulfonate), PEDOT (poly-3,4-ethylendioxy thiophene), mMTDATA (4,4',4"-tris[phenyl(m-tolyl)amino] triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenyl-amino)phenyl]benzidine), MeO-TPD (N,N,N',N'-tetrakis(4-methoxyphenyl)benzidine), HAT-CN (1,4,5,8,9,11-hexaazatriphenylen-hexacarbonitrile) and/or Spiro-NPD (N,N'-diphenyl-N,N'-bis-(1-naphthyl)-9,9'-spirobifluorene-2,7-diamine).

Adjacent to the anode layer A or hole injection layer (HIL) typically a hole transport layer (HTL) is located. Herein, any hole transport compound may be used. Exemplarily, electron-rich heteroaromatic compounds such as triarylamines and/or carbazoles may be used as hole transport compound. The HTL may decrease the energy barrier between the anode layer A and the light-emitting layer EML. The hole transport layer (HTL) may also be an electron blocking layer (EBL). Preferably, hole transport compounds bear comparably high energy levels of their triplet states T1. Exemplarily the hole transport layer (HTL) may comprise a star-shaped heterocycle such as tris(4-carbazoyl-9-ylphenyl)amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4"-tris[2-naphthyl(phenyl)amino] triphenylamine), Spiro-TAD, DNTPD, NPB, NPNPB, MeO-TPD, HAT-CN and/or TrisPcz (9,9'-diphenyl-6-(9-phenyl-9H-carbazol-3-yl)-9H,9'H-3,3'-bicarbazole). In addition, the HTL may comprise a p-doped layer, which may be composed of an inorganic or organic dopant in an organic hole-transporting matrix. Transition metal oxides such as vanadium oxide, molybdenum oxide or tungsten oxide may exemplarily be used as inorganic dopant. Tetrafluorotetracyanoquinodimethane (F4-TCNQ), copper-pentafluorobenzoate (Cu(I)pFBz) or transition metal complexes may exemplarily be used as organic dopant.

The EBL may, for example, comprise mCP (1,3-bis(carbazol-9-yl)benzene), TCTA, 2-TNATA, mCBP (3,3-di(9H-carbazol-9-yl)biphenyl), SiMCP (3,5-Di(9H-carbazol-9-yl) phenyl]triphenylsilane), DPEPO, tris-Pcz, CzSi (9-(4-tert-Butylphenyl)-3,6-bis(triphenylsilyl)-9H-carbazole), and/or DCB (N,N'-dicarbazolyl-1,4-dimethylbenzene).

Adjacent to the hole transport layer (HTL), the light-emitting layer EML is typically located. The light-emitting layer EML comprises at least one light emitting molecule. Particular, the EML comprises at least one light emitting molecule according to the invention. In one embodiment, the light-emitting layer comprises only the organic molecules according to the invention. Typically, the EML additionally comprises one or more host material. Exemplarily, the host material is selected from CBP (4,4'-Bis-(N-carbazolyl)-biphenyl), mCP, mCBP Sif87 (dibenzo[b,d]thiophen-2-yltriphenylsilane), CzSi, SimCP ([3,5-Di(9H-carbazol-9-yl)phenyl]triphenylsilane), Sif88 (dibenzo[b,d]thiophen-2-yl) diphenylsilane), DPEPO (bis[2-(diphenylphosphino) phenyl]ether oxide), 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris (biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine). The host material typically should be selected to exhibit first triplet (T1) and first singlet (S1) energy levels, which are energetically higher than the first triplet (T1) and first singlet (S1) energy levels of the organic molecule.

In one embodiment of the invention, the EML comprises a so-called mixed-host system with at least one hole-dominant host and one electron-dominant host. In a particular embodiment, the EML comprises exactly one light emitting molecule species according to the invention and a mixed-host system comprising T2T as electron-dominant host and a host selected from CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole as hole-dominant host. In a further embodiment the EML comprises 50-80% by weight, preferably 60-75% by weight of a host selected from CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl) phenyl]-9H-carbazole and 9-[3,5-bis(2-dibenzothiophenyl) phenyl]-9H-carbazole; 10-45% by weight, preferably 15-30% by weight of T2T and 5-40% by weight, preferably 10-30% by weight of light emitting molecule according to the invention.

Adjacent to the light-emitting layer EML an electron transport layer (ETL) may be located. Herein, any electron transporter may be used. Exemplarily, compounds poor of electrons such as, e.g., benzimidazoles, pyridines, triazoles, oxadiazoles (e.g., 1,3,4-oxadiazole), phosphinoxides and sulfone, may be used. An electron transporter may also be a star-shaped heterocycle such as 1,3,5-tri(1-phenyl-1H-benzo [d]imidazol-2-yl)phenyl (TPBi). The ETL may comprise NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphinoxide), BPyTP2 (2,7-di(2,2'-bipyridin-5-yl)triphenyle), Sif87 (dibenzo[b,d]thiophen-2-yltriphenylsilane), Sif88 (dibenzo[b,d]thiophen-2-yl)diphenylsilane), BmPyPhB (1,3-bis[3,5-di(pyridin-3-yl)phenyl]benzene) and/or BTB (4,4'-bis-[2-(4,6-diphenyl-1,3,5-triazinyl)]-1,1'-biphenyl). Optionally, the ETL may be doped with materials such as Liq. The electron transport layer (ETL) may also block holes or a holeblocking layer (HBL) is introduced.

The HBL may, for example, comprise BCP (2,9-dimethyl-4,7-diphenyl-1,10-phenanthroline=Bathocuproine), BAlq (bis(8-hydroxy-2-methylquinoline)-(4-phenylphenoxy)aluminum), NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphinoxide), T2T (2,4,6-tris(biphenyl-3-yl)-1,3,5-triazine), T3T (2,4,6-tris(triphenyl-3-yl)-1,3,5-triazine), TST (2,4,6-tris(9,9'-spirobifluorene-2-yl)-1,3,5-triazine), and/or TCB/TCP (1,3,5-tris(N-carbazolyl)benzol/1,3,5-tris (carbazol)-9-yl) benzene).

A cathode layer C may be located adjacent to the electron transport layer (ETL). For example, the cathode layer C may comprise or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer may also consist of (essentially) non-transparent metals such as Mg, Ca or Al. Alternatively or additionally, the cathode layer C may also comprise graphite and or carbon nanotubes (CNTs). Alternatively, the cathode layer C may also consist of nanoscalic silver wires.

An OLED may further, optionally, comprise a protection layer between the electron transport layer (ETL) and the cathode layer C (which may be designated as electron injection layer (EIL)). This layer may comprise lithium fluoride, cesium fluoride, silver, Liq (8-hydroxyquinolinolatolithium), $Li_2O$, $BaF_2$, MgO and/or NaF.

Optionally, also the electron transport layer (ETL) and/or a hole blocking layer (HBL) may comprise one or more host compounds.

In order to modify the emission spectrum and/or the absorption spectrum of the light-emitting layer EML further, the light-emitting layer EML may further comprise one or more further emitter molecule F. Such an emitter molecule F may be any emitter molecule known in the art. Preferably such an emitter molecule F is a molecule with a structure differing from the structure of the molecules according to the invention. The emitter molecule F may optionally be a TADF emitter. Alternatively, the emitter molecule F may optionally be a fluorescent and/or phosphorescent emitter molecule which is able to shift the emission spectrum and/or the absorption spectrum of the light-emitting layer EML. Exemplarily, the triplet and/or singlet excitons may be transferred from the emitter molecule according to the invention to the emitter molecule F before relaxing to the ground state S0 by emitting light typically red-shifted in comparison to the light emitted by emitter molecule E. Optionally, the emitter molecule F may also provoke two-photon effects (i.e., the absorption of two photons of half the energy of the absorption maximum).

Optionally, an optoelectronic device (e.g., an OLED) may exemplarily be an essentially white optoelectronic device. Exemplarily such white optoelectronic device may comprise at least one (deep) blue emitter molecule and one or more emitter molecules emitting green and/or red light. Then, there may also optionally be energy transmittance between two or more molecules as described above.

As used herein, if not defined more specifically in the particular context, the designation of the colors of emitted and/or absorbed light is as follows:

violet: wavelength range of >380-420 nm;
deep blue: wavelength range of >420-480 nm;
sky blue: wavelength range of >480-500 nm;
green: wavelength range of >500-560 nm;
yellow: wavelength range of >560-580 nm;
orange: wavelength range of >580-620 nm;
red: wavelength range of >620-800 nm.

With respect to emitter molecules, such colors refer to the emission maximum. Therefore, exemplarily, a deep blue emitter has an emission maximum in the range of from >420 to 480 nm, a sky-blue emitter has an emission maximum in the range of from >480 to 500 nm, a green emitter has an emission maximum in a range of from >500 to 560 nm, a red emitter has an emission maximum in a range of from >620 to 800 nm.

A further embodiment of the present invention relates to an OLED, which emits light with CIEx and CIEy color coordinates close to the CIEx (=0.131) and CIEy (=0.046) color coordinates of the primary color blue (CIEx=0.131 and CIEy=0.046) as defined by ITU-R Recommendation BT.2020 (Rec. 2020) and thus is suited for the use in Ultra High Definition (UHD) displays, e.g. UHD-TVs. In this context, the term "close to" refers to the ranges of CIEx and CIEy coordinates provided at the end of this paragraph. In commercial applications, typically top-emitting (top-electrode is transparent) devices are used, whereas test devices as described throughout the present application represent bottom-emitting devices (bottom-electrode and substrate are transparent). The CIEy color coordinate of a blue device can be reduced by up to a factor of two, when changing from a bottom- to a top-emitting device, while the CIEx remains nearly unchanged (Okinaka et al. doi:10.1002/sdtp.10480). Accordingly, a further embodiment of the present invention relates to an OLED, whose emission exhibits a CIEx color coordinate of between 0.02 and 0.30, preferably between 0.03 and 0.25, more preferably between 0.05 and 0.20 or even more preferably between 0.08 and 0.18 or even between 0.10 and 0.15 and/or a CIEy color coordinate of between 0.00 and 0.45, preferably between 0.01 and 0.30, more preferably between 0.02 and 0.20 or even more preferably between 0.03 and 0.15 or even between 0.04 and 0.10.

A further embodiment of the present invention relates to an OLED, which emits light with CIEx and CIEy color coordinates close to the CIEx (=0.170) and CIEy (=0.797) color coordinates of the primary color green (CIEx=0.170 and CIEy=0.797) as defined by ITU-R Recommendation BT.2020 (Rec. 2020) and thus is suited for the use in Ultra High Definition (UHD) displays, e.g. UHD-TVs. In this context, the term "close to" refers to the ranges of CIEx and CIEy coordinates provided at the end of this paragraph. In commercial applications, typically top-emitting (top-electrode is transparent) devices are used, whereas test devices as used throughout the present application represent bottom-emitting devices (bottom-electrode and substrate are transparent). The CIEy color coordinate of a blue device can be reduced by up to a factor of two, when changing from a bottom- to a top-emitting device, while the CIEx remains nearly unchanged (Okinaka et al. doi:10.1002/sdtp.10480). Accordingly, a further aspect of the present invention relates to an OLED, whose emission exhibits a CIEx color coordinate of between 0.06 and 0.34, preferably between 0.07 and 0.29, more preferably between 0.09 and 0.24 or even more preferably between 0.12 and 0.22 or even between 0.14 and 0.19 and/or a CIEy color coordinate of between 0.75 and 1.20, preferably between 0.76 and 1.05, more preferably between 0.77 and 0.95 or even more preferably between 0.78 and 0.90 or even between 0.79 and 0.85.

A further embodiment of the present invention relates to an OLED, which emits light with CIEx and CIEy color coordinates close to the CIEx (=0.708) and CIEy (=0.292) color coordinates of the primary color red (CIEx=0.708 and CIEy=0.292) as defined by ITU-R Recommendation BT.2020 (Rec. 2020) and thus is suited for the use in Ultra High Definition (UHD) displays, e.g. UHD-TVs. In this context, the term "close to" refers to the ranges of CIEx and CIEy coordinates provided at the end of this paragraph. In commercial applications, typically top-emitting (top-electrode is transparent) devices are used, whereas test devices as used throughout the present application represent bottom-emitting devices (bottom-electrode and substrate are transparent). The CIEy color coordinate of a blue device can be reduced by up to a factor of two, when changing from a bottom- to a top-emitting device, while the CIEx remains nearly unchanged (Okinaka et al. doi:10.1002/sdtp.10480). Accordingly, a further aspect of the present invention relates to an OLED, whose emission exhibits a CIEx color coordinate of between 0.60 and 0.88, preferably between 0.61 and 0.83, more preferably between 0.63 and 0.78 or even more preferably between 0.66 and 0.76 or even between 0.68 and 0.73 and/or a CIEy color coordinate of between 0.25 and 0.70, preferably between 0.26 and 0.55, more preferably between 0.27 and 0.45 or even more preferably between 0.28 and 0.40 or even between 0.29 and 0.35.

Accordingly, a further aspect of the present invention relates to an OLED, which exhibits an external quantum efficiency at 1000 cd/m$^2$ of more than 8%, more preferably of more than 10%, more preferably of more than 13%, even more preferably of more than 15% or even more than 20% and/or exhibits an emission maximum between 420 nm and 500 nm, preferably between 430 nm and 490 nm, more preferably between 440 nm and 480 nm, even more preferably between 450 nm and 470 nm and/or exhibits a LT80 value at 500 cd/m$^2$ of more than 100 h, preferably more than 200 h, more preferably more than 400 h, even more preferably more than 750 h or even more than 1000 h.

The optoelectronic device, in particular the OLED according to the present invention can be produced by any means of vapor deposition and/or liquid processing. Accordingly, at least one layer is prepared by means of a sublimation process, prepared by means of an organic vapor phase deposition process, prepared by means of a carrier gas sublimation process, solution processed or printed.

The methods used to produce the optoelectronic device, in particular the OLED according to the present invention are known in the art. The different layers are individually and successively deposited on a suitable substrate by means of subsequent deposition processes. The individual layers may be deposited using the same or differing deposition methods.

Vapor deposition processes exemplarily comprise thermal (co)evaporation, chemical vapor deposition and physical vapor deposition. For active matrix OLED display, an AMOLED backplane is used as substrate. The individual layer may be processed from solutions or dispersions employing adequate solvents. Solution deposition process exemplarily comprise spin coating, dip coating and jet printing. Liquid processing may optionally be carried out in an inert atmosphere (e.g., in a nitrogen atmosphere) and the solvent may optionally be completely or partially removed by means known in the state of the art.

EXAMPLES

General Synthesis Schemes

Synthesis of $M^{NRCT}$-L-$M^{TADF}$:

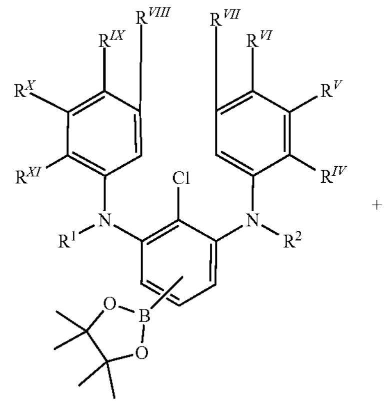

Z0

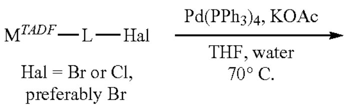

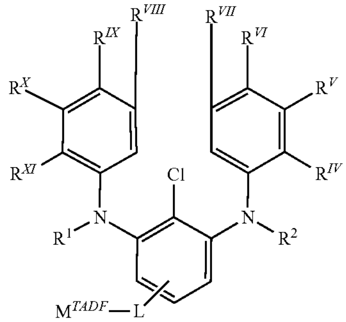

Z1

$M^{TADF}$-L-Hal, preferably $M^{TADF}$-L-Br, (1.0 equivalents), Z0 (1.0-1.5 equivalents), $Pd(PPh_3)_4$ (tetrakis(triphenylphosphine)palladium(0) (CAS:14221-01-3, 0.03 equivalents) and potassium carbonate (3.0 equivalents) are stirred overnight under nitrogen atmosphere in THF/Water (4:1) at 70° C. After cooling down to room temperature (rt), the reaction mixture is extracted with ethyl acetate/brine. The organic phases are collected, the organic solvent is removed and the crude product Z1 is purified by flash chromatography or by recrystallization.

For example:

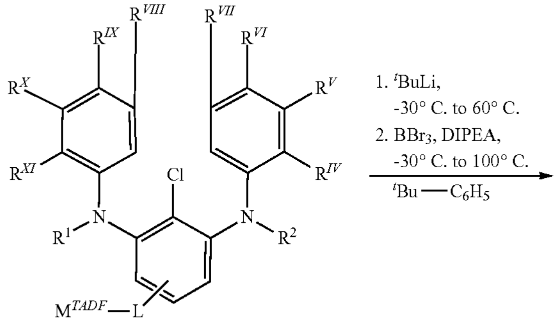

Z1

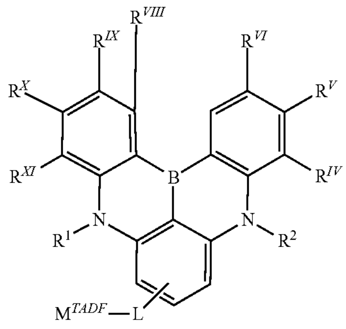

P1

Under $N_2$, in a flame-dried three-necked flask Z1' (1.00 equivalent) is dissolved in dry tert-butylbenzene and the solution is cooled to −30° C. A solution of tert-Butyllithium ($^tBuLi$, 2.5 M in hexanes) (2.2 equivalents) is added dropwise. The resulting mixture is allowed to warm to rt and subsequently heated at 60° C. for 2 h. Subsequently, volatile components are removed under high vacuum using a cooling trap cooled with liquid $N_2$. Afterwards, the residual mixture is cooled to −30° C. $BBr_3$ (2.0 equivalents) is added dropwise, the cooling bath removed and the mixture stirred at rt for 30 min. Subsequently, the mixture is cooled to 0° C., followed by dropwise addition of DIPEA (3.0 equivalents). The mixture is allowed to warm to rt, followed by heating at 100° C. for 16 h. After cooling down to rt ethyl acetate is added and the resulting solution poured onto a saturated aqueous solution of KOAc. The precipitated crude product is filtered off, washed with little ethyl acetate and dissolved in toluene. The resulting solution is dried over MgSO4, filtered and concentrated to yield the crude product P1. To obtain another product fraction, the phases of the previously obtained filtrate are separated and the aqueous layer extracted with ethyl acetate. The combined organic layers are washed with brine, dried over $MgSO_4$, filtered and concentrated. Both product fractions are combined and purified by MPLC or recrystallization to yield the desired compound P1 as a solid.

An example of an alternative synthetic route is as follows:
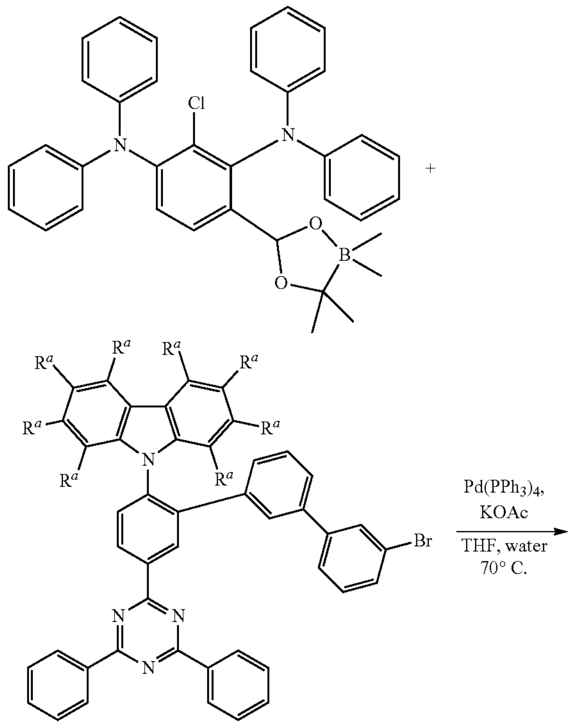
-continued
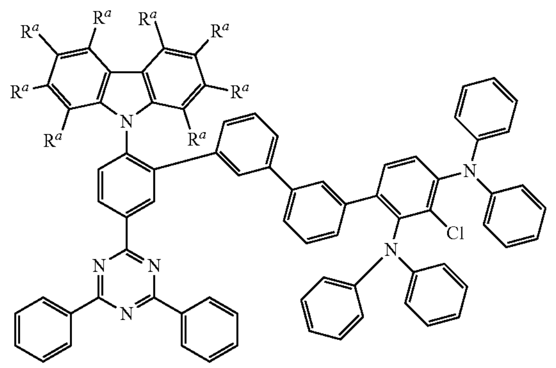
For example:
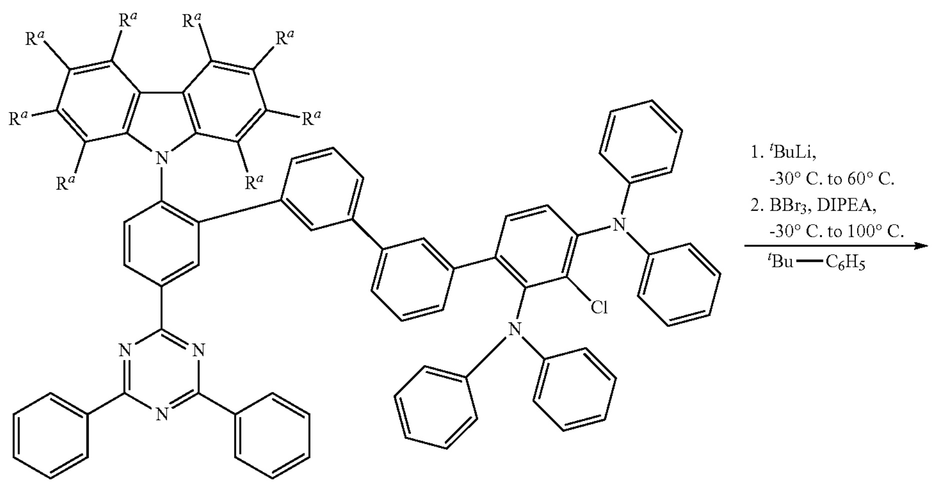

-continued

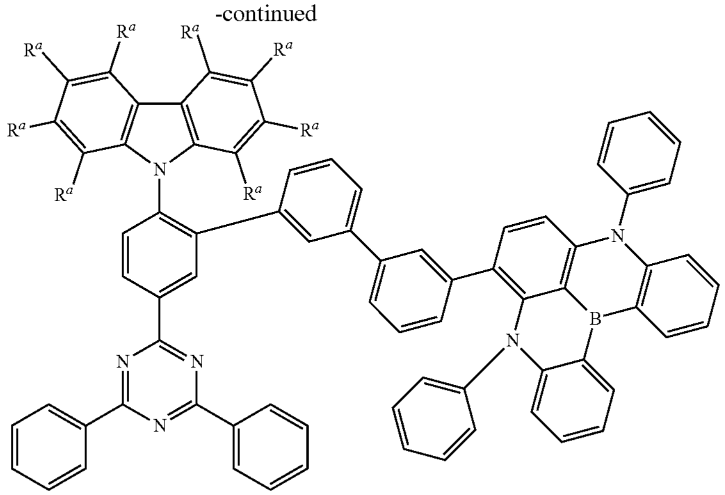

Alternative route for structures of Formulas: Formula $M^{NRCT}$-13 or Formula $M^{NRCT}$-14:

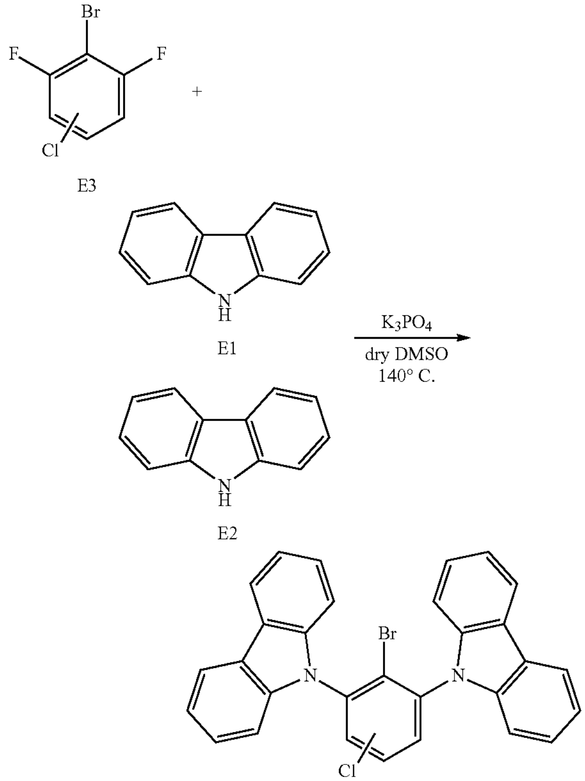

E3

E1

E2

Z1'

E1 (1 equivalent), E2 (1 equivalent), E3 and anhydrous $K_3PO_4$ are suspended in dry DMSO under nitrogen atmosphere and heated at 140° C. for 16 h. After cooling to room temperature, the reaction mixture poured into water. The precipitate is filtered off, washed with water and dried. Subsequently, the filter cake is dissolved in dichloromethane and the resulting solution dried over $MgSO_4$. After filtration and evaporation of the solvent, the crude product is purified by recrystallization or MPLC.

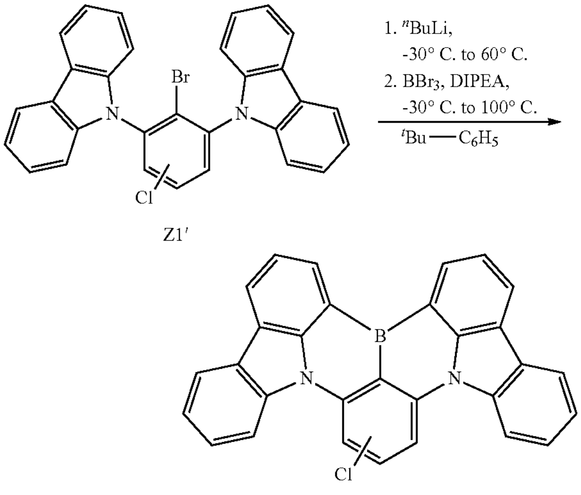

Z1'

P1'

Under $N_2$, in a flame-dried three-necked flask Z1' (1.00 equivalent) is dissolved in dry tert-butylbenzene and the solution is cooled to −30° C. A solution of n-Butyllithium ($^{n}$BuLi, 2.5 M in hexanes) (1.1 equivalents) is added dropwise. The resulting mixture is allowed to warm to rt and subsequently heated at 60° C. for 2 h. Subsequently, volatile components are removed under high vacuum using a cooling trap cooled with liquid $N_2$. Afterwards, the residual mixture is cooled to −30° C. $BBr_3$ (2.0 equivalents) is added dropwise, the cooling bath removed and the mixture stirred at rt for 30 min. Subsequently, the mixture is cooled to 0° C., followed by dropwise addition of DIPEA (3.0 equivalents). The mixture is allowed to warm to rt, followed by heating at 100° C. for 16 h. After cooling down to rt ethyl acetate is added and the resulting solution poured onto a saturated aqueous solution of KOAc. The precipitated crude product is filtered off, washed with little ethyl acetate and dissolved in toluene. The resulting solution is dried over MgSO4, filtered and concentrated to yield the crude product P1'. To obtain another product fraction, the phases of the previously obtained filtrate are separated and the aqueous layer extracted with ethyl acetate. The combined organic layers are washed with brine, dried over MgSO4, filtered and concentrated. Both product fractions are combined and purified by MPLC or recrystallization to yield the desired compound P1' as a solid.

P1' can then be coupled to $M^{TADF}$-L via a Suzuki-type coupling reaction. This means that P1' is either reacted with the boronic acid or boronic acid ester ($M^{TADF}$-L-$B(OH)_2$ or $M^{TADF}$-L-$B(OR)_2$ e.g. $M^{TADF}$-L-BPin; ($Pin=O_2C_2(CH_3)_4$) or is transferred to a boronic acid or boronic acid ester analogous of P1' via reaction with e.g. Bis(pinacolato) diboron ($B_2Pin_2$, CAS: 73183-34-3) and then coupled with $M^{TADF}$-L-Hal (Hal is either Br or Cl, preferably Br) via a Suzuki-type coupling reaction.

Synthesis of $M^{TADF}$-L-Hal and $M^{TADF}$-L-$B(OH)_2$ or $M^{TADF}$-L-$B(OR)_2$

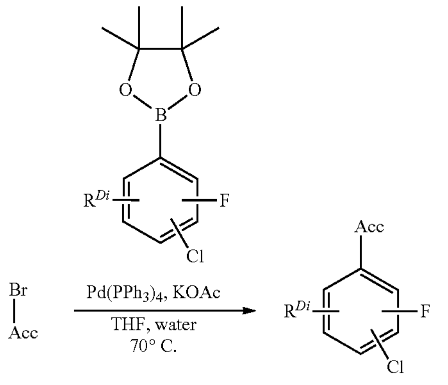

$Z^{TADF}0$

Acc-Br (1.0 equivalents) Chloro-fluoro-phenylboronic ester (1.0-1.5 equivalents), $Pd(PPh_3)_4$ (tetrakis(triphenylphosphine)palladium(0) (CAS:14221-01-3, 0.10 equivalents) and potassium carbonate (3.0 equivalents) are stirred overnight under nitrogen atmosphere in THF/Water (4:1) at 70° C. After cooling down to room temperature (rt), the reaction mixture is extracted with ethyl acetate/brine. The organic phases are collected, the organic solvent is removed and the crude product $Z^{TADF}0$ is purified by MPLC or by recrystallization.

Acc-Br is preferably chosen from structures of Formulas CI1 to CI23:

Formula CI1

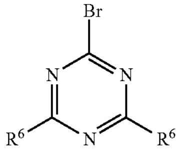

Formula CI2

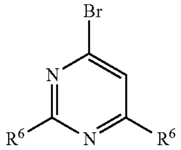

Formula CI3

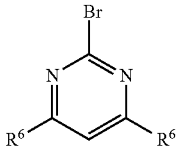

-continued

Formula CI4

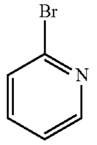

Formula CI5

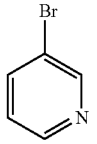

Formula CI6

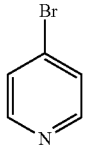

Formula CI7

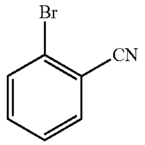

Formula CI8

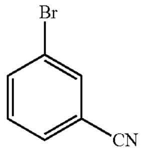

Formula CI9

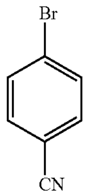

Formula CI10

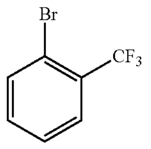

Formula CI11

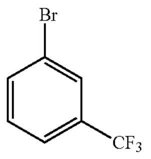

Formula CI12

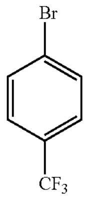

-continued

Formaula C113

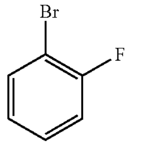

Formula C114

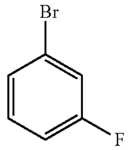

Formula C115

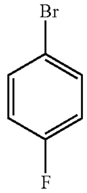

Formula C116

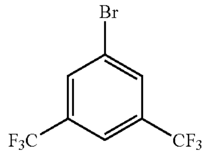

Formula C117

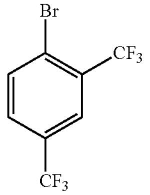

Formula C118

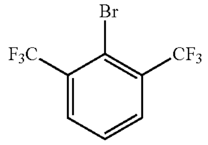

Formula C119

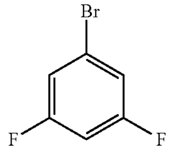

Formula C120

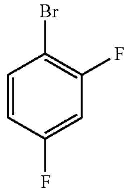

Formula C121

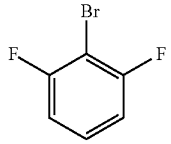

-continued

Formula C122

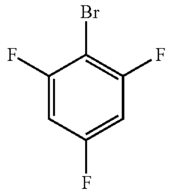

Formujla C123

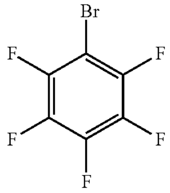

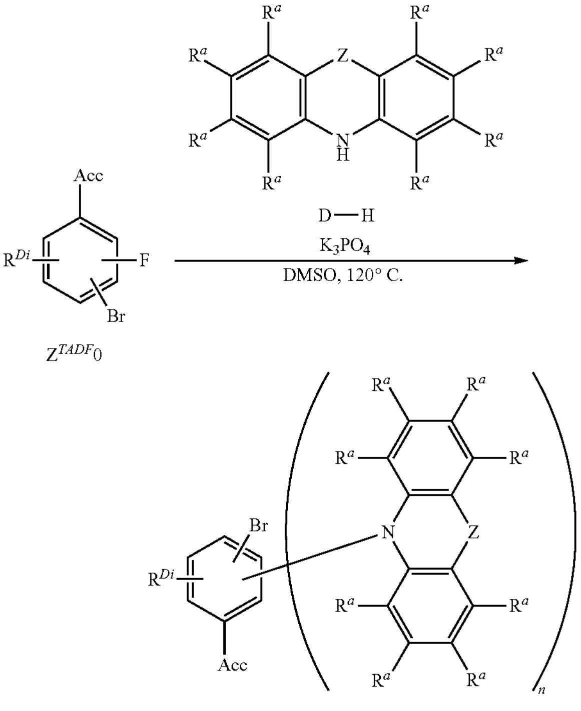

$Z^{TADF}0$ $M^{TADF}1$-Hal $Z^{TADF}0$ (1 equivalent), the corresponding donor molecule D-H (1 equivalent) and tribasic potassium phosphate (3 equivalents) are suspended under nitrogen atmosphere in DMSO and stirred at 120° C. for 12 to 16 hours. Subsequently, the reaction mixture is poured into an excess of water in order to precipitate the product. The precipitate is filtered off, washed with water and dried under vacuum. The crude product is purified by recrystallization or by flash chromatography. The product $M^{TADF}1$-Hal is obtained as a solid.

For the reaction of a nitrogen heterocycle in a nucleophilic aromatic substitution with an aryl halide, preferably an aryl fluoride, typical conditions include the use of a base, such as tribasic potassium phosphate or sodium hydride, for example, in an aprotic polar solvent, such as dimethyl sulfoxide (DMSO) or N,N-dimethylformamide (DMF), for example.

In particular, the donor molecule D-H is a 3,6-substituted carbazole (e.g., 3,6-dimethylcarbazole, 3,6-diphenylcarbazole, 3,6-di-tert-butylcarbazole), a 2,7-substituted carbazole (e.g., 2,7-dimethylcarbazole, 2,7-diphenylcarbazole, 2,7-di-tert-butylcarbazole), a 1,8-substituted carbazole (e.g., 1,8-dimethylcarbazole, 1,8-diphenylcarbazole, 1,8-di-tert-butylcarbazole), a 1-substituted carbazole (e.g., 1-methylcarbazole, 1-phenylcarbazole, 1-tert-butylcarbazole), a 2-substituted carbazole (e.g., 2-methylcarbazole, 2-phenylcarbazole, 2-tert-butylcarbazole), or a 3-substituted carbazole (e.g., 3-methylcarbazole, 3-phenylcarbazole, 3-tert-butylcarbazole).

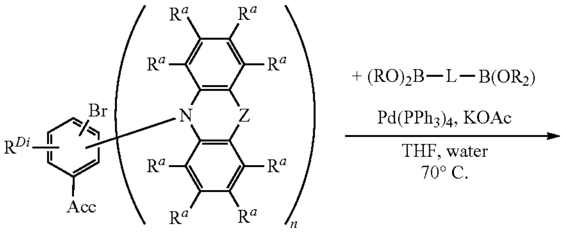

$M^{TADF}1$-Hal

-continued

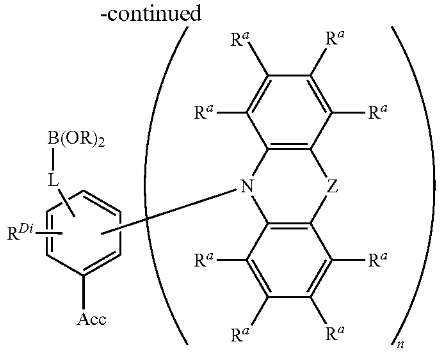

$M^{TADF}1$-L—$B(OR)_2$ $M^{TADF1}$-Hal (1.0 equivalents), the diboronic ester of the bridging unit, $(RO)_2B$-L-$B(OR)_2$ (e.g. 1,3-phenyldiboronic acid, bis(pinacol) ester) (1.0-1.5 equivalents), $Pd(PPh_3)_4$ (tetrakis(triphenylphosphine)palladium(0) (CAS:14221-01-3, 0.10 equivalents) and potassium carbonate (3 equivalents) are stirred overnight under nitrogen atmosphere in THF/Water (4:1) at 70° C. After cooling down to room temperature (RT), the reaction mixture is extracted with ethyl acetate/brine. The organic phases are collected, the organic solvent is removed and the crude product $M^{TADF}1$-L-B$(OR)_2$ is purified by flash chromatography or by recrystallization.

For example:

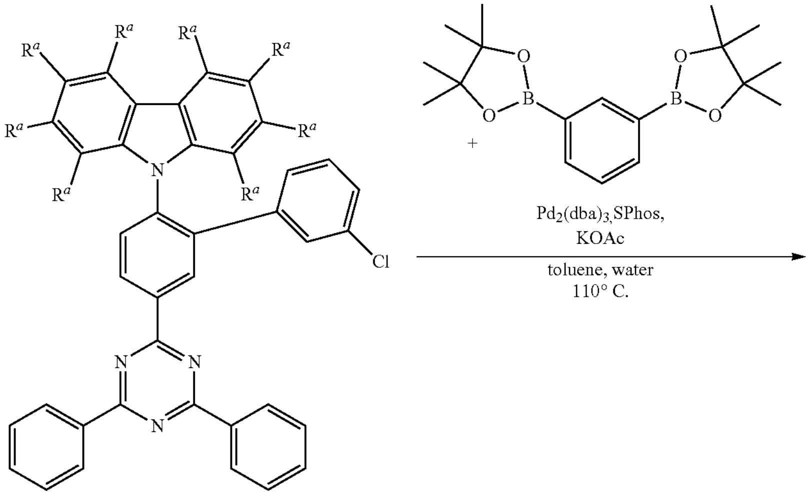

-continued

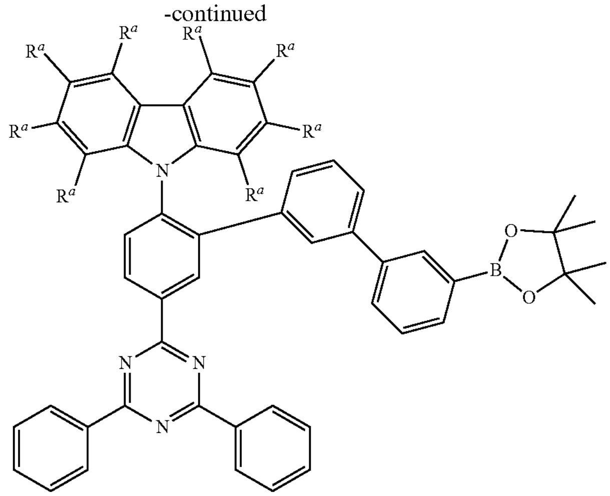

Alternative route:

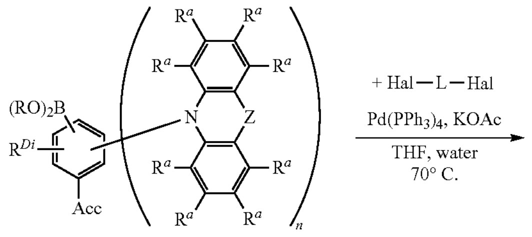

$M^{TADF}1$-B(OR)$_2$

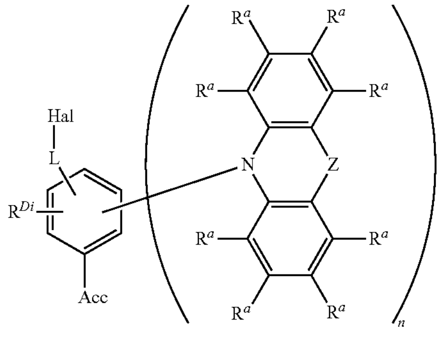

$M^{TADF}1$-L—Hal

For example:

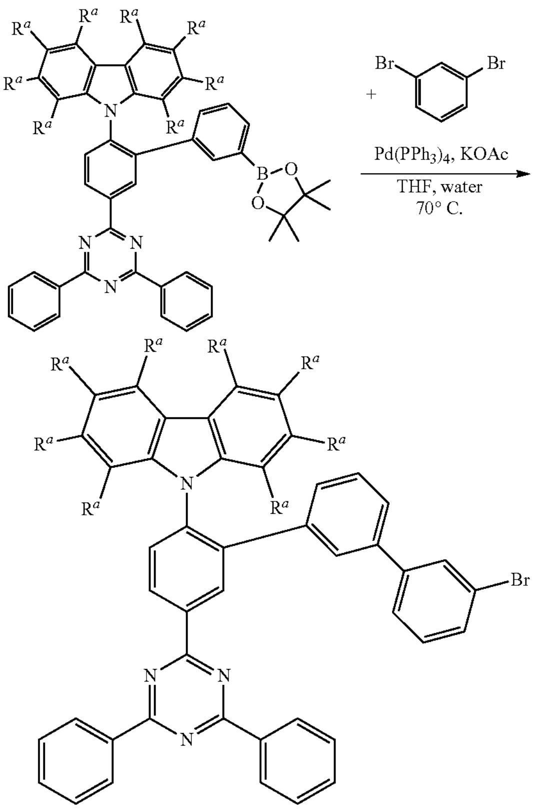

$M^{TADF1}$-B(OR)$_2$ (1.0 equivalents), the dihalide of the bridging unit, Hal-L-Hal (e.g. 1,3-dibromophenyl) (1.0-1.5 equivalents), Pd(PPh$_3$)$_4$ (tetrakis(triphenylphosphine)palladium(0) (CAS:14221-01-3, 0.10 equivalents) and potassium carbonate (3 equivalents) are stirred overnight under nitrogen atmosphere in THF/Water (4:1) at 70° C. After cooling down to room temperature (RT), the reaction mixture is extracted with ethyl acetate/brine. The organic phases are collected, the organic solvent is removed and the crude product $M^{TADF1}$-L-Hal is purified by flash chromatography or by recrystallization.

To obtain $M^{TADF}1$-B(OR)$_2$, e.g. $M^{TADF}1$-BPin, $M^{TADF}1$-Hal may be reacted with a boron acid ester, e.g. Bis (pinacolato)diboron ($B_2Pin_2$, CAS: 73183-34-3), employing known conditions.

By choosing the right reaction conditions $M^{TADF1}$-L-Hal can also be obtained from the reaction of $M^{TADF1}$-Hal with (RO)$_2$B-L-Hal, e.g. $M^{TADF1}$-Br with (RO)$_2$B-L-CI, and $M^{TADF1}$-L-B(OR)$_2$ can also be obtained from the reaction of $M^{TADF1}$-B(OR)$_2$ with Hal-L-Hal followed by borylation as described above.

In case a third chemical moiety consisting of a structure of Formula Q is present in the molecule and $M^{TADF}1$ is bound via the structure of Formula Q to the bridging unit L, the structure has to be introduced as the dihalide of the structure of Formula Q in reaction with $M^{TADF1}$-$B(OR)_2$ or as diboronic ester of the structure of Formula Q in reaction with $M^{TADF1}$-Hal. Here the previously described conditions apply.

For example:

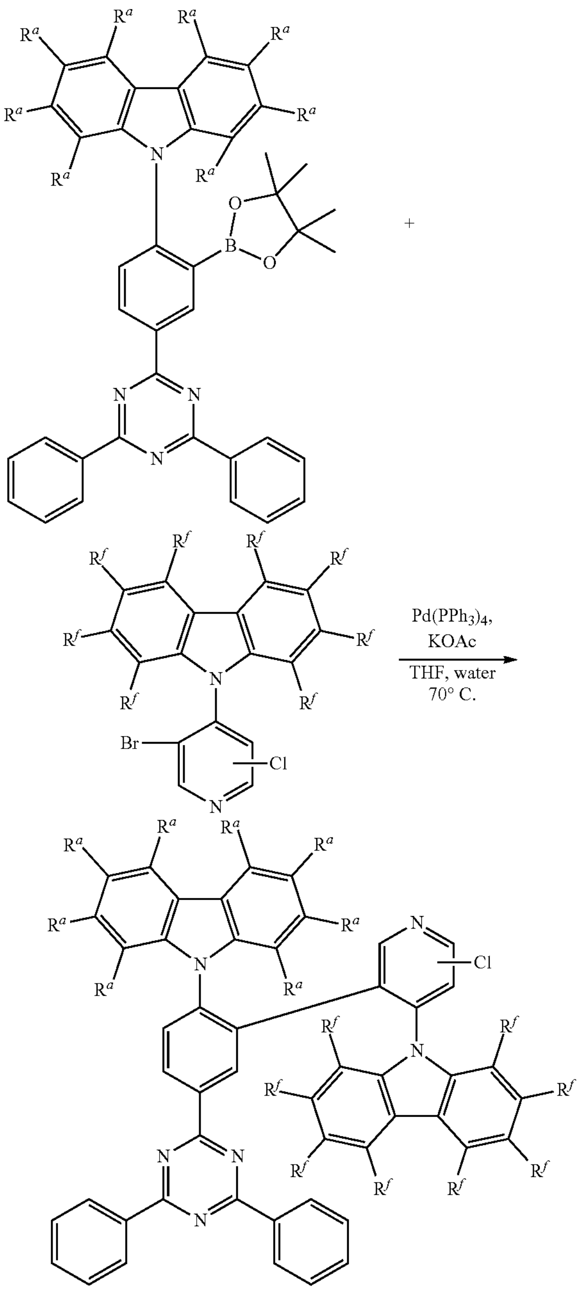

Formula $M^{TADF}$-31

$Pd(PPh_3)_4$ (tetrakis(triphenylphosphine)palladium(0) (CAS:14221-01-3) is used as a Pd catalyst during the Suzuki coupling reactions. Other catalyst alternatives are known in the art ((tris(dibenzylideneacetone)dipalladium(0)) or [1,1'-bis(diphenylphosphino)ferrocene]-palladium (II) dichloride). For example, the ligand may be selected from the group consisting of S-Phos ([2-dicyclohexylphoshino-2',6'-dimethoxy-1,1'-biphenyl]; or SPhos), X-Phos (2-(dicyclohexylphosphino)-2",4",6"-triisopropylbiphenyl; or XPhos), and $P(Cy)_3$ (tricyclohexylphosphine). The salt is, for example, selected from tribasic potassium phosphate and potassium acetate and the solvent can be a pure solvent, such as THF/water, toluene or dioxane, or a mixture, such as toluene/dioxane/water or dioxane/toluene. A person of skill in the art can determine which Pd catalyst, ligand, salt and solvent combination will result in high reaction yields.

HPLC-MS:

HPLC-MS analysis is performed on an HPLC by Agilent (1100 series) with MS-detector (Thermo LTQ XL).

Exemplary a typical HPLC method is as follows: a reverse phase column 4.6 mm×150 mm, particle size 3.5 μm from Agilent (ZORBAX Eclipse Plus 95 Å C18, 4.6×150 mm, 3.5 μm HPLC column) is used in the HPLC. The HPLC-MS measurements are performed at room temperature (rt) following gradients

| Flow rate [ml/min] | time [min] | A[%] | B[%] | C[%] |
|---|---|---|---|---|
| 2.5 | 0 | 40 | 50 | 10 |
| 2.5 | 5 | 40 | 50 | 10 |
| 2.5 | 25 | 10 | 20 | 70 |
| 2.5 | 35 | 10 | 20 | 70 |
| 2.5 | 35.01 | 40 | 50 | 10 |
| 2.5 | 40.01 | 40 | 50 | 10 |
| 2.5 | 41.01 | 40 | 50 | 10 |

using the following solvent mixtures:

| | | |
|---|---|---|
| solvent A: | $H_2O$ (90%) | MeCN (10%) |
| solvent B: | $H_2O$ (10%) | MeCN (90%) |
| solvent C: | THF (50%) | MeCN (50%) |

An injection volume of 5 μL from a solution with a concentration of 0.5 mg/mL of the analyte is taken for the measurements.

Ionization of the probe is performed using an APCI (atmospheric pressure chemical ionization) source either in positive (APCI+) or negative (APCI−) ionization mode.

Cyclic Voltammetry

Cyclic voltammograms are measured from solutions having concentration of $10^3$ mol/l of the organic molecules in dichloromethane or a suitable solvent and a suitable supporting electrolyte (e.g. 0.1 mol/l of tetrabutylammonium hexafluorophosphate). The measurements are conducted at room temperature under nitrogen atmosphere with a three-electrode assembly (Working and counter electrodes: Pt wire, reference electrode: Pt wire) and calibrated using $FeCp_2/FeCp_2^+$ as internal standard. The HOMO data was corrected using ferrocene as internal standard against SCE.

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets (and a m4-grid for numerical integration are used. The Turbomole program package is used for all calculations.

Photophysical Measurements

Sample Pretreatment: Spin-Coating

Apparatus: Spin150, SPS euro.

The sample concentration is 10 mg/ml, dissolved in a suitable solvent.

Program: 1) 3 s at 400 U/min; 20 s at 1000 U/min at 1000 Upm/s. 3) 10 s at 4000 U/min at 1000 Upm/s. After coating, the films are tried at 70° C. for 1 min.

Photoluminescence Spectroscopy and TCSPC (Time-Correlated Single-Photon Counting)

Steady-state emission spectroscopy is measured by a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra are corrected using standard correction fits.

Excited state lifetimes are determined employing the same system using the TCSPC method with FM-2013 equipment and a Horiba Yvon TCSPC hub.

Excitation Sources:

NanoLED 370 (wavelength: 371 nm, puls duration: 1.1 ns)

NanoLED 290 (wavelength: 294 nm, puls duration: <1 ns)

SpectraLED 310 (wavelength: 314 nm)

SpectraLED 355 (wavelength: 355 nm).

Data analysis (exponential fit) is done using the software suite DataStation and DAS6 analysis software. The fit is specified using the chi-squared-test.

Photoluminescence Quantum Yield Measurements

For photoluminescence quantum yield (PLQY) measurements an Absolute PL Quantum Yield Measurement C9920-03G system (Hamamatsu Photonics) is used. Quantum yields and CIE coordinates are determined using the software U6039-05 version 3.6.0.

Emission maxima are given in nm, quantum yields ϕ in % and CIE coordinates as x,y values.

PLQY is determined using the following protocol:

Quality assurance: Anthracene in ethanol (known concentration) is used as reference Excitation wavelength: the absorption maximum of the organic molecule is determined and the molecule is excited using this wavelength Measurement Quantum yields are measured for sample of solutions or films under nitrogen atmosphere. The yield is calculated using the equation:

$$\Phi_{PL} = \frac{n_{photon},\ emited}{n_{photon},\ \text{absorbed}} = \frac{\int \frac{\lambda}{hc}\left[Int_{emitted}^{sample}(\lambda) - Int_{absorbed}^{sample}(\lambda)\right]d\lambda}{\int \frac{\lambda}{hc}\left[Int_{emitted}^{reference}(\lambda) - Int_{absorbed}^{reference}(\lambda)\right]d\lambda}$$

wherein $n_{photon}$ denotes the photon count and Int. the intensity.

Production and Characterization of Optoelectronic Devices

OLED devices comprising organic molecules according to the invention can be produced via vacuum-deposition methods. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT 95 to the time point, at which the measured luminance decreased to 95% of the initial luminance etc.

Accelerated lifetime measurements are performed (e.g. applying increased current densities). Exemplarily LT80 values at 500 $cd/m^2$ are determined using the following equation:

$$LT80\left(500\frac{cd^2}{m^2}\right) = LT80(L_0)\left(\frac{L_0}{500\frac{cd^2}{m^2}}\right)^{1.6}$$

wherein $L_0$ denotes the initial luminance at the applied current density.

The values correspond to the average of several pixels (typically two to eight), the standard deviation between these pixels is given.

Additional examples of organic molecules of the invention

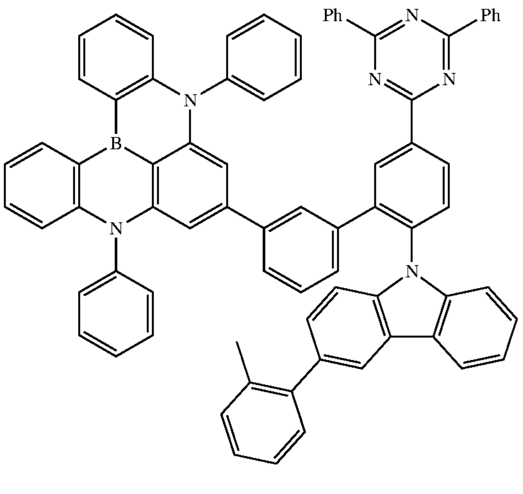

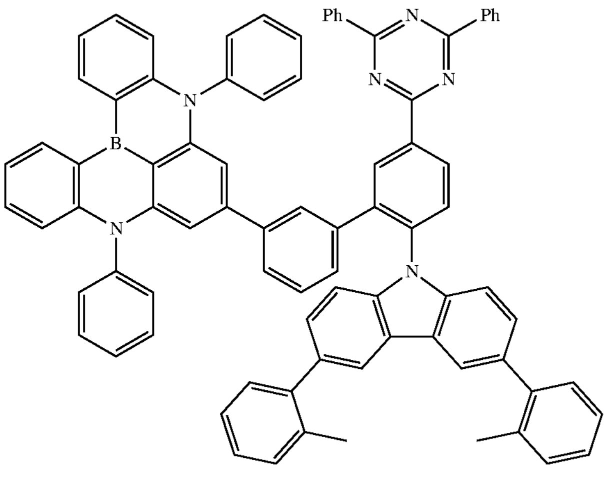

-continued
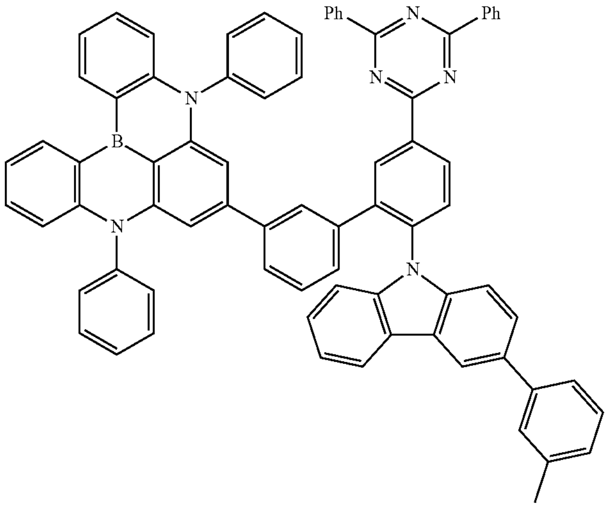
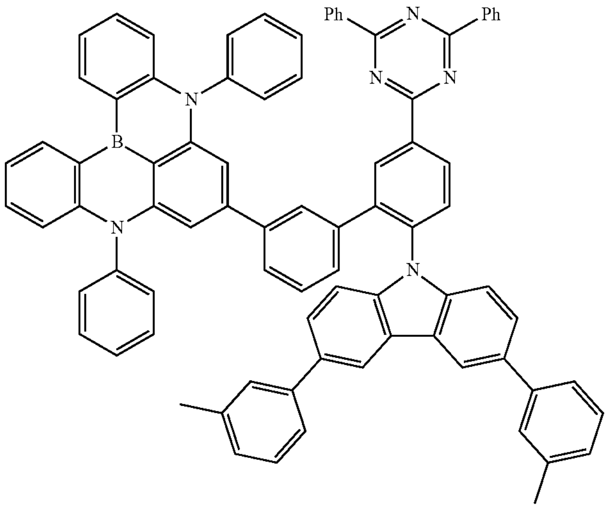
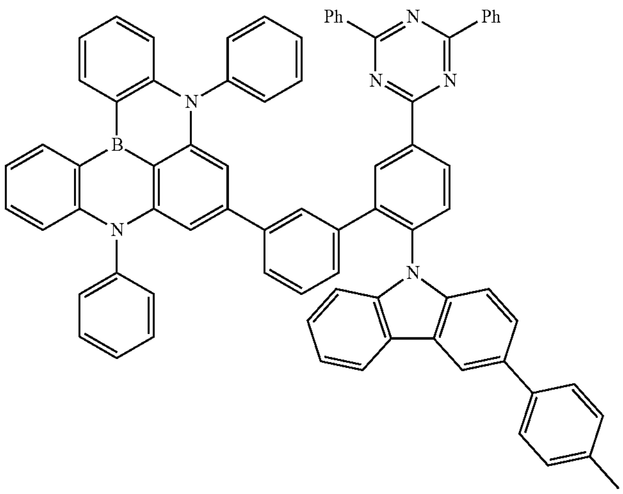

-continued
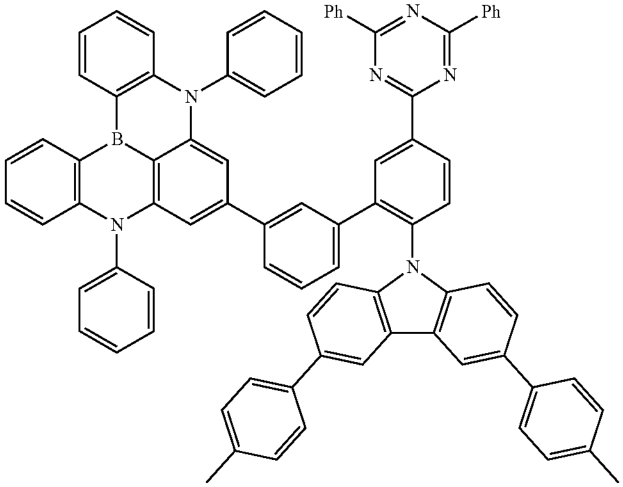
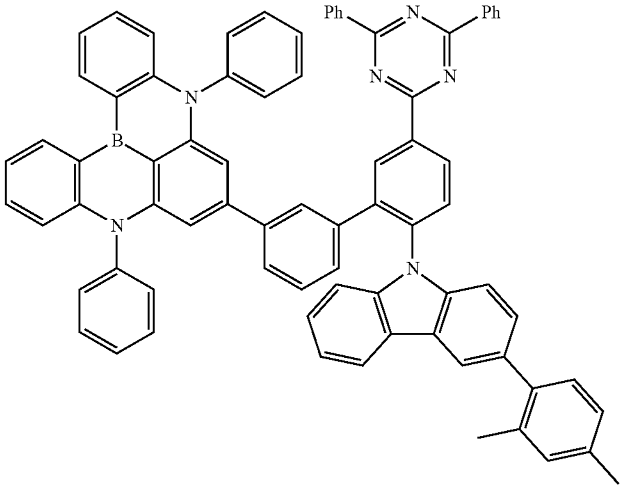
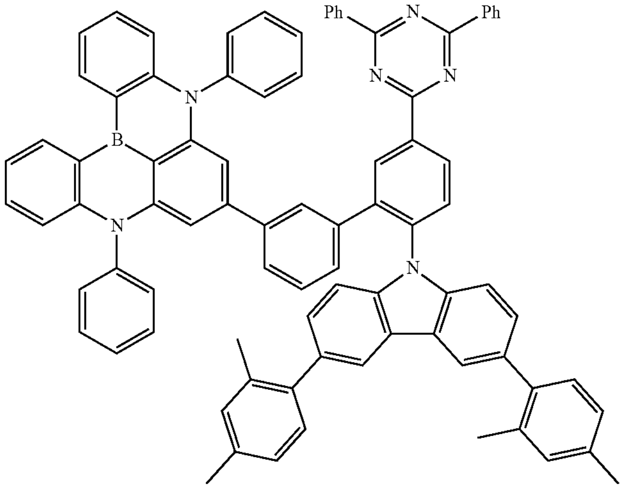

-continued
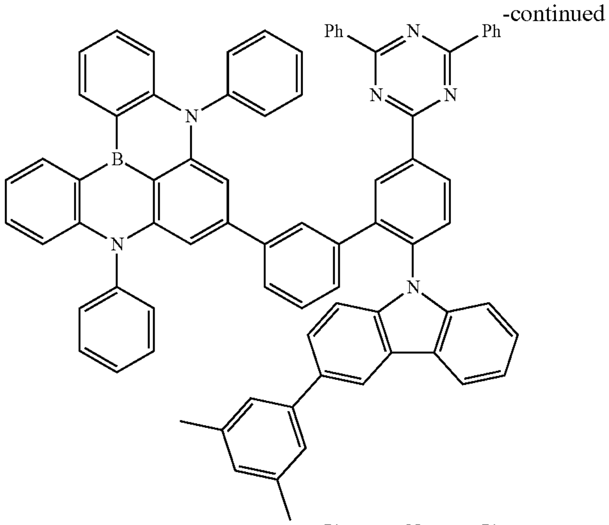
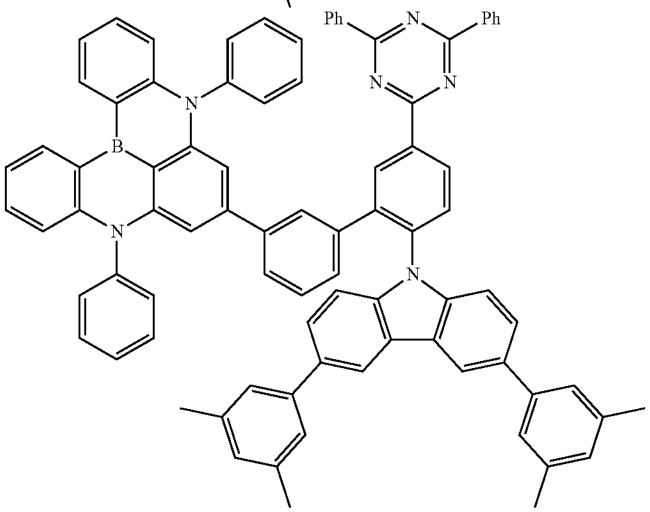
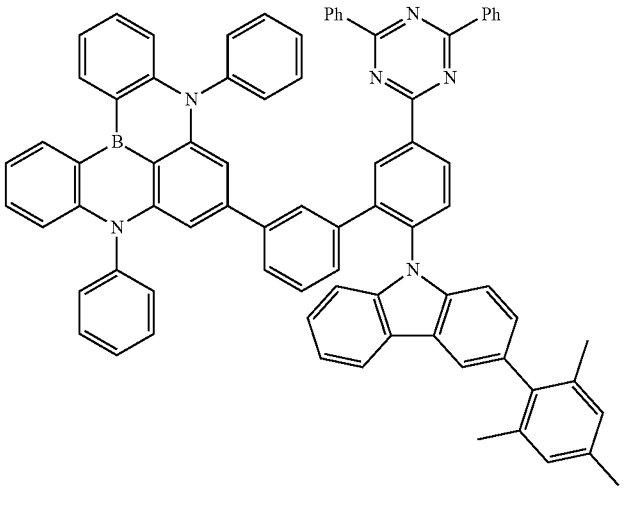

-continued
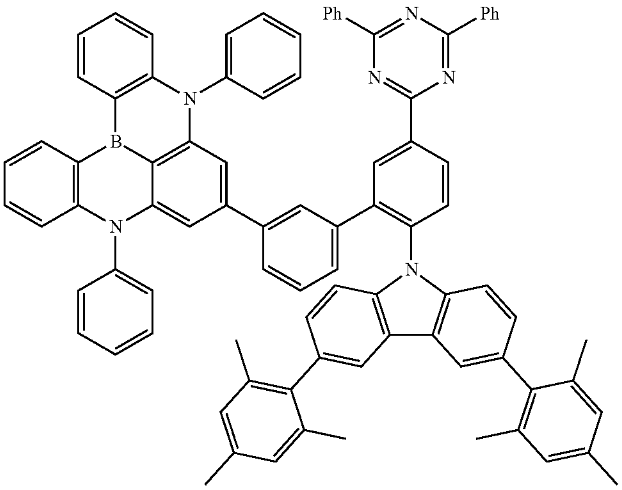
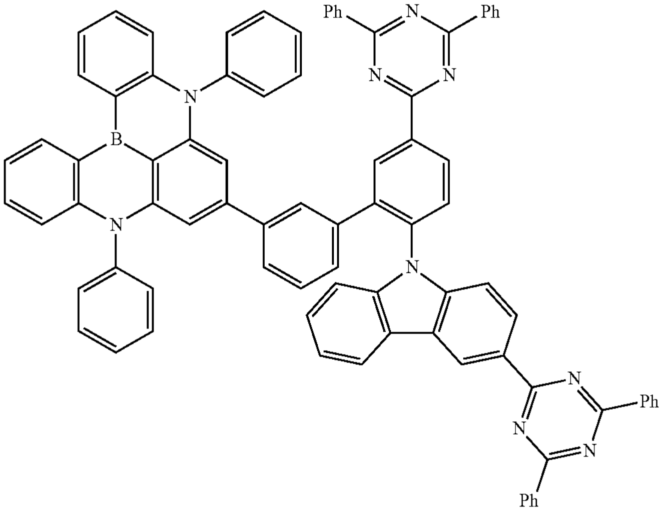
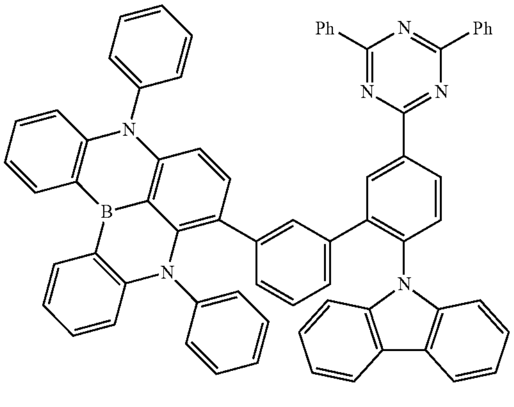
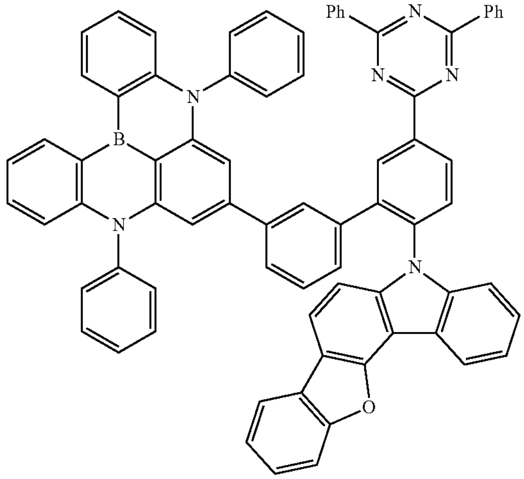

-continued
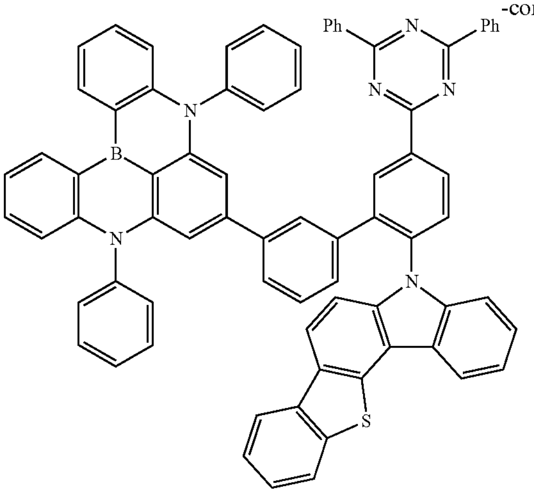
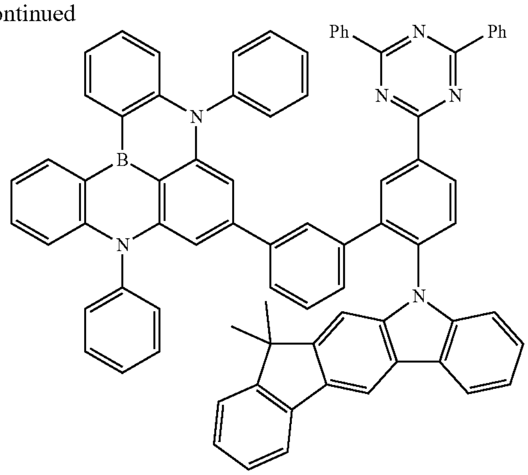
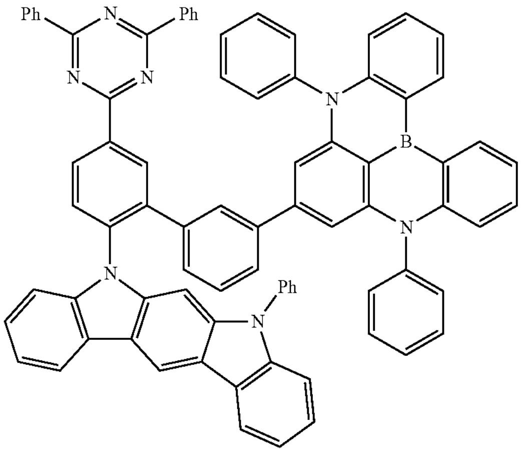
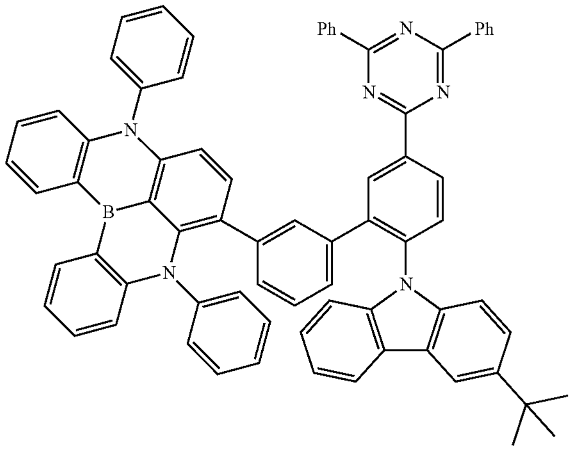
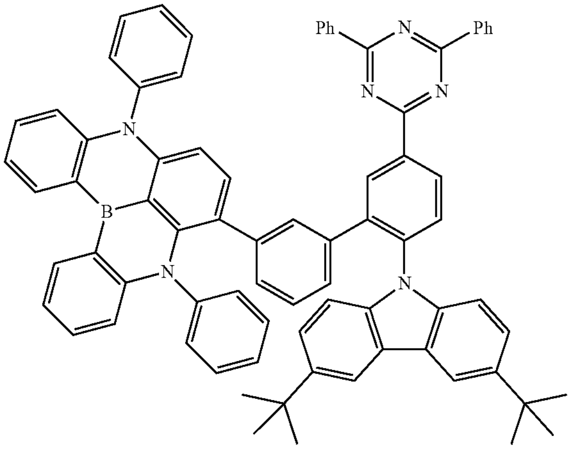
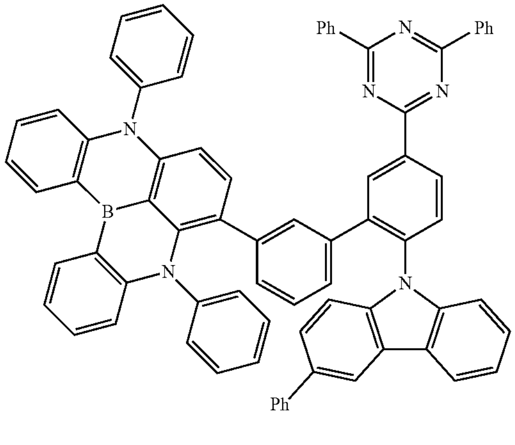

-continued
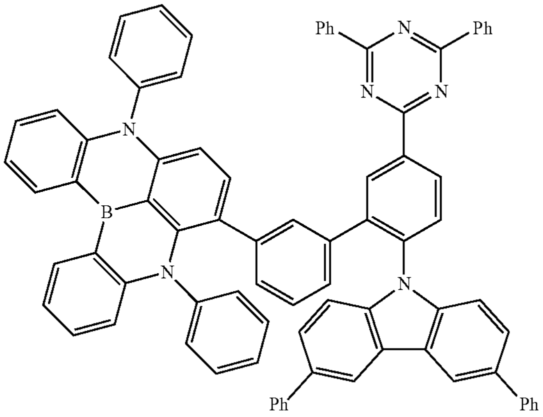
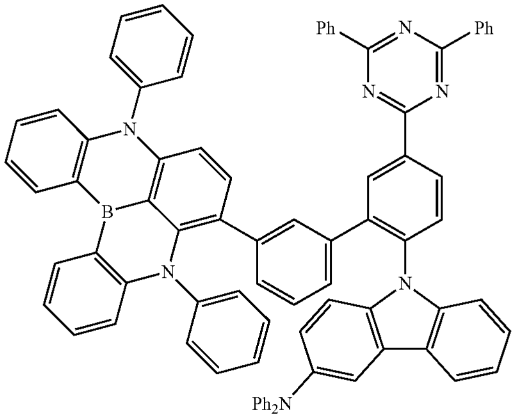
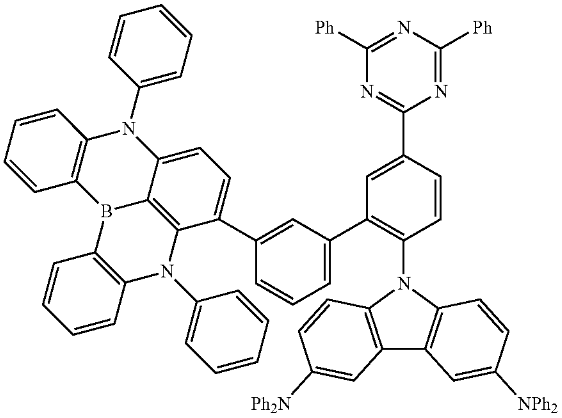
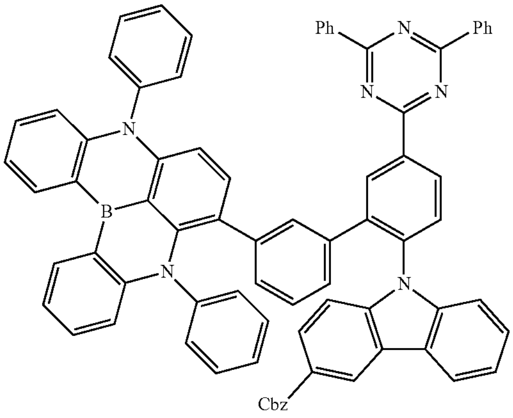
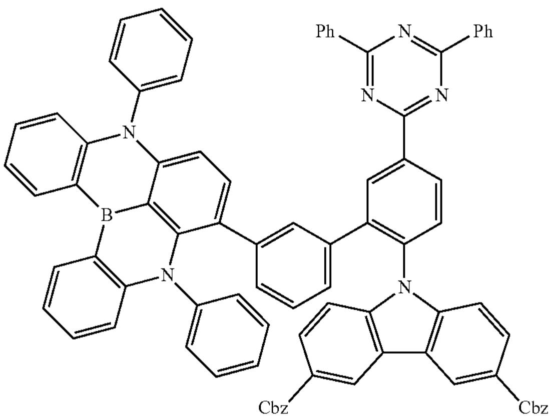
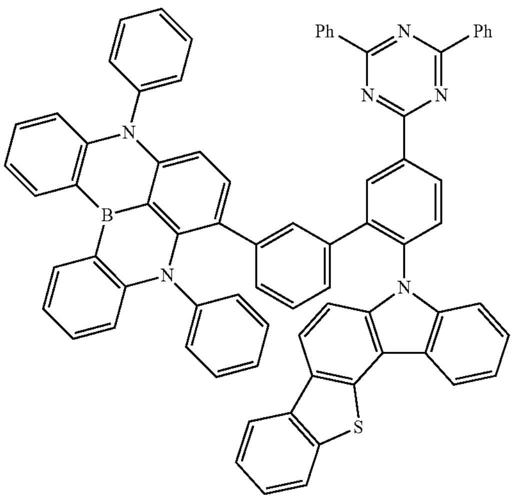

-continued
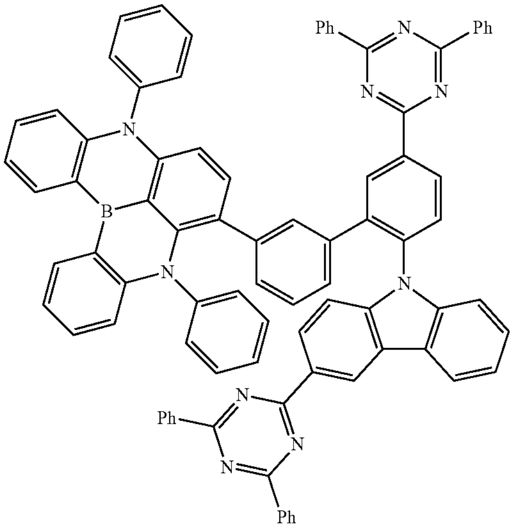
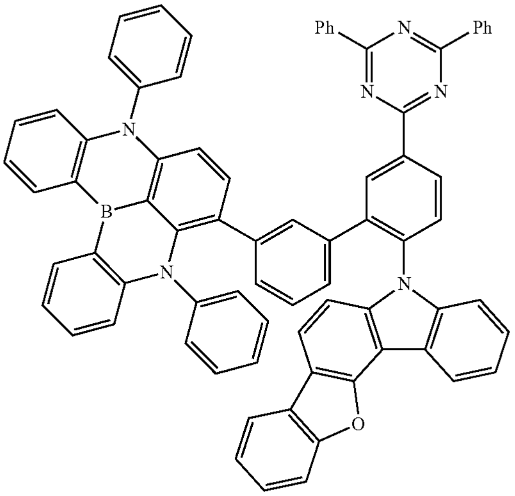
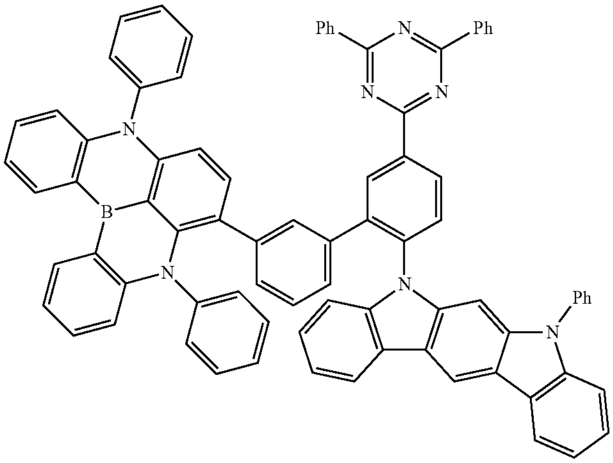
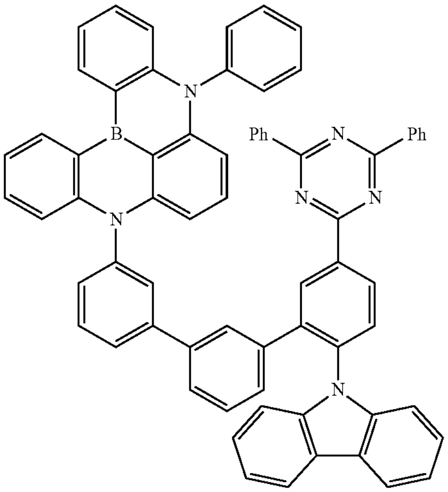
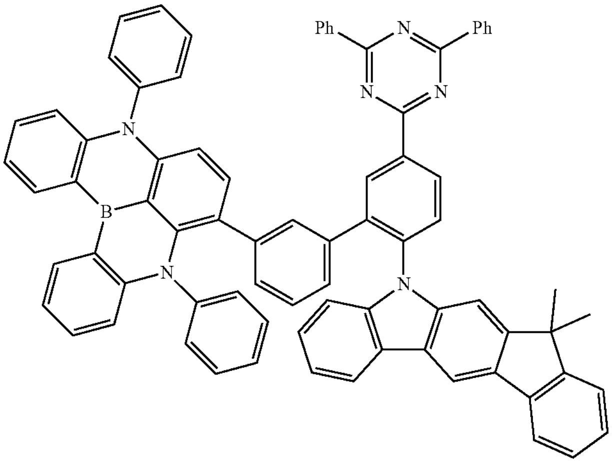

-continued
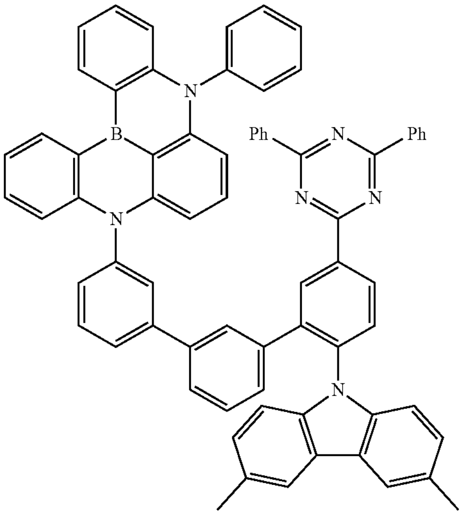
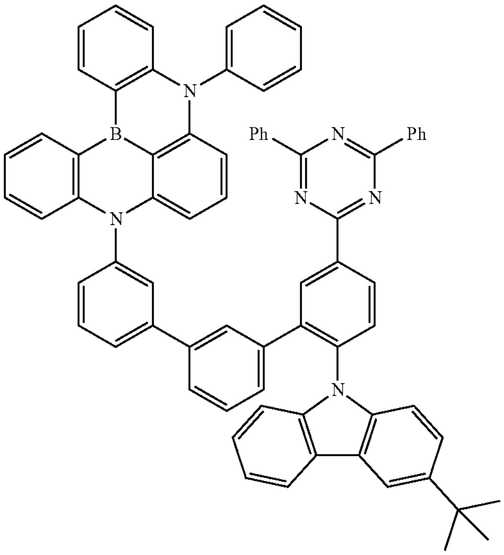
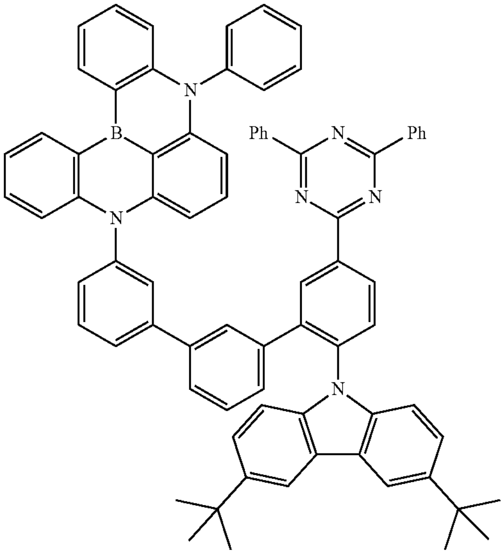
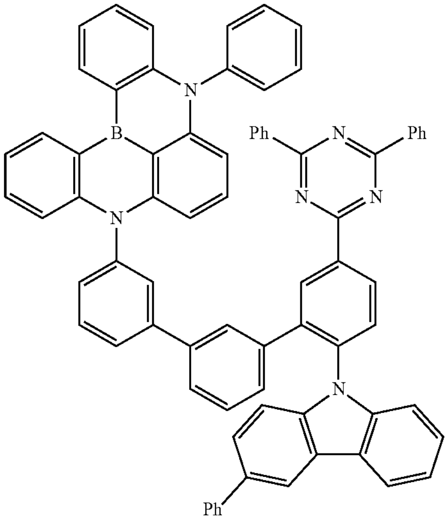
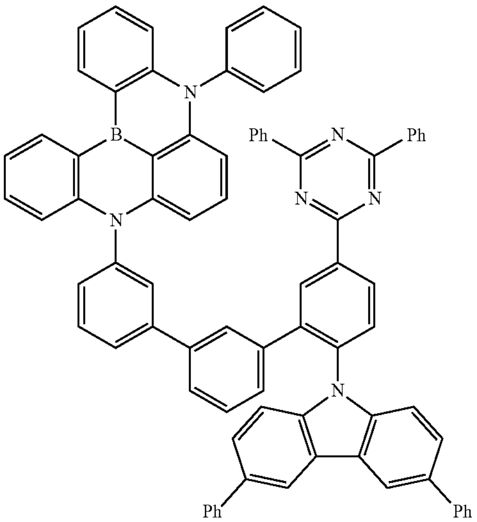
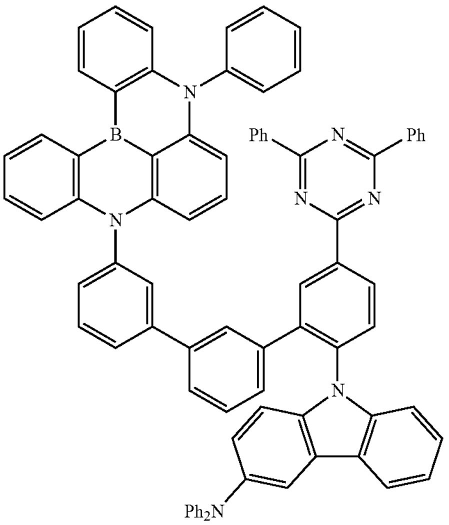

-continued
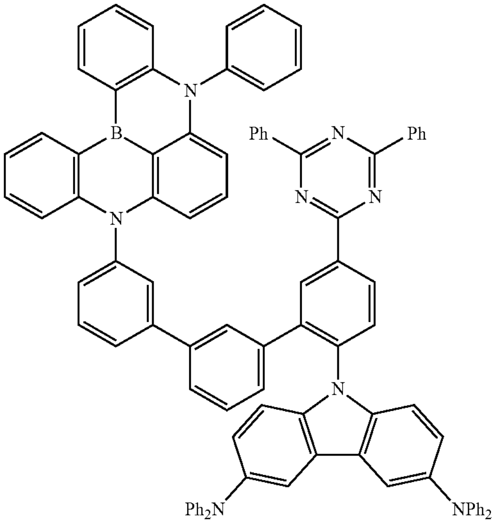
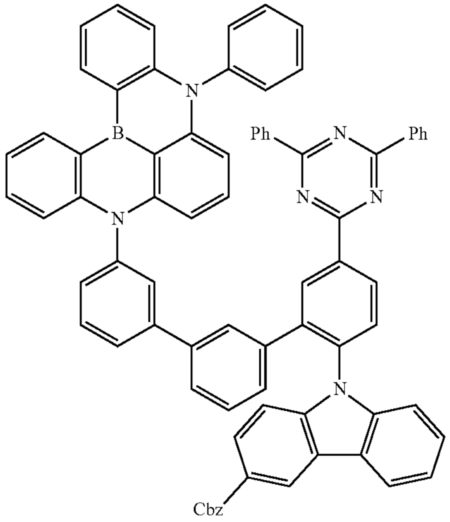
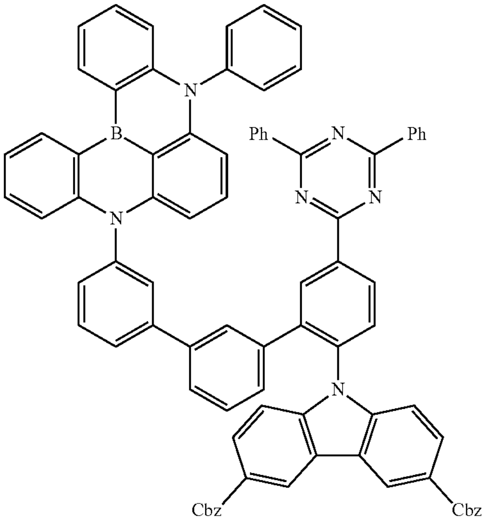
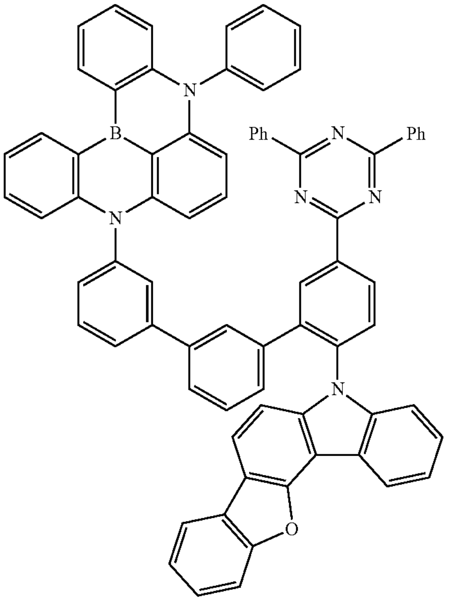
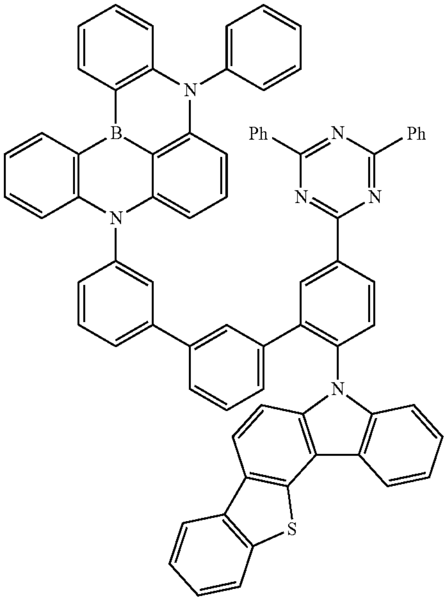
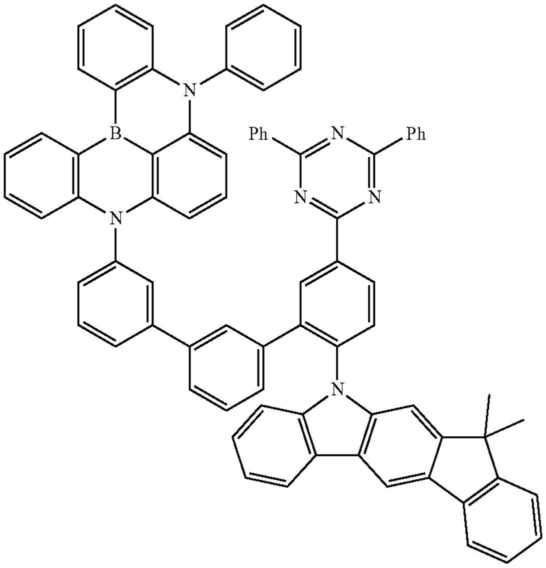

-continued
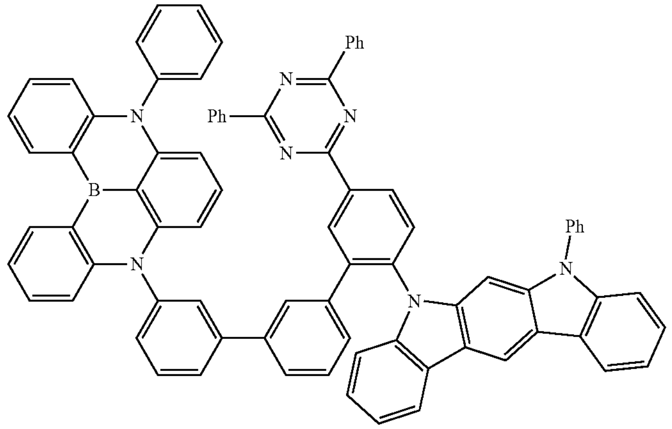
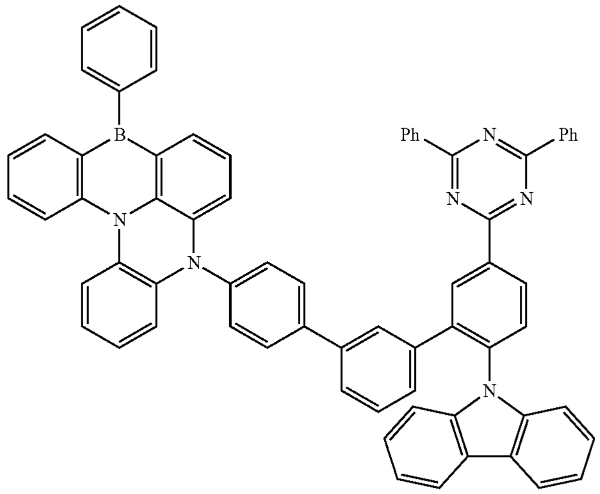
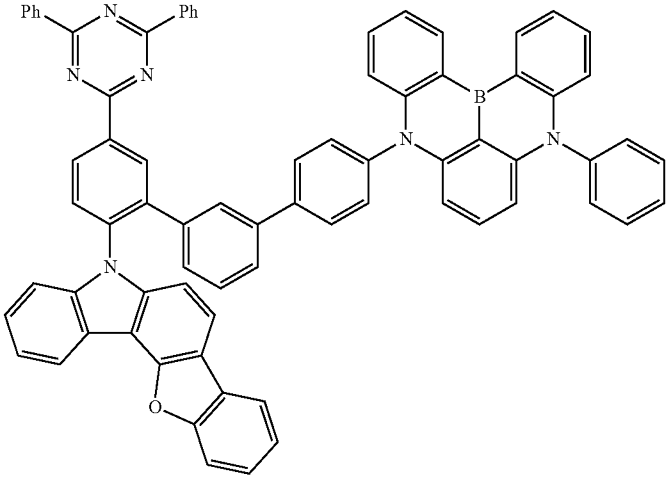

-continued
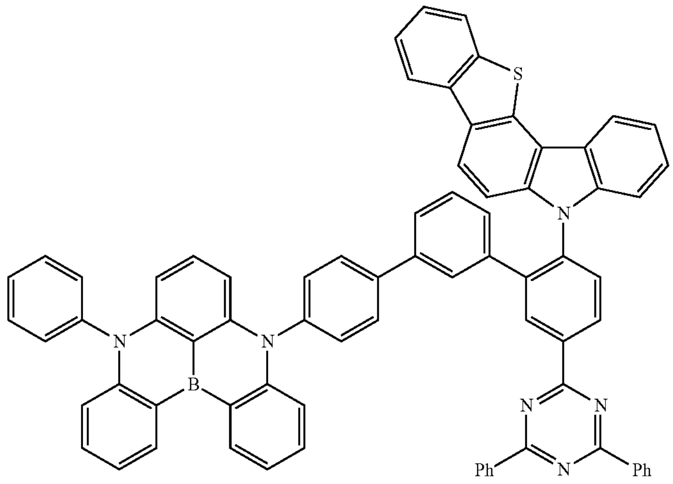
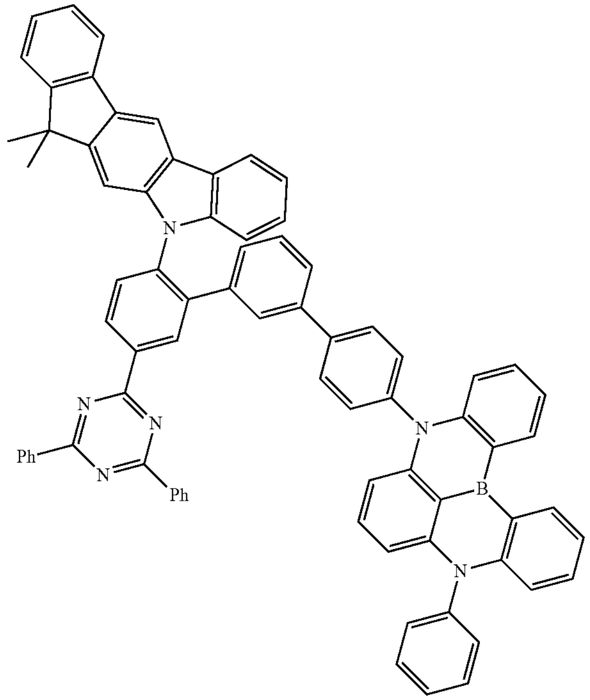
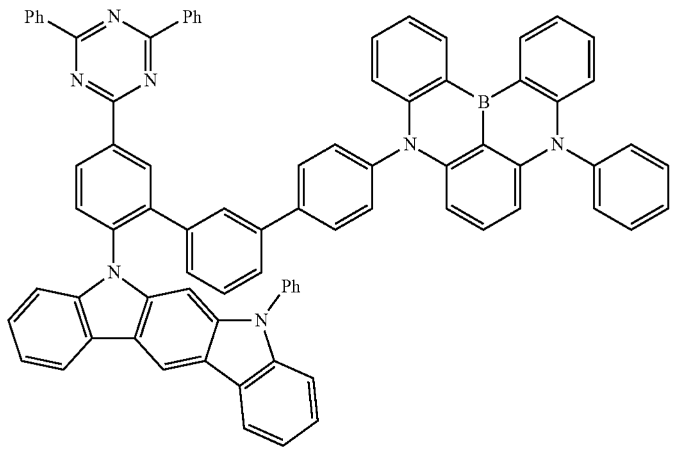

-continued
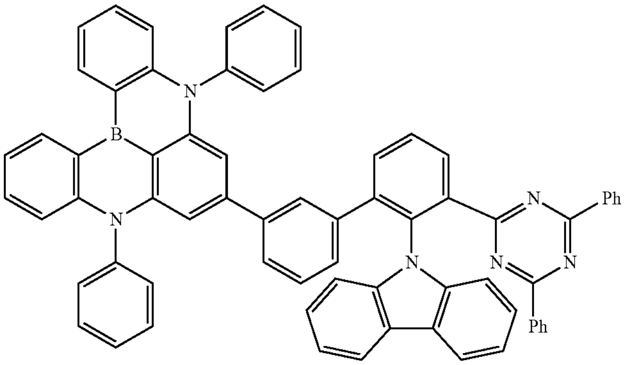
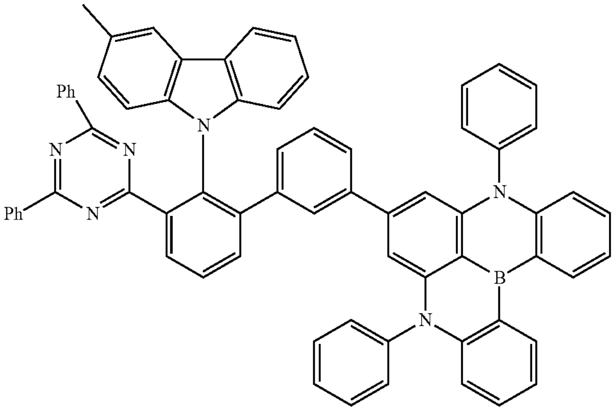
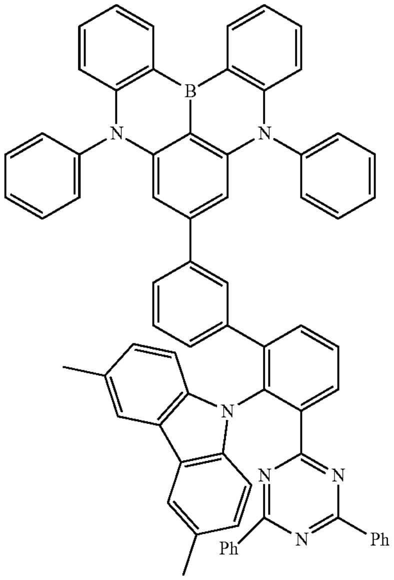
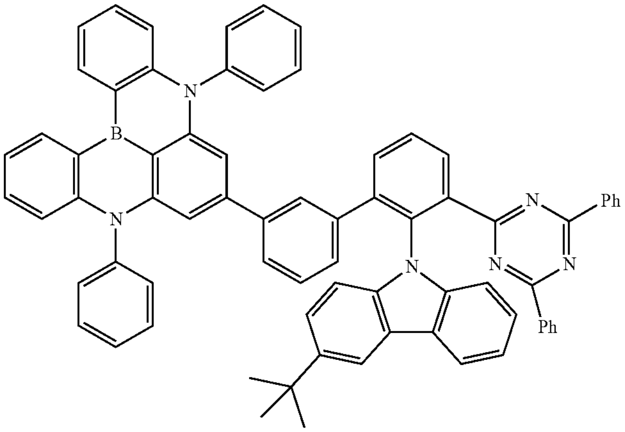

-continued
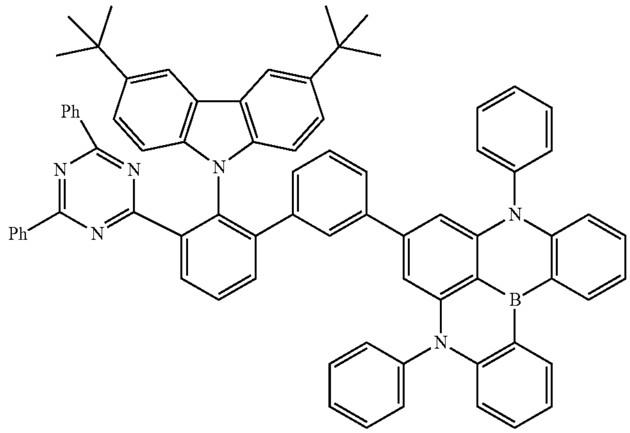
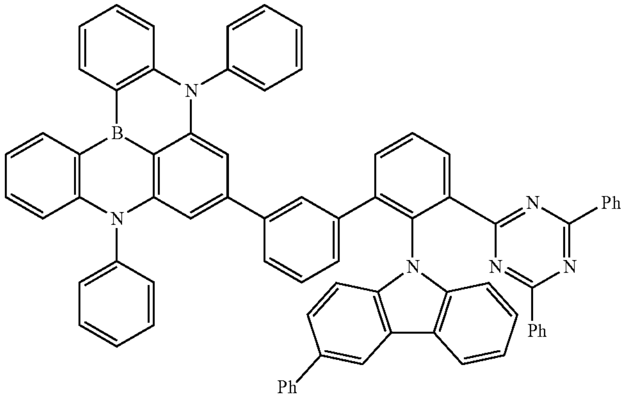
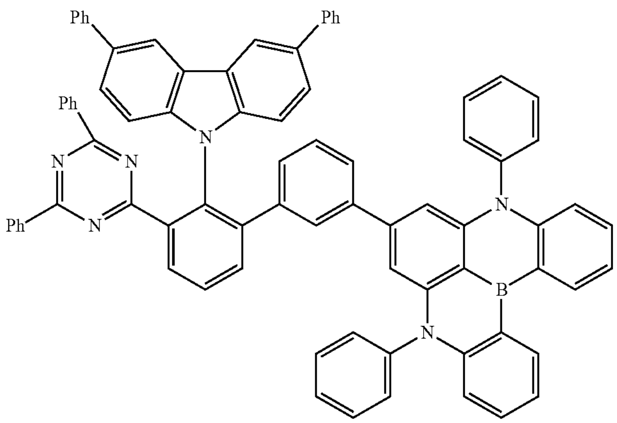
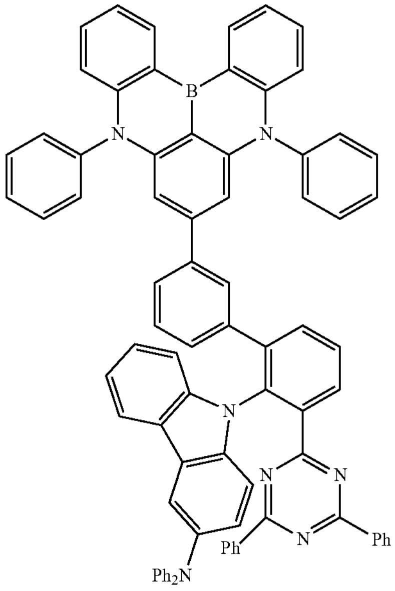

-continued
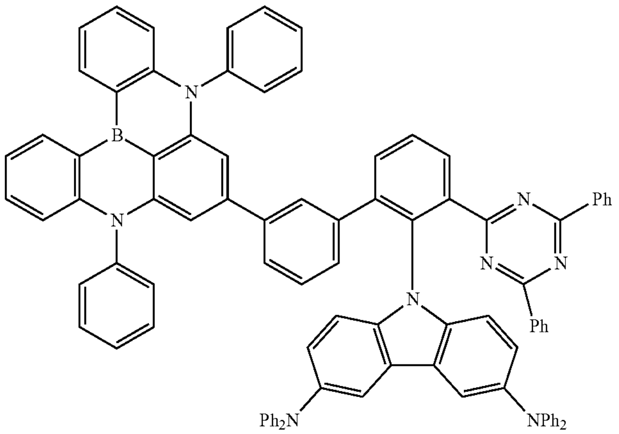
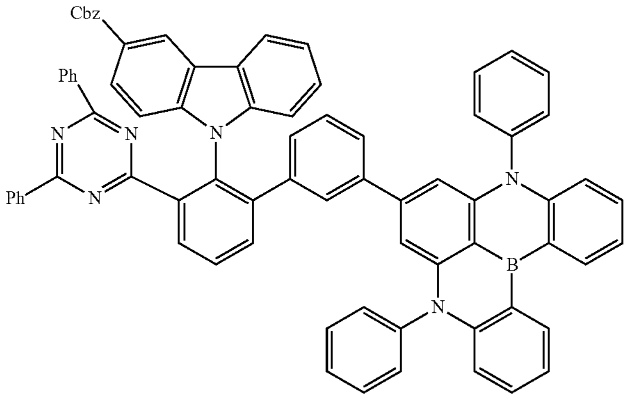
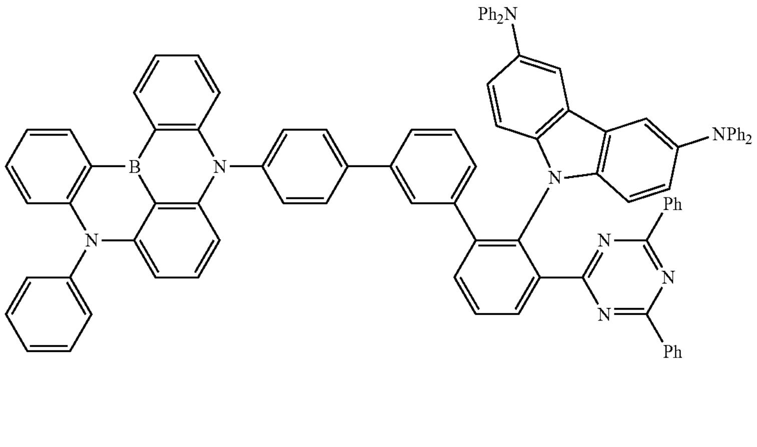
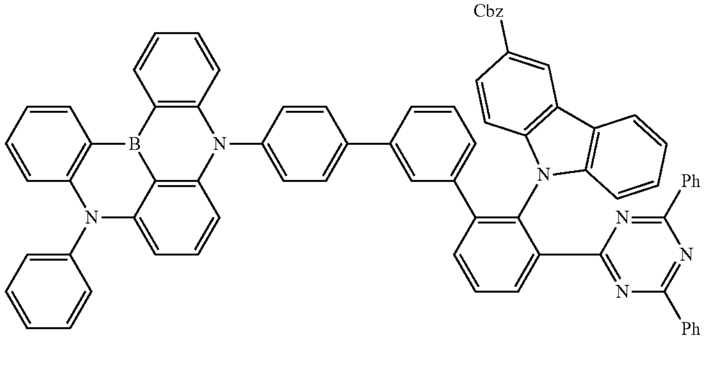

-continued
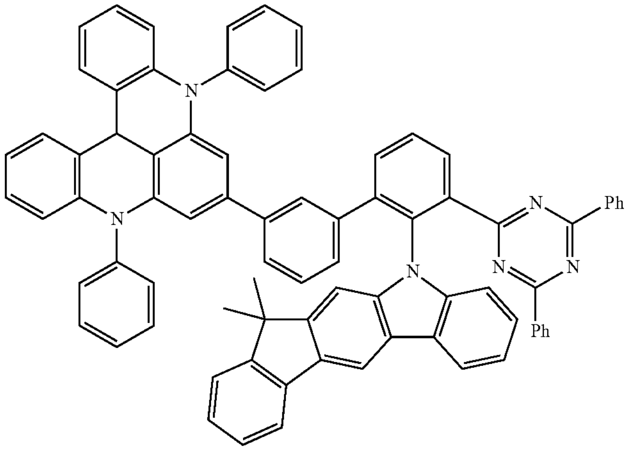
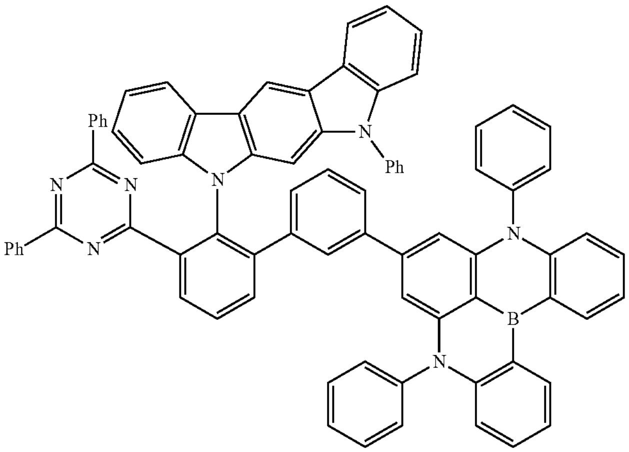
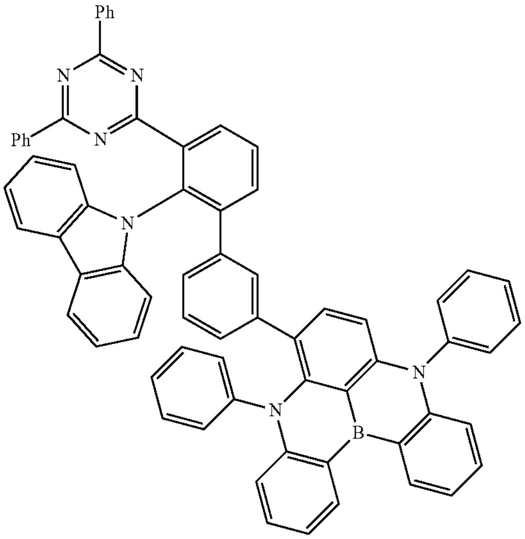
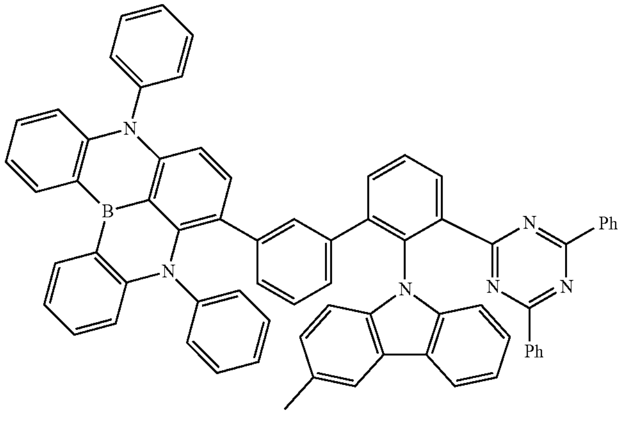

-continued
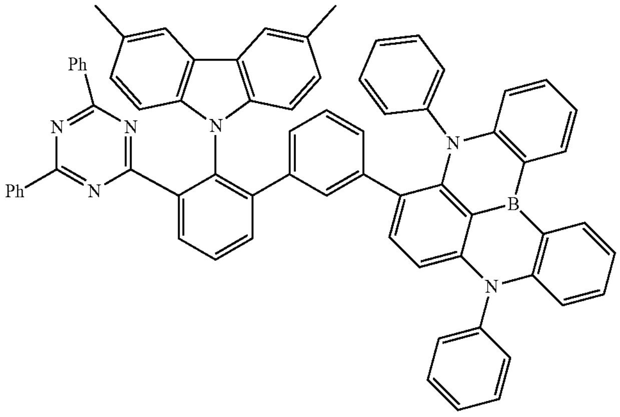
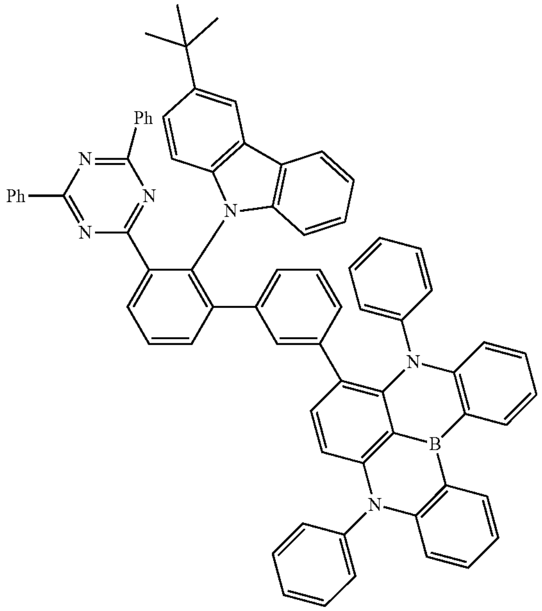
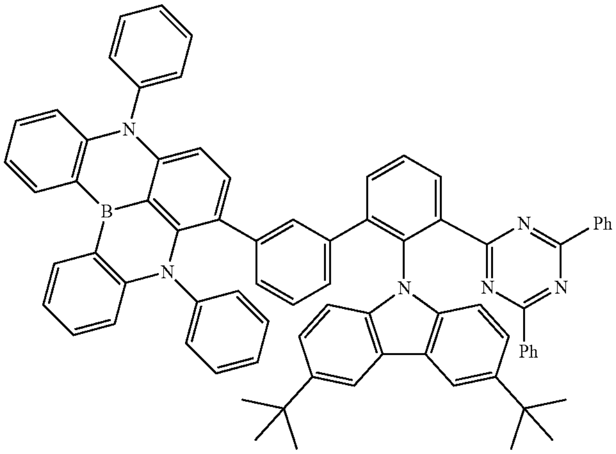
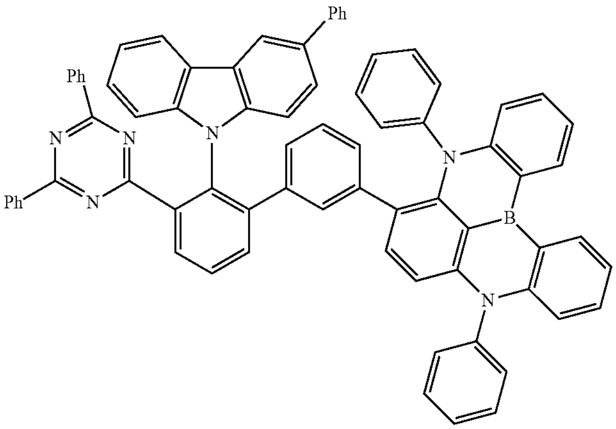
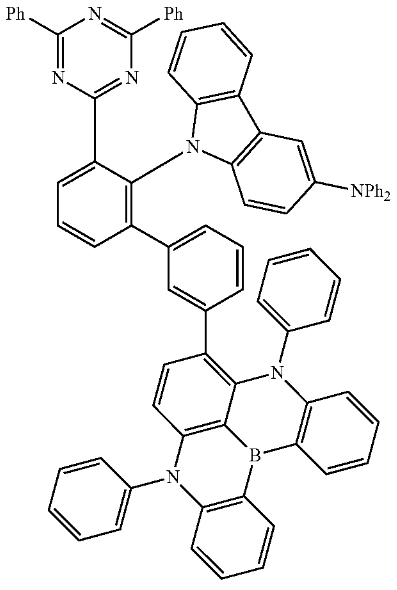

-continued
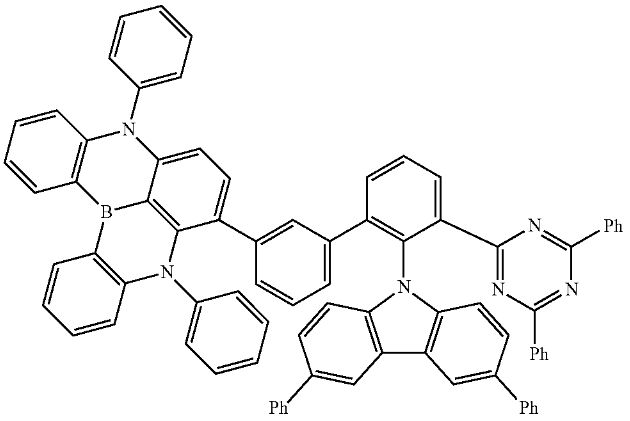
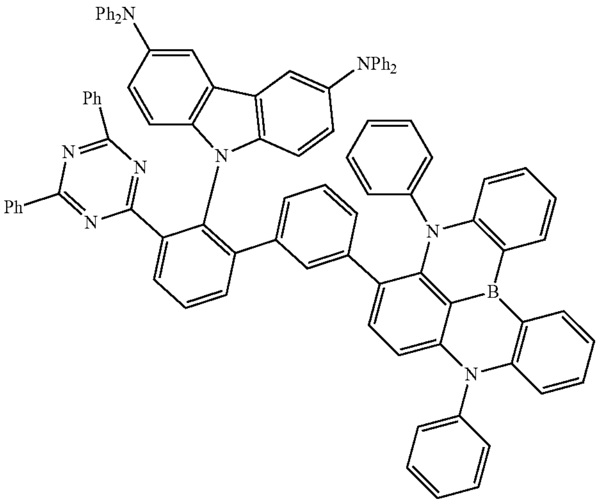
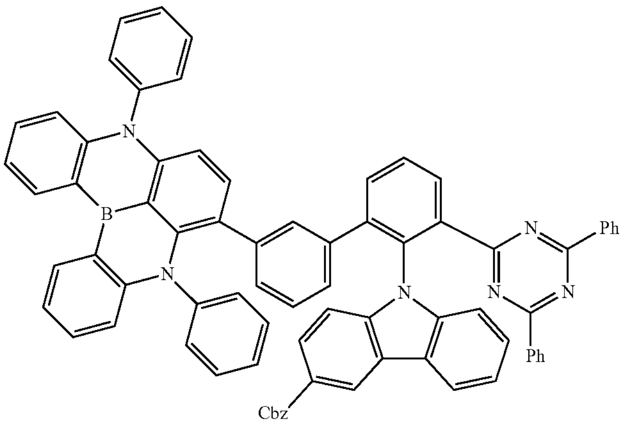

-continued
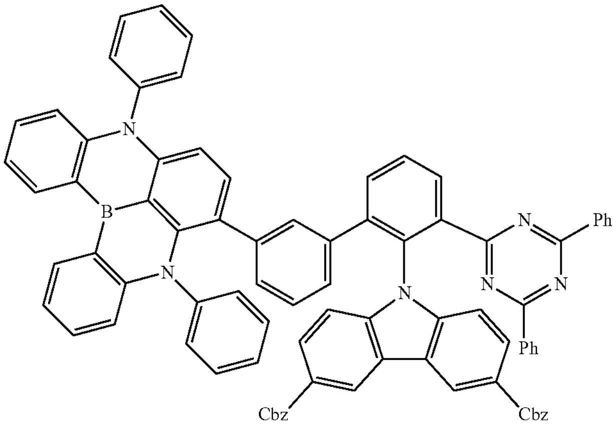
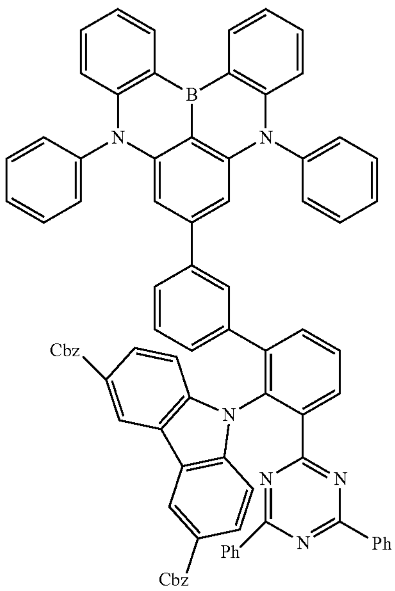
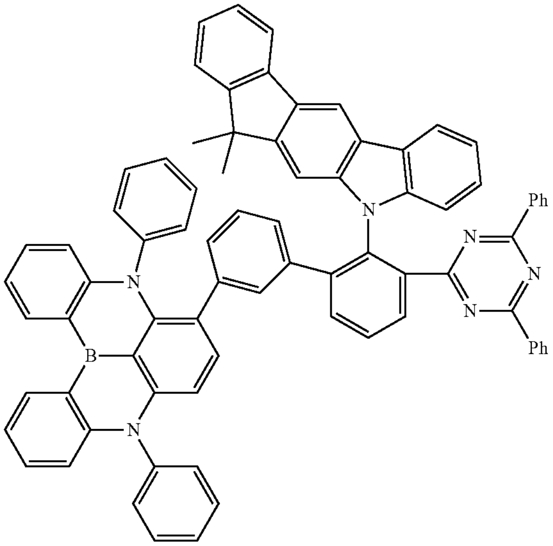
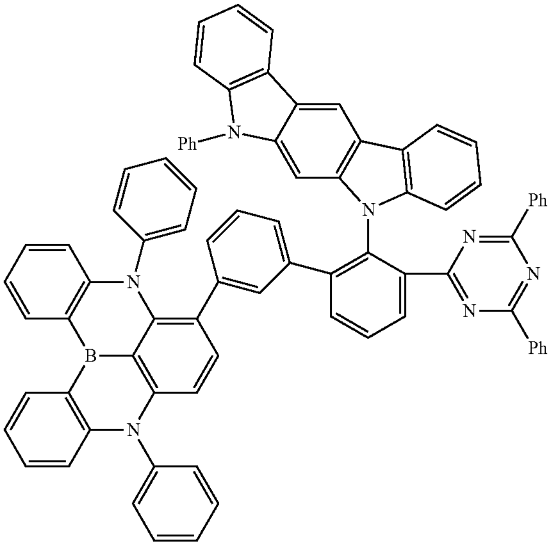

-continued
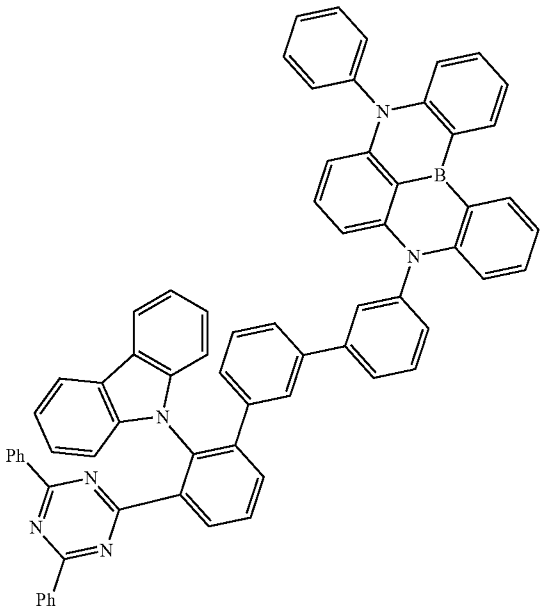
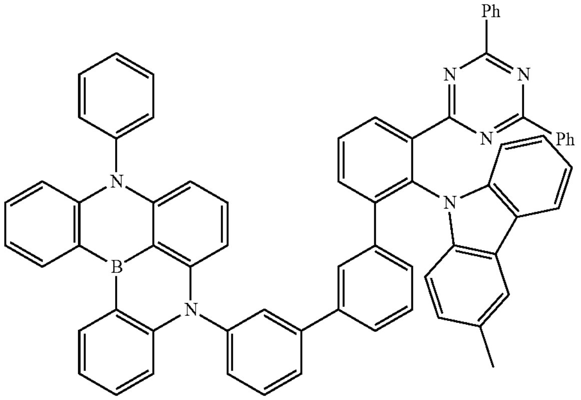
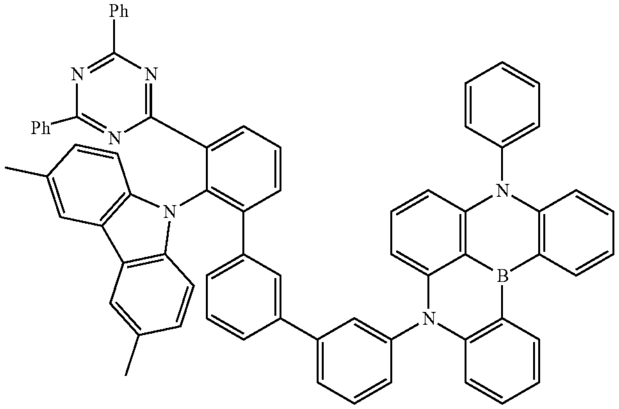
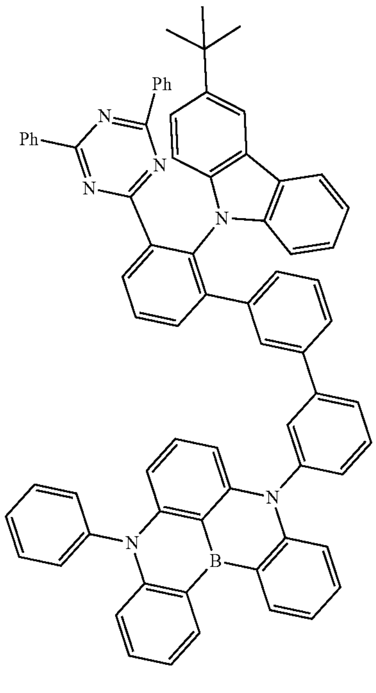
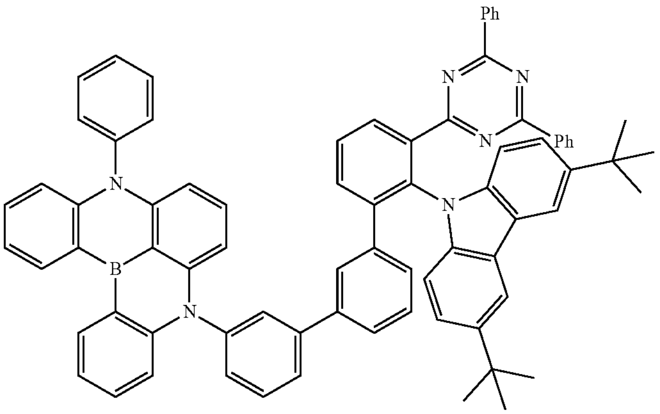

-continued
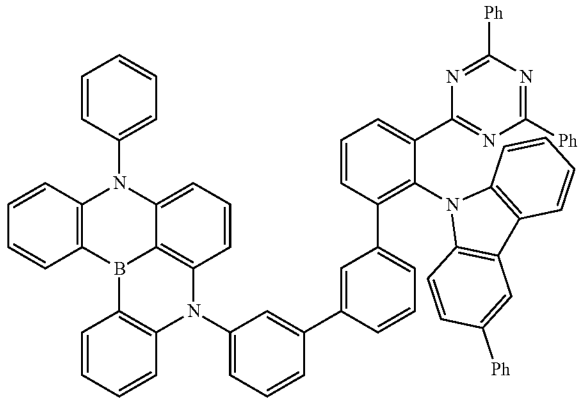
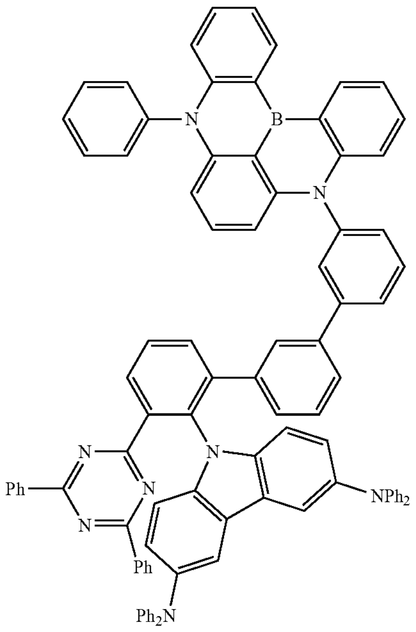
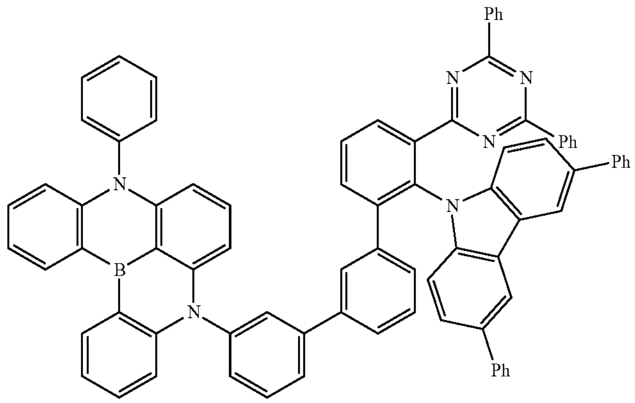
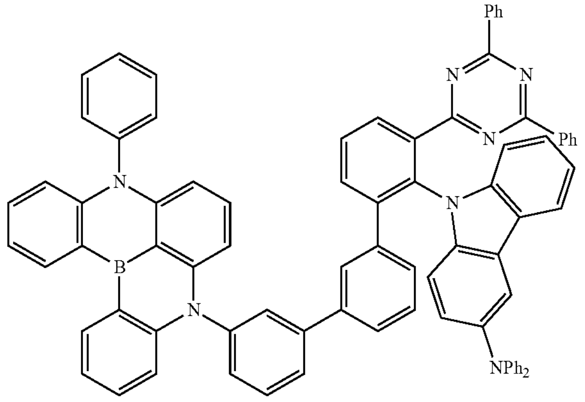

-continued
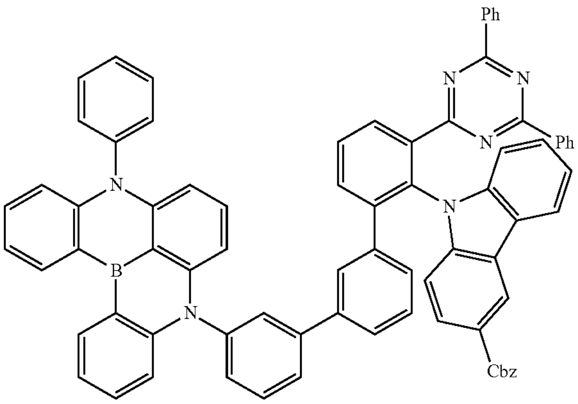
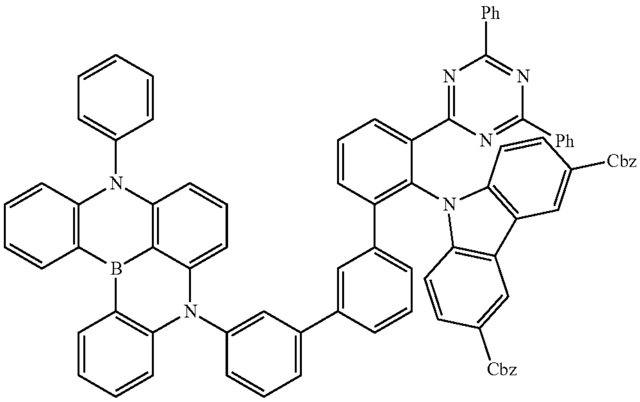
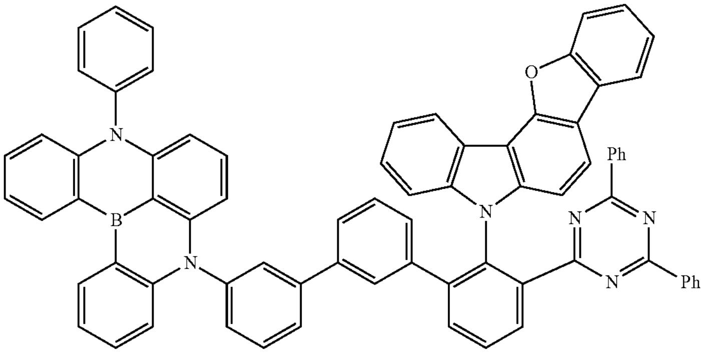
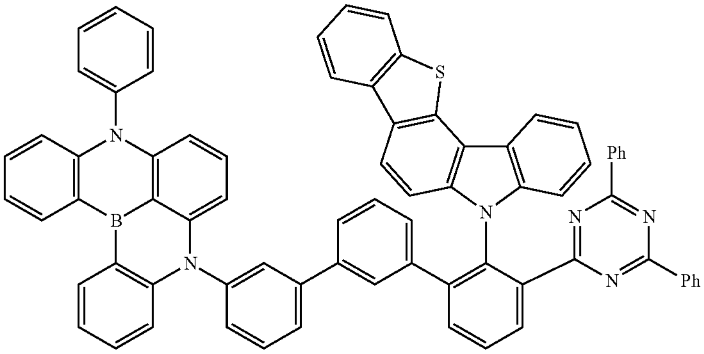

-continued
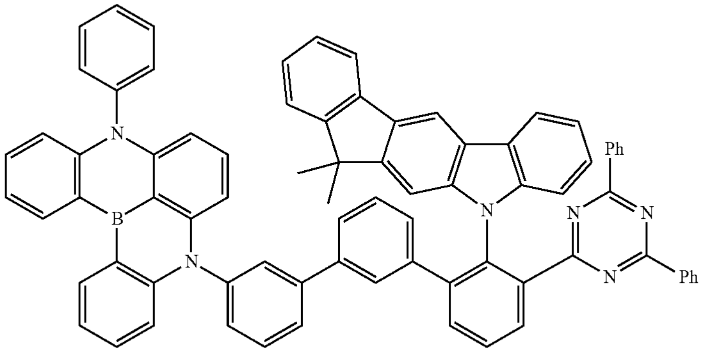
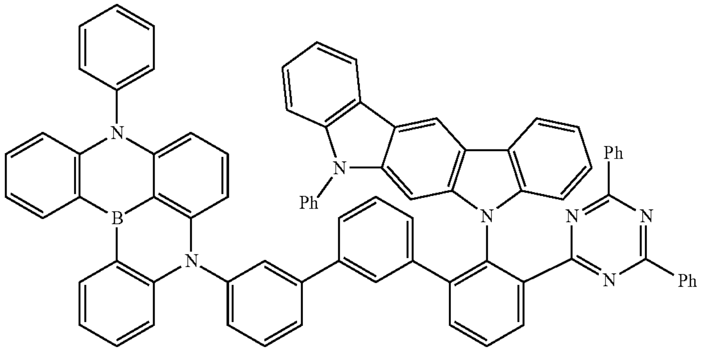
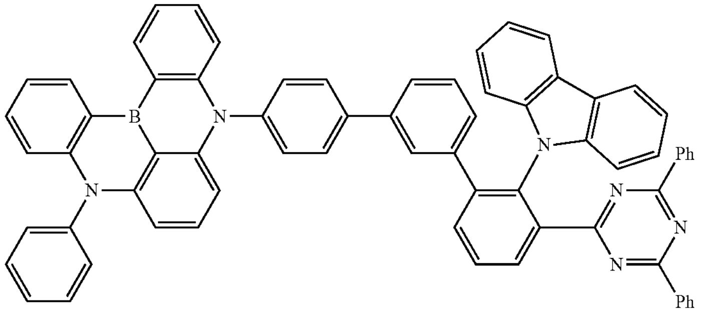
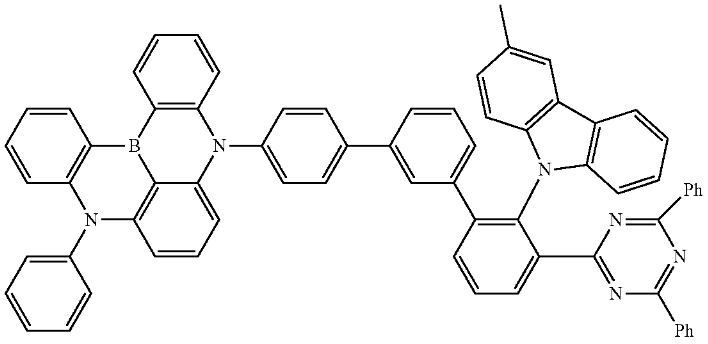
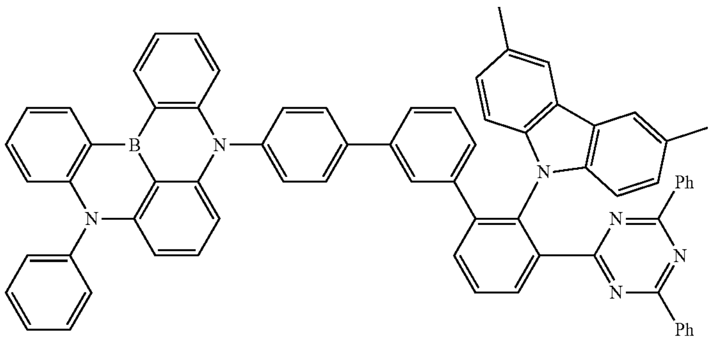

-continued
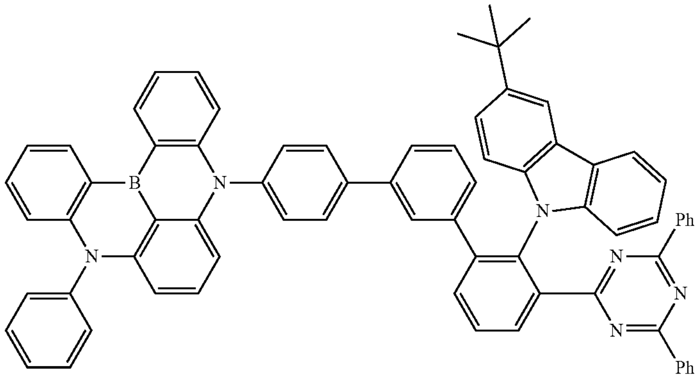
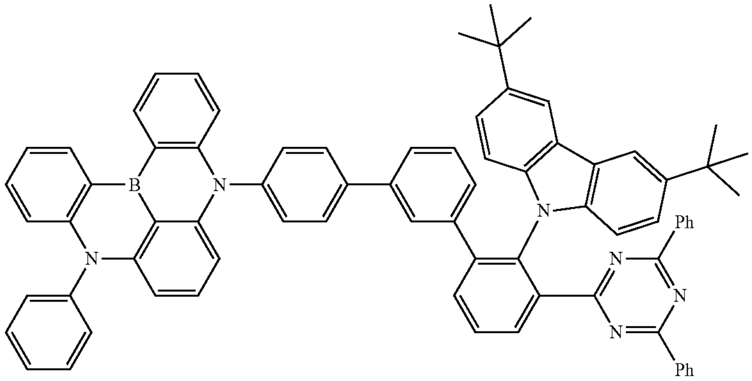
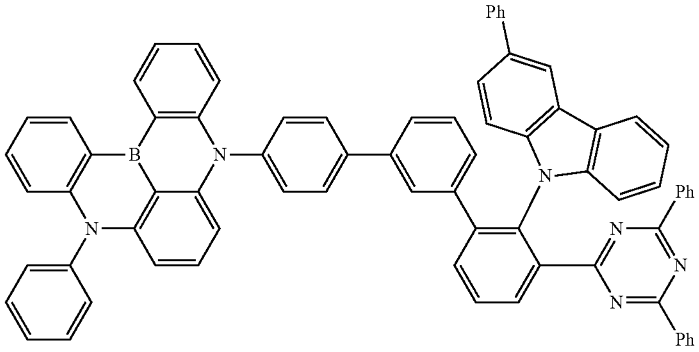
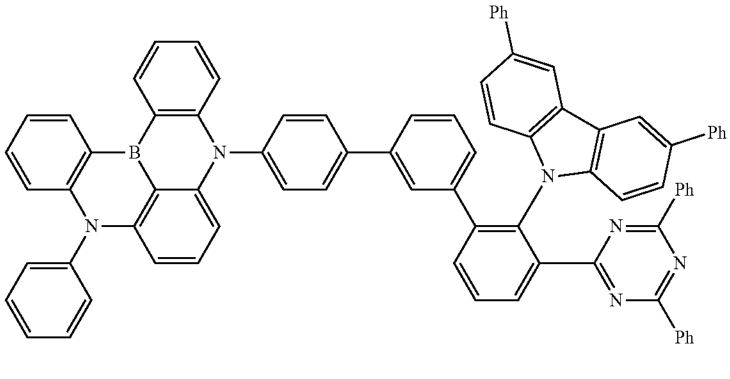

-continued
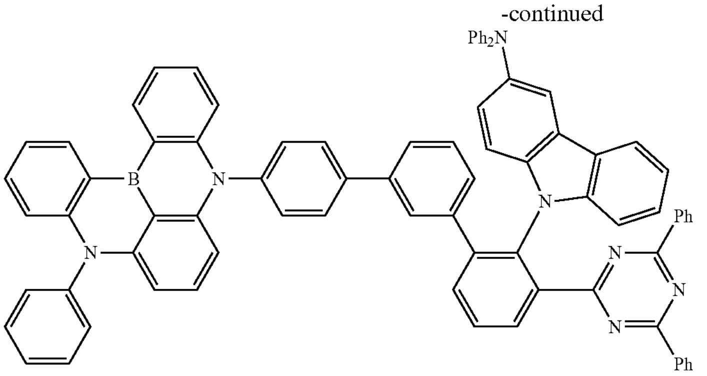
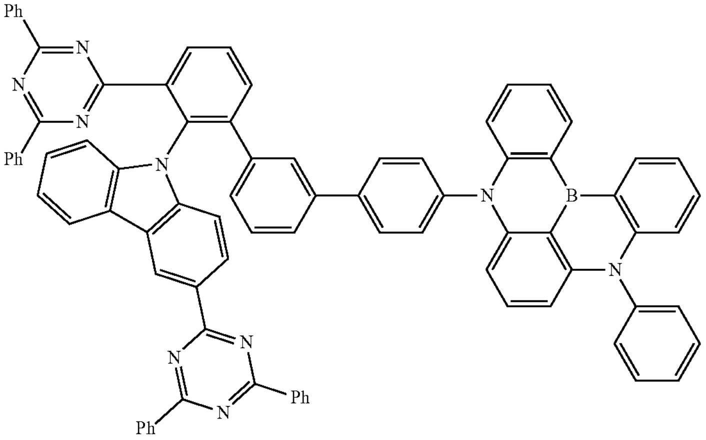
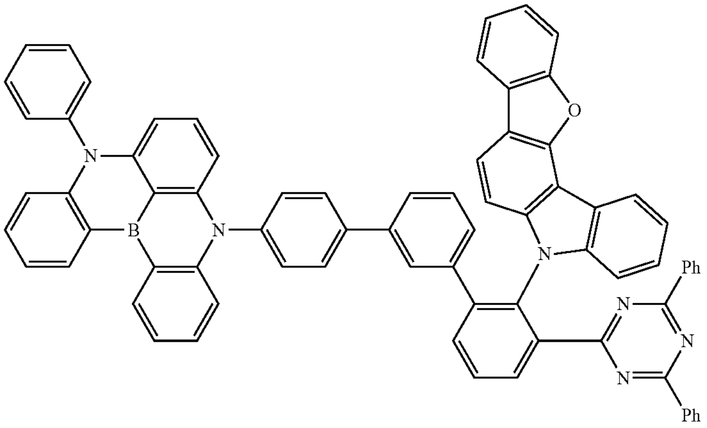
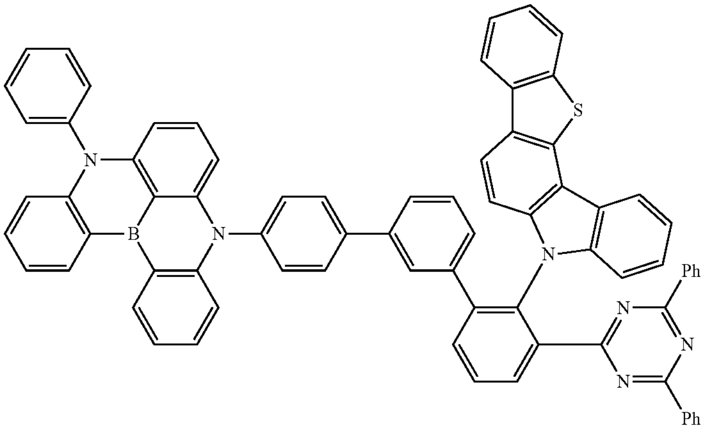

-continued
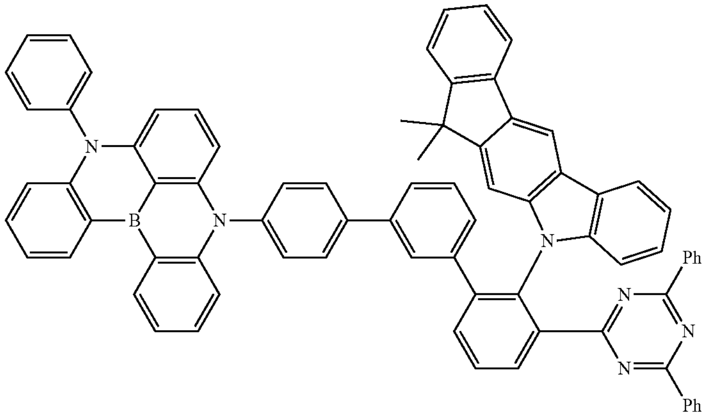
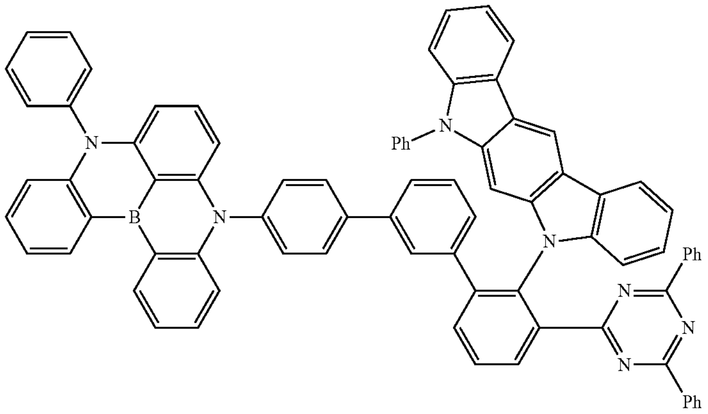
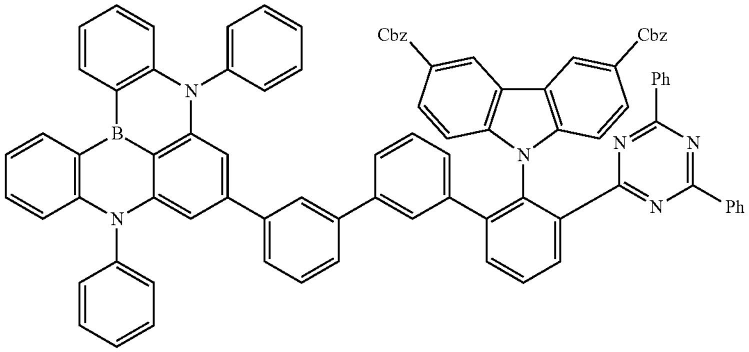
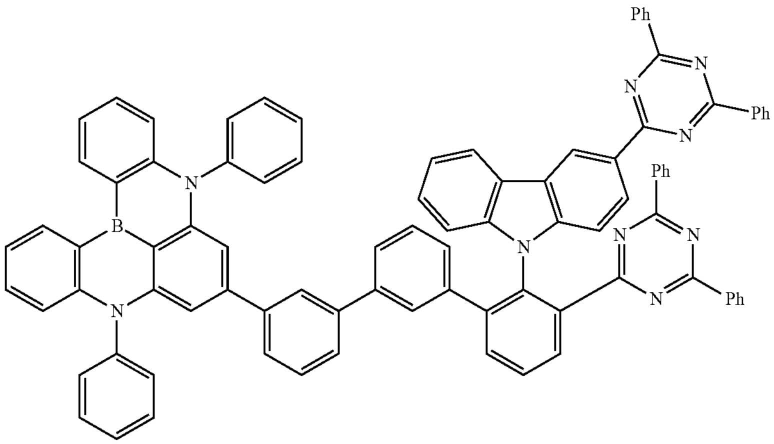

-continued
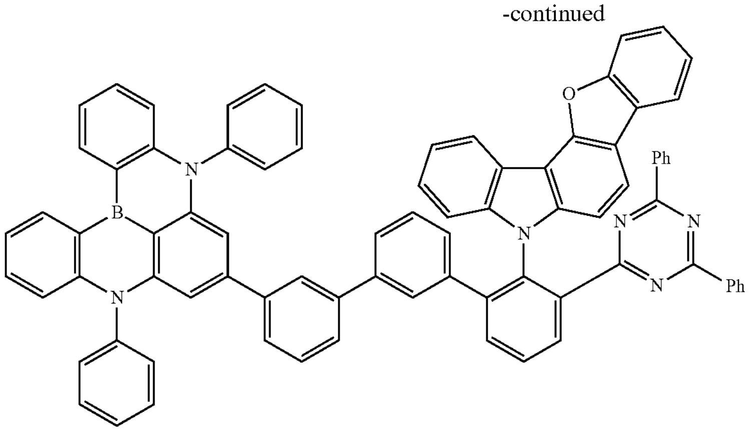
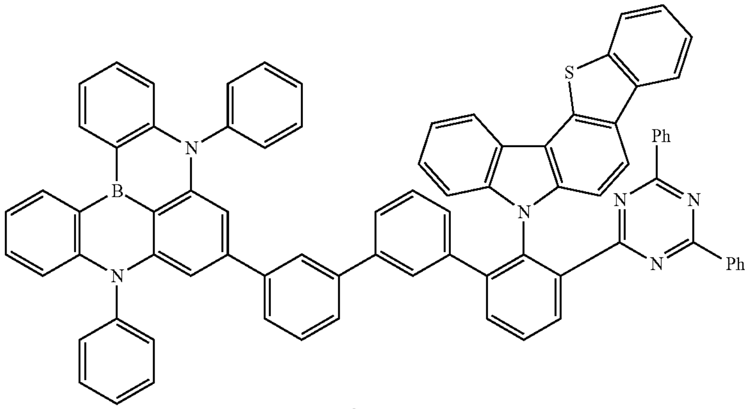
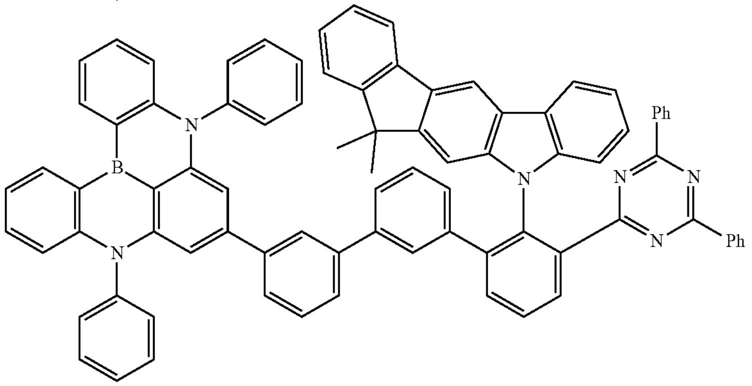
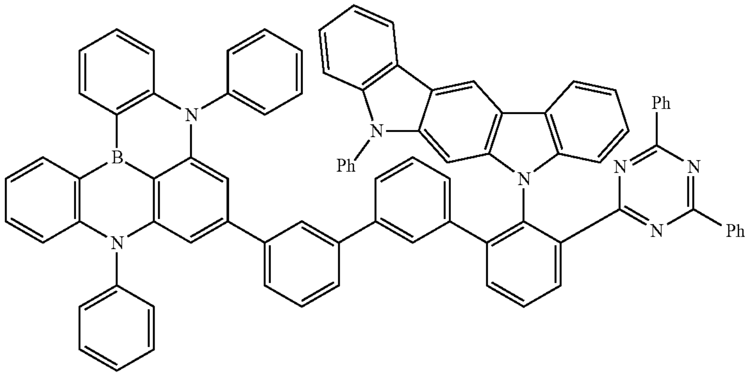

-continued
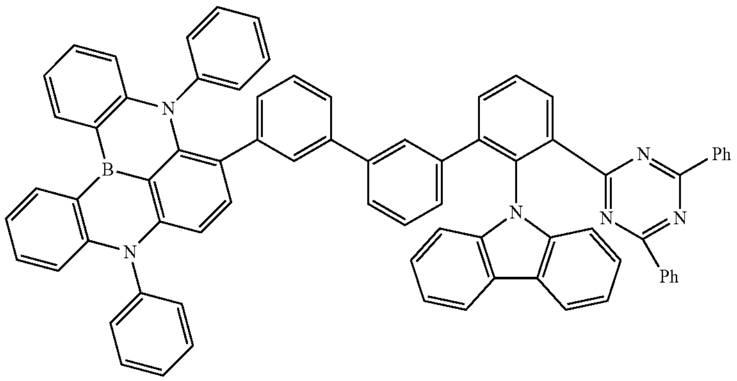
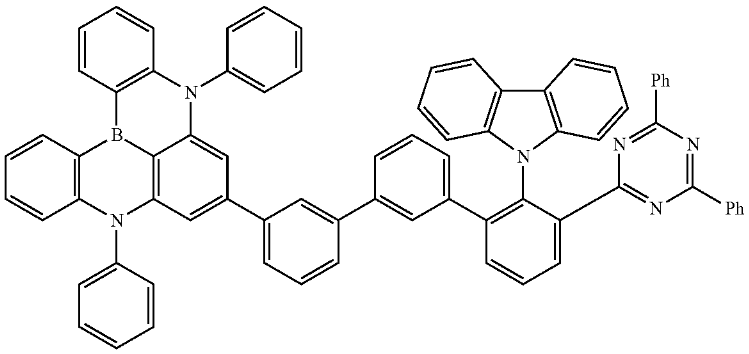
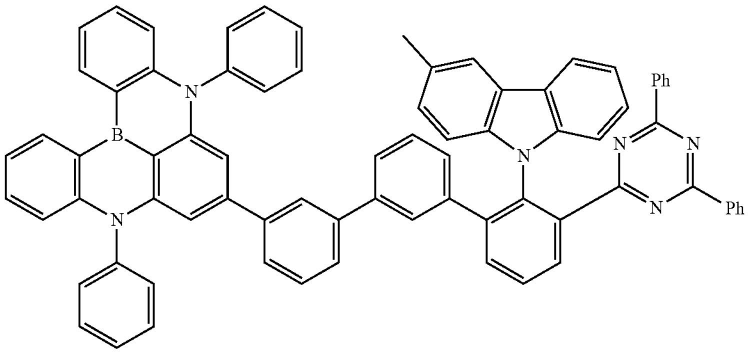
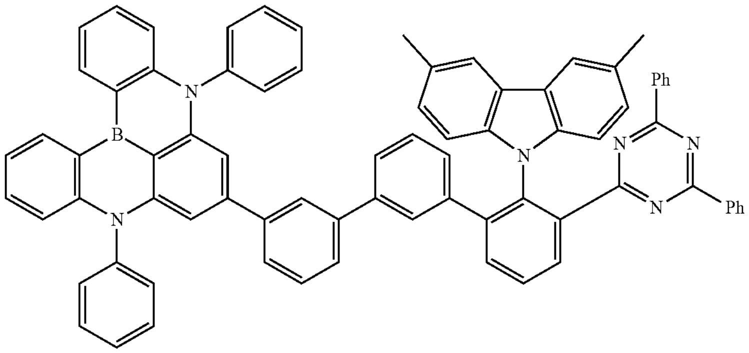

-continued
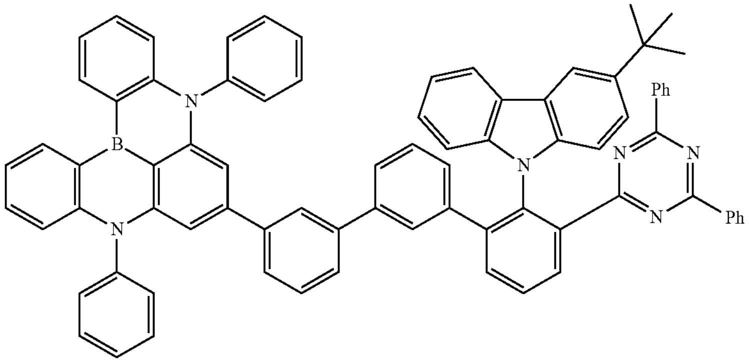
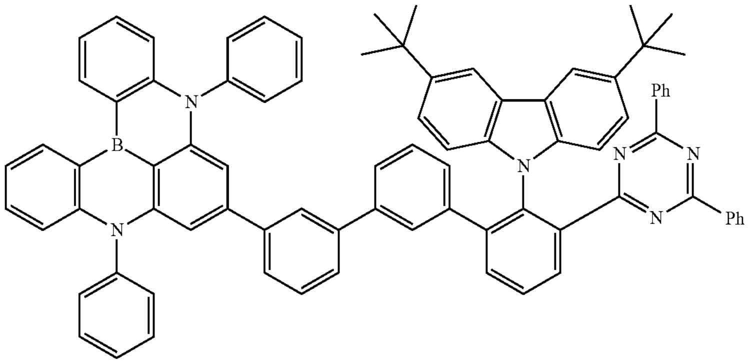
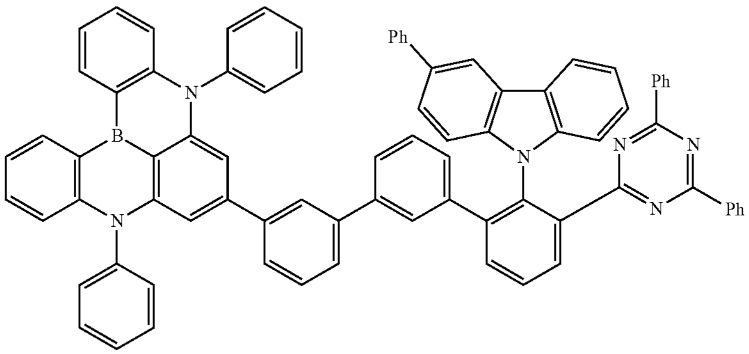
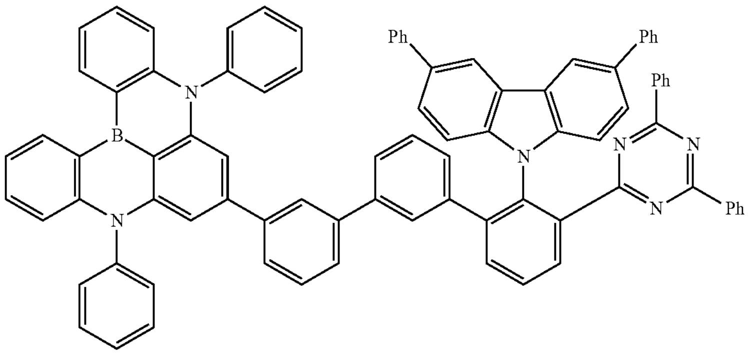

-continued
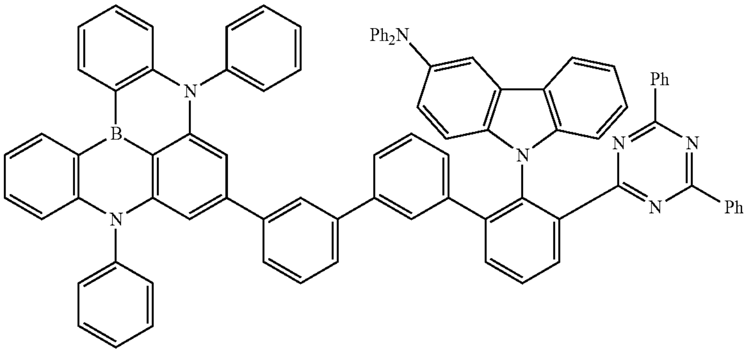
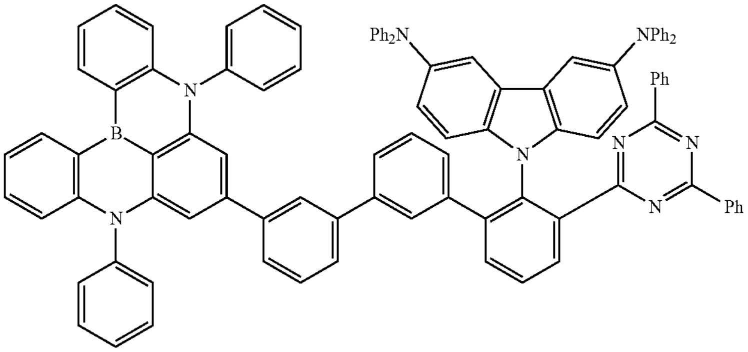
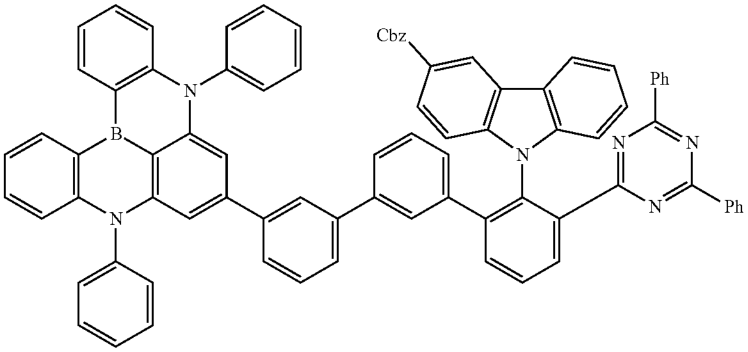
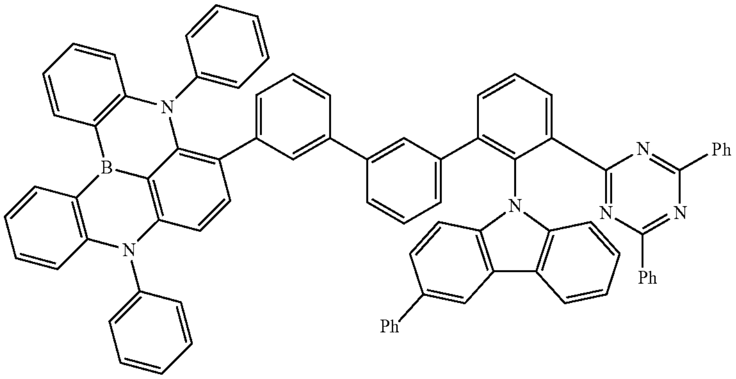

-continued
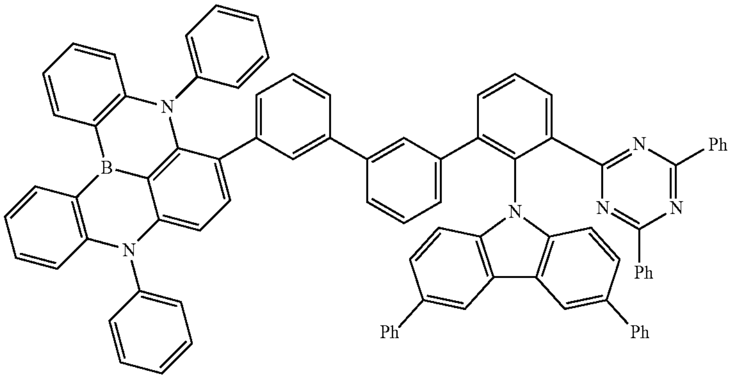
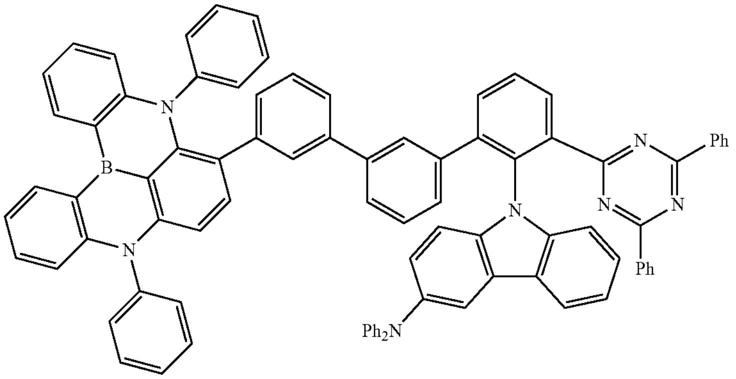
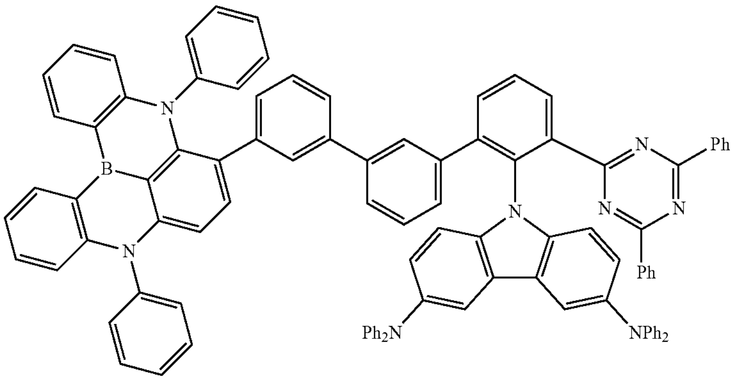
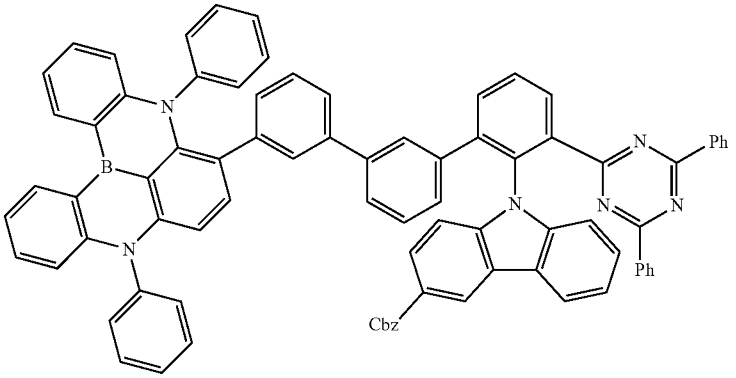

-continued
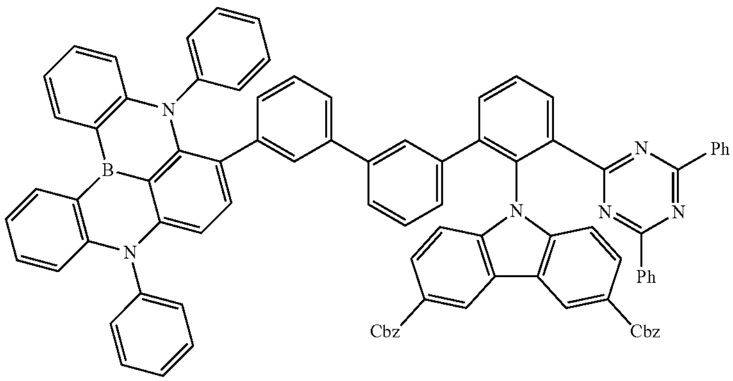
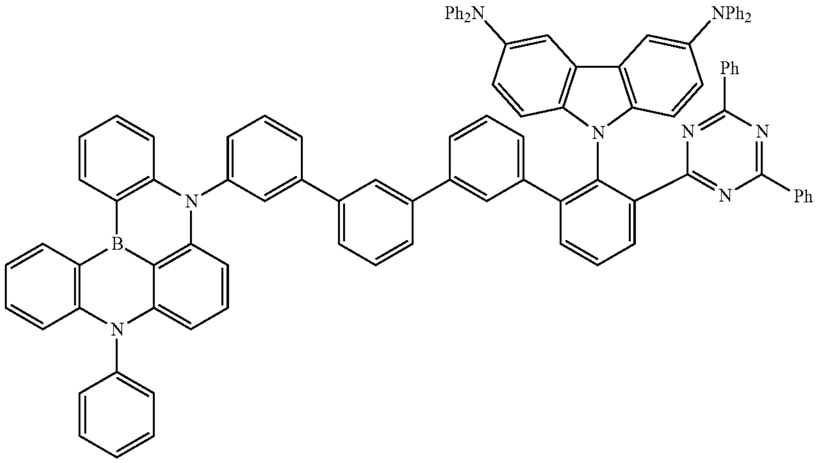
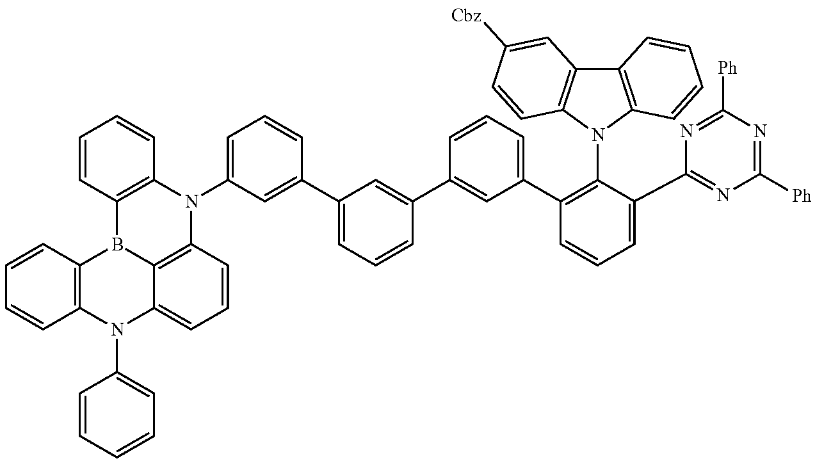

-continued
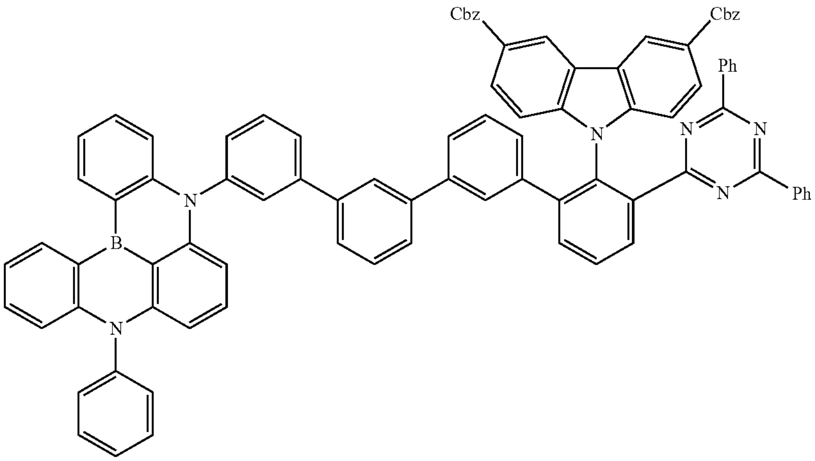
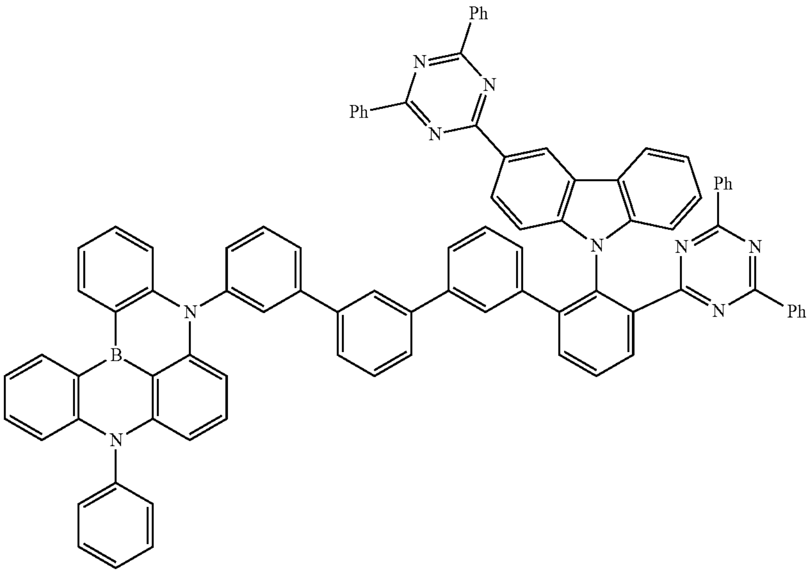
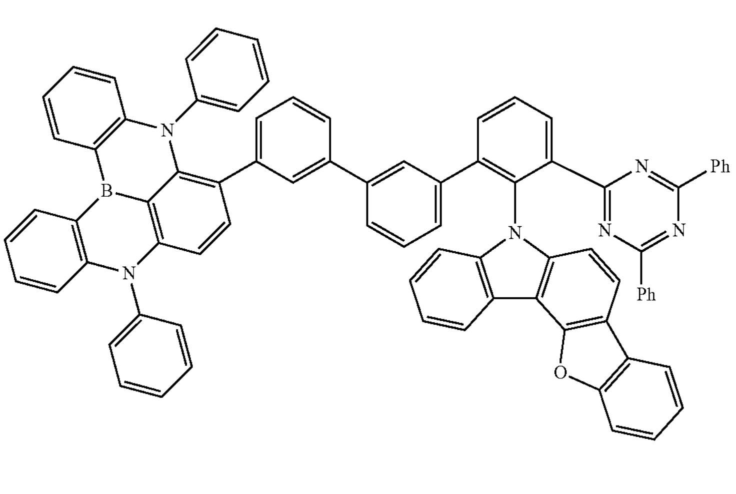

-continued
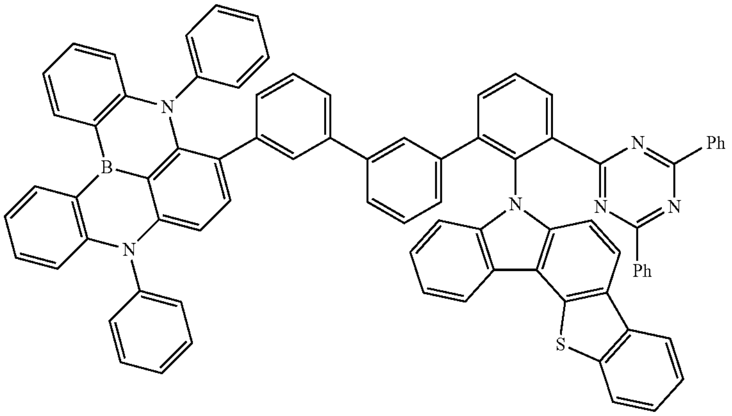
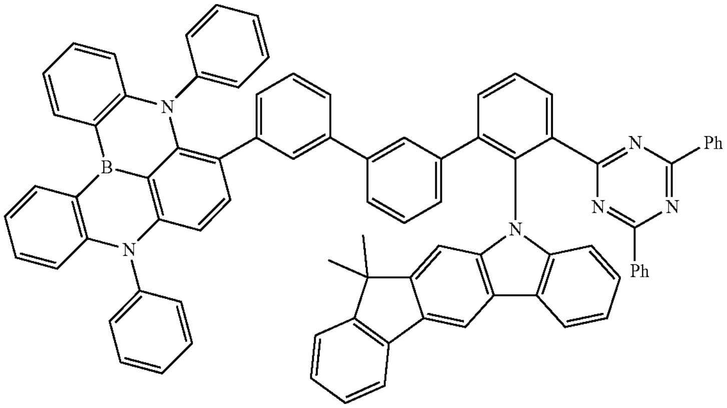
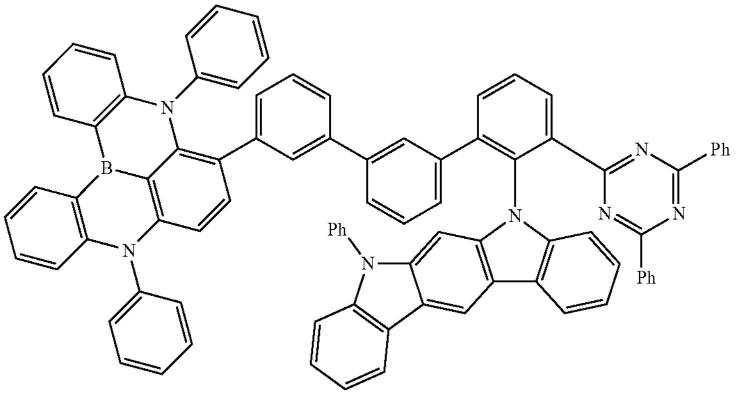
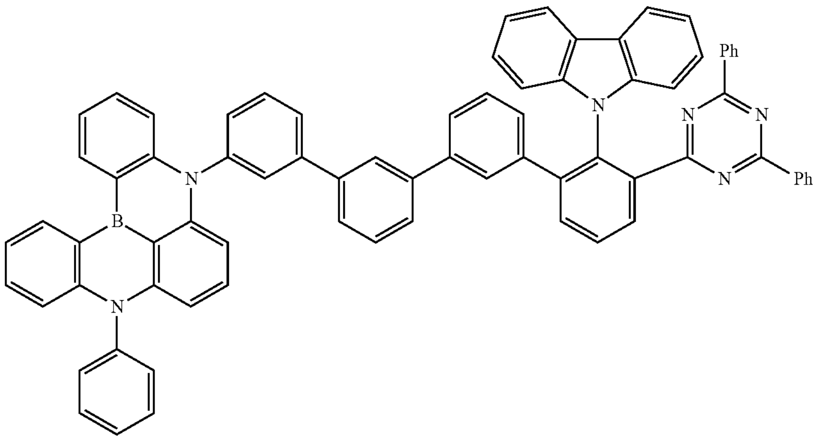

-continued
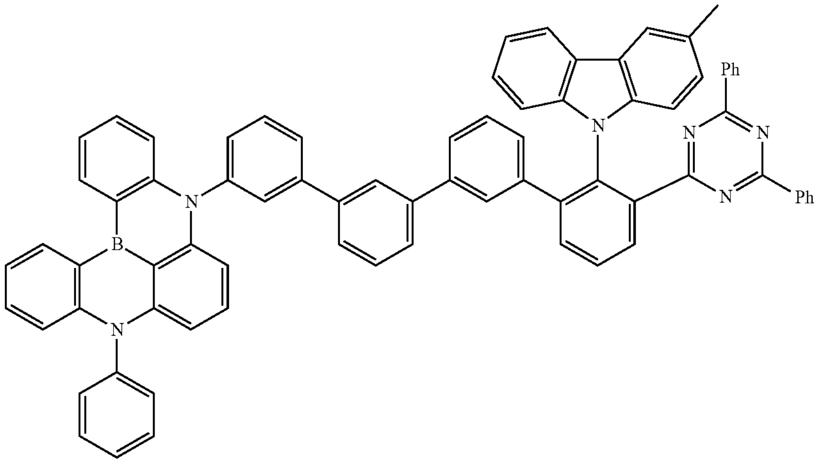
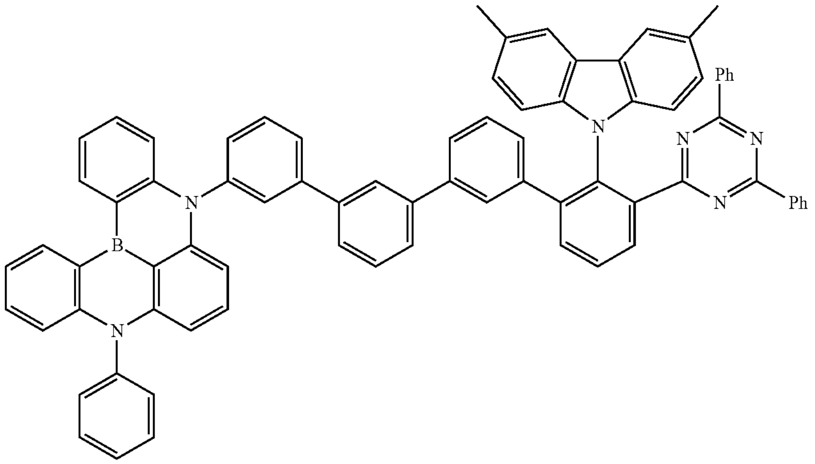
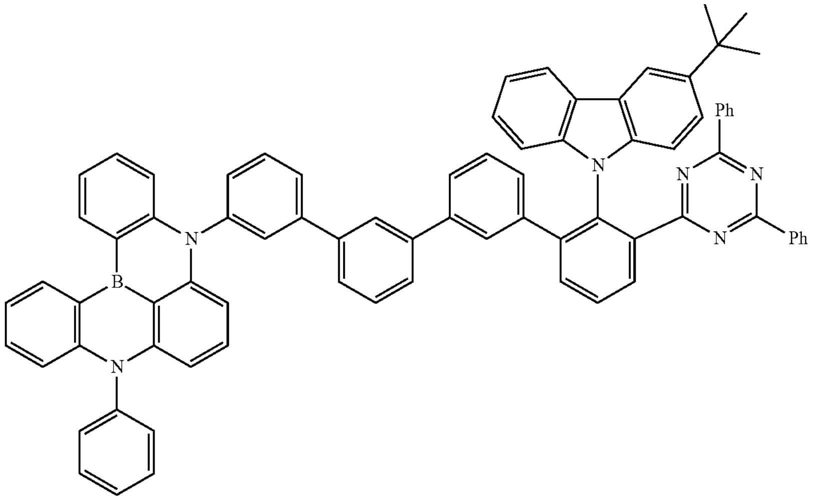

-continued
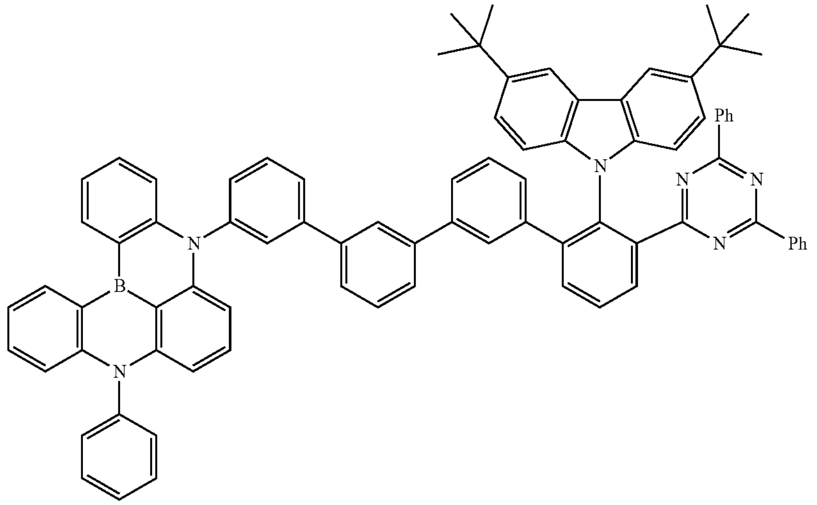
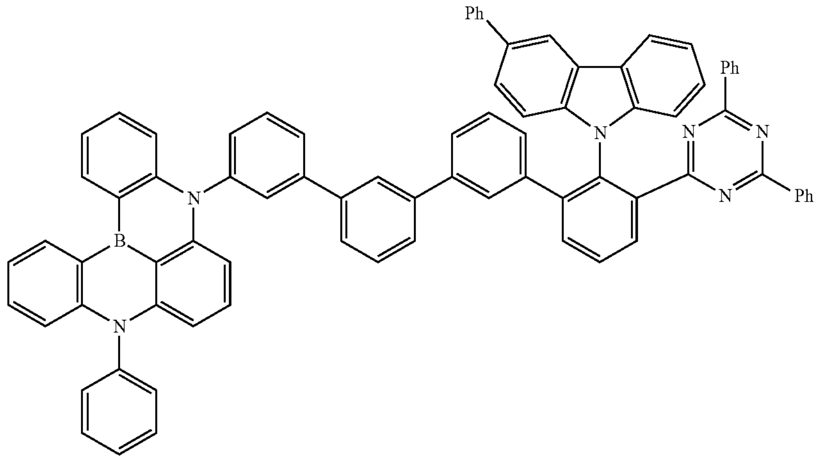
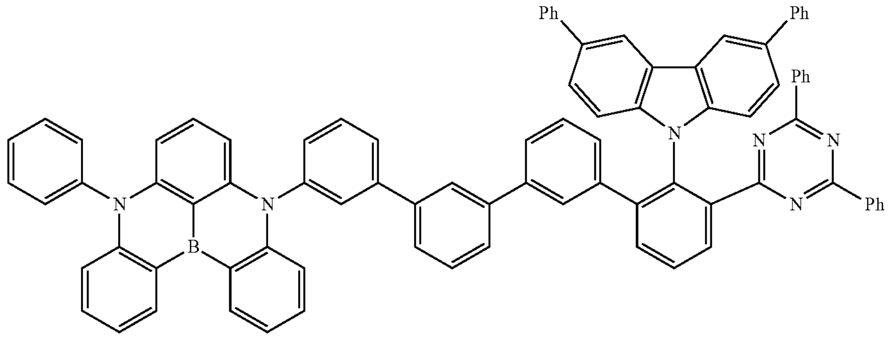
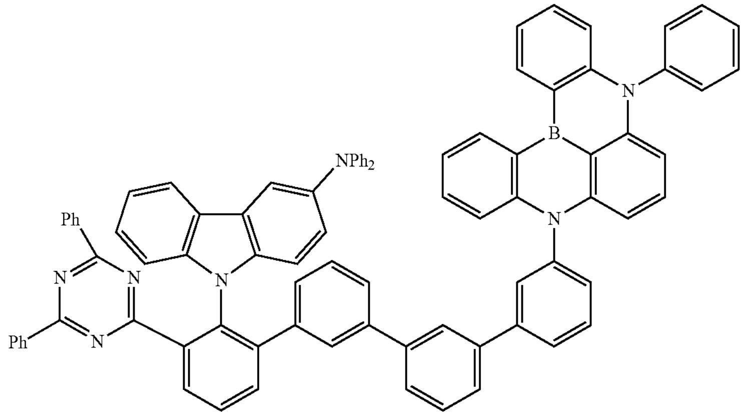

-continued
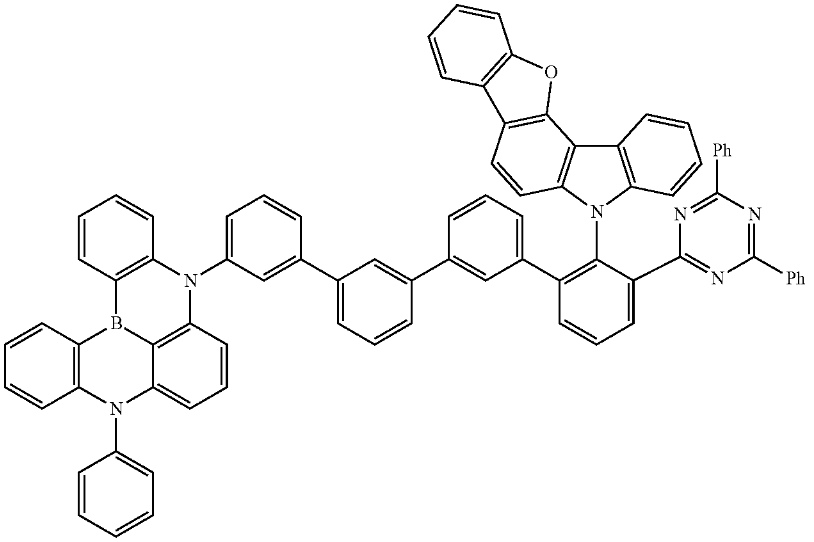
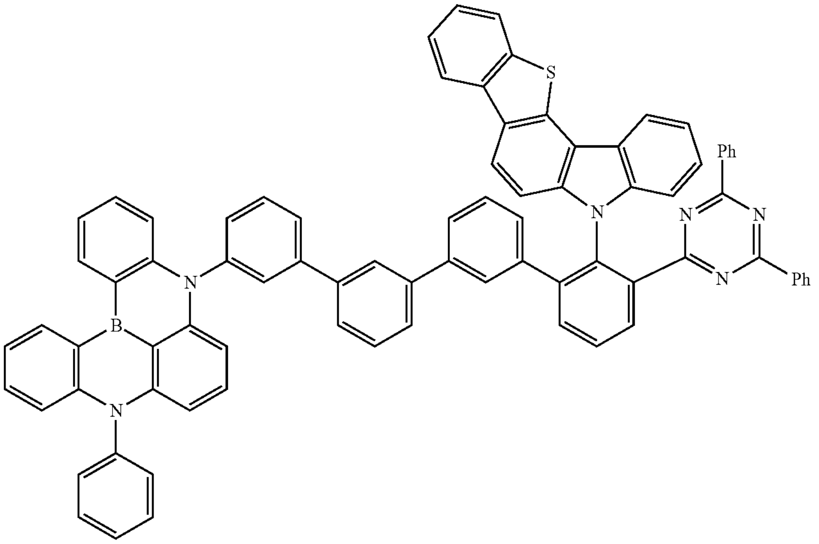
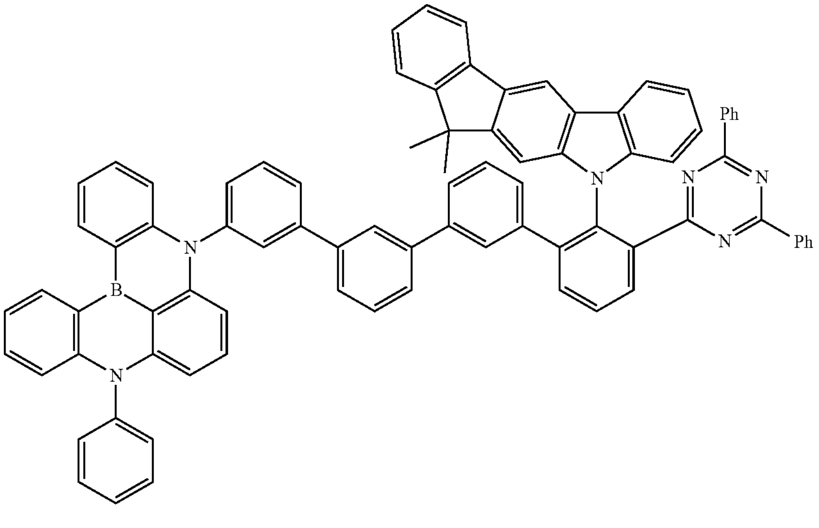

-continued
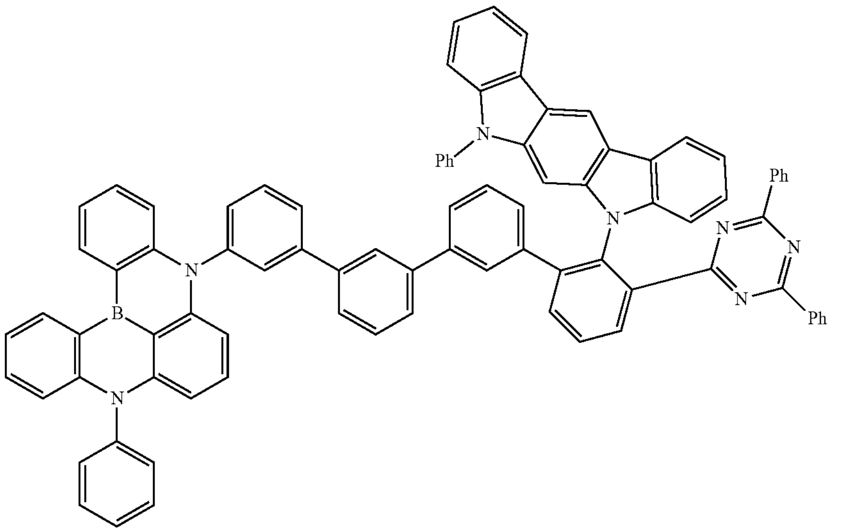
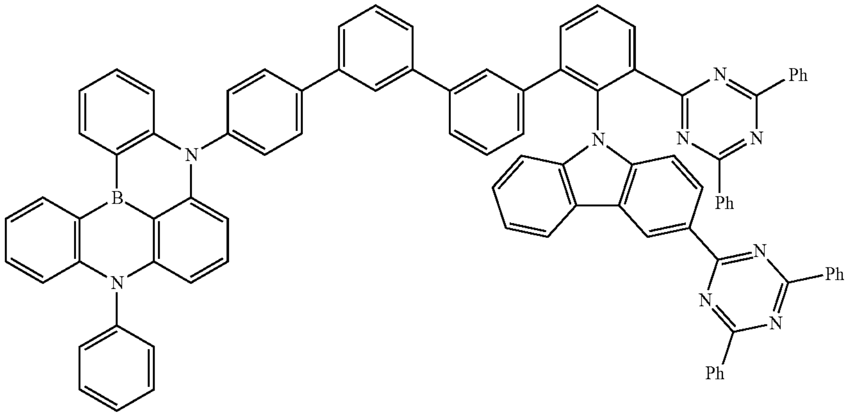
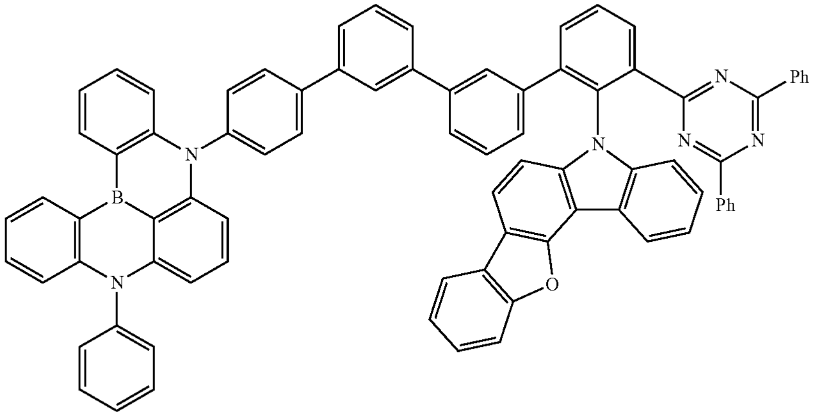

-continued
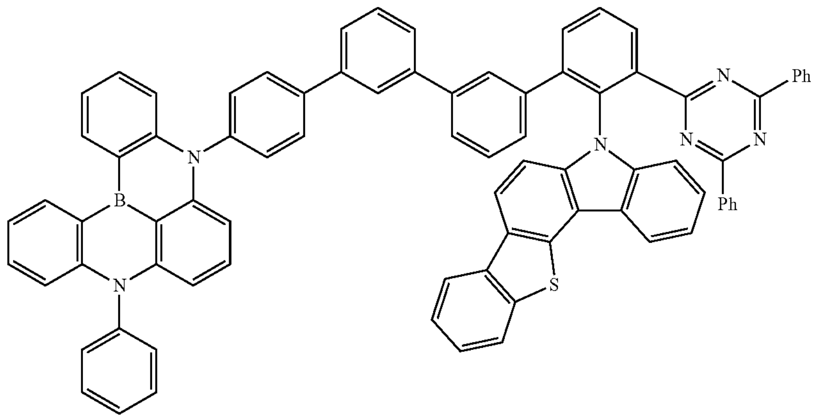
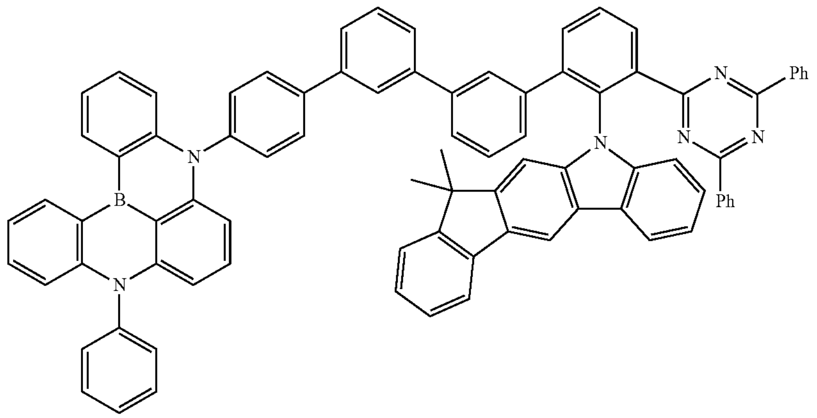
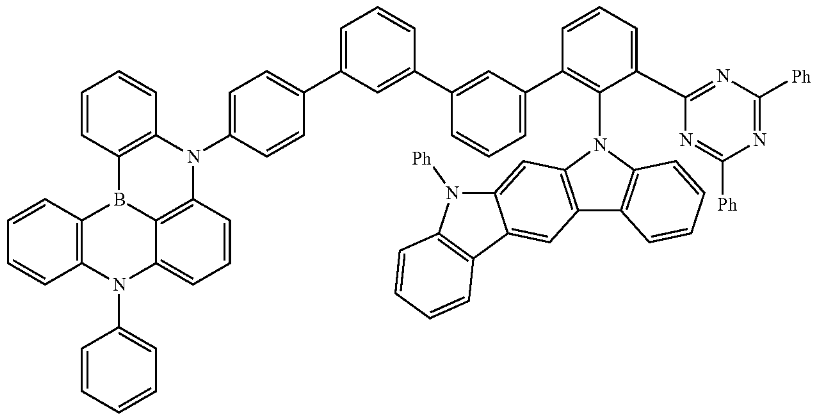

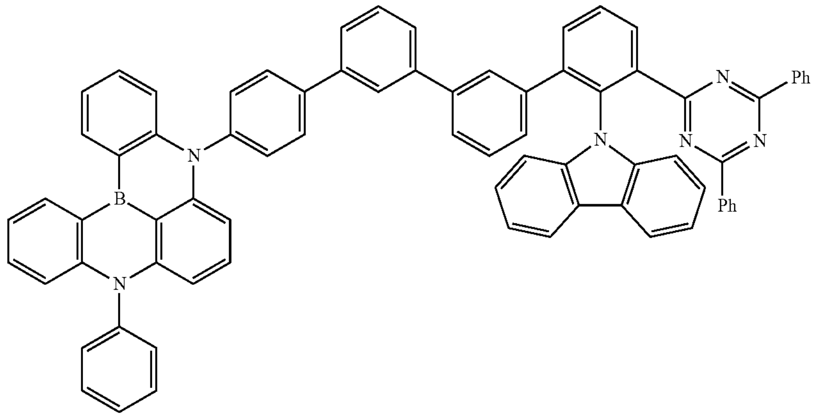
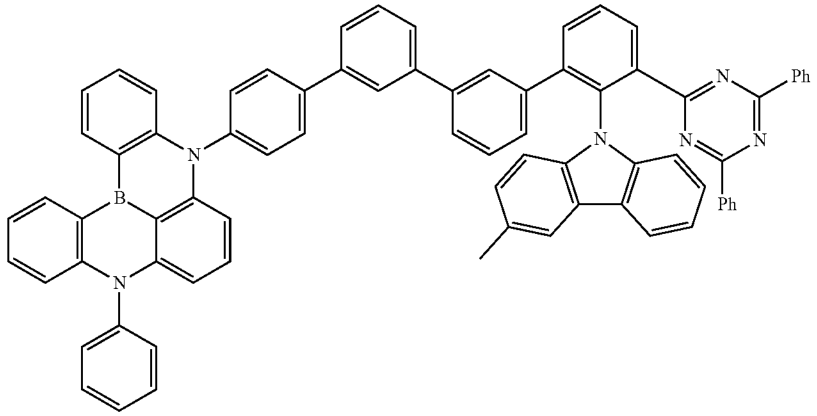
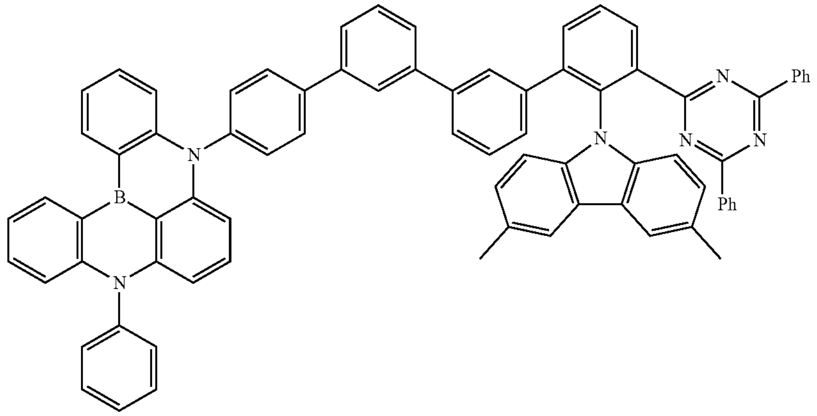
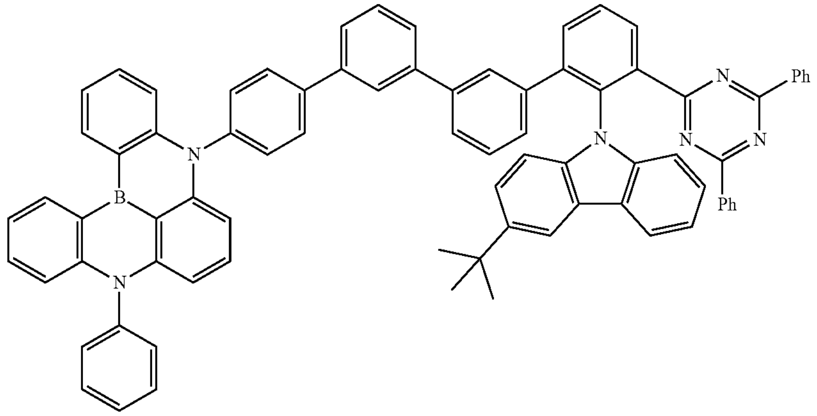

-continued
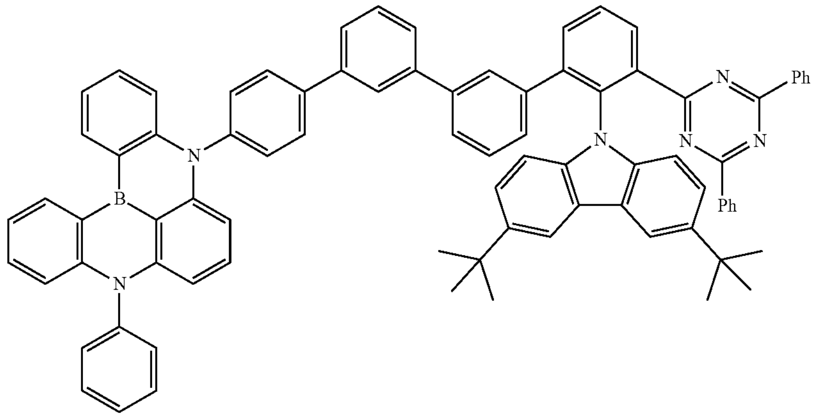
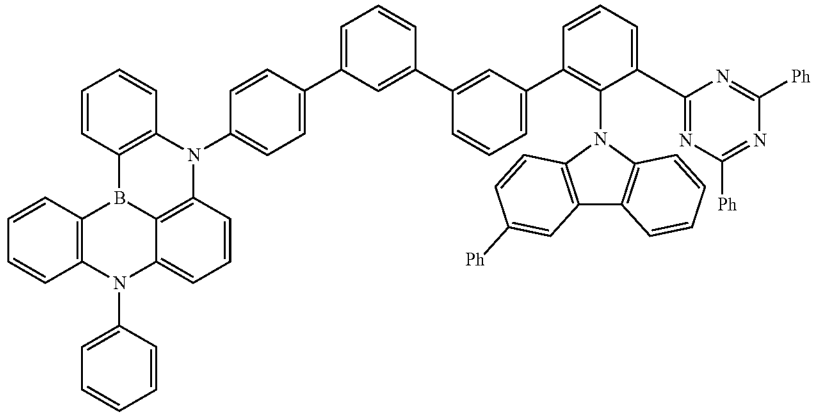
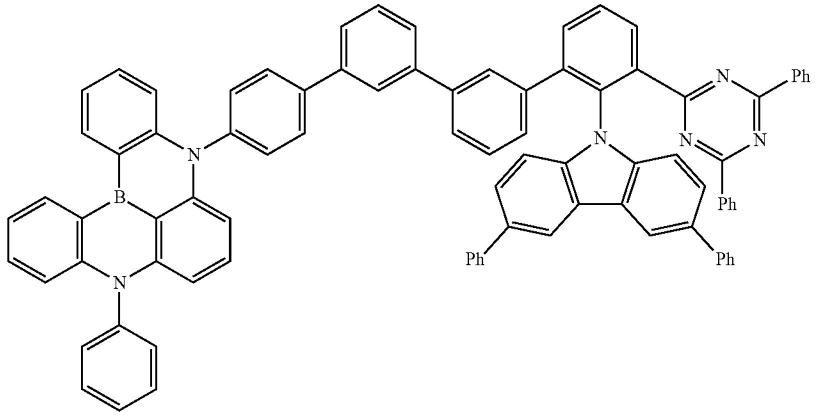
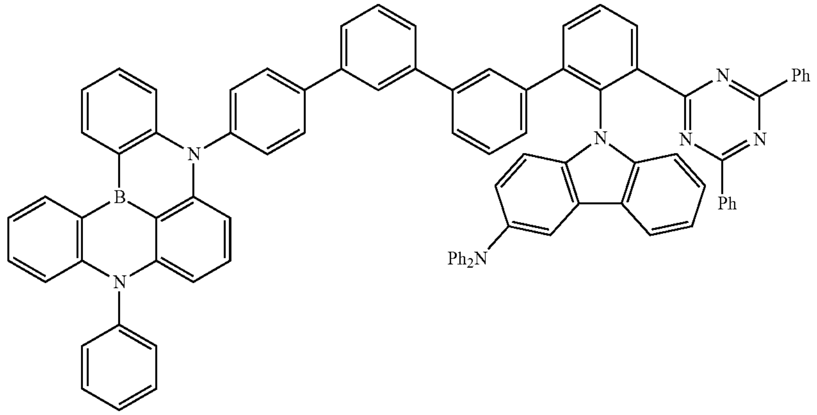

-continued
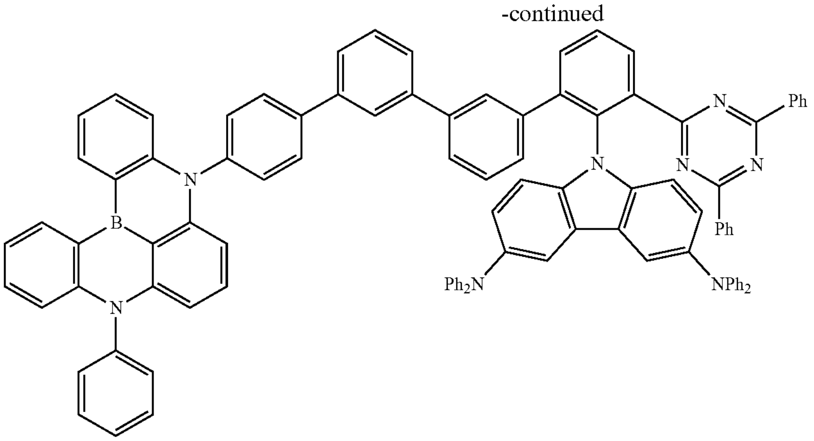
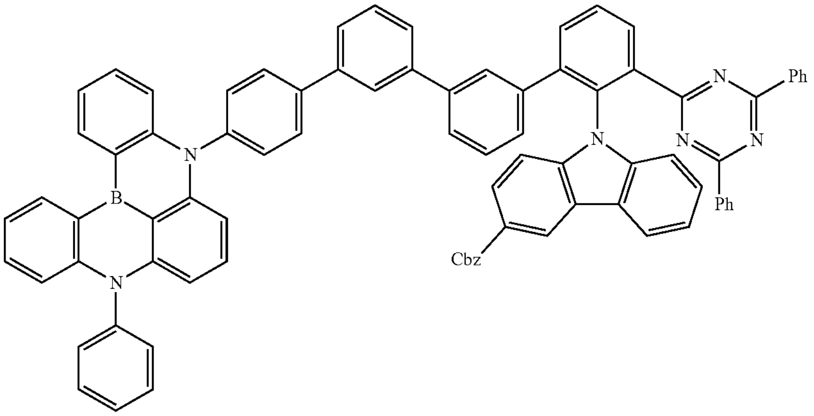
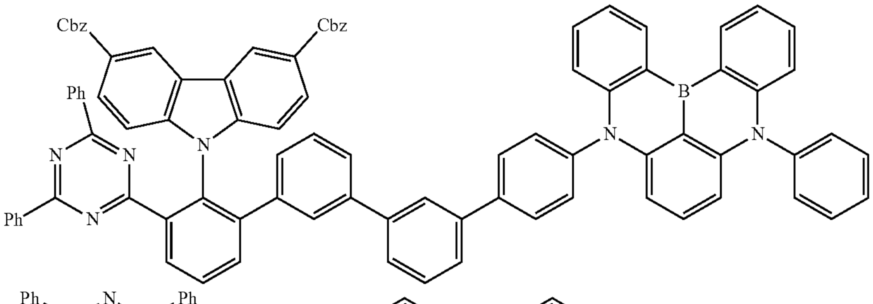
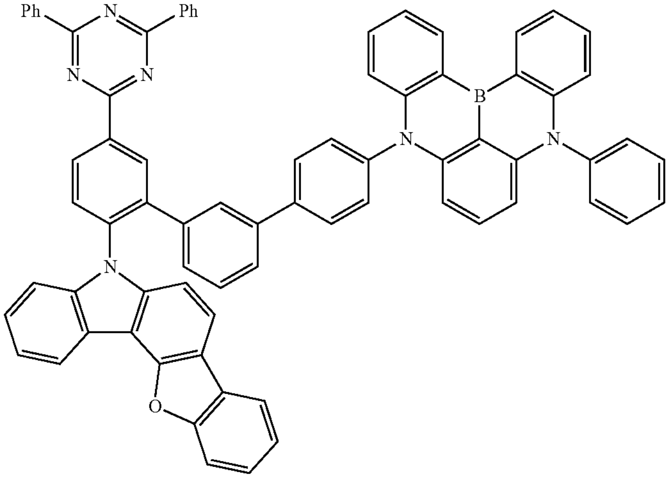

-continued
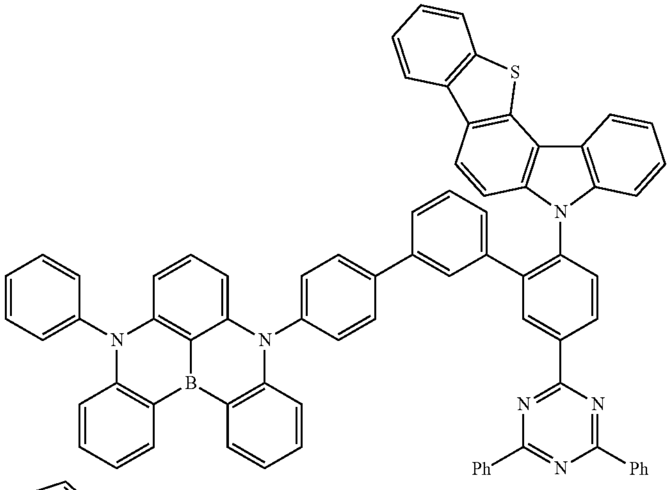
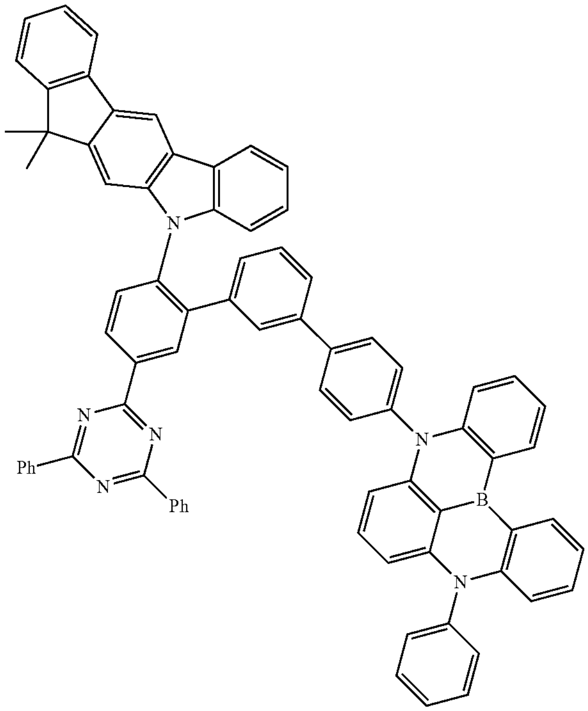
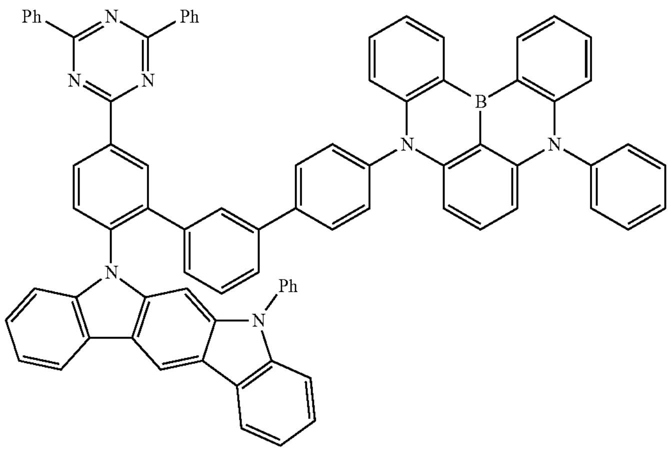

-continued
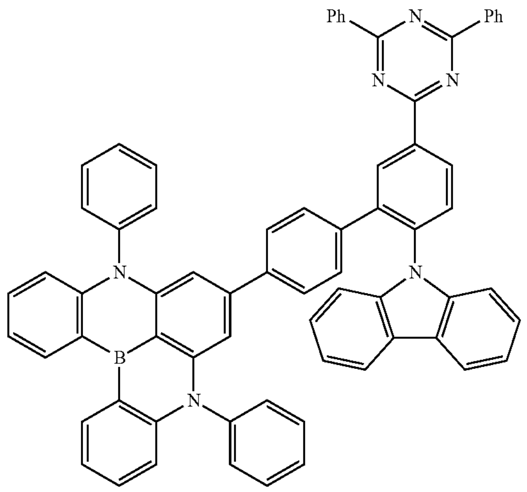
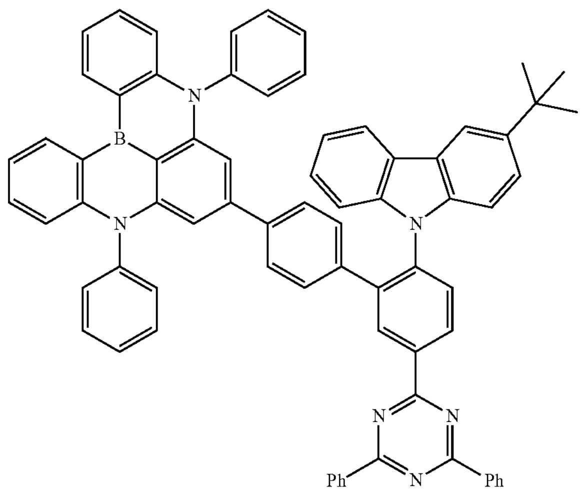
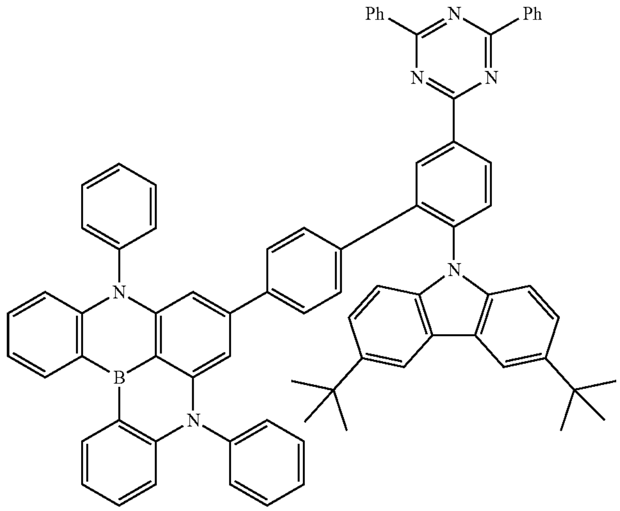
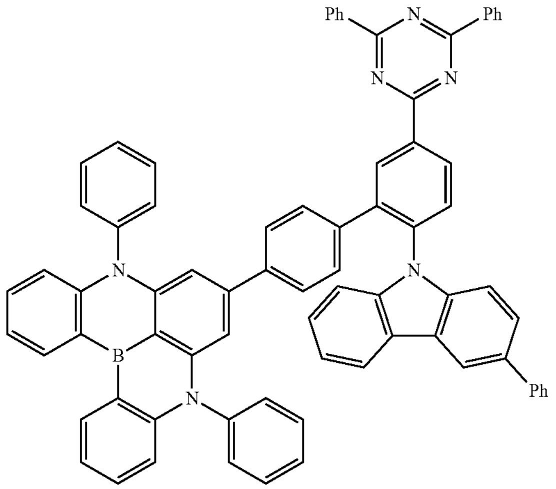
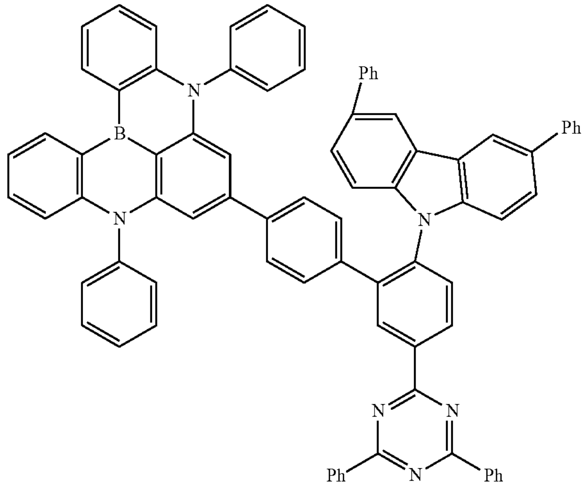
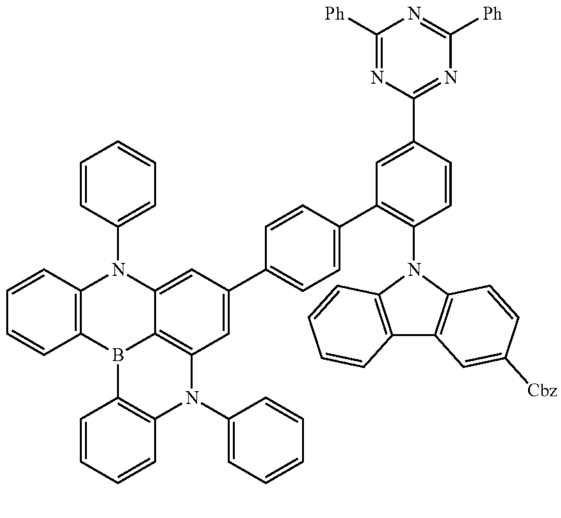

-continued
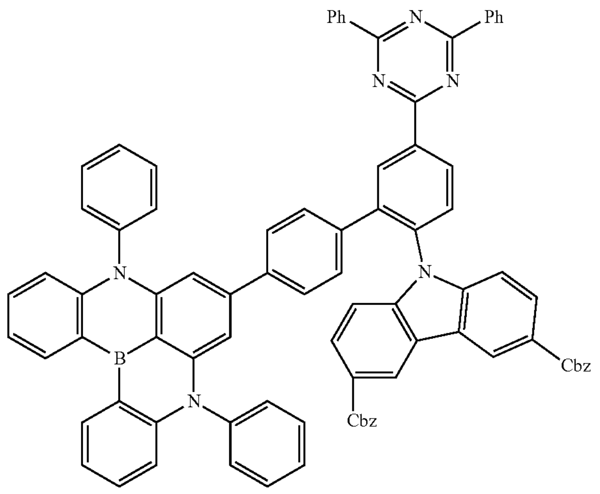
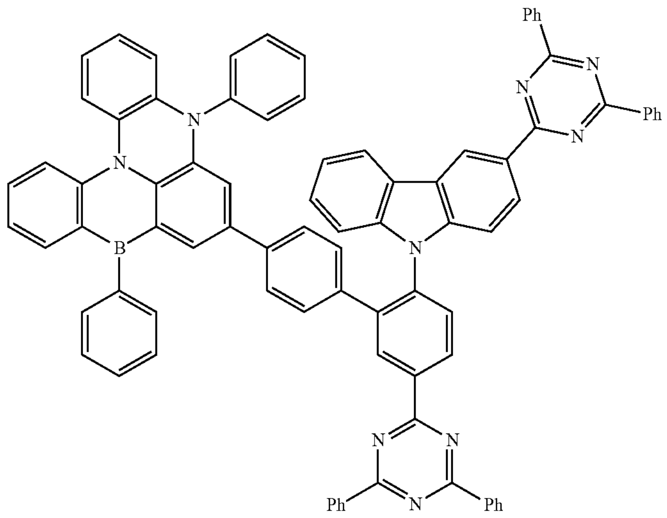
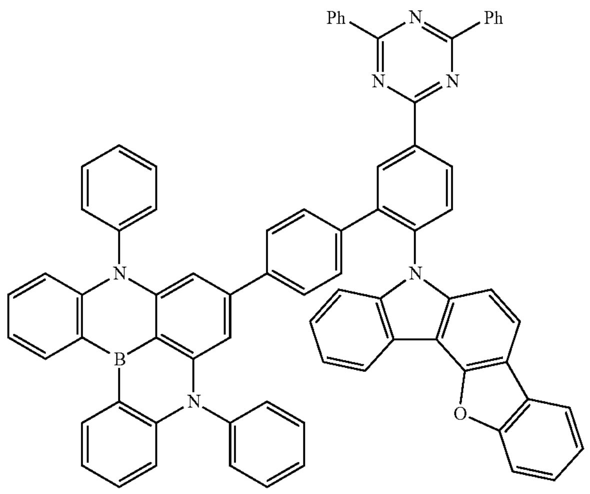

-continued
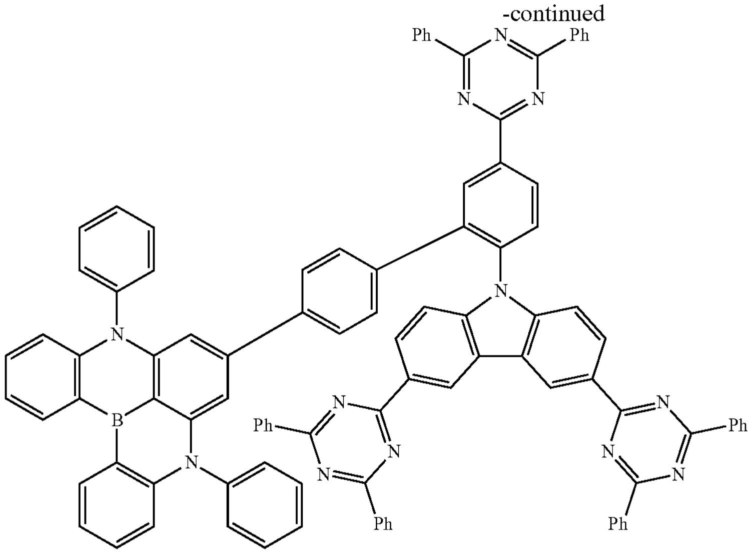
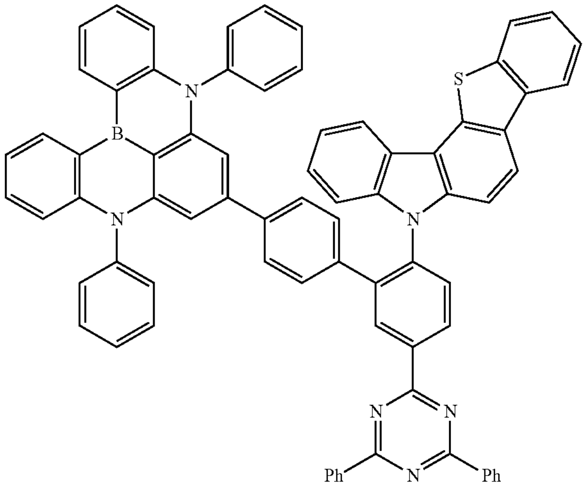
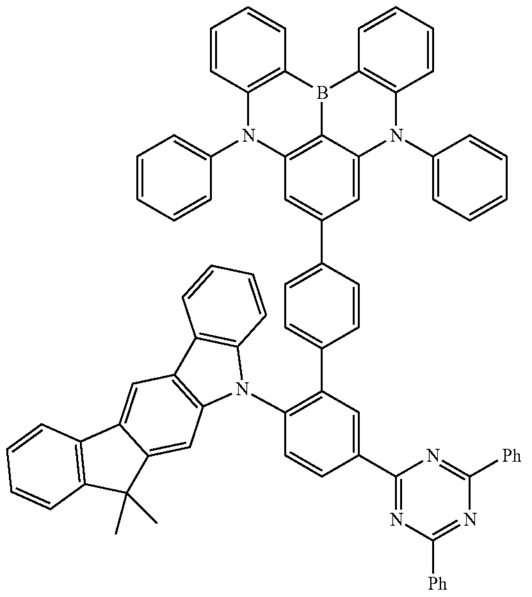
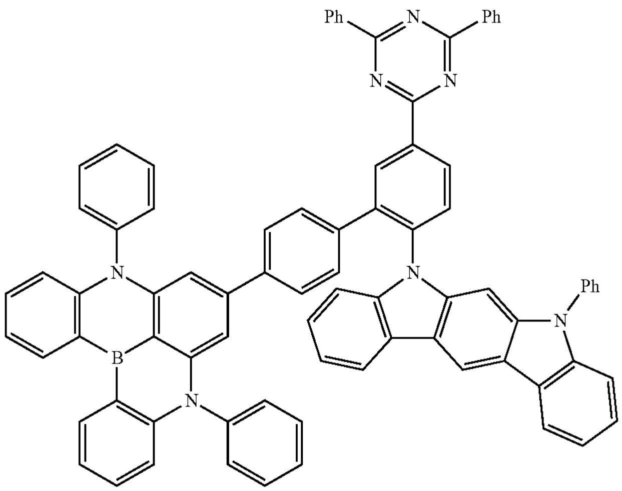
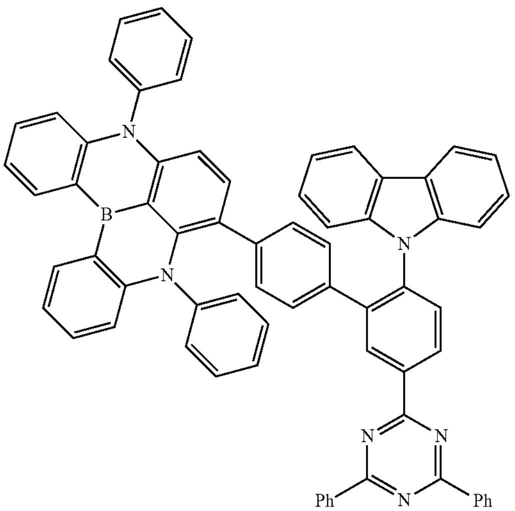

-continued
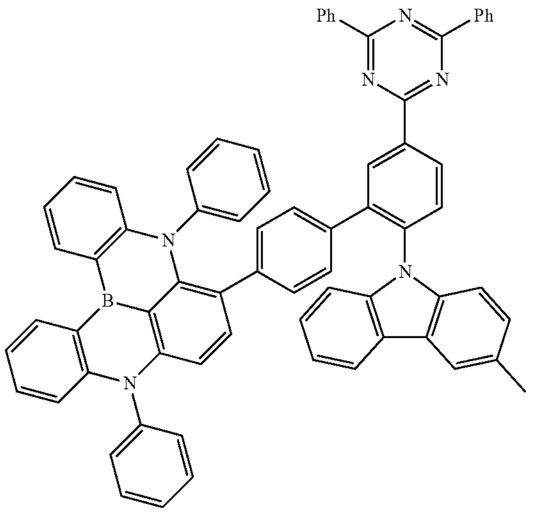
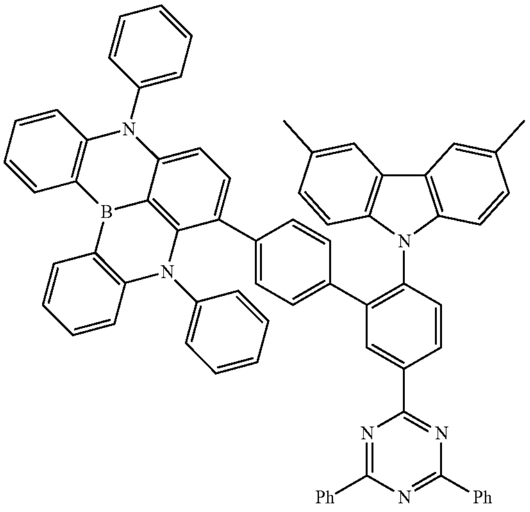
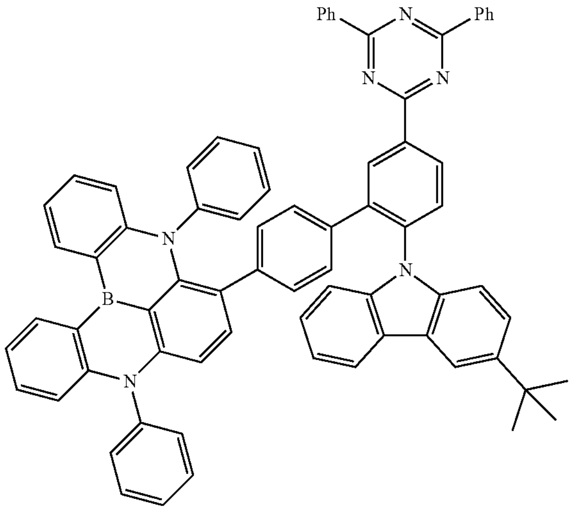
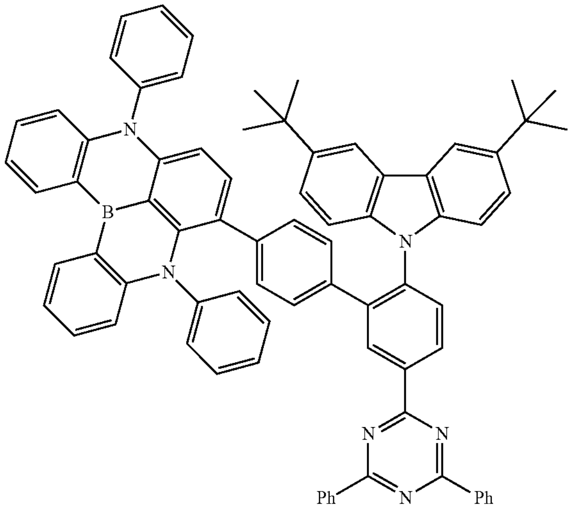
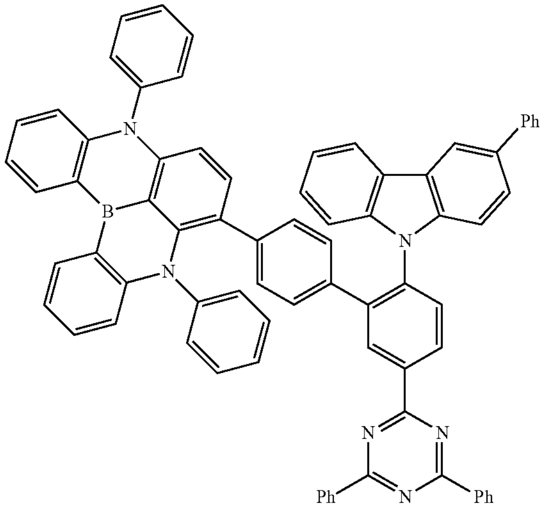
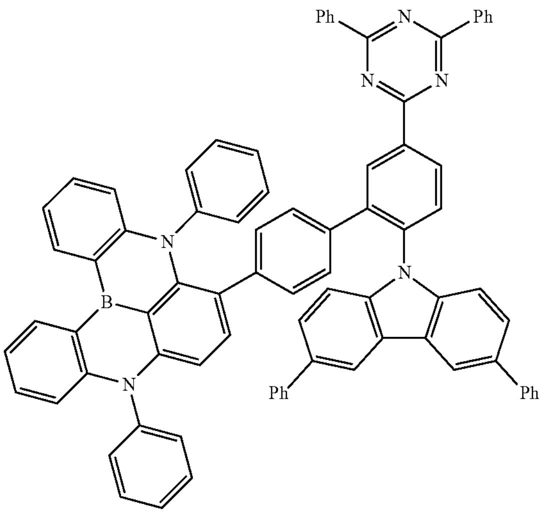

-continued
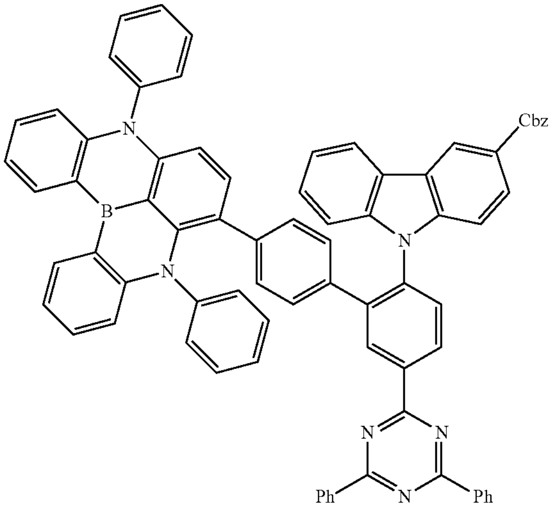
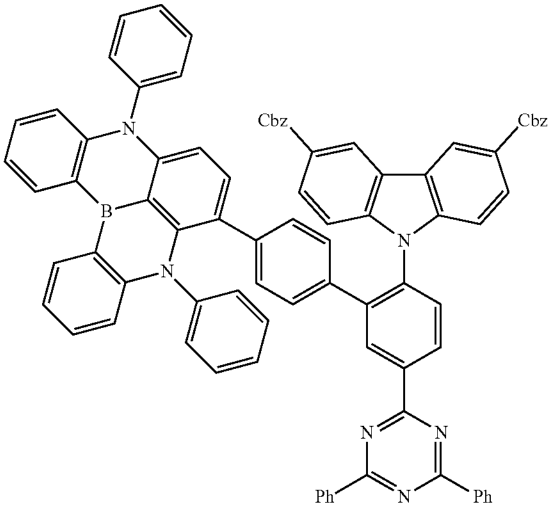
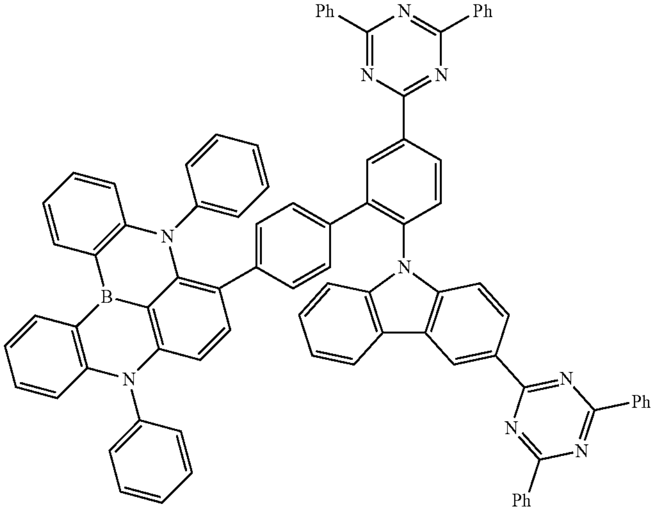
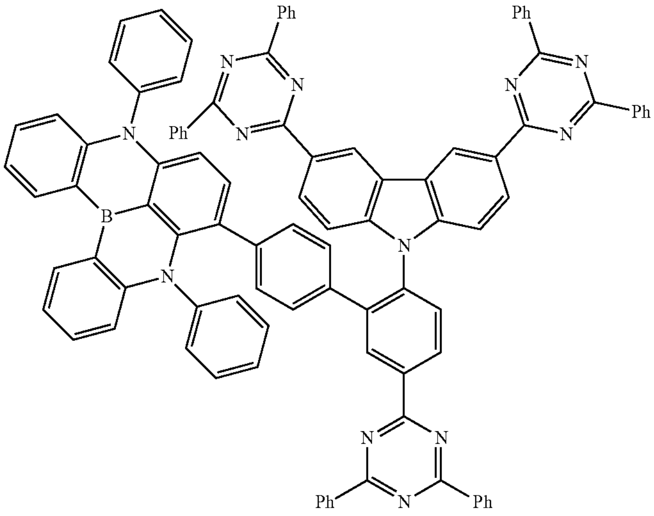

-continued
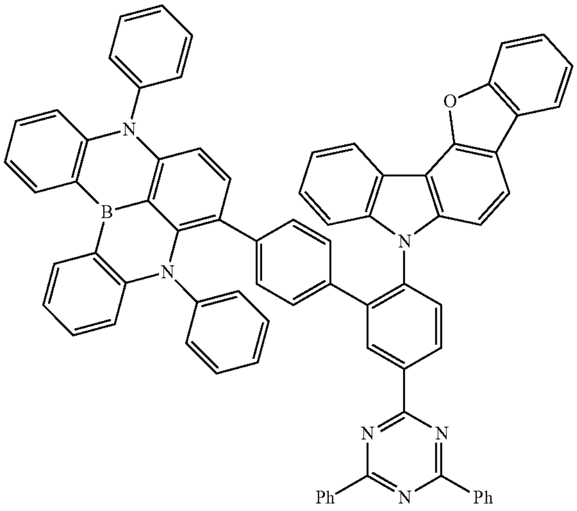
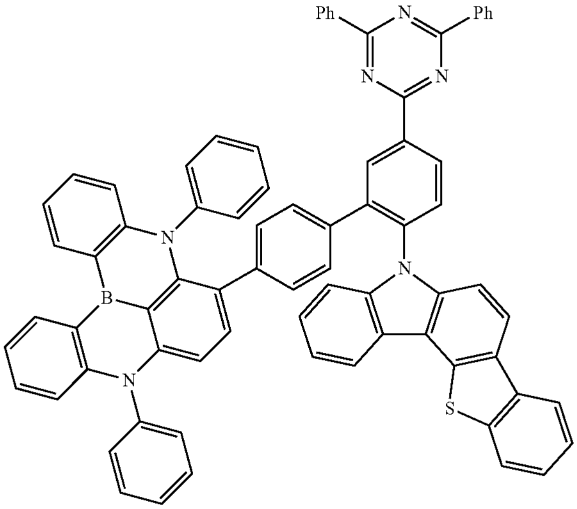
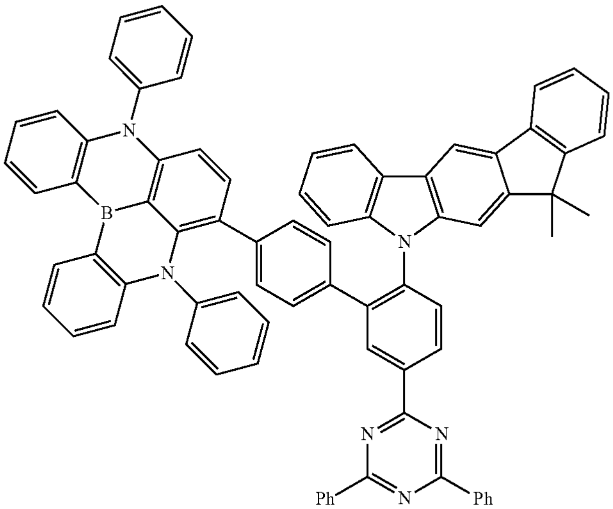

-continued
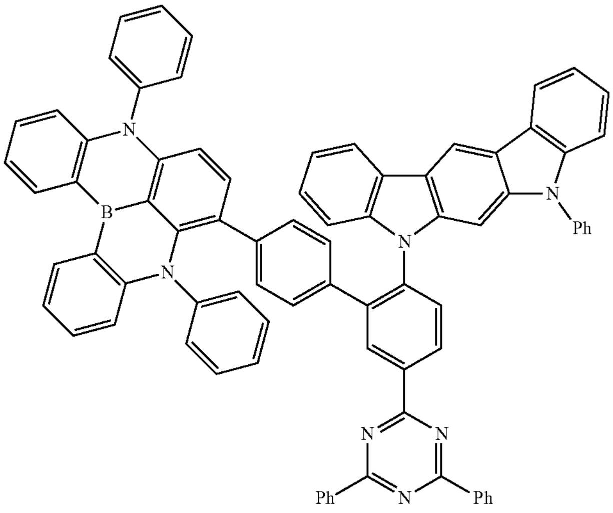
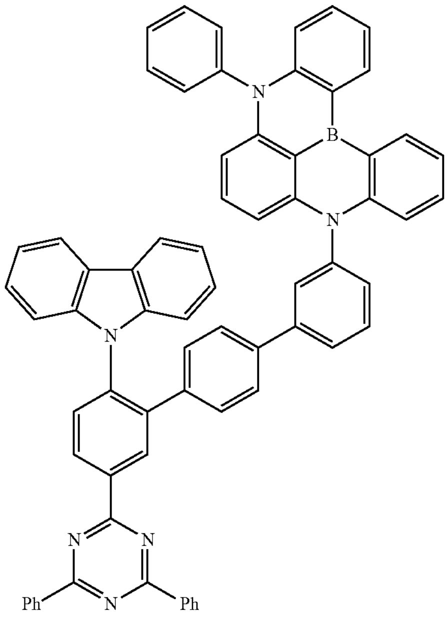
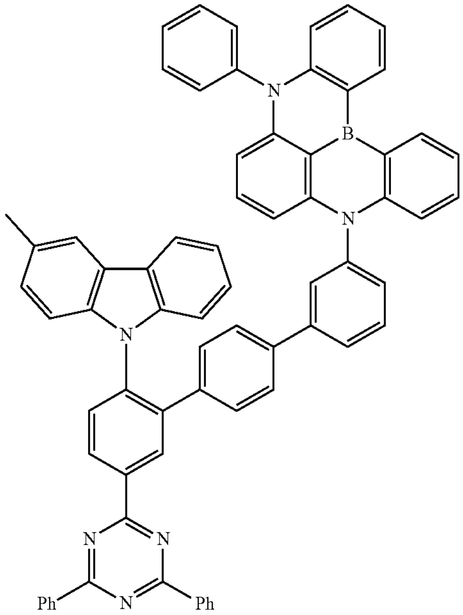
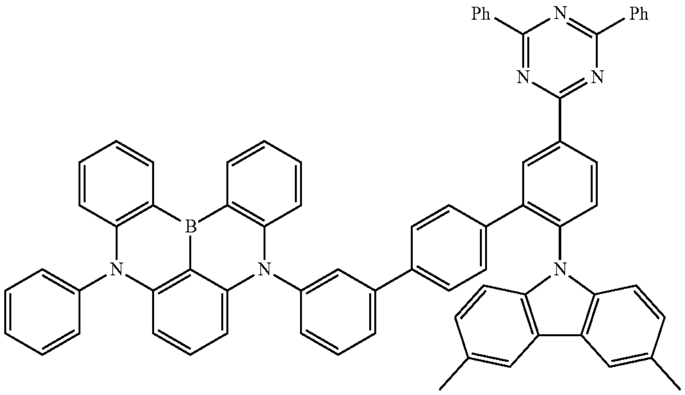
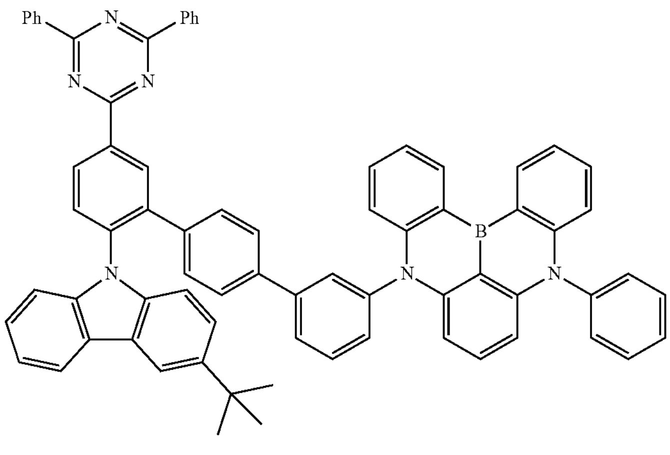

-continued
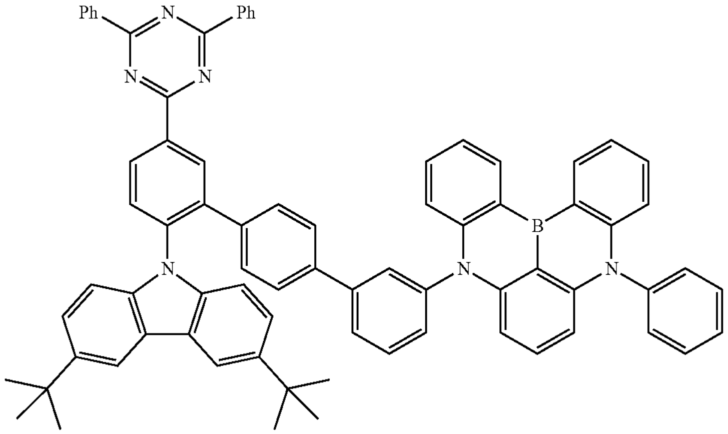
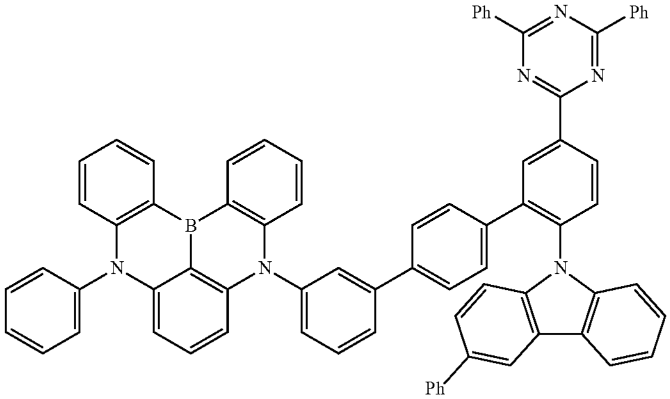
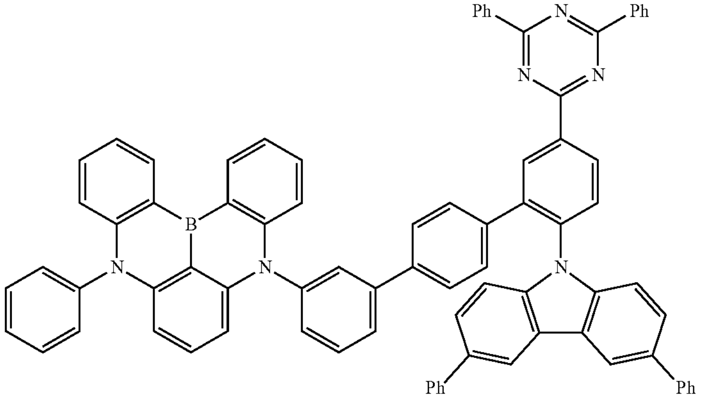
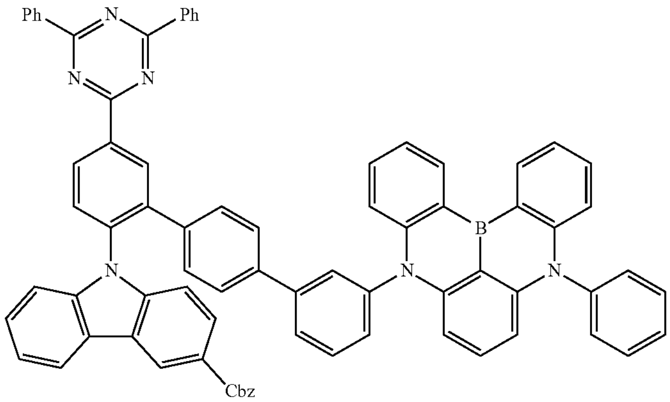

-continued
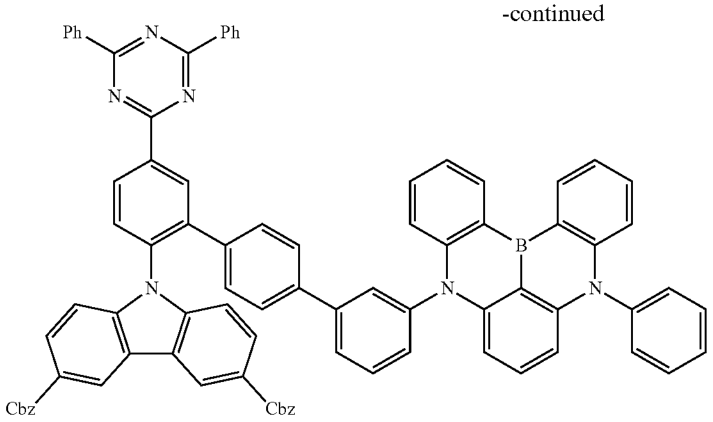
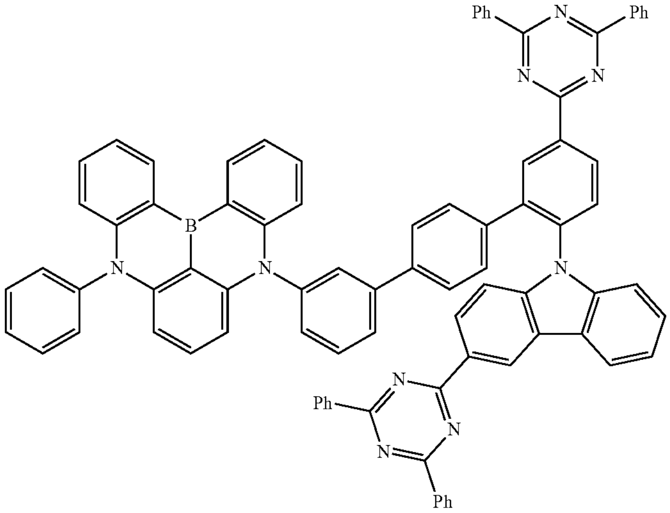
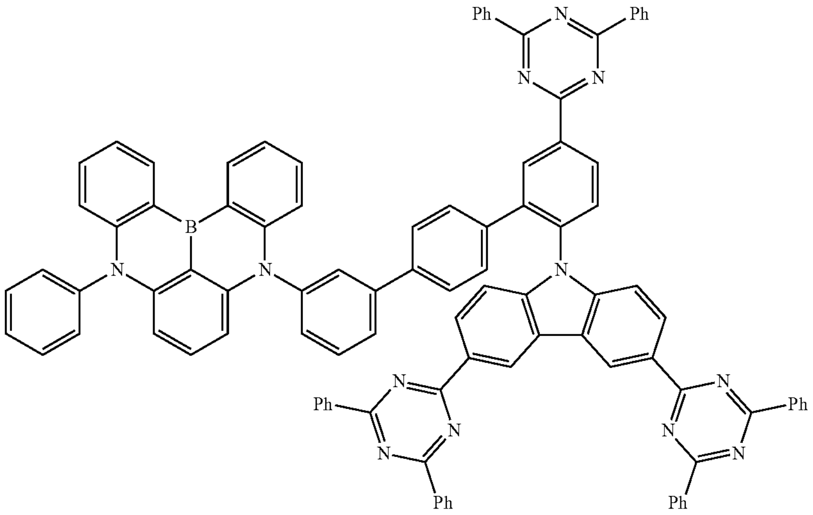

-continued
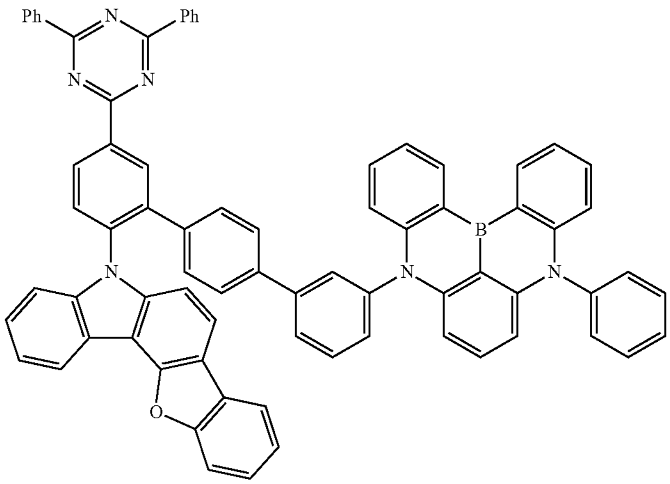
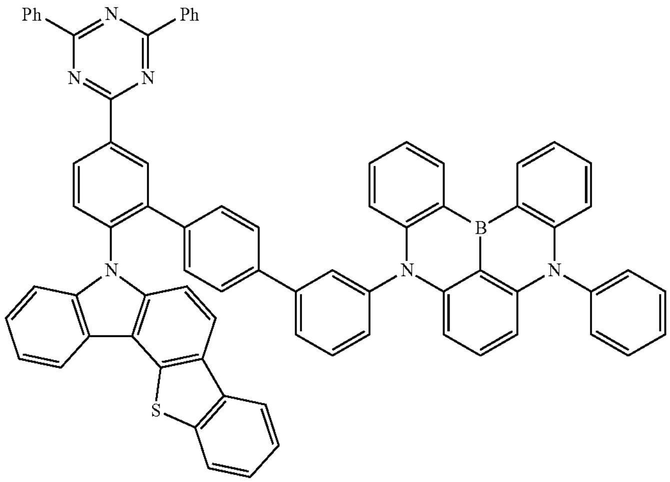
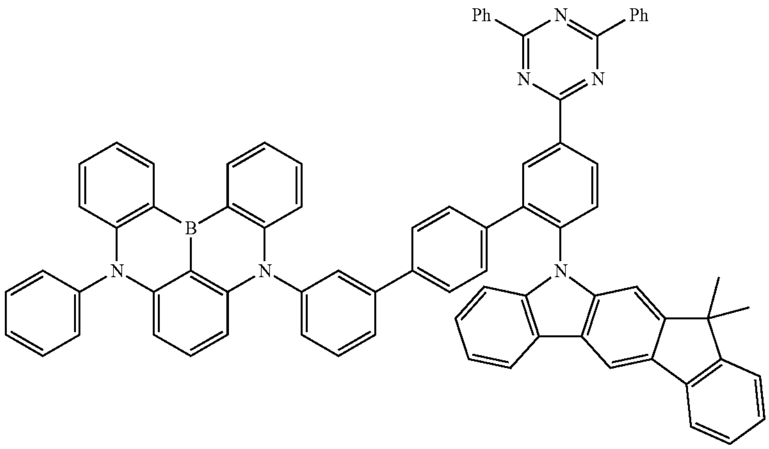

-continued
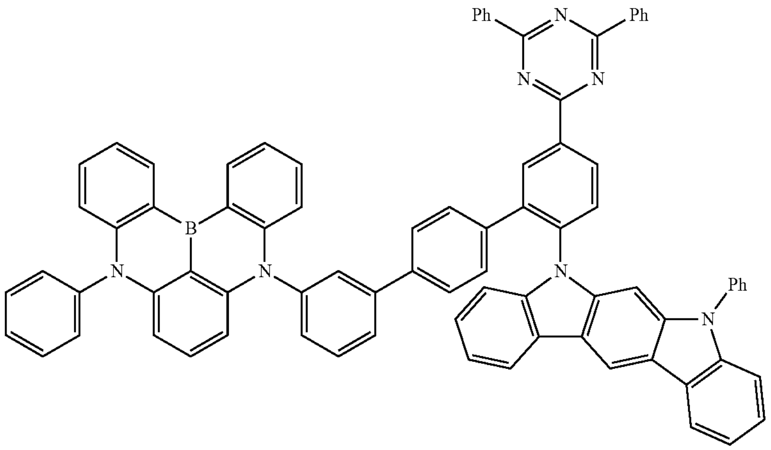
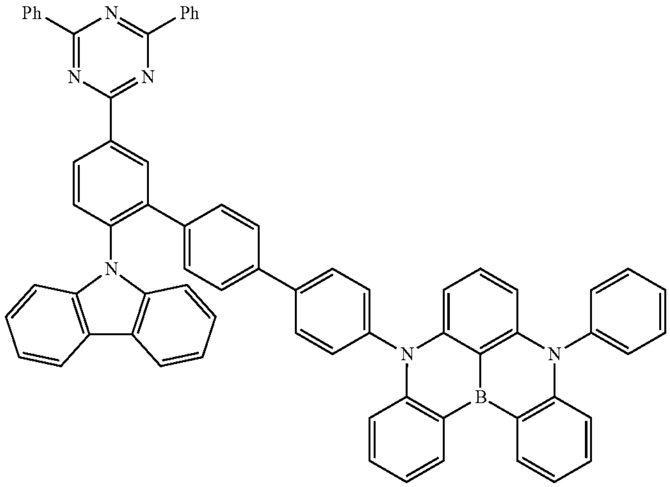
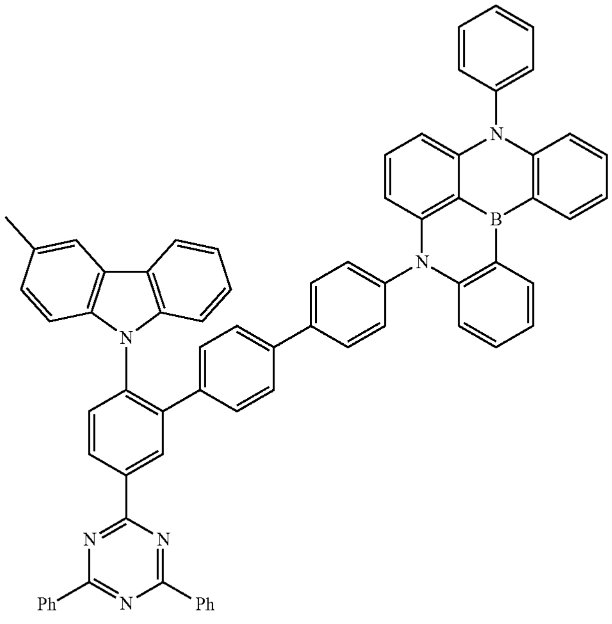

-continued
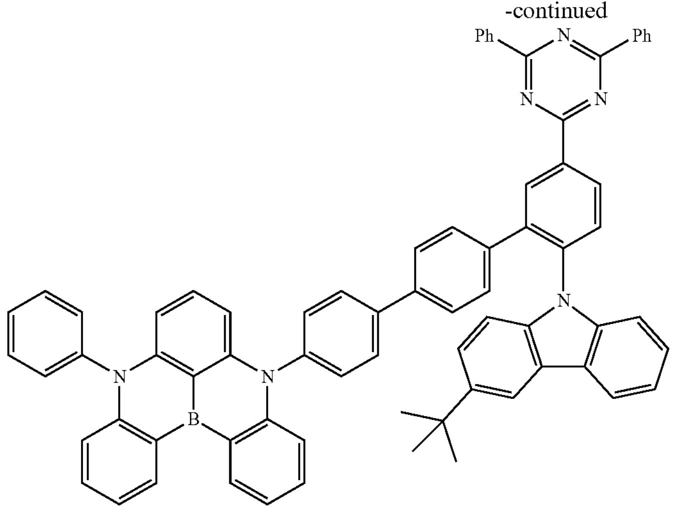
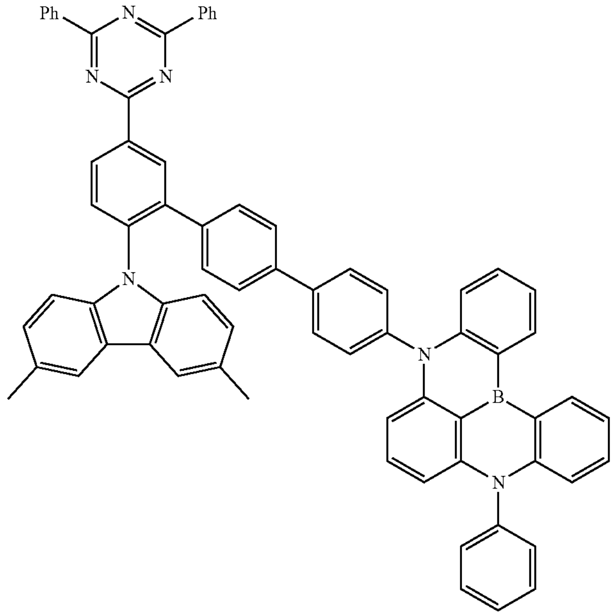
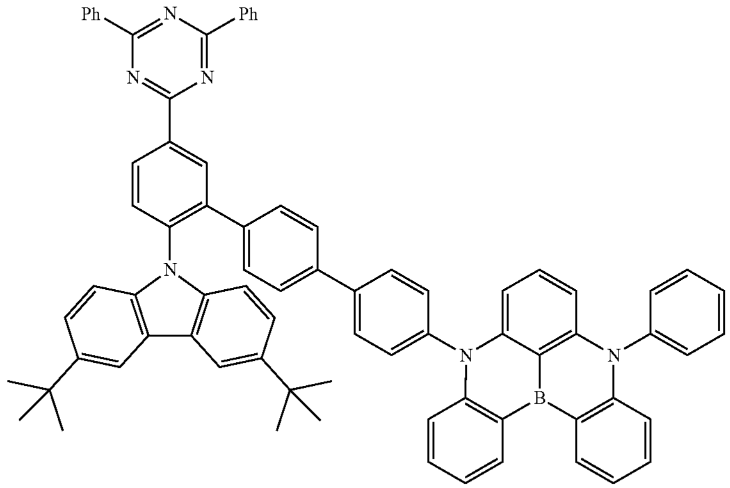

-continued
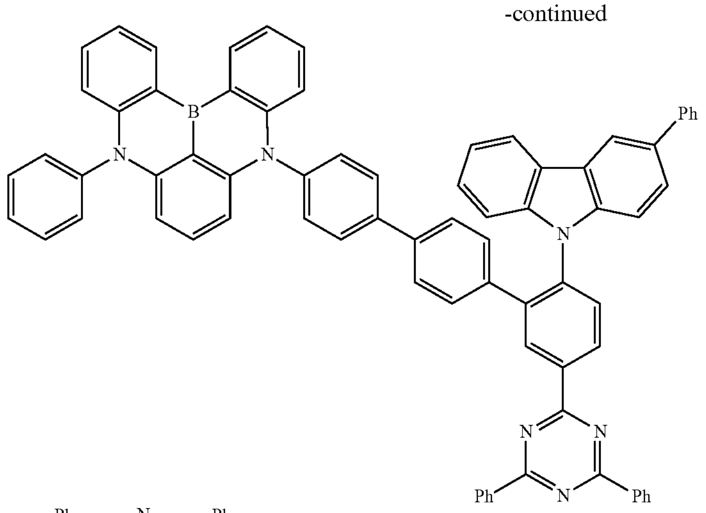
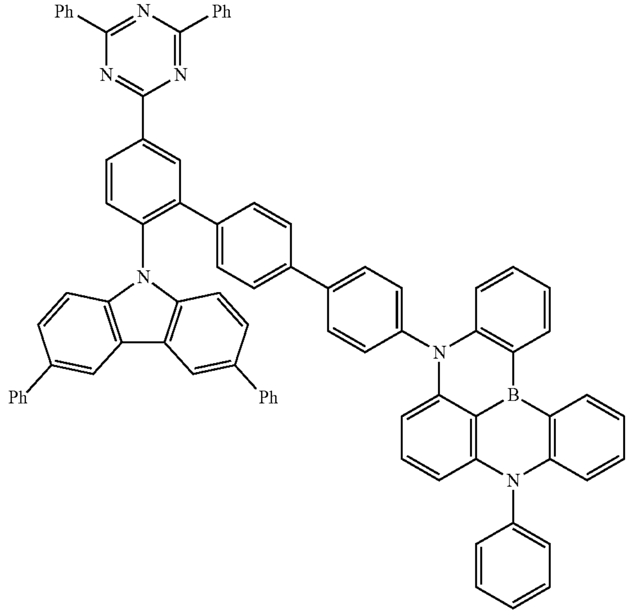
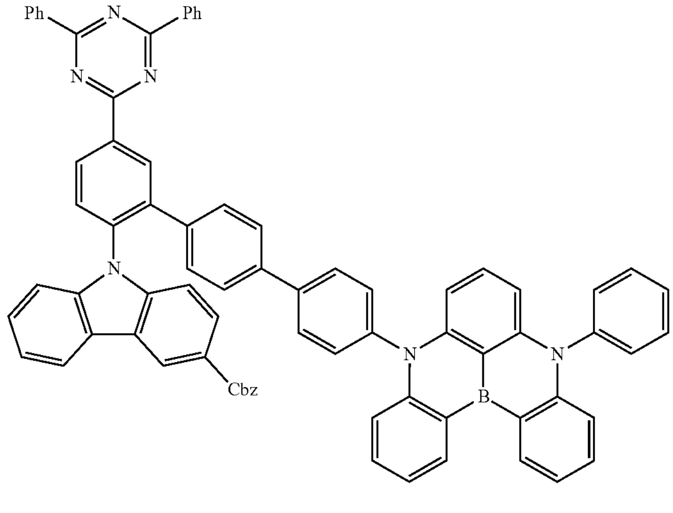

-continued
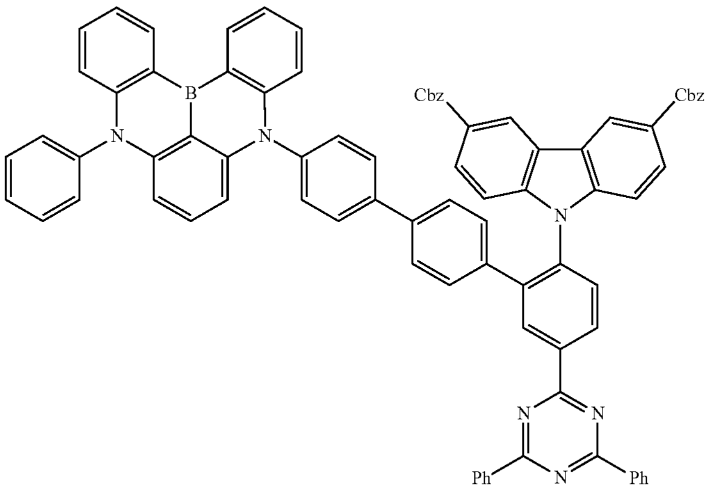
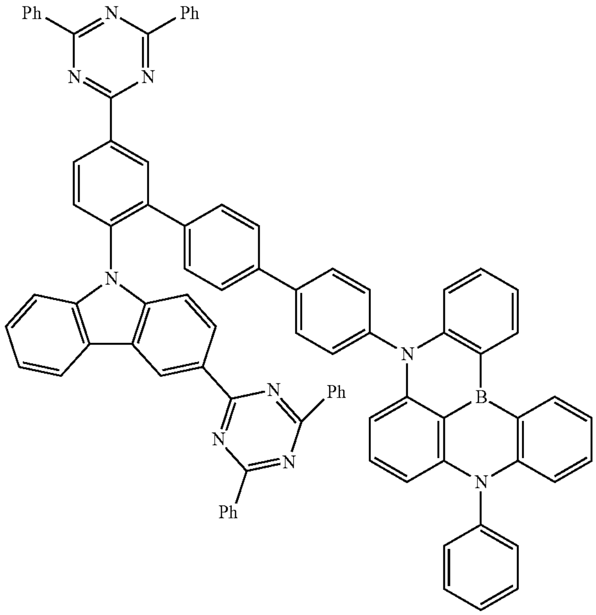
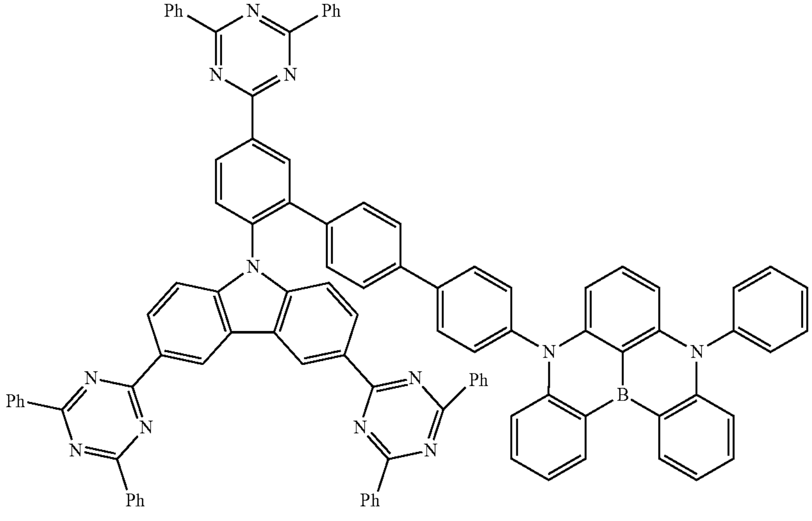

-continued
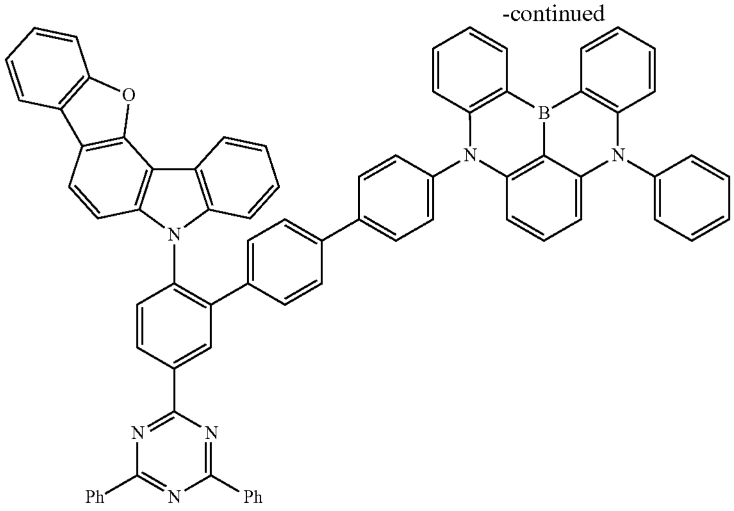
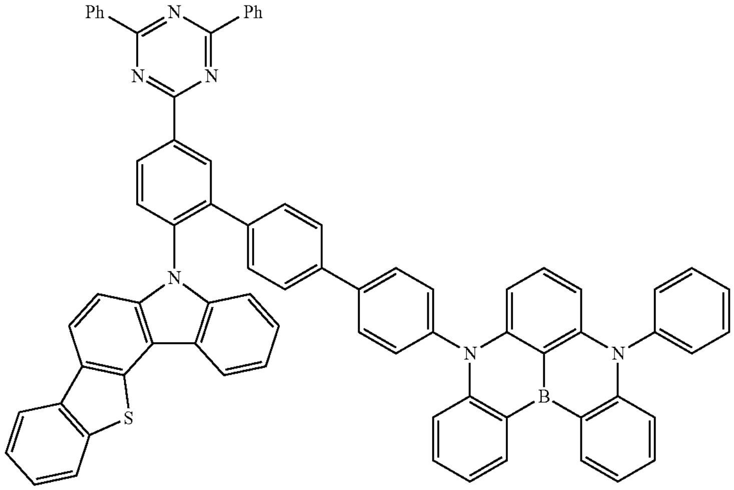
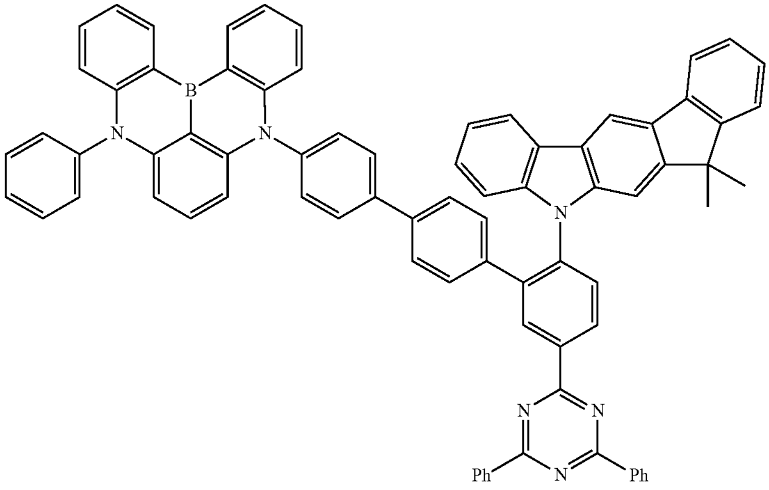

-continued
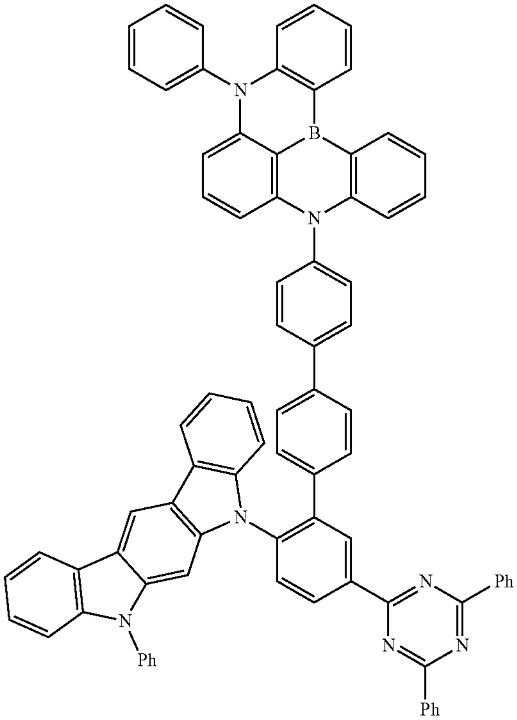
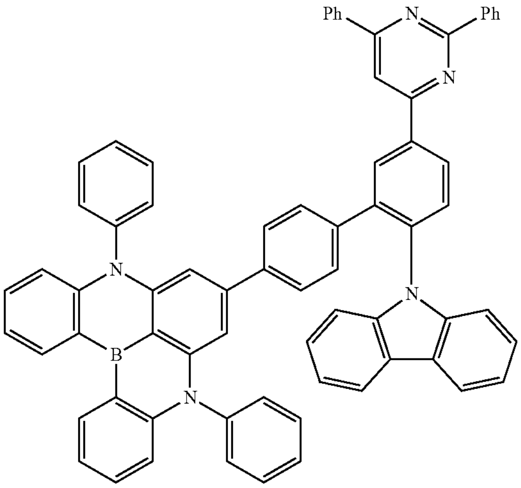
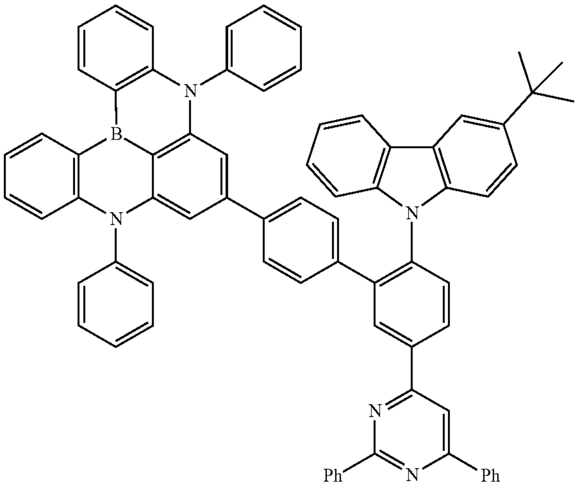
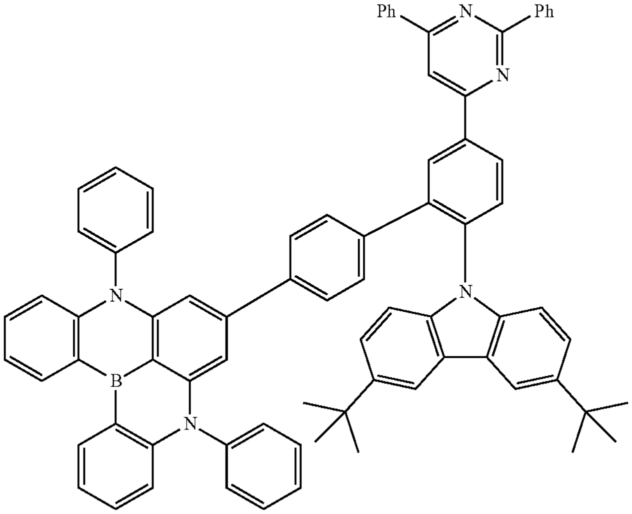

-continued
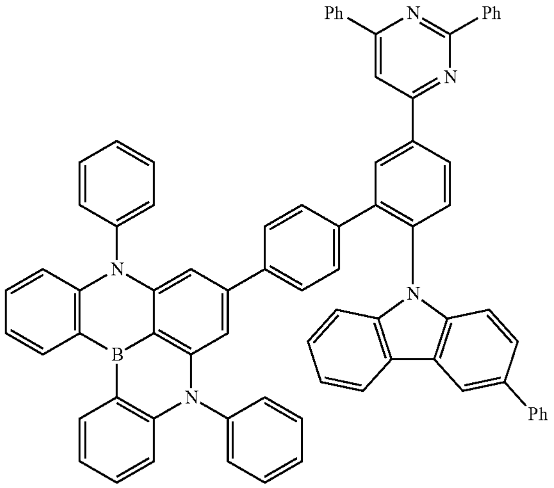
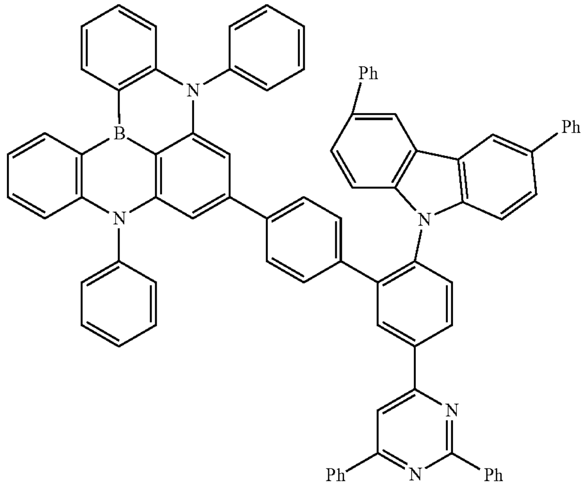
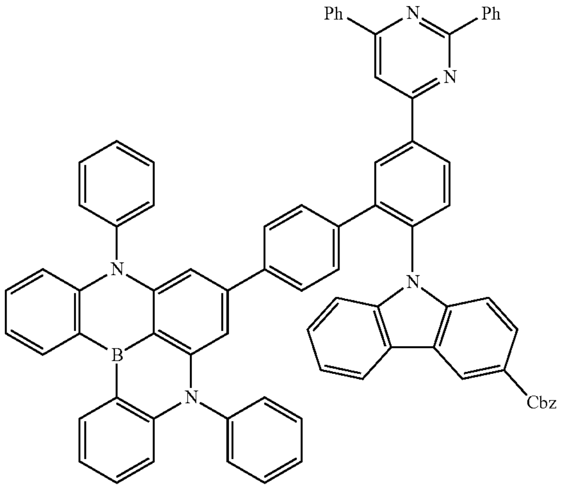
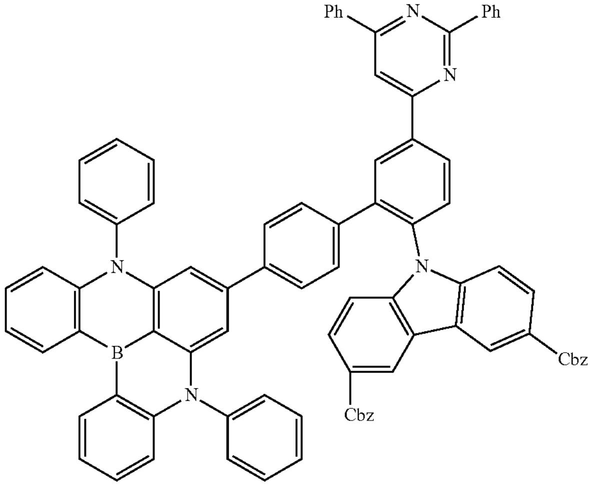

-continued
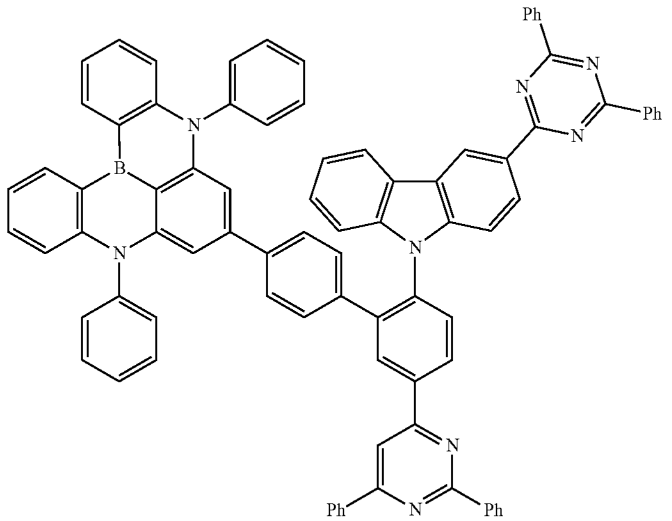
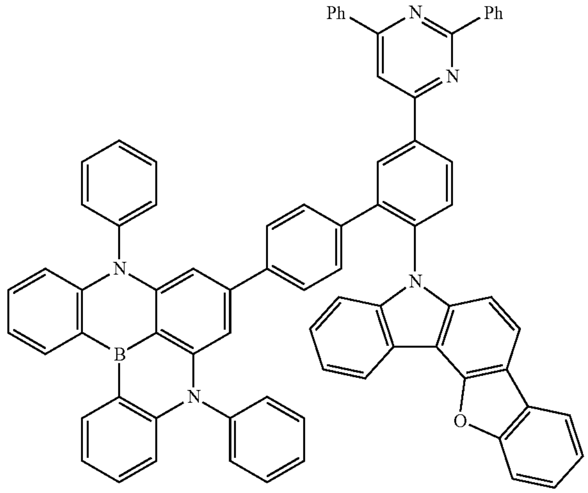
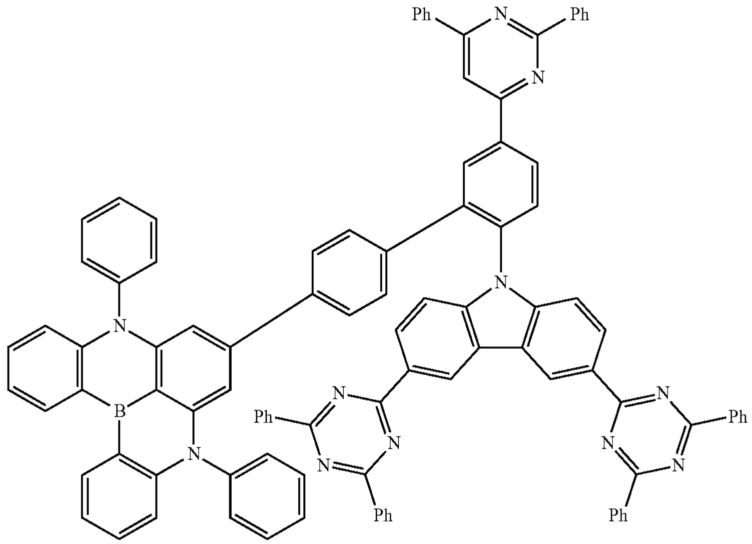

-continued
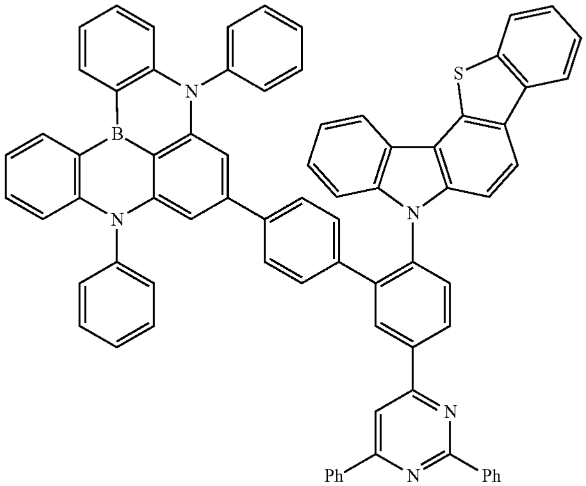
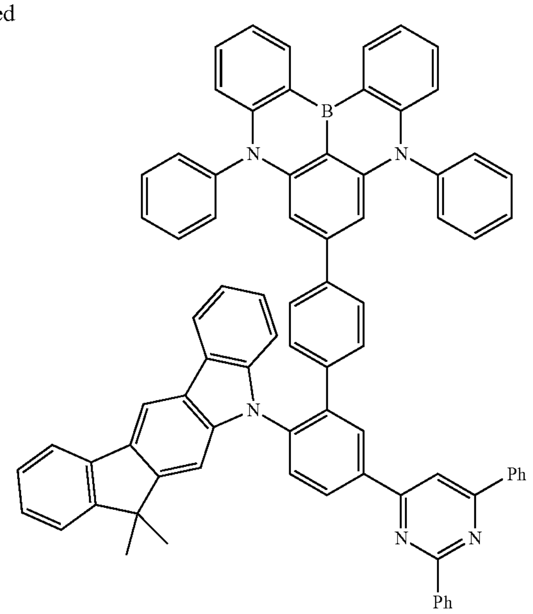
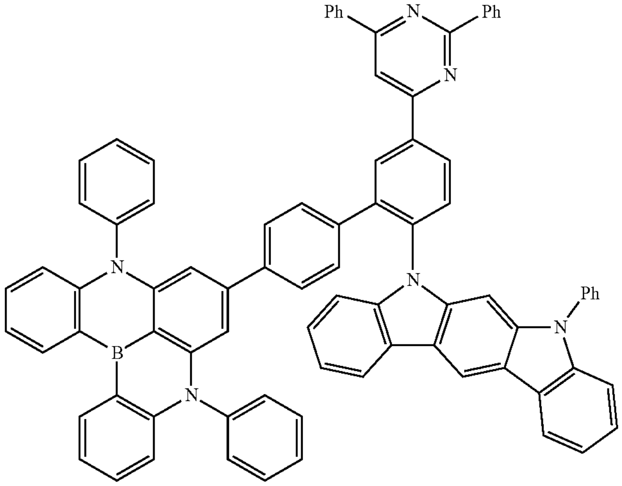
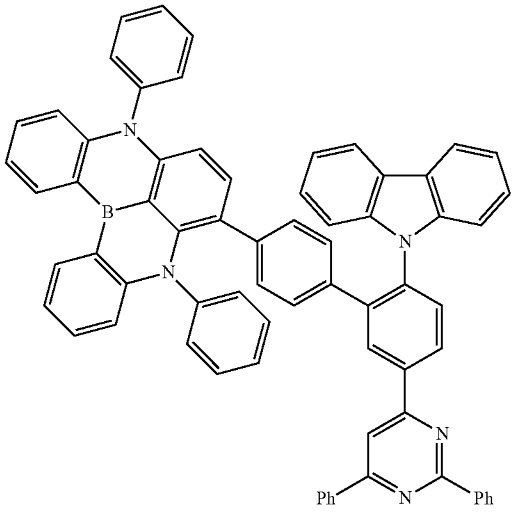
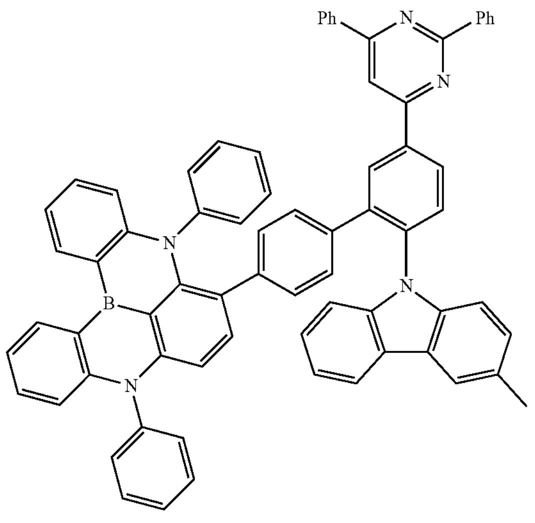

-continued
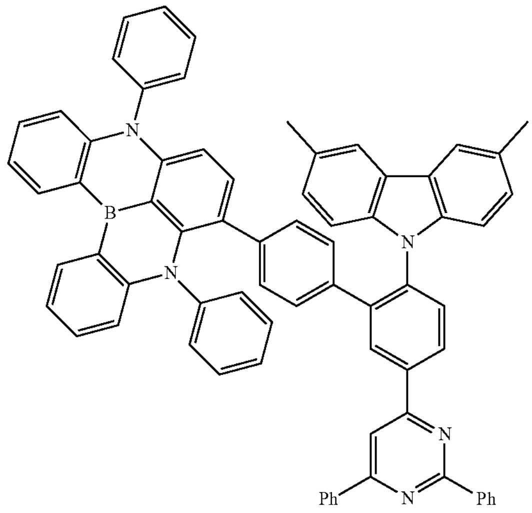
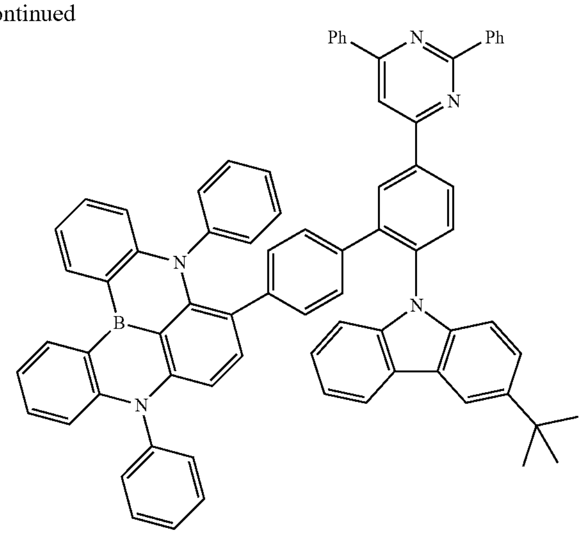
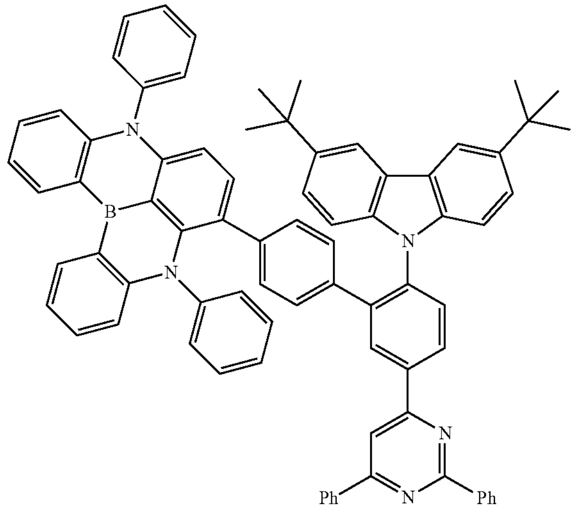
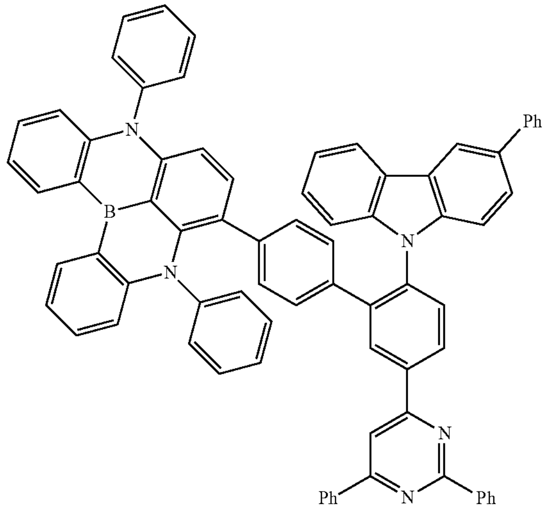
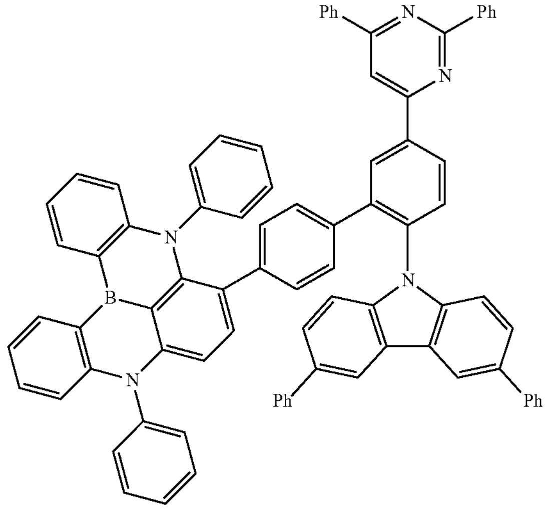
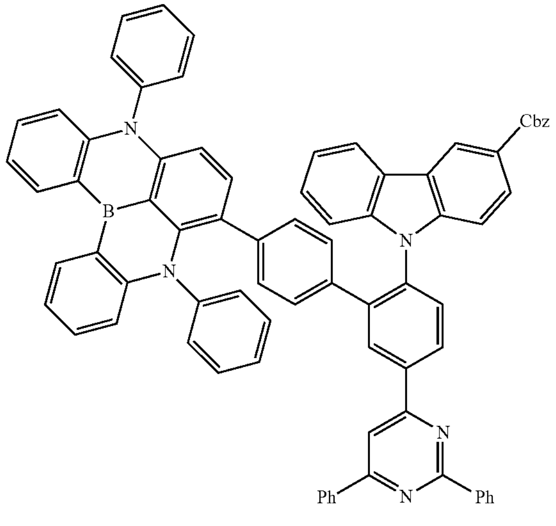

-continued
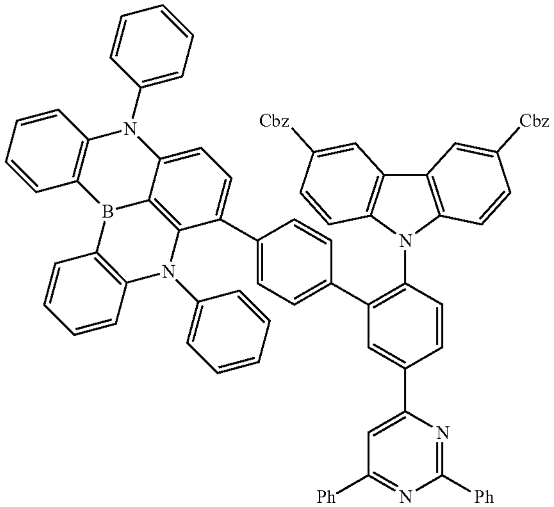
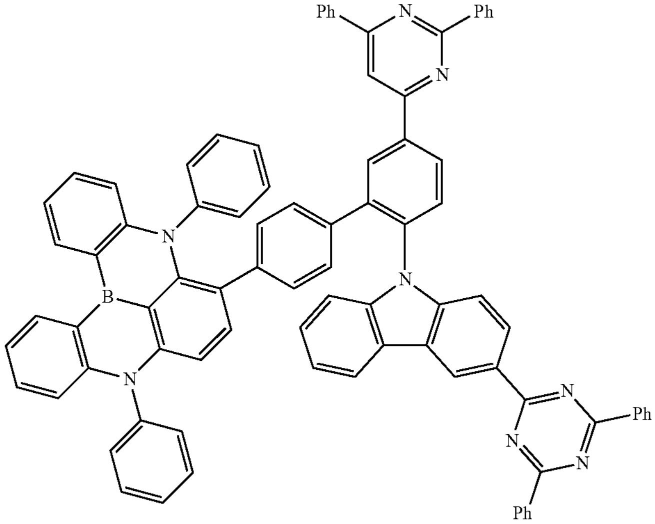
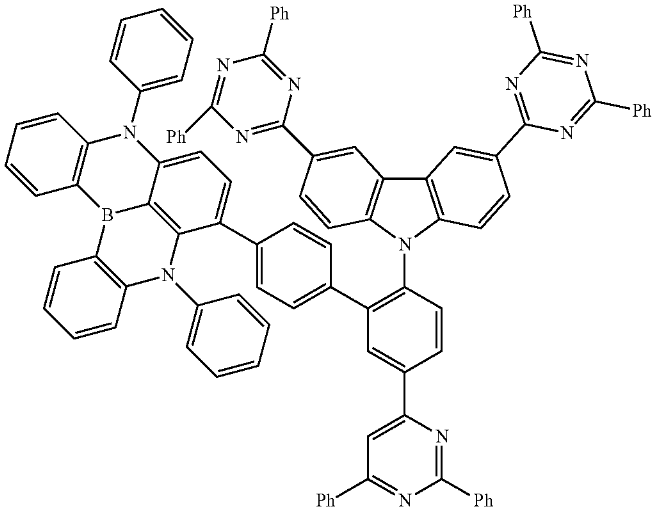

-continued
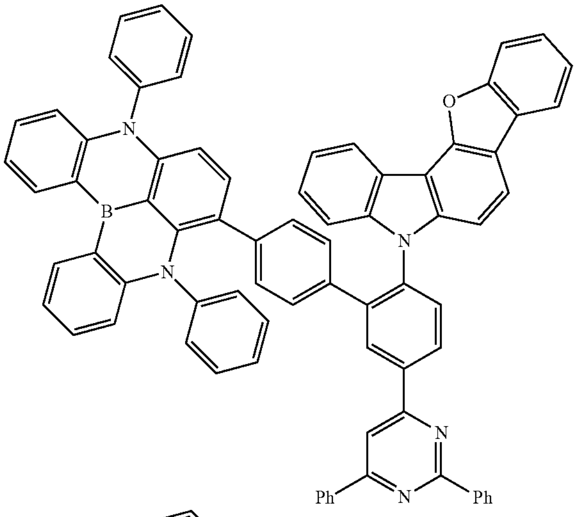
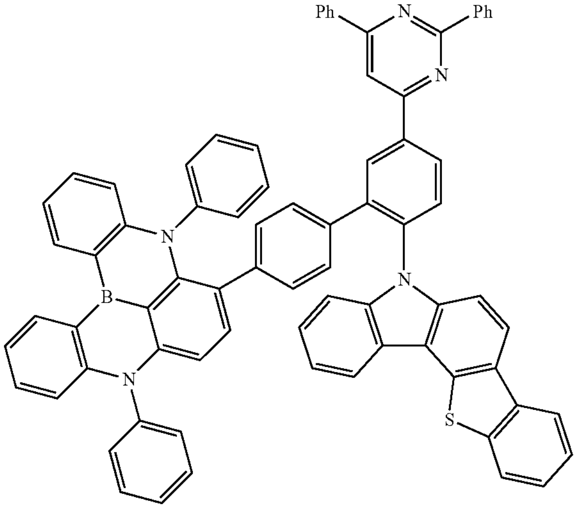
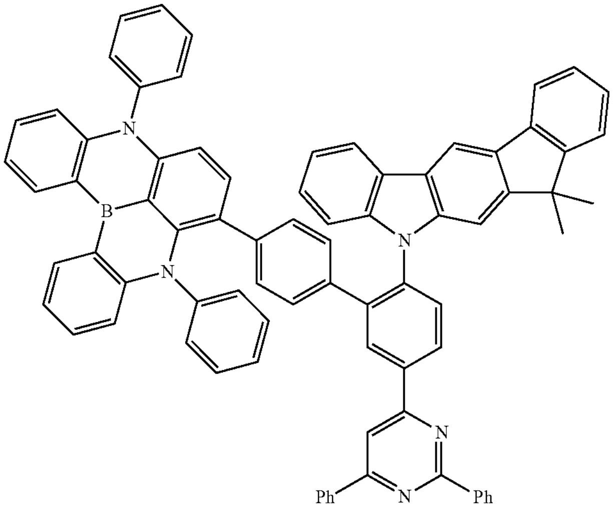
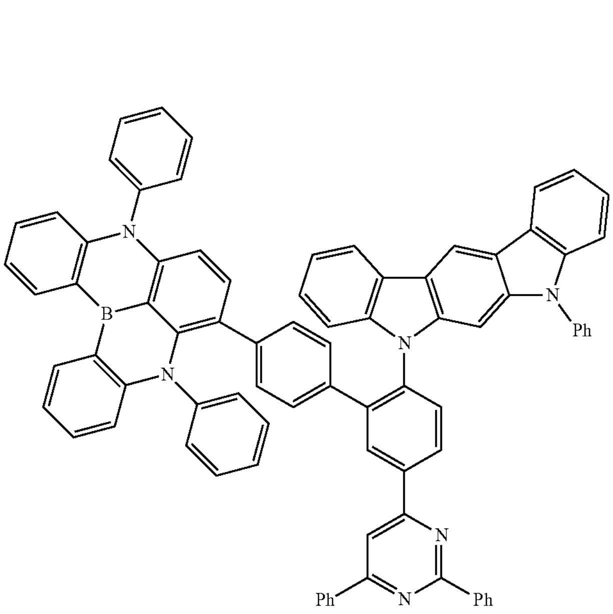
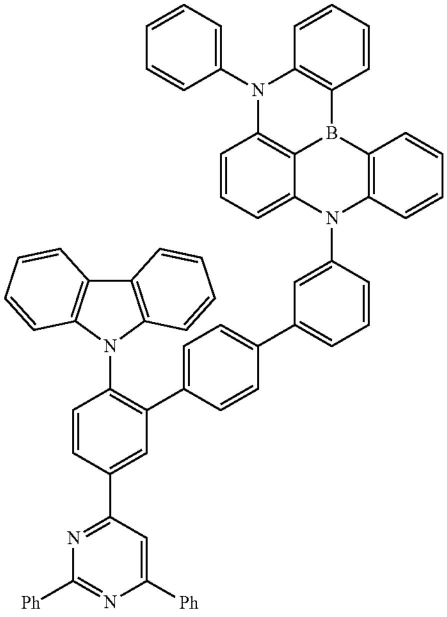

-continued
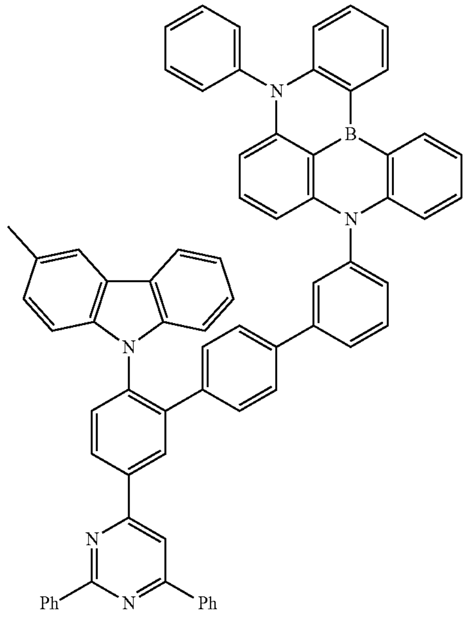
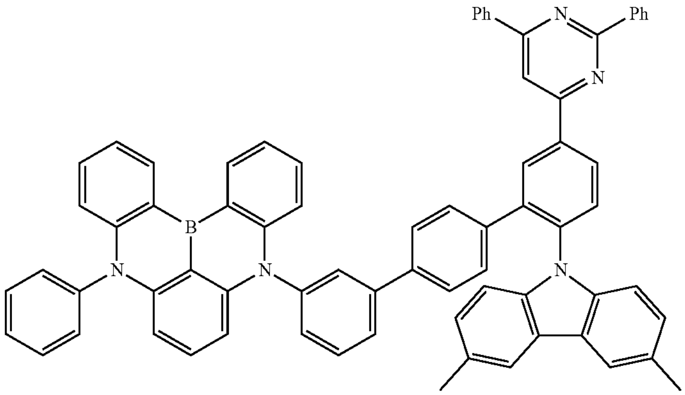
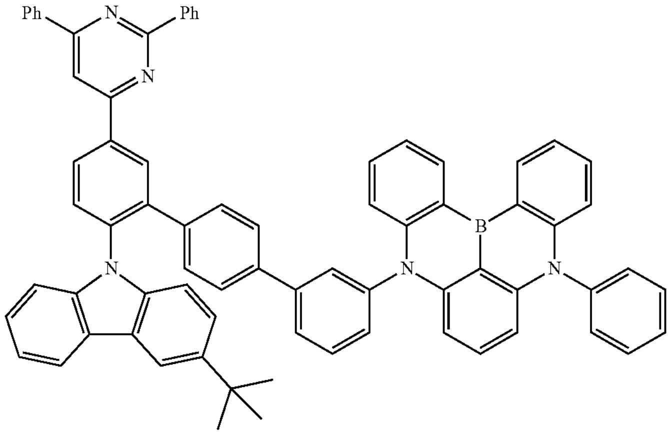

-continued
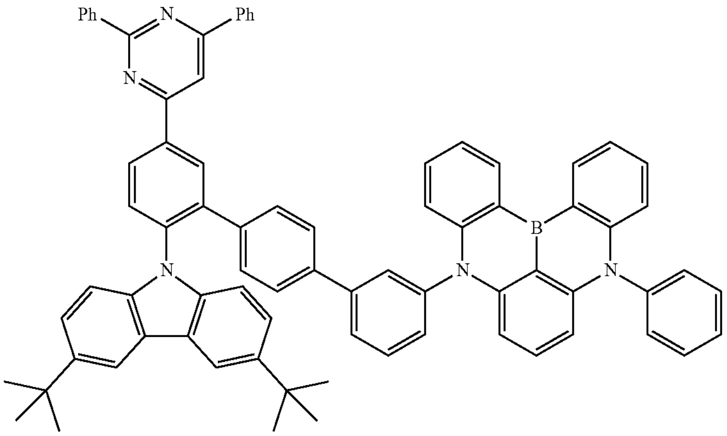
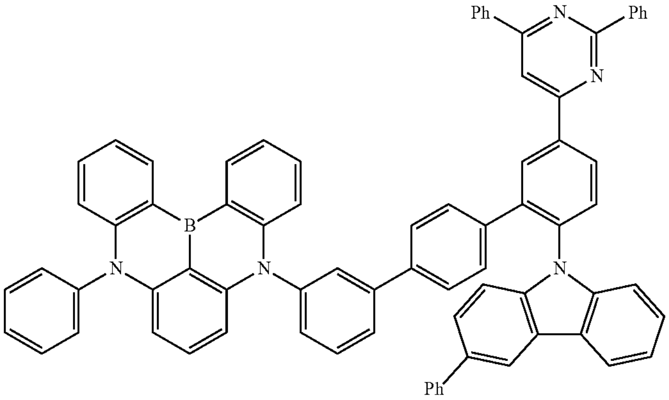
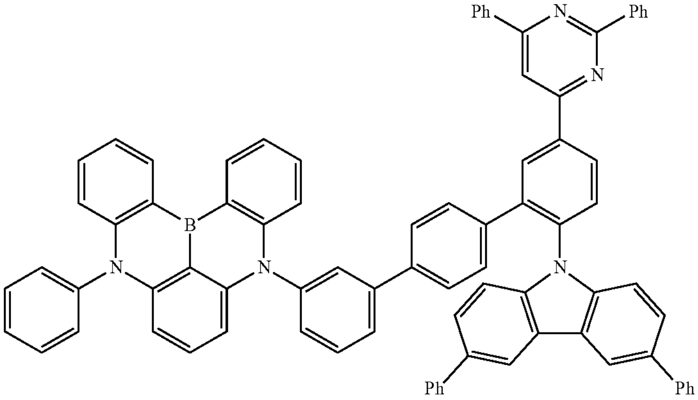
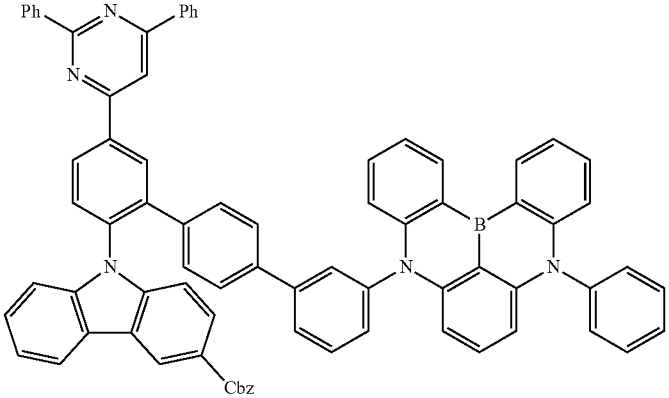

-continued
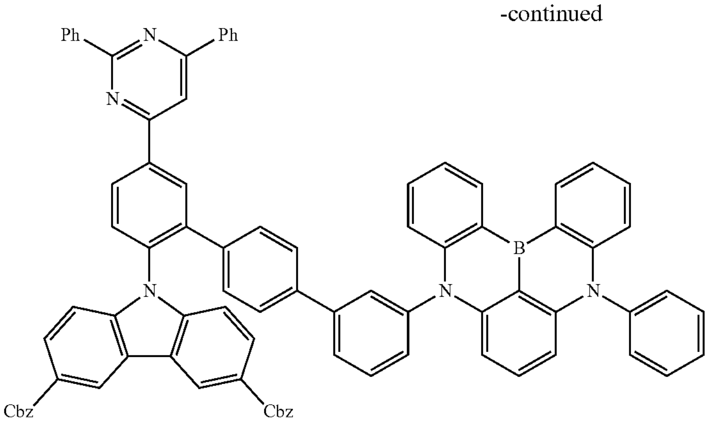
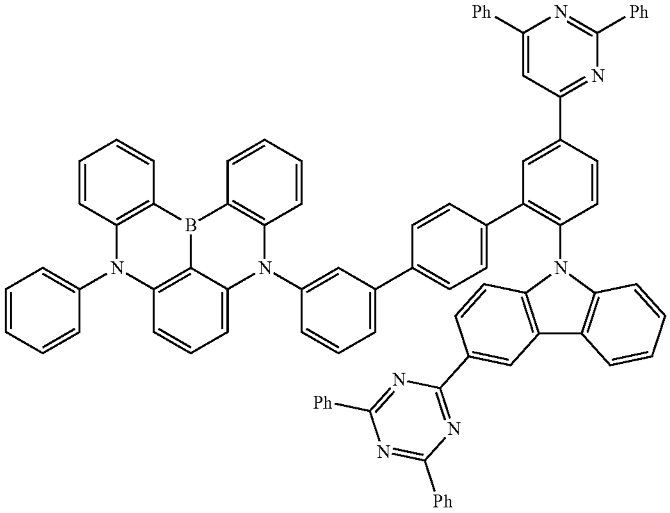
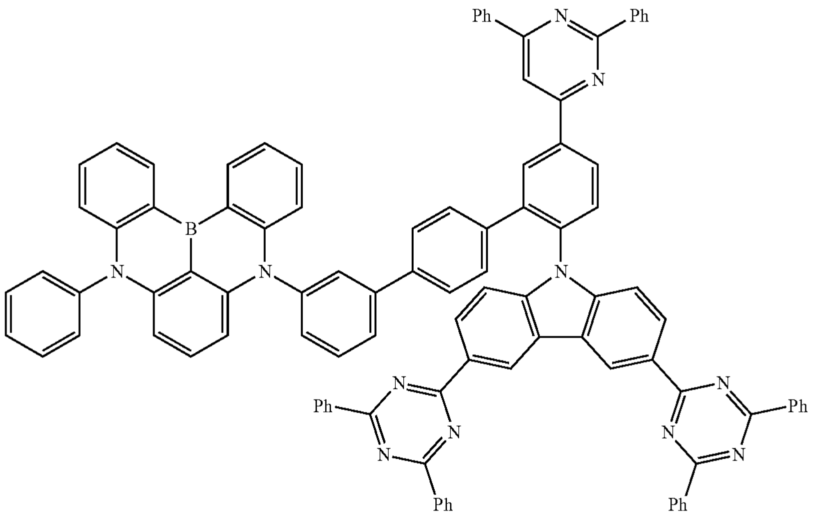

-continued
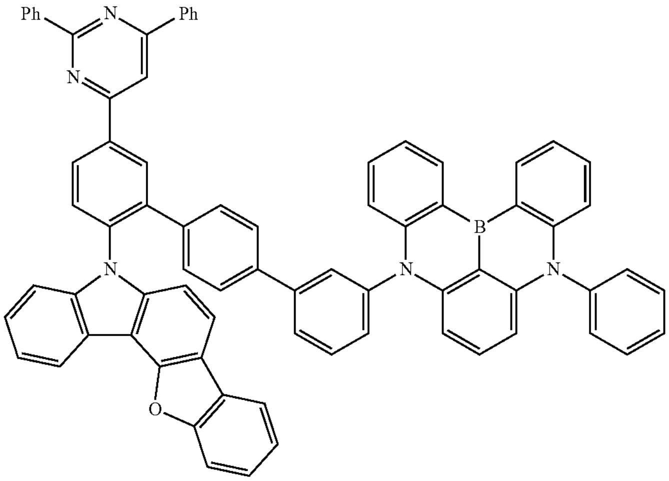
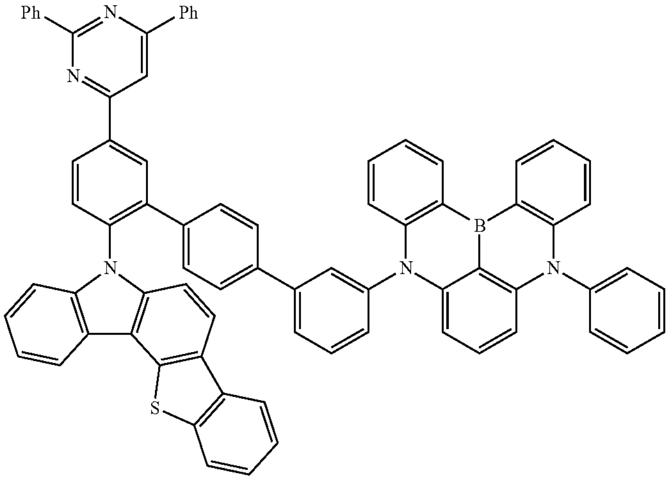
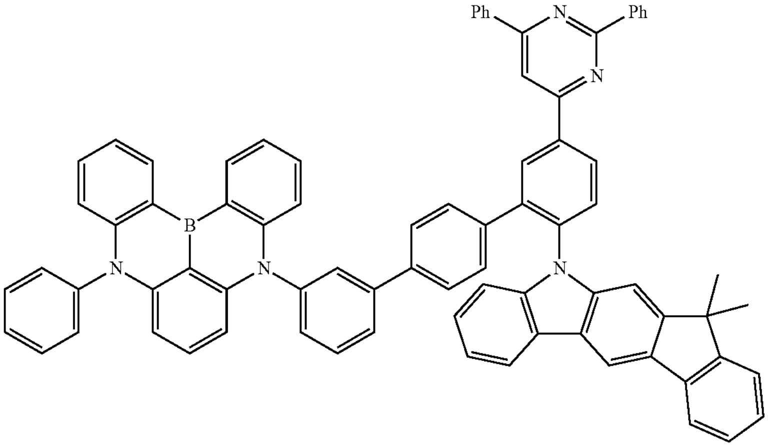

-continued
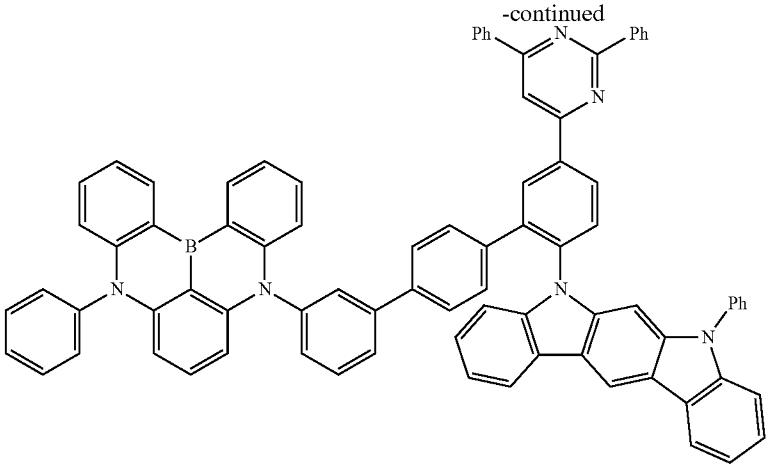
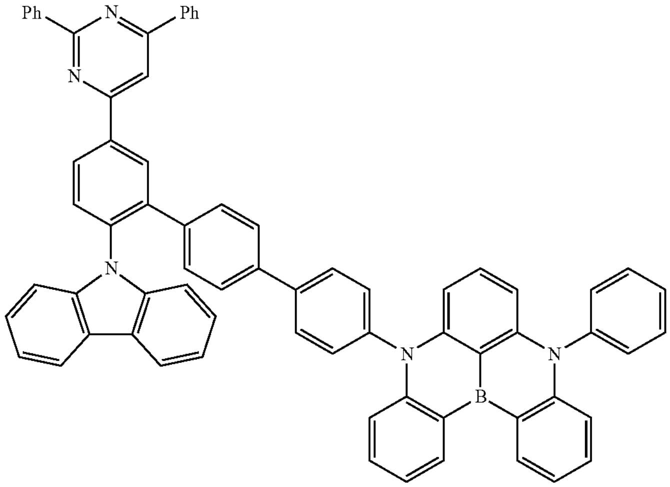
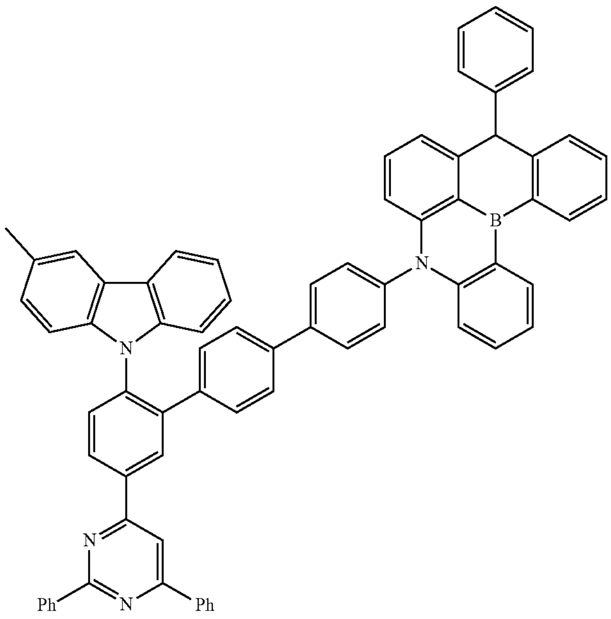

-continued
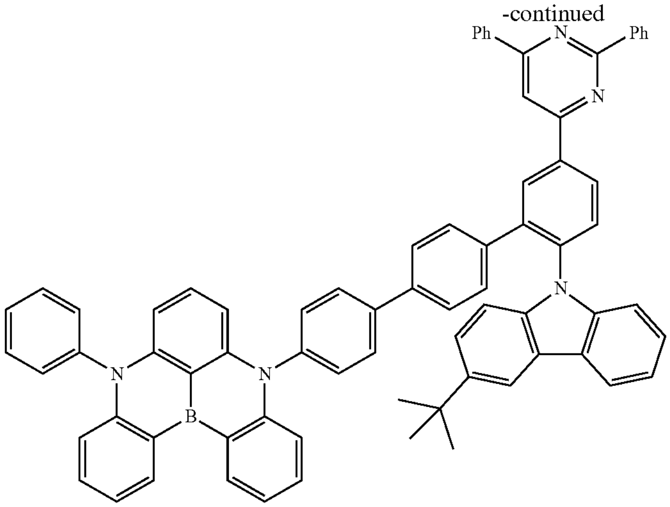
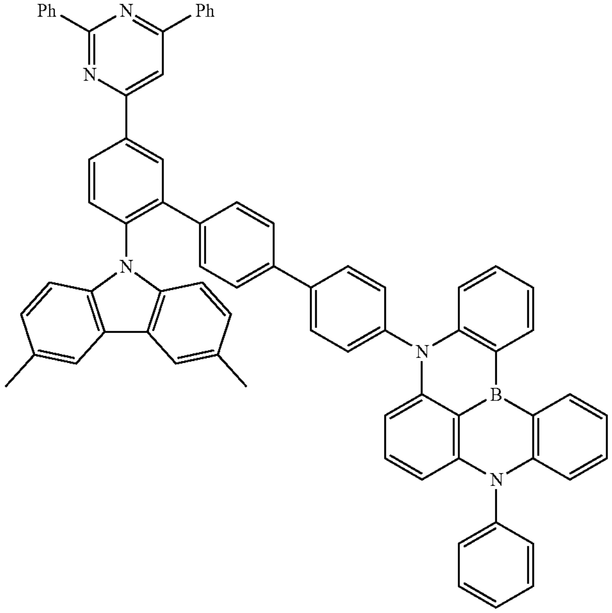
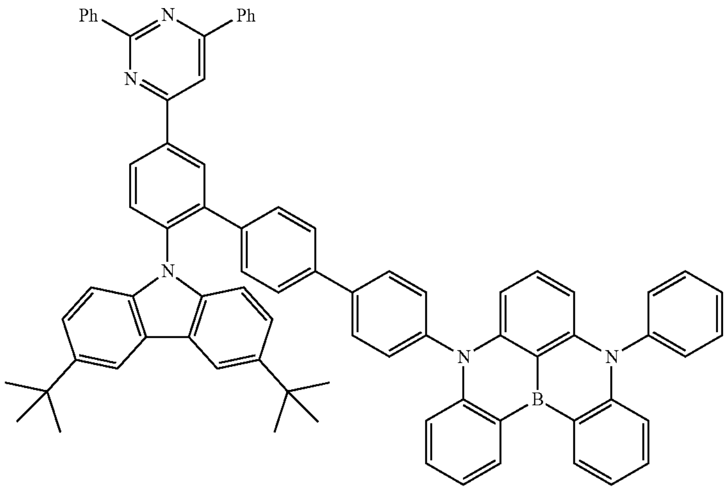

-continued
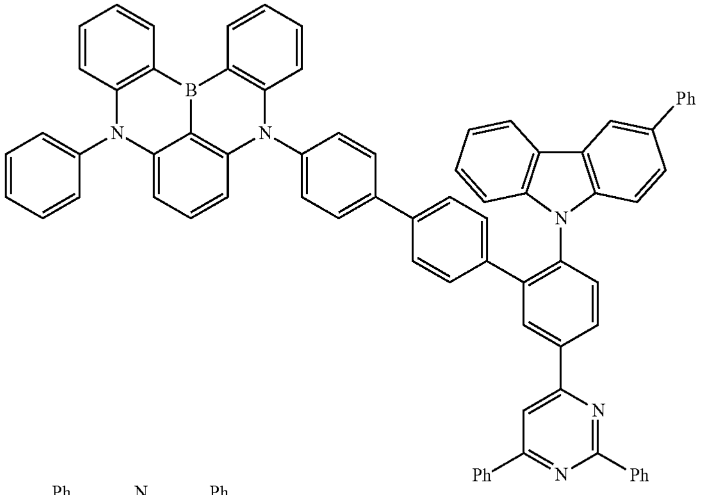
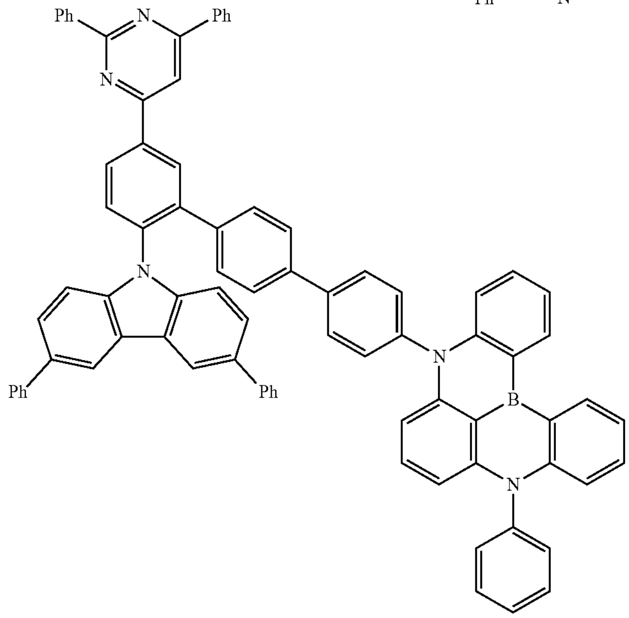
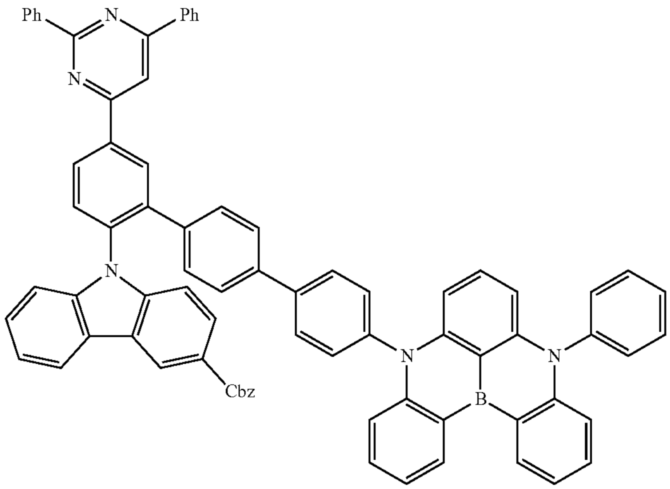

-continued
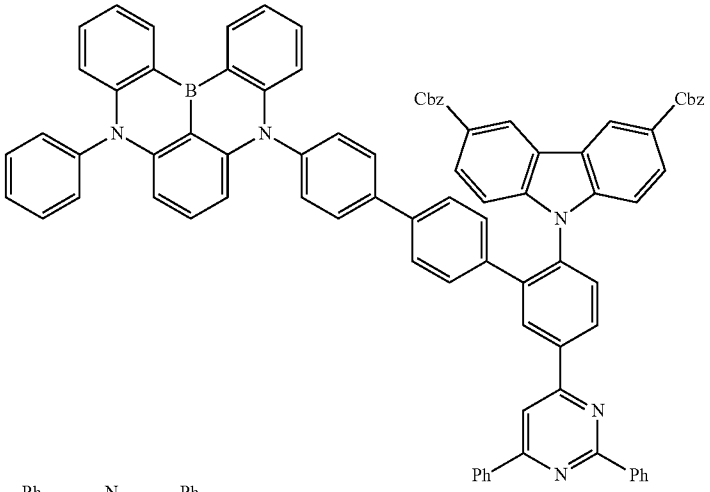
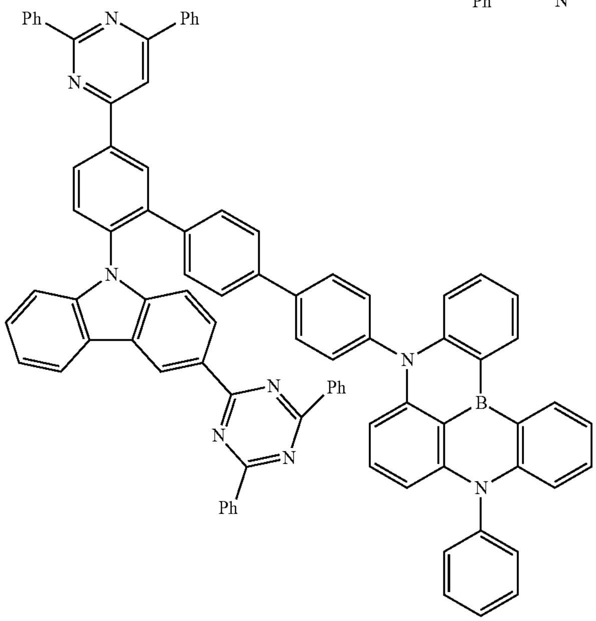
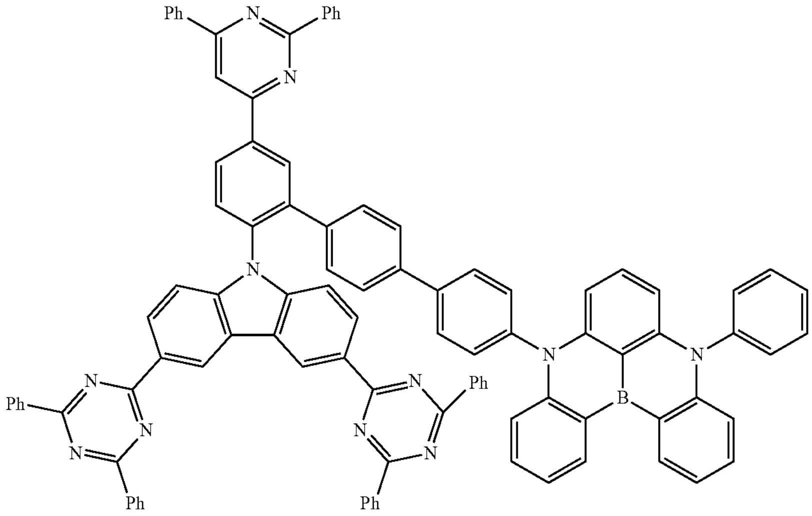

-continued
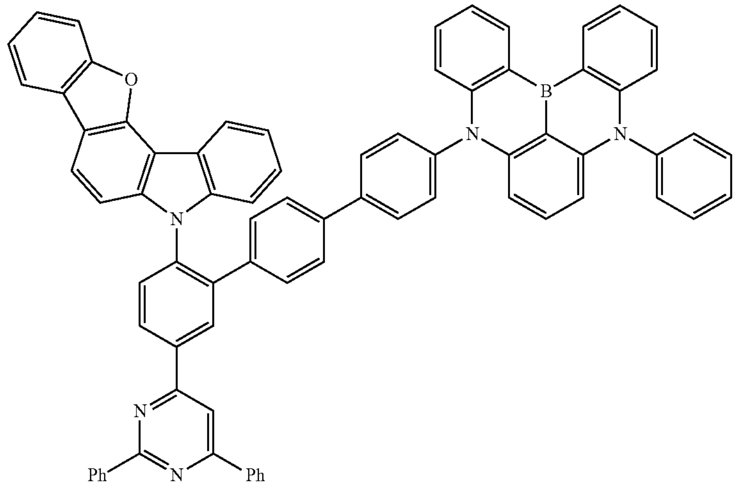
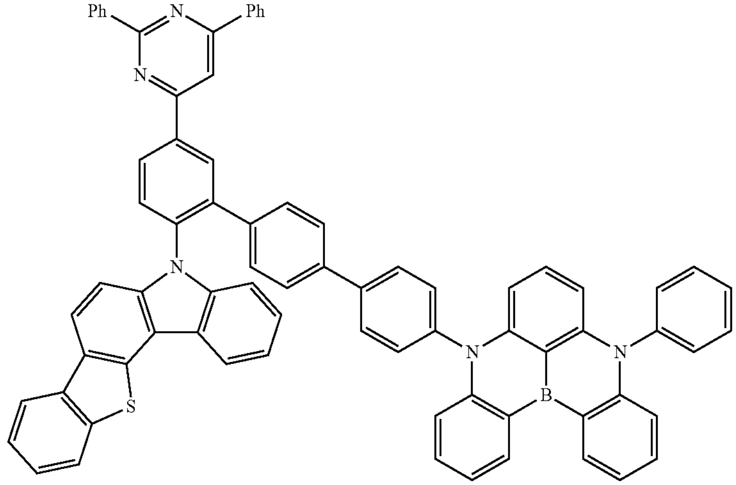
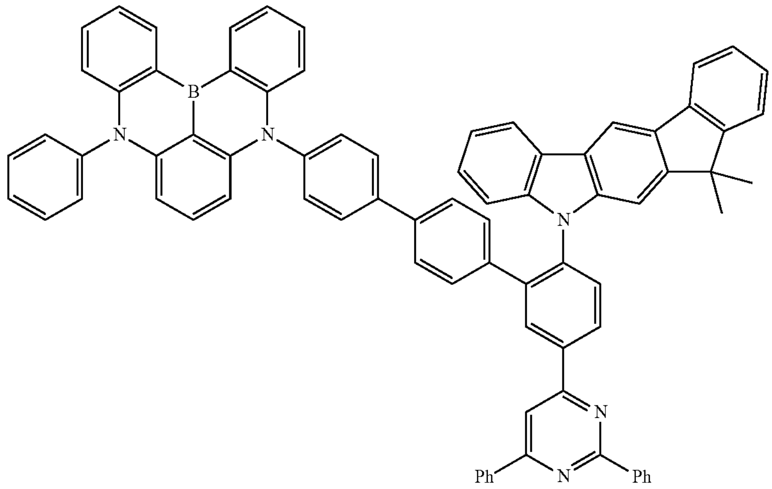

-continued
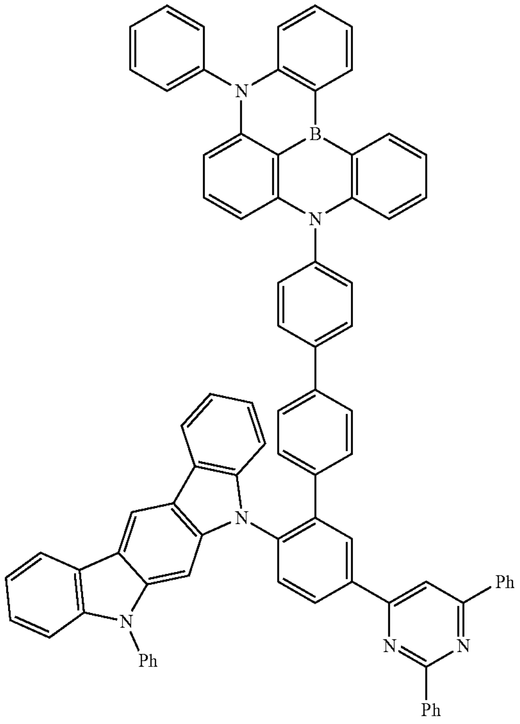
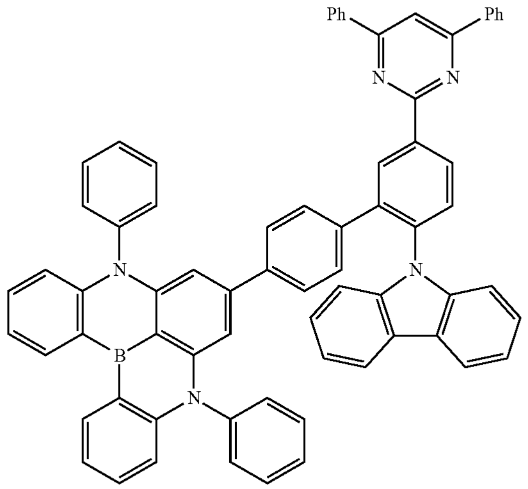
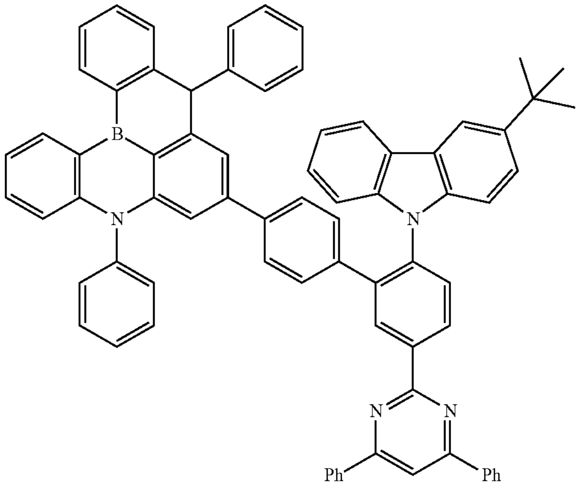
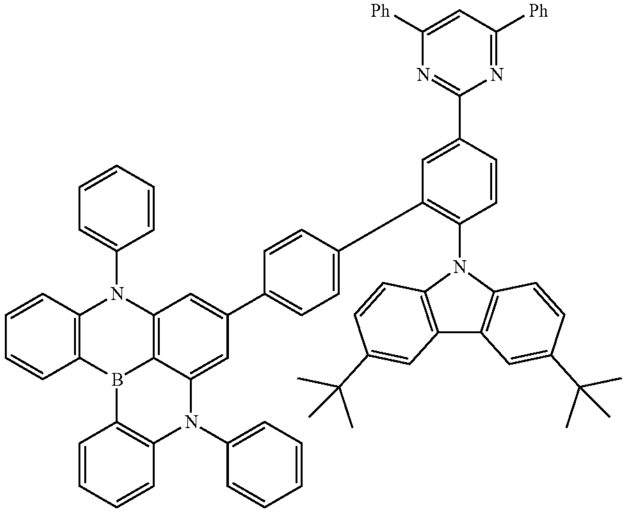

-continued
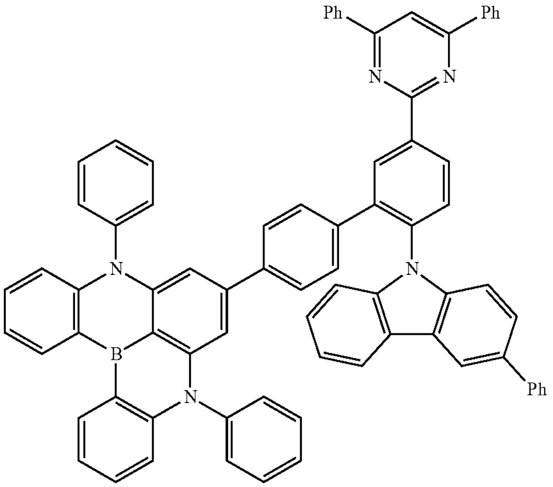
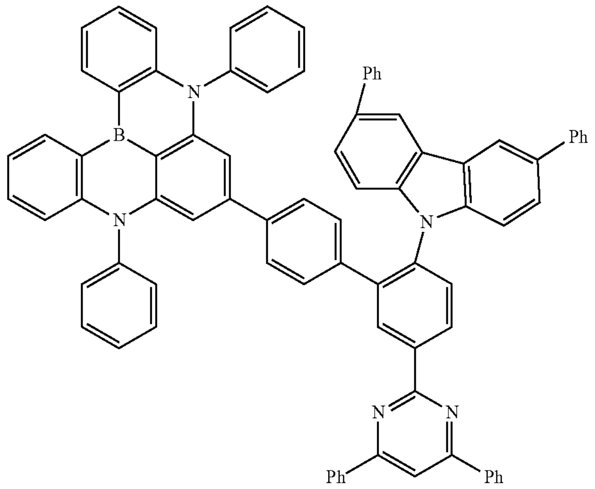
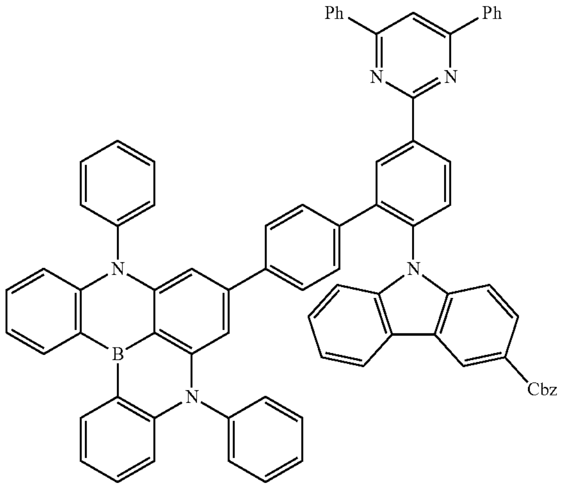
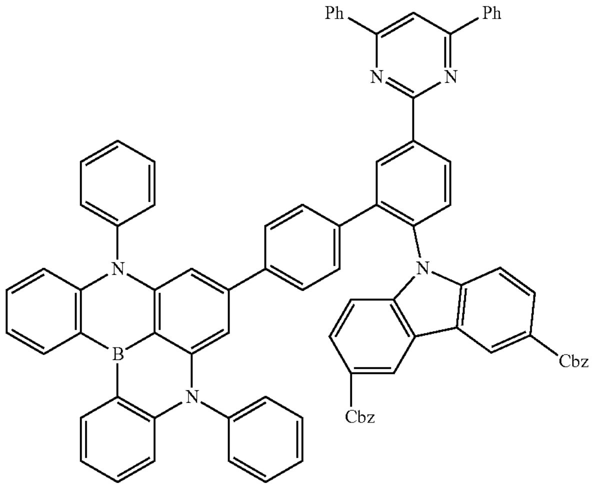
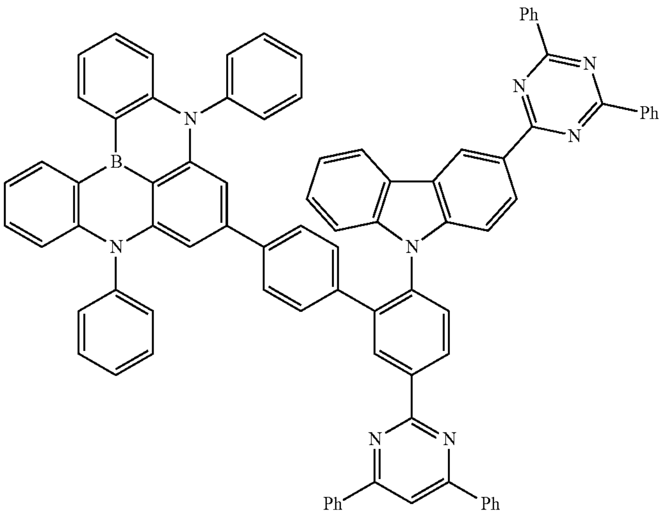

-continued
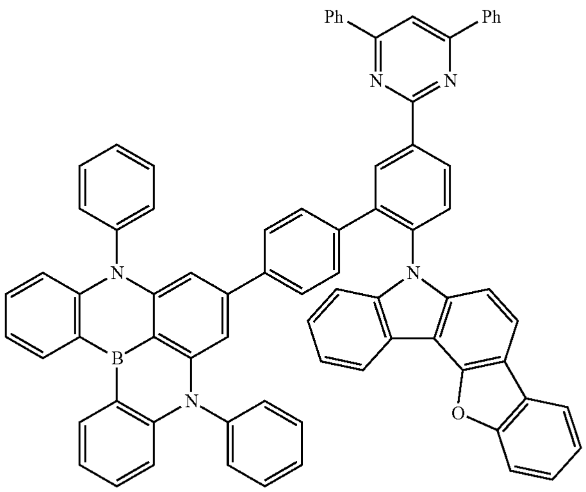
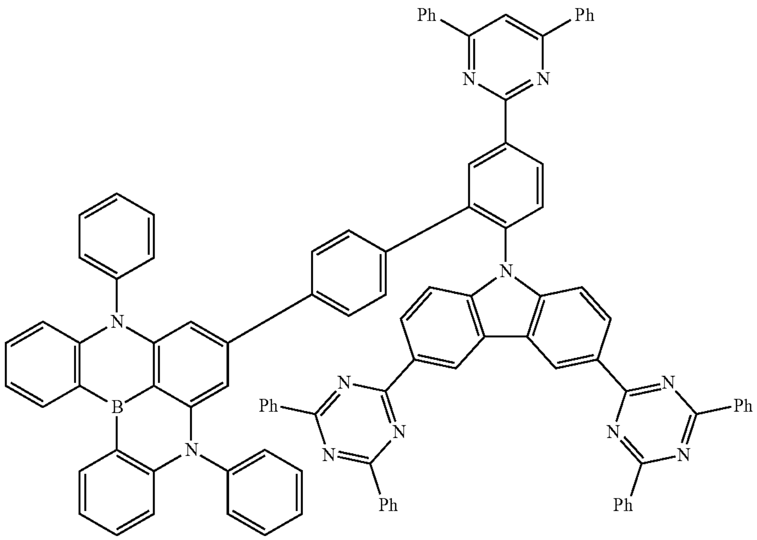
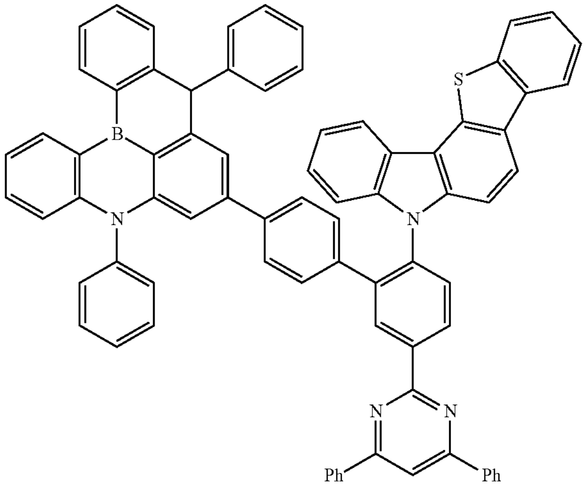
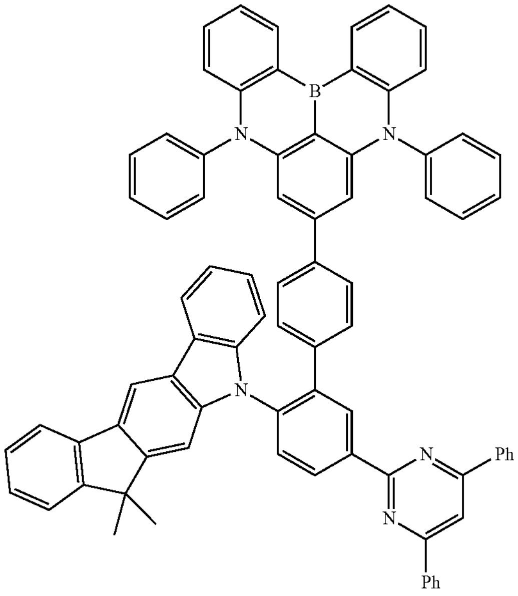

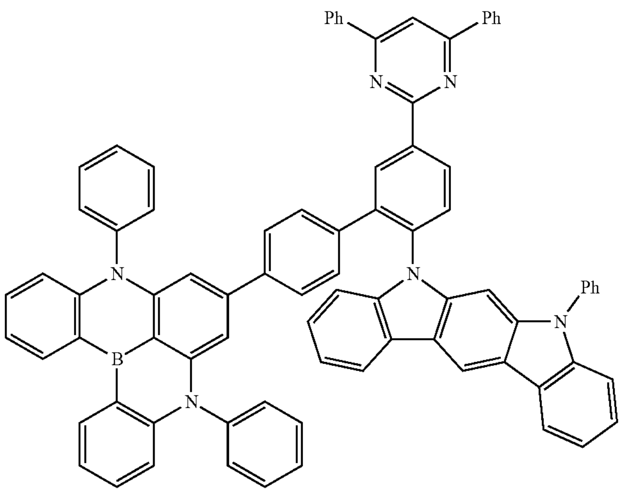
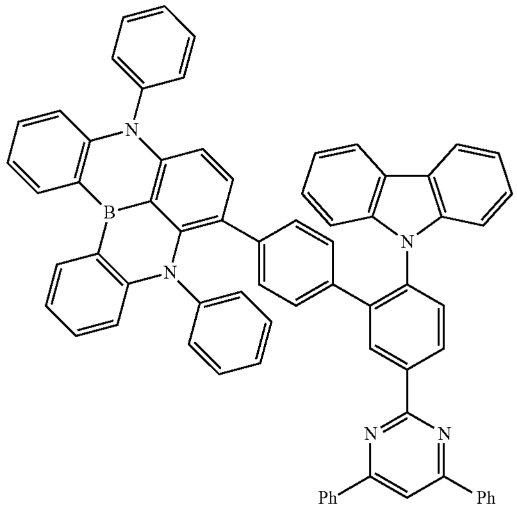
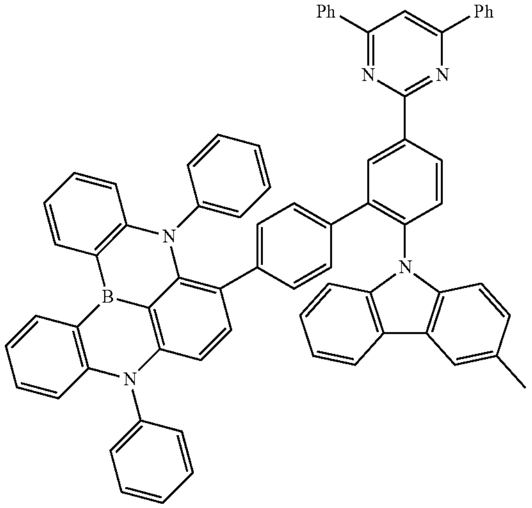
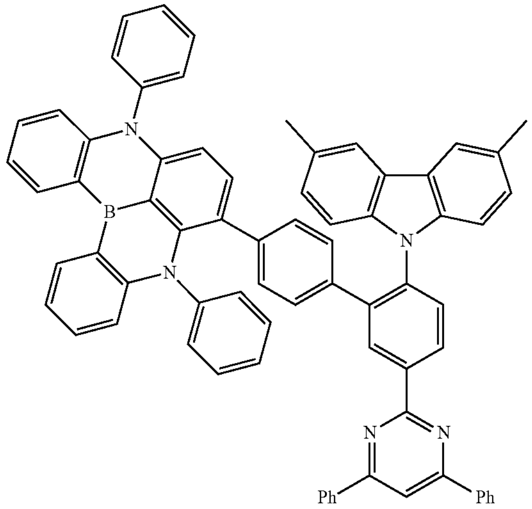
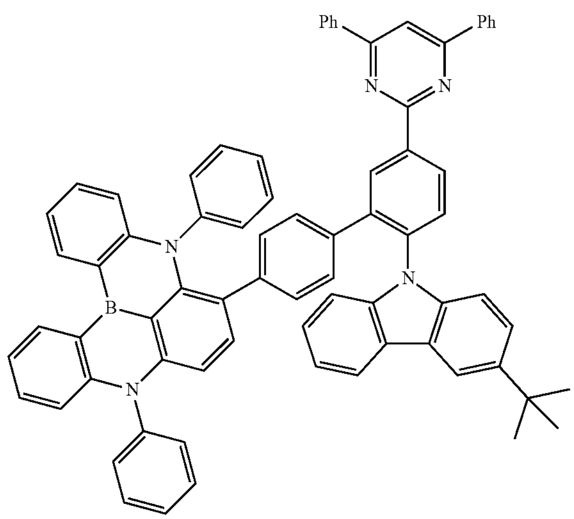
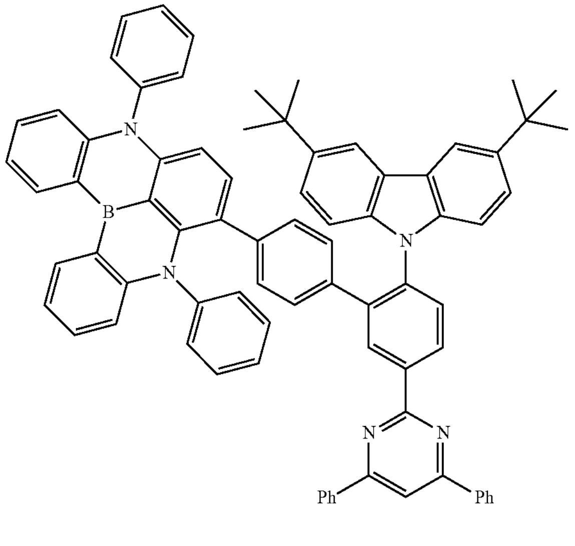

-continued
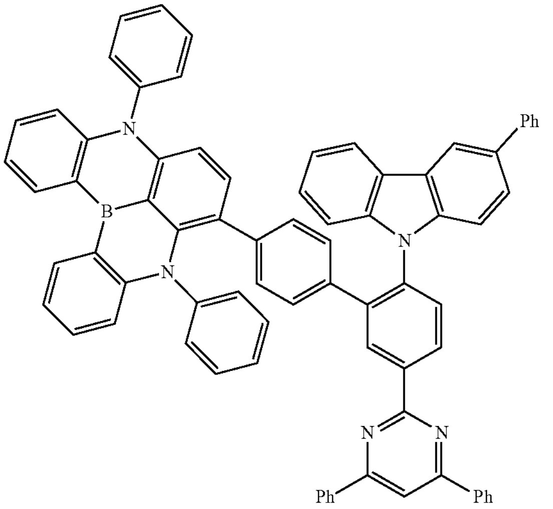
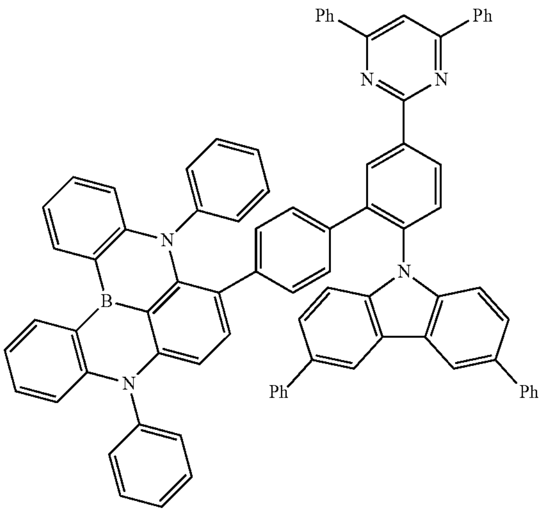
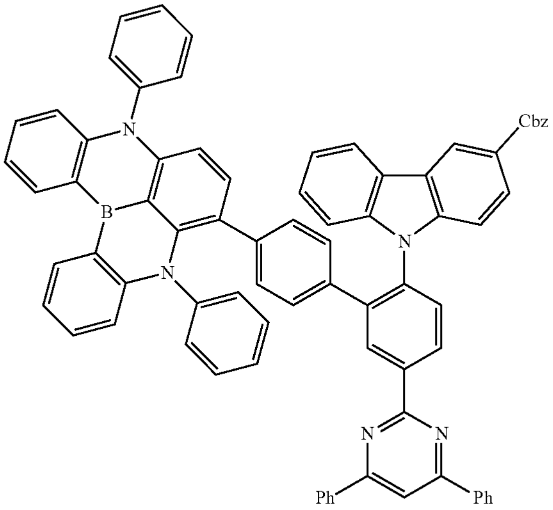
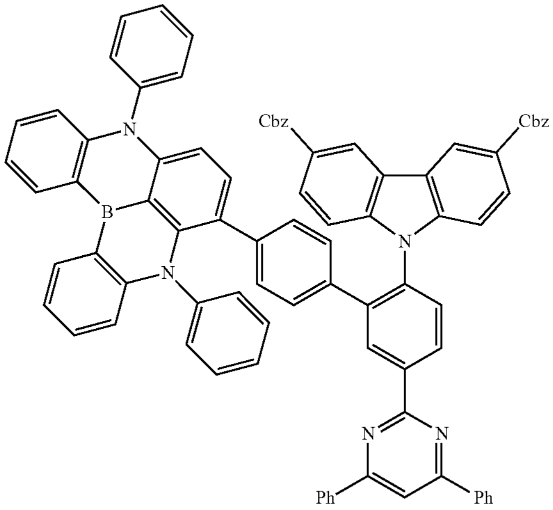
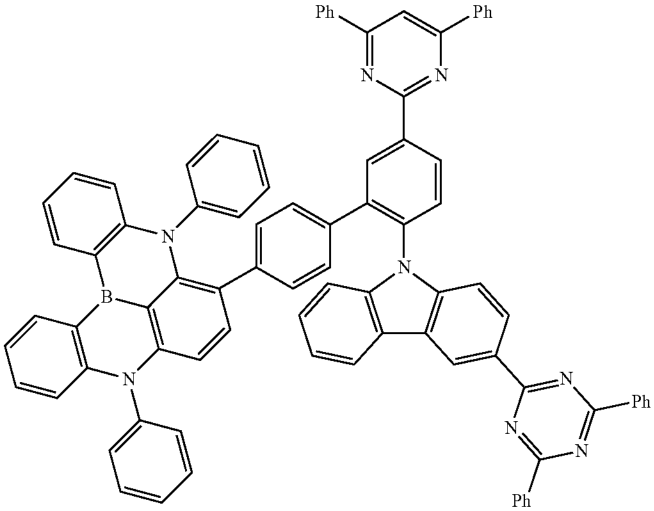

-continued
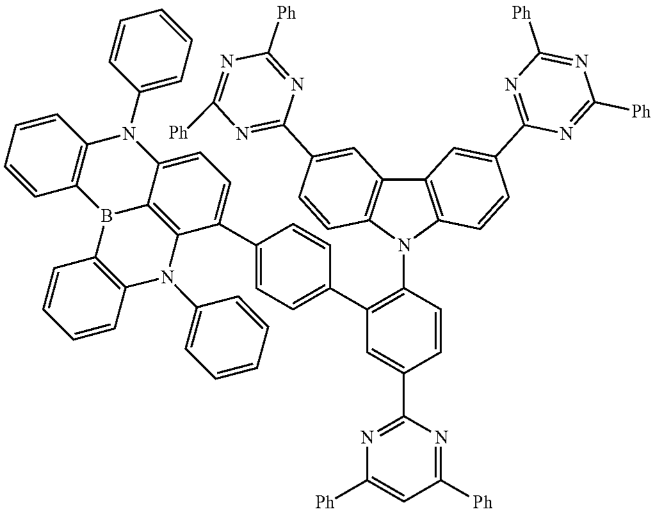
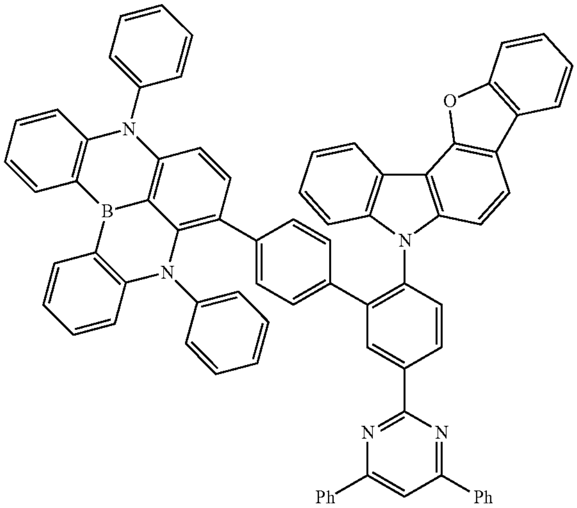
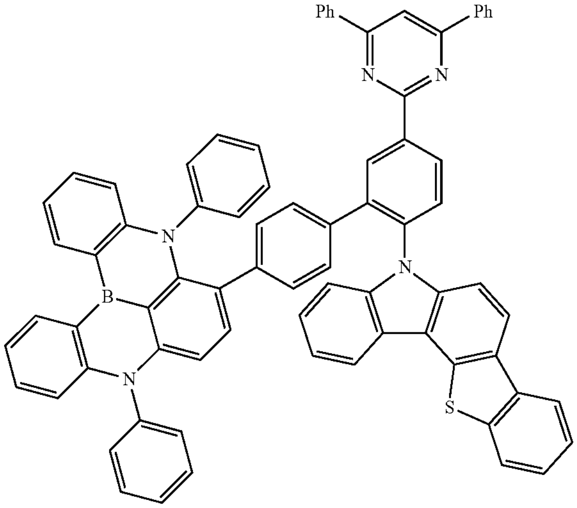
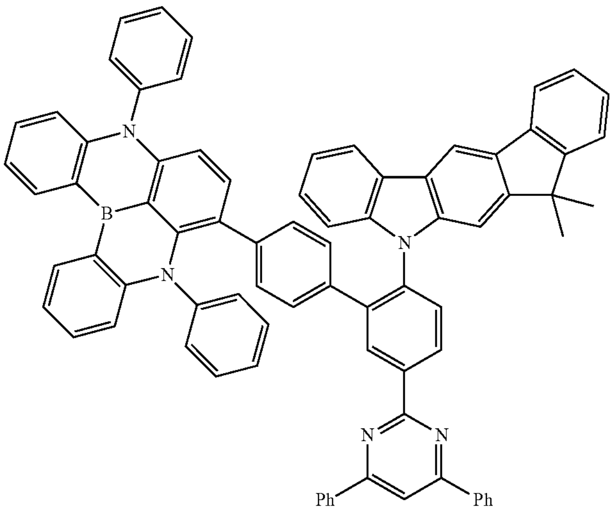

-continued
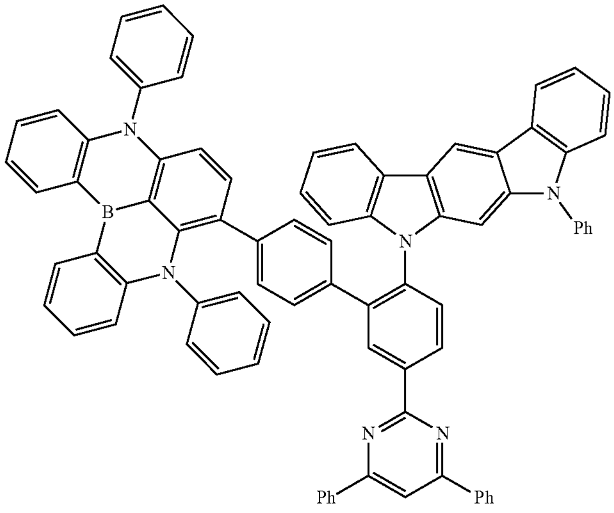
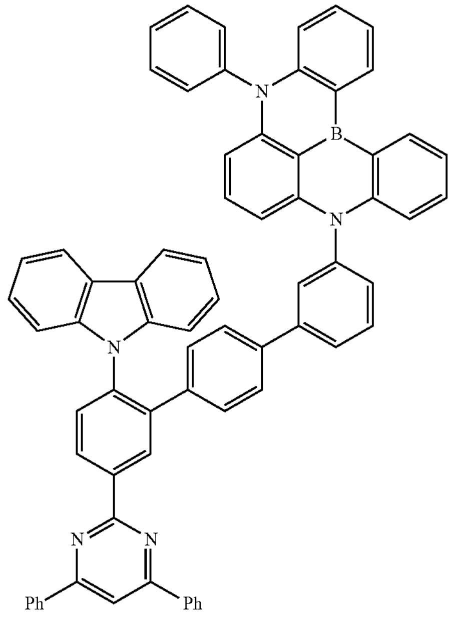
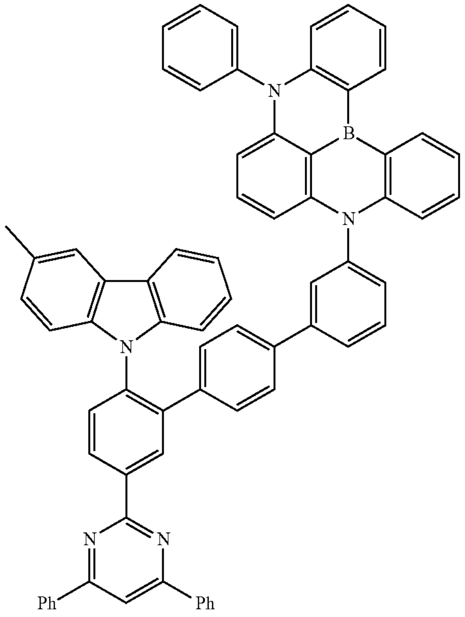
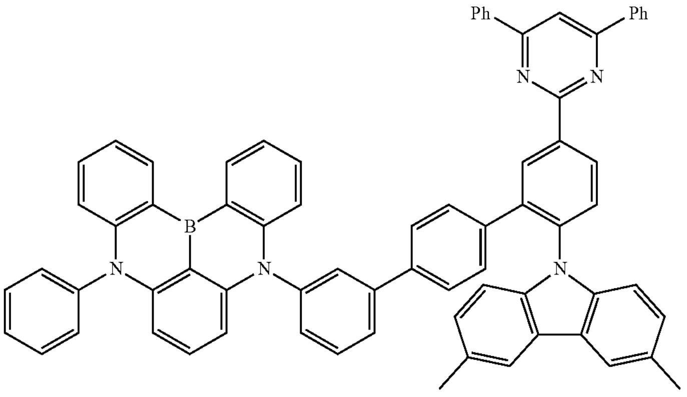
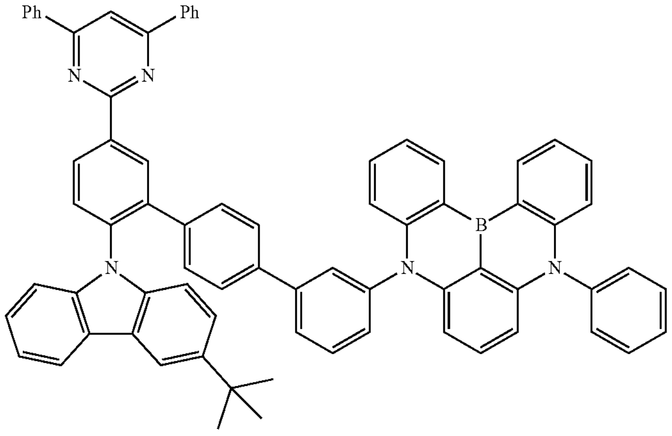

-continued
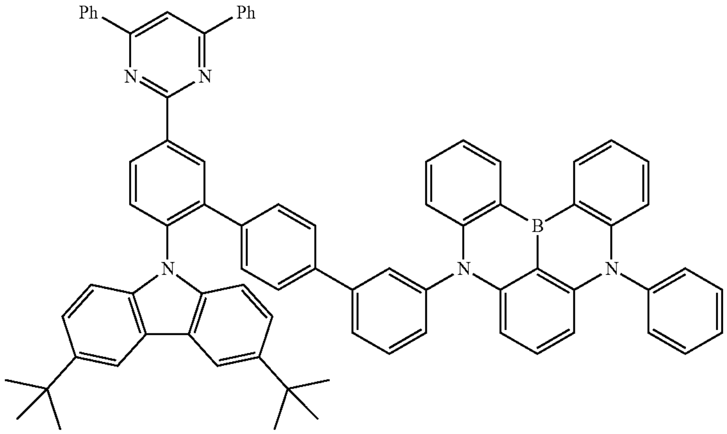
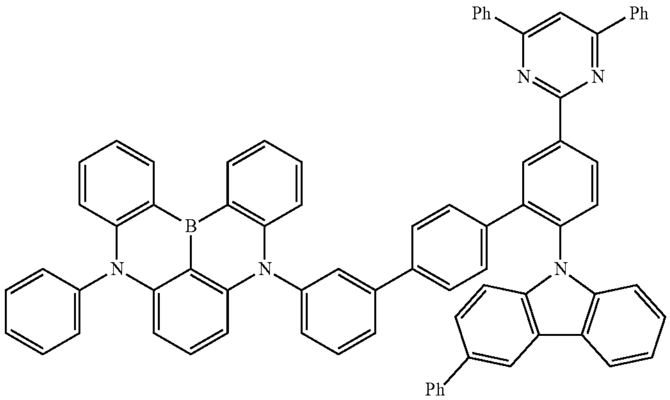
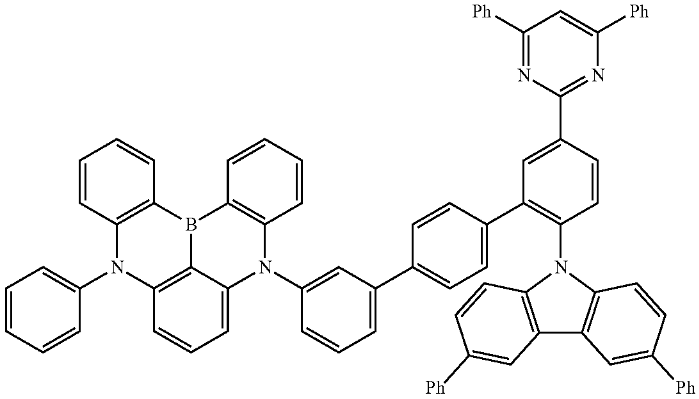
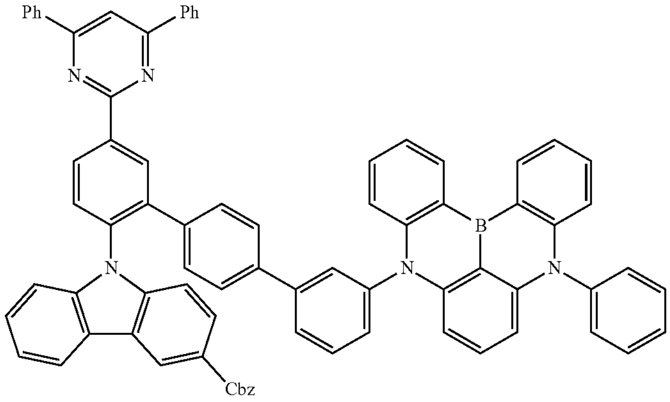

-continued
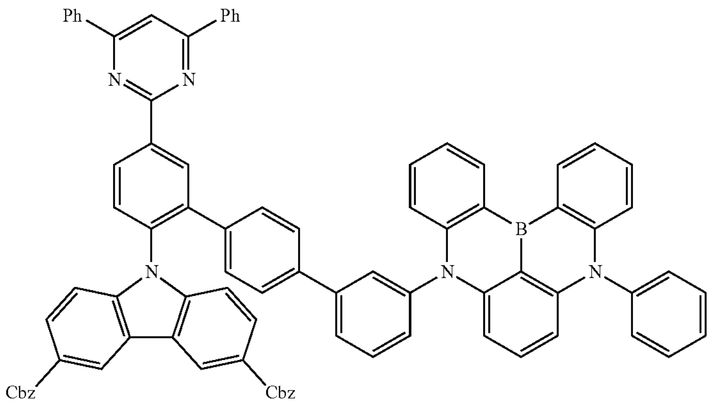
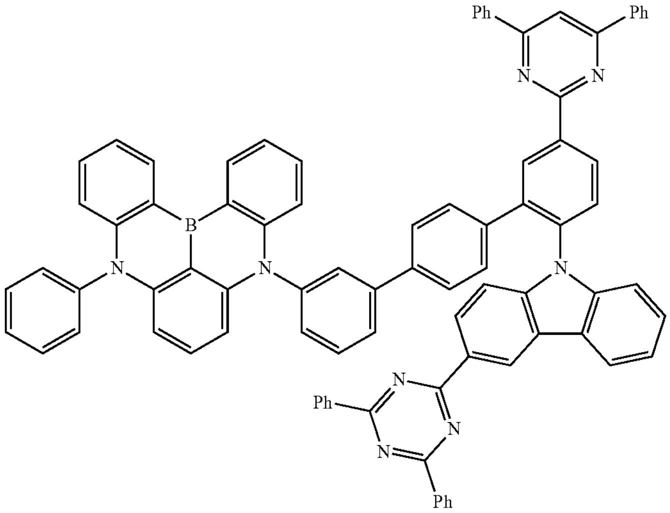
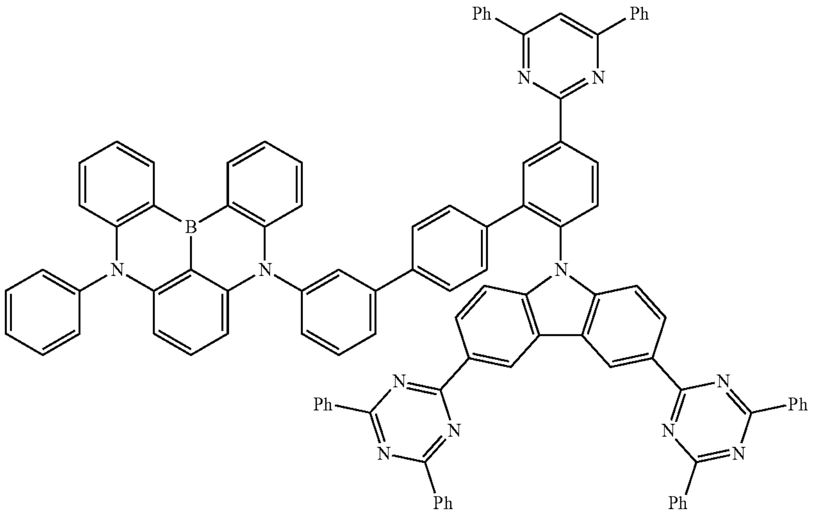

-continued
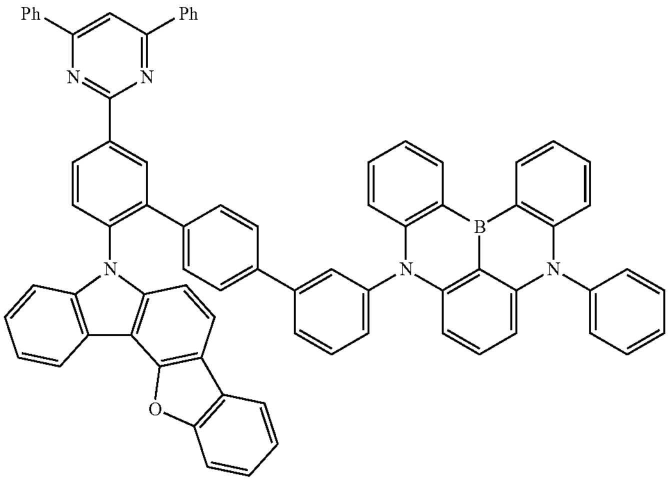
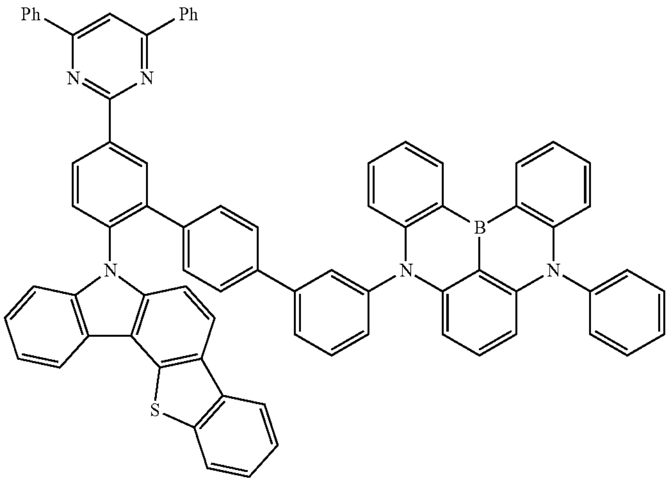
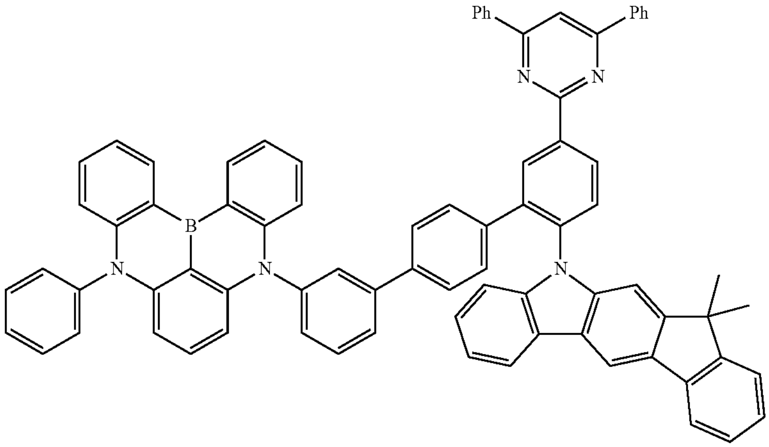

-continued
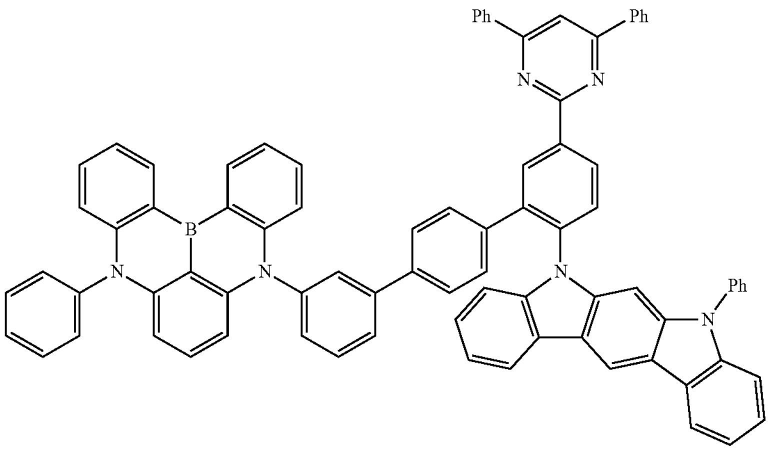
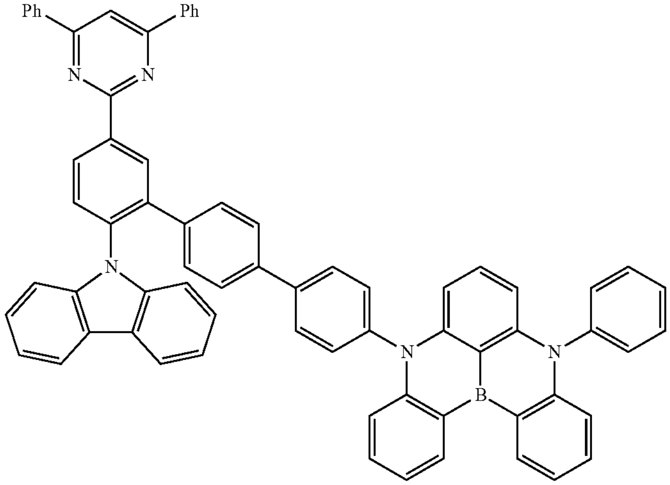
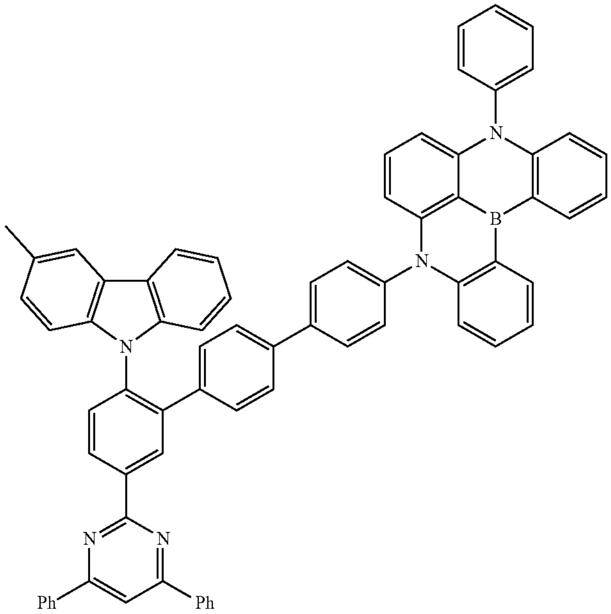

-continued
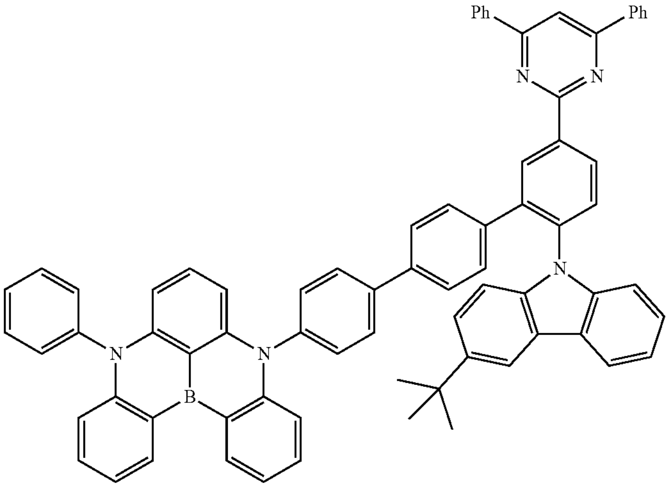
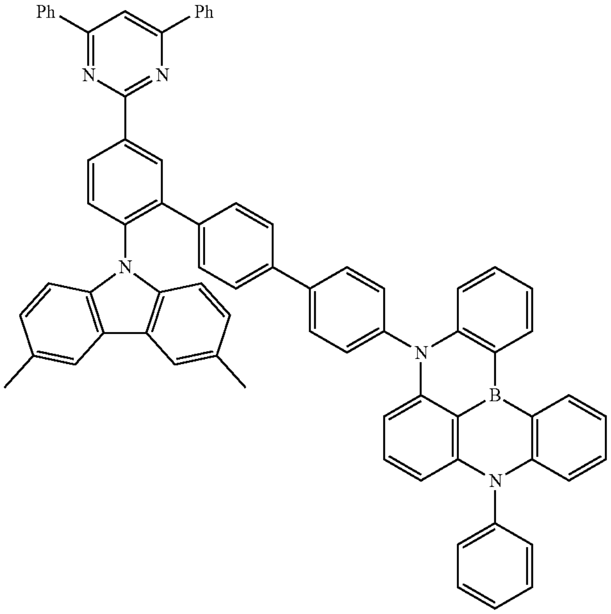
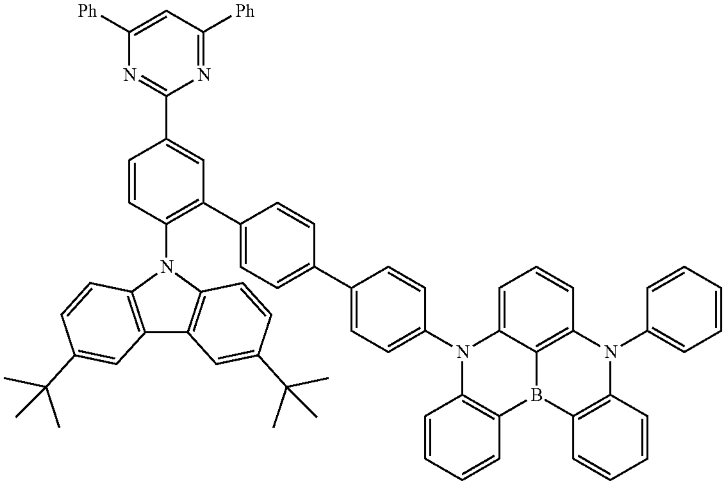

-continued
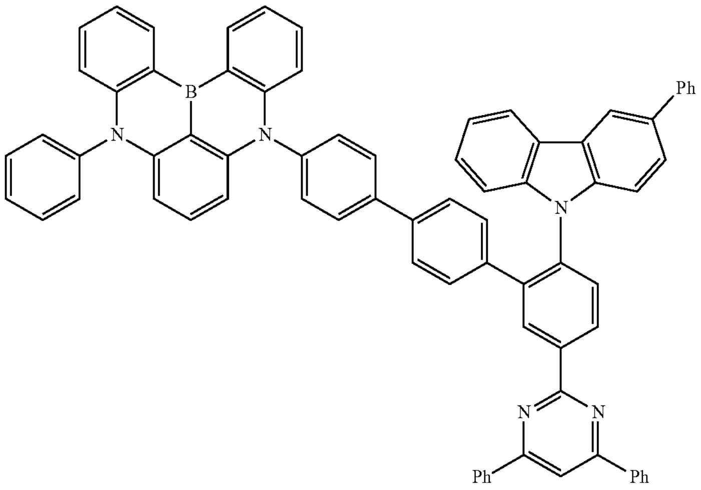
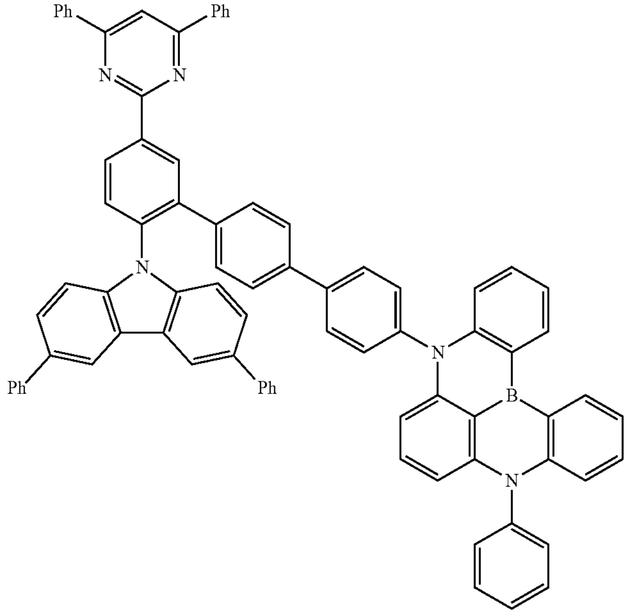
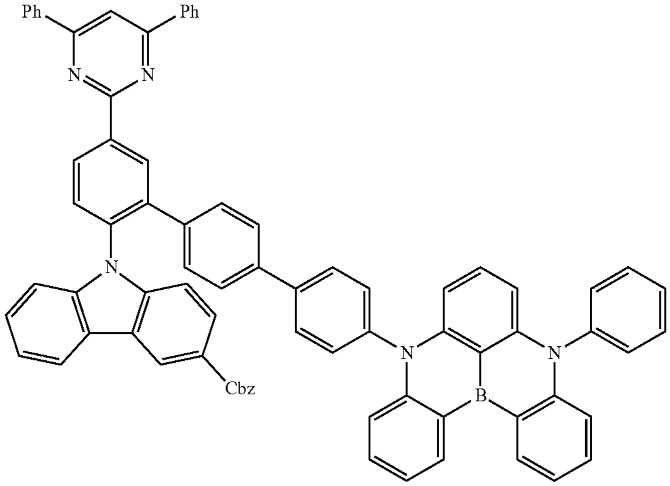

-continued
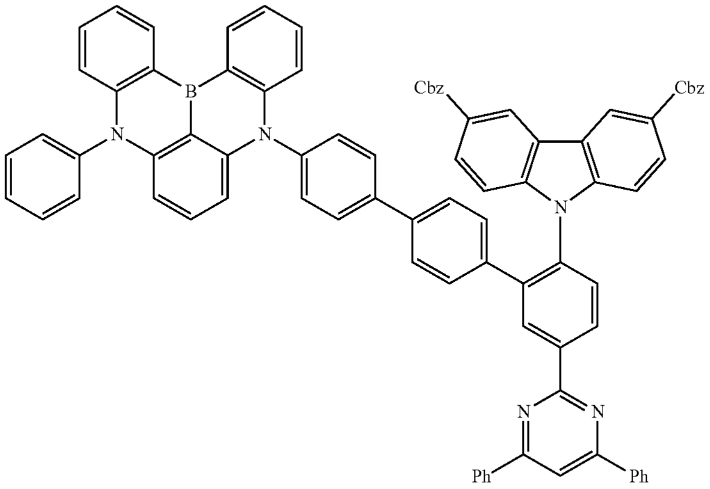
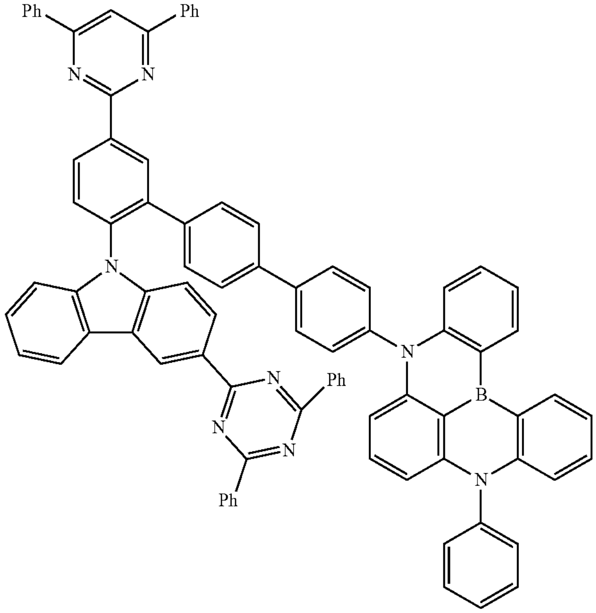
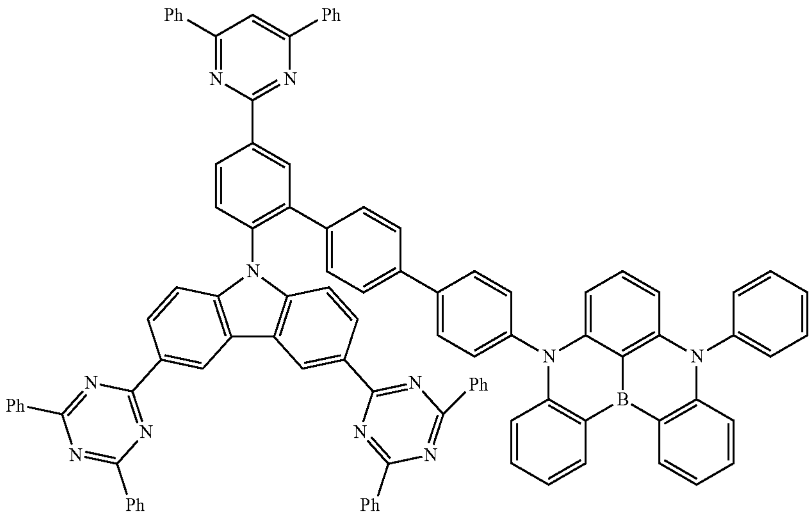

-continued
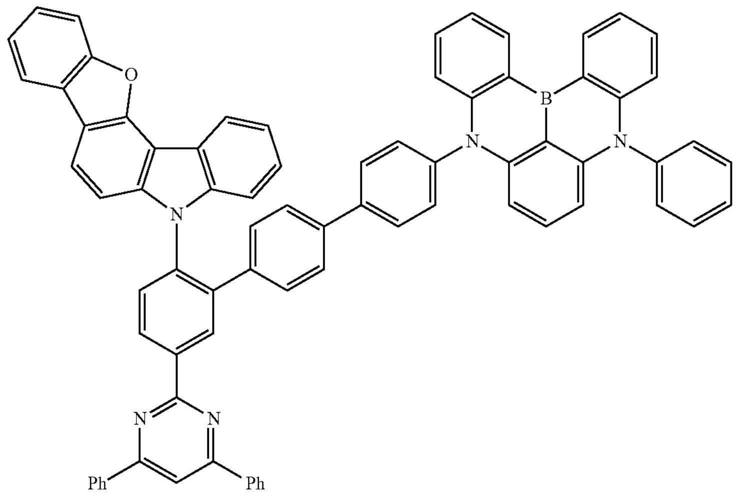
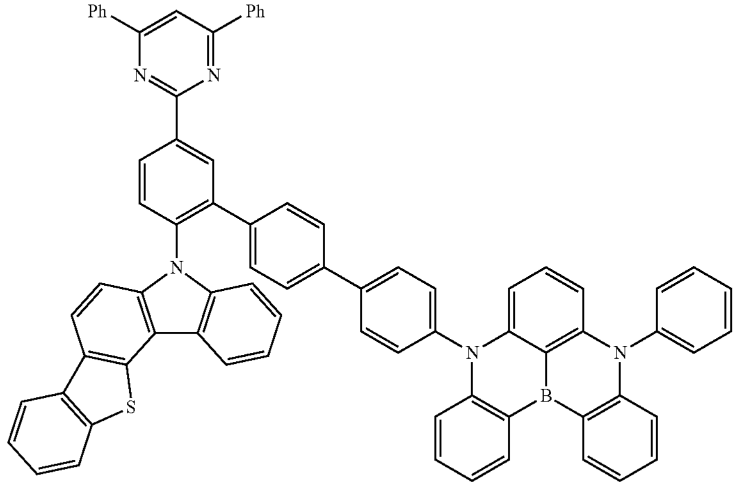
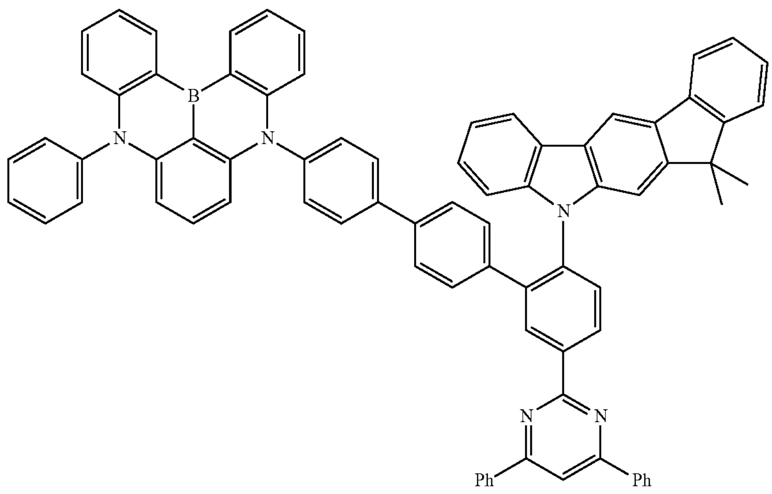

-continued
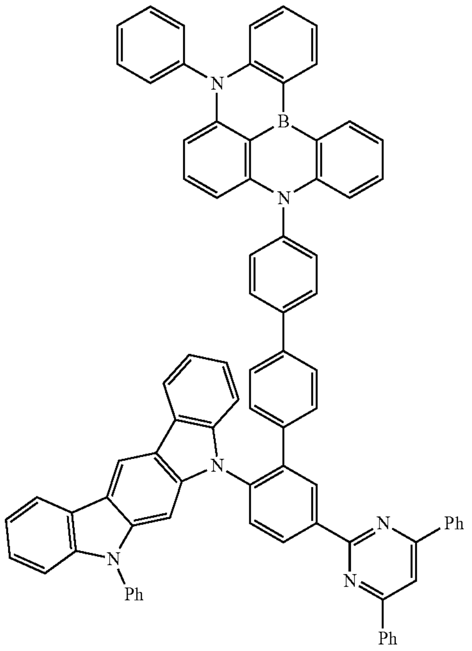
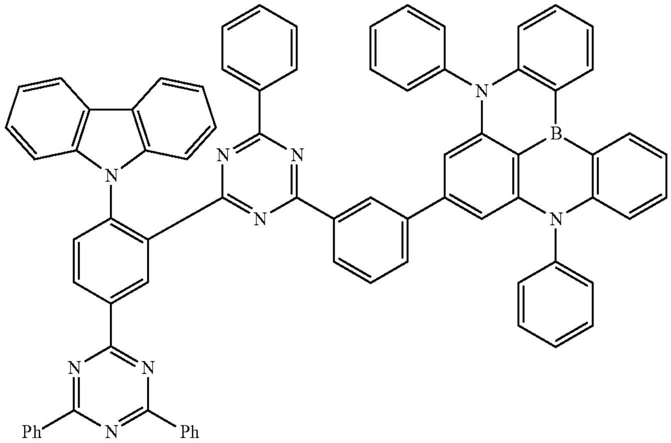
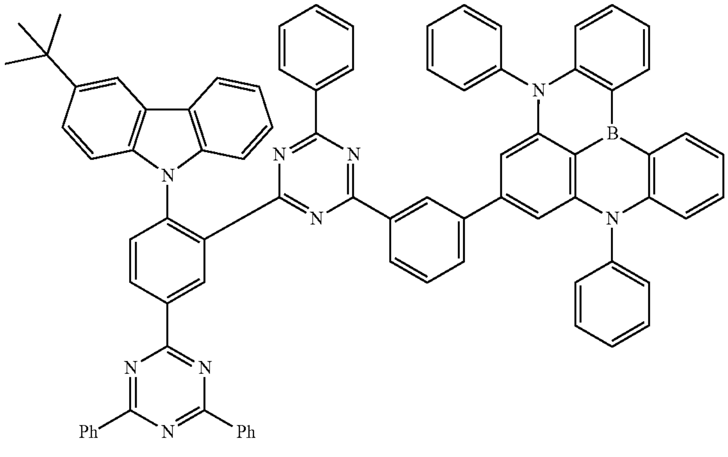

-continued
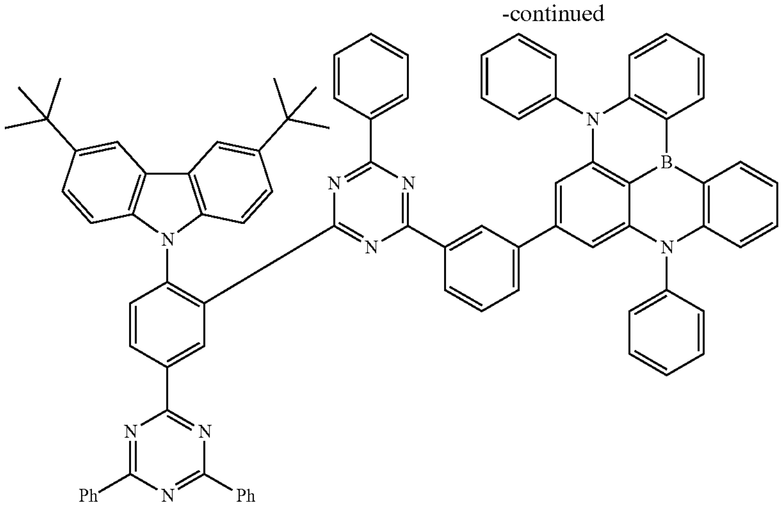
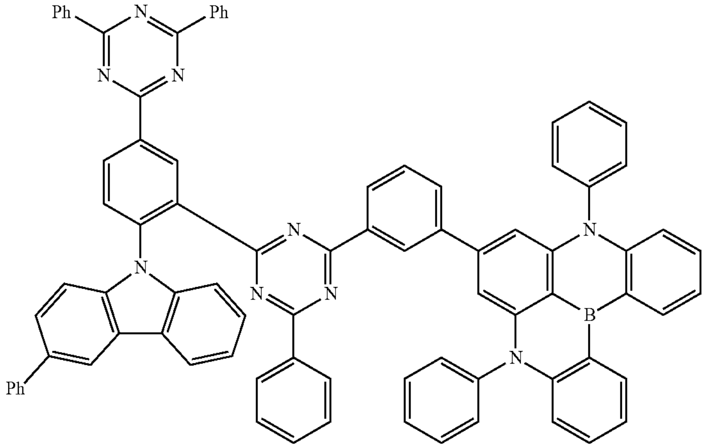
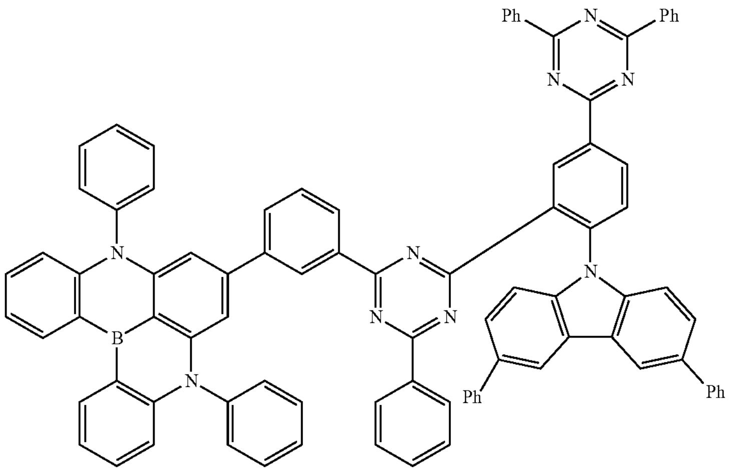

-continued
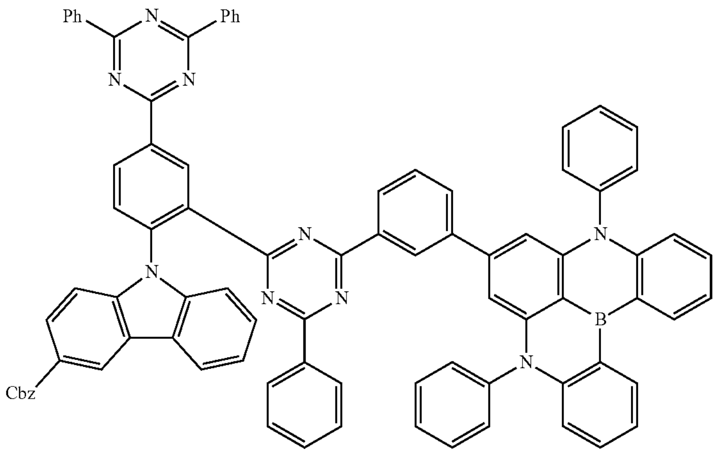
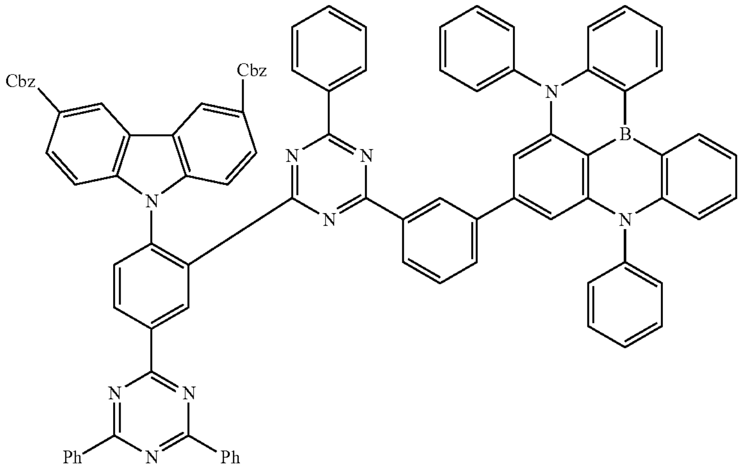
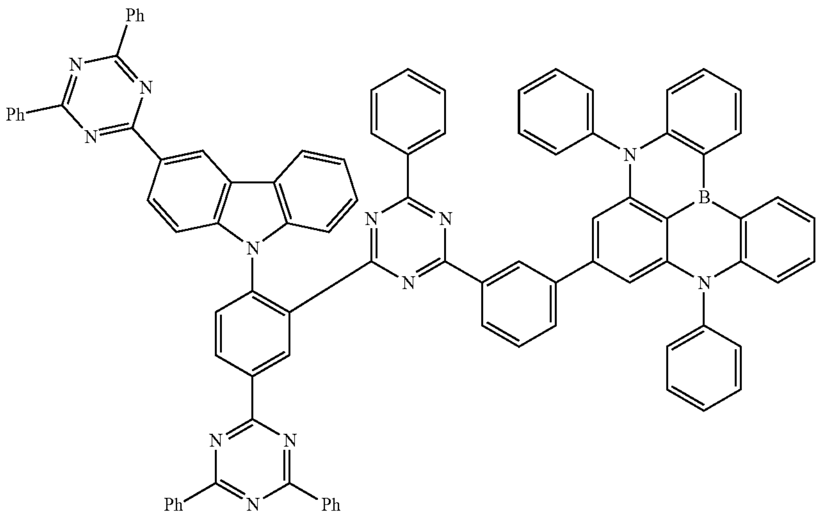

-continued
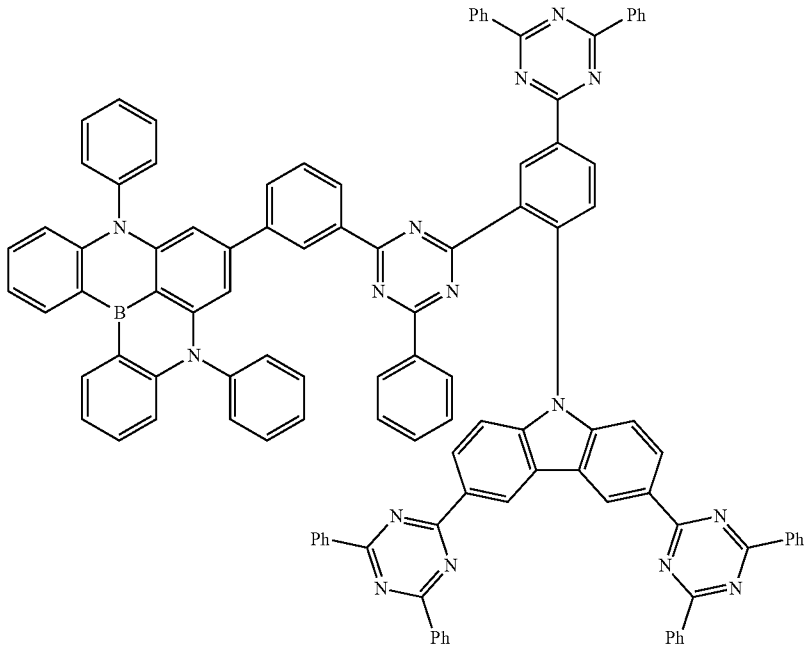
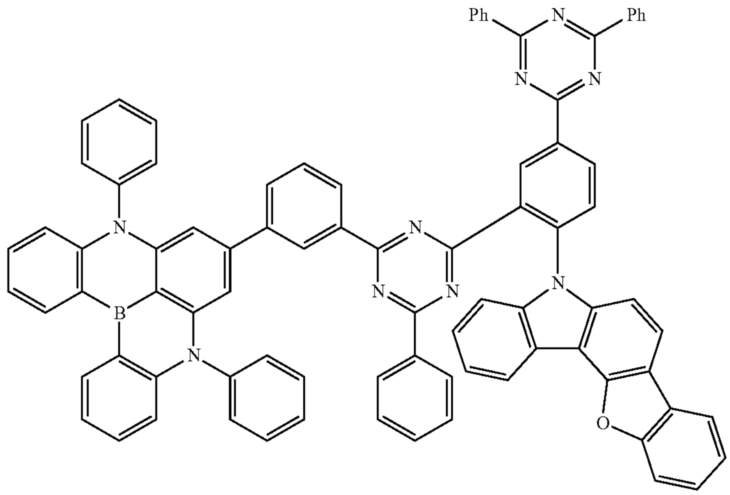
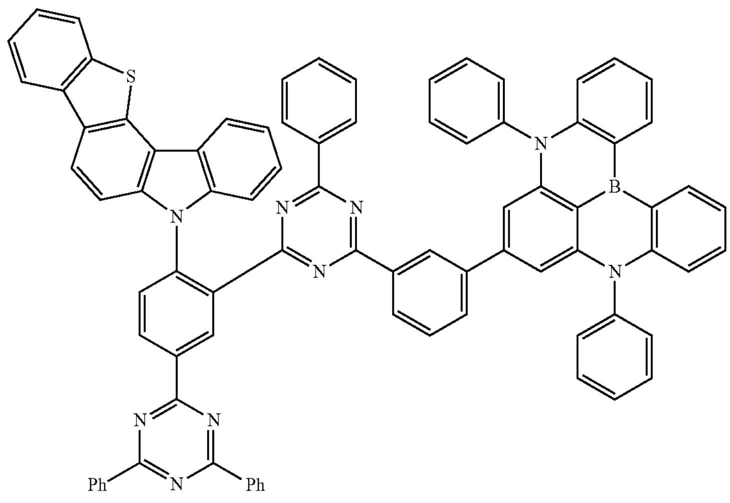

-continued
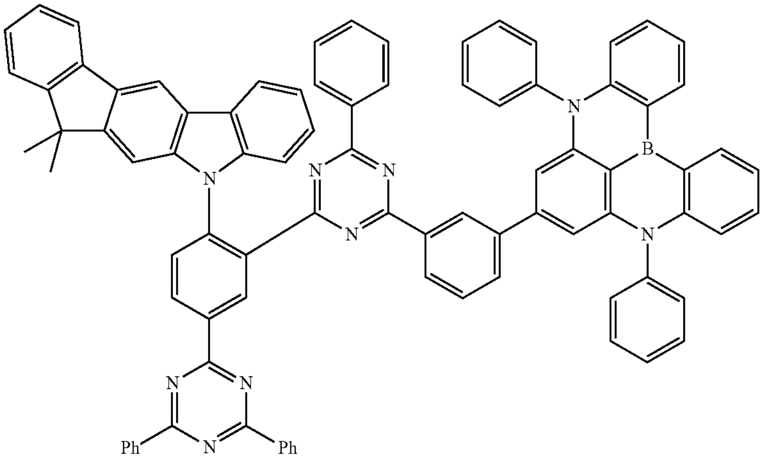
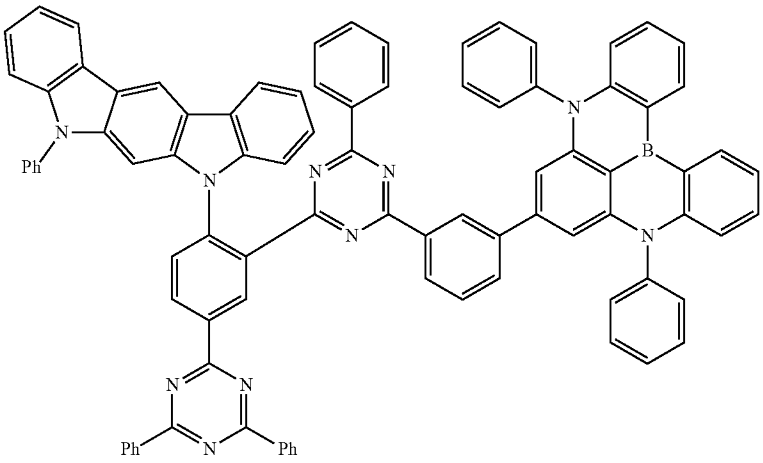
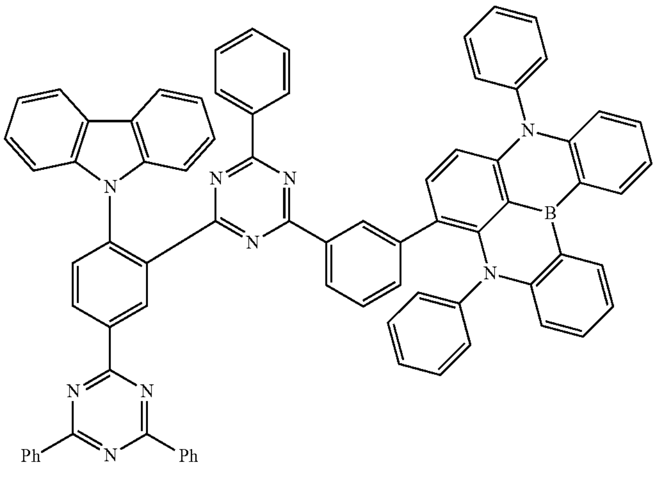

-continued
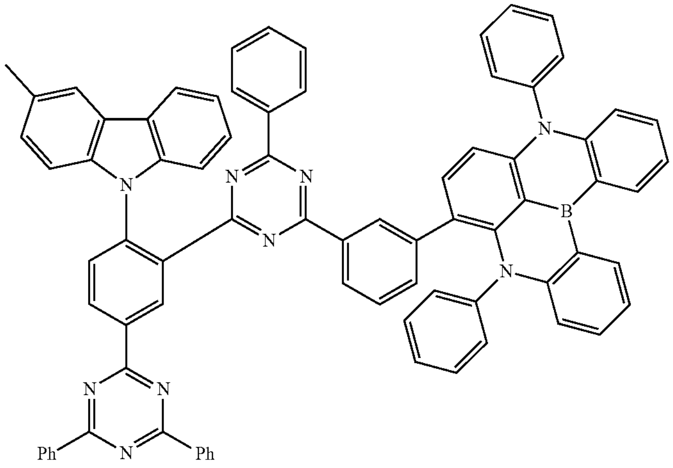
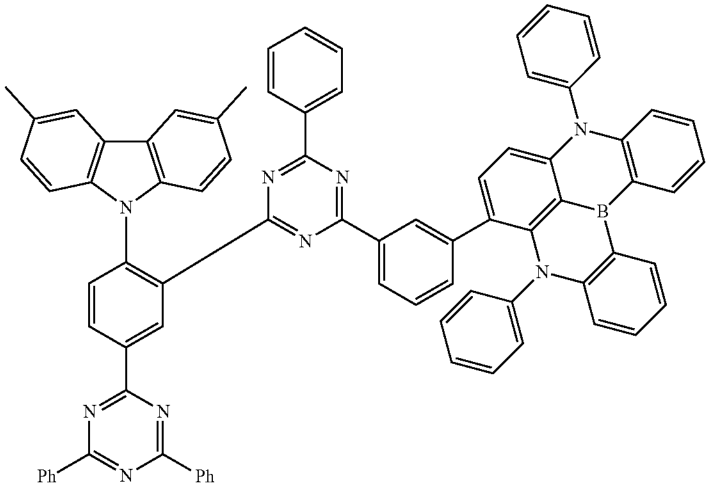
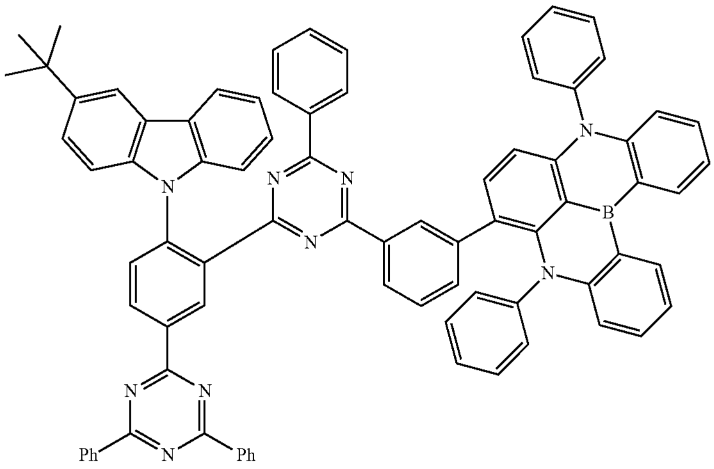

-continued
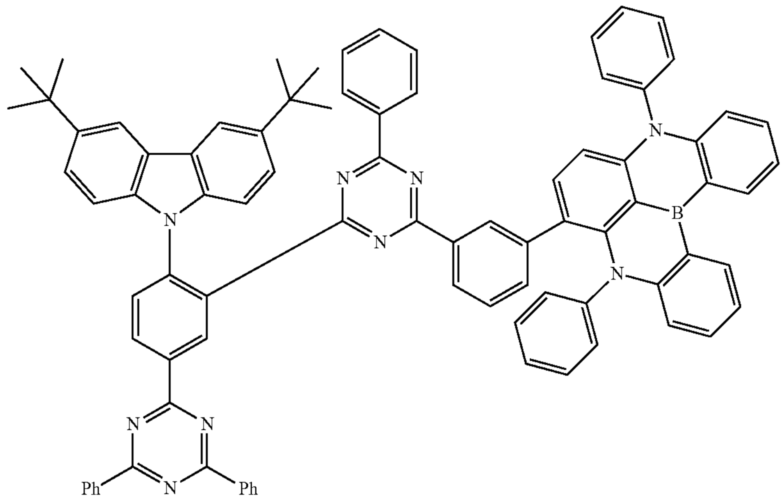
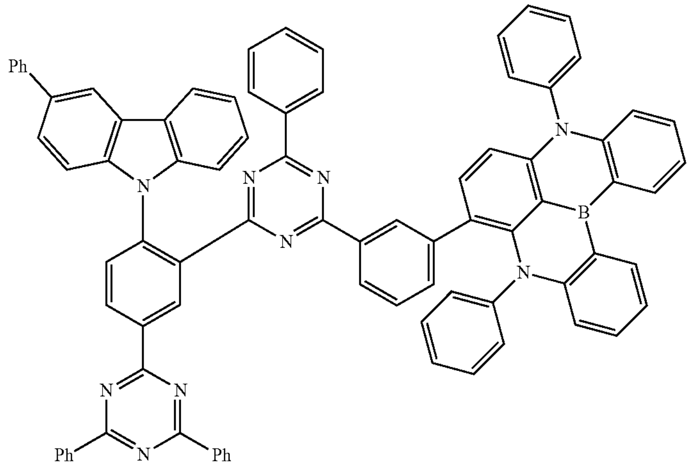
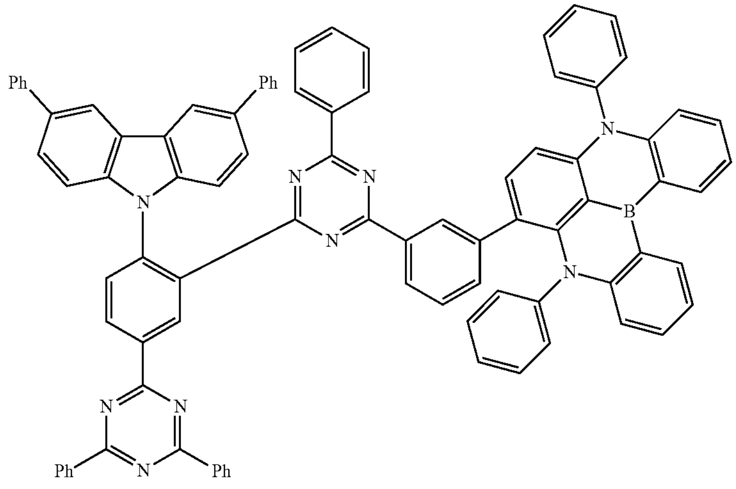

-continued
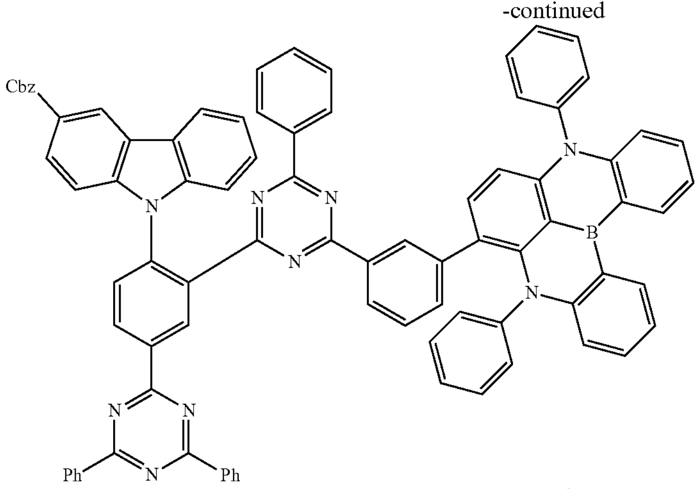
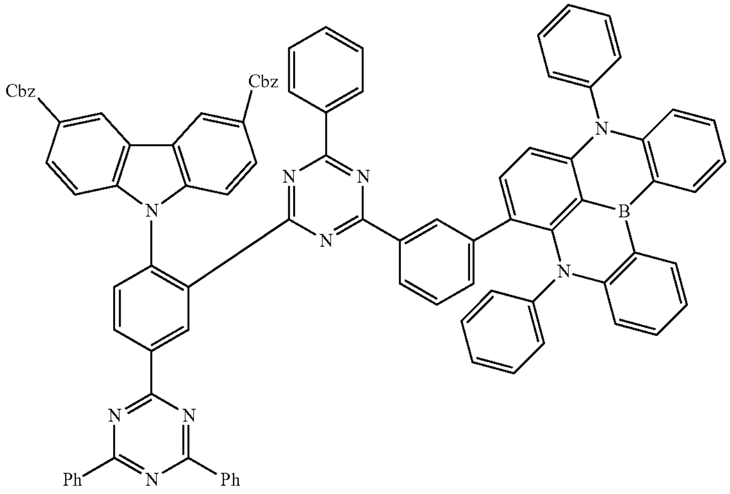
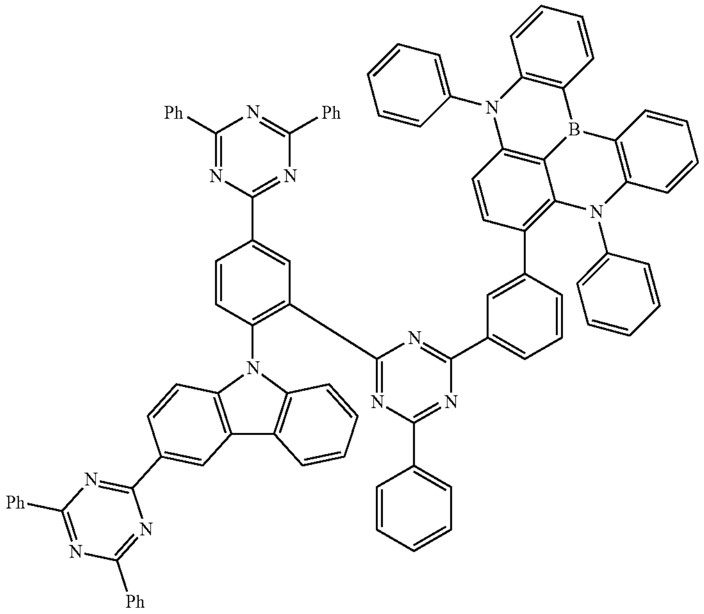

-continued
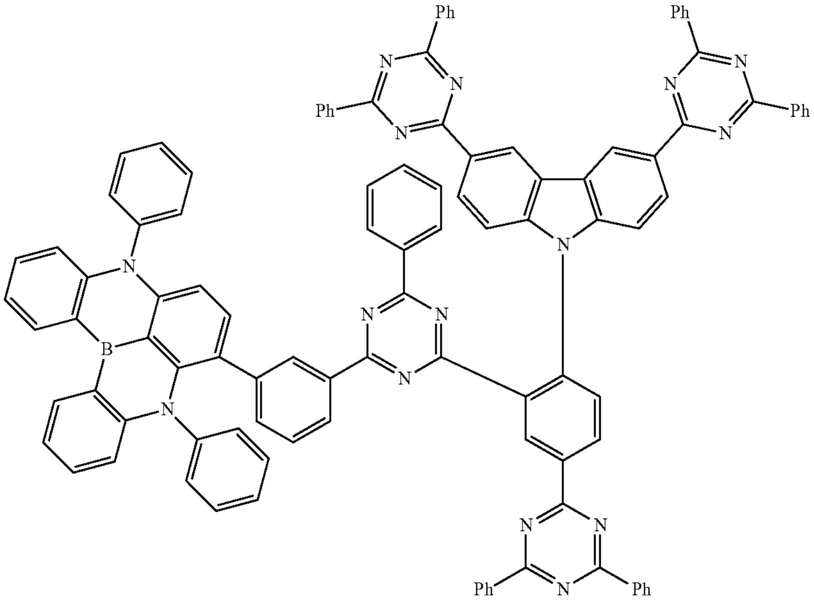
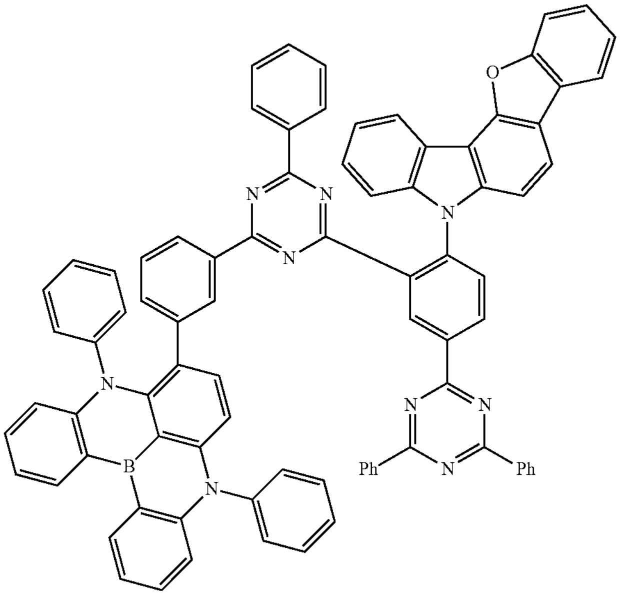

-continued
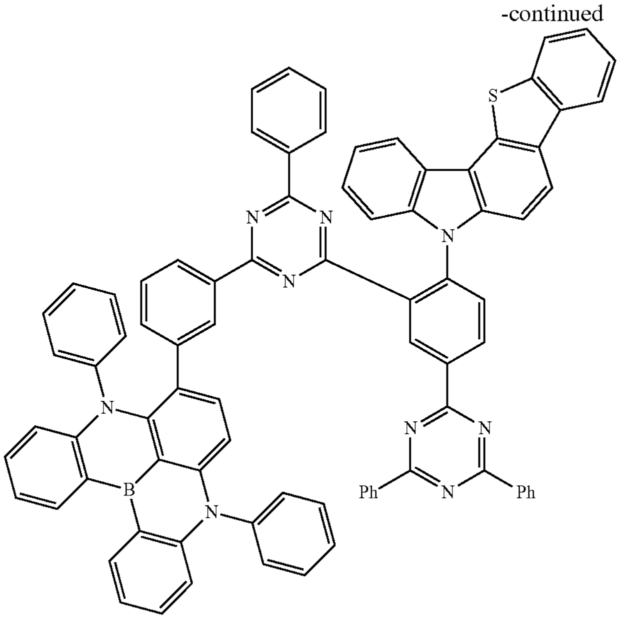
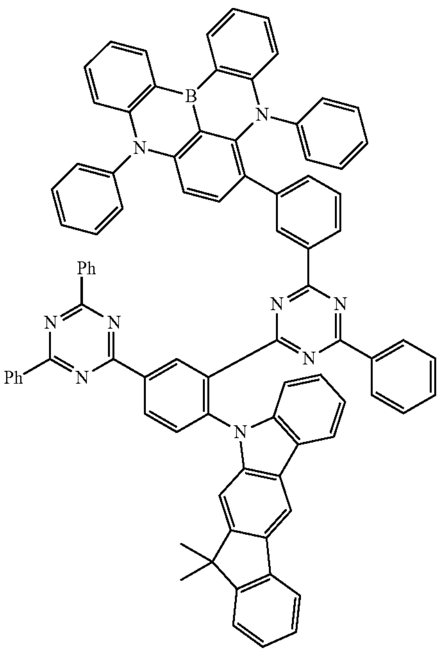

-continued
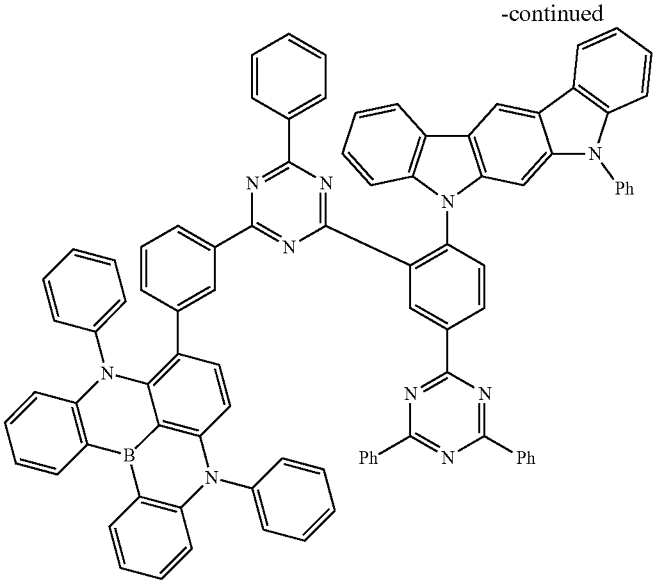
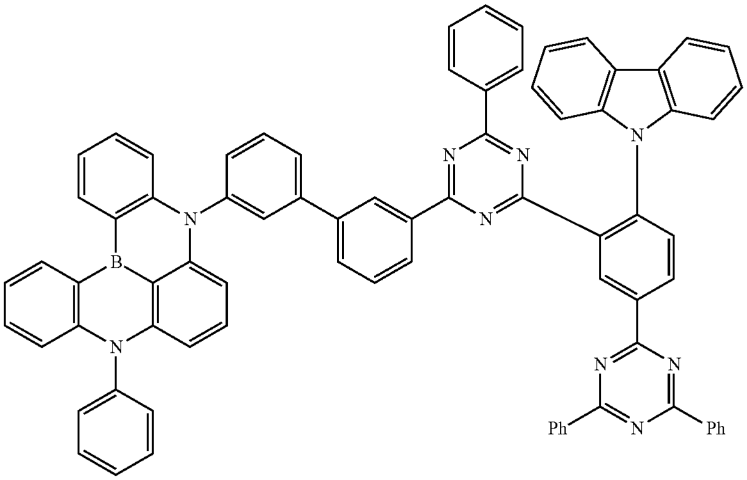
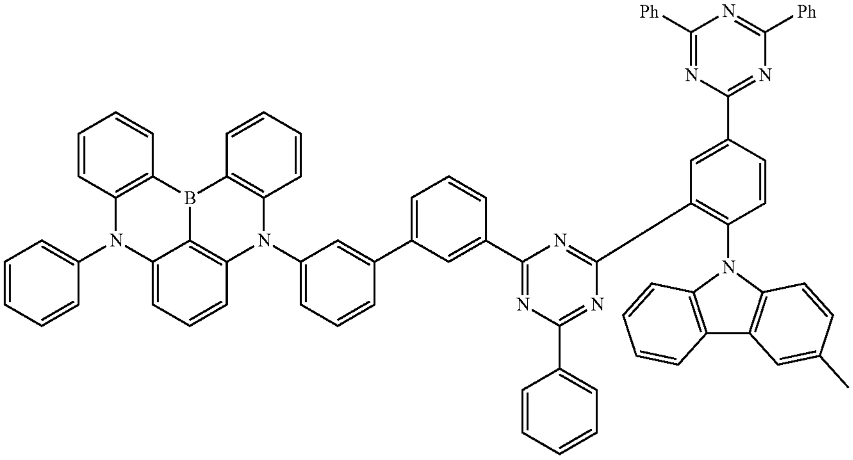

-continued
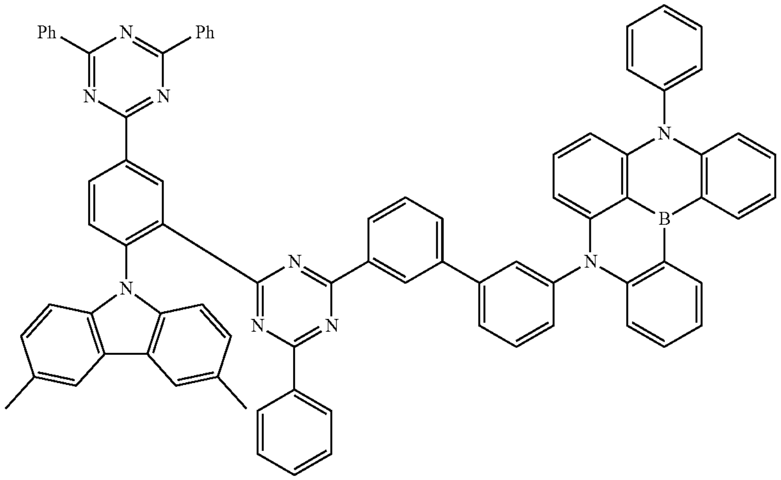
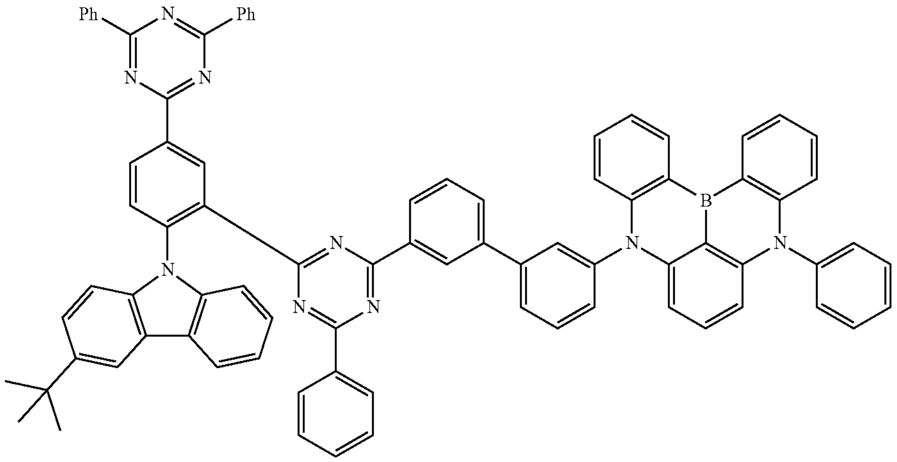
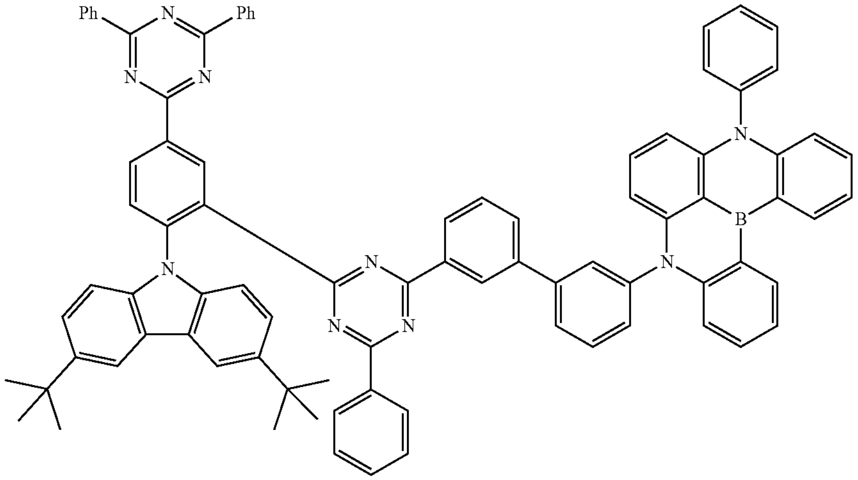

-continued
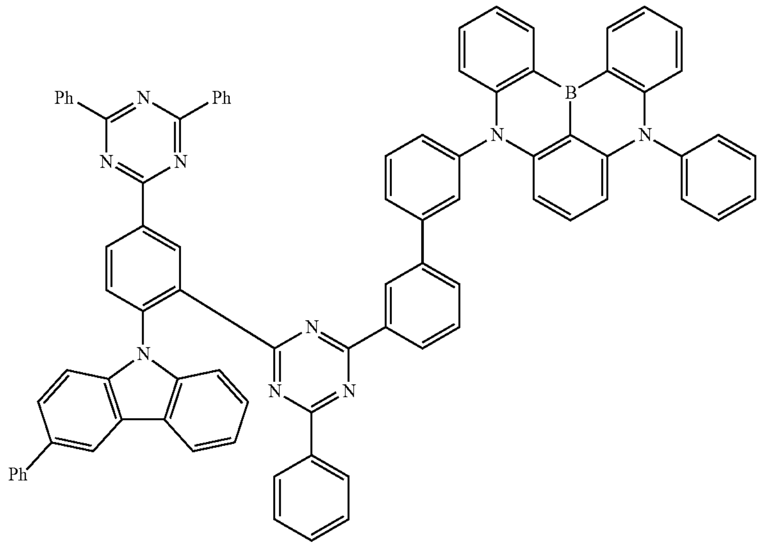
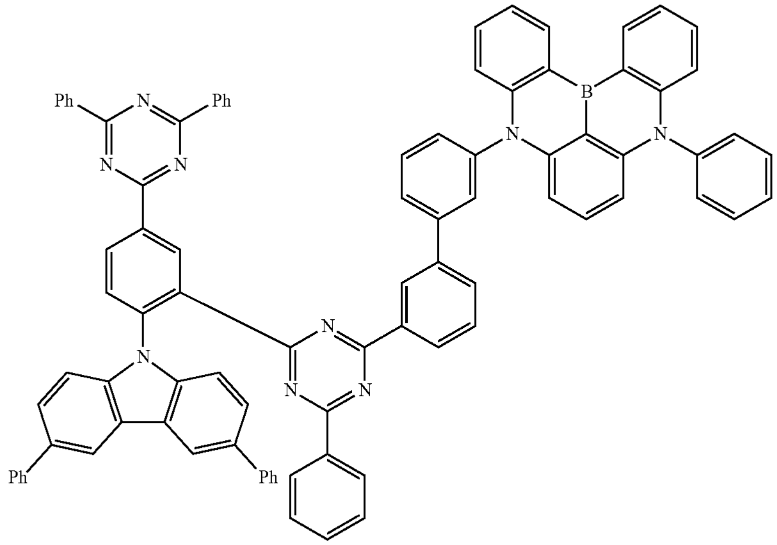
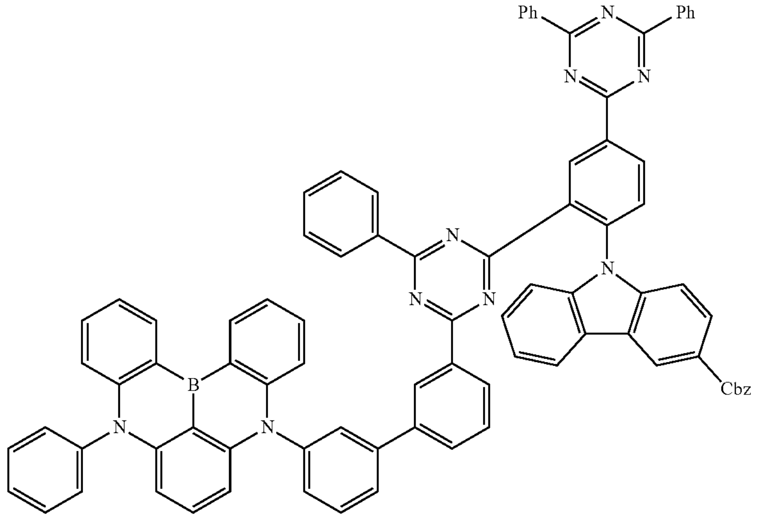

-continued
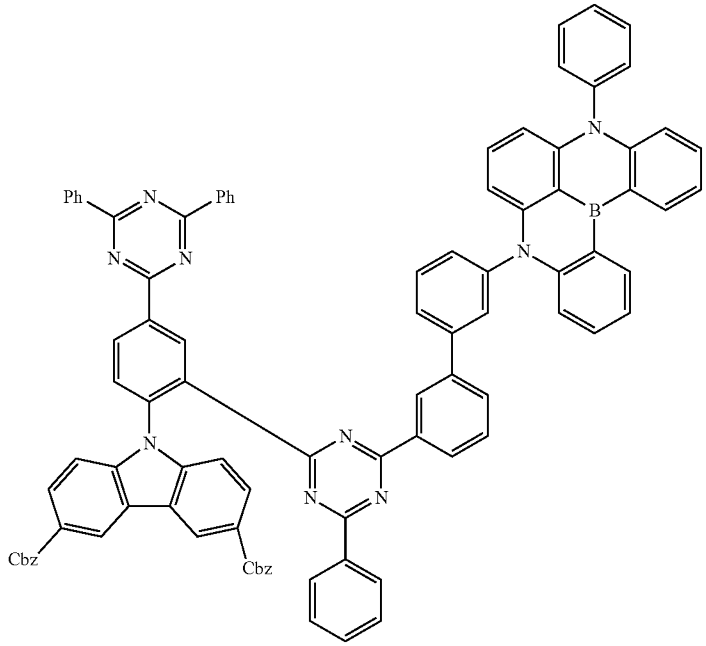
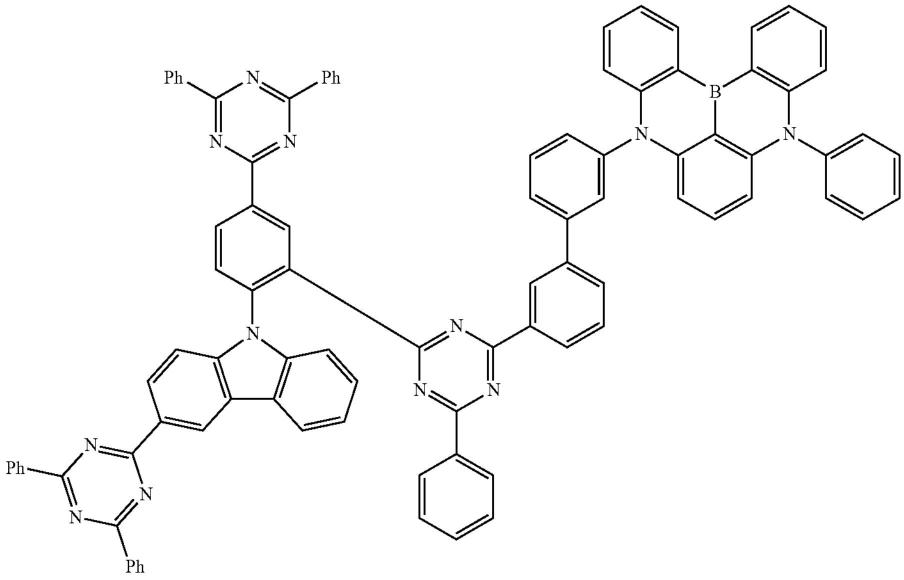
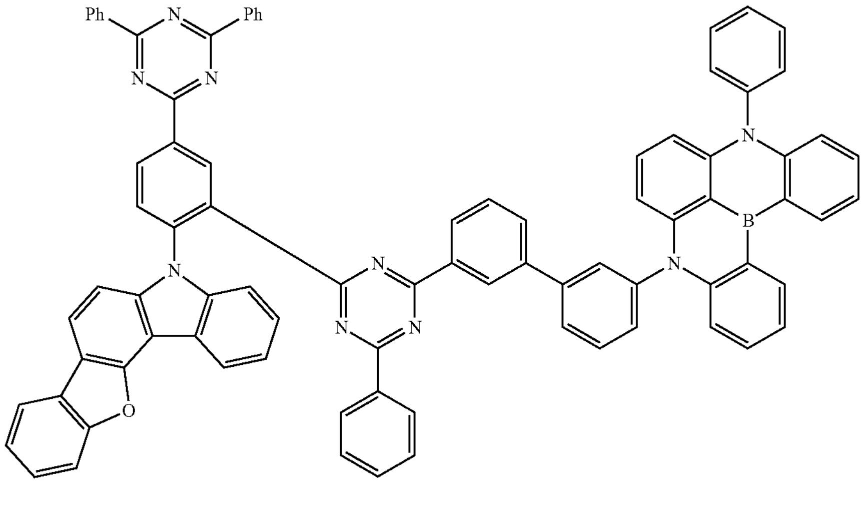

-continued
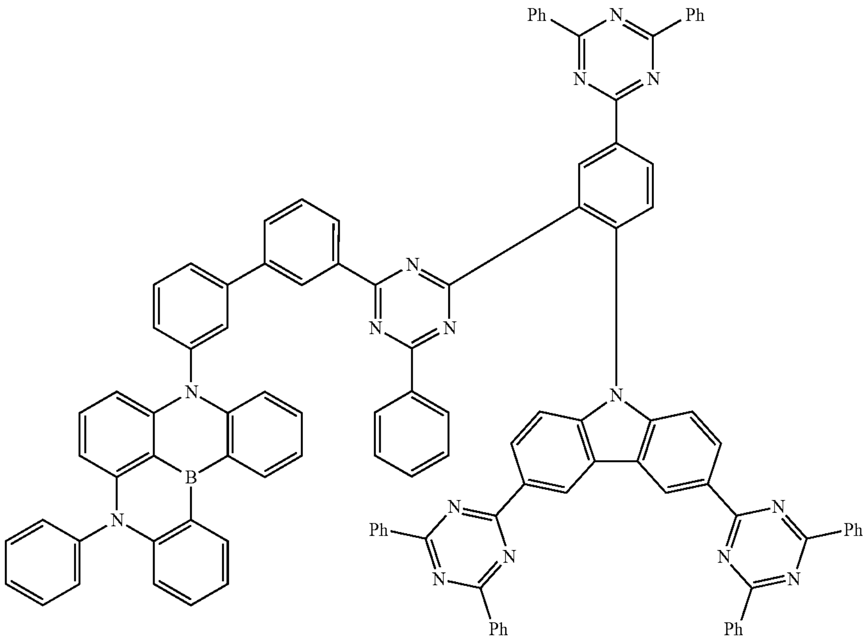
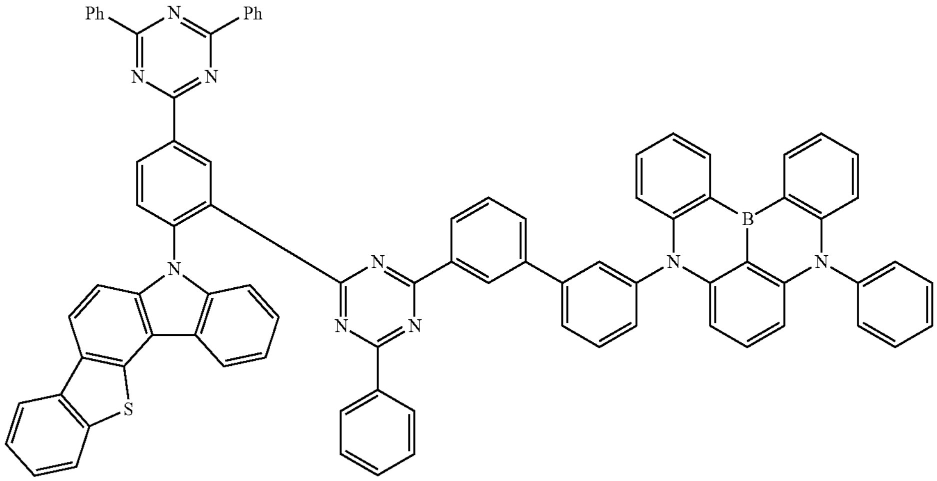
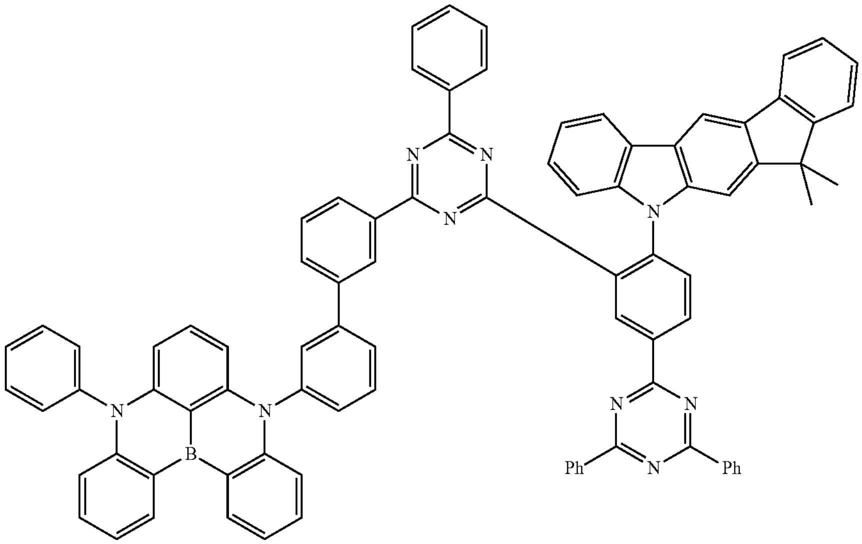

-continued
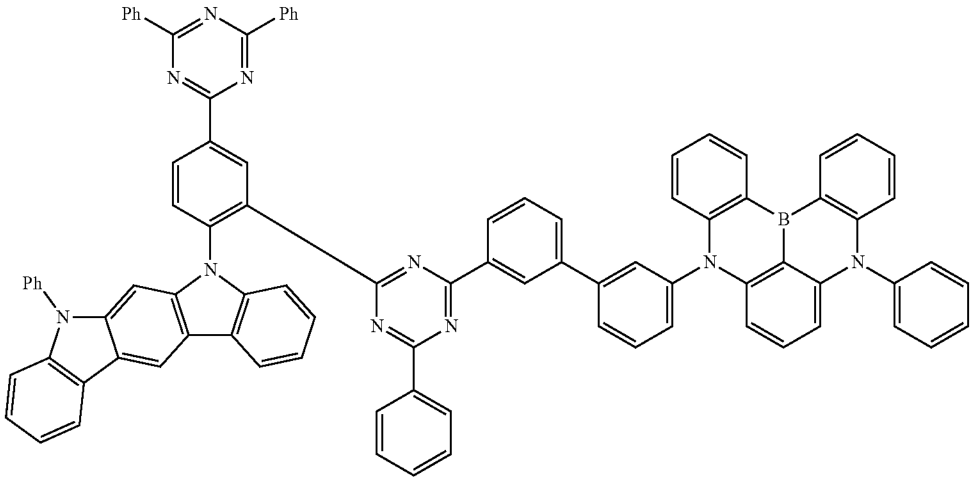
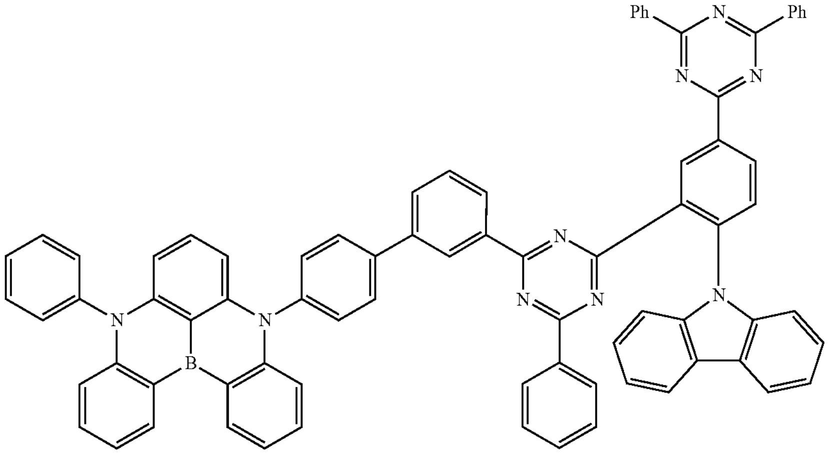
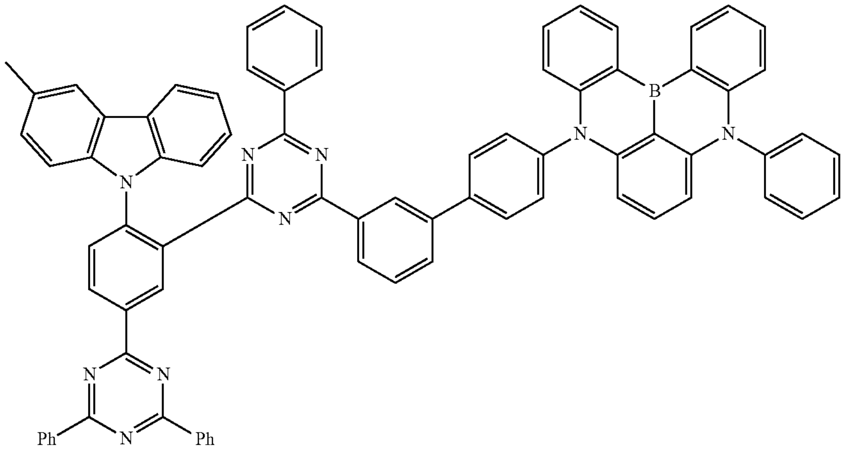

-continued
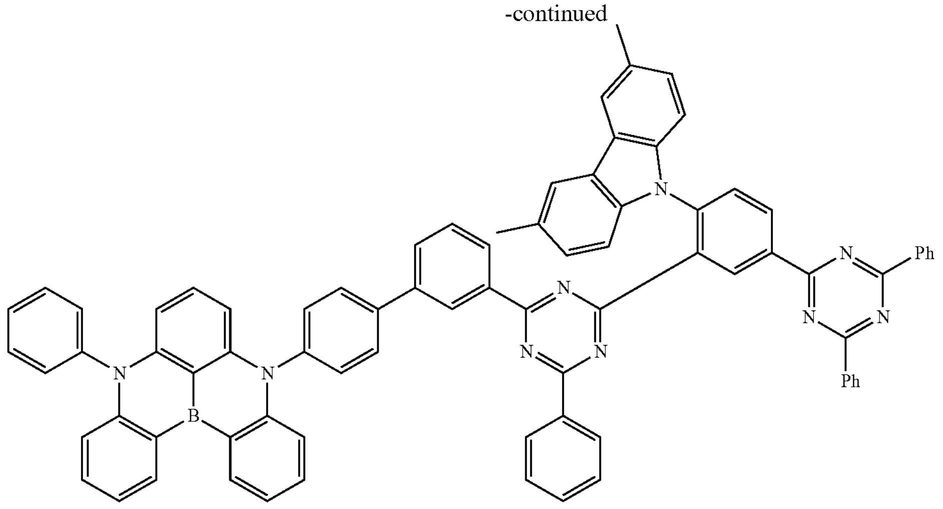
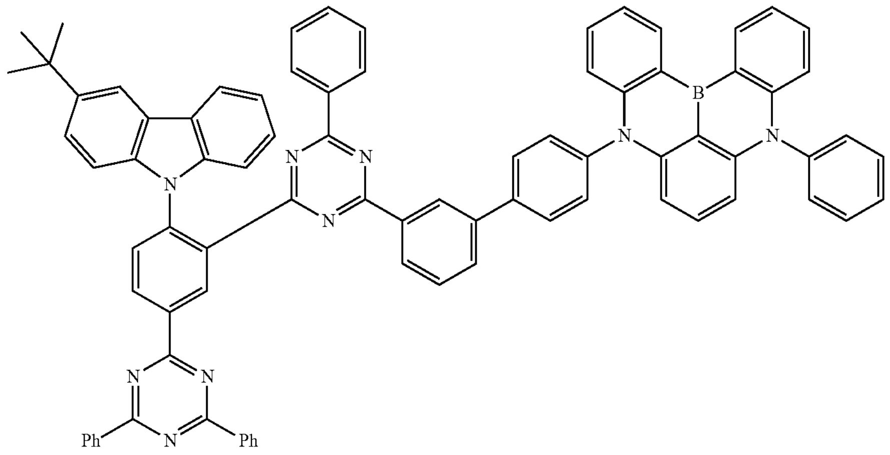
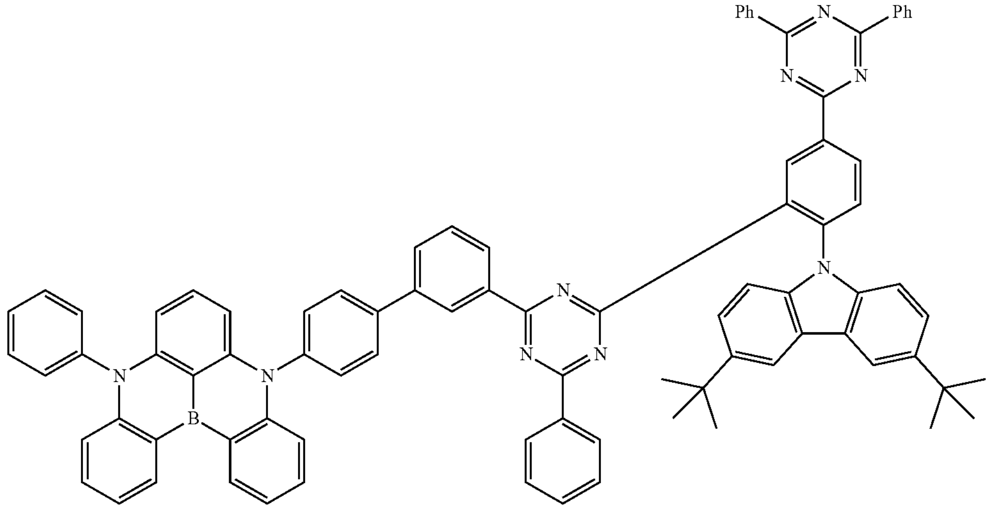

-continued
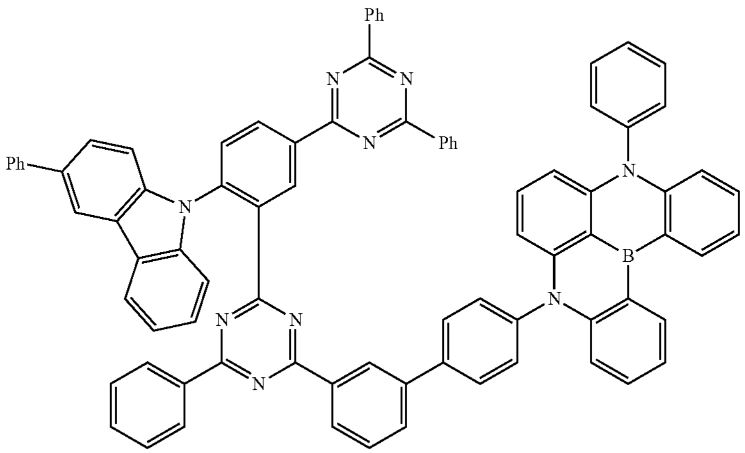
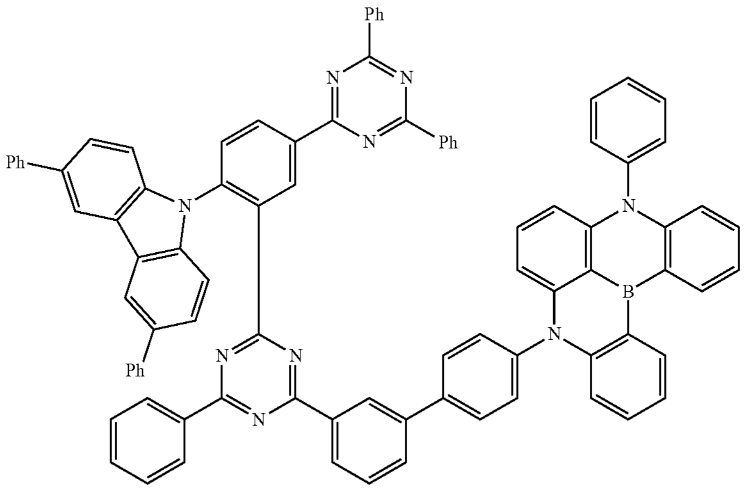
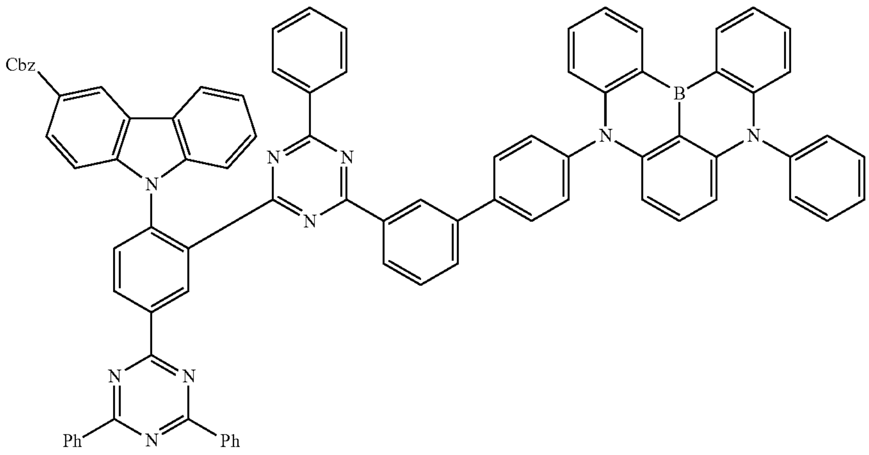

-continued
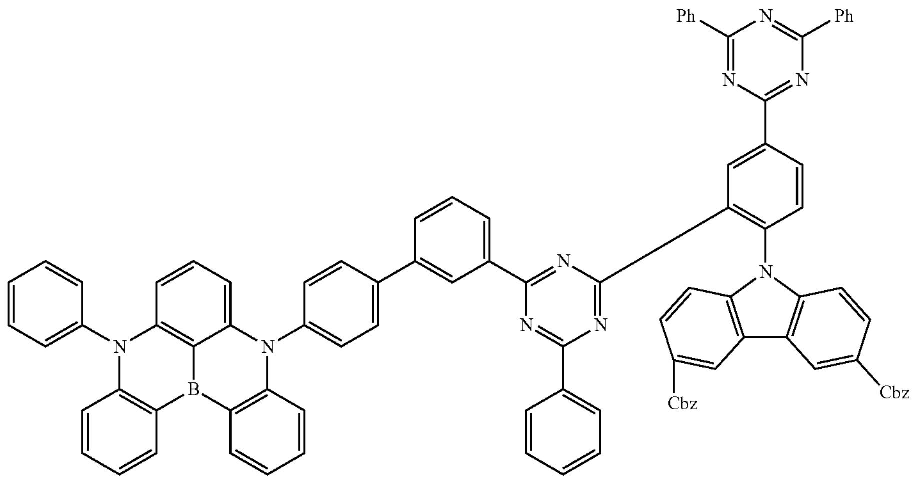
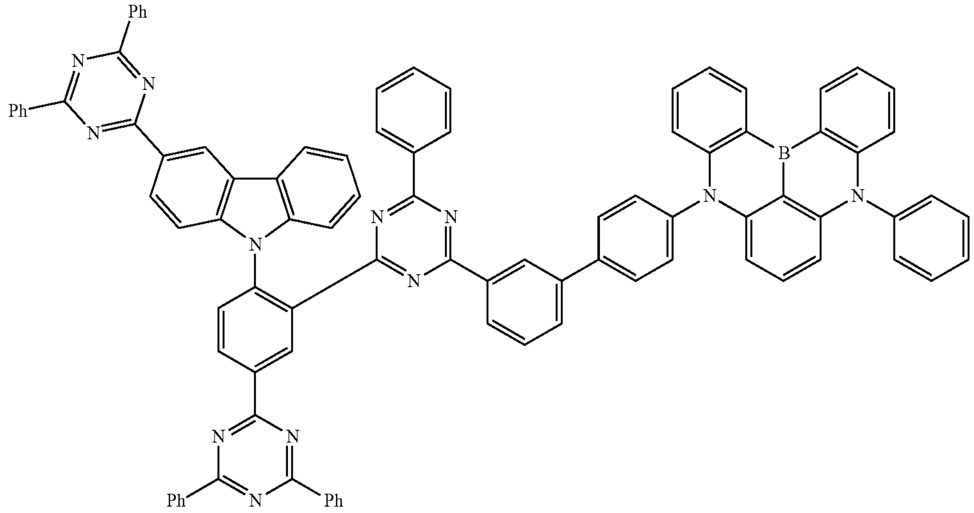
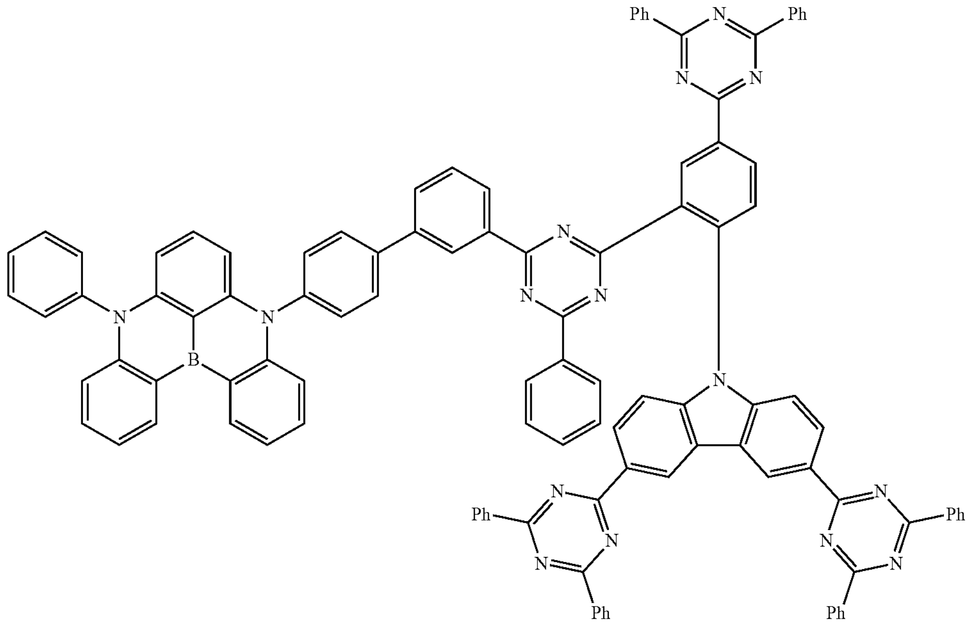

-continued
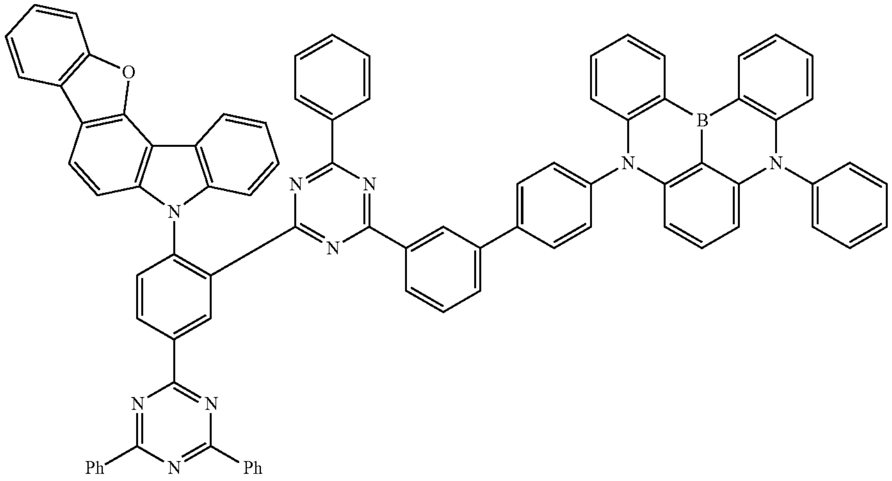
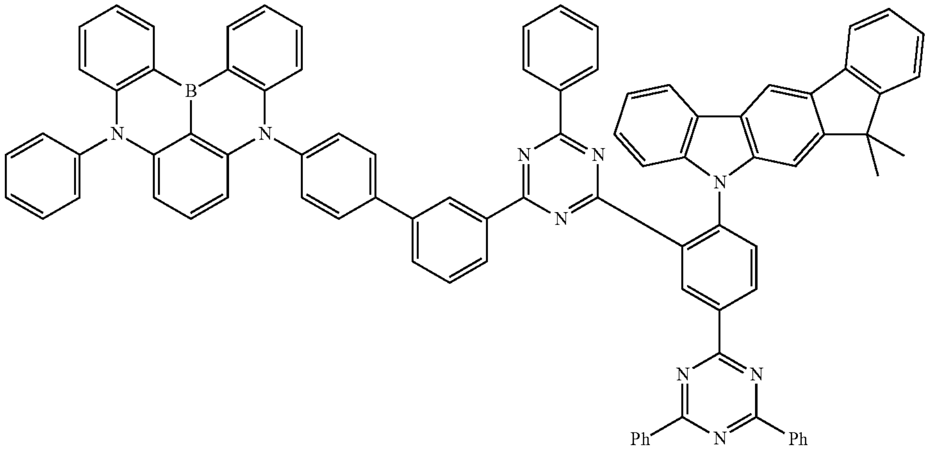
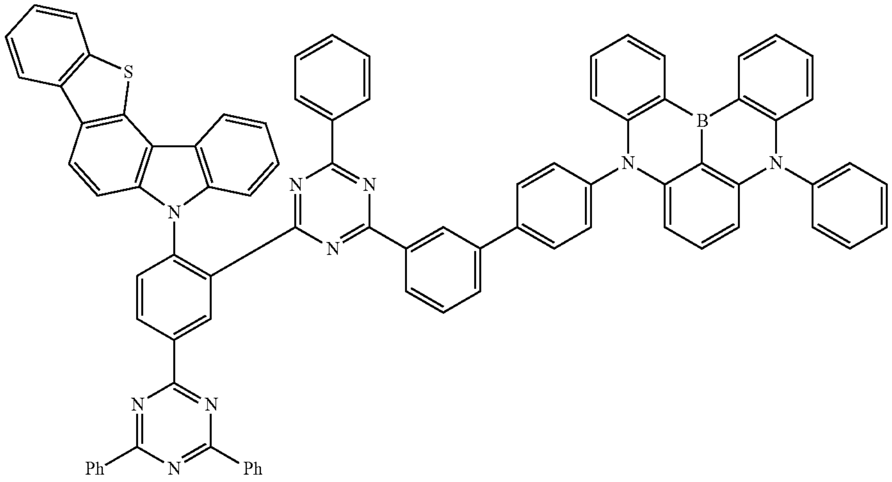

-continued
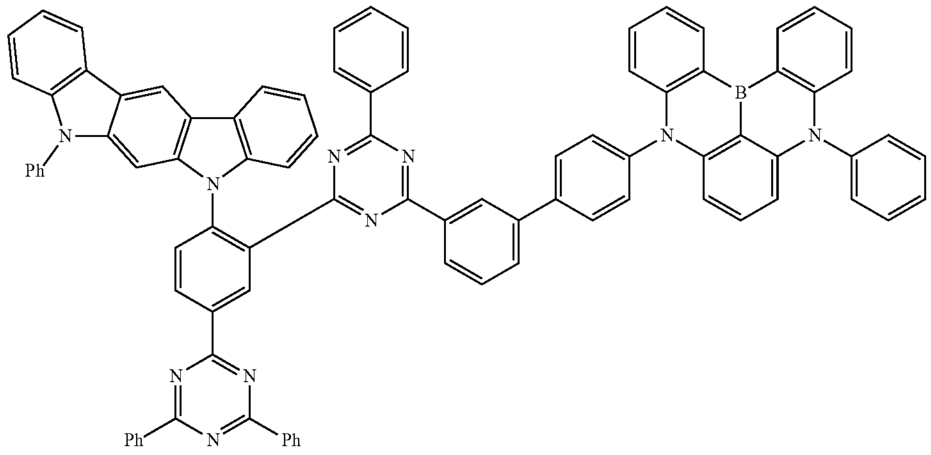
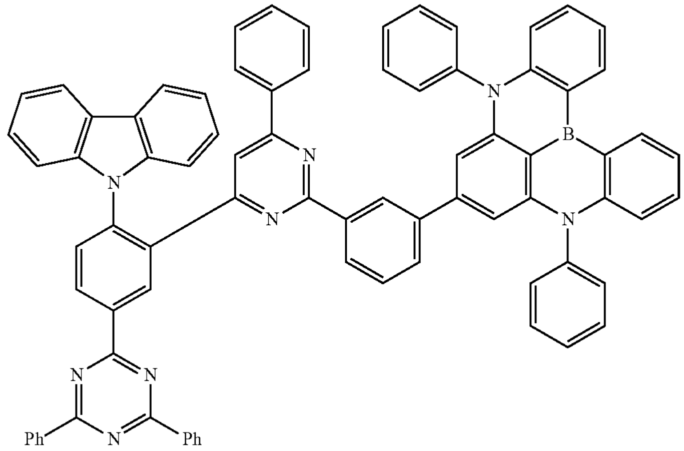
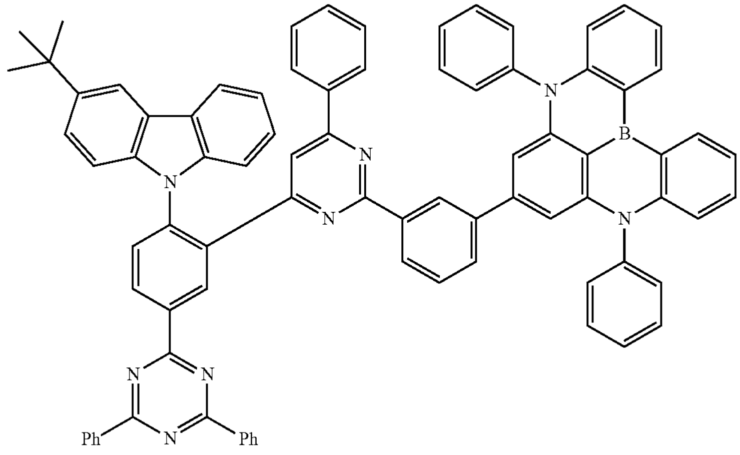

-continued
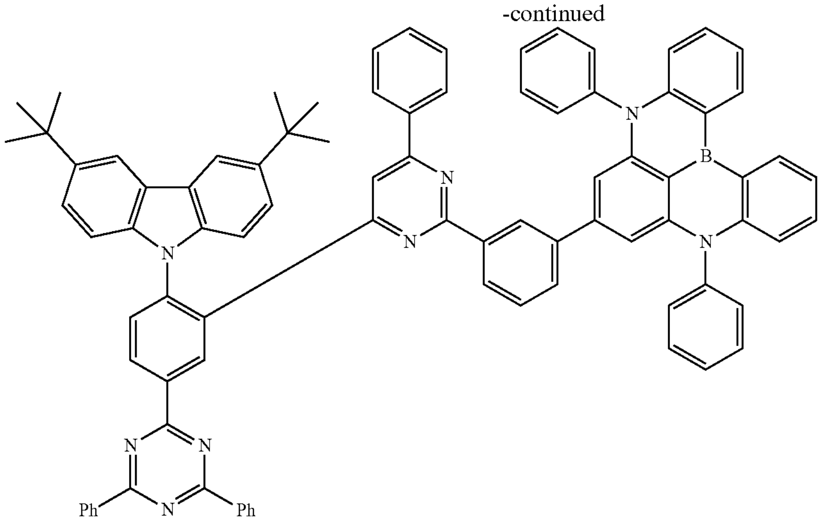
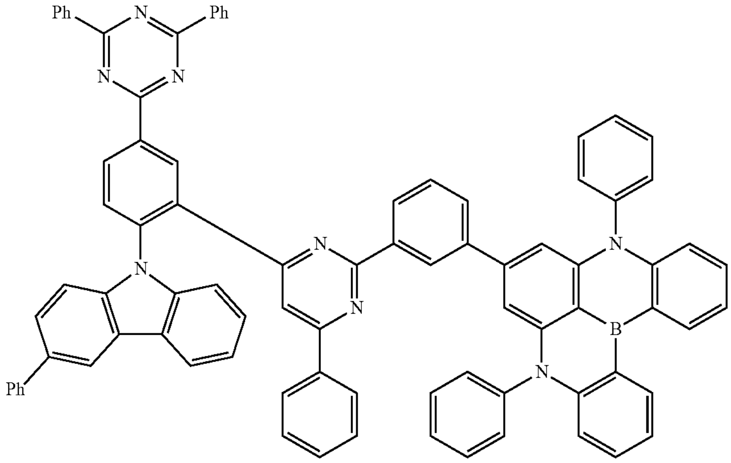
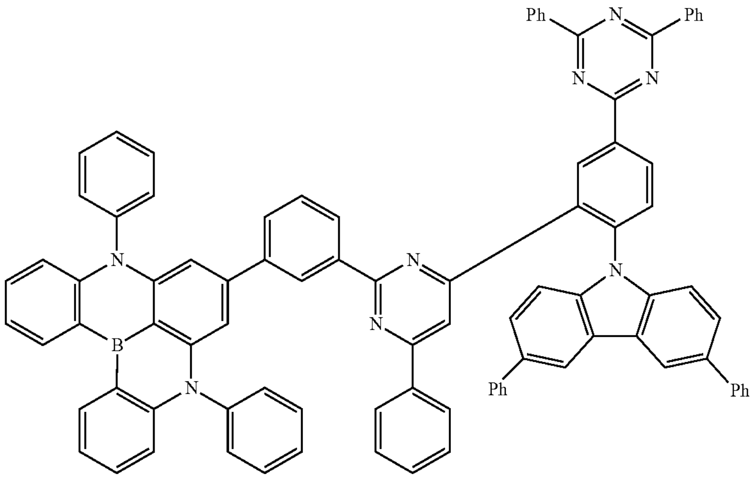

-continued
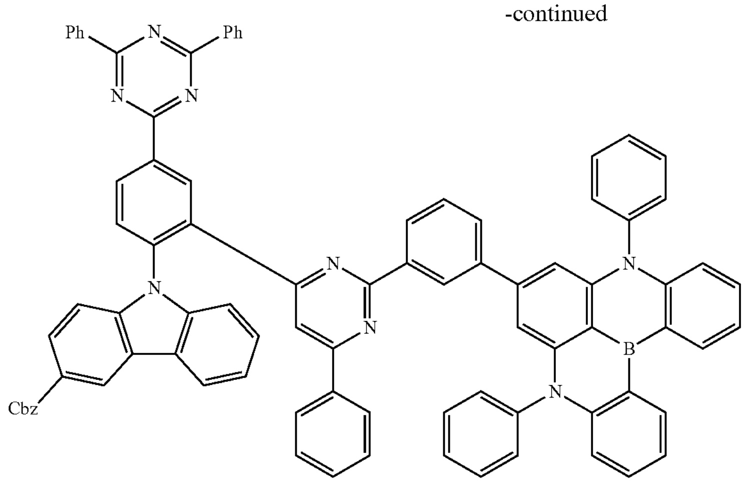
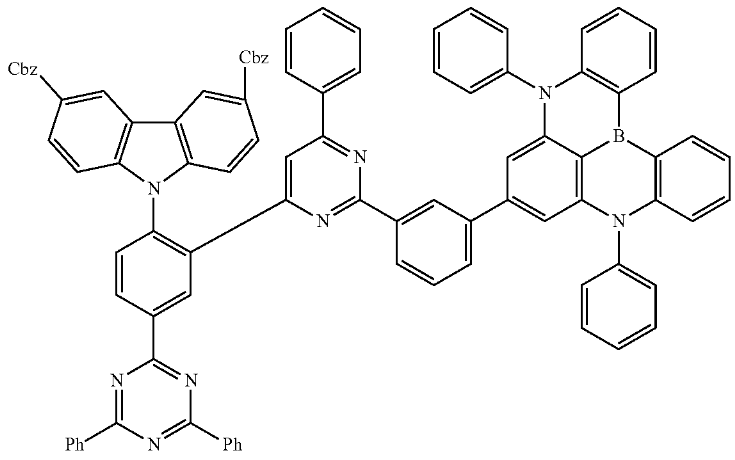
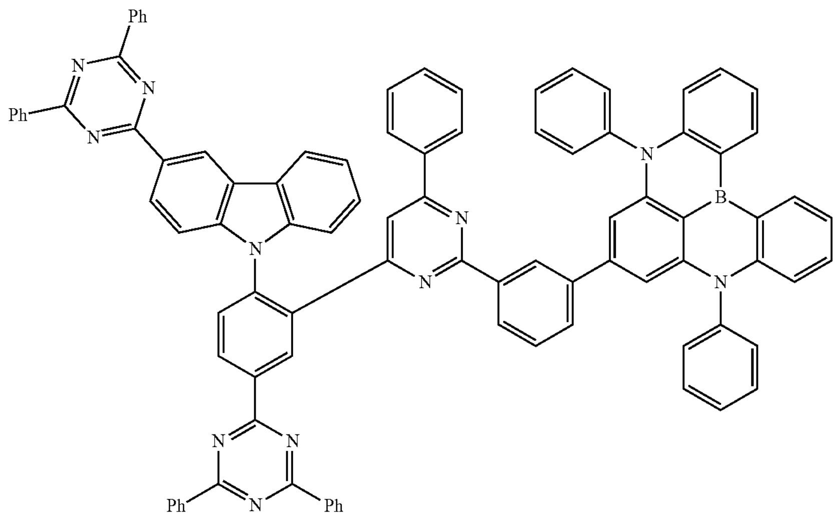

-continued
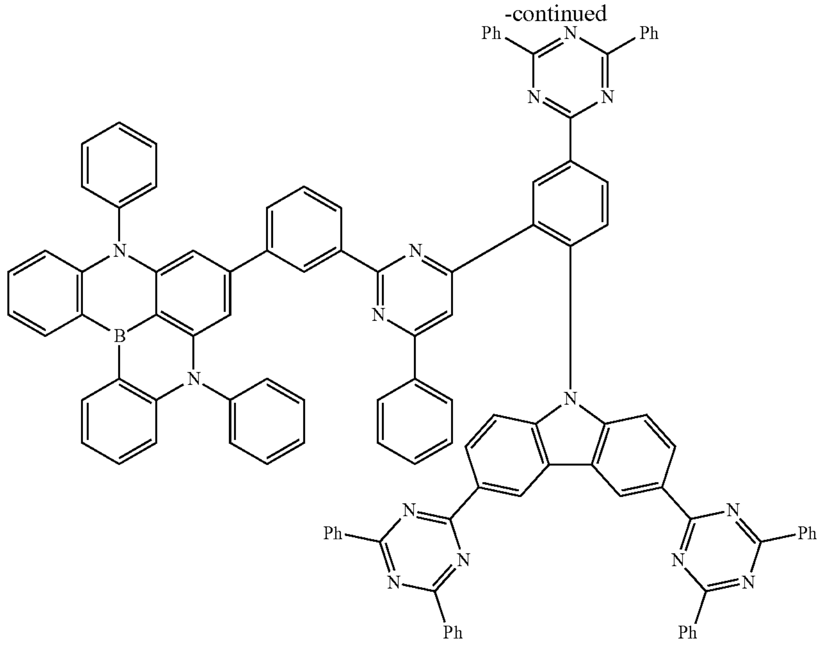
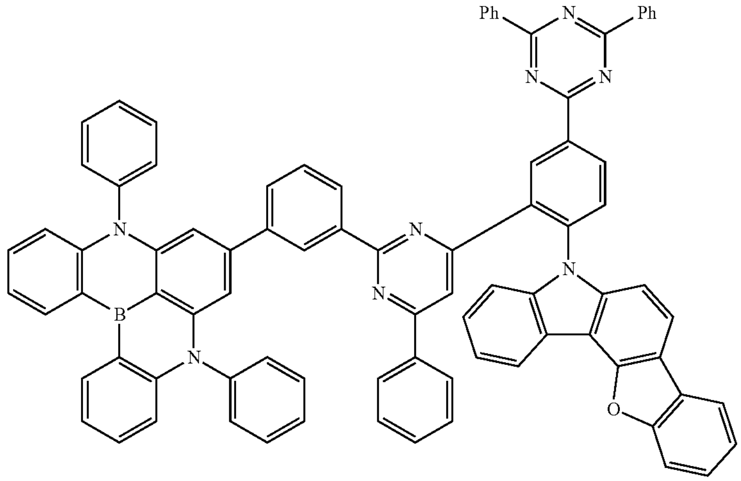
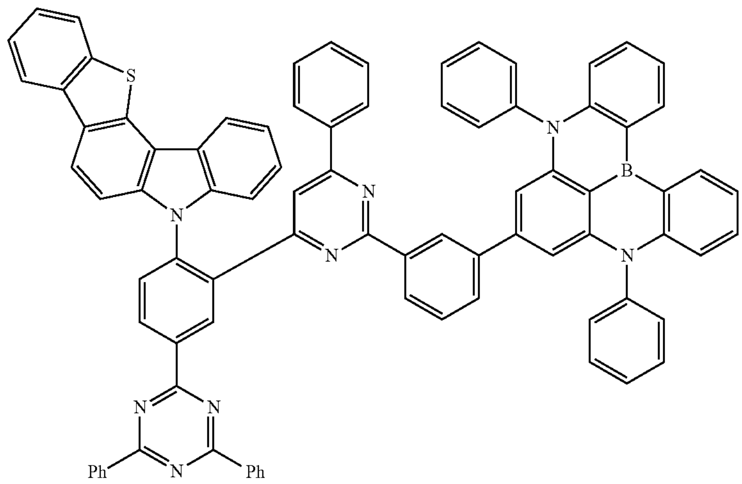

-continued
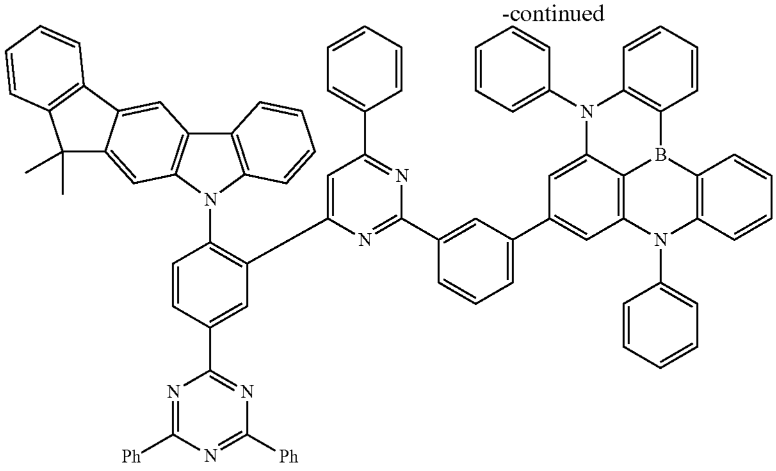
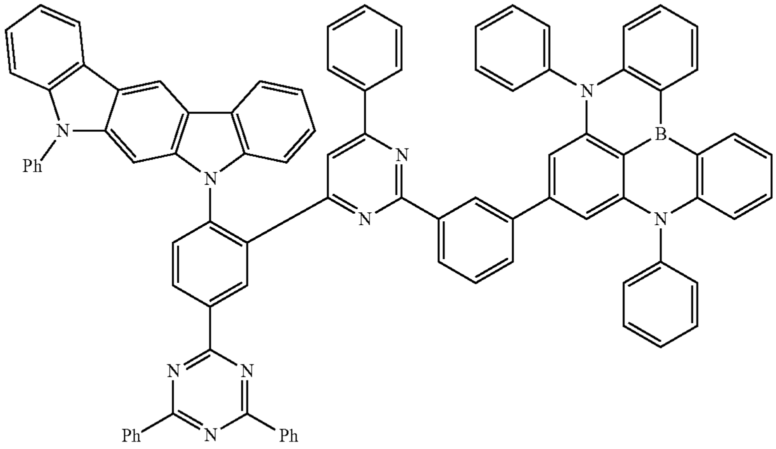
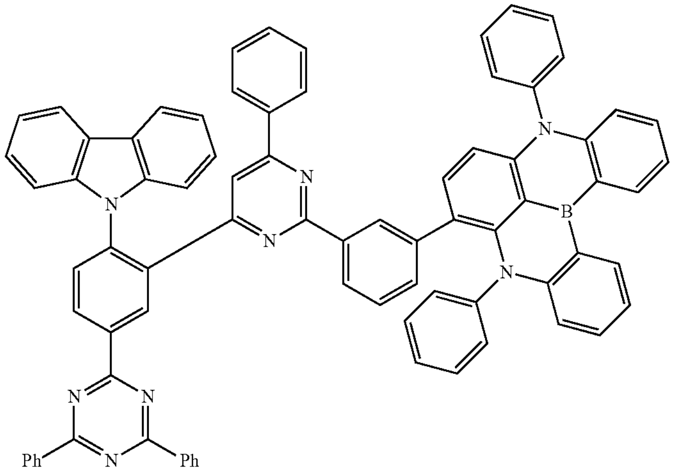

-continued
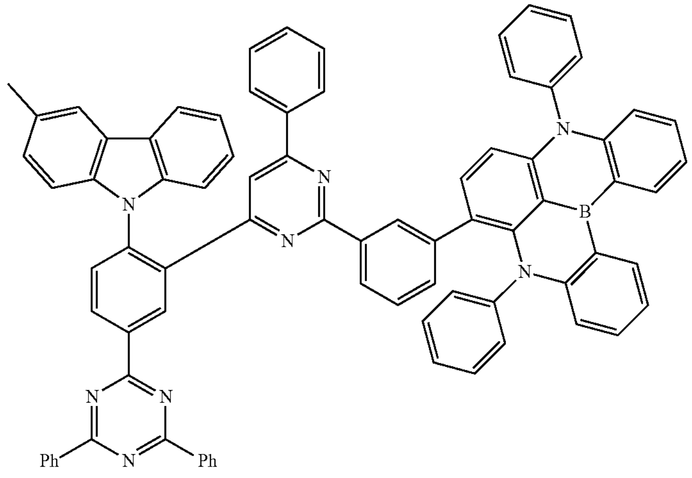
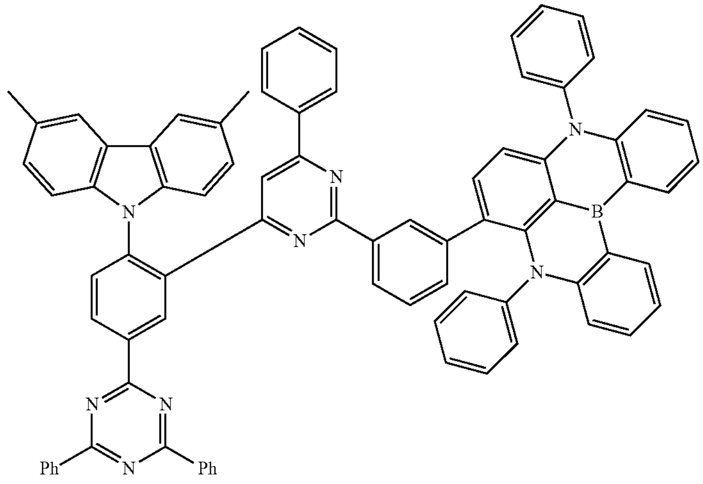
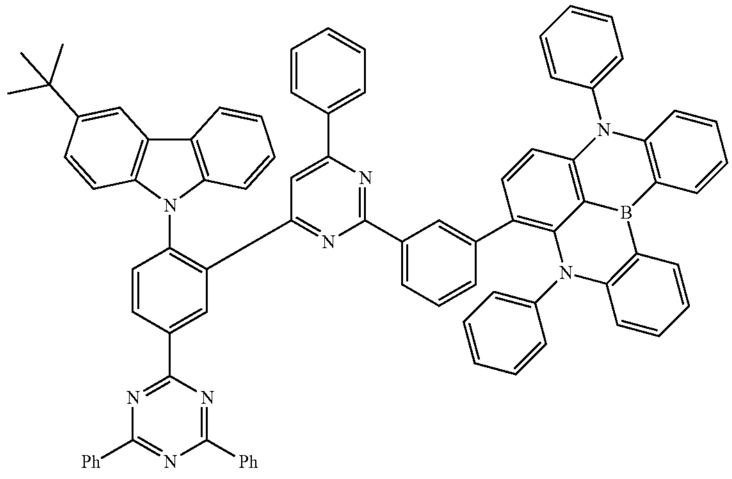

-continued
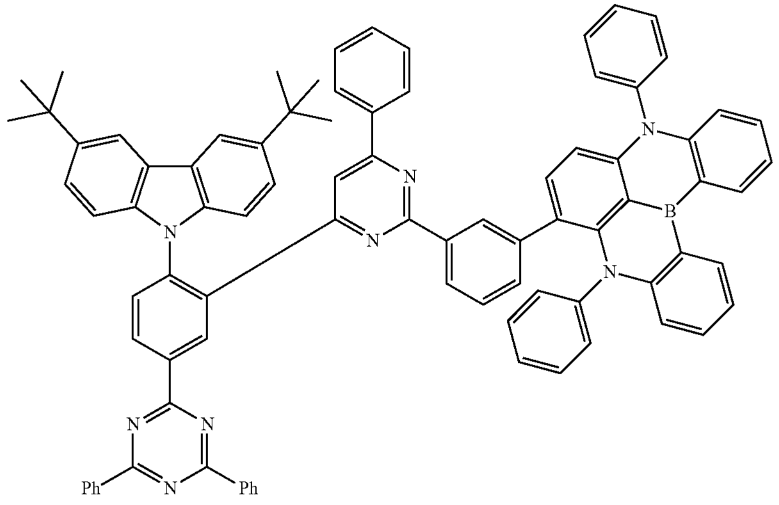
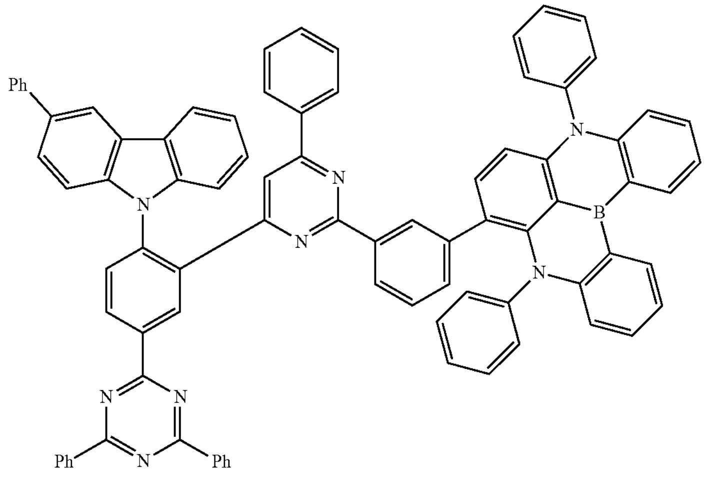
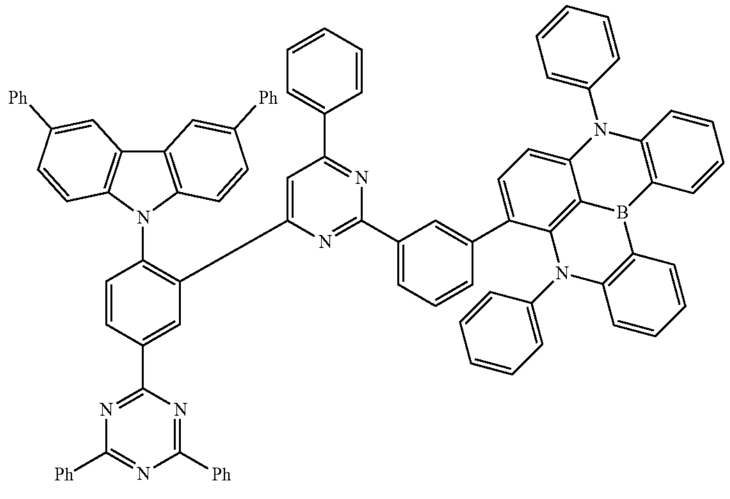

-continued
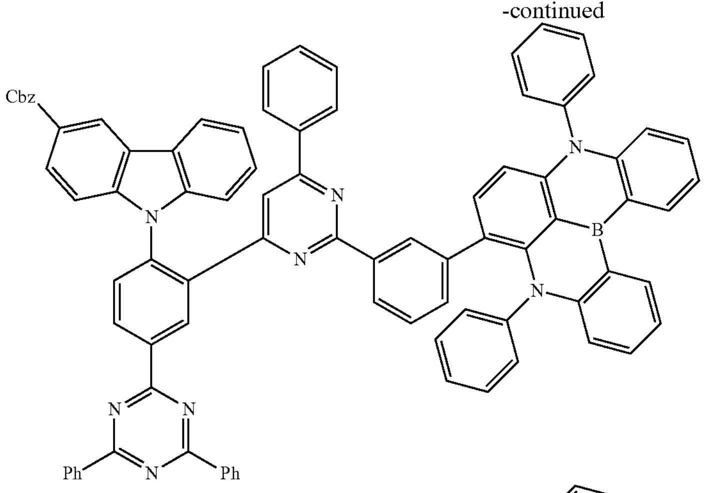
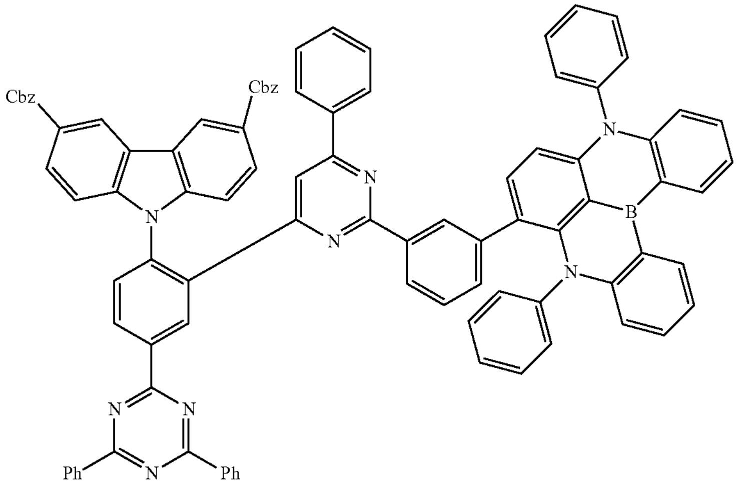
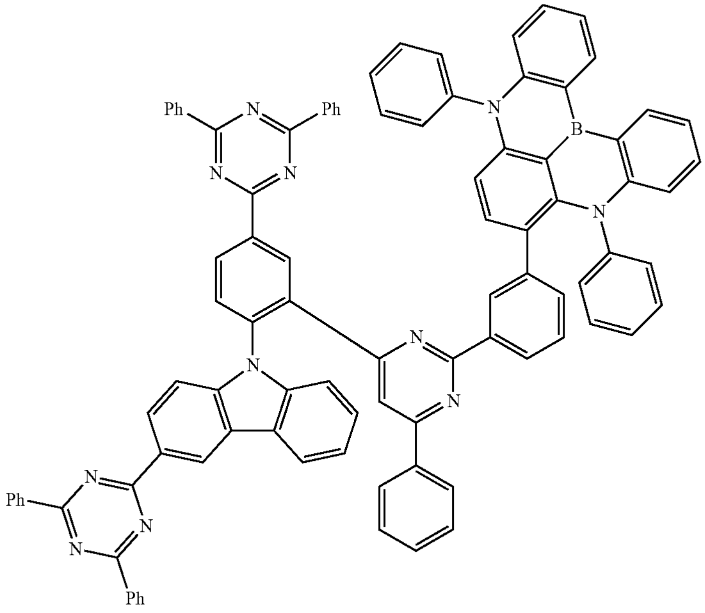

-continued
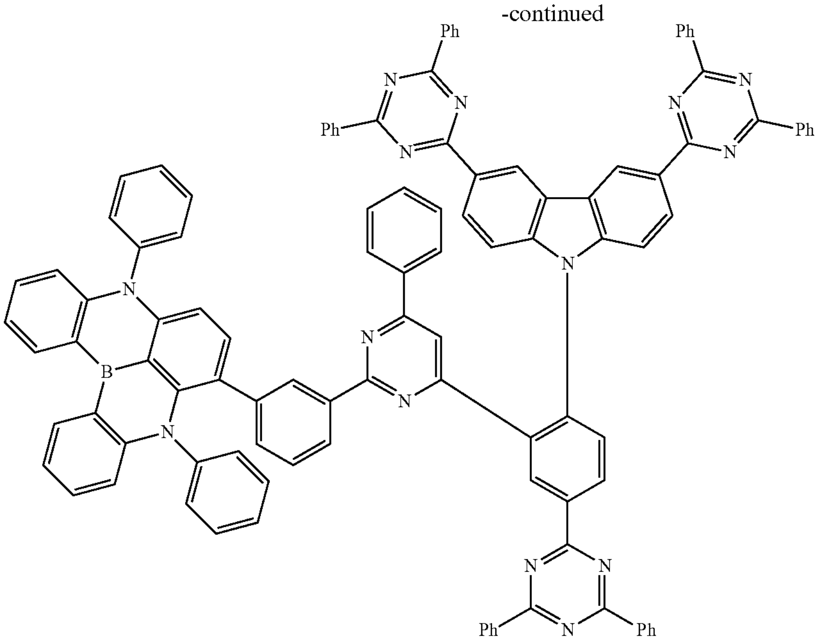
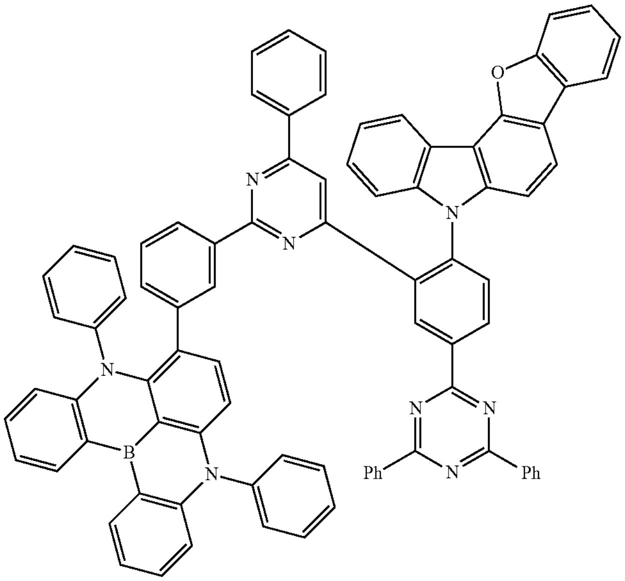

-continued
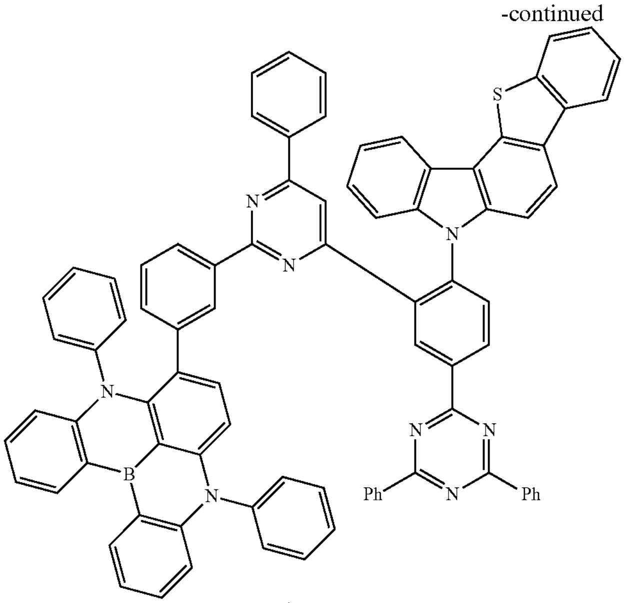
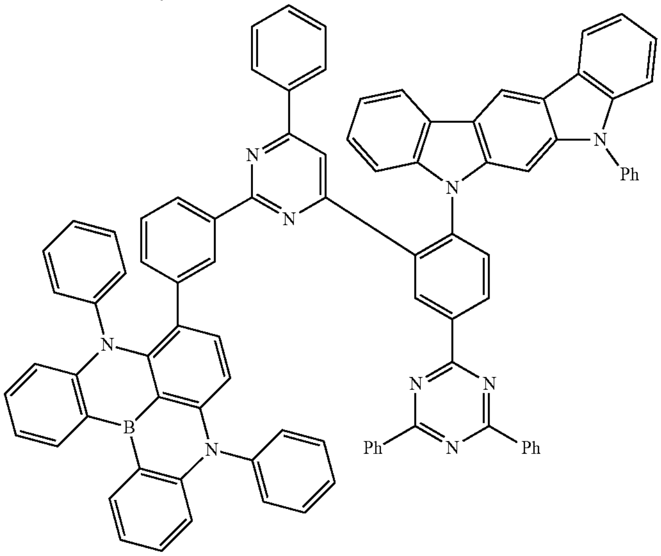
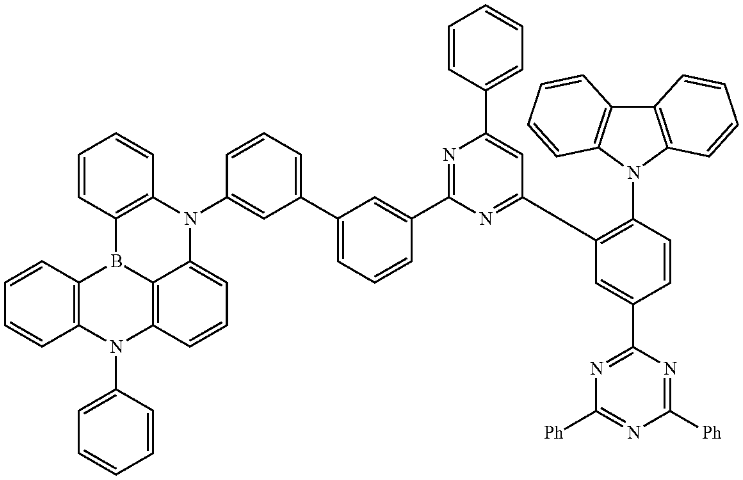

-continued
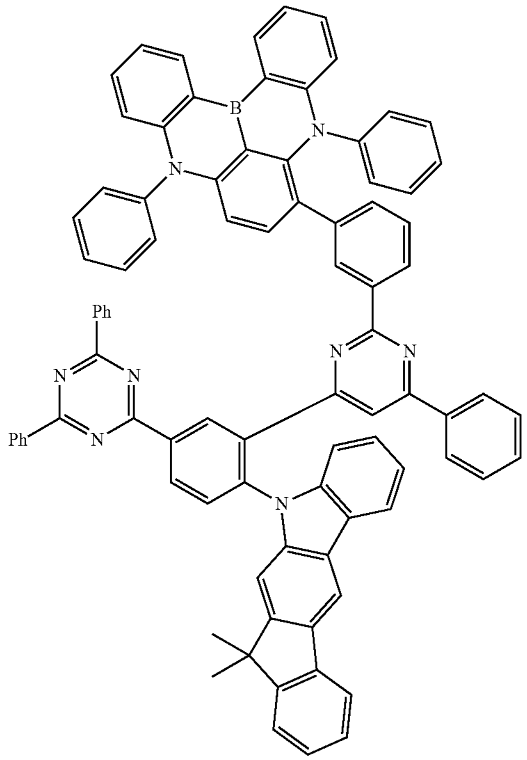
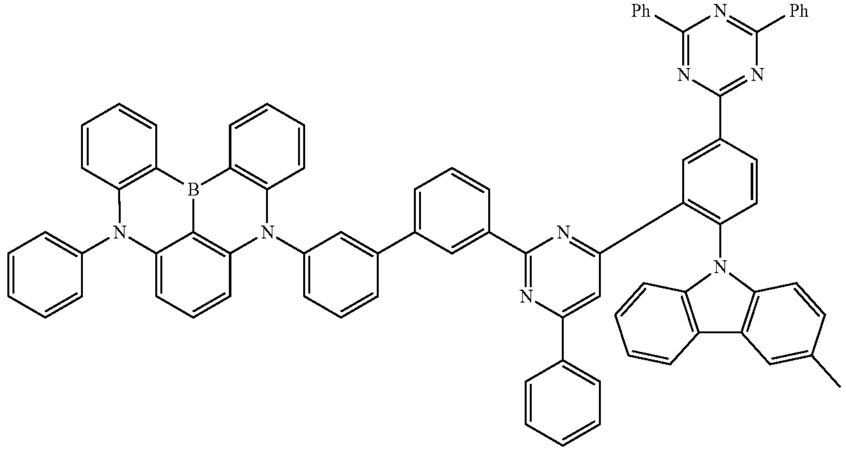
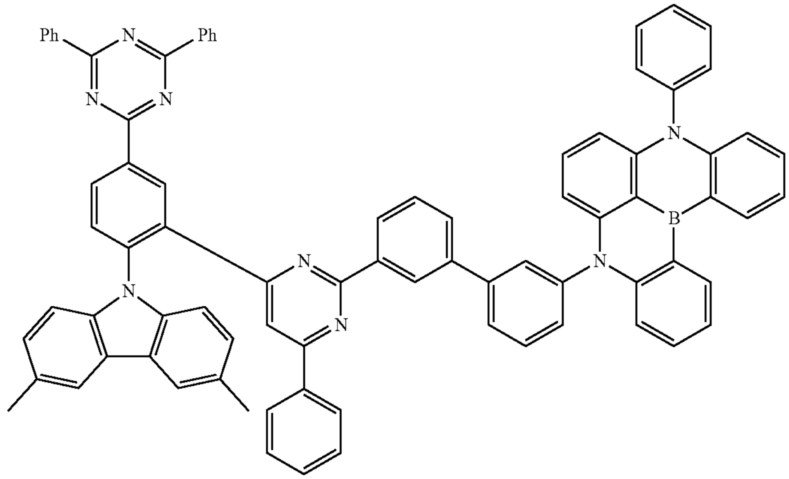

-continued
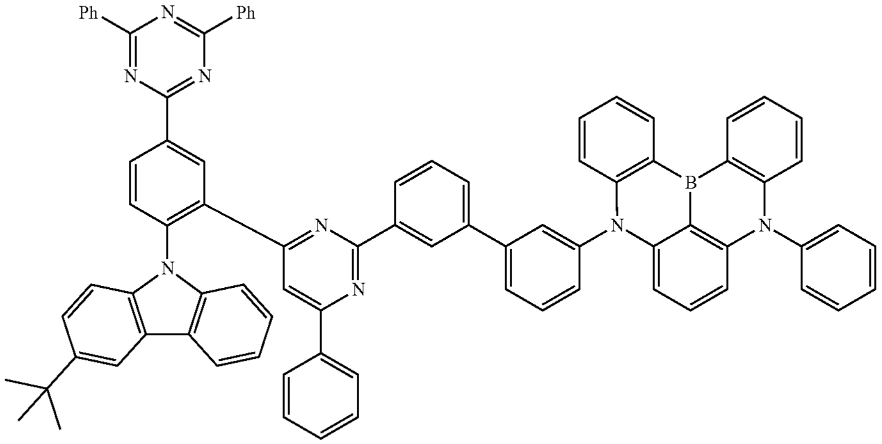
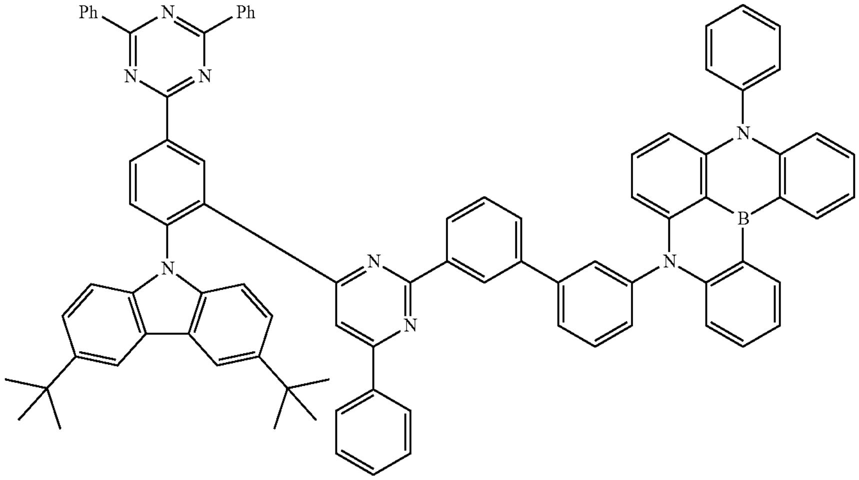
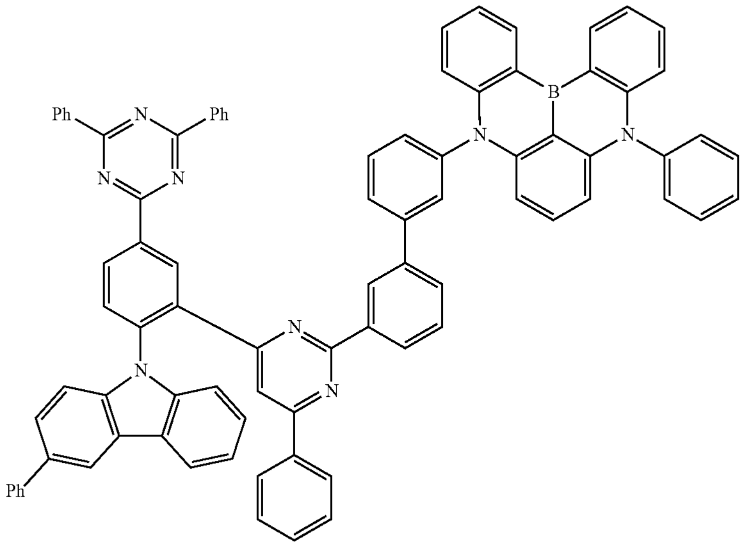

-continued
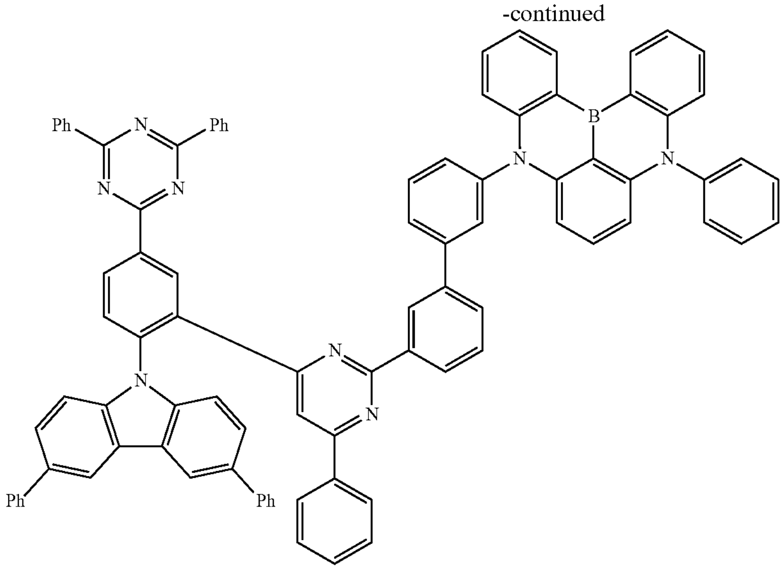
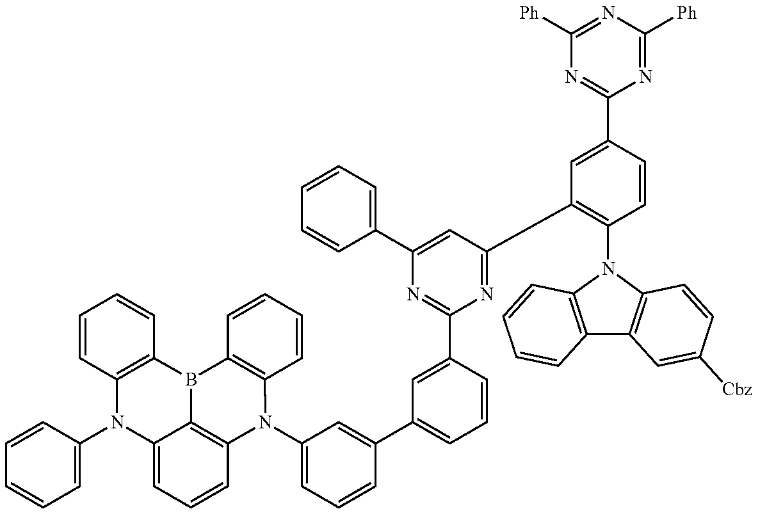
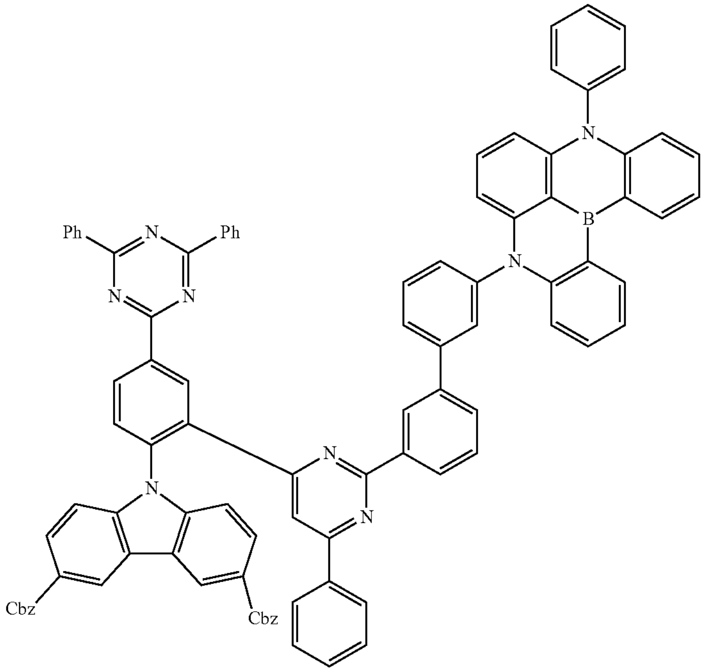

-continued
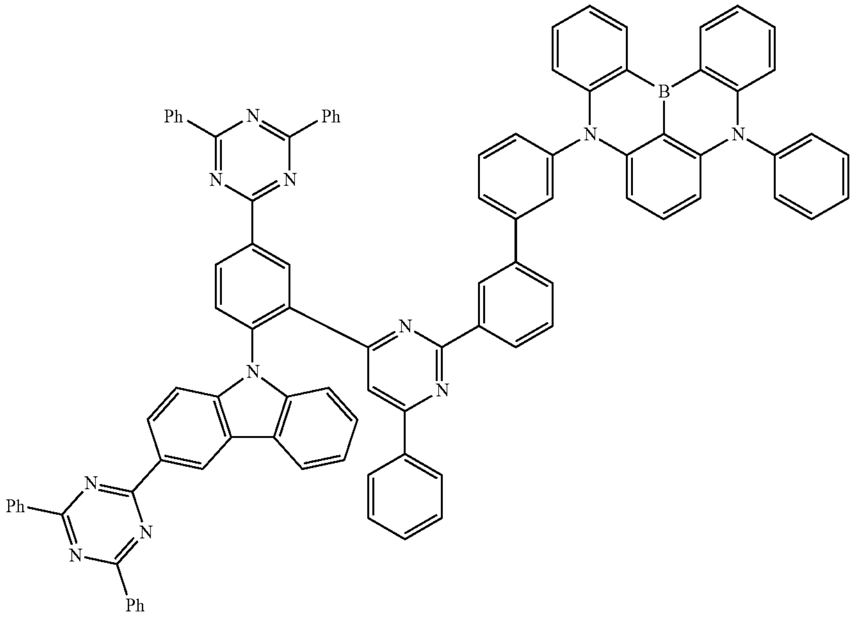
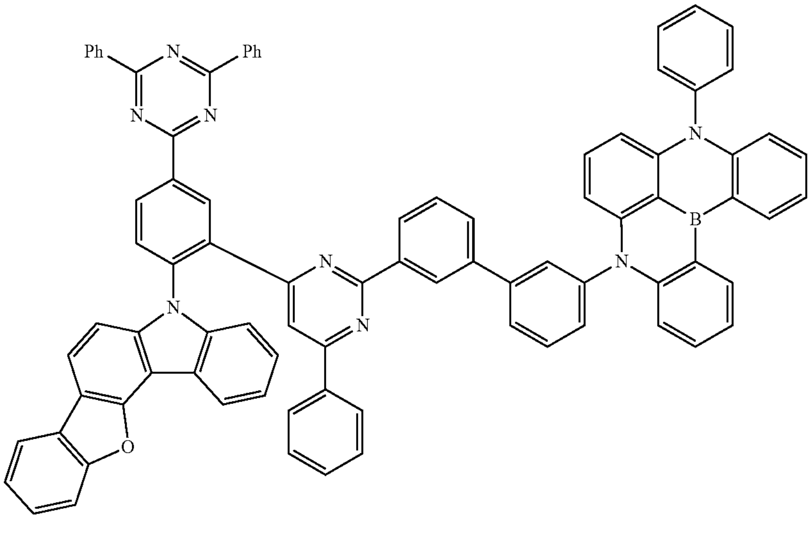

-continued
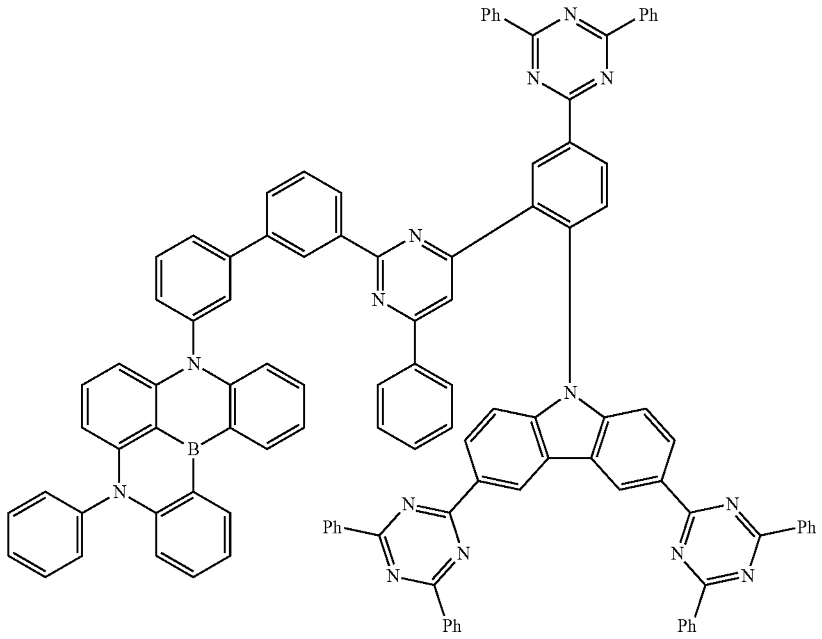
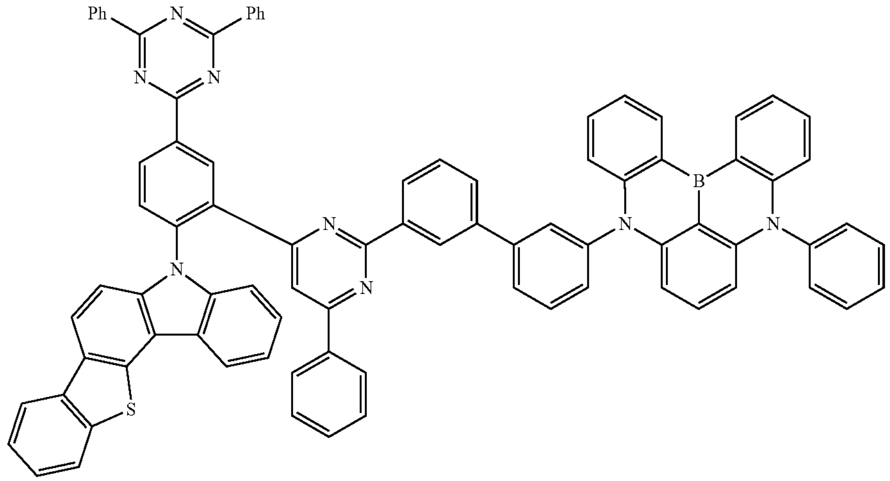
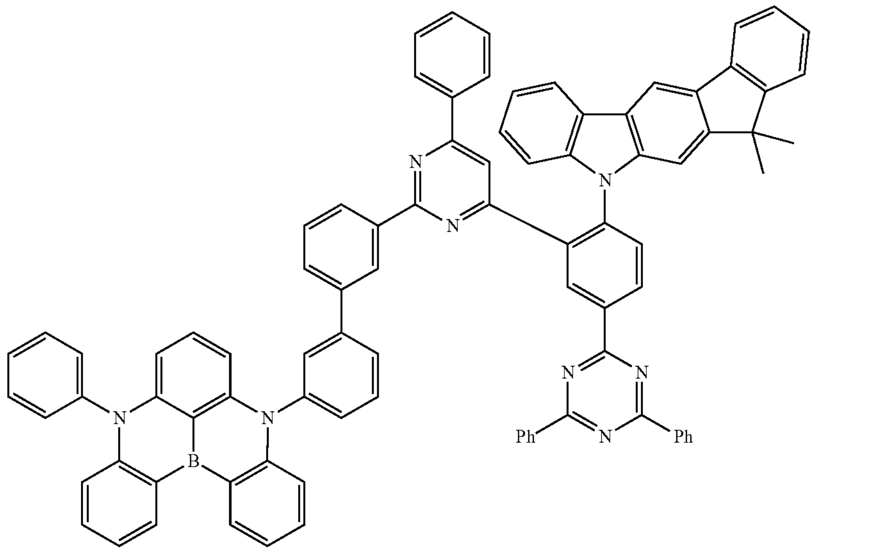

-continued
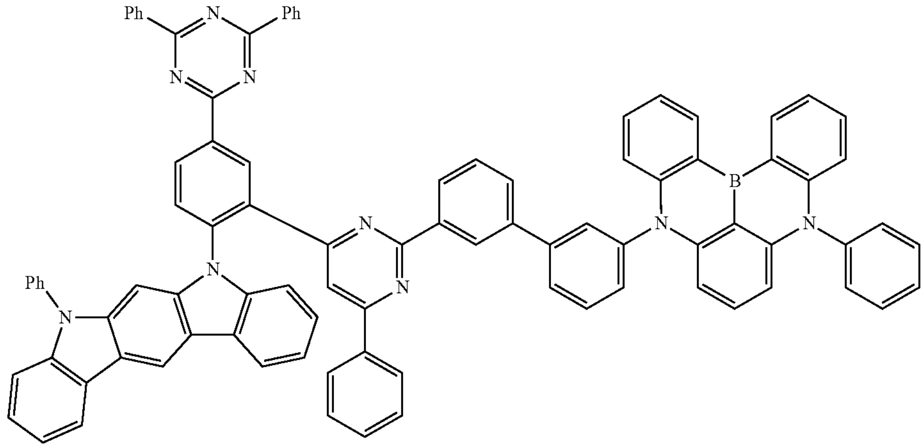
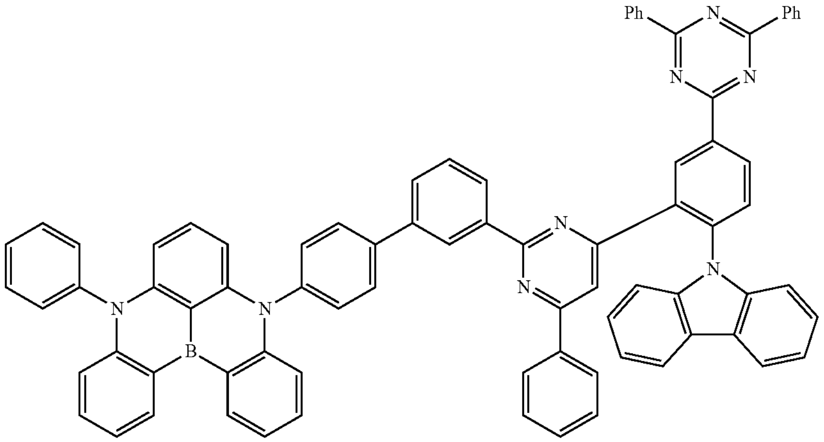
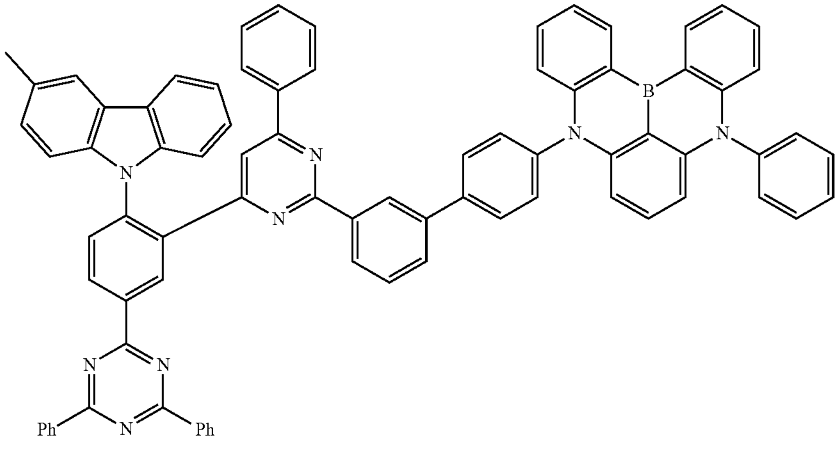

-continued
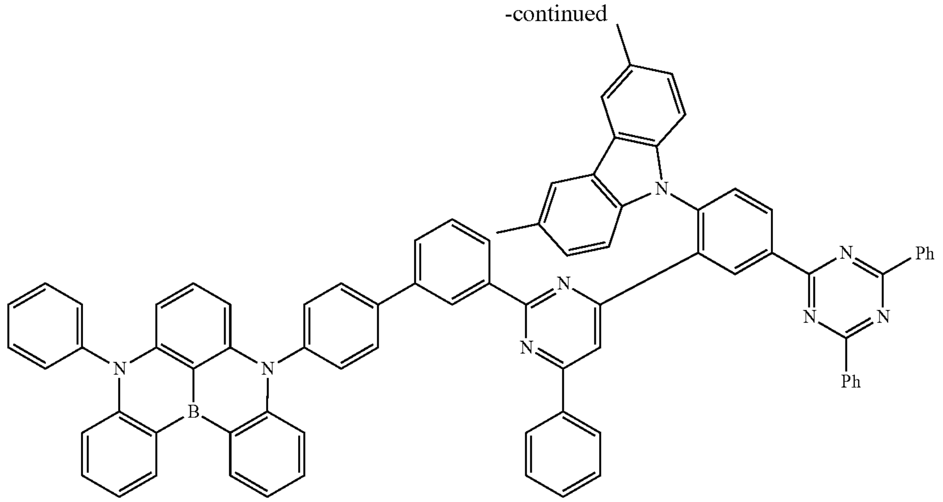
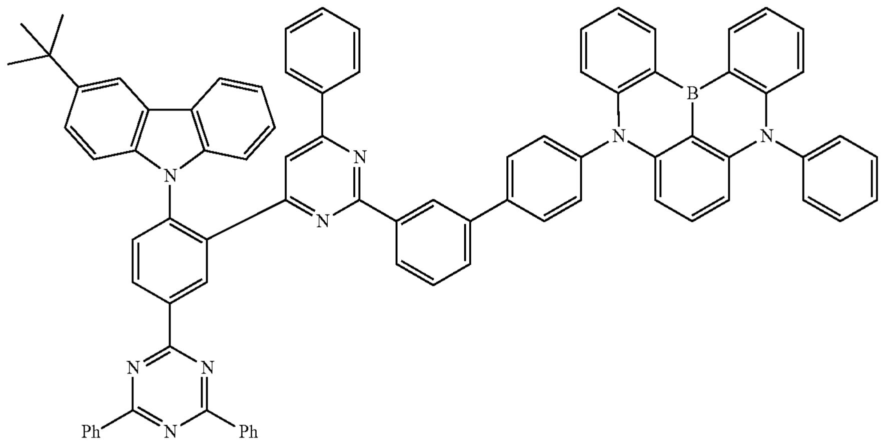
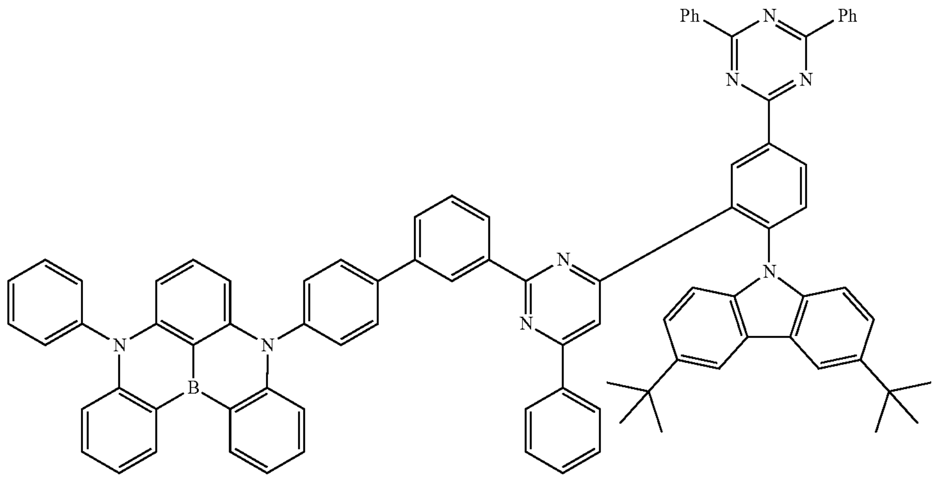

-continued
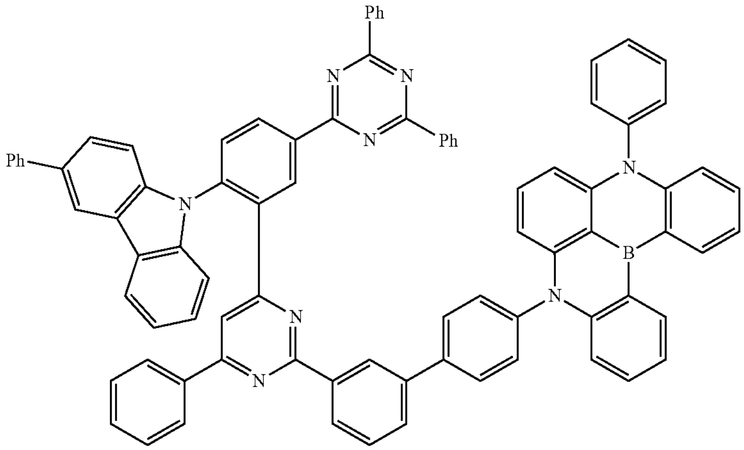
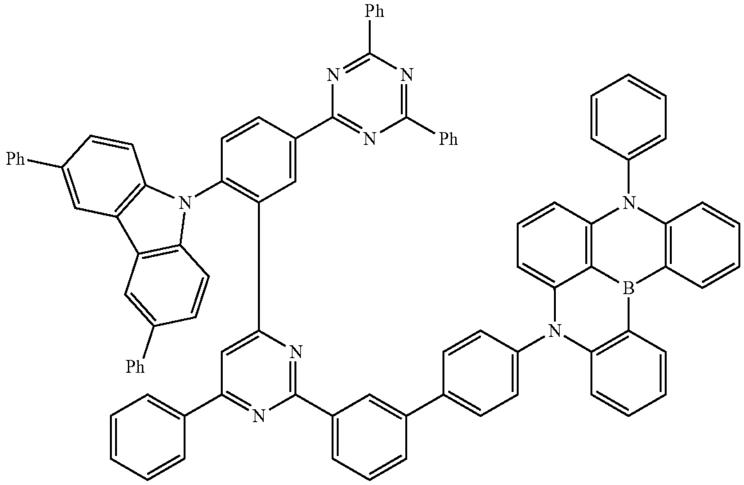
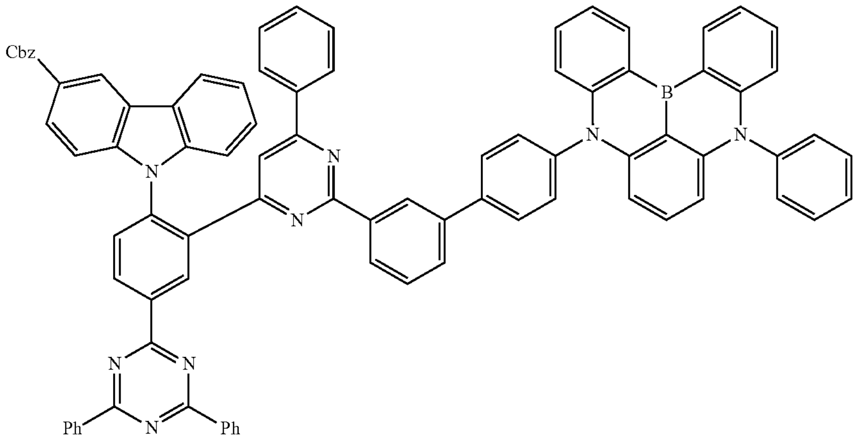

-continued
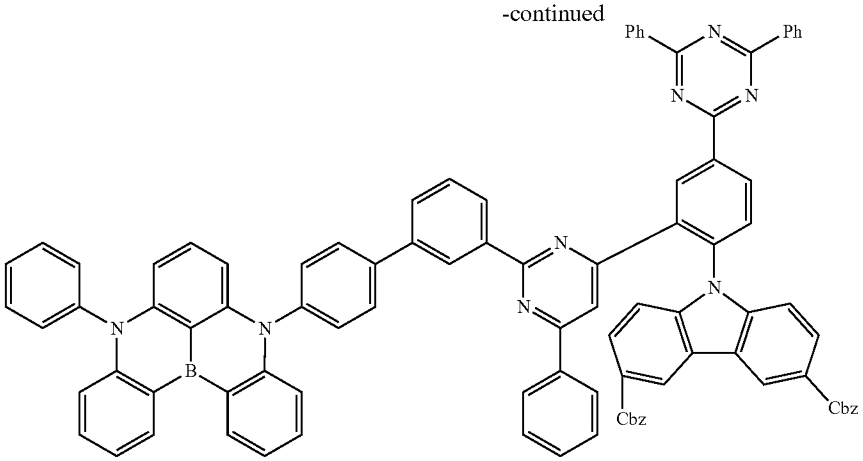
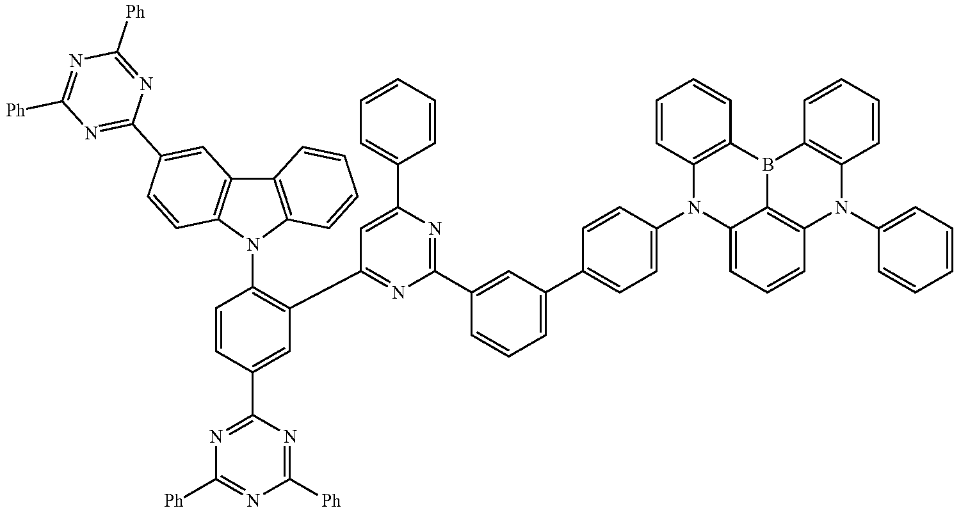
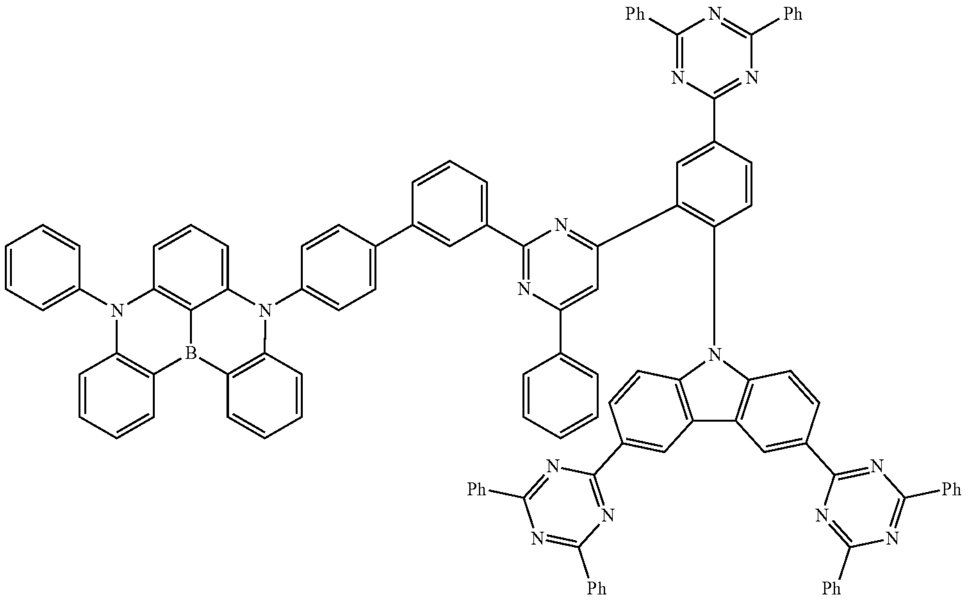

-continued
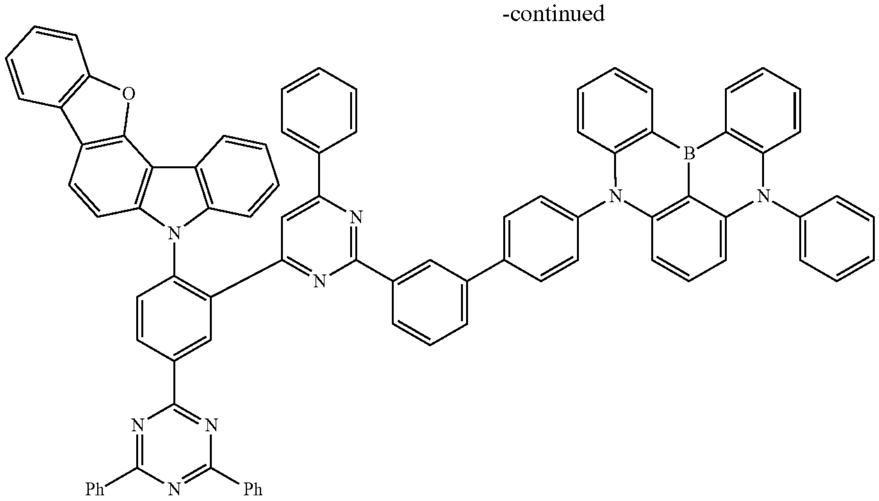
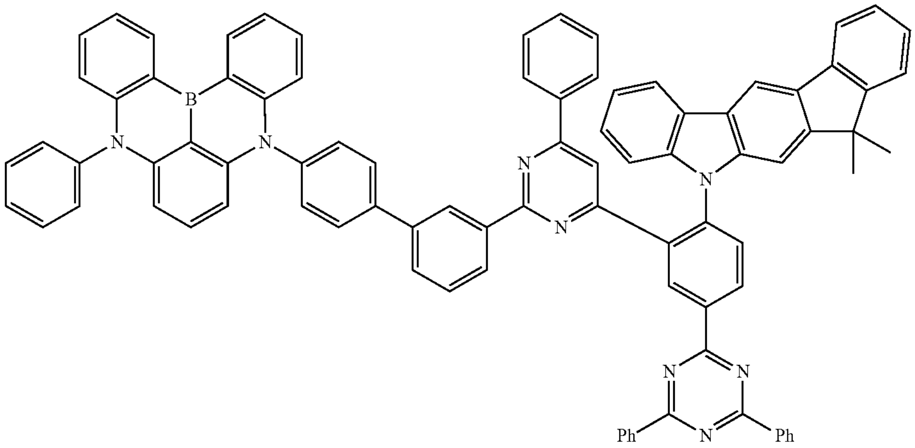
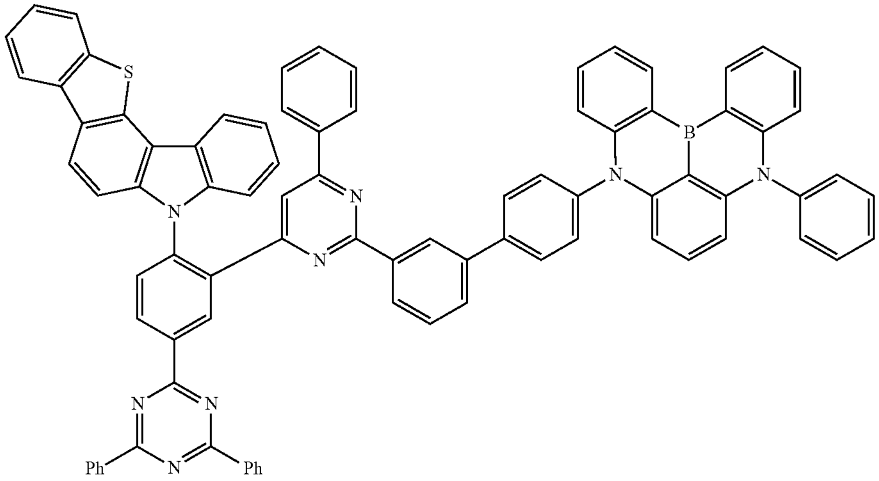

-continued
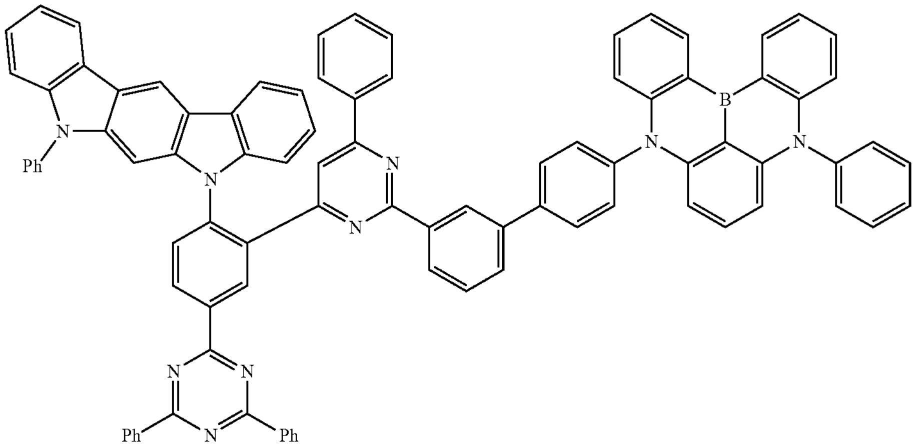
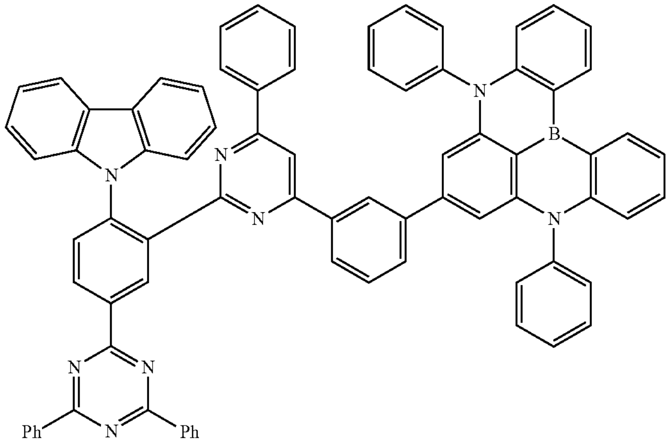
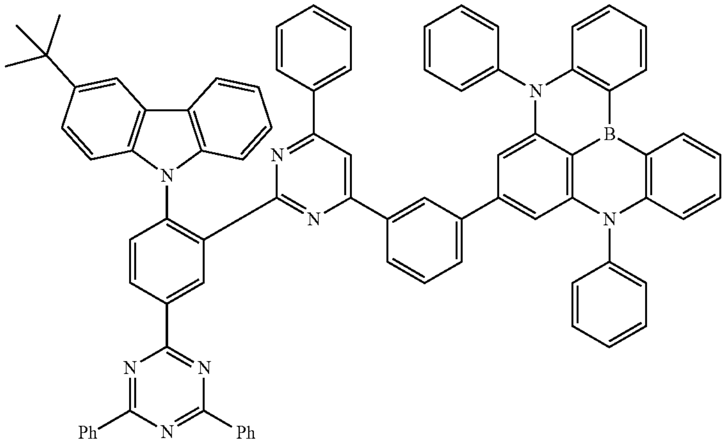

-continued
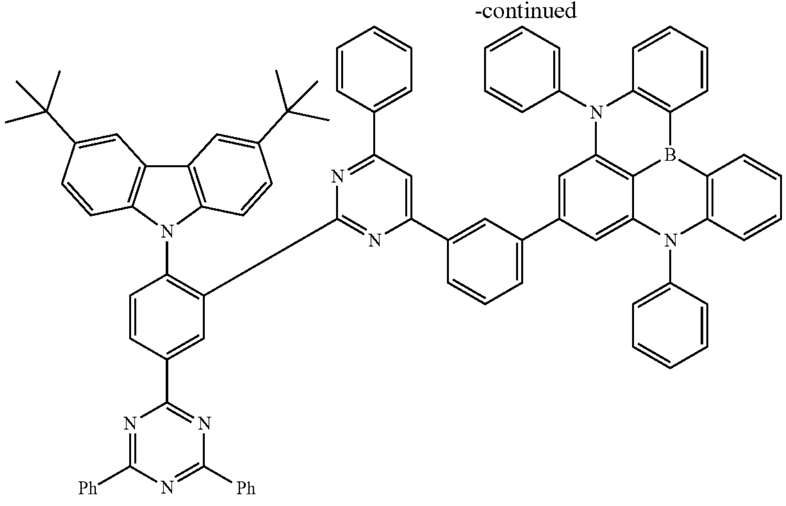
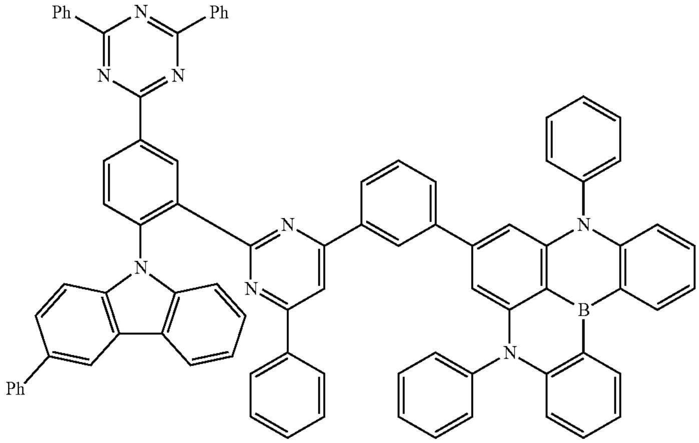
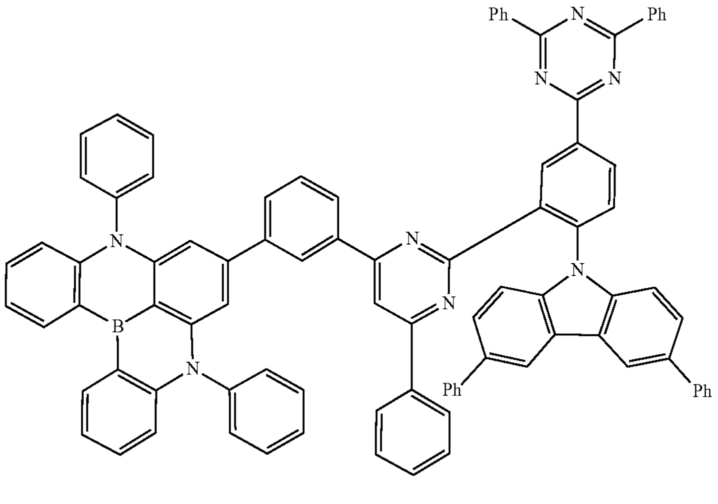

-continued
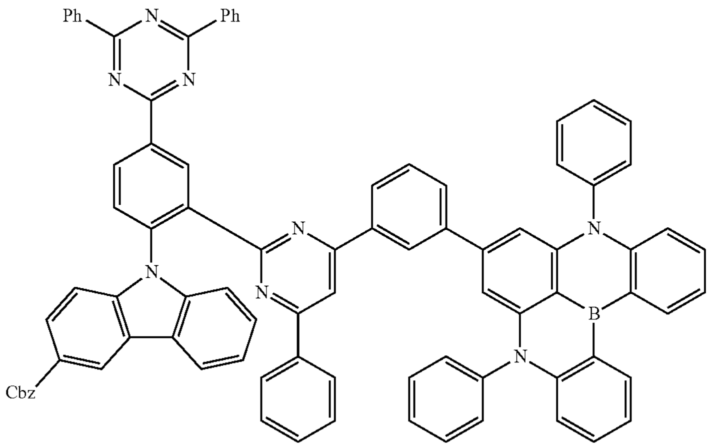
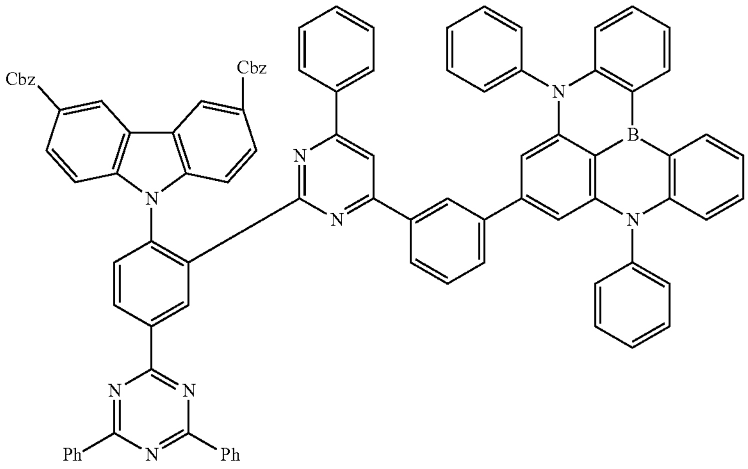
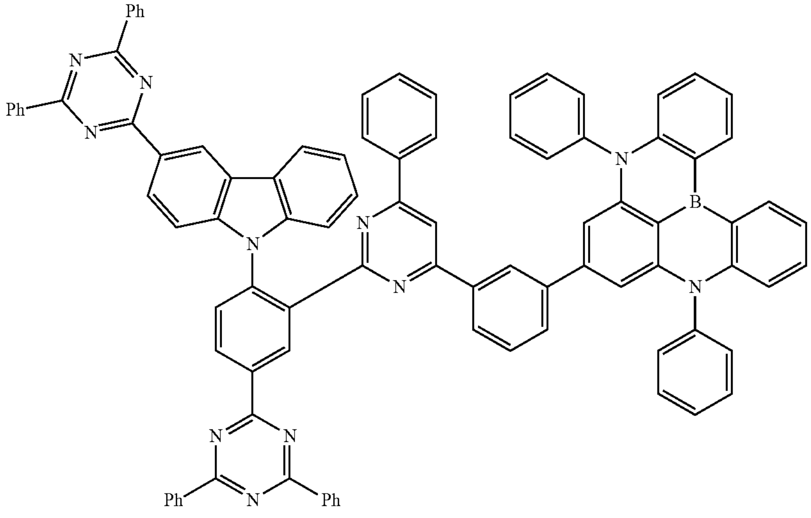

-continued
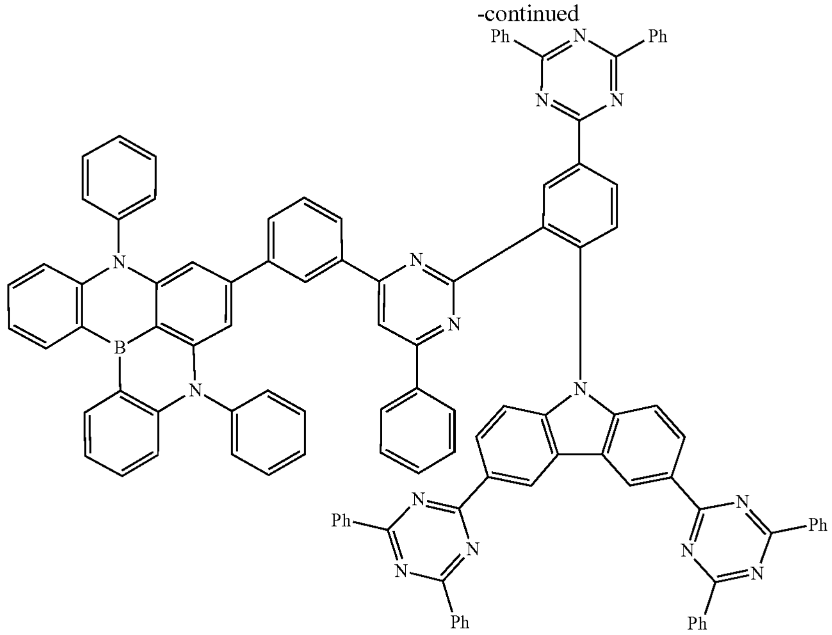
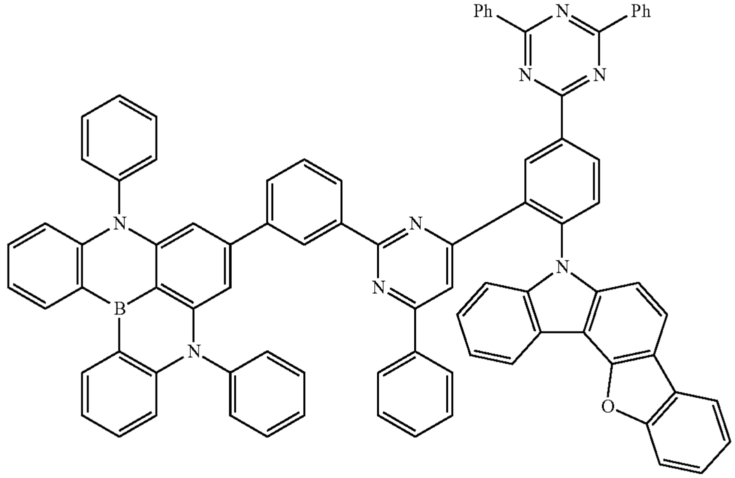
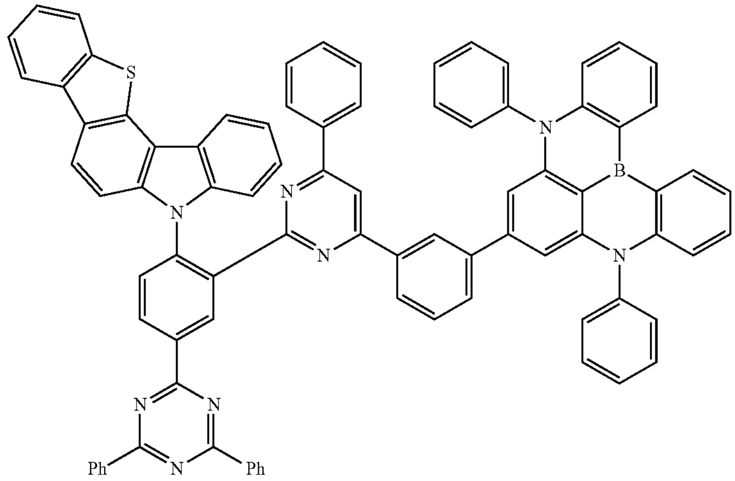

-continued
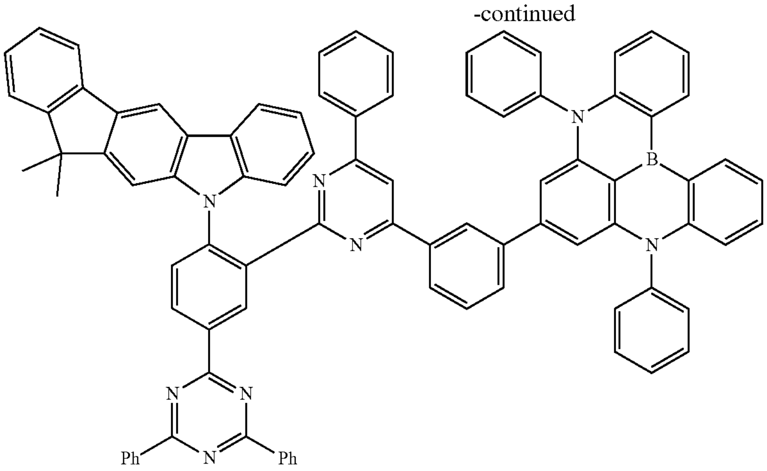
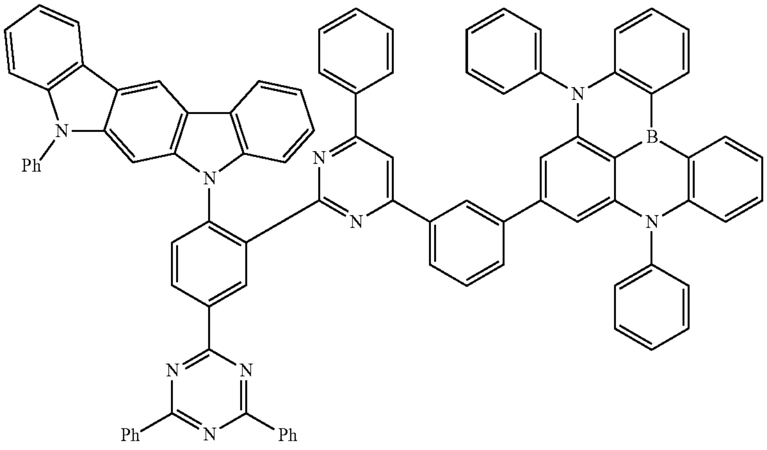
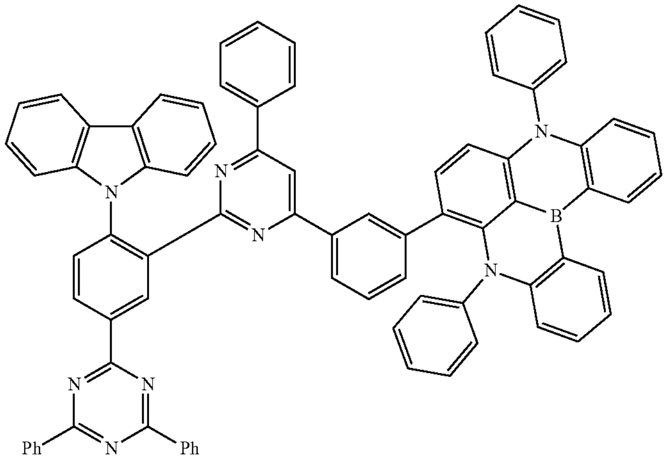

-continued
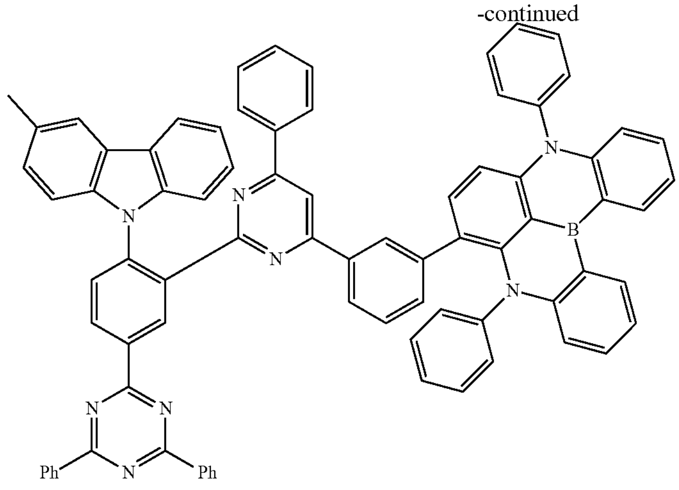
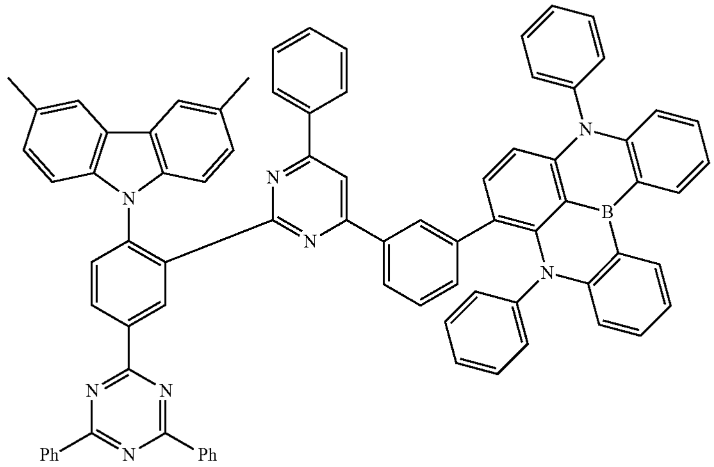
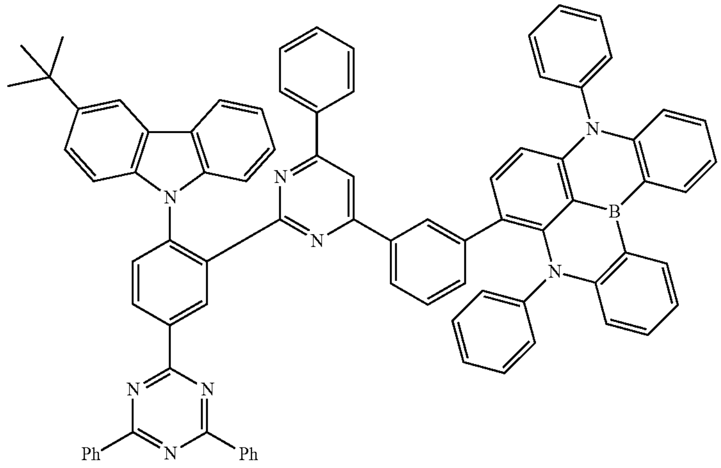

-continued
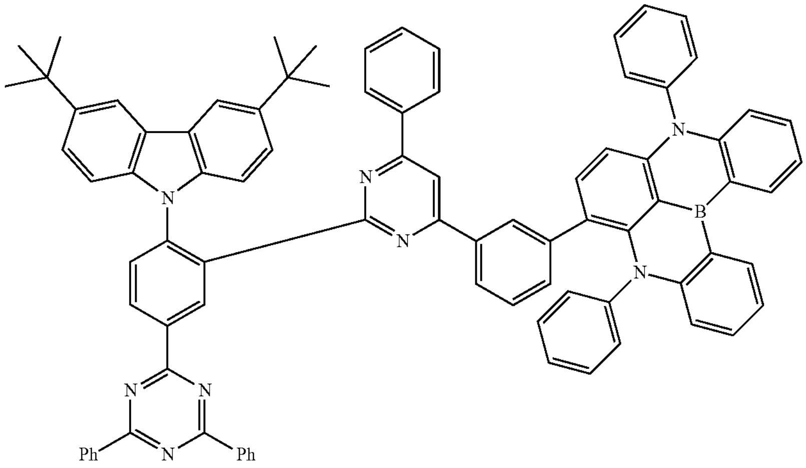
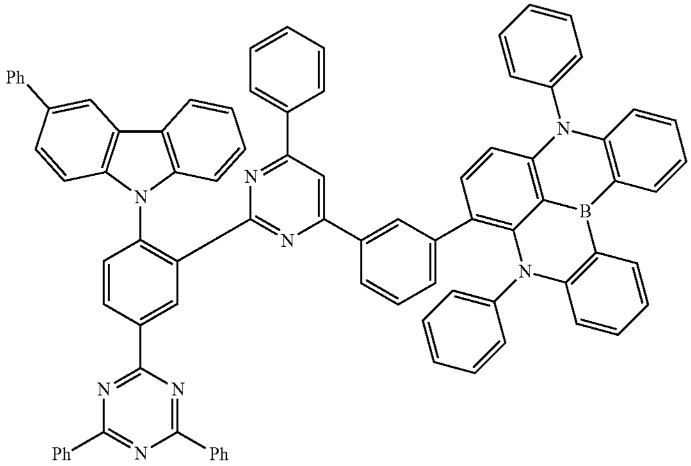
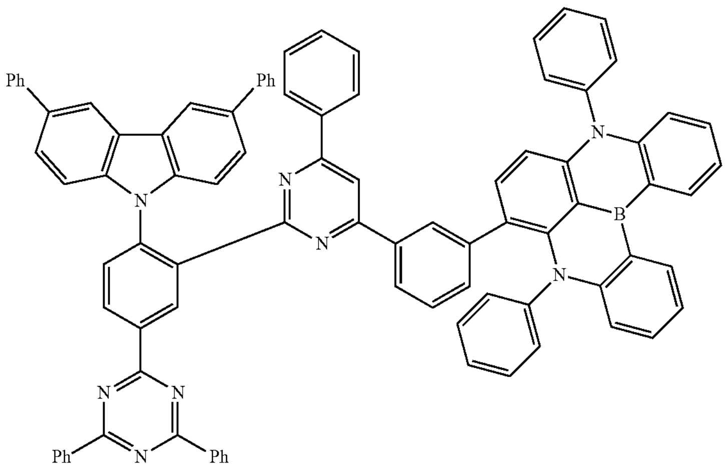

-continued
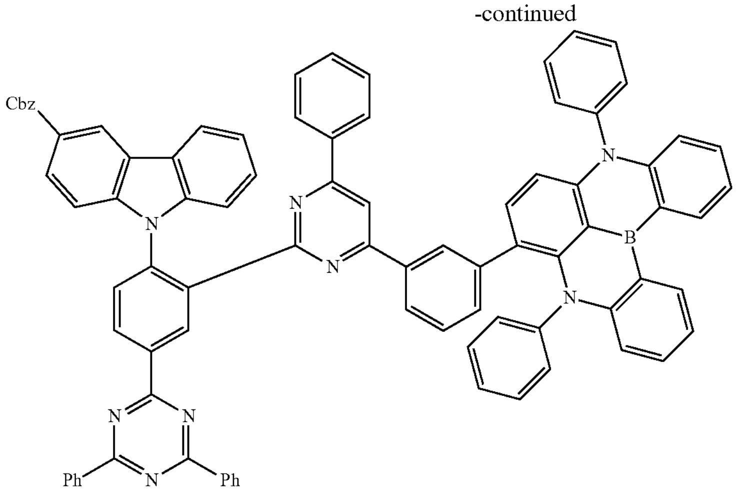
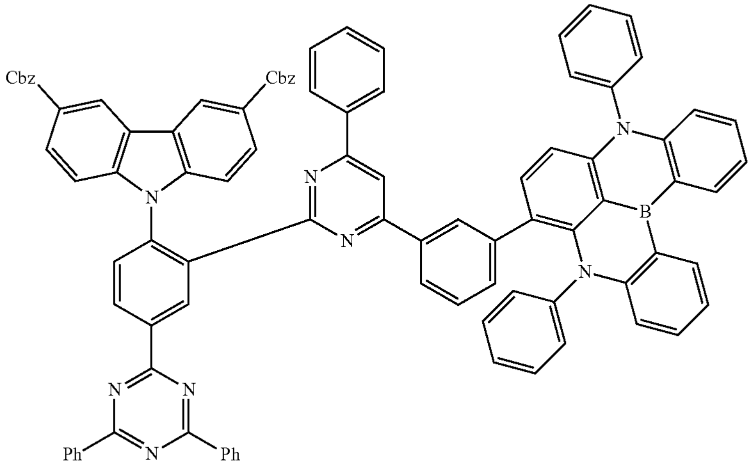
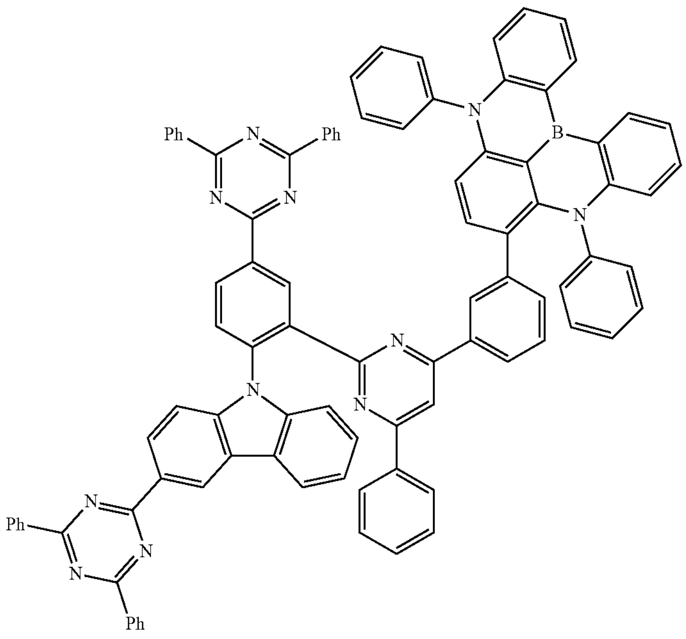

-continued
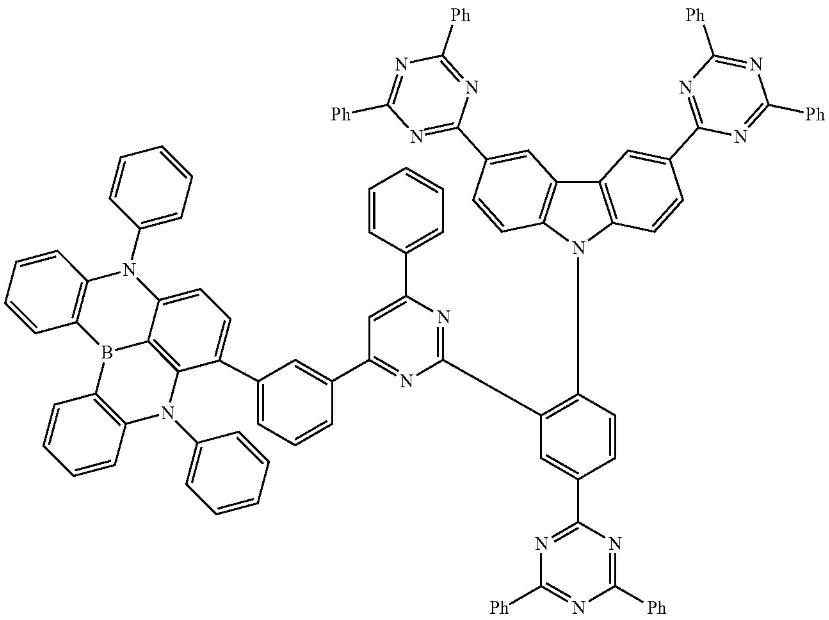
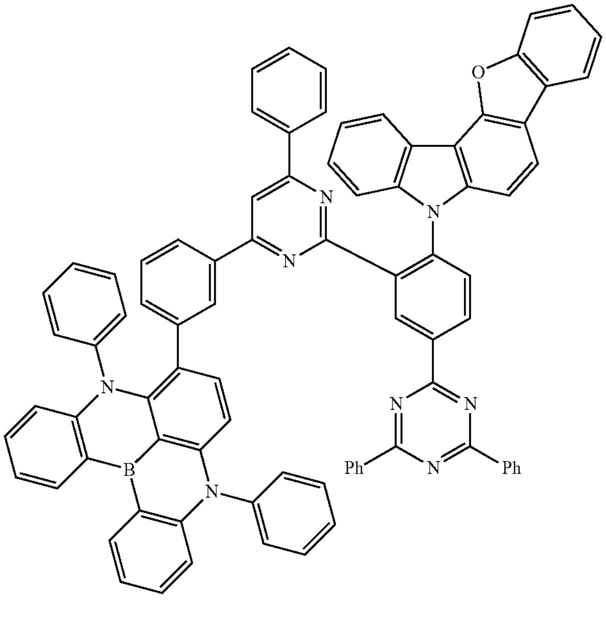

-continued
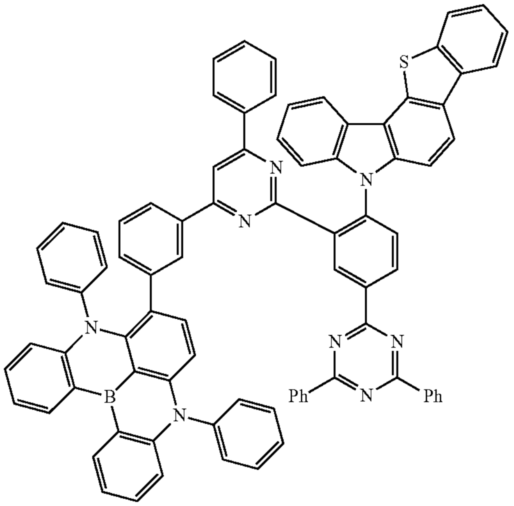
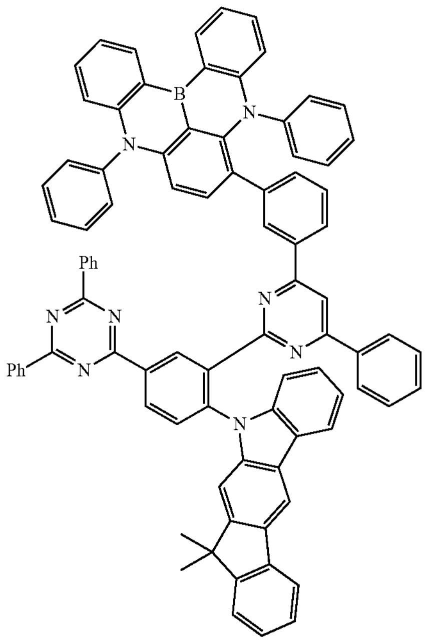
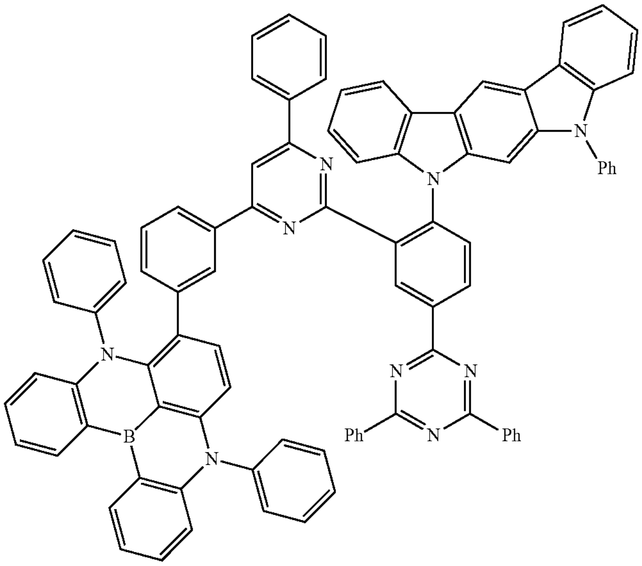
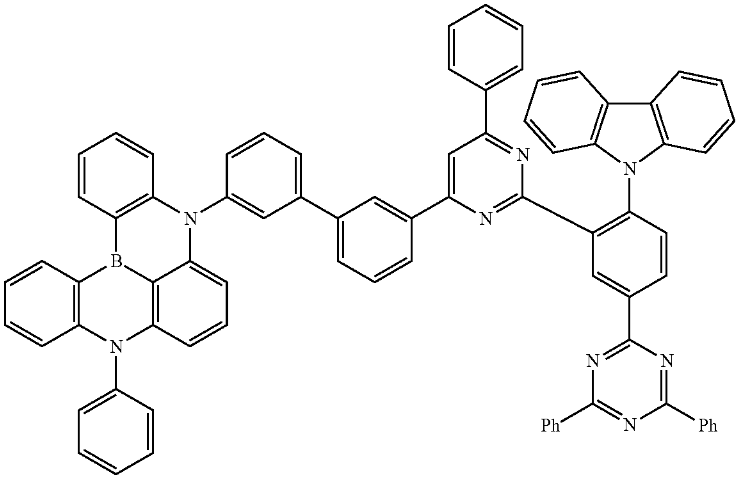

-continued
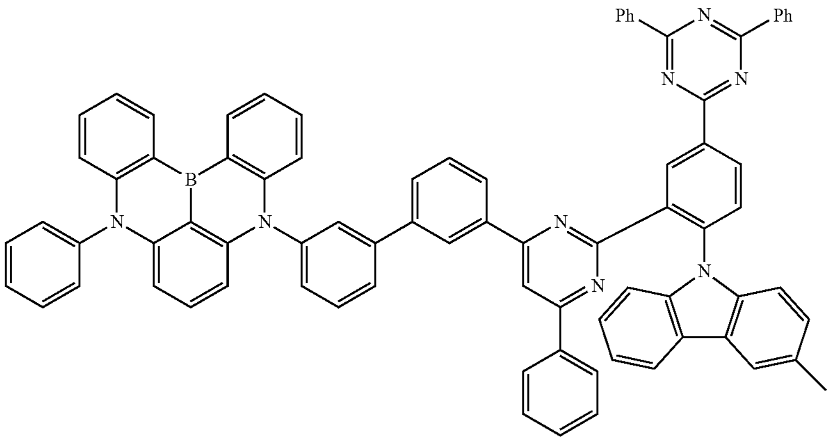
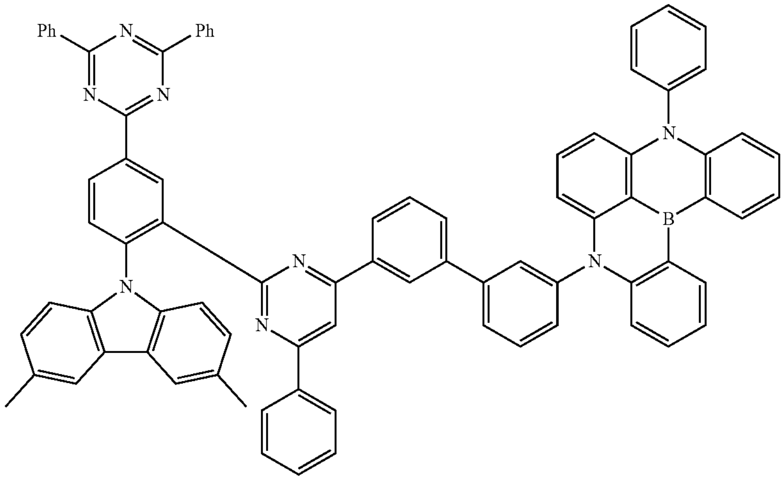
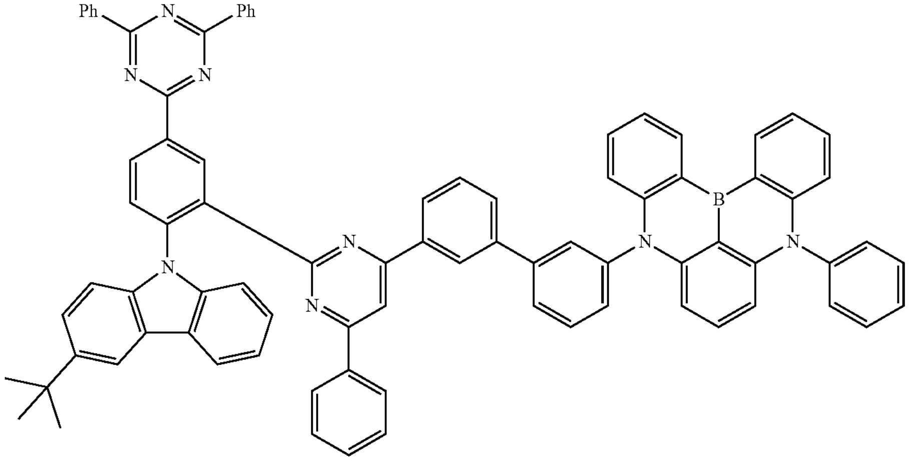

-continued
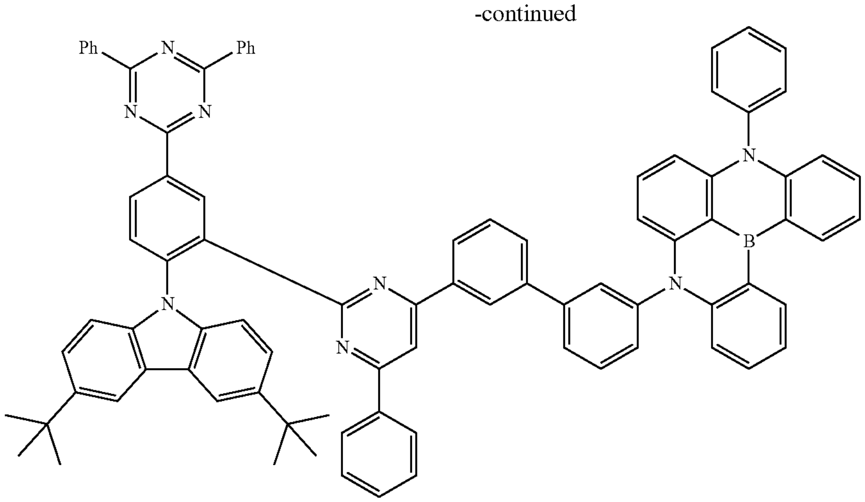
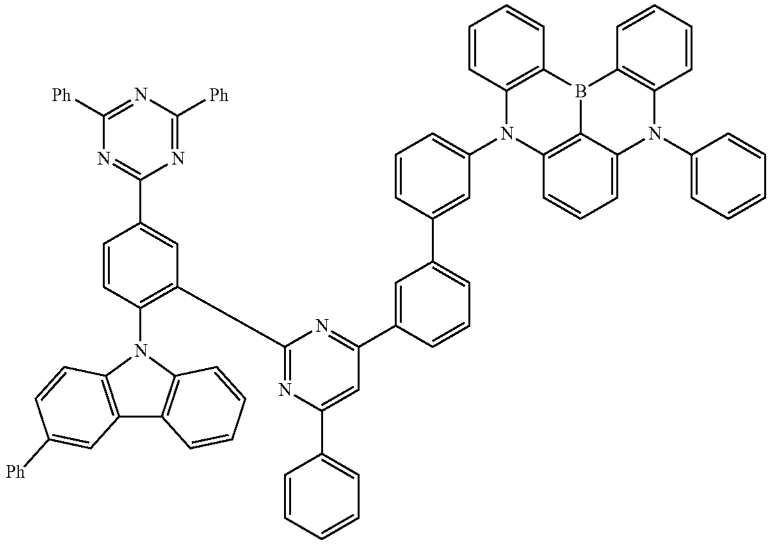
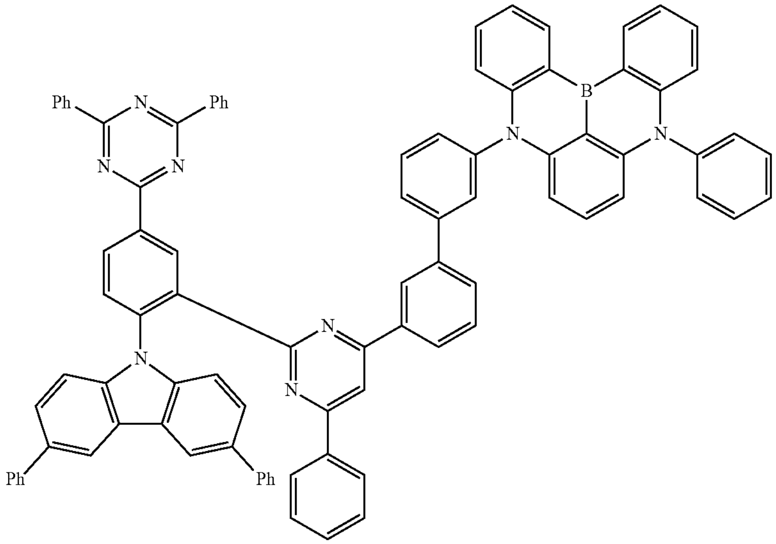 [SMILES: c1ccc(-c2ccc3c(c2)c2cc(-c4ccccc4)ccc2n3-c2ccc(-c3nc(-c4ccccc4)nc(-c4ccccc4)n3)cc2-c2nc(-c3ccccc3)cc(-c3cccc(-c4cccc(N5c6ccccc6B6c7ccccc7N(c7ccccc7)c7cccc5c76)c4)c3)n2)cc1]

-continued
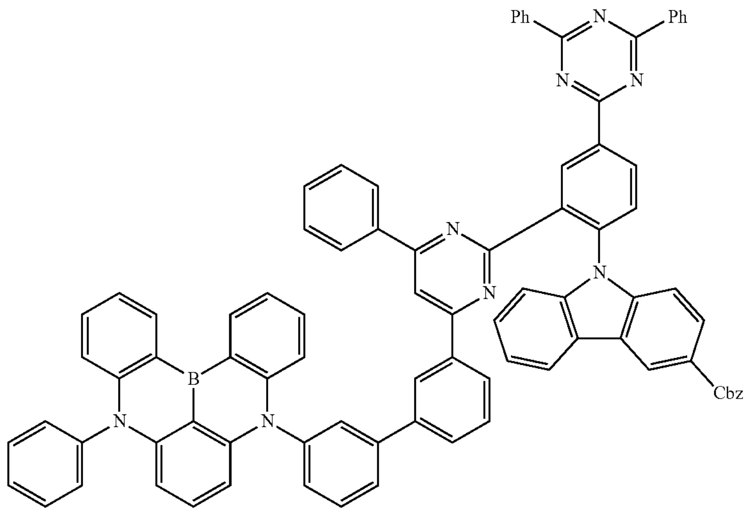
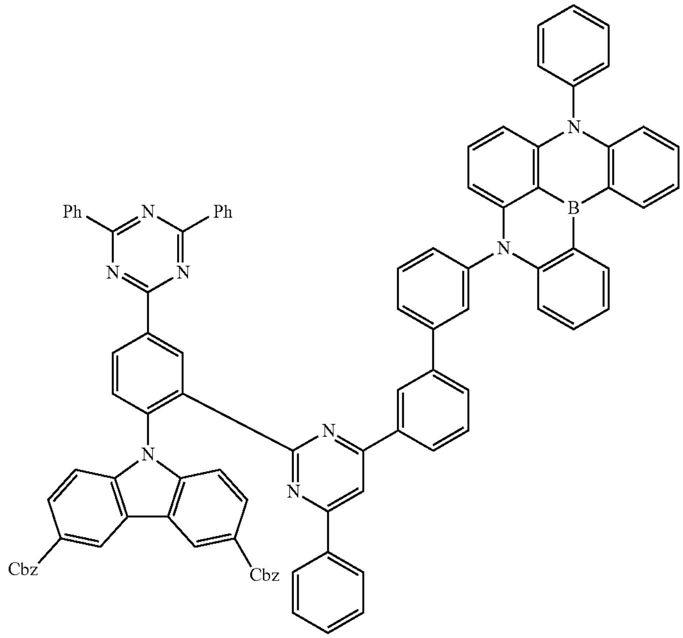

-continued
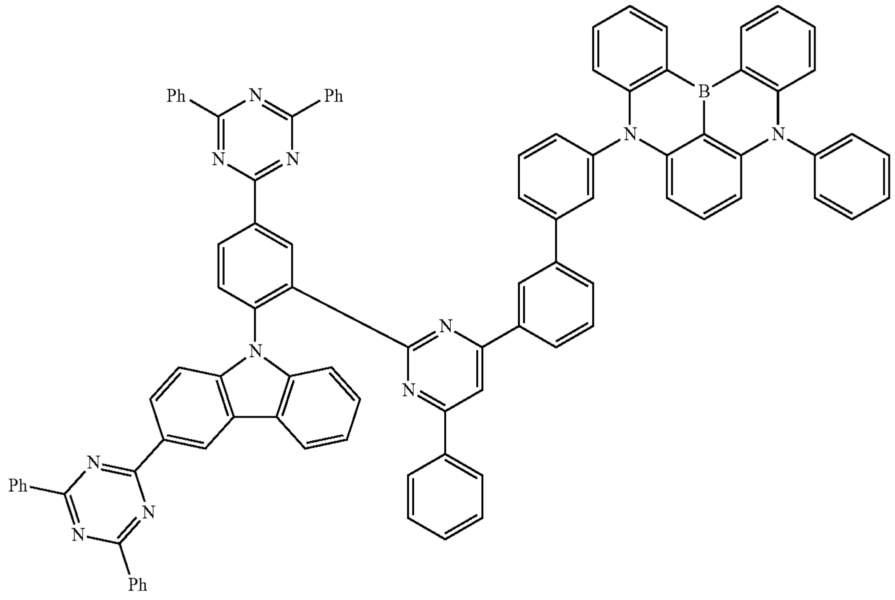
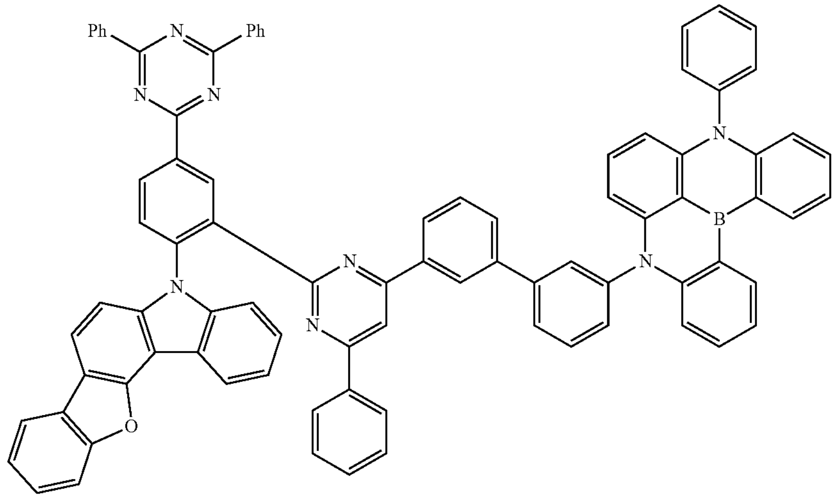
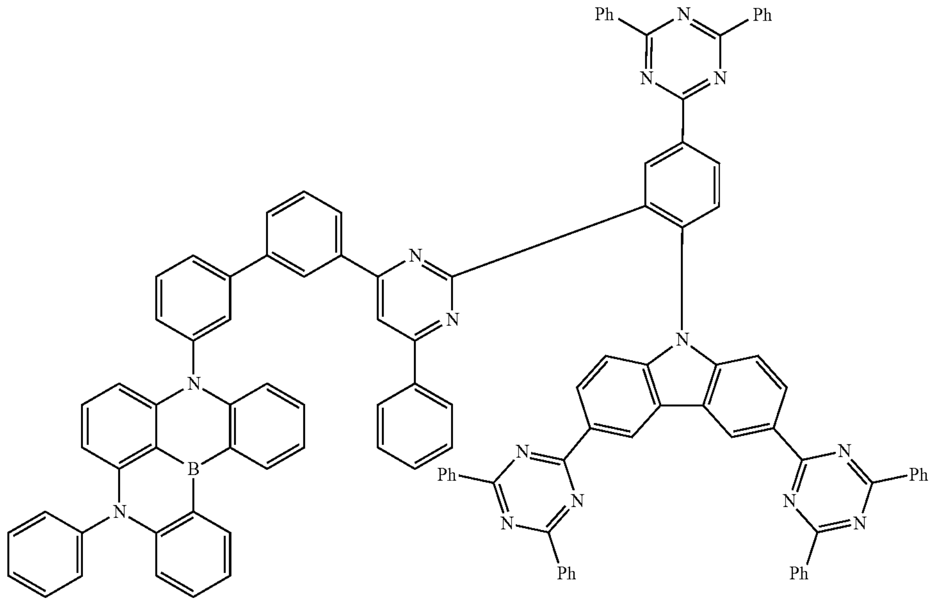

-continued
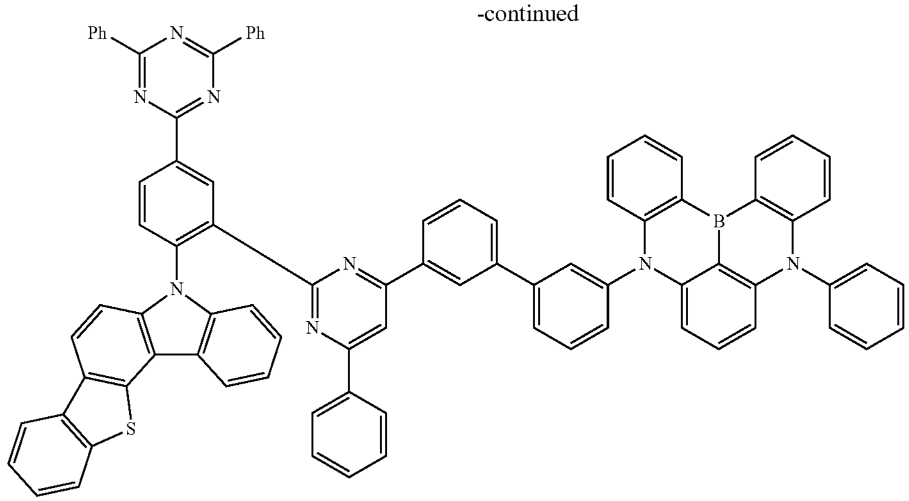
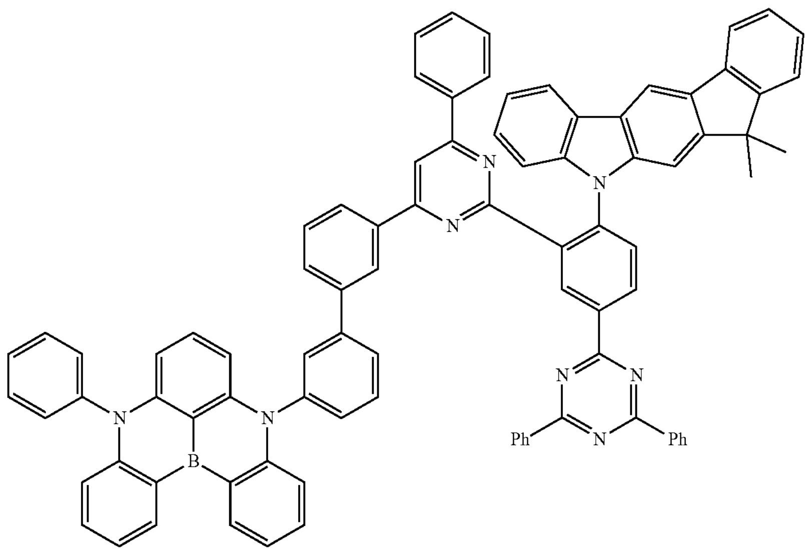
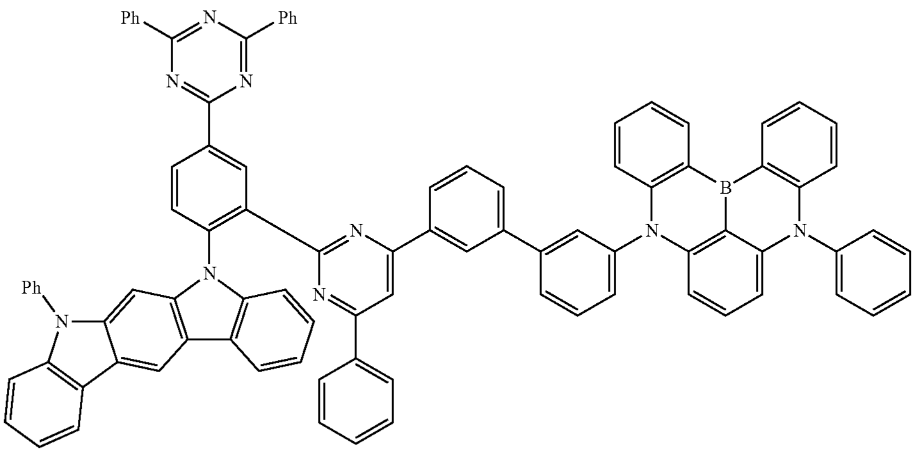

-continued
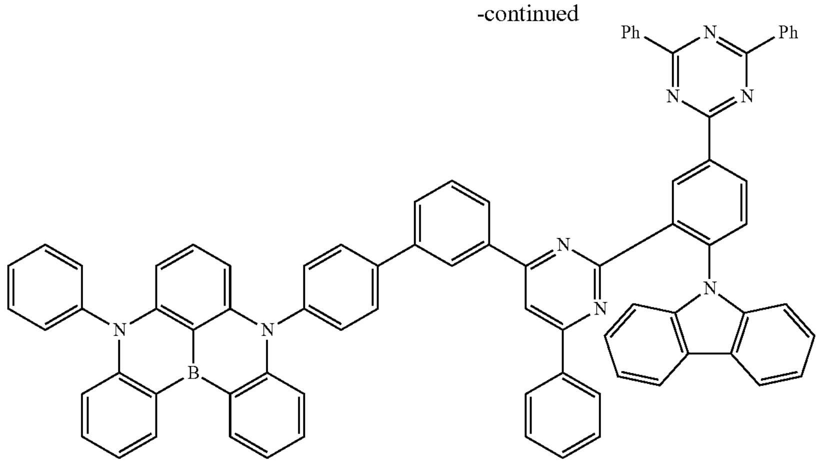
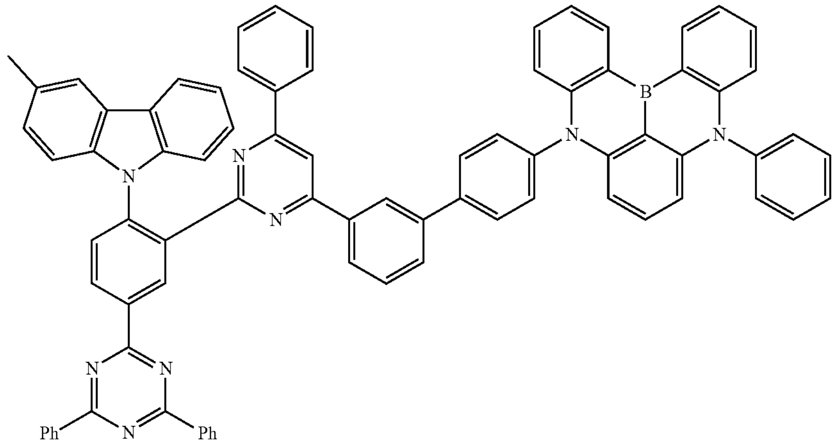
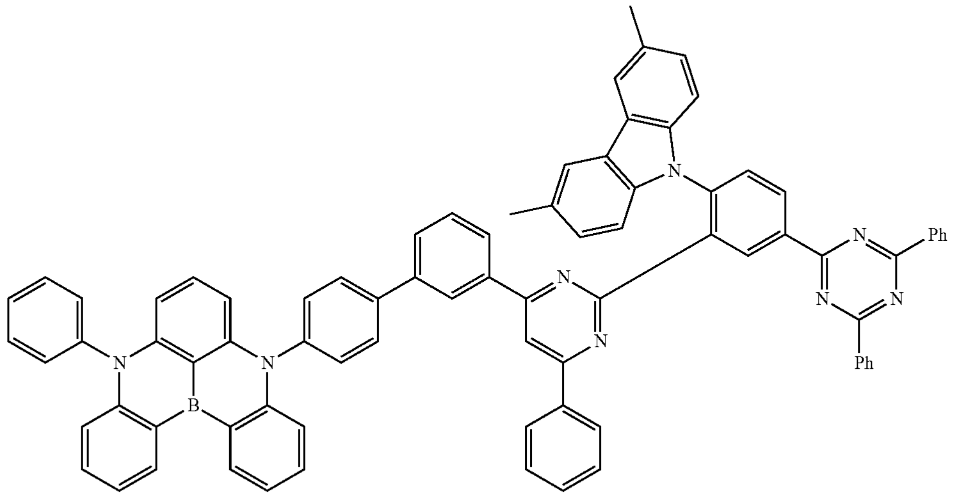

-continued
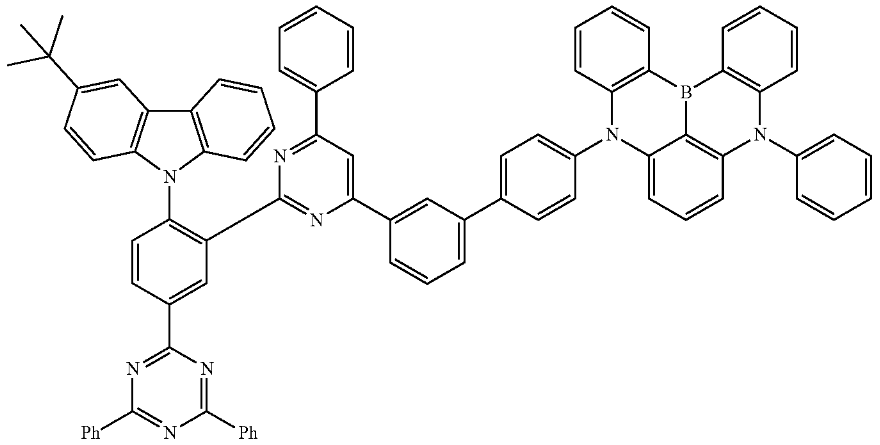
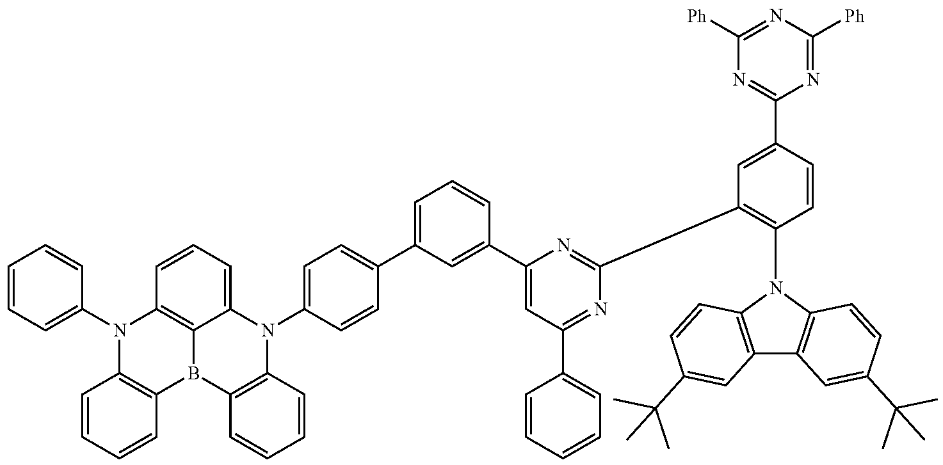
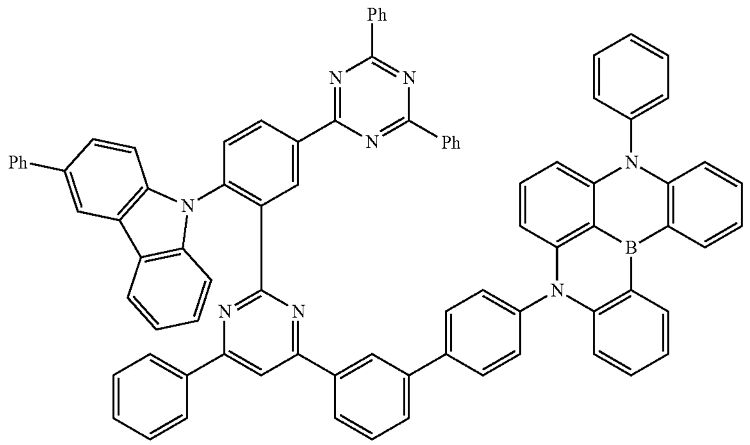

-continued
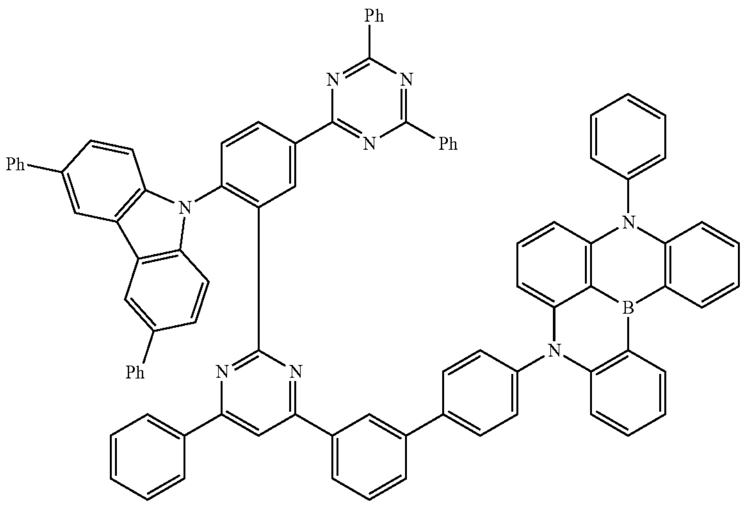
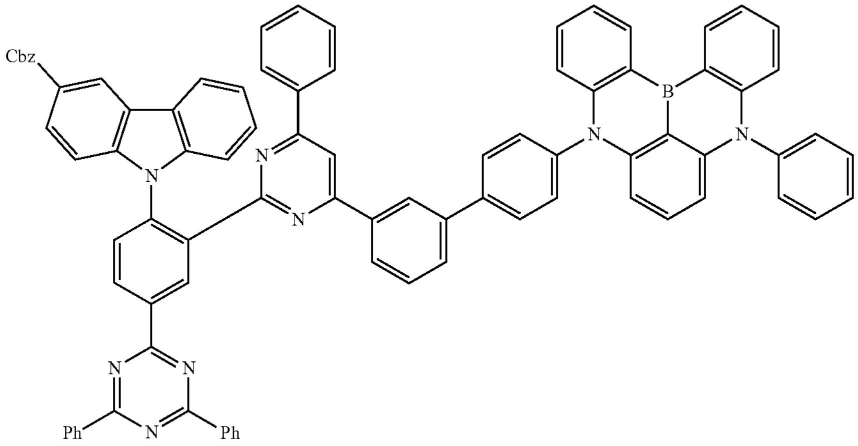
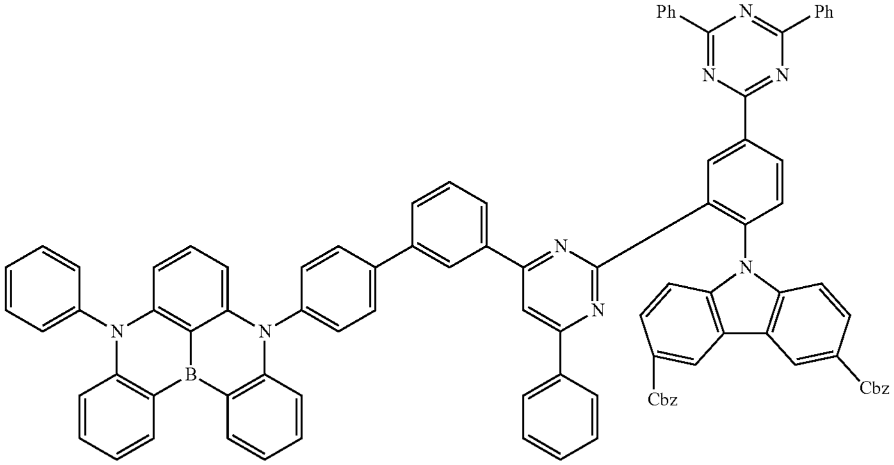

-continued
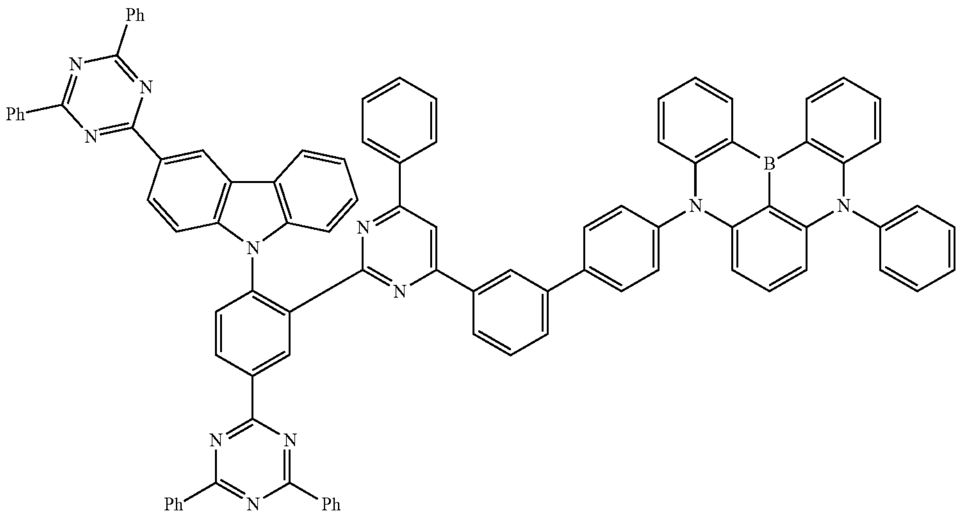
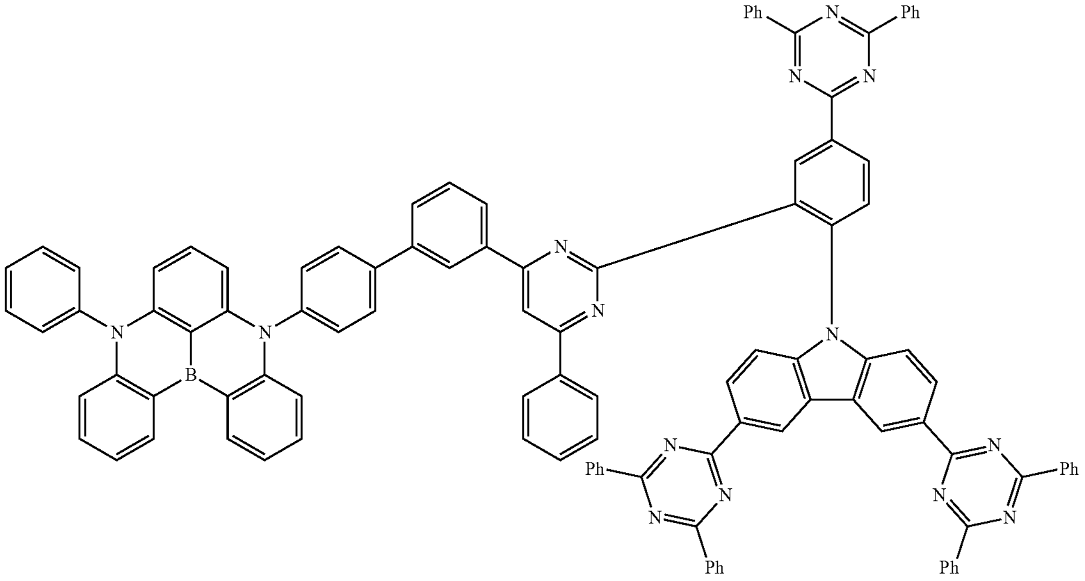
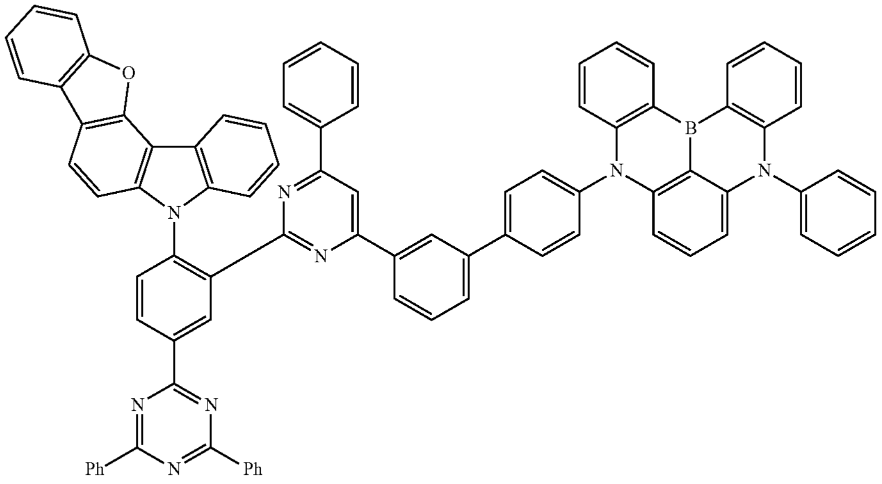

-continued
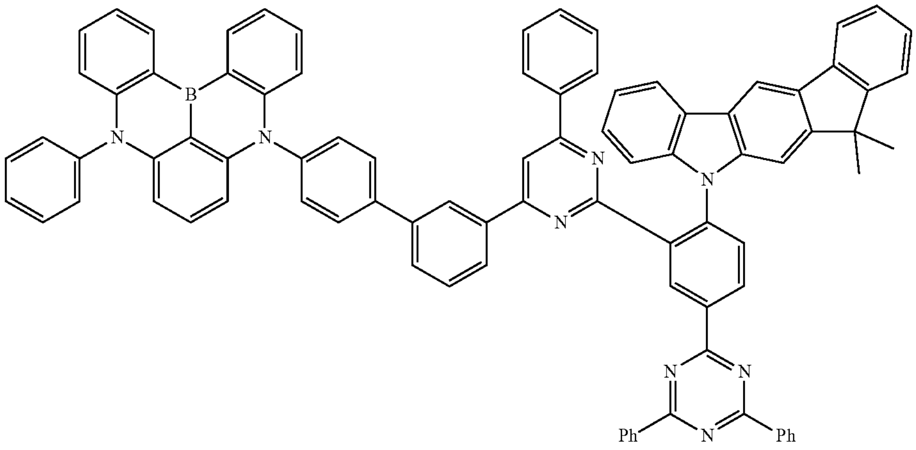
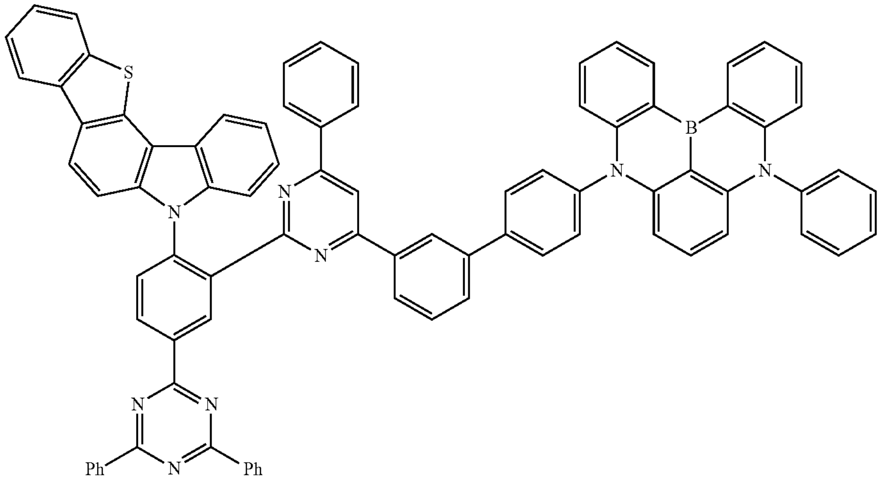
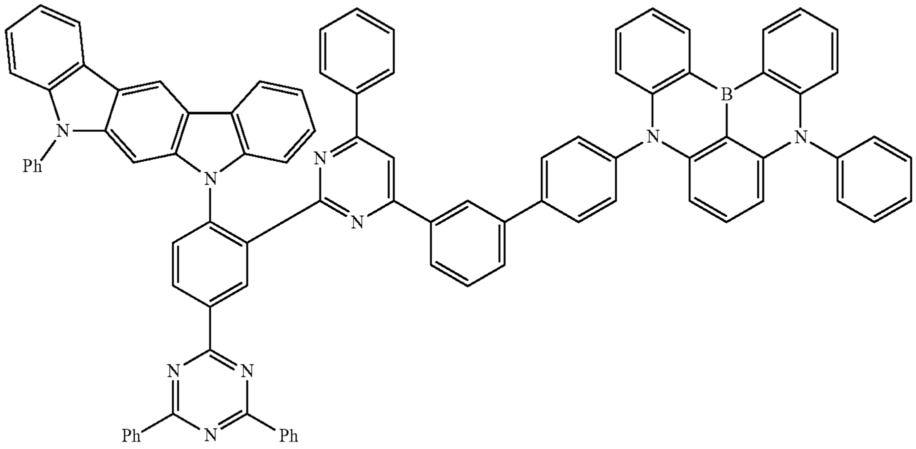

-continued
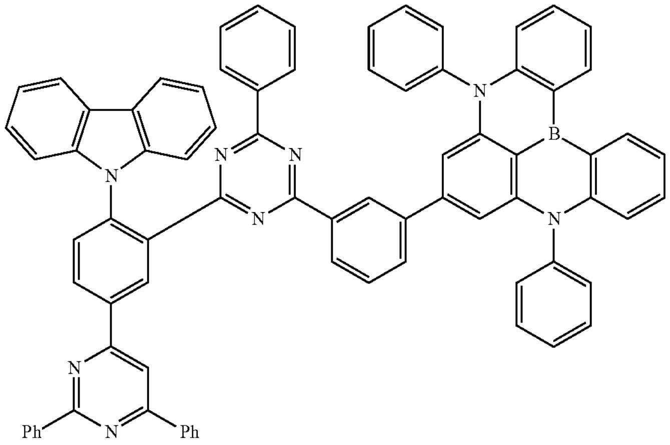
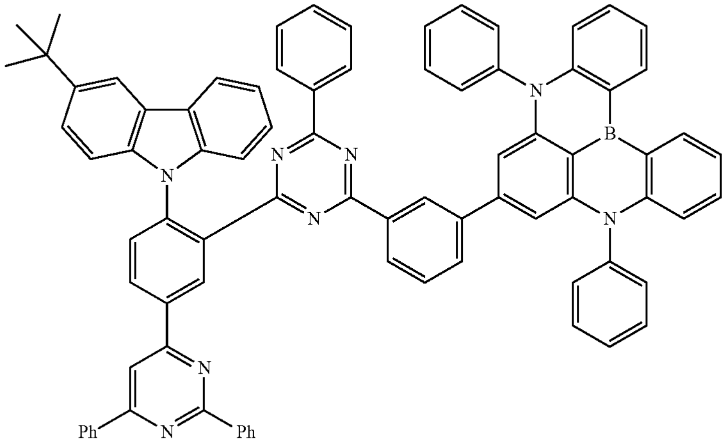
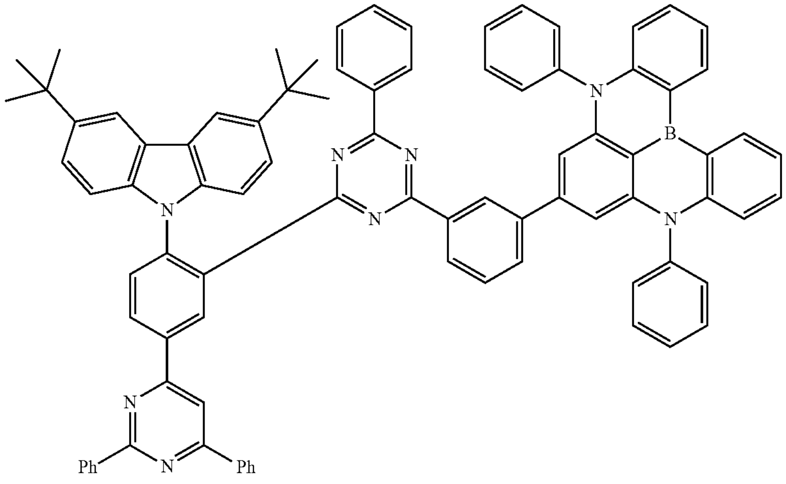

-continued
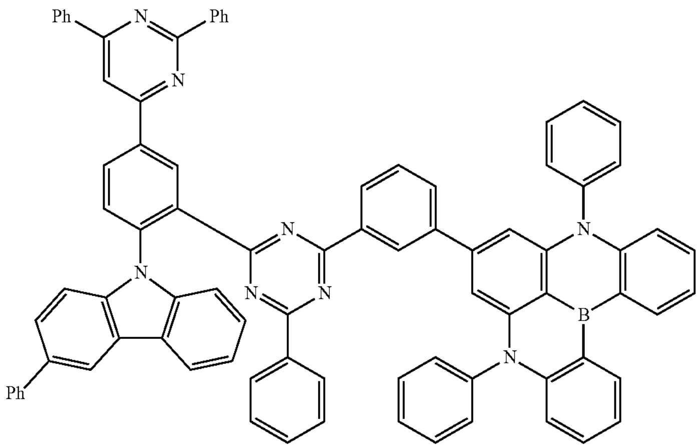
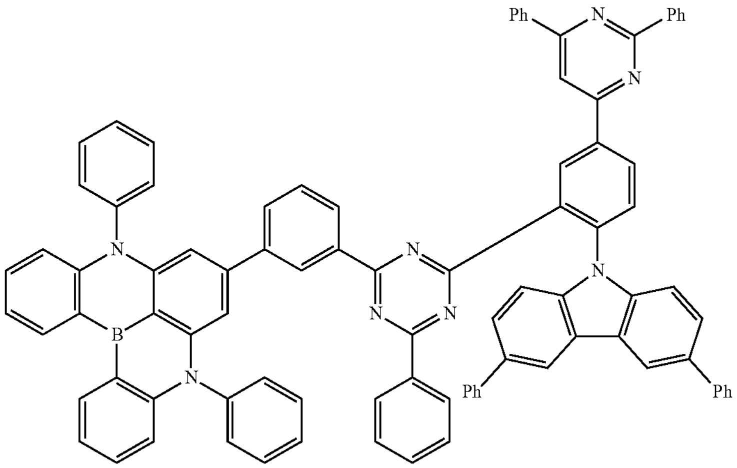
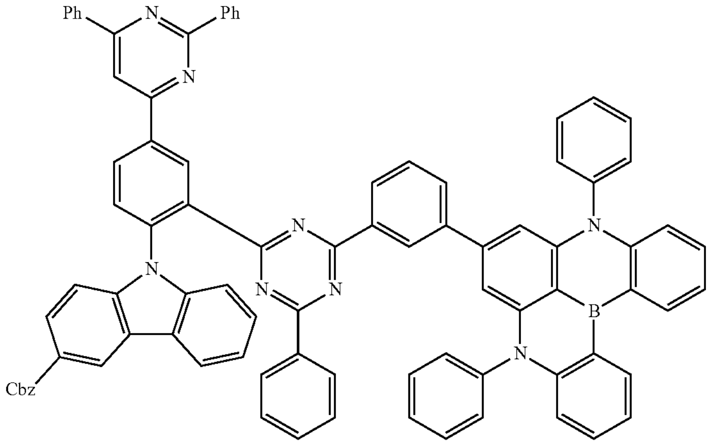

-continued
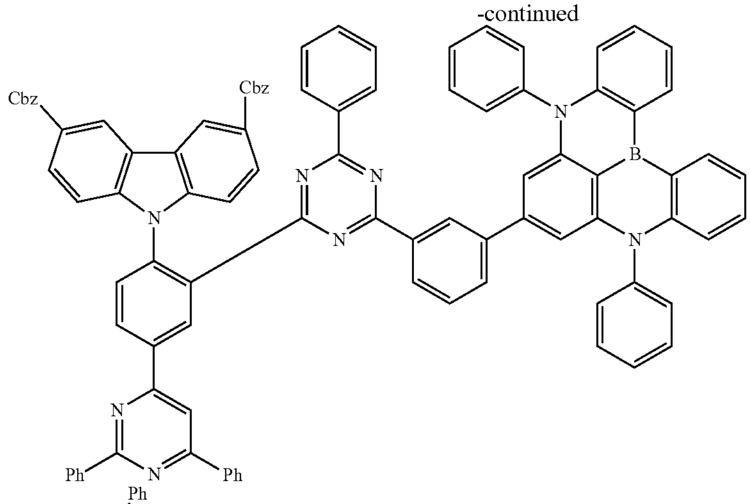
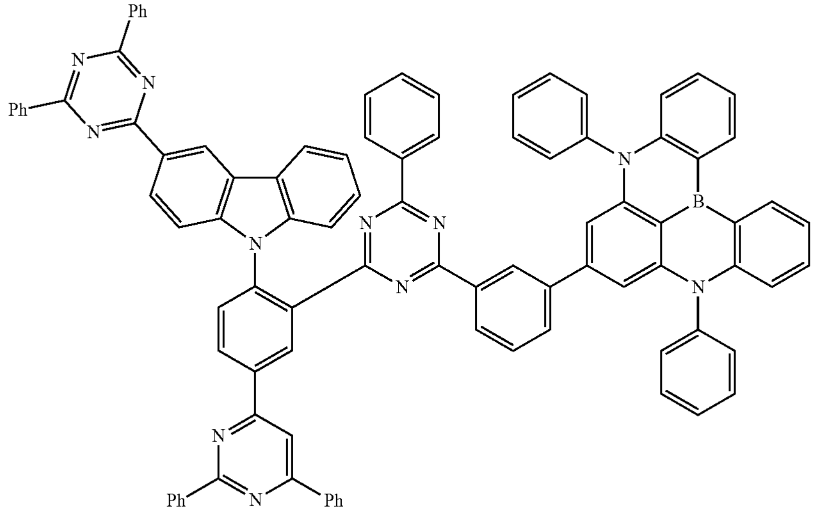
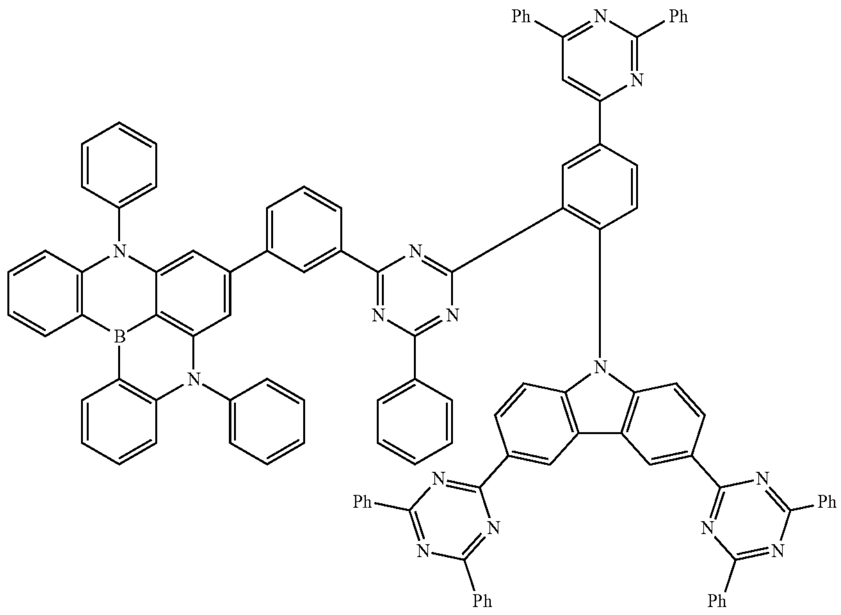

-continued
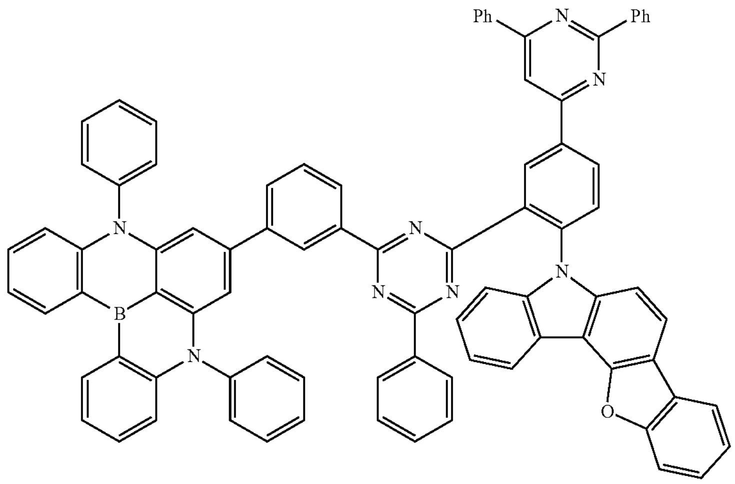
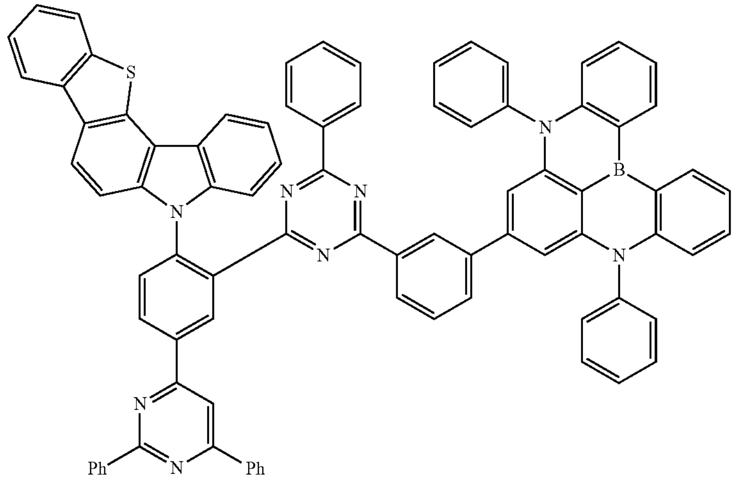
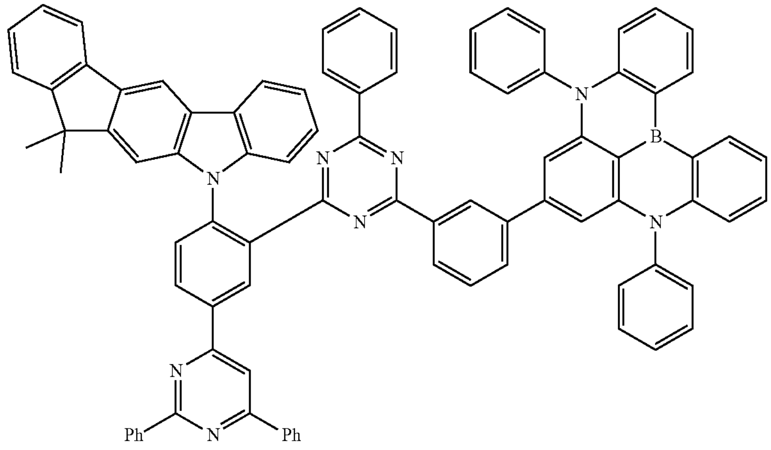

-continued
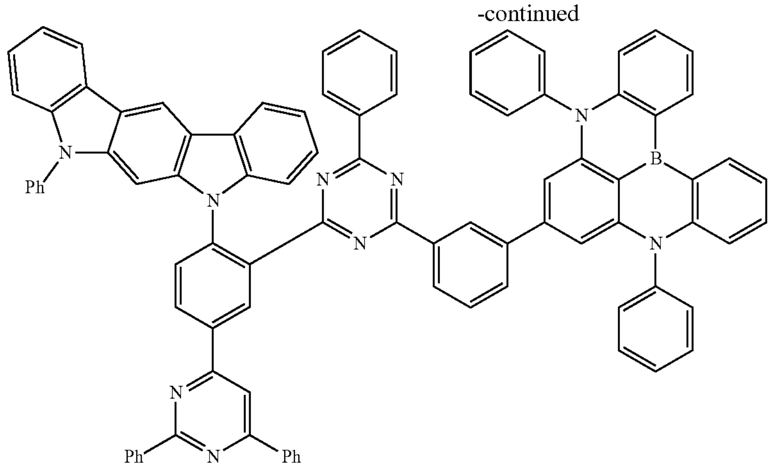
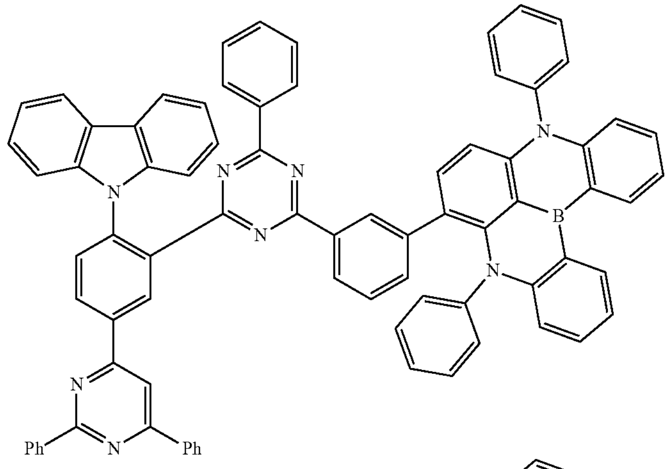
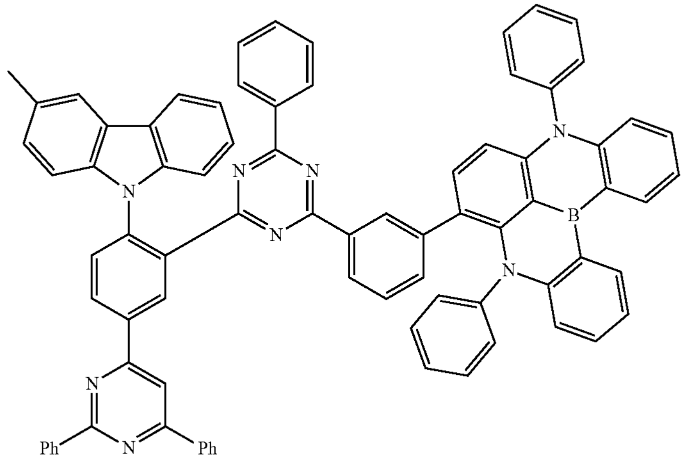

-continued
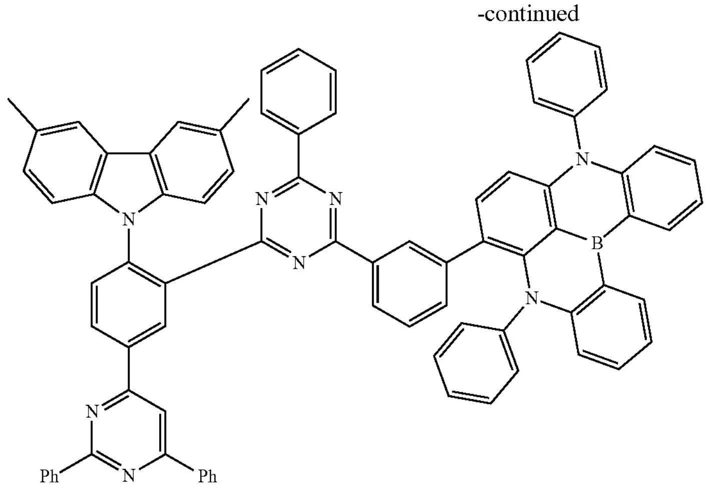
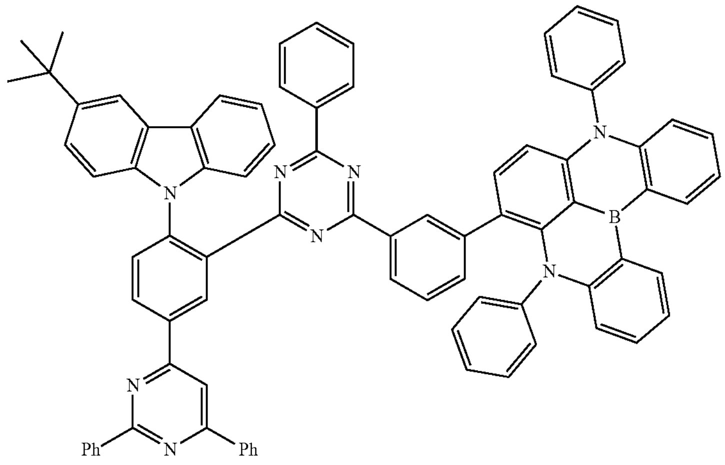
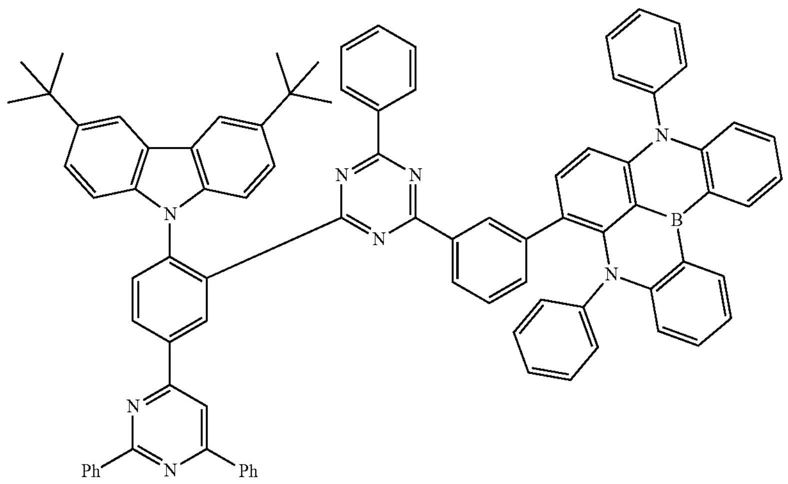

-continued
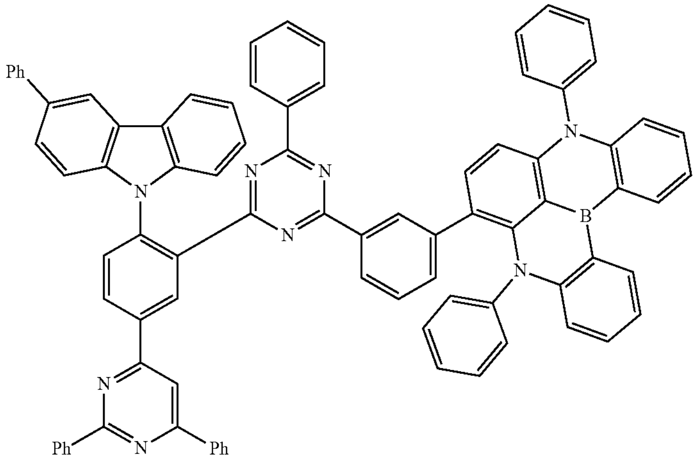
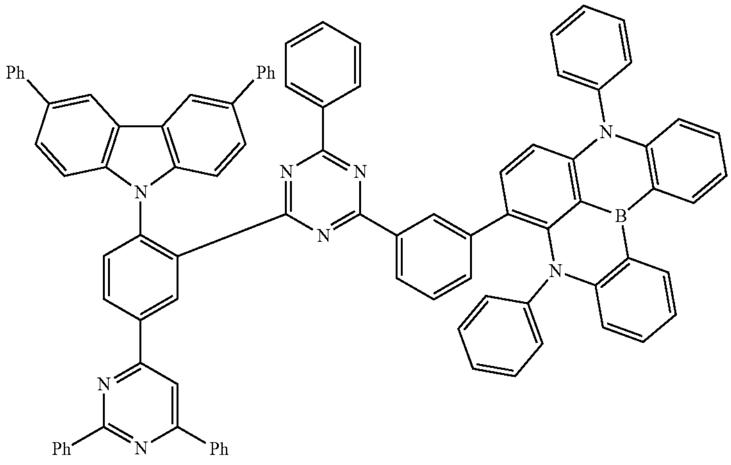
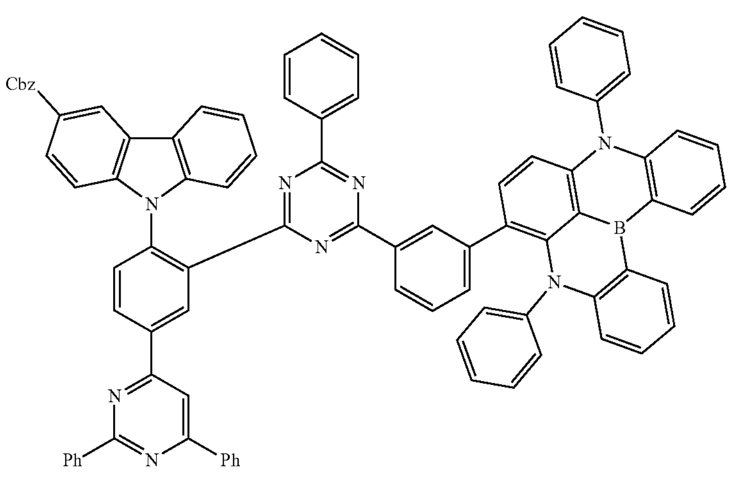

-continued
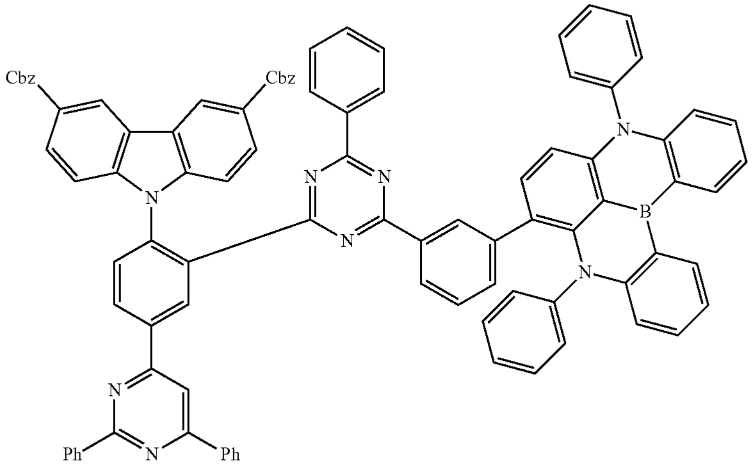
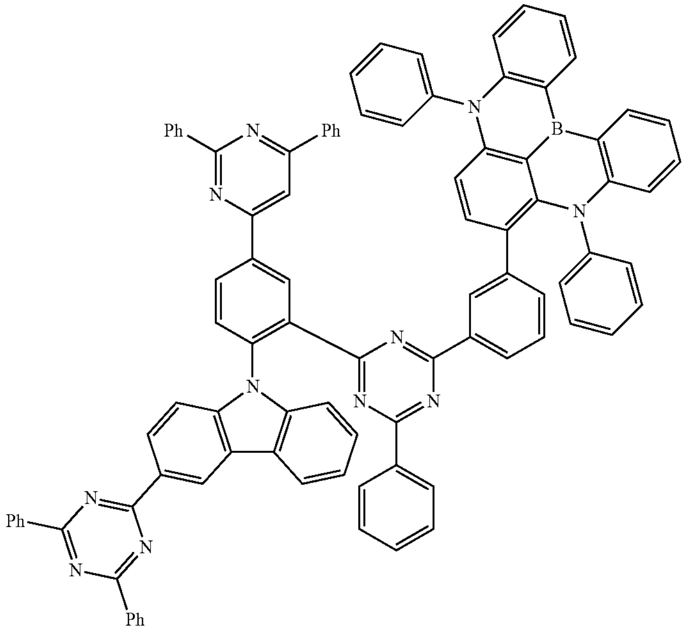
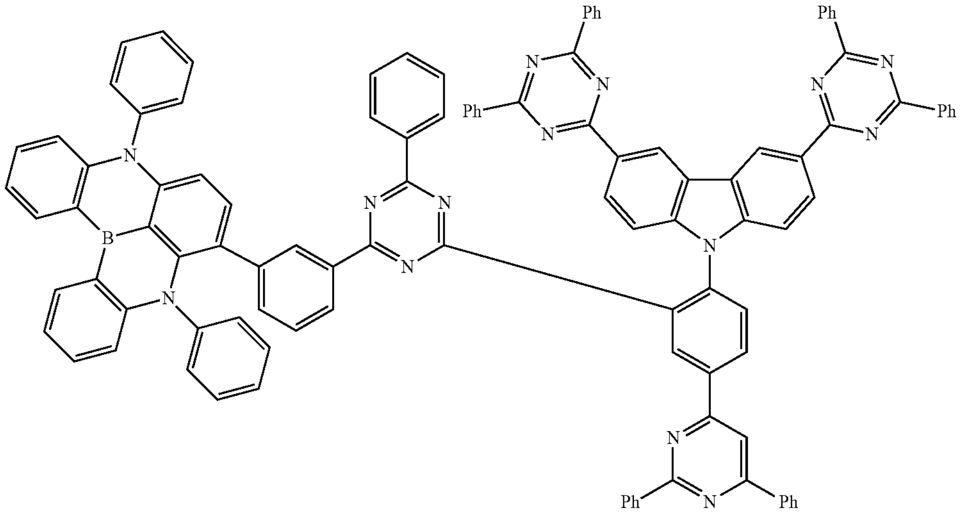

-continued
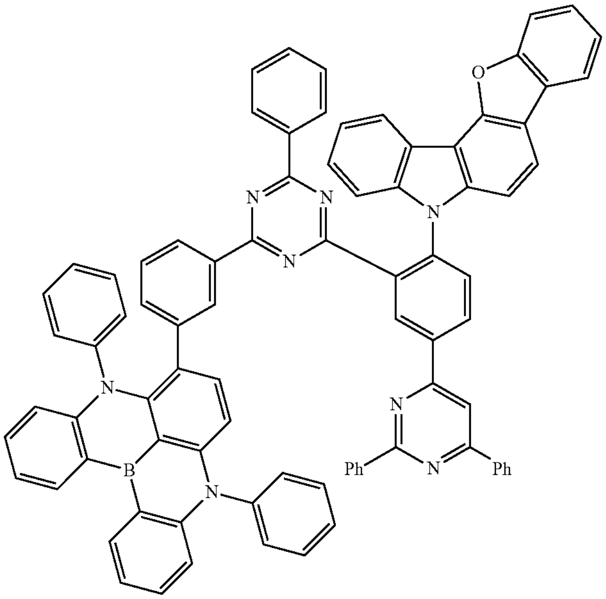
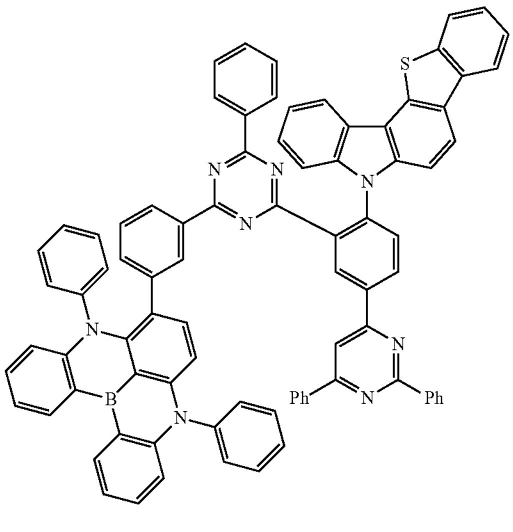
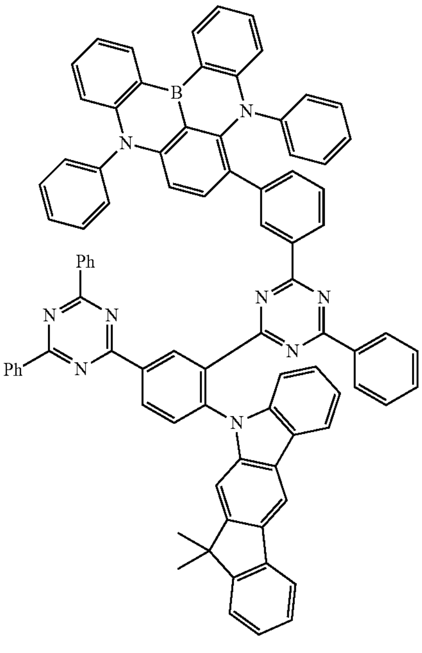

-continued
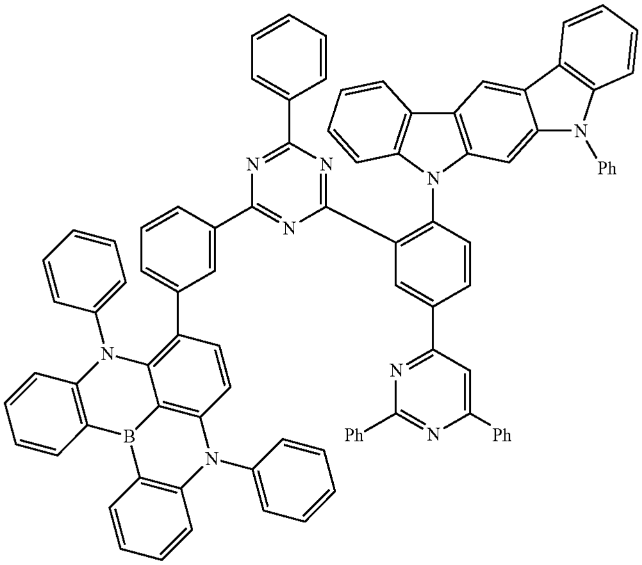
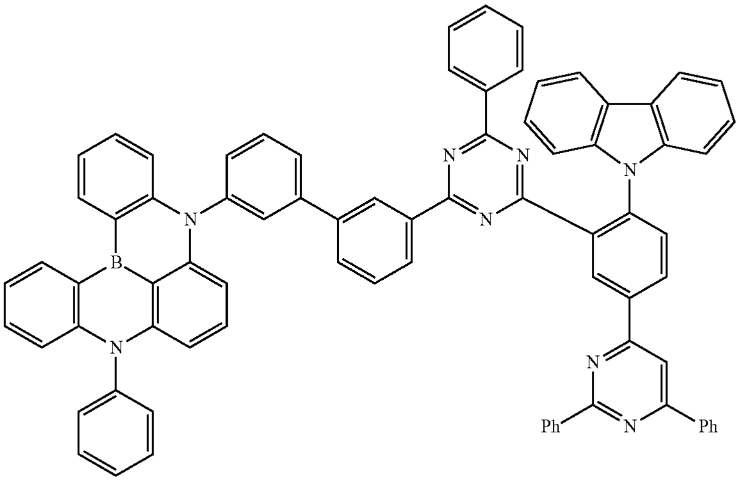
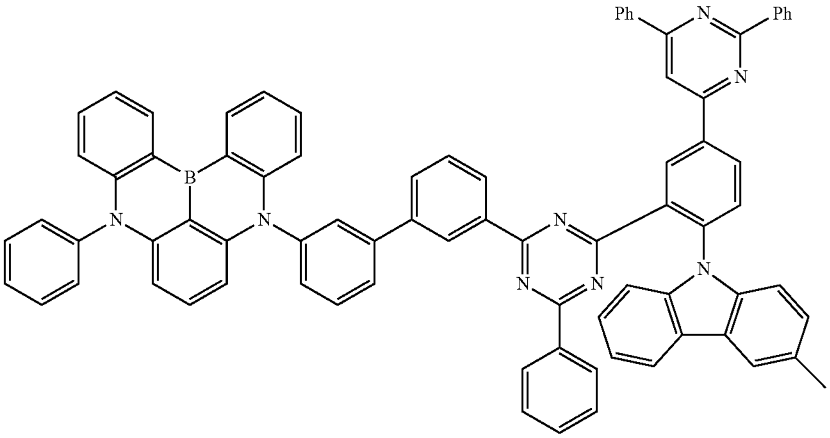

-continued
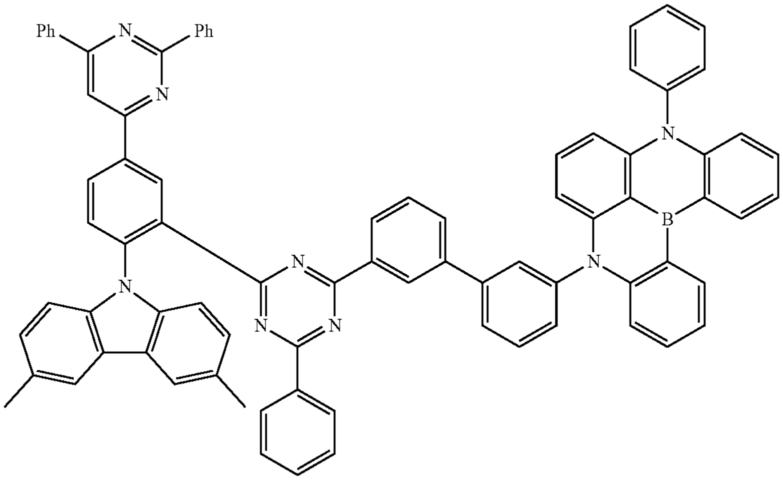
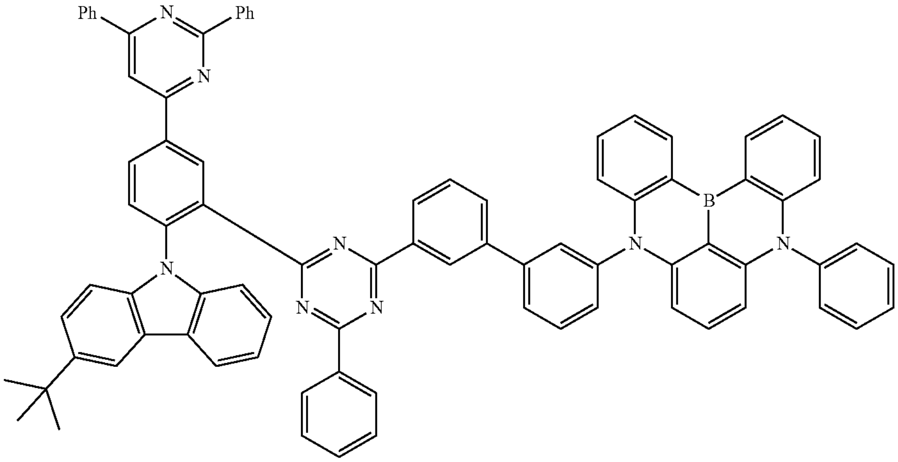
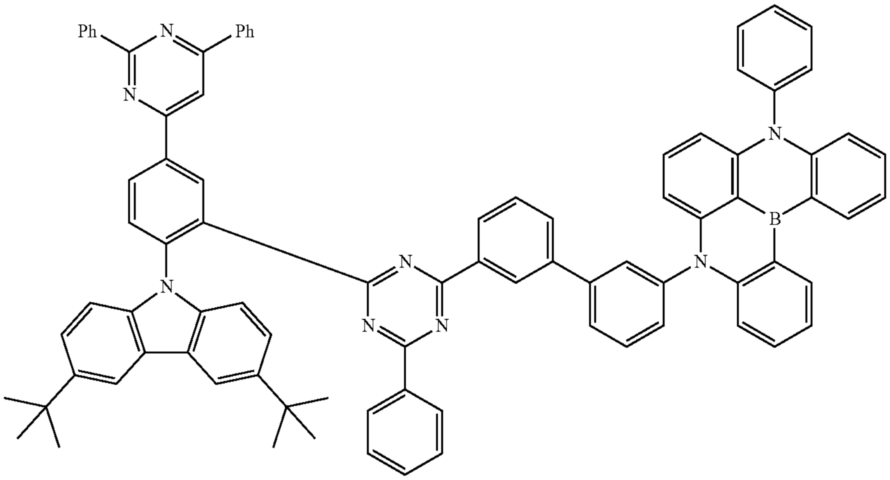

-continued
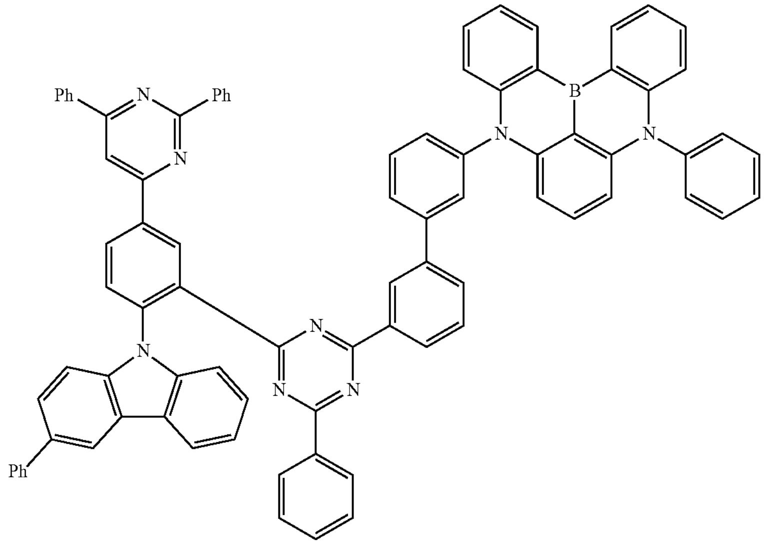
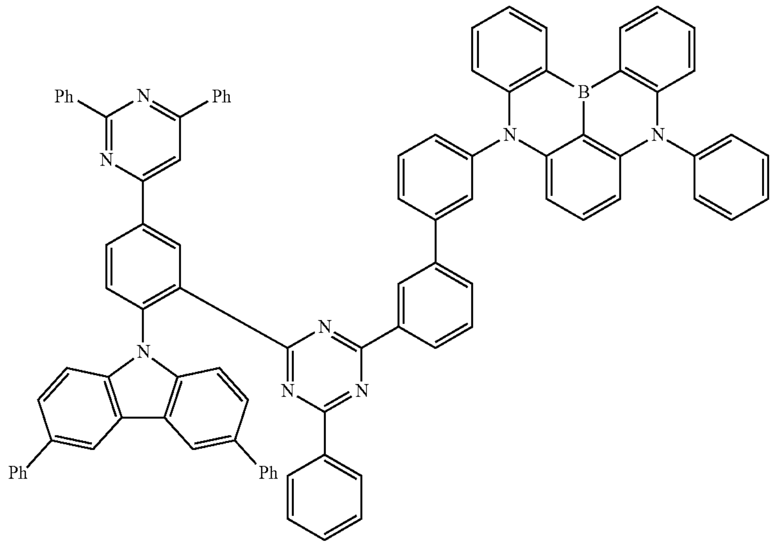
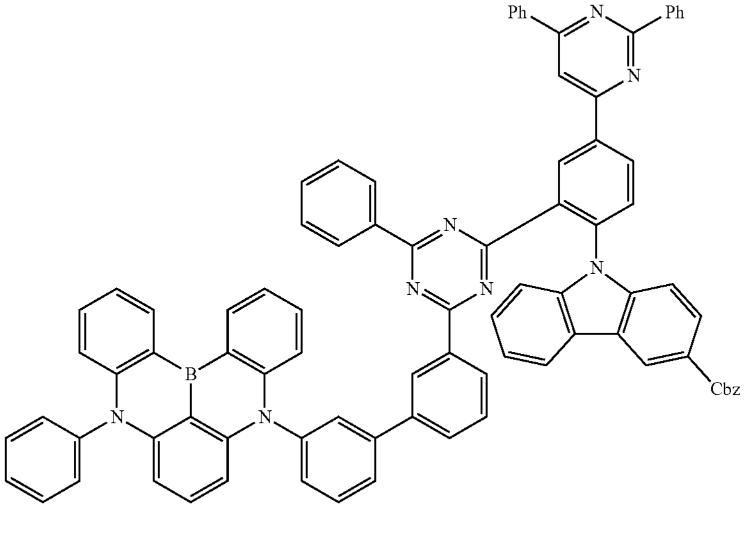

-continued
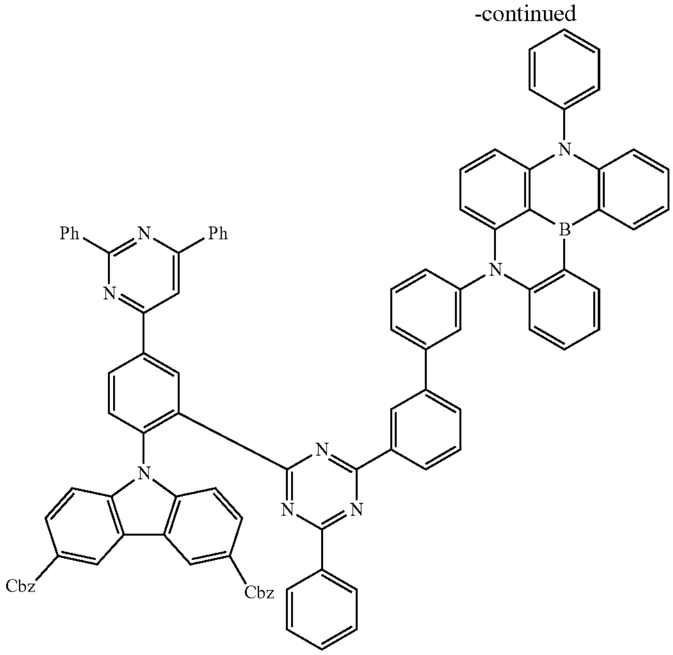
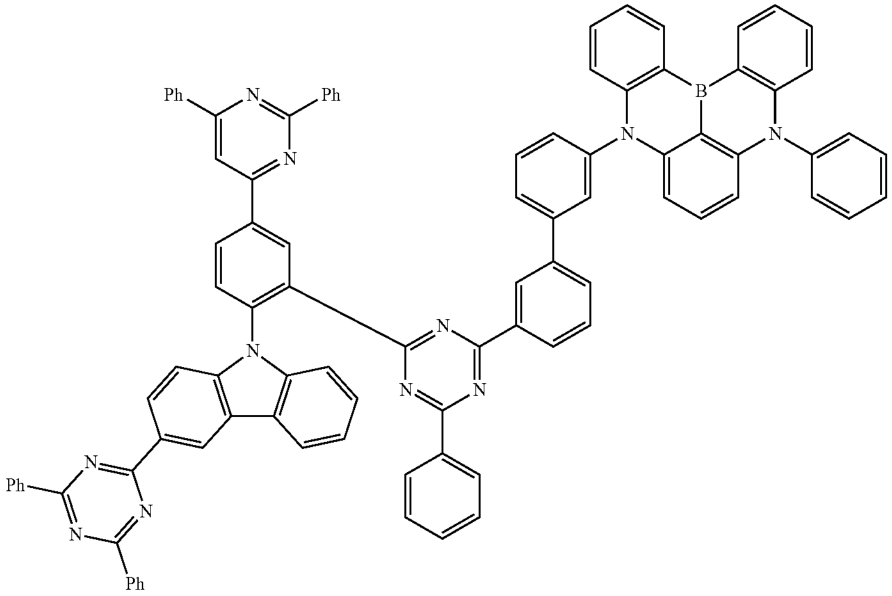
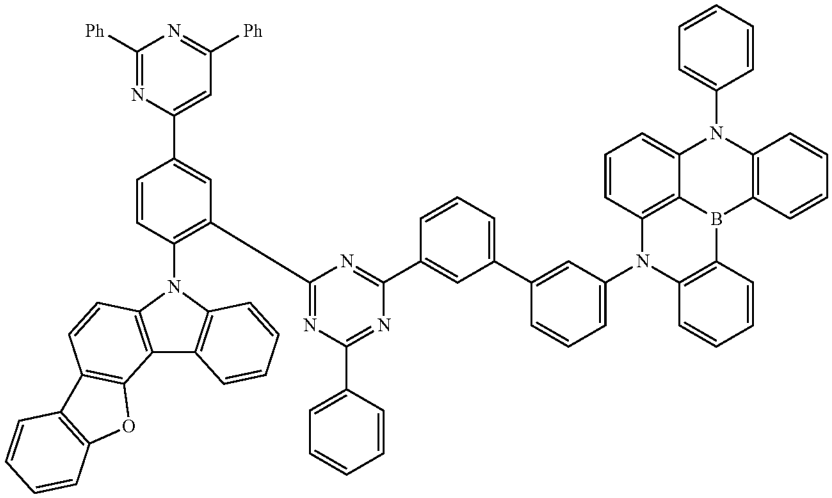

-continued
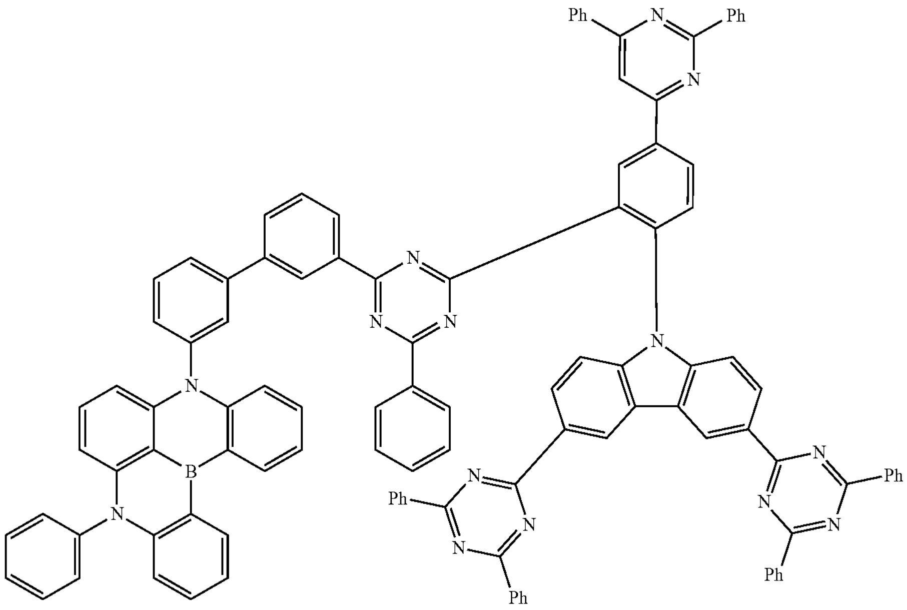
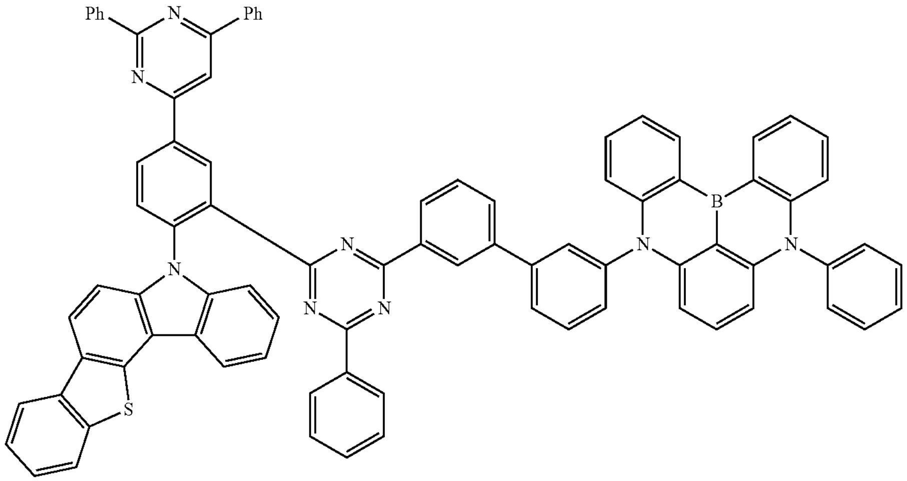
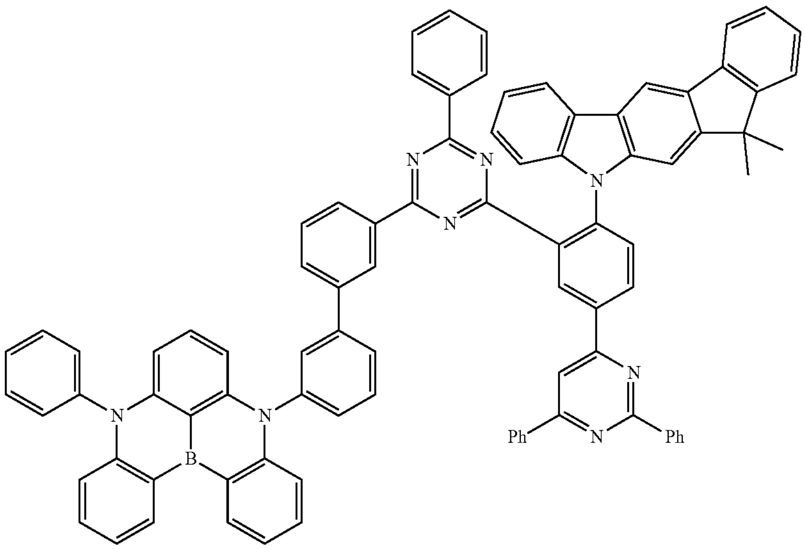

-continued
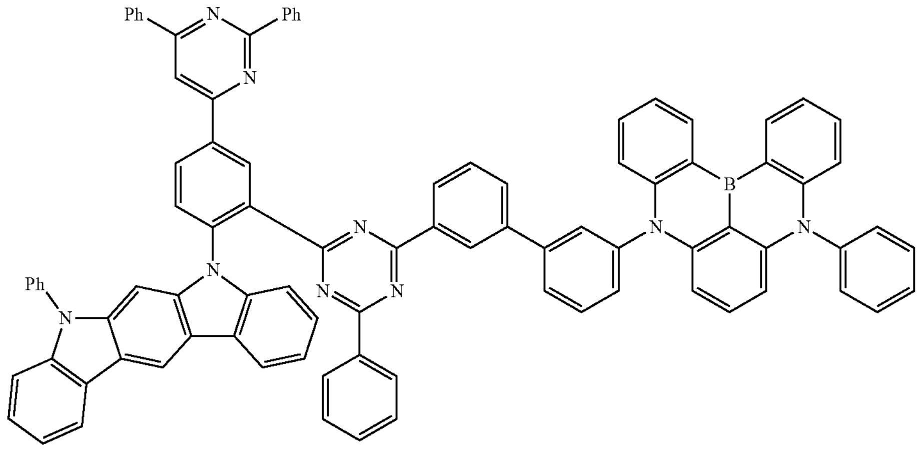
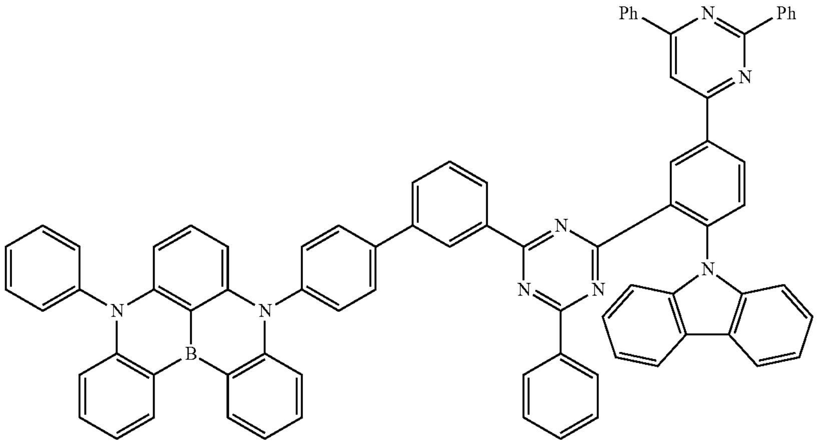
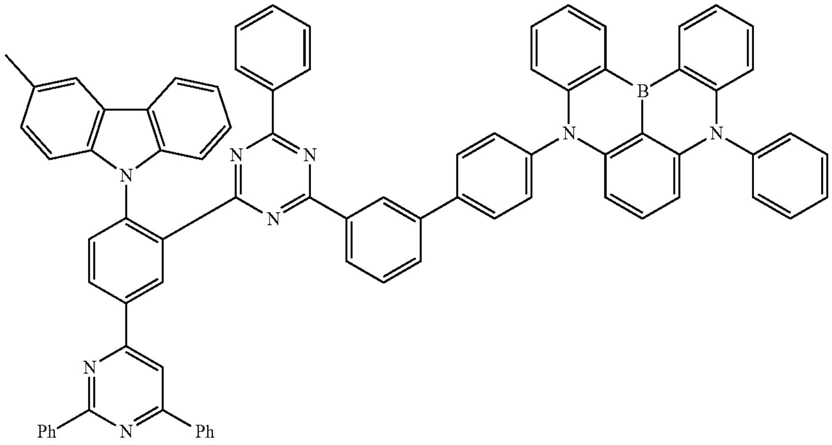

-continued
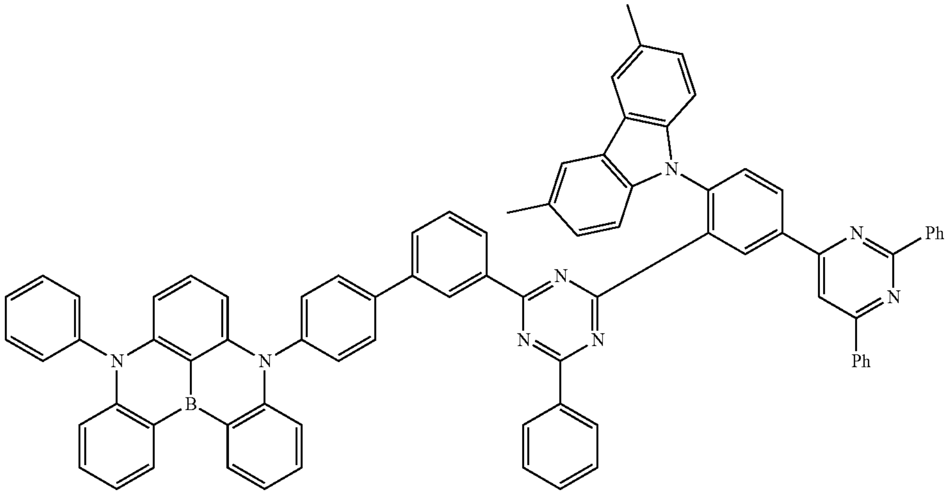
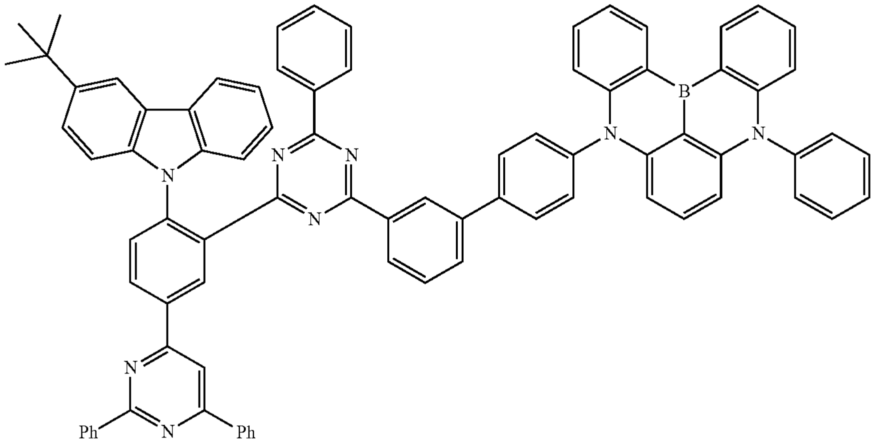
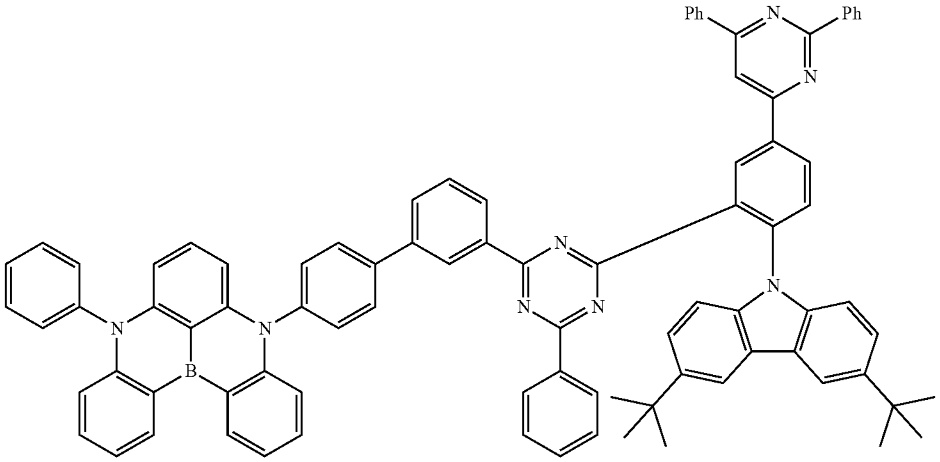

-continued
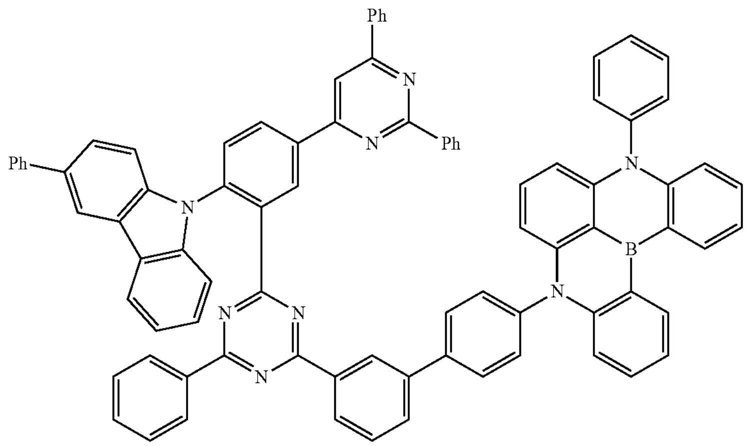
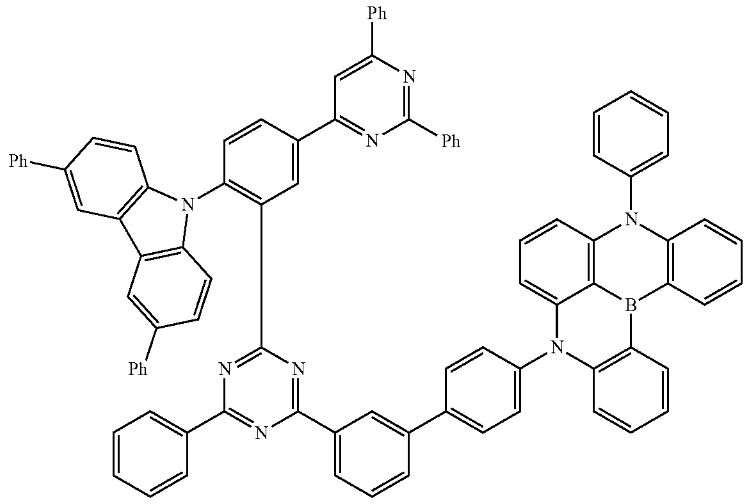
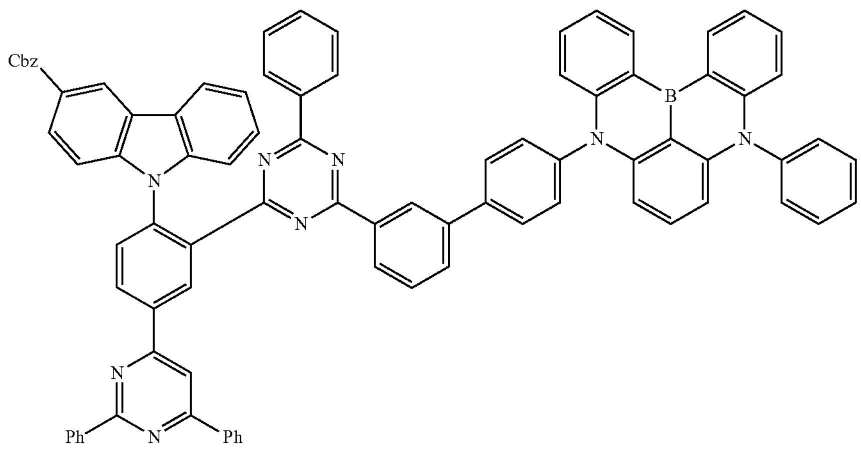

-continued
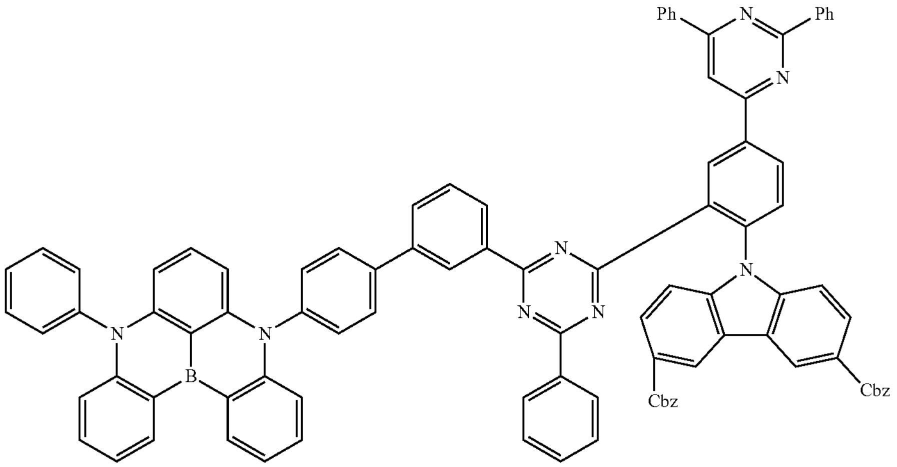
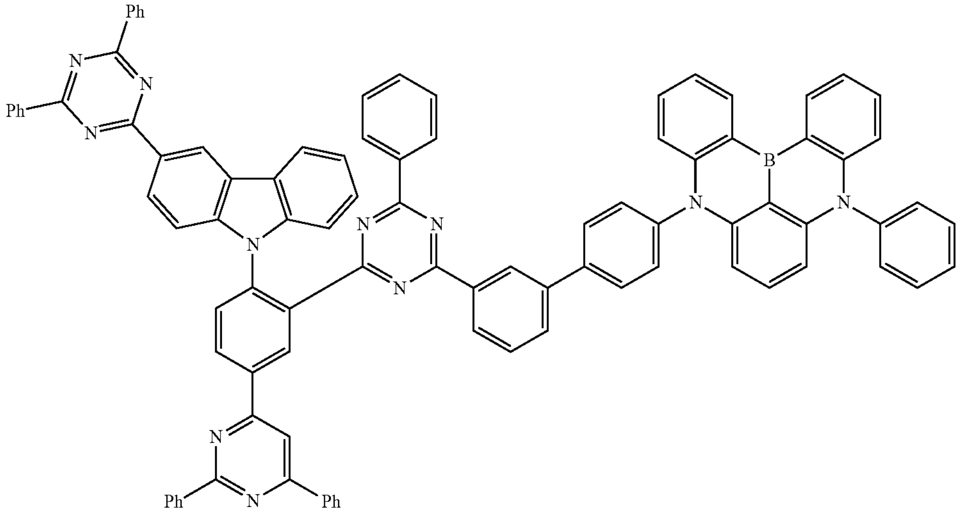
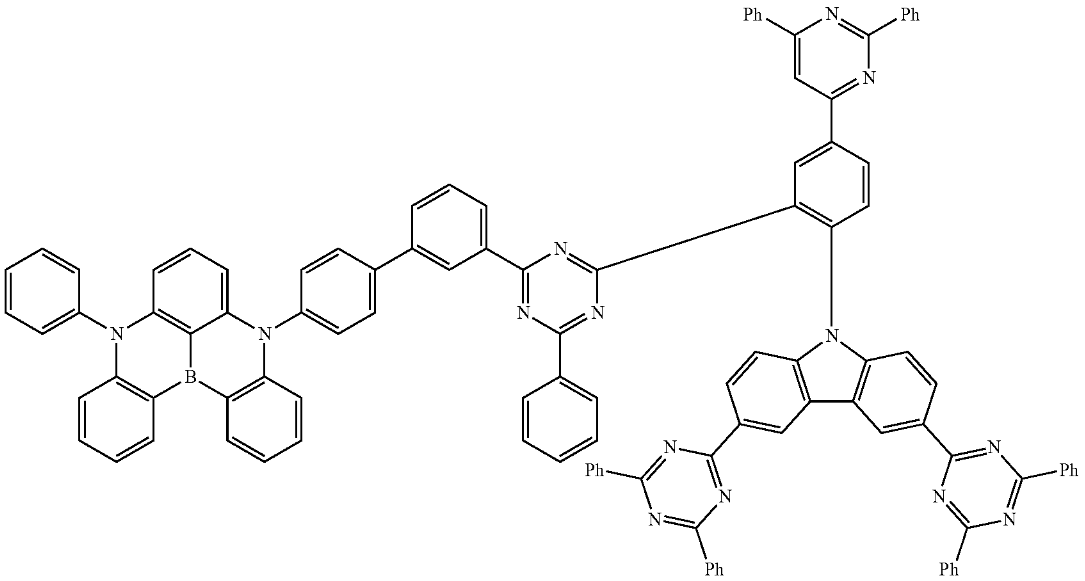

-continued
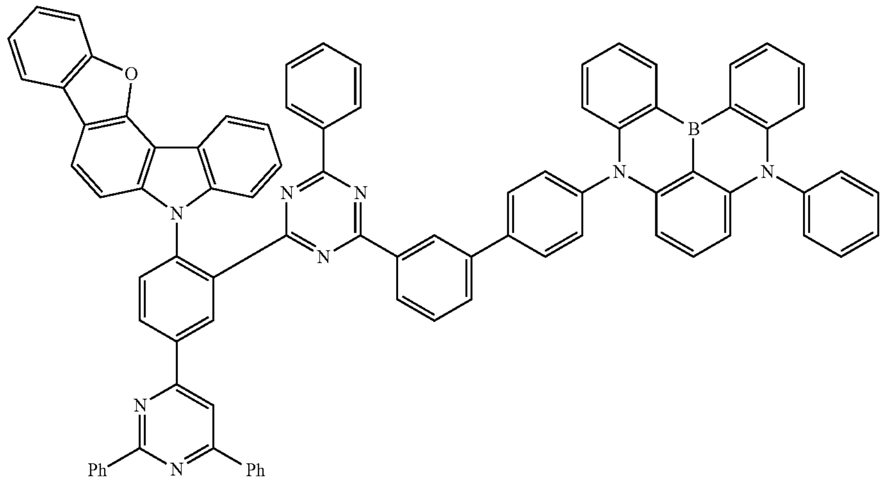
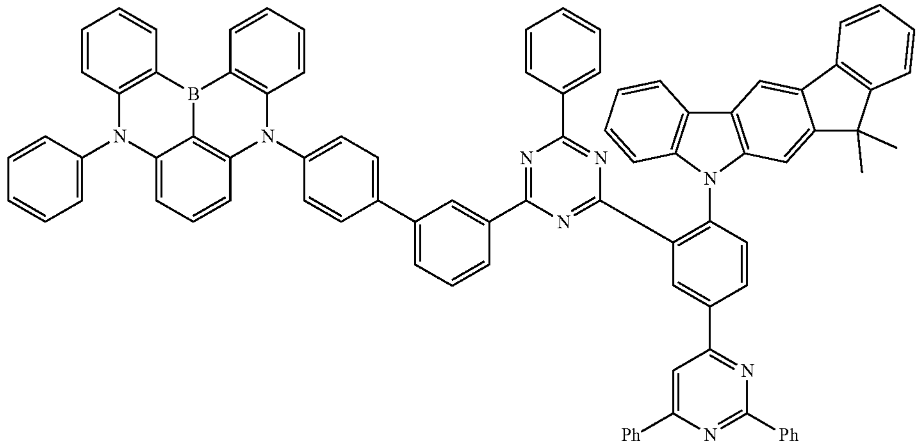
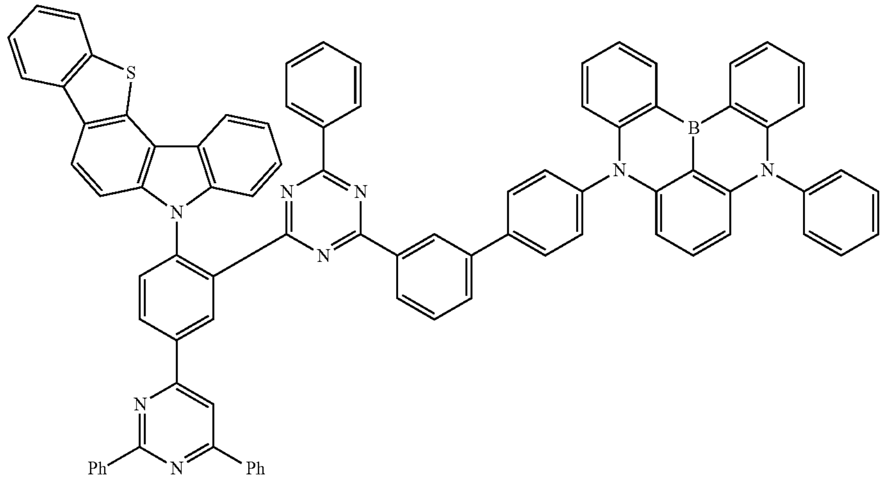

-continued
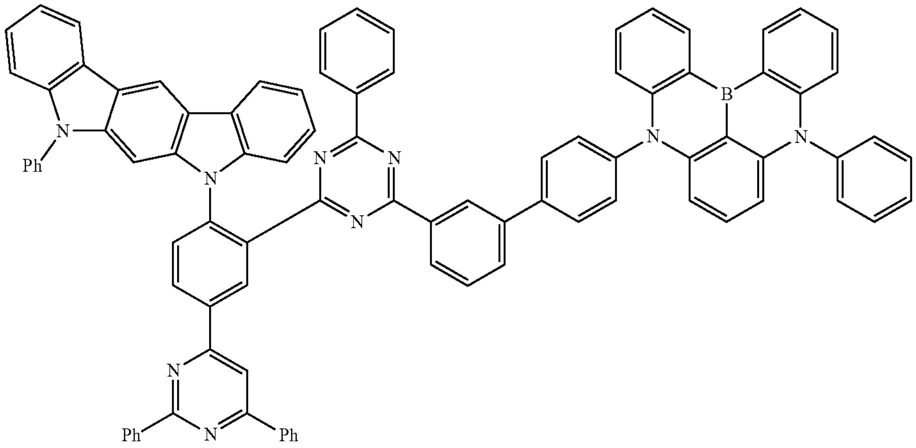
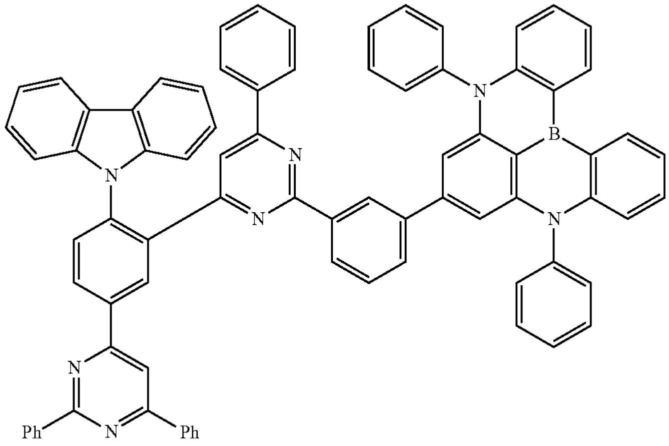
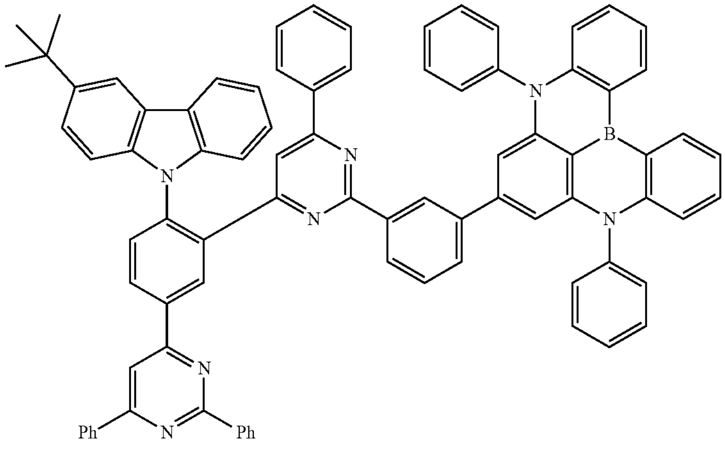

-continued
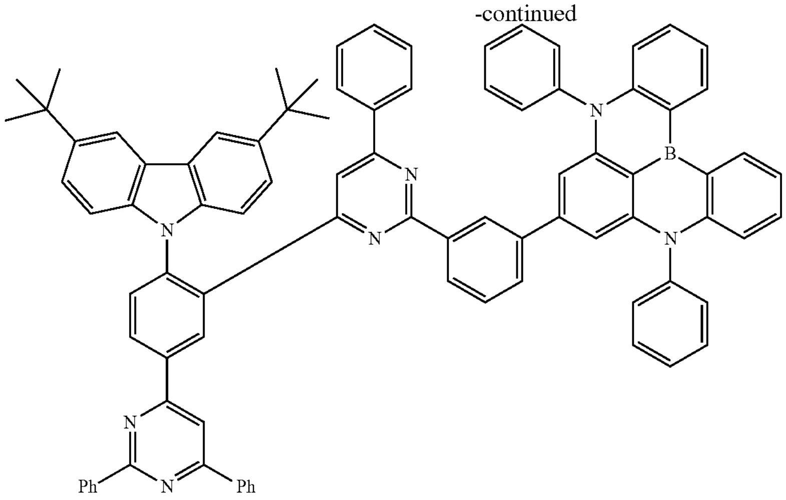
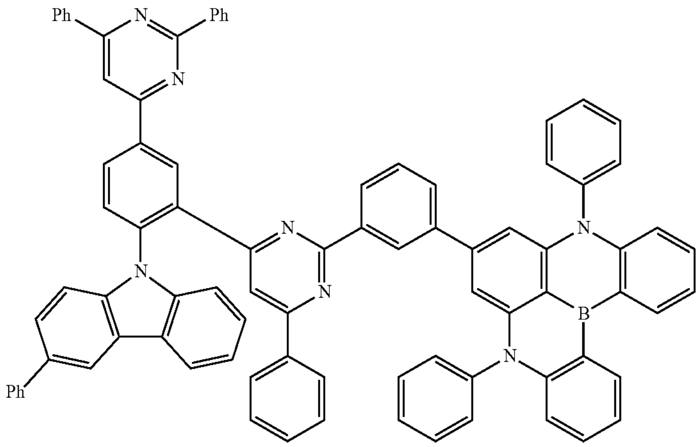
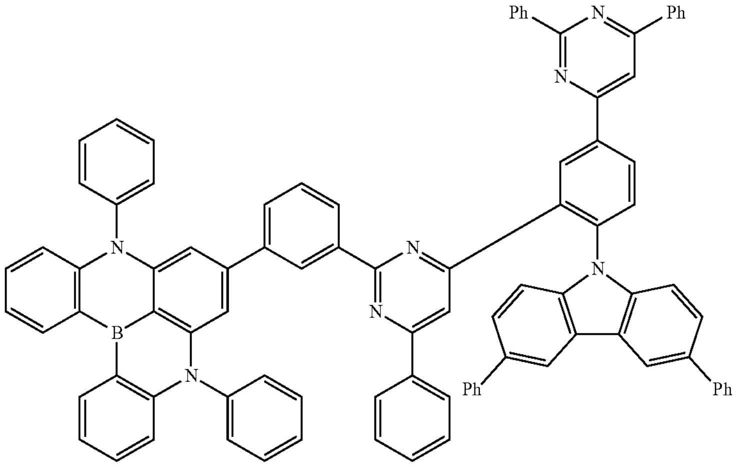

-continued
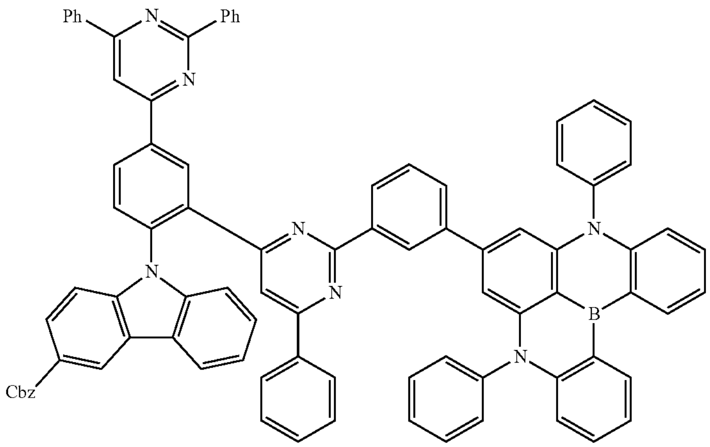
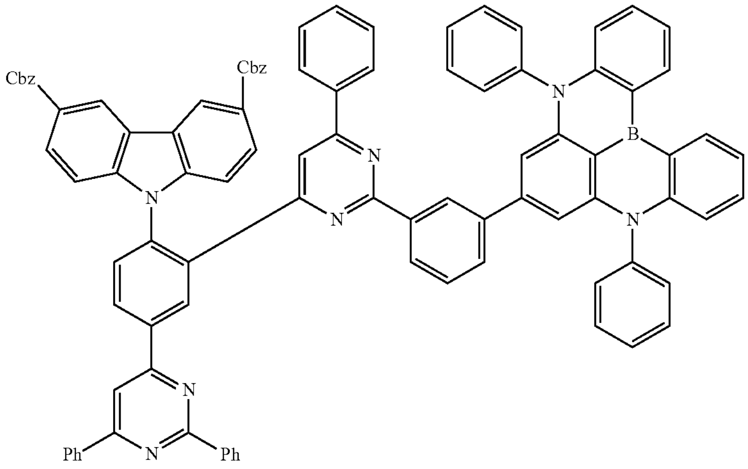
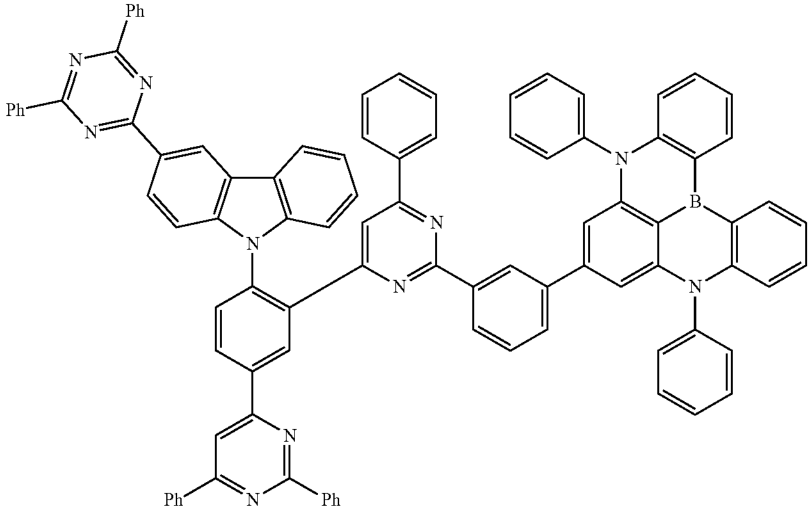

-continued
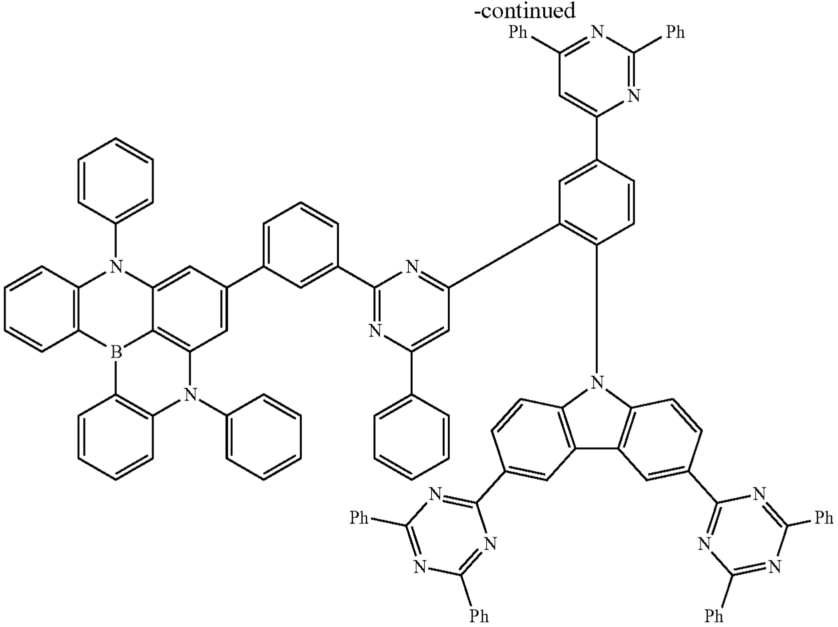
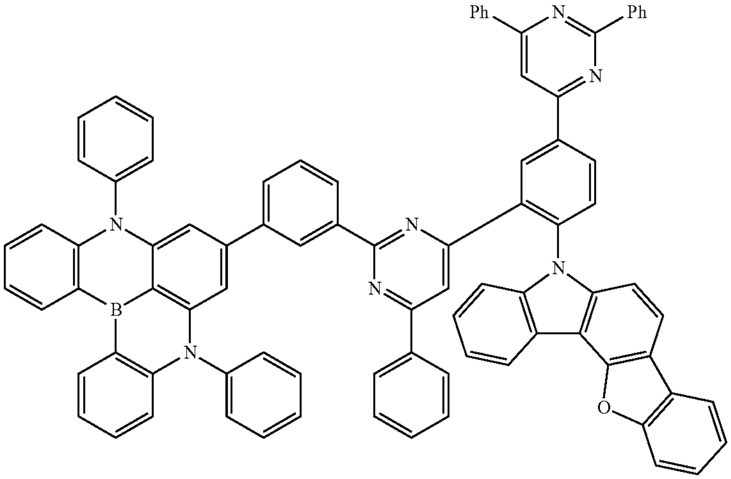
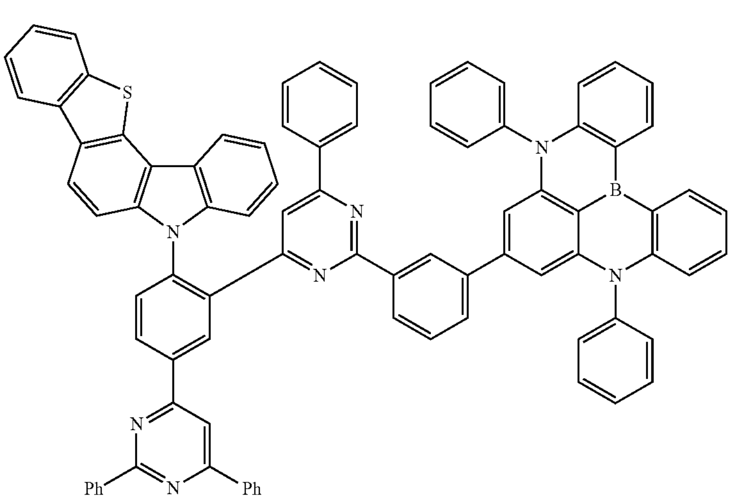

-continued
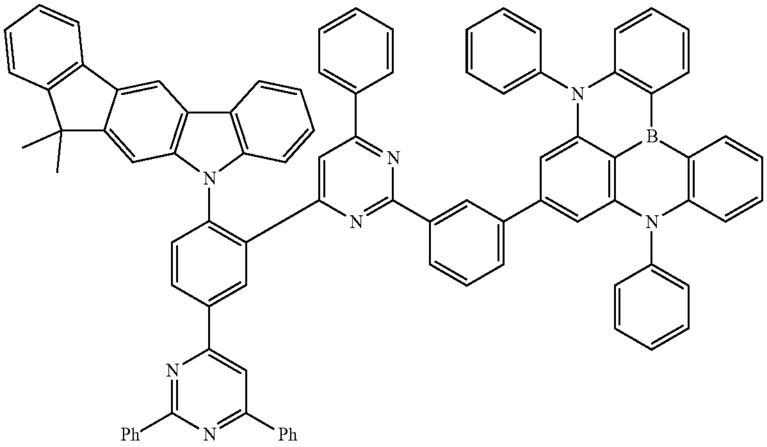
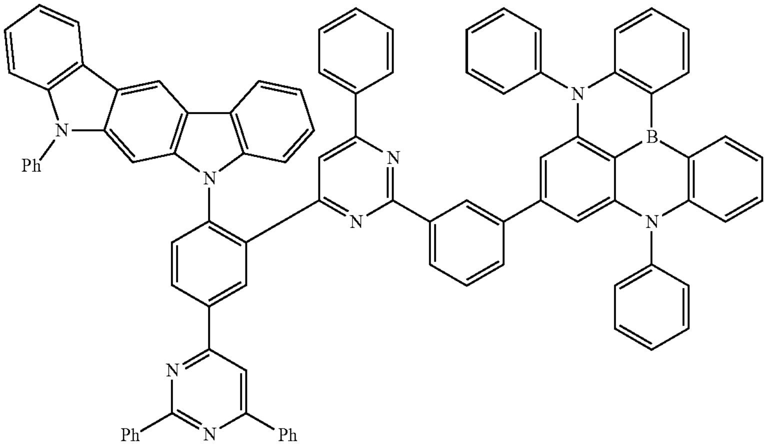
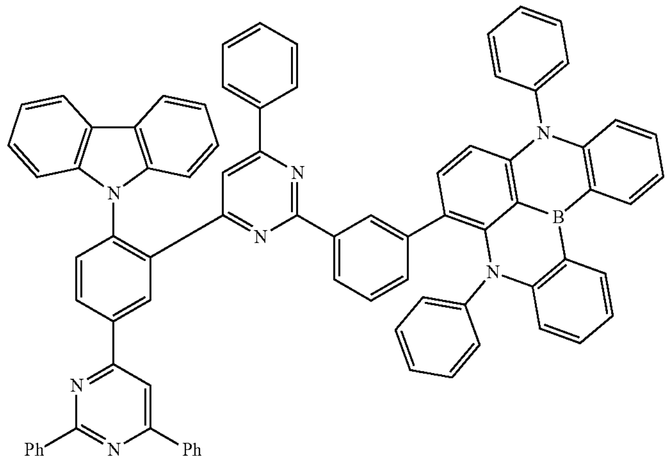

-continued
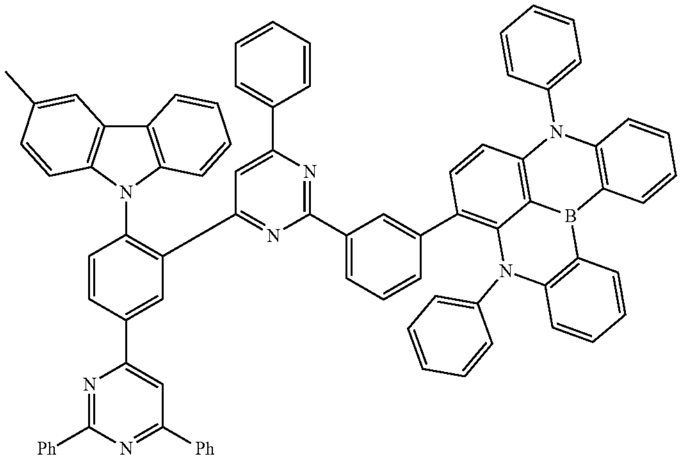
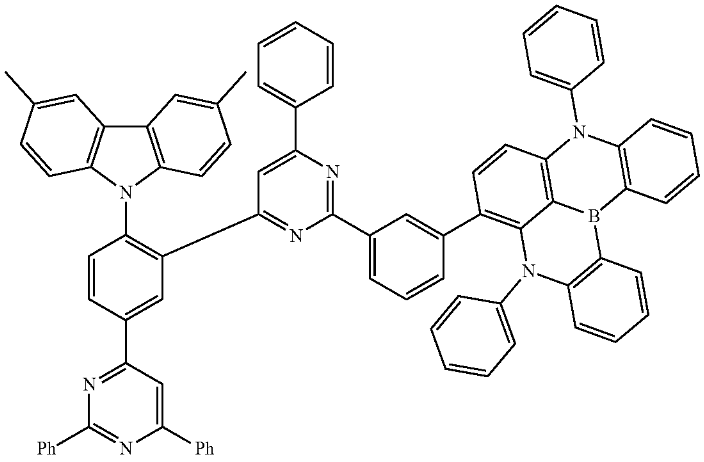
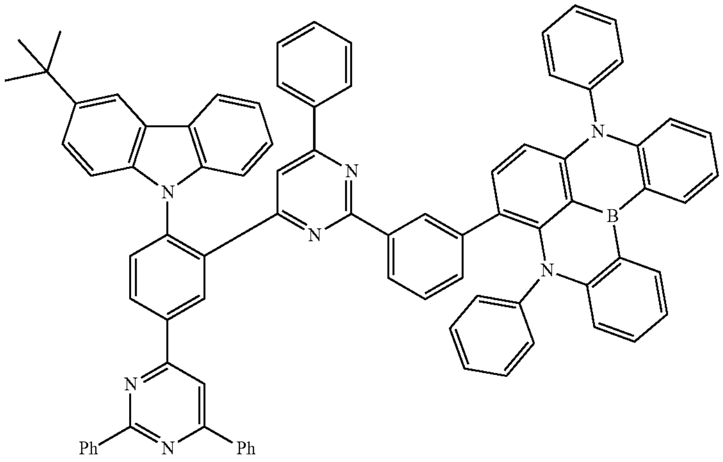

-continued
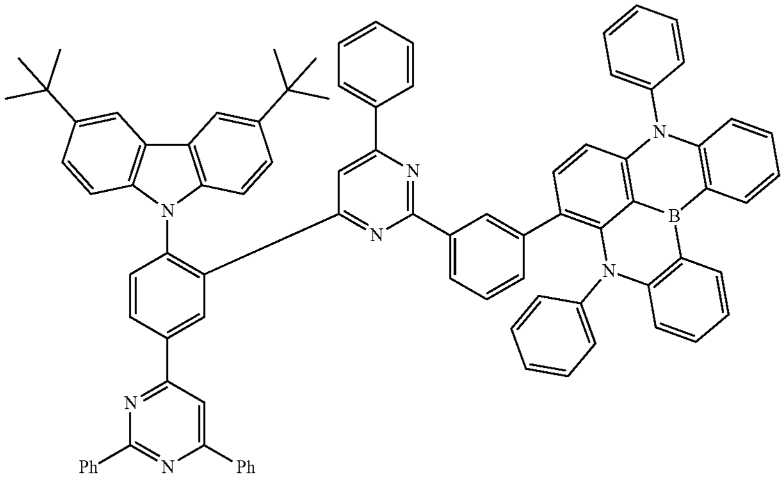
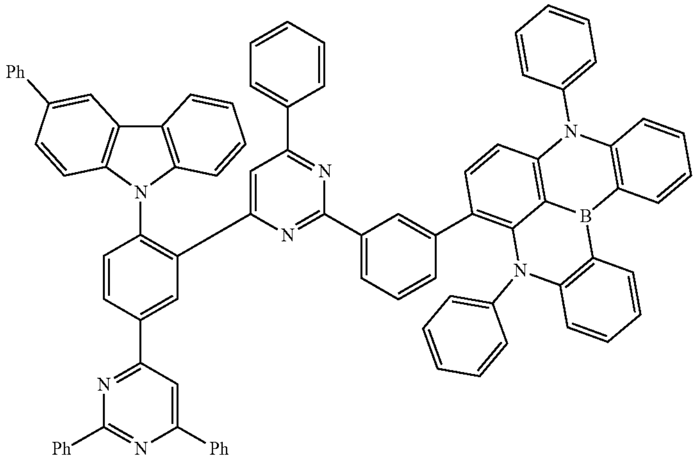
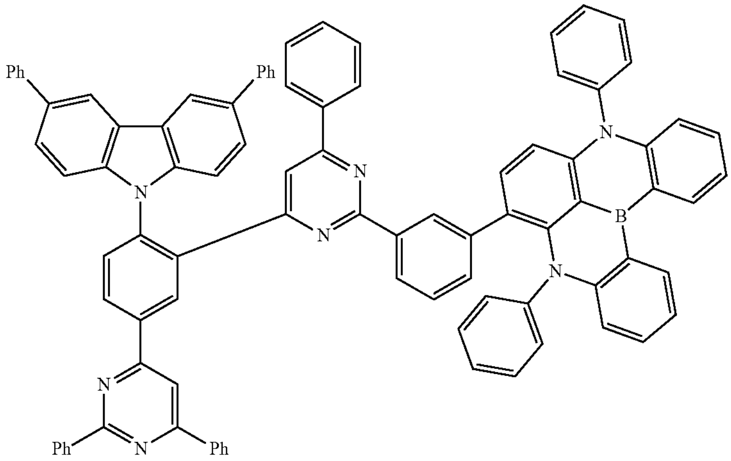

-continued
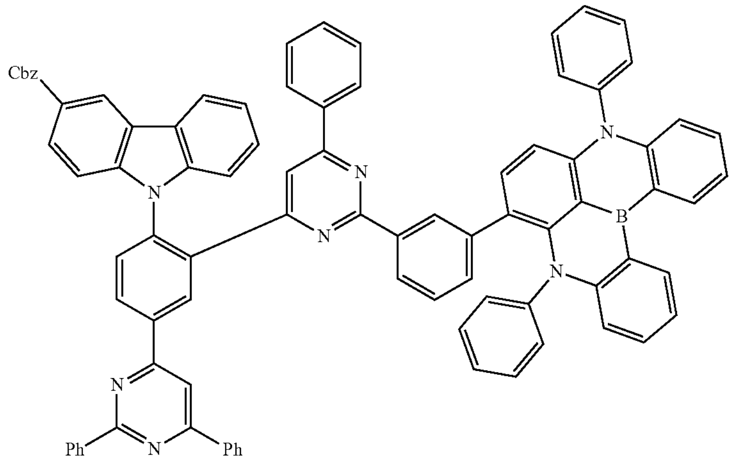
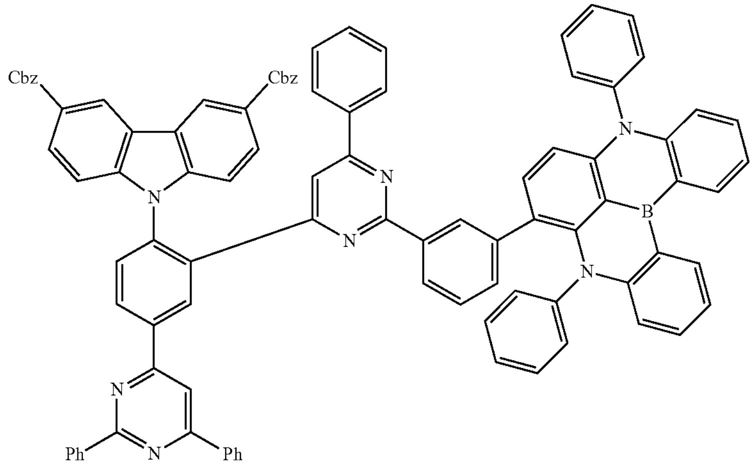
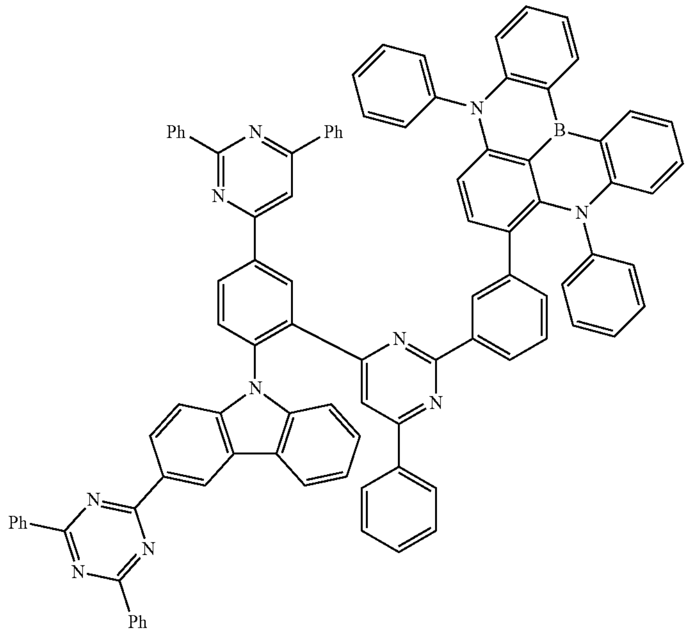

-continued
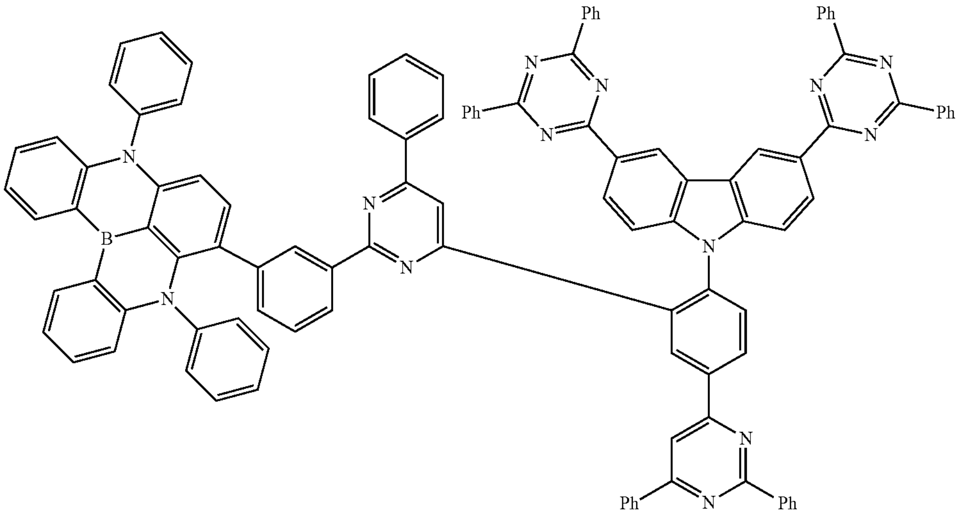
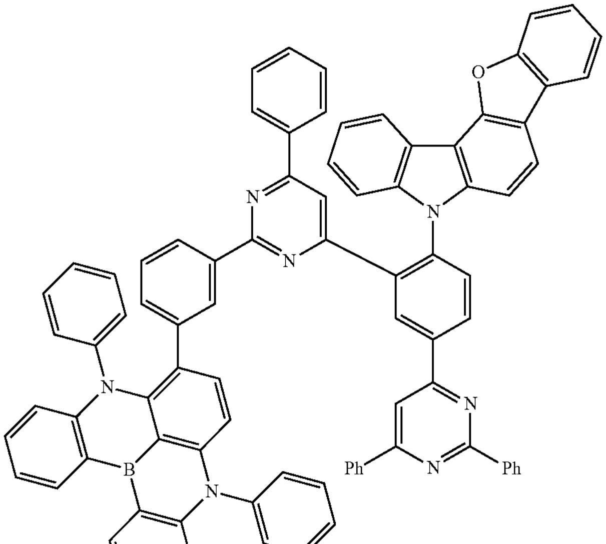

-continued
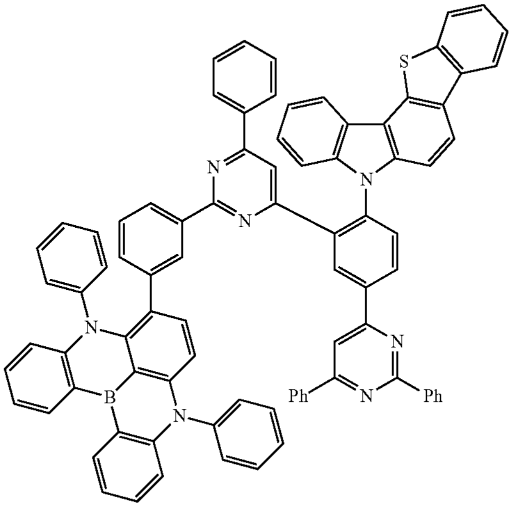
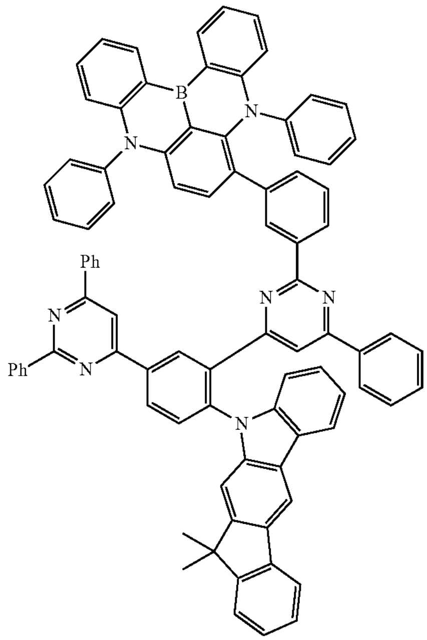
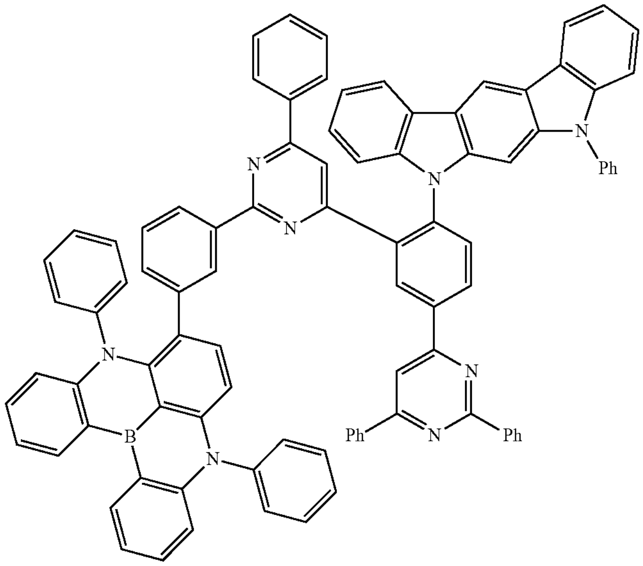
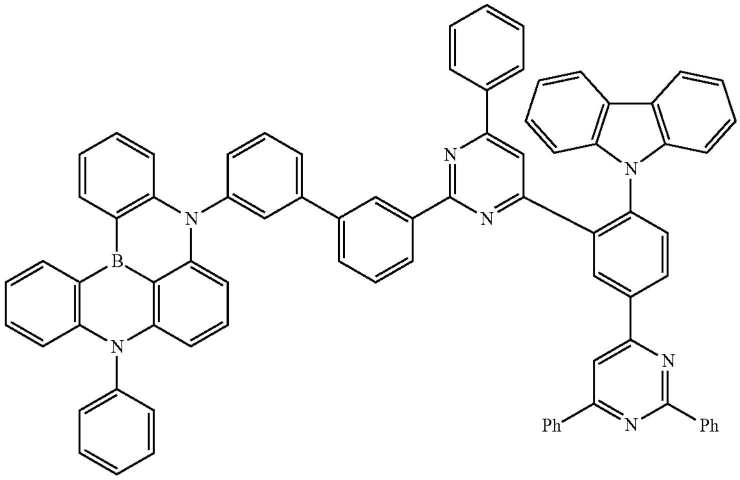

-continued
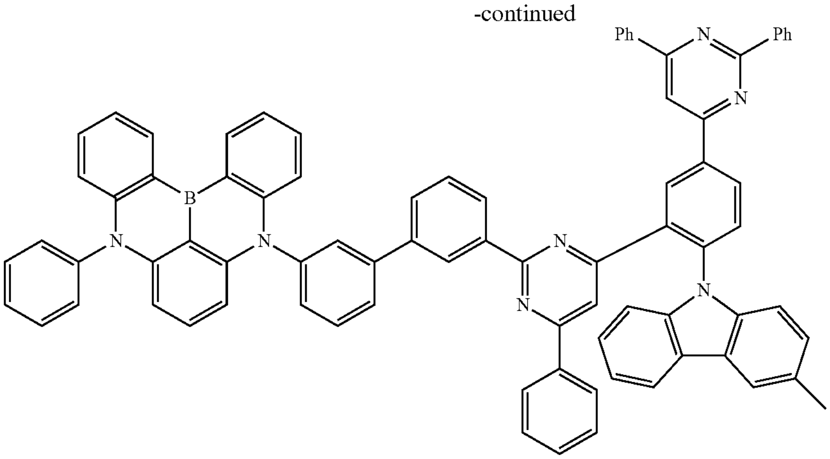
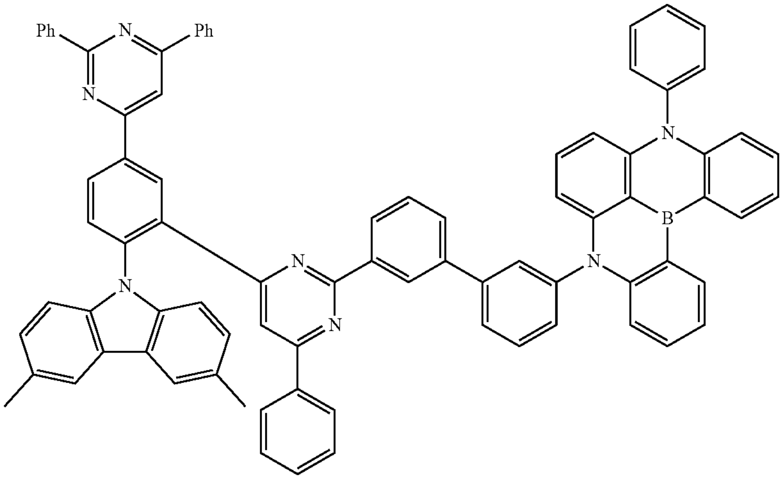
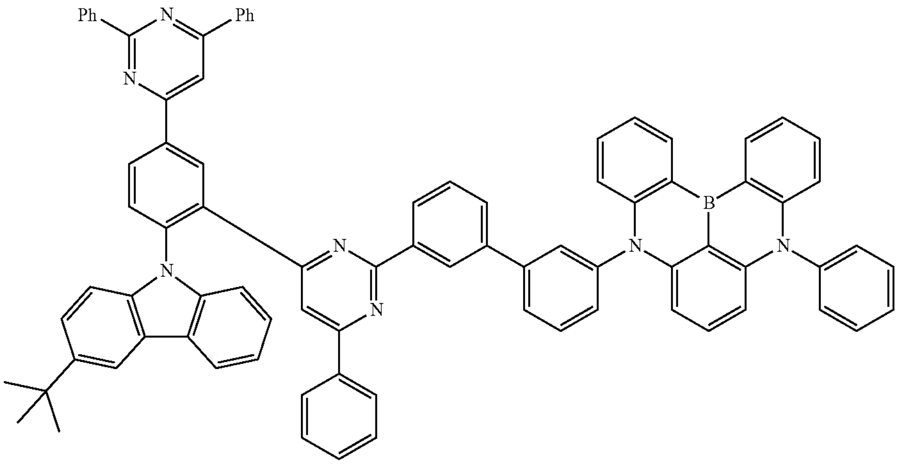

-continued
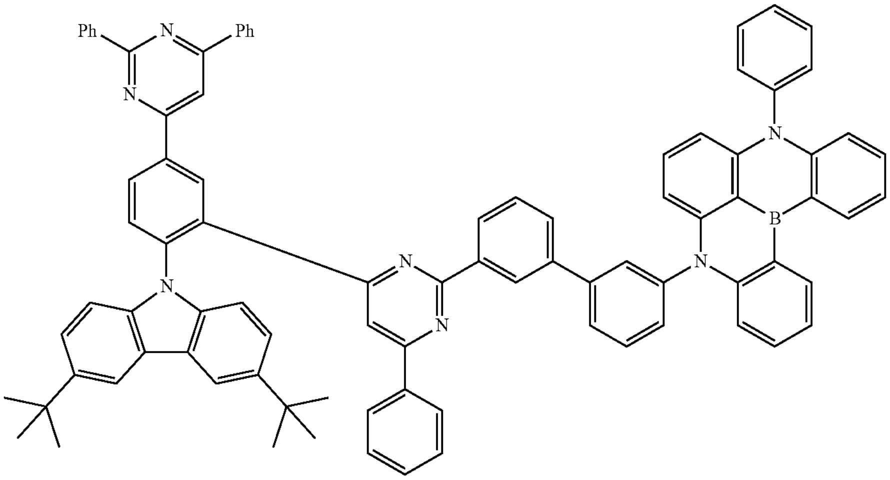
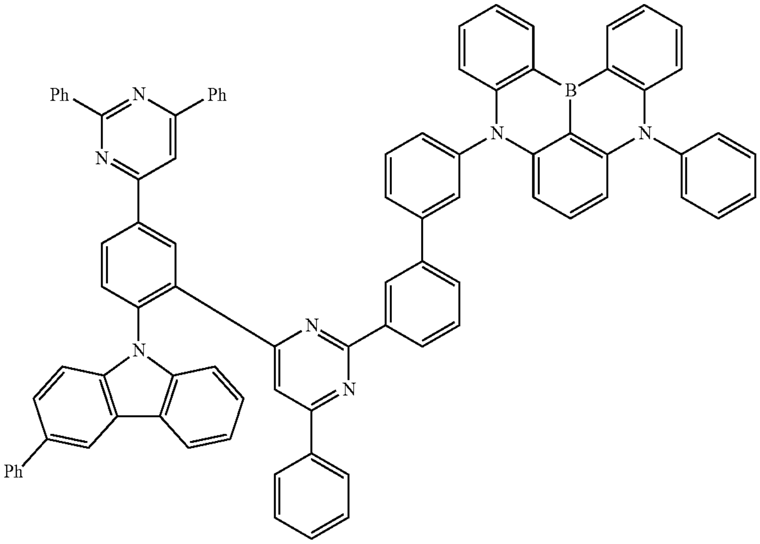
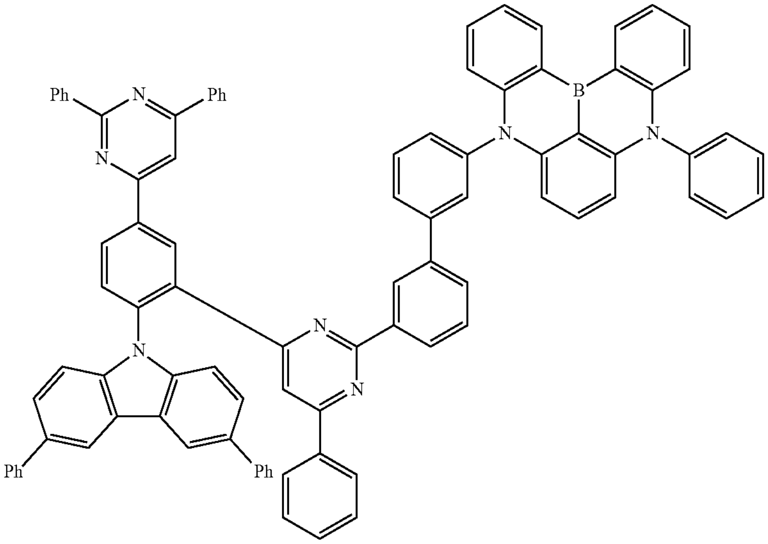

-continued
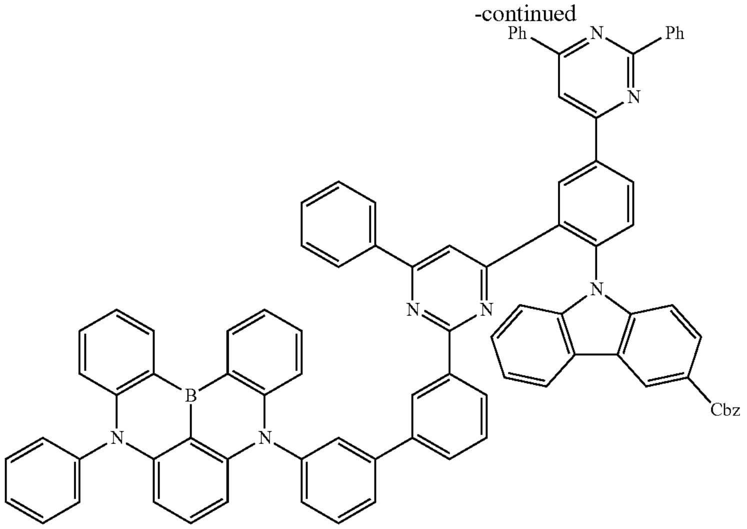
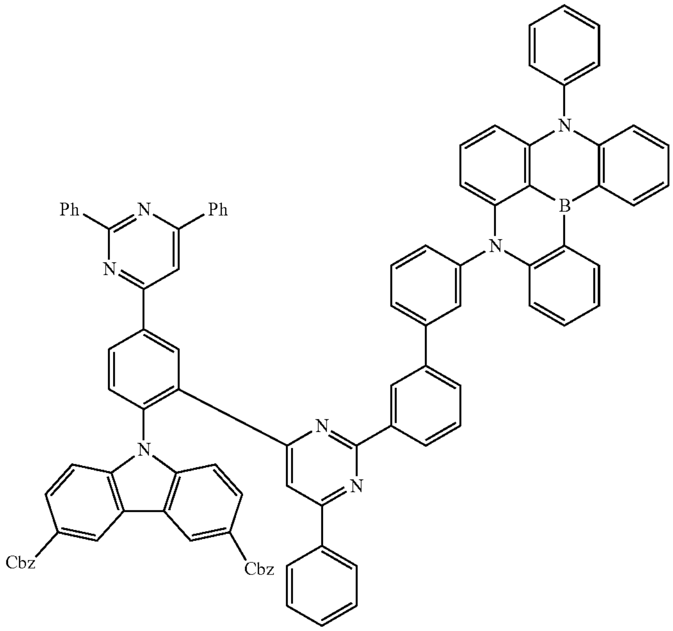
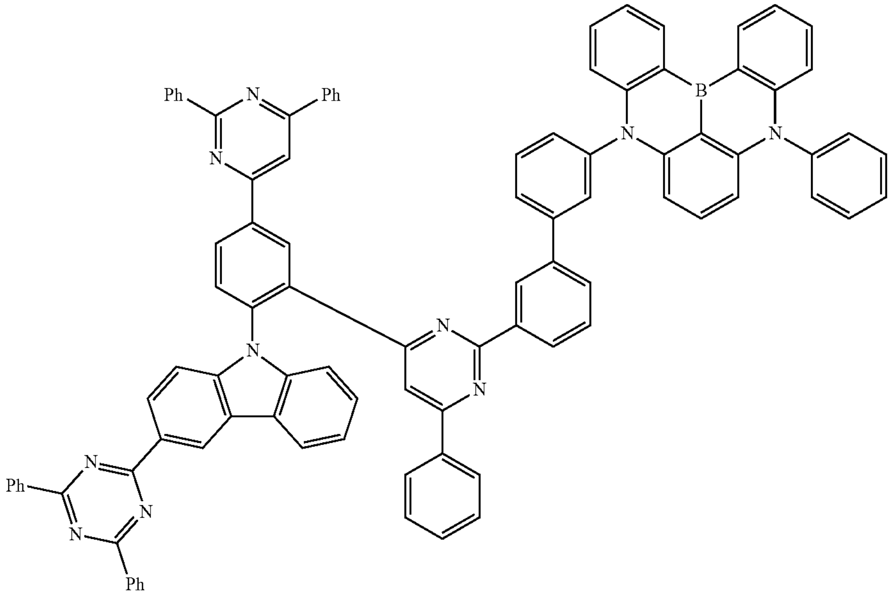

-continued
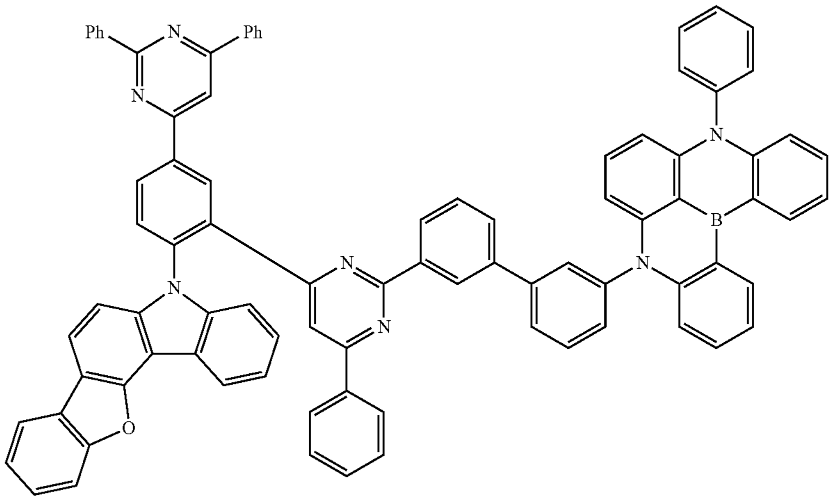
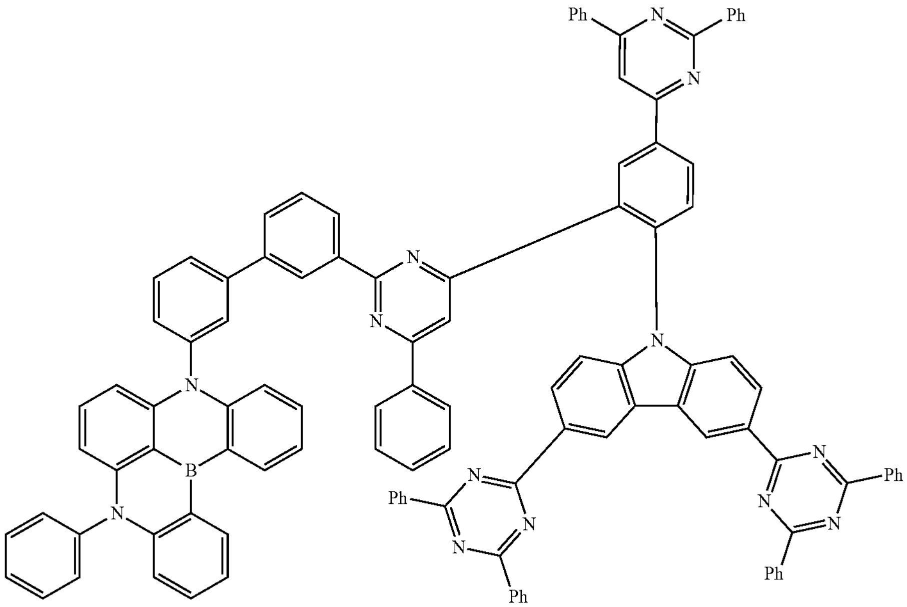
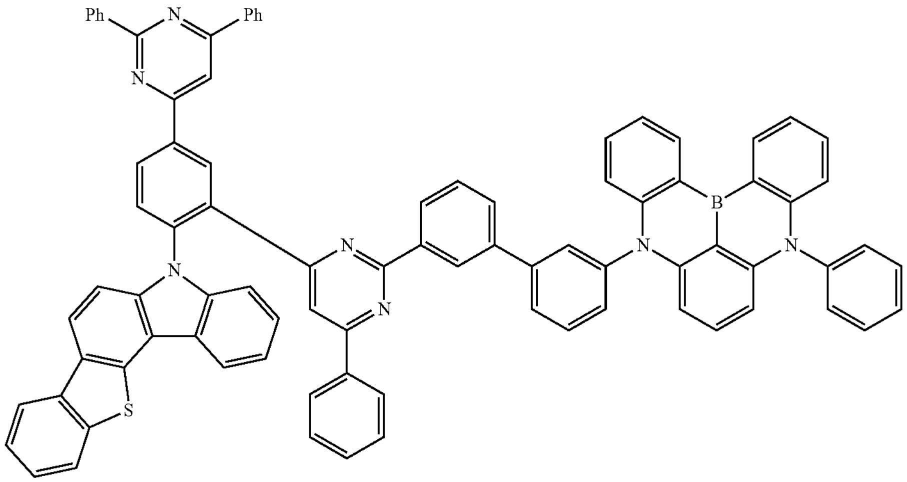

-continued
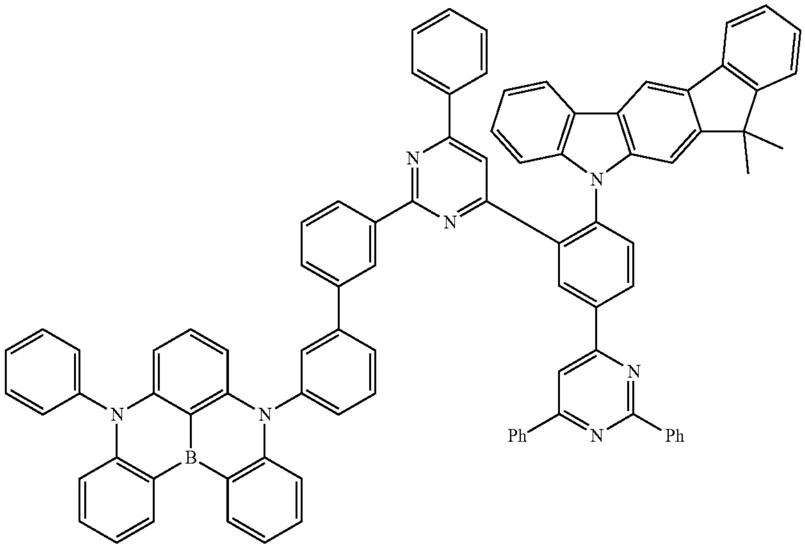
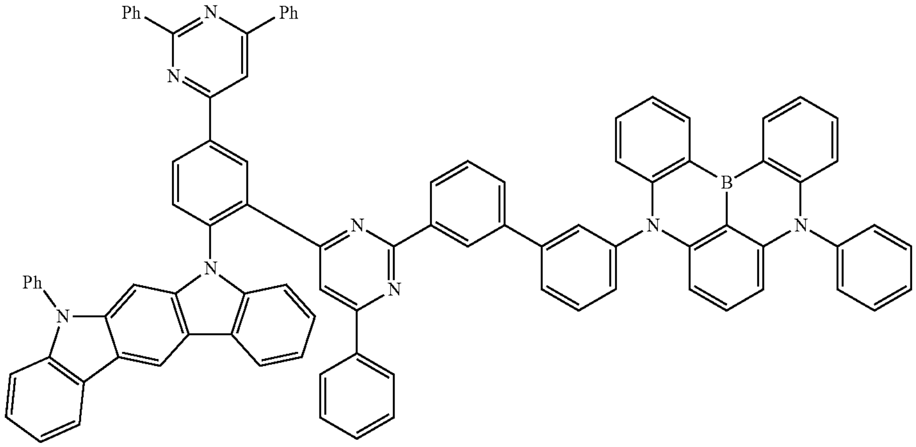
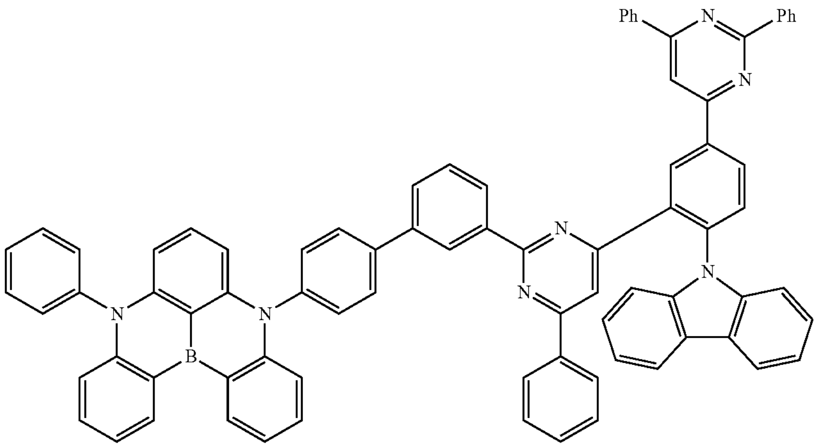

-continued
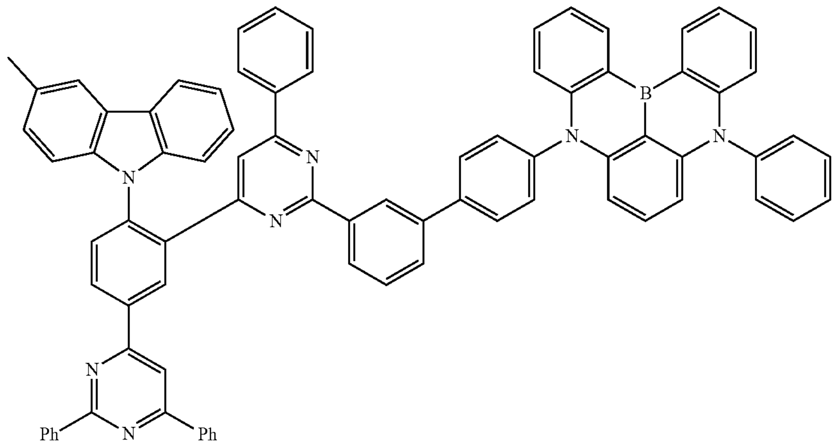
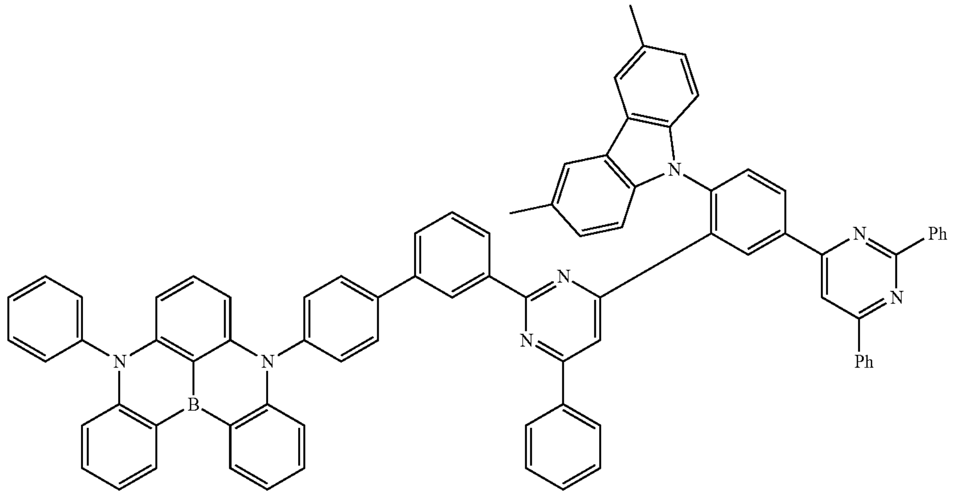
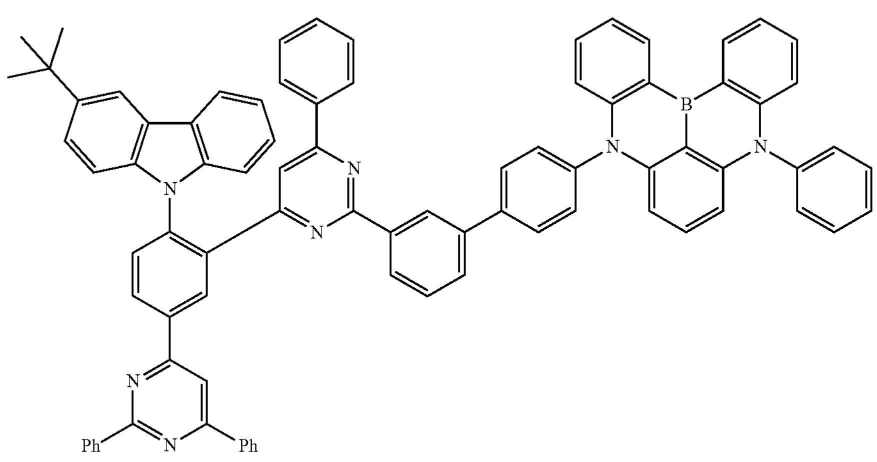

-continued
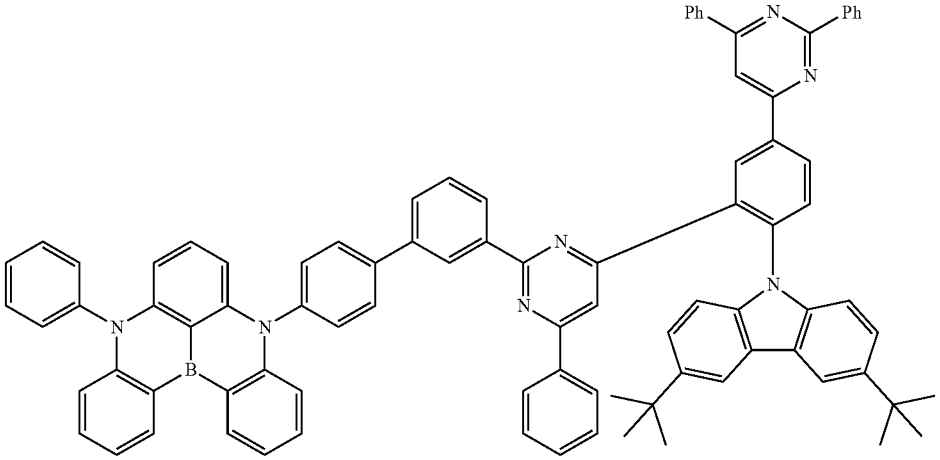
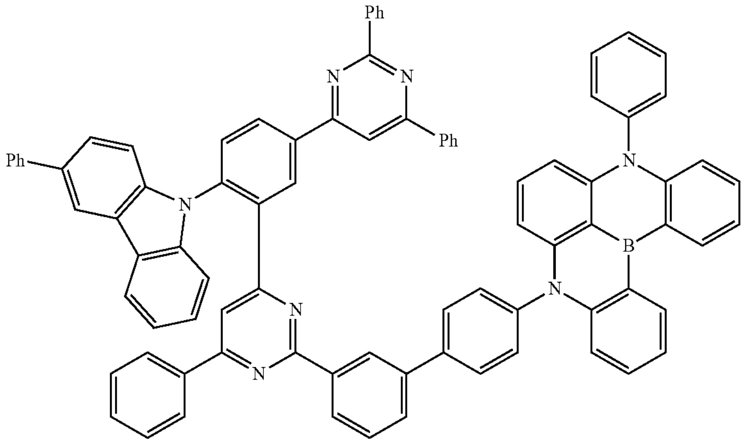
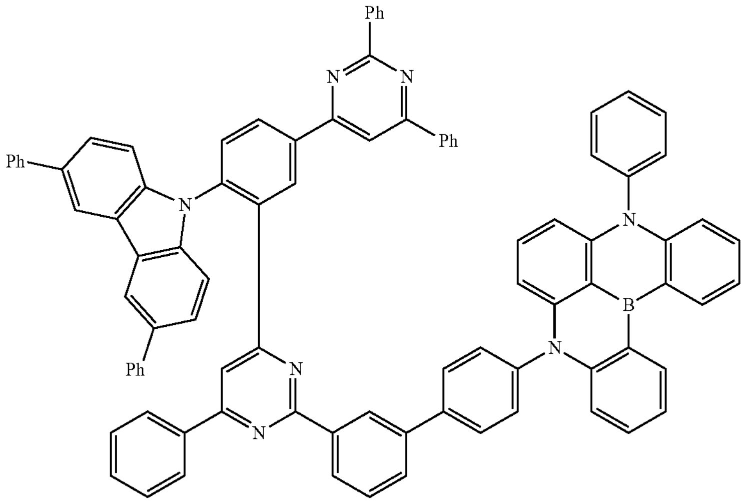

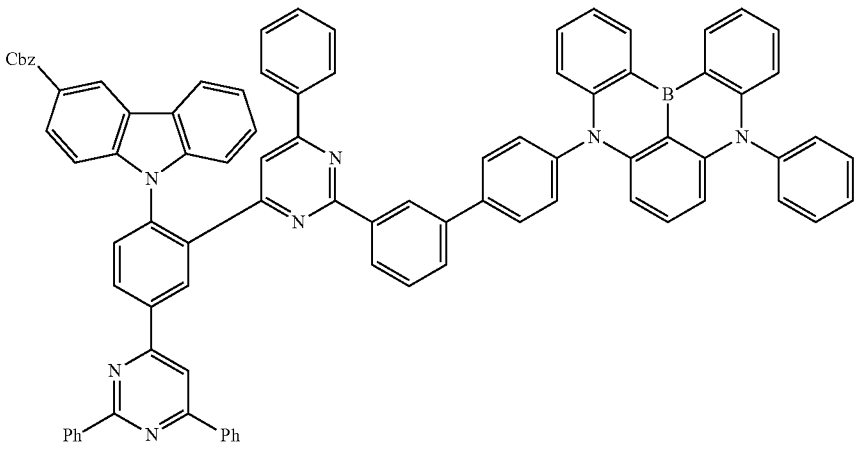
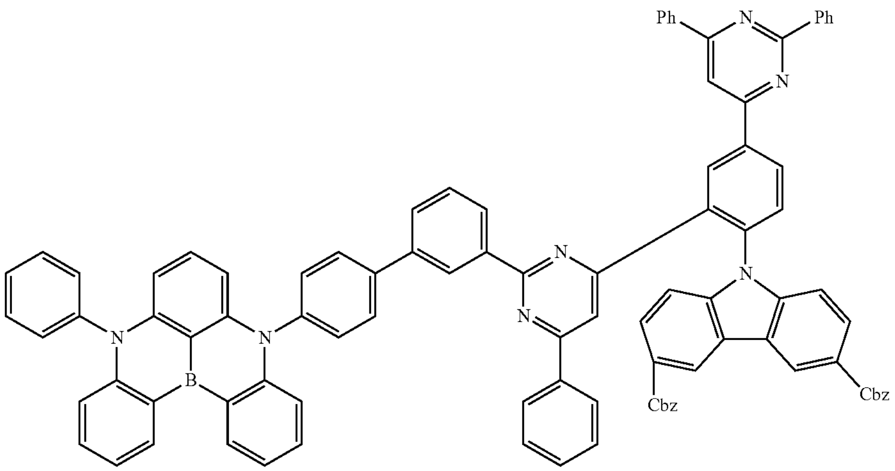
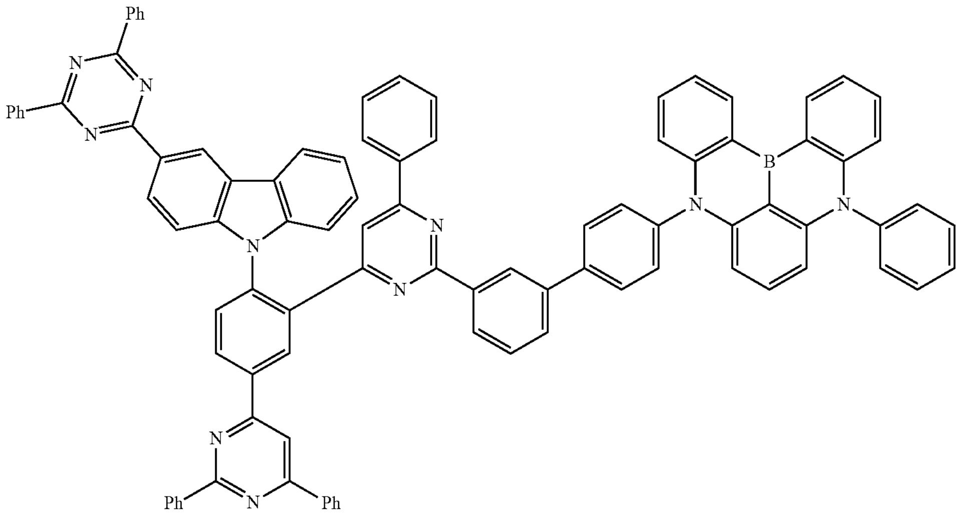

-continued
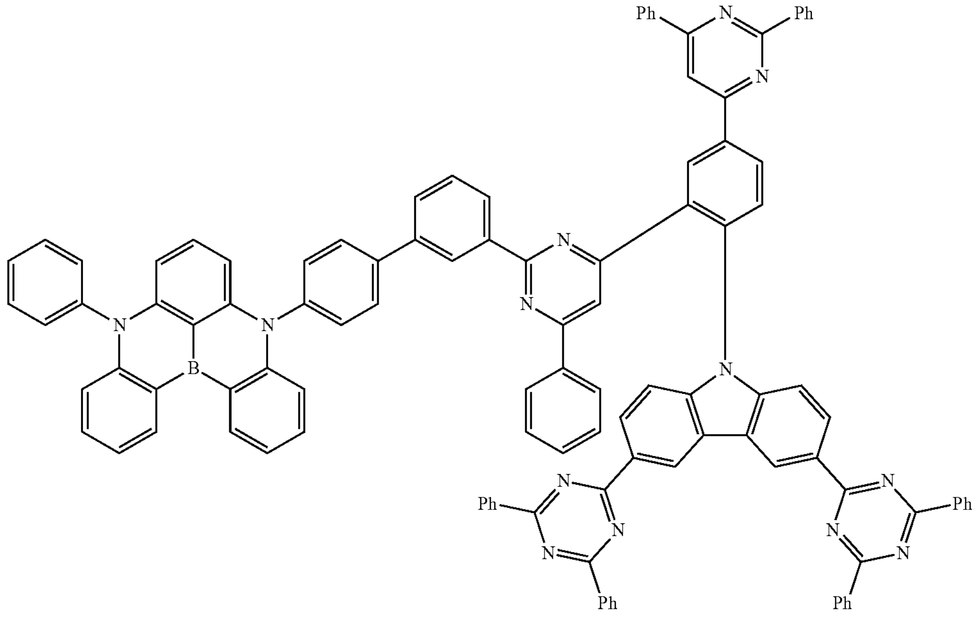 [SMILES: c1ccc(-c2cc(-c3ccc(-n4c5ccc(-c6nc(-c7ccccc7)nc(-c7ccccc7)n6)cc5c5cc(-c6nc(-c7ccccc7)nc(-c7ccccc7)n6)ccc54)c(-c4cc(-c5ccccc5)nc(-c5cccc(-c6ccc(N7c8ccccc8B8c9ccccc9N(c9ccccc9)c9cccc7c98)cc6)c5)n4)c3)nc(-c3ccccc3)n2)cc1]
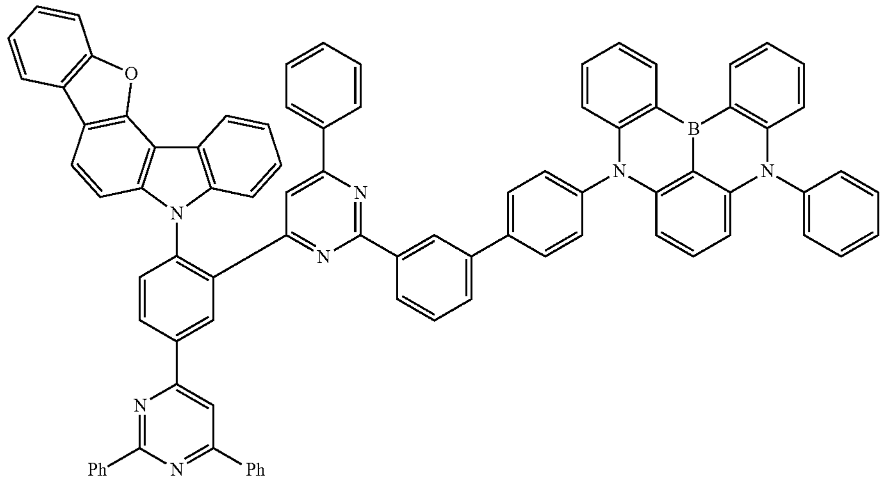
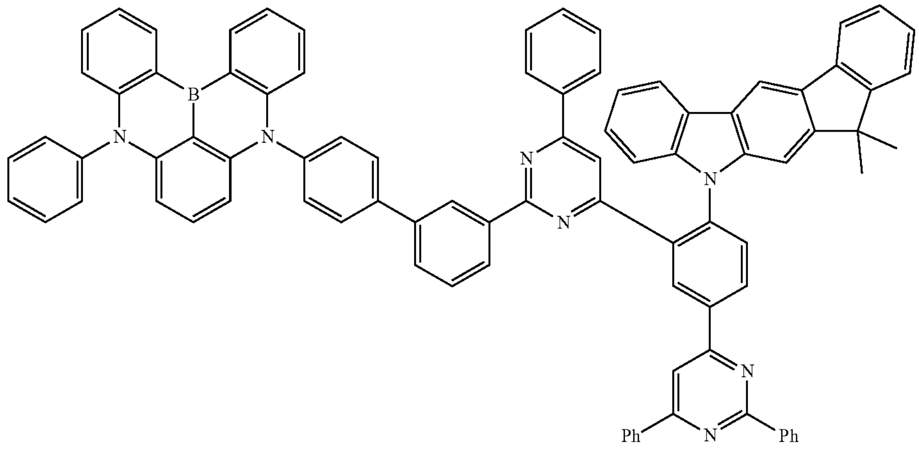

-continued
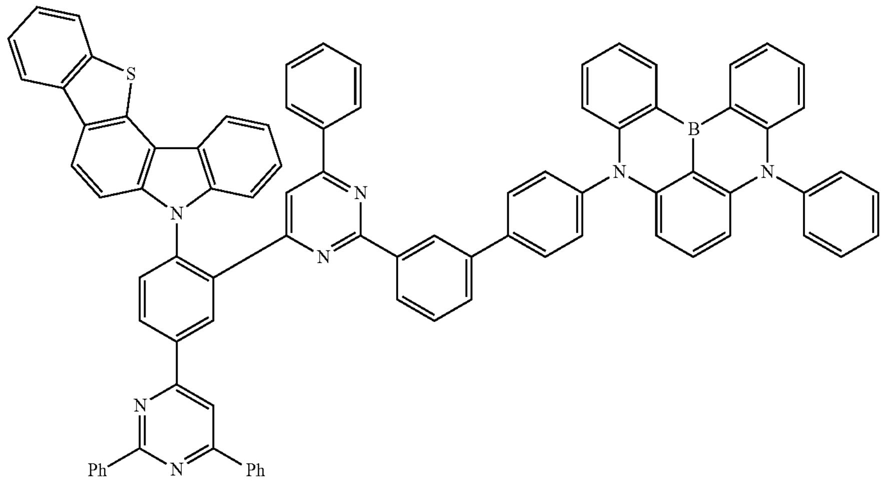
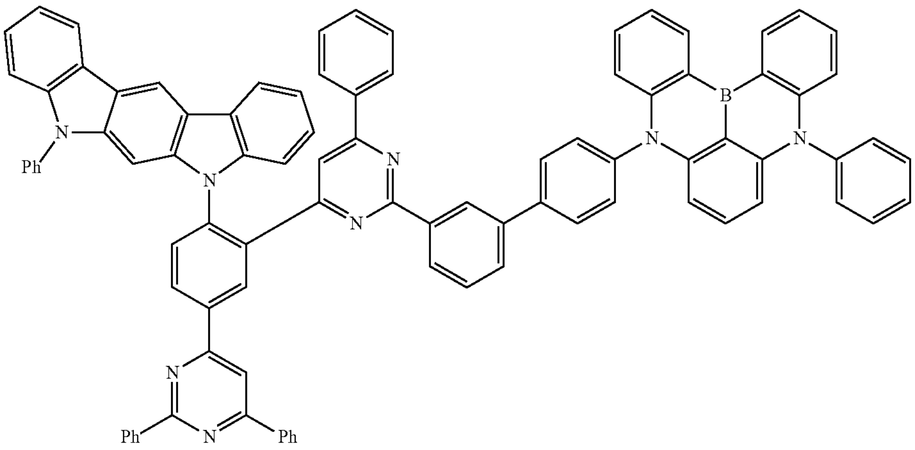
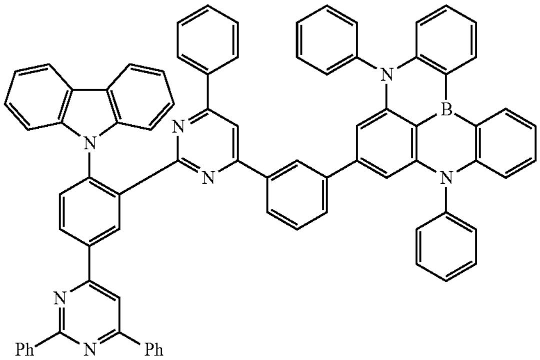
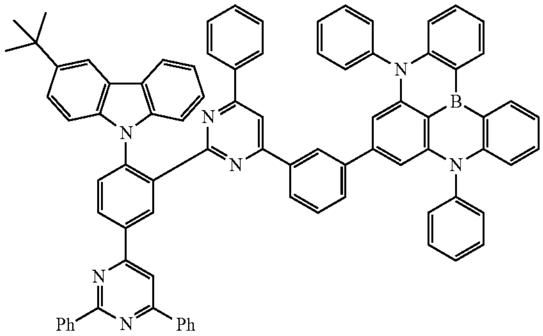

-continued
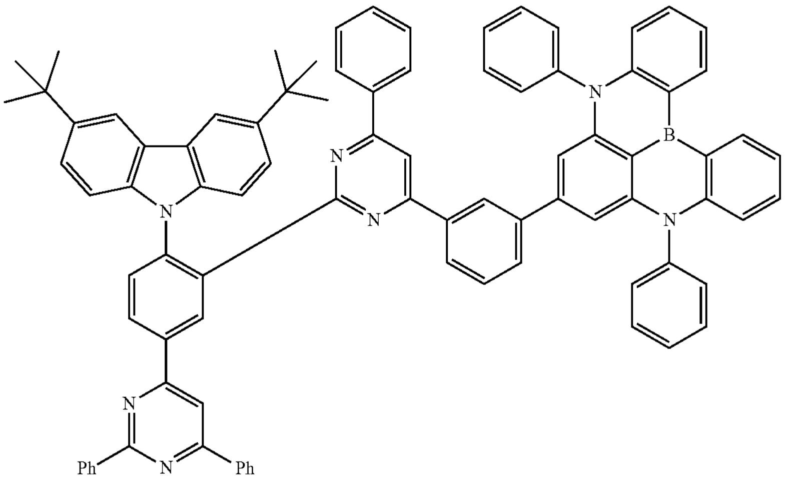
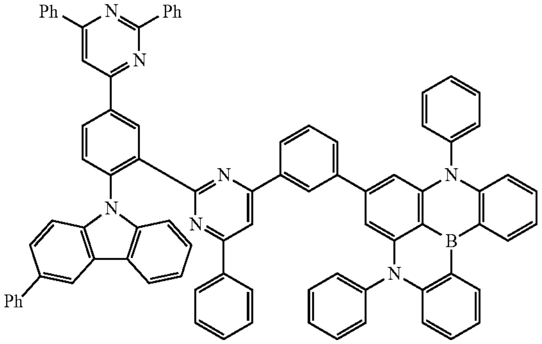
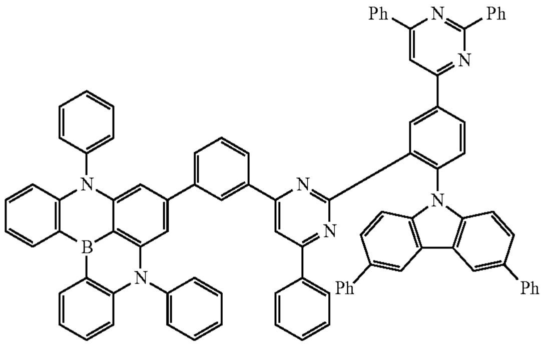
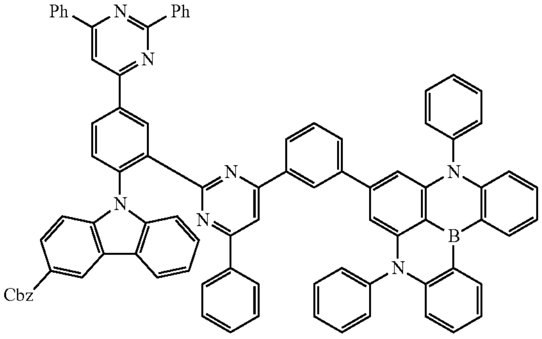
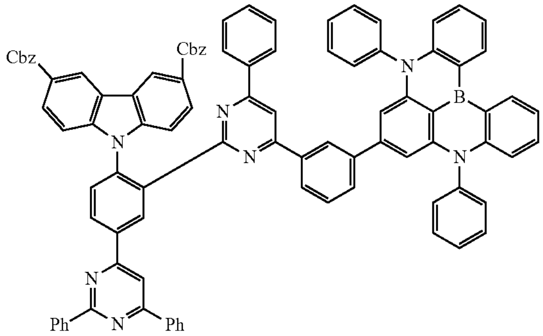
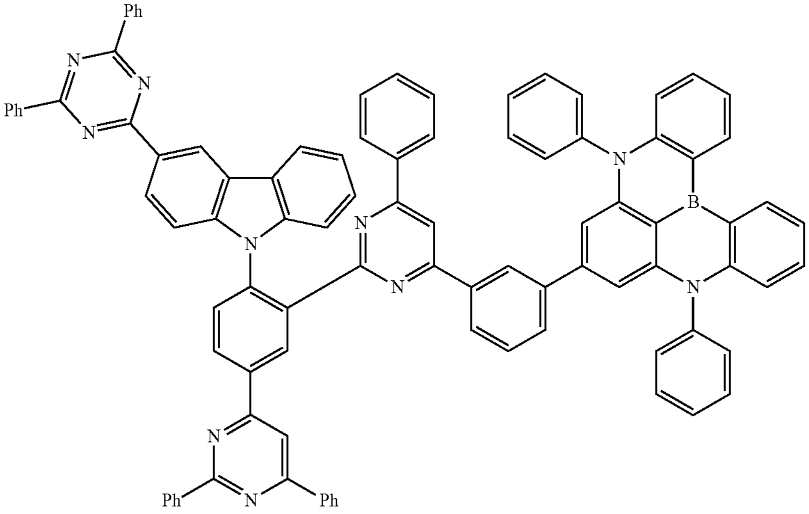

-continued
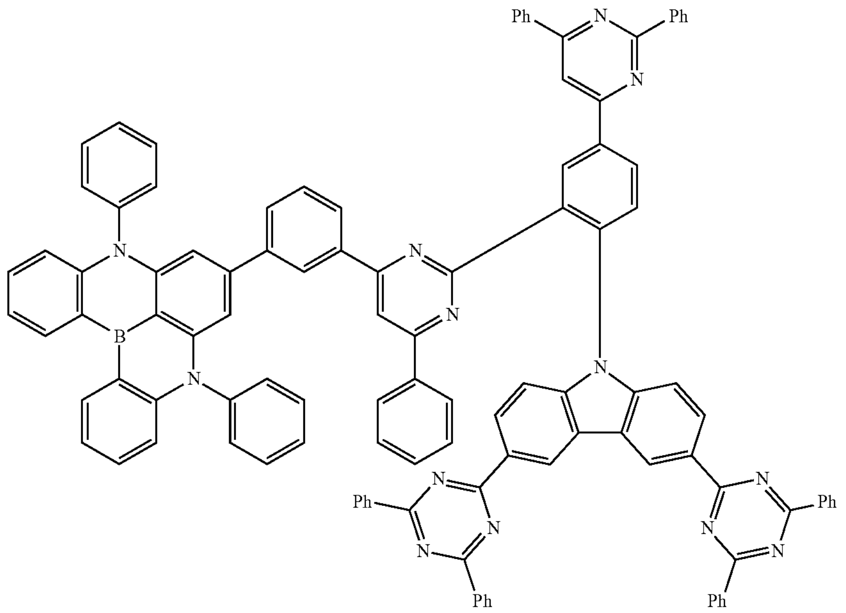
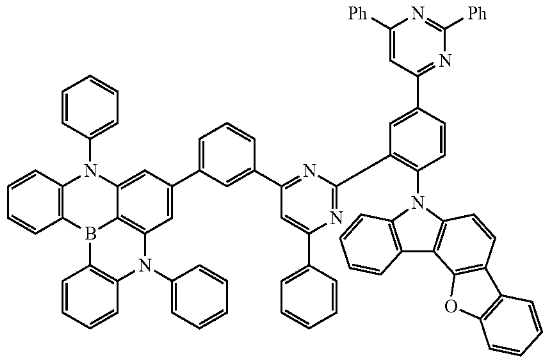
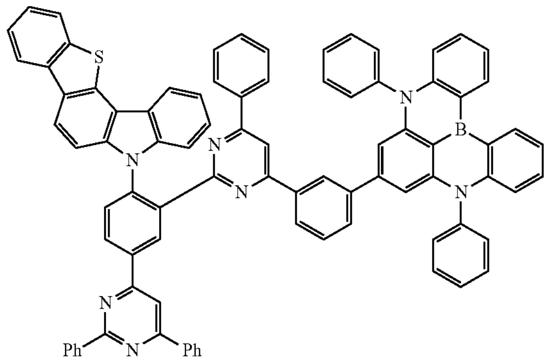
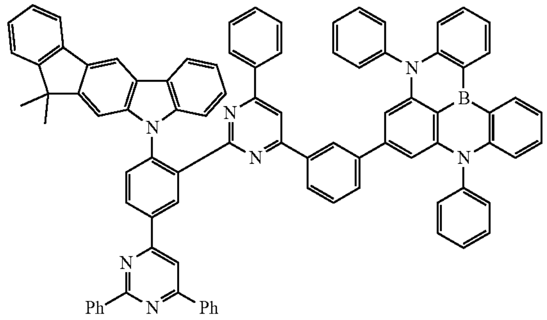
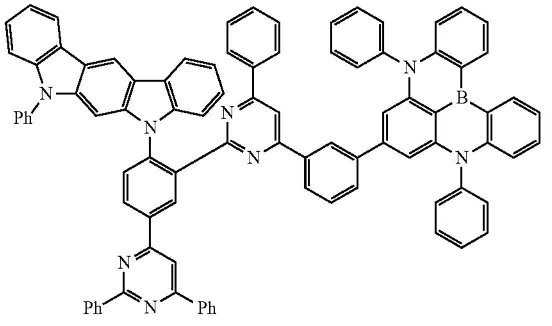
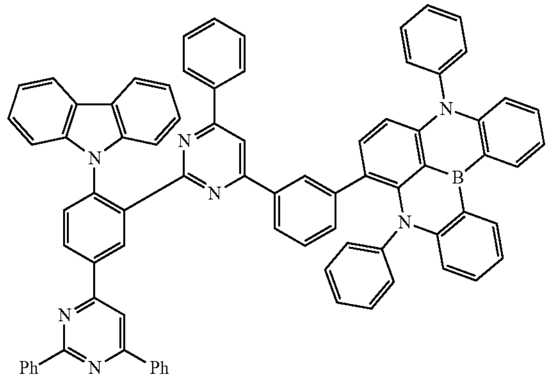
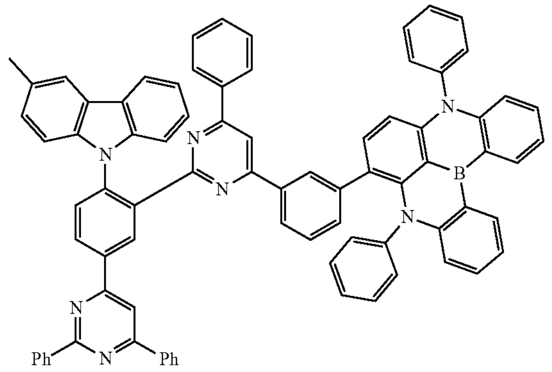

-continued
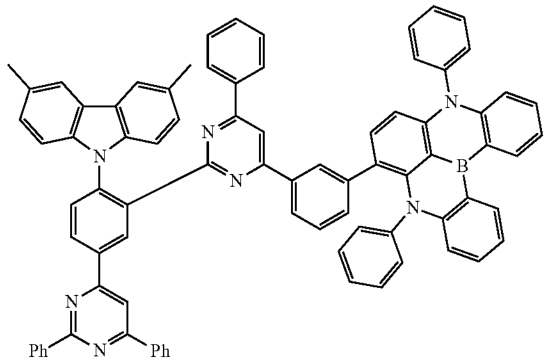
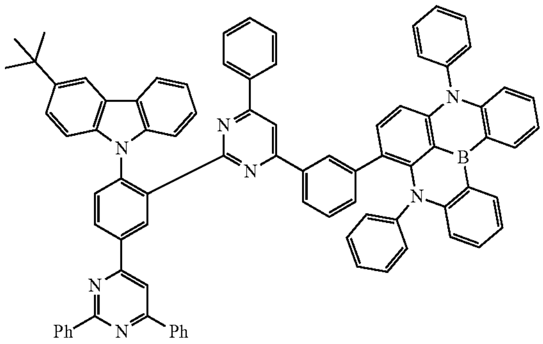
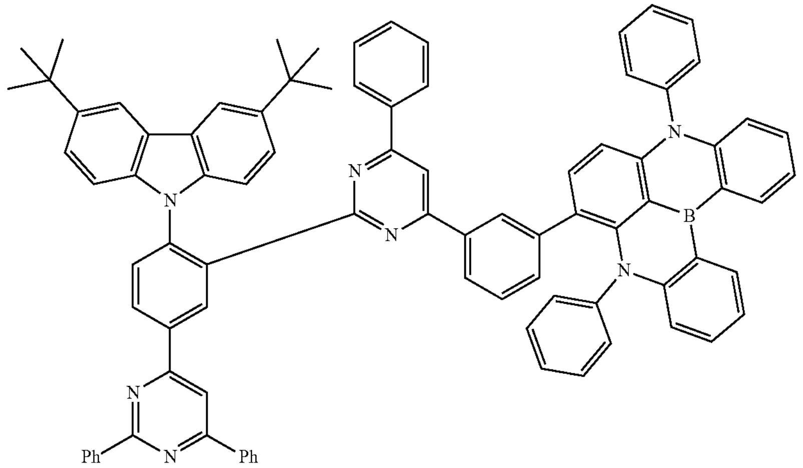
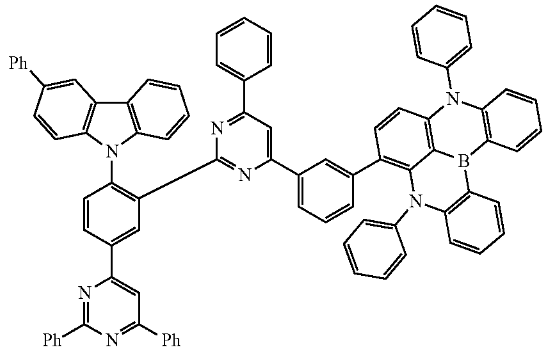
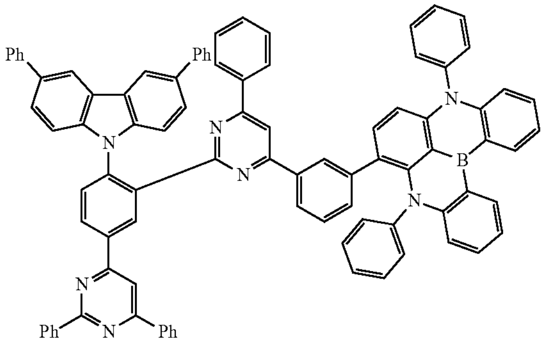
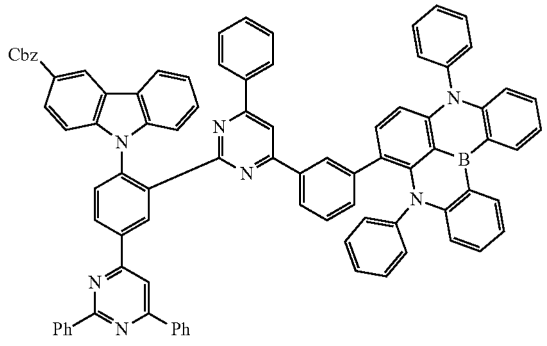
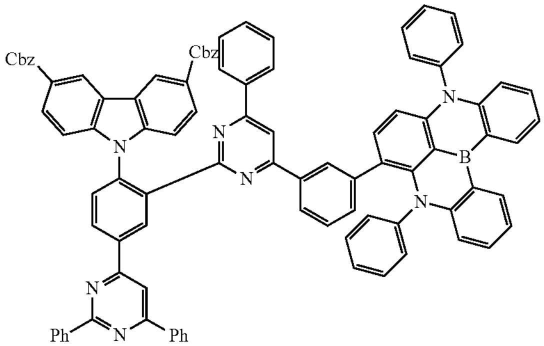

-continued
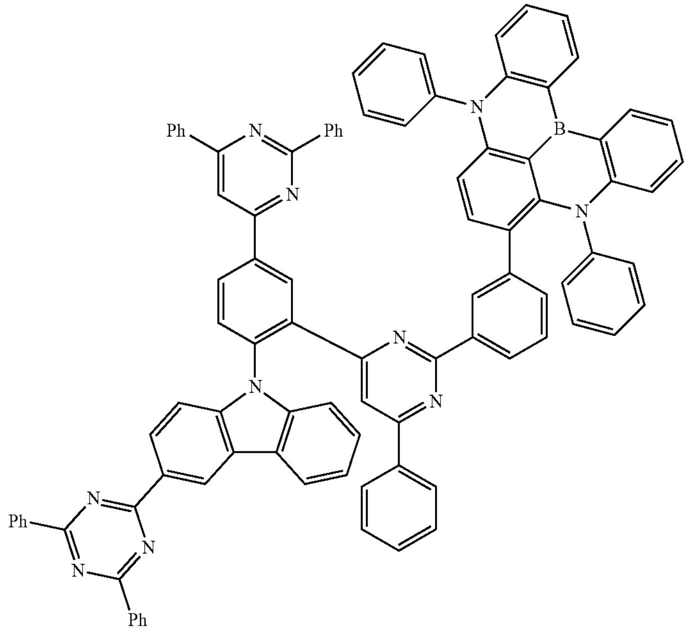
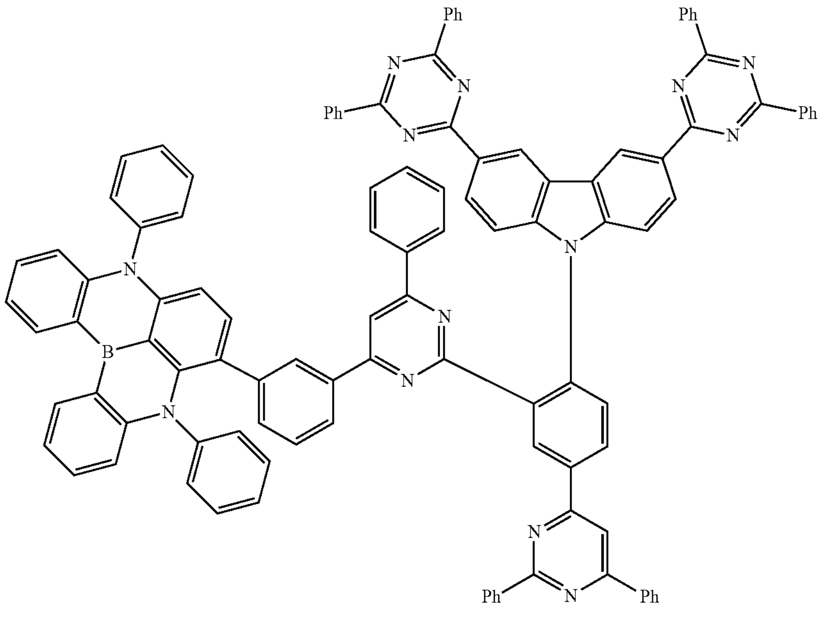

-continued
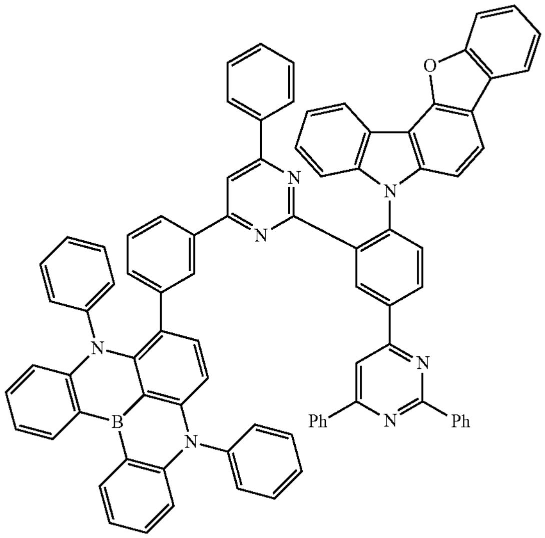
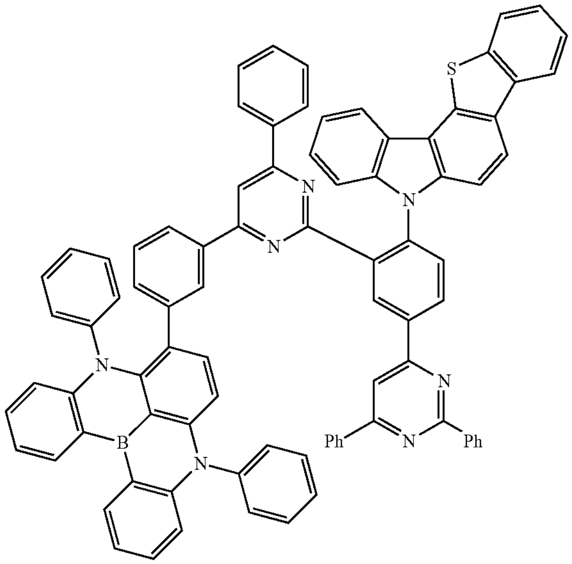
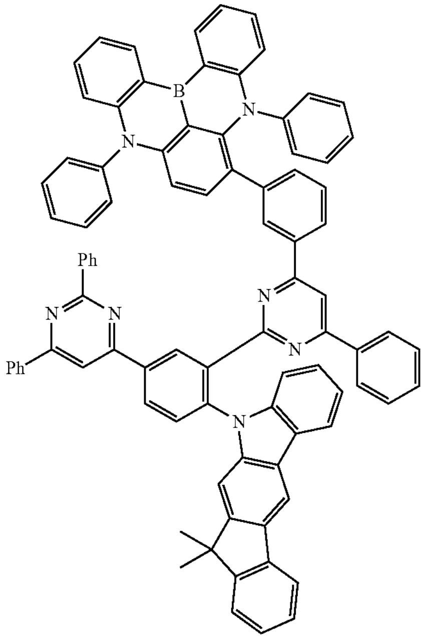
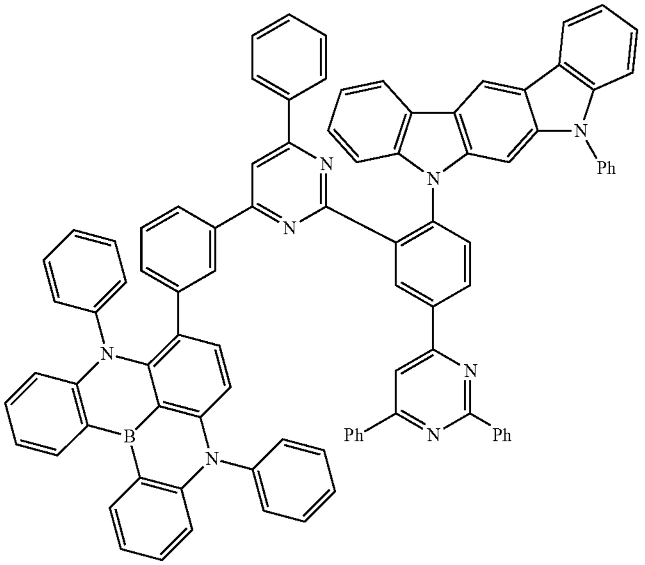
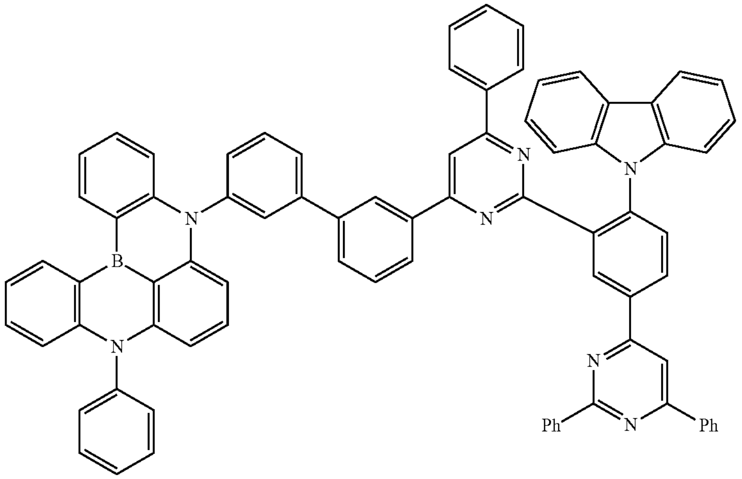

-continued
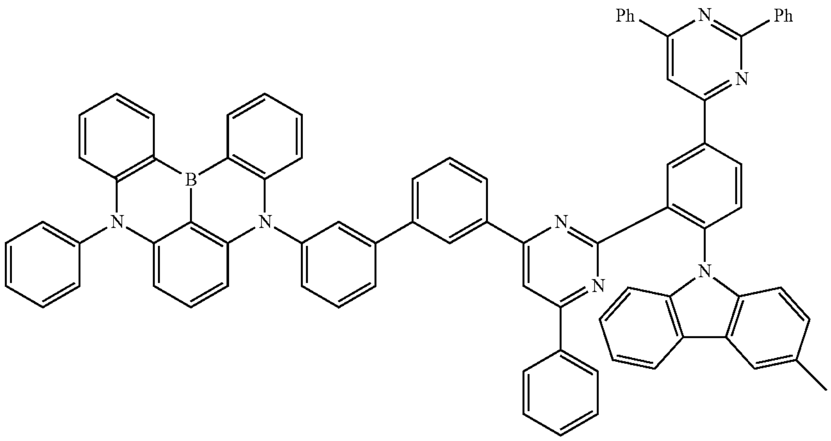
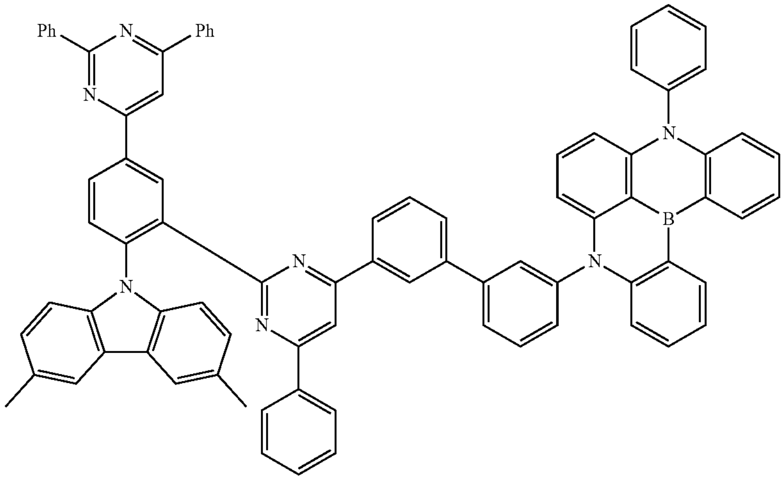
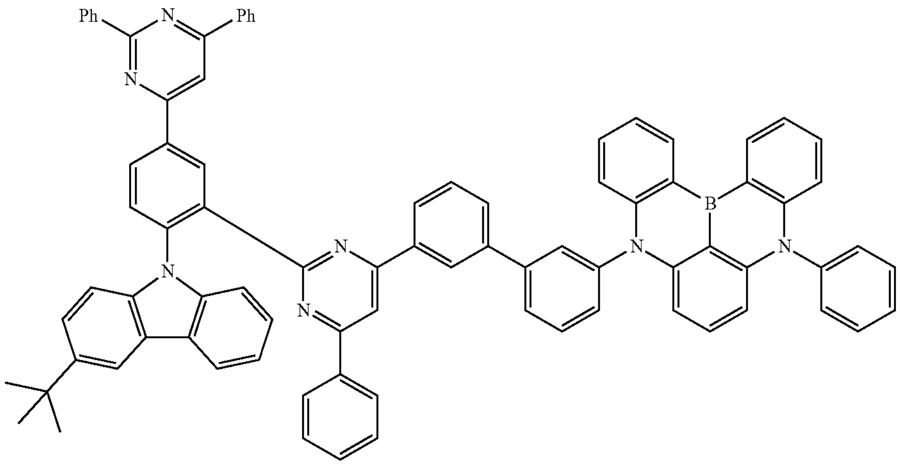

-continued
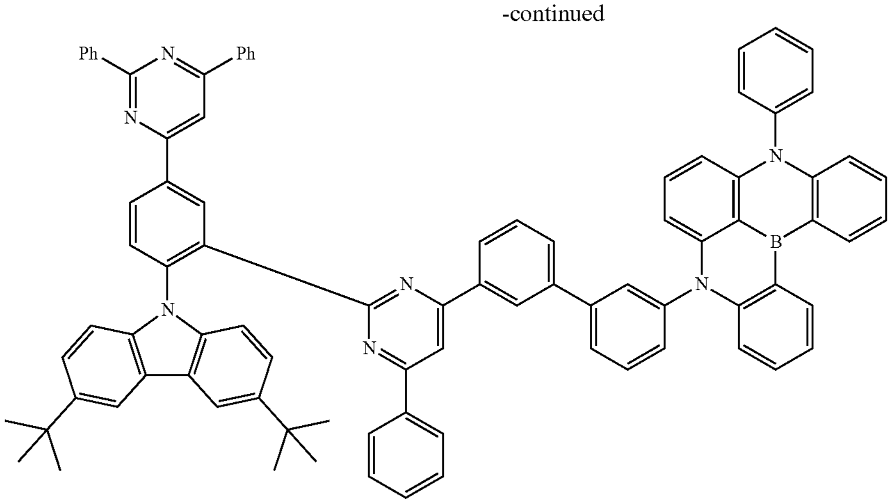
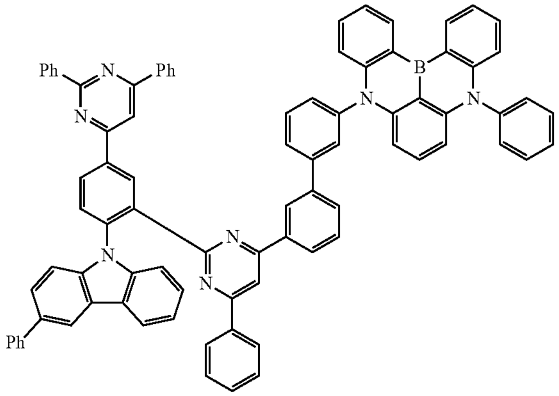
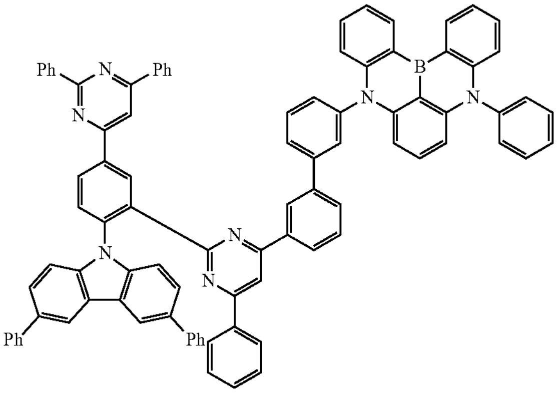
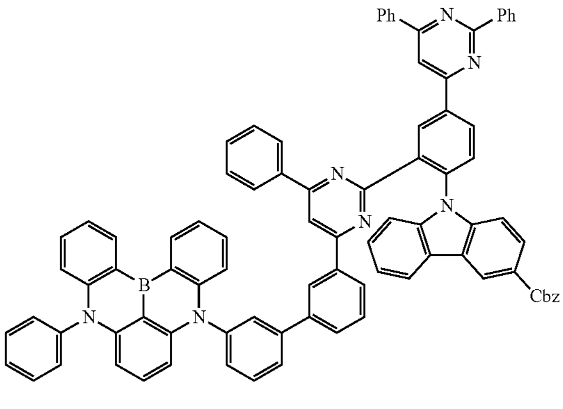
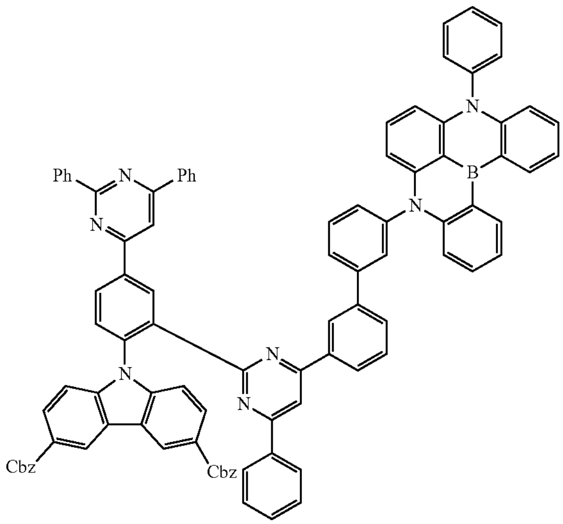

-continued
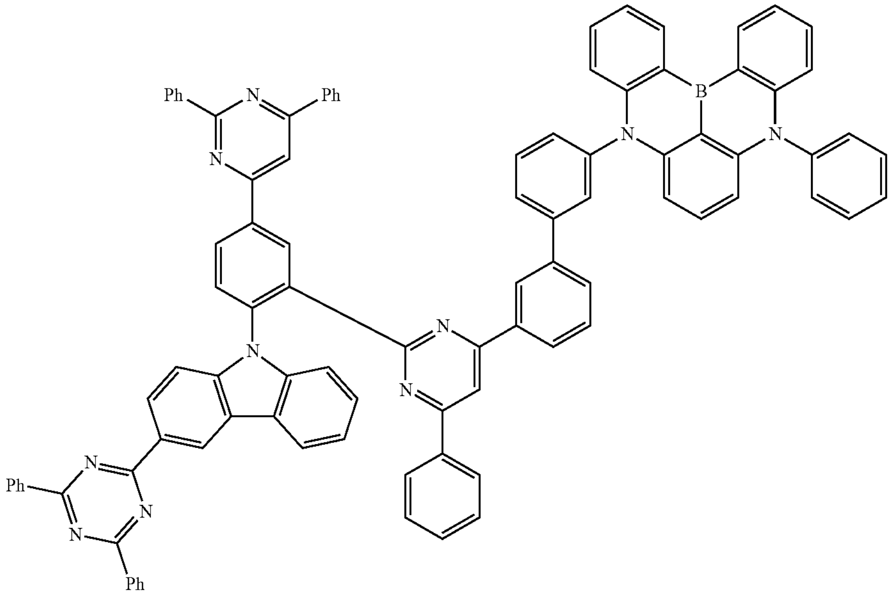
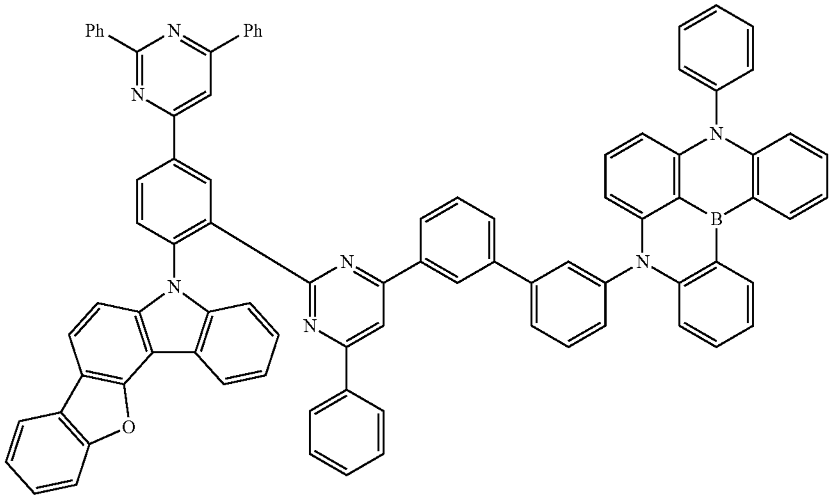
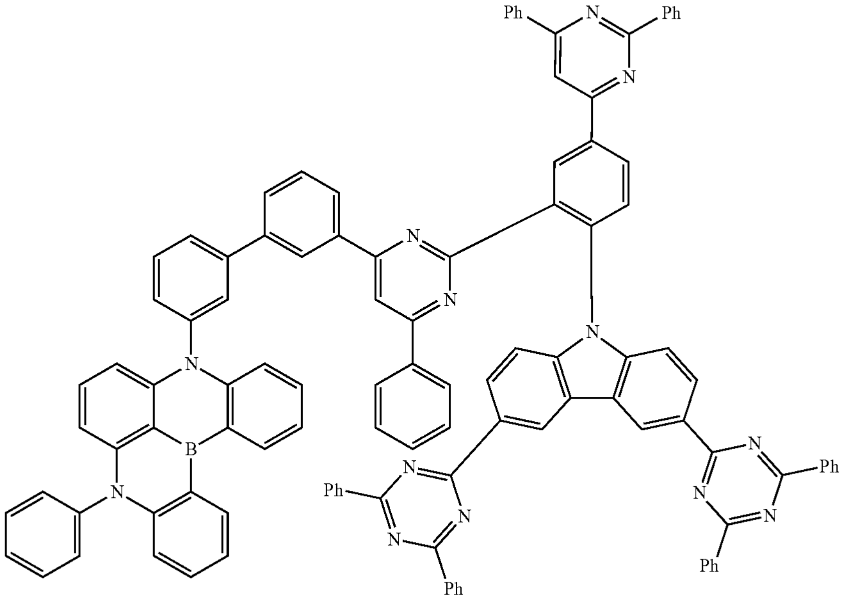

-continued
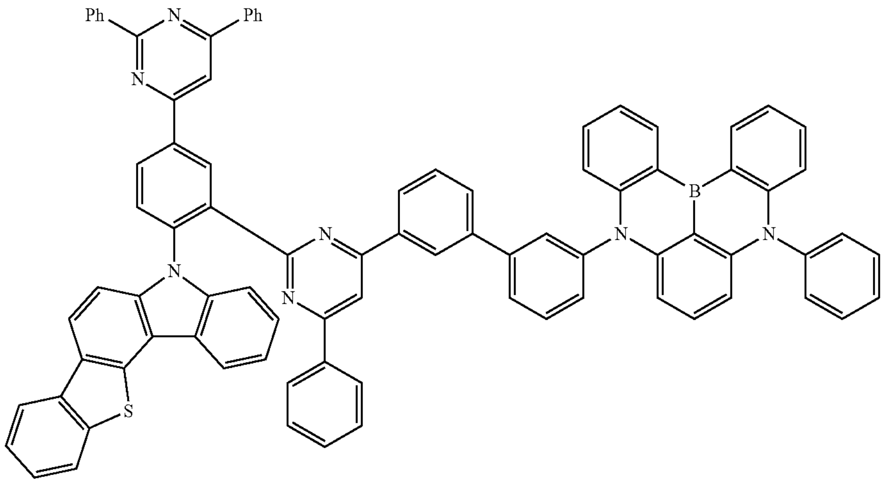
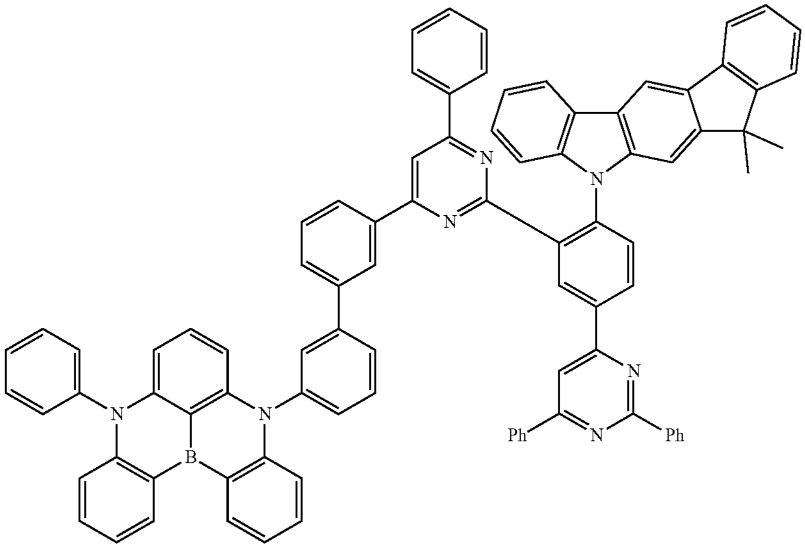
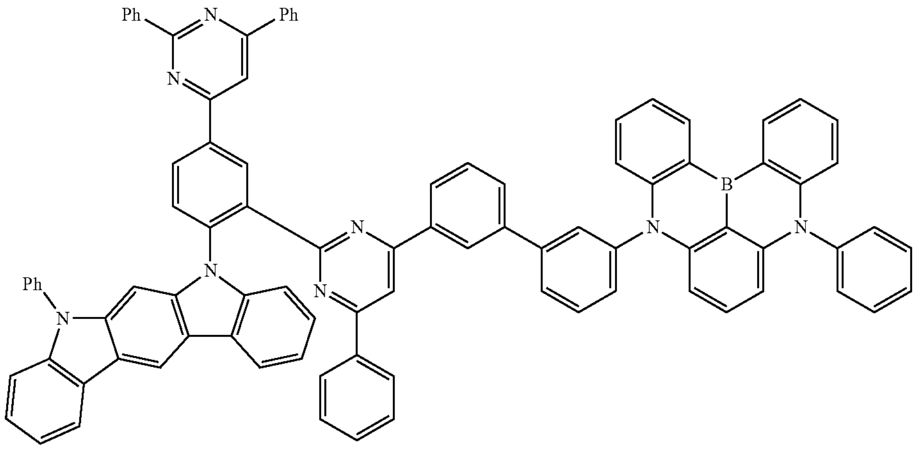

-continued
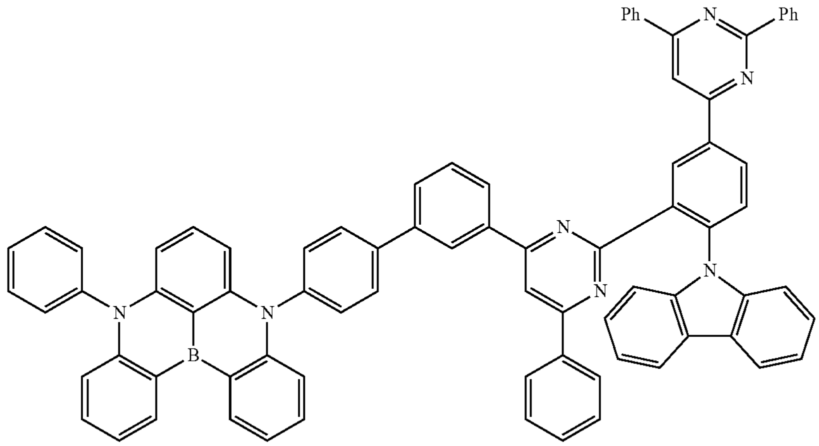
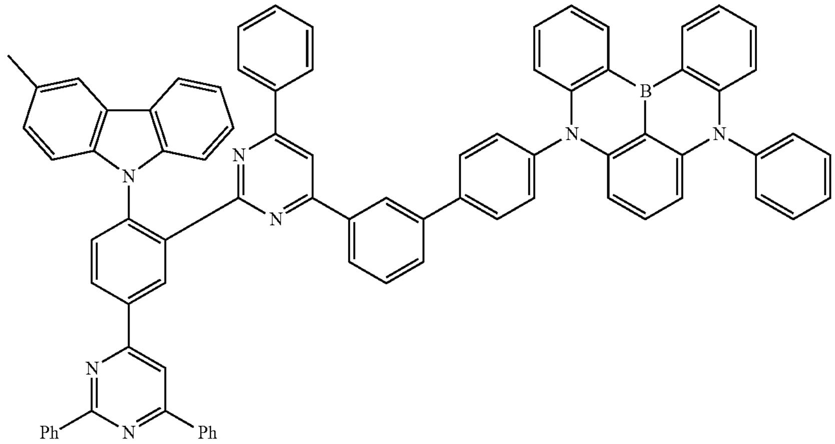
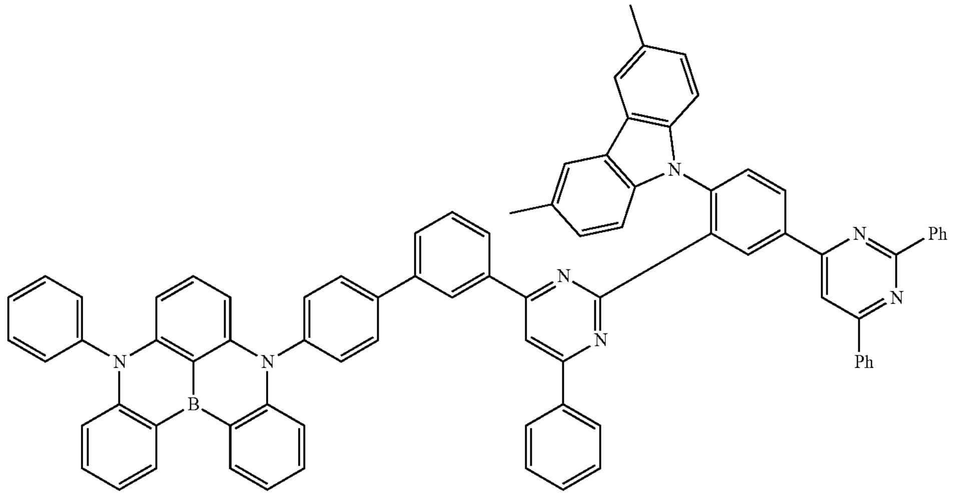

-continued
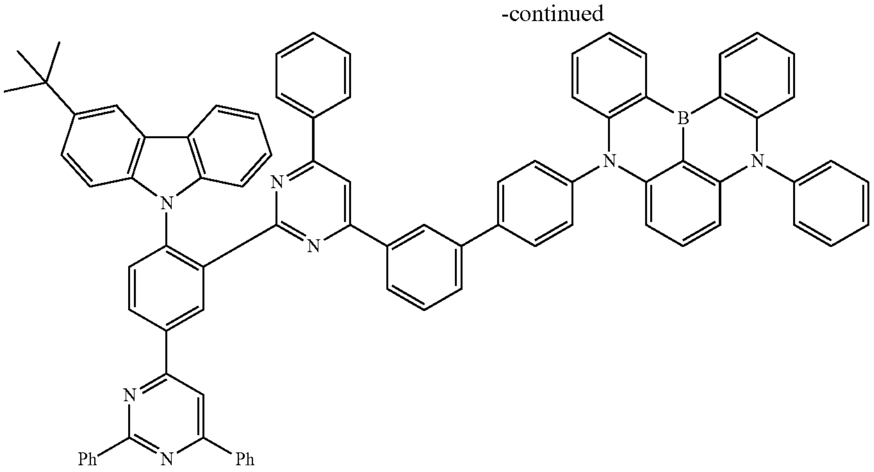
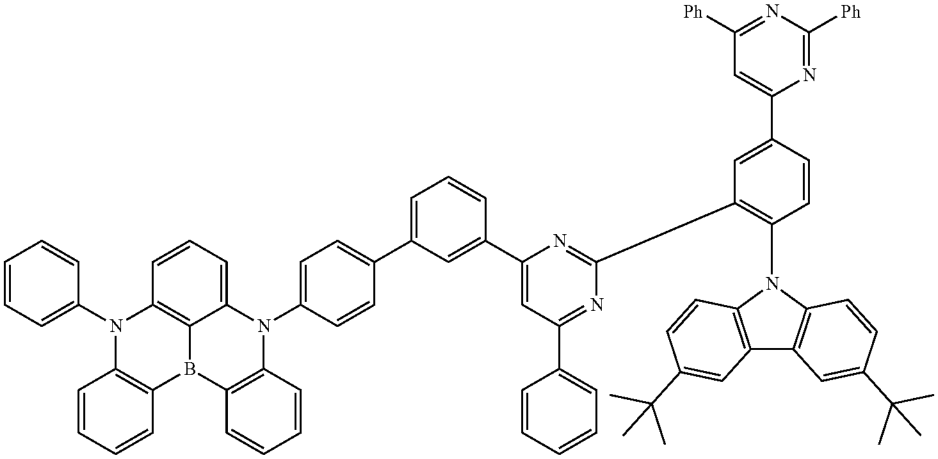
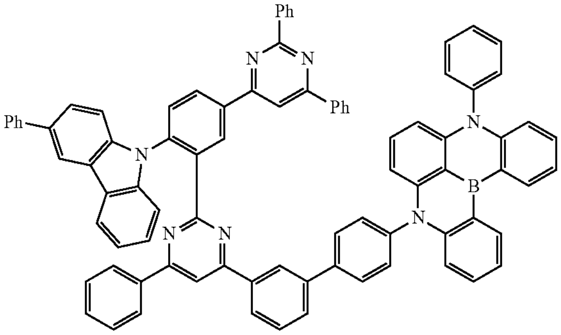
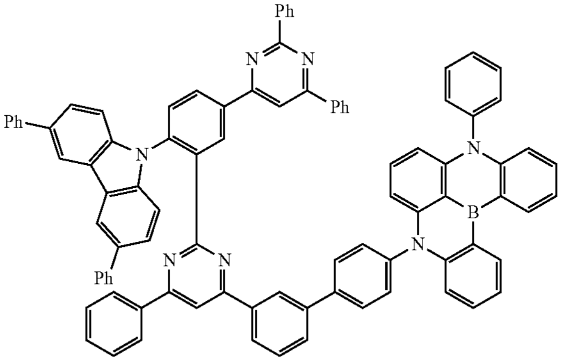
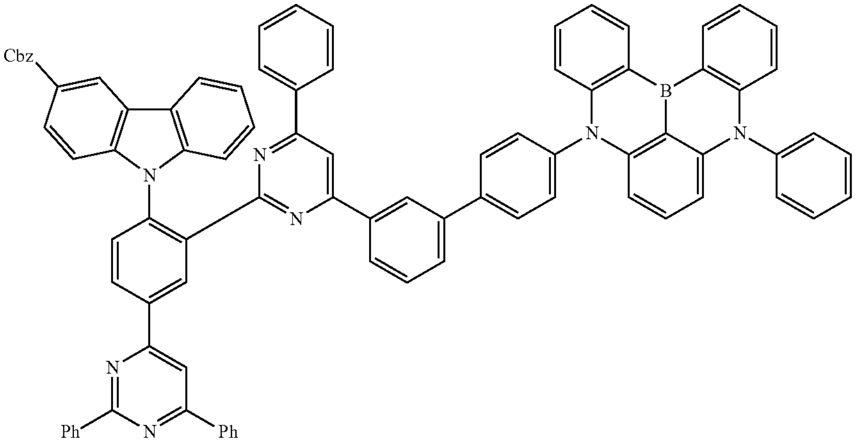

-continued
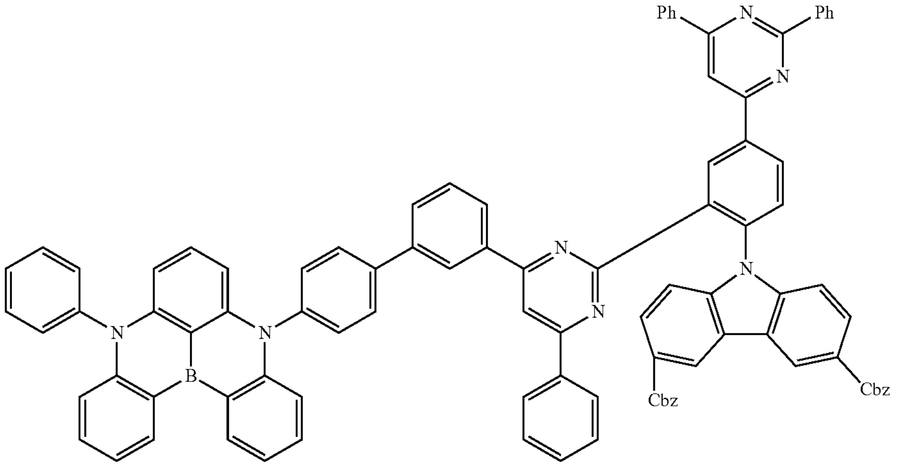
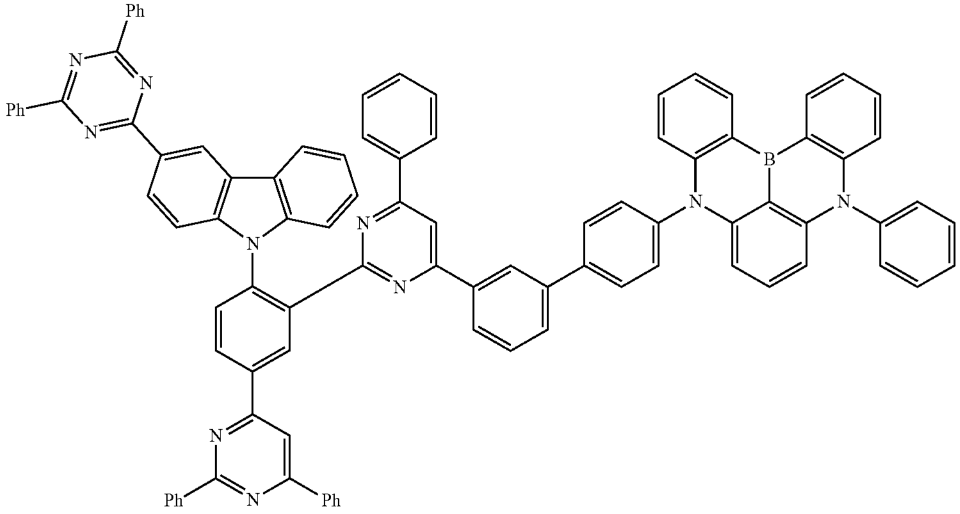
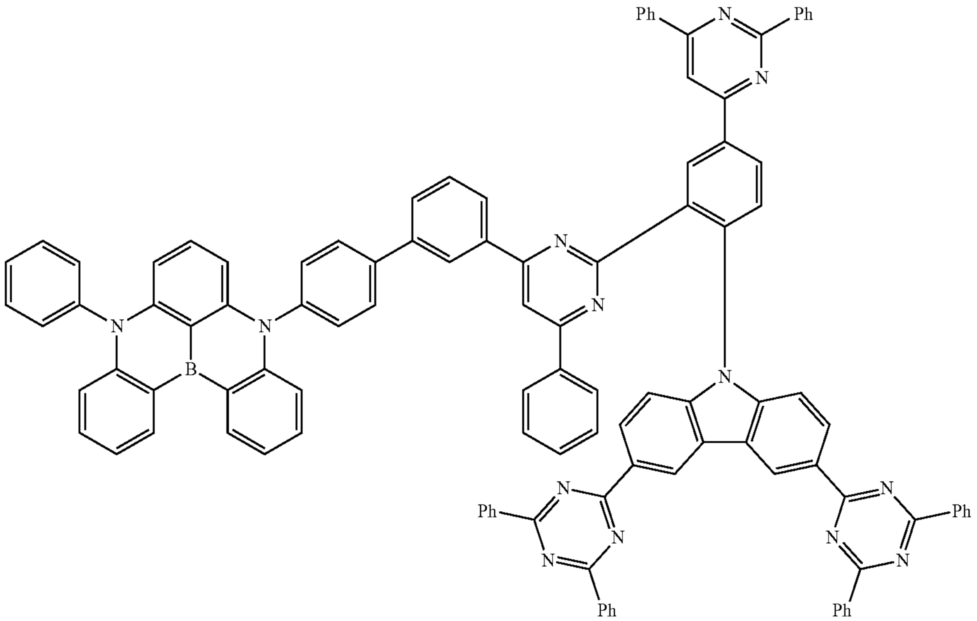

-continued
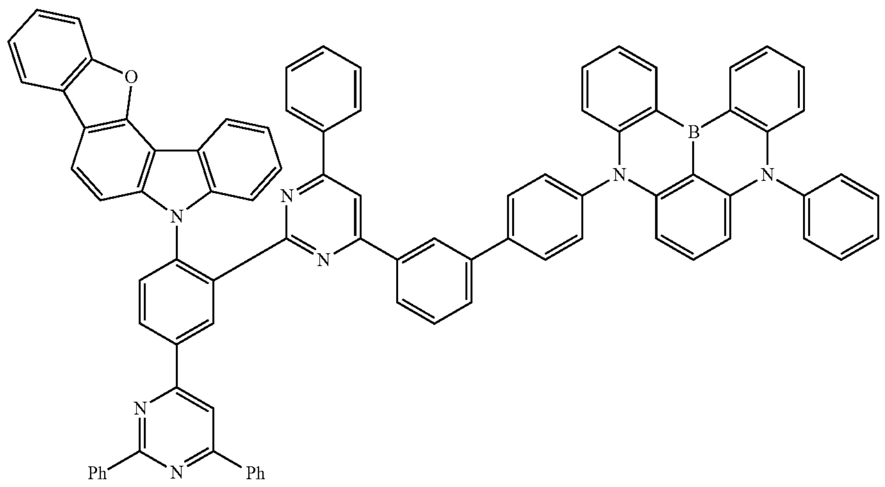
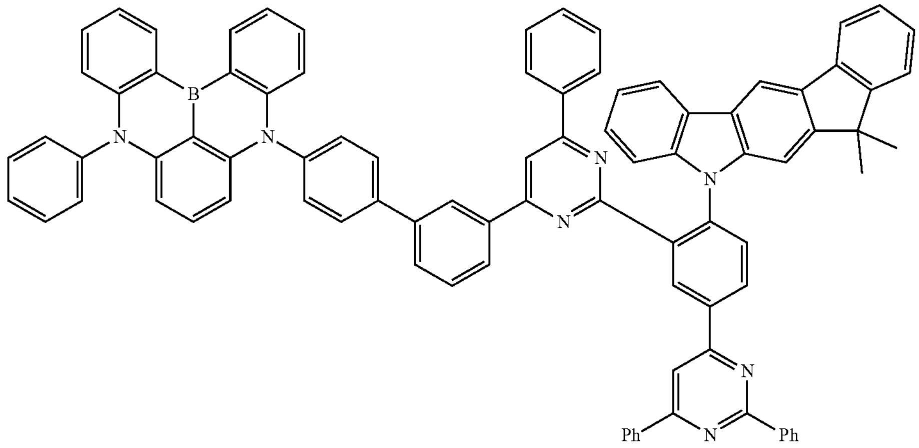
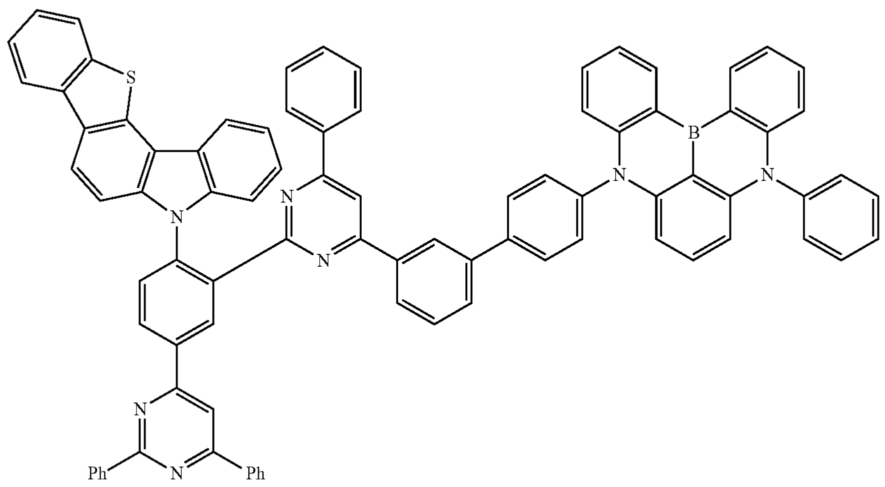

-continued
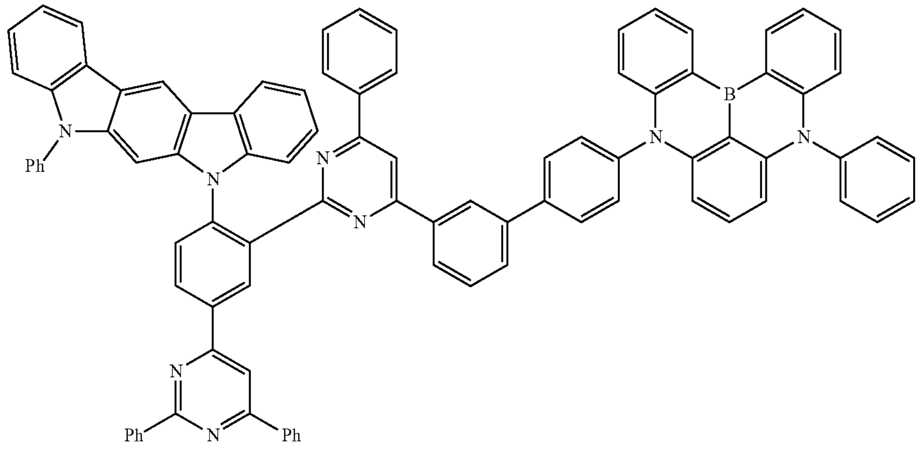
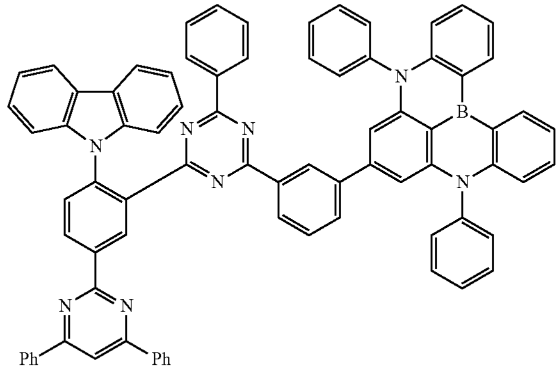
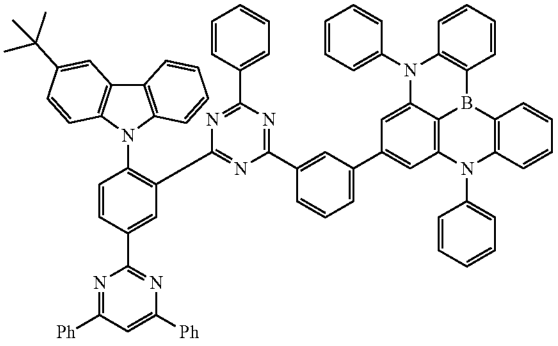
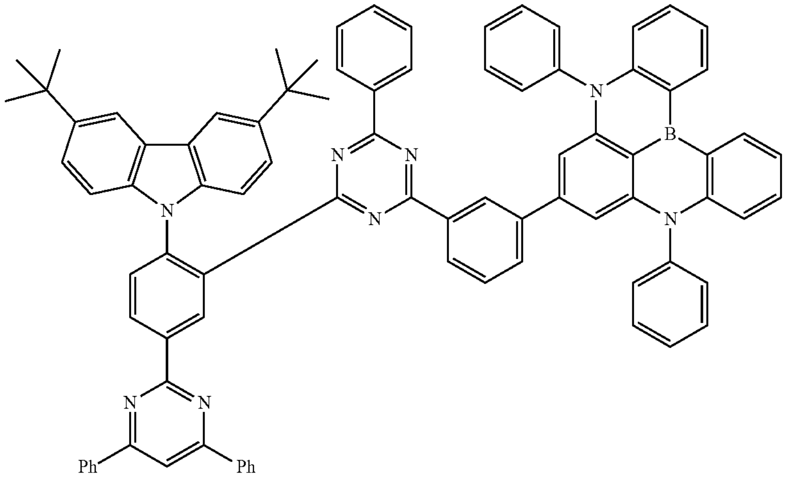
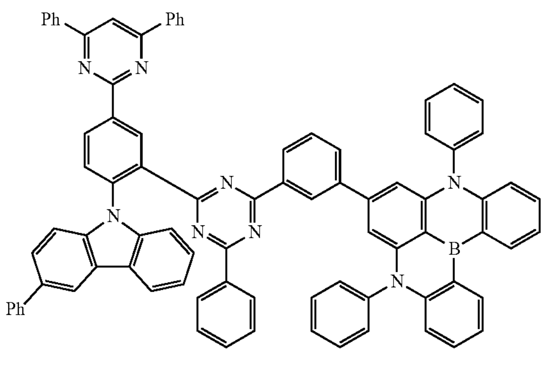
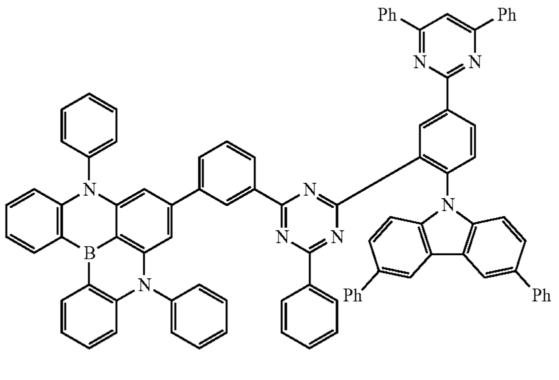

-continued
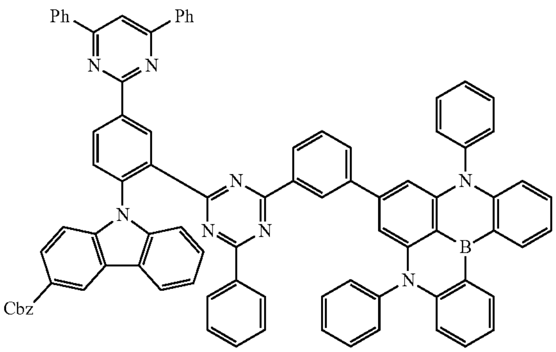
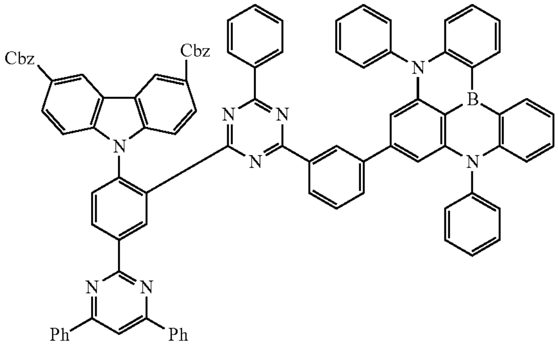
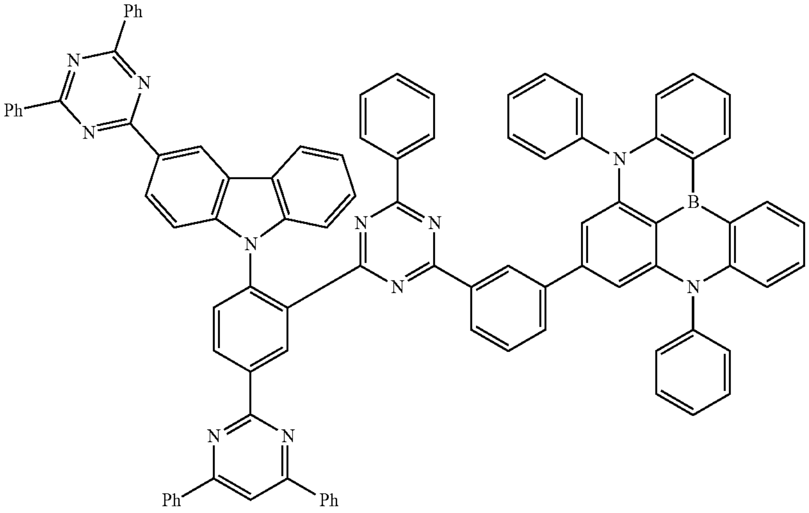
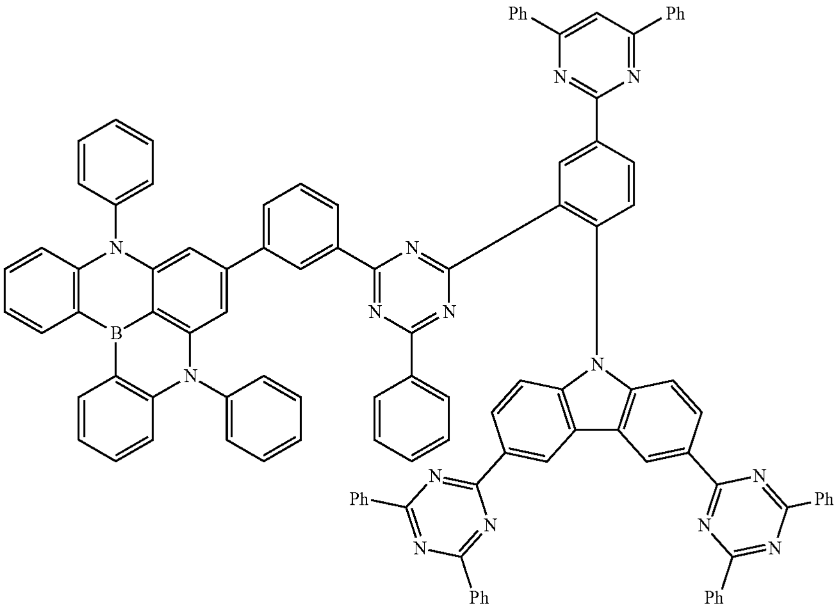

-continued
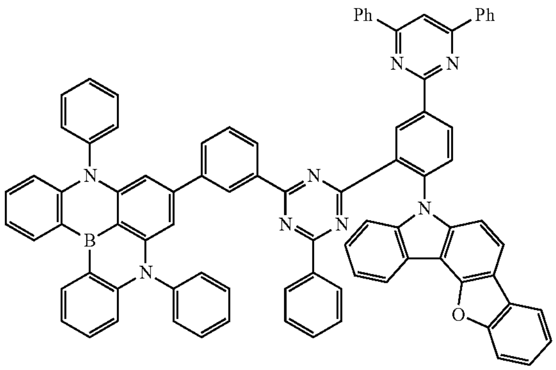
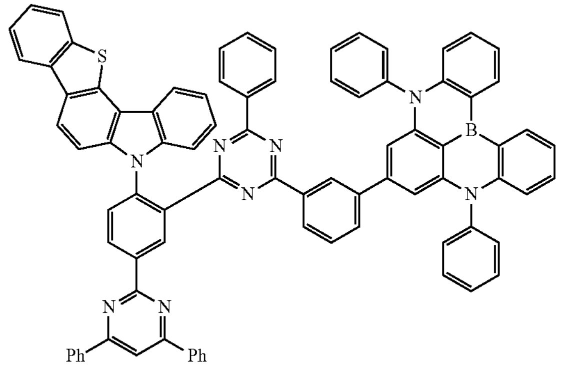
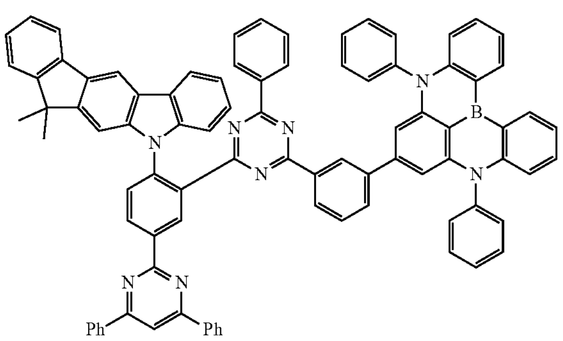
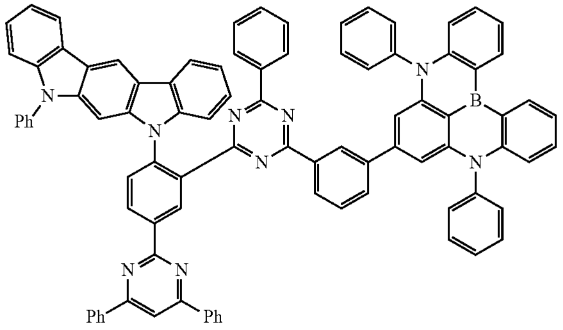
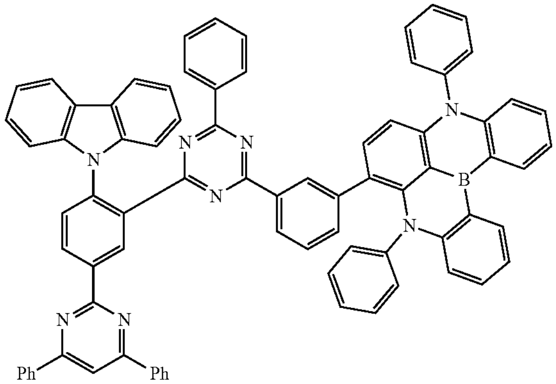
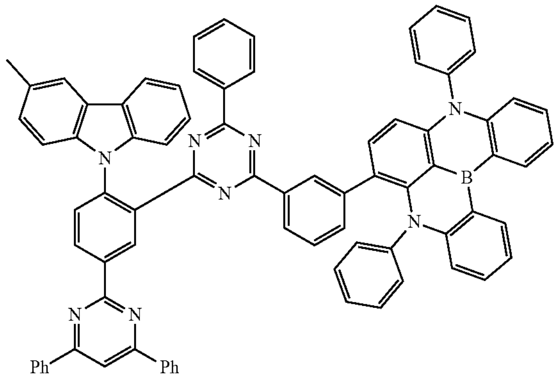
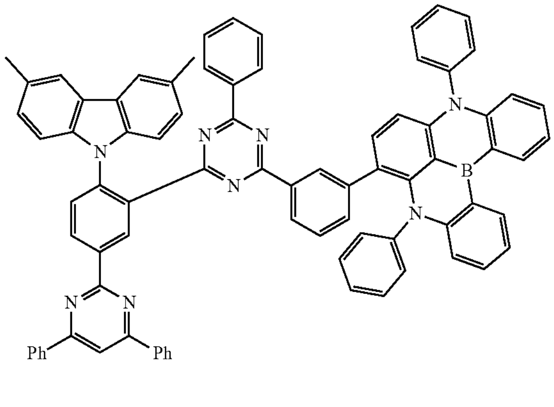
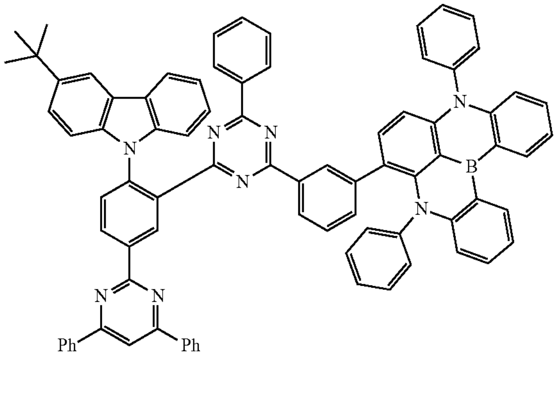

-continued
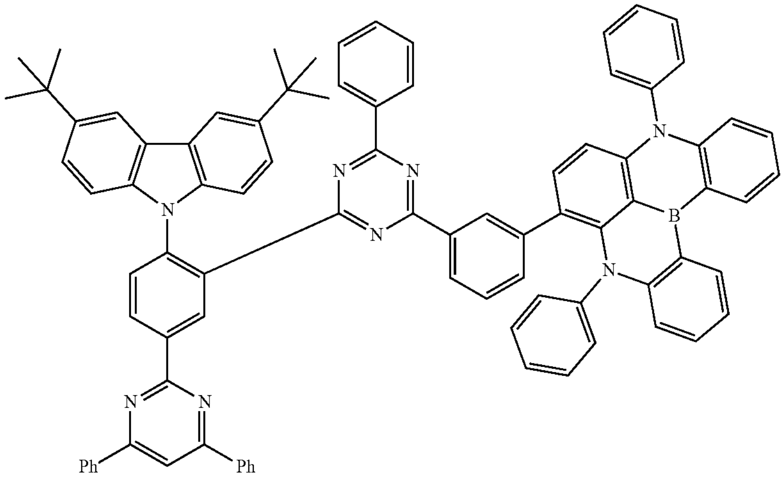
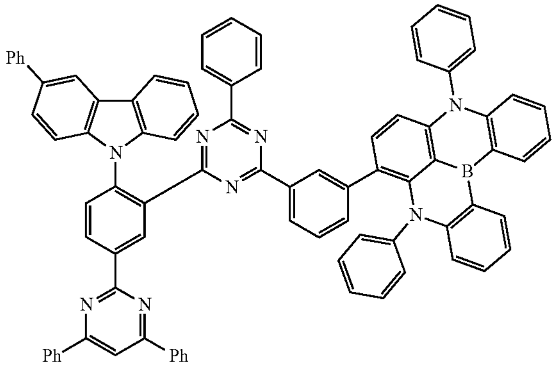
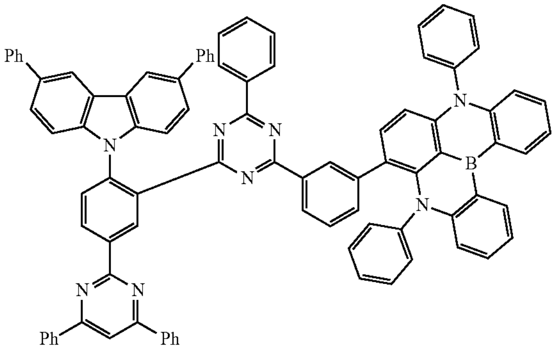
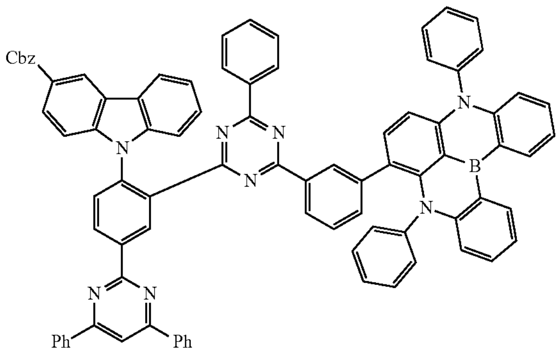
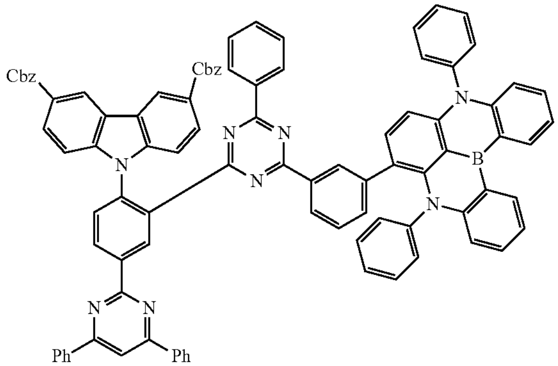

-continued
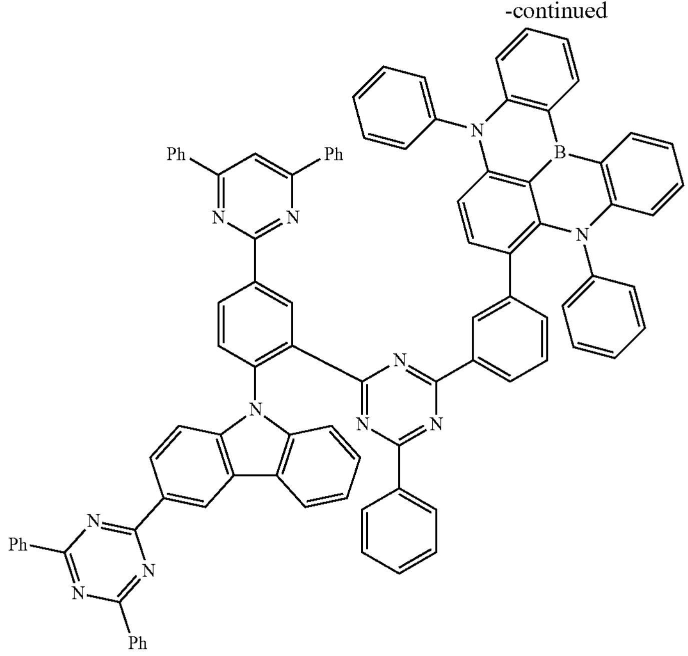
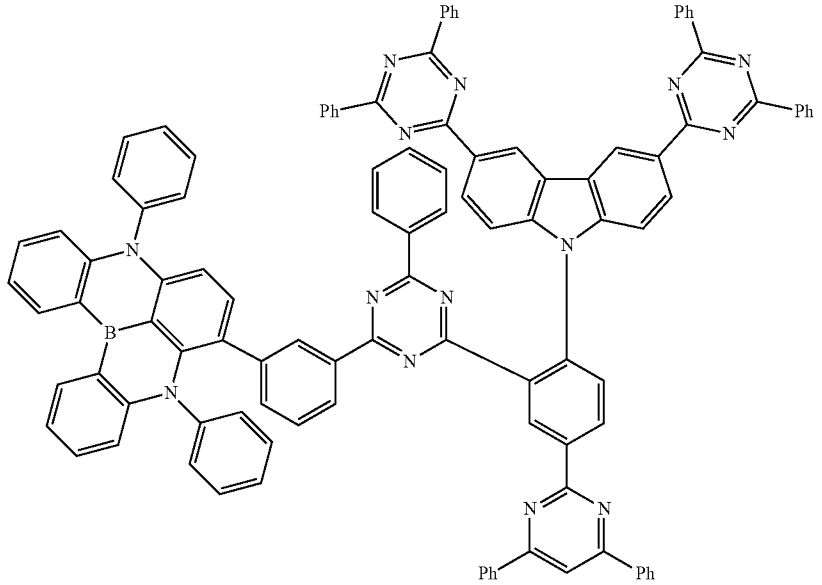

-continued
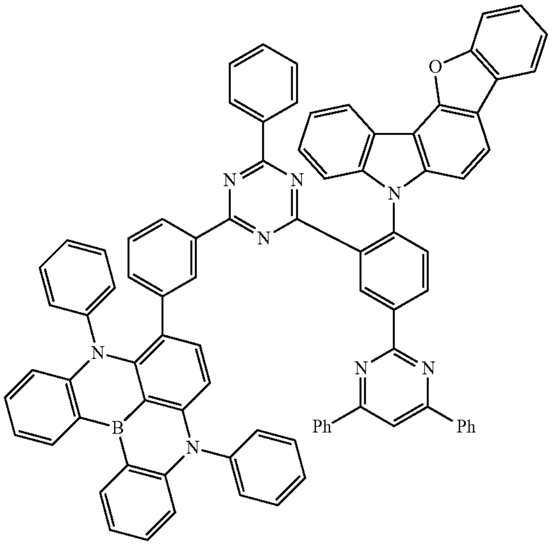
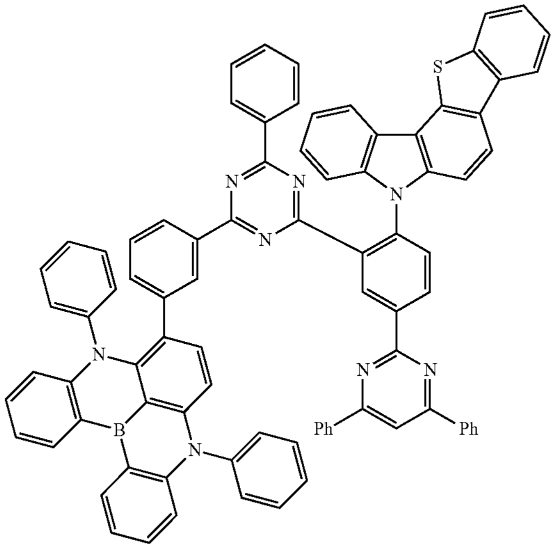
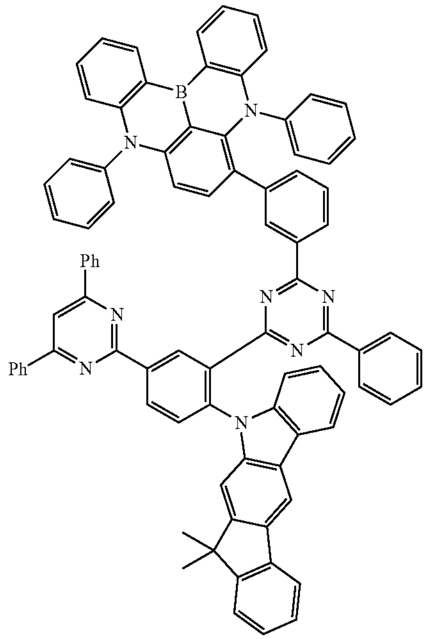
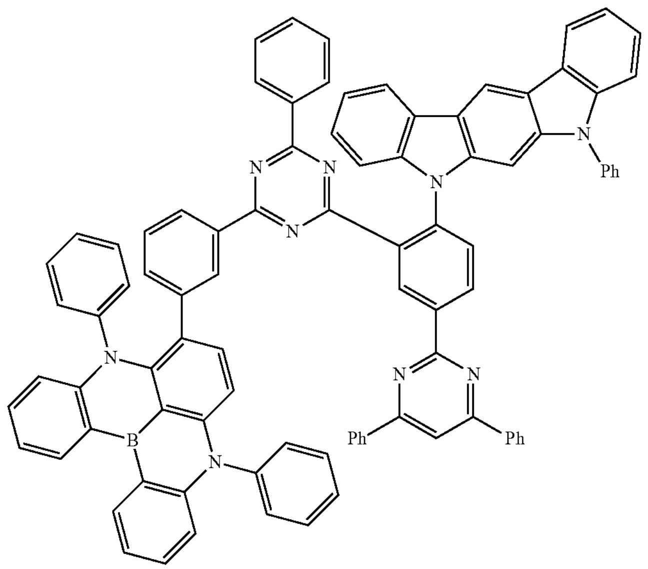
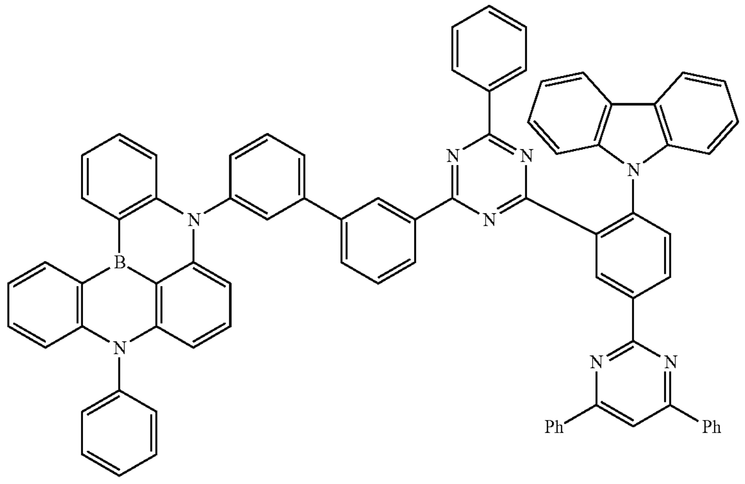

-continued
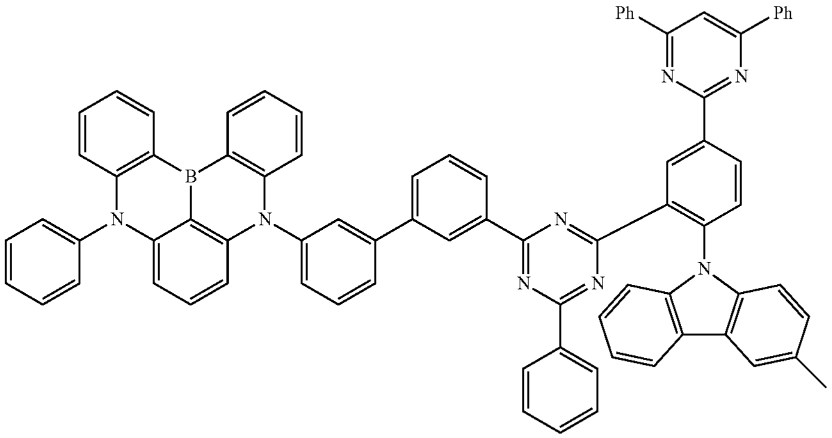
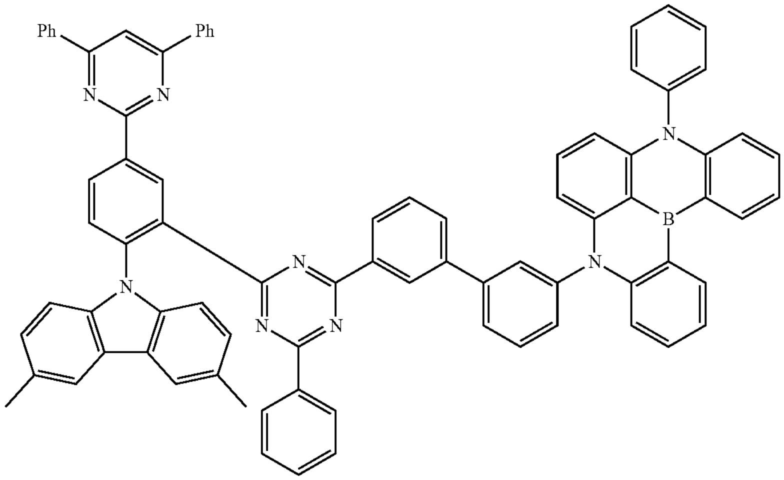
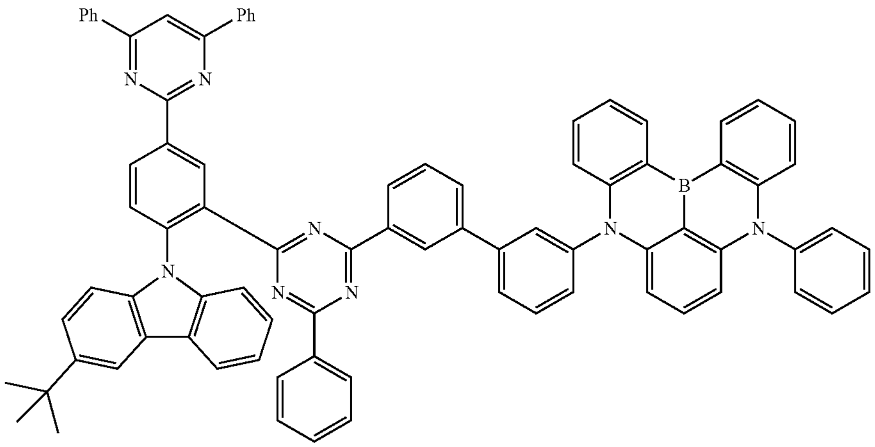

-continued
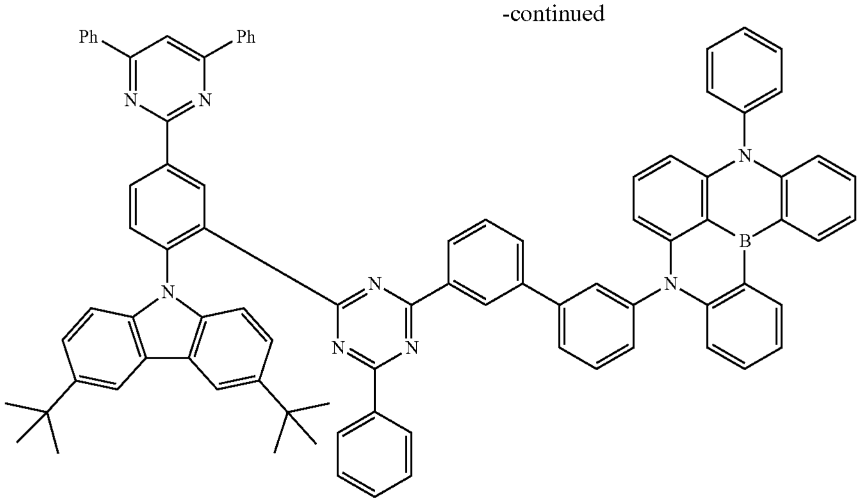
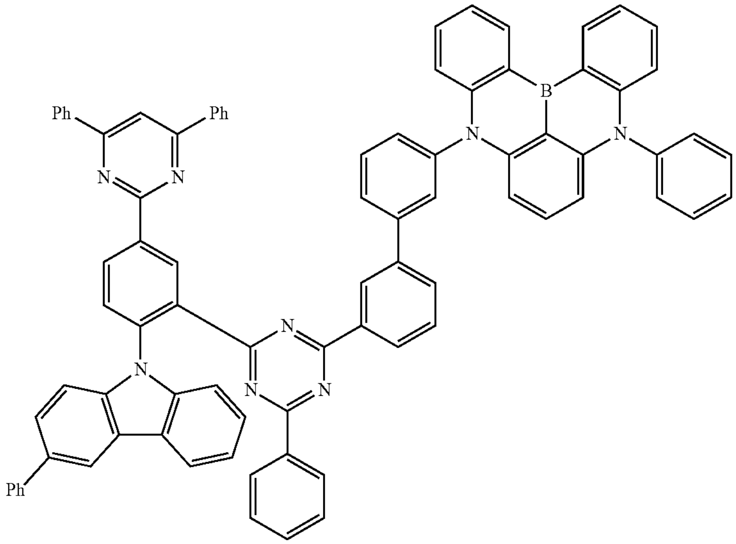
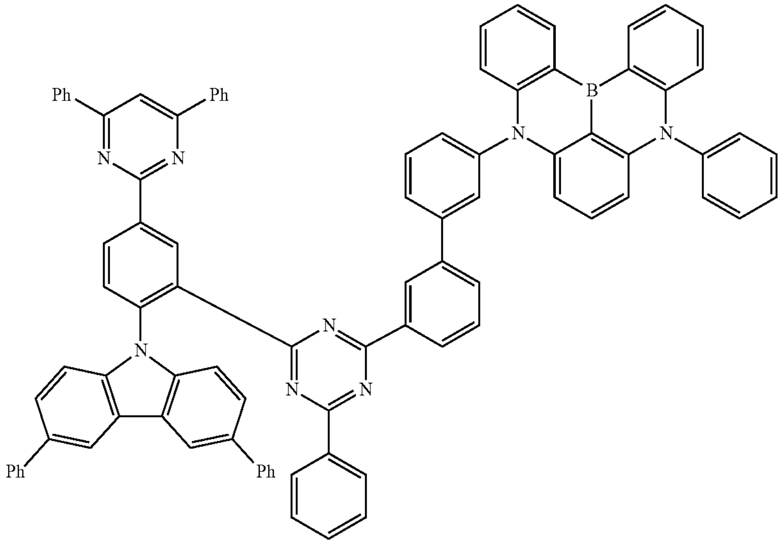

-continued
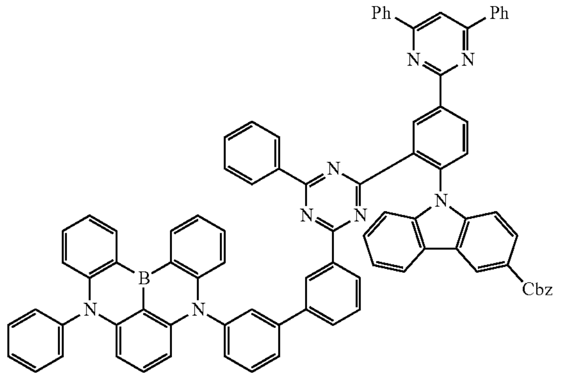
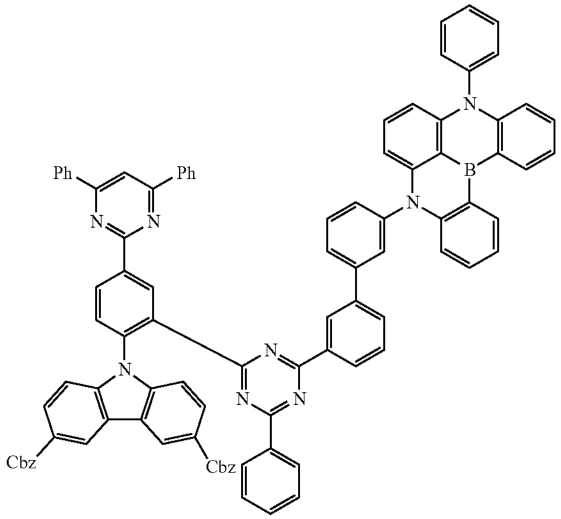
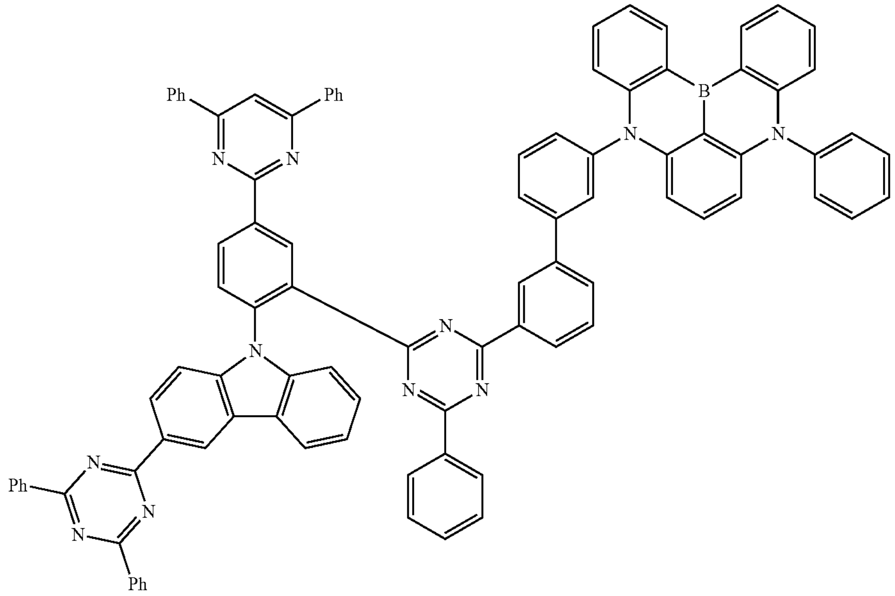
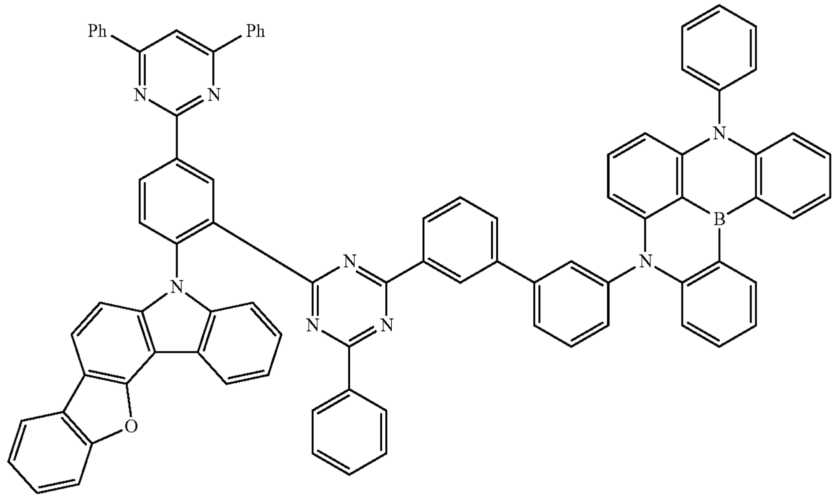

-continued
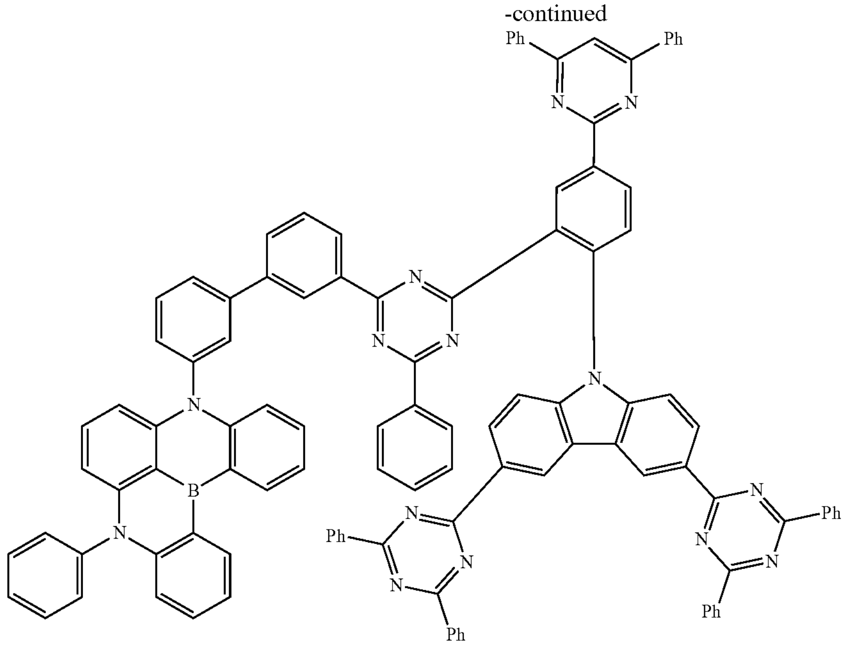
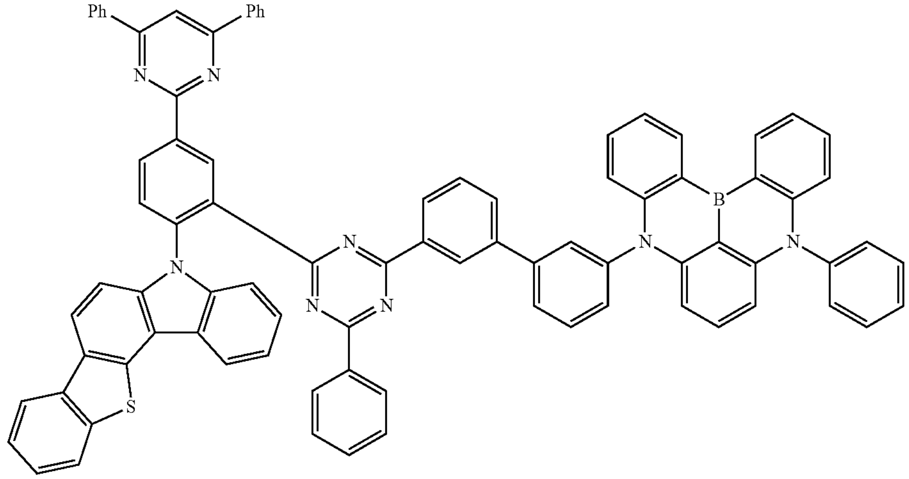
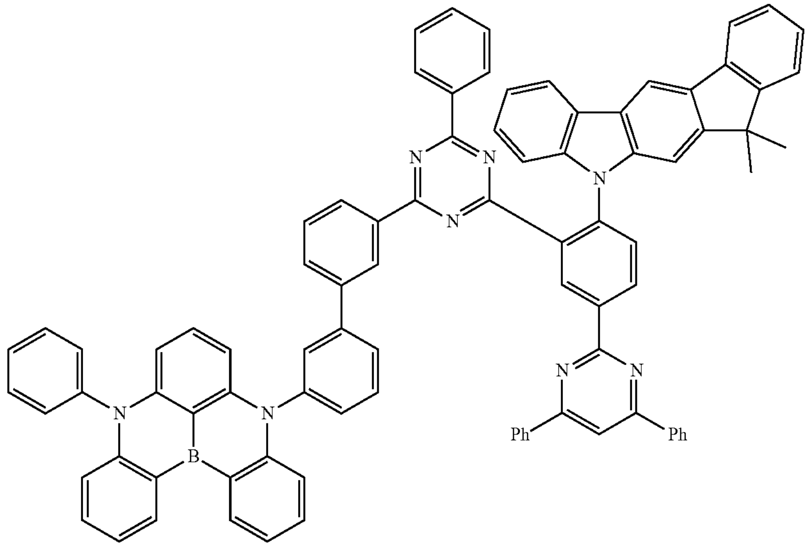

-continued
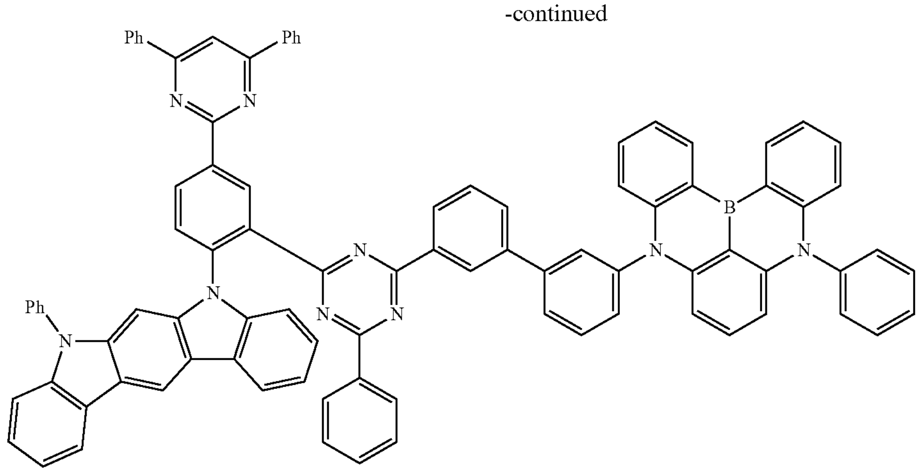
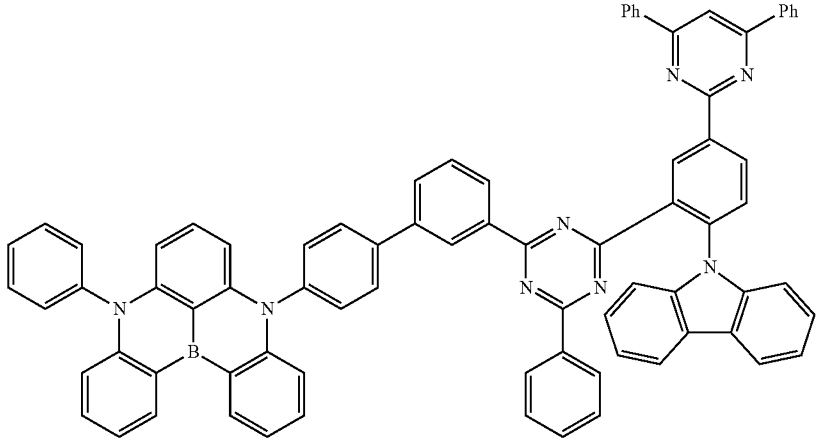
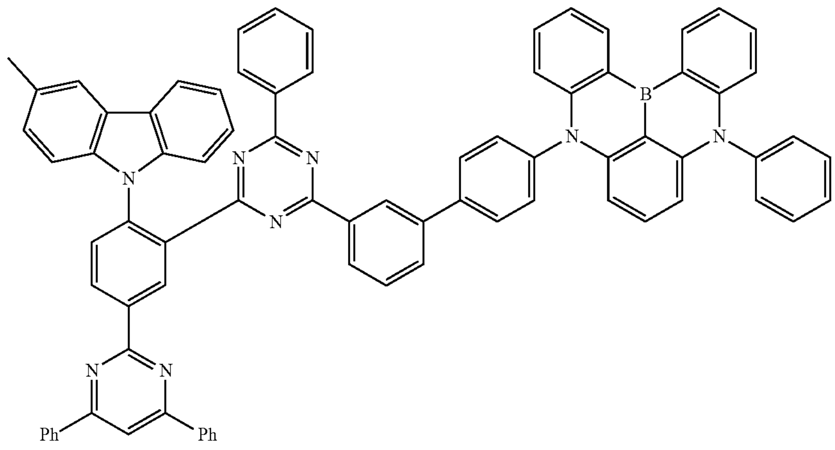

-continued
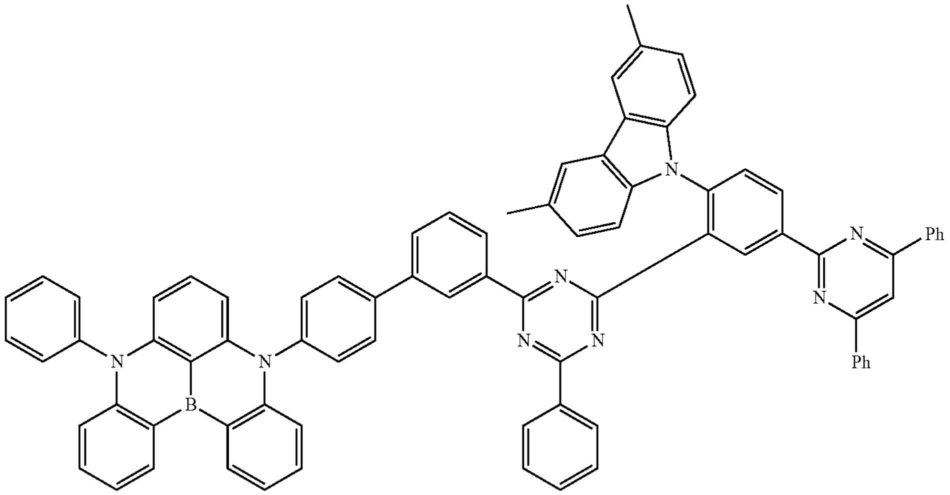
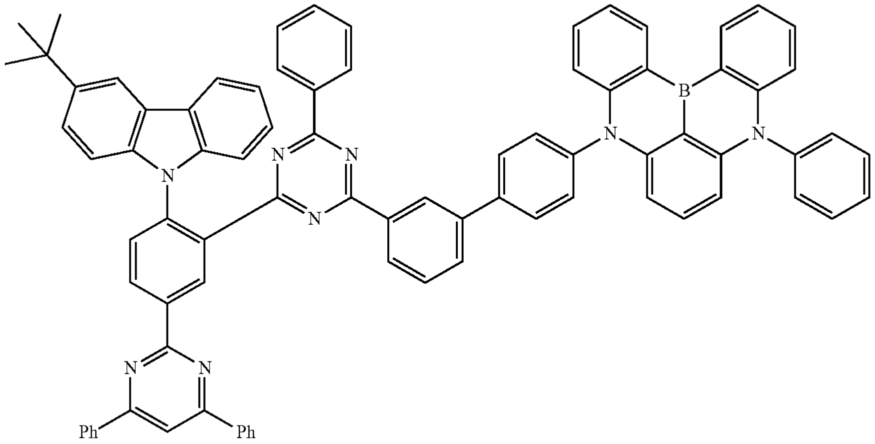
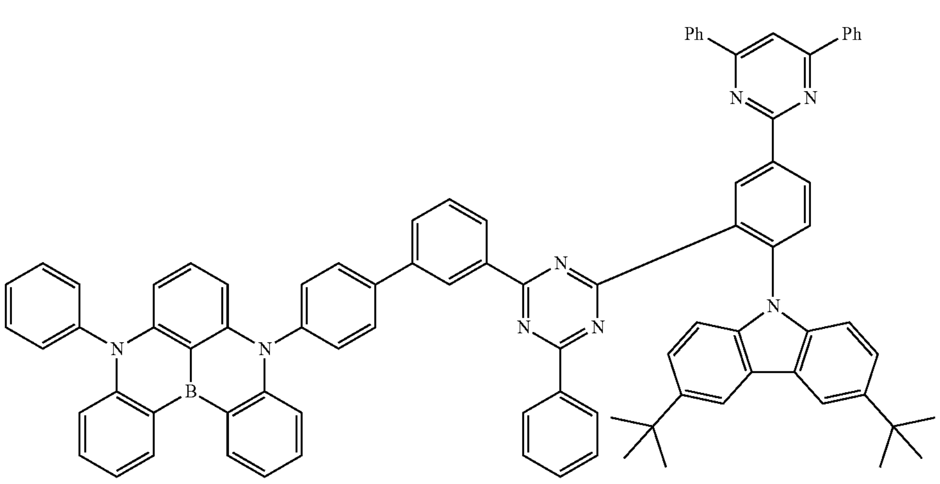

-continued
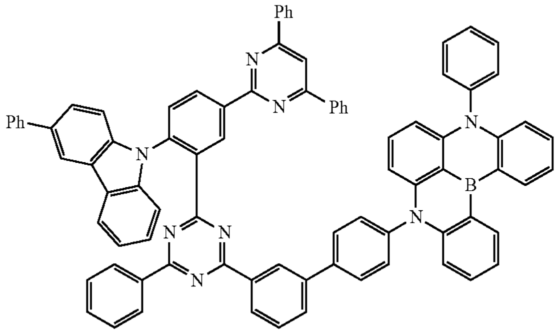
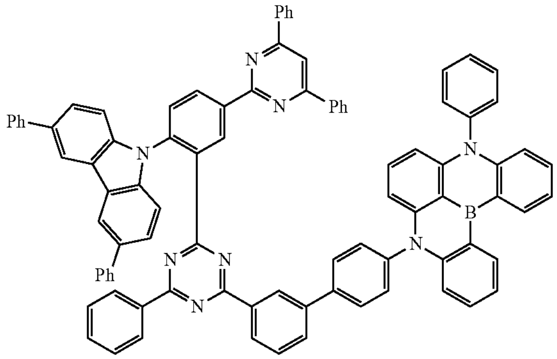
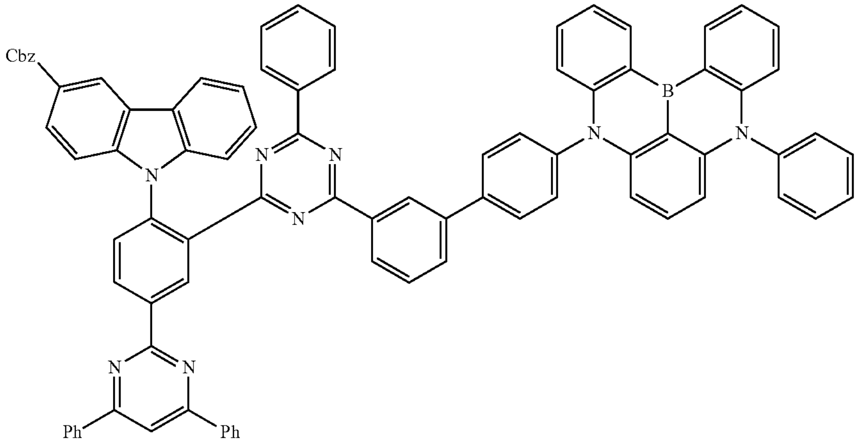
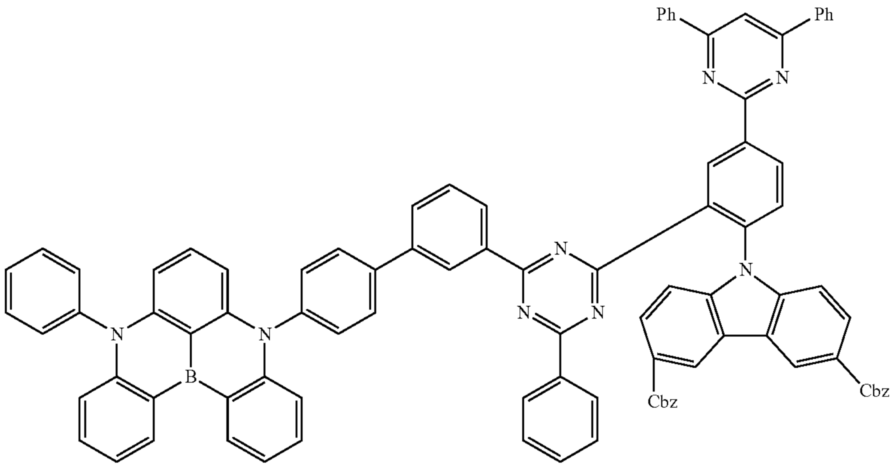

-continued
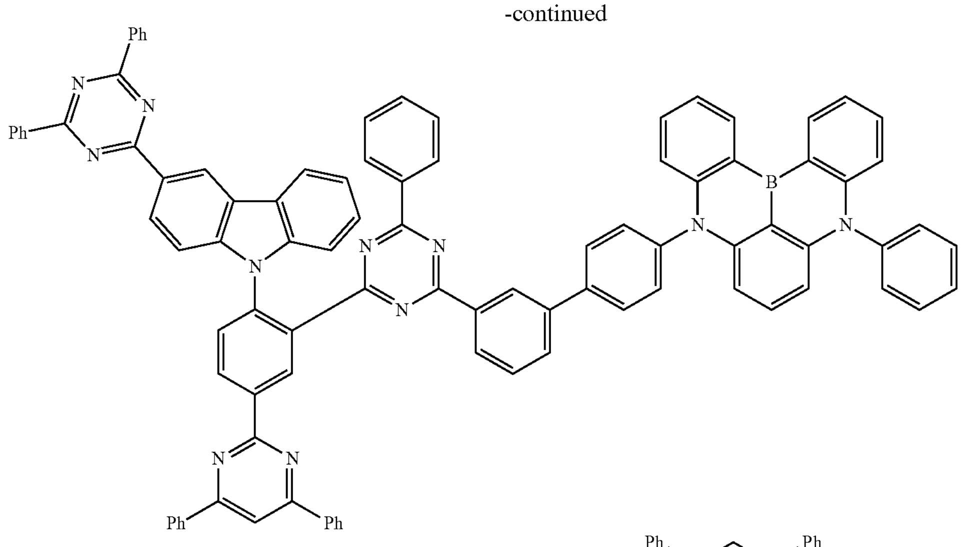
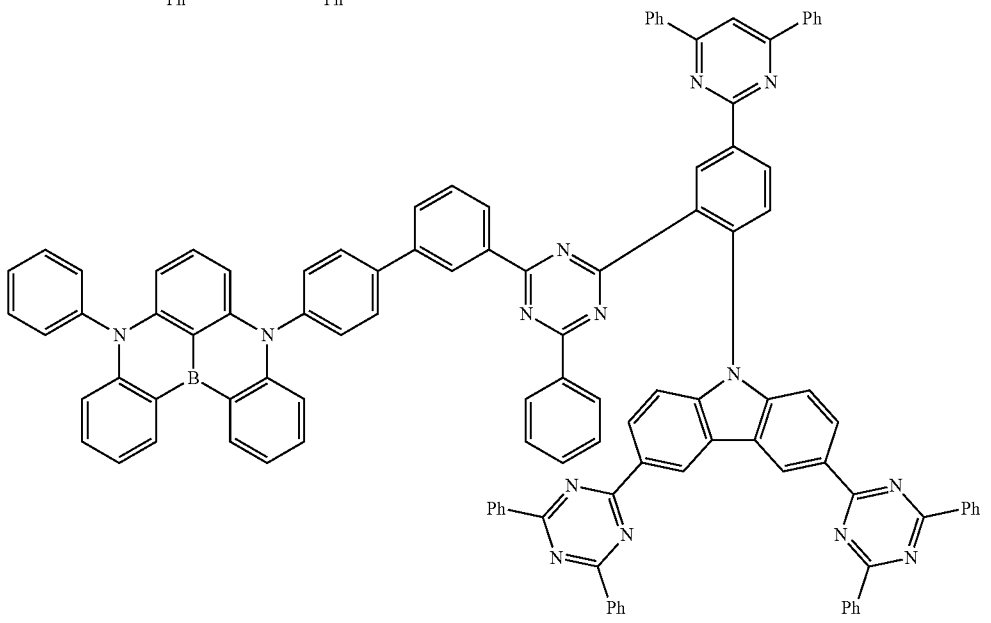
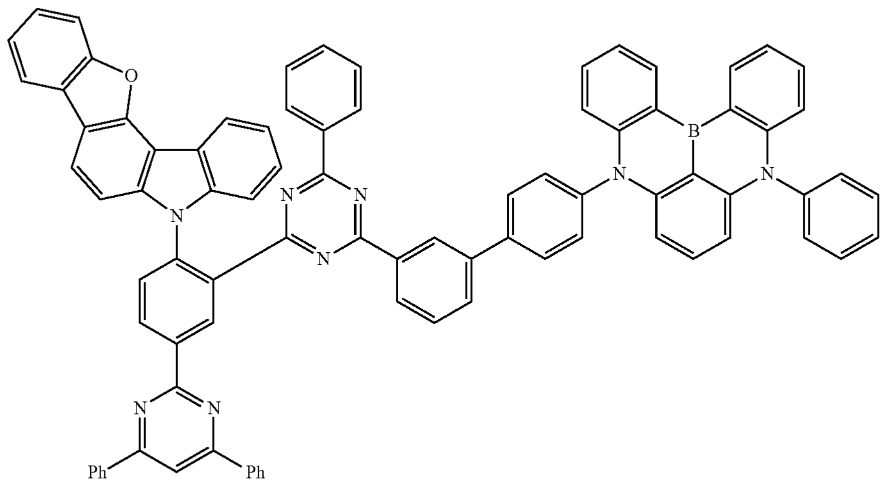

-continued
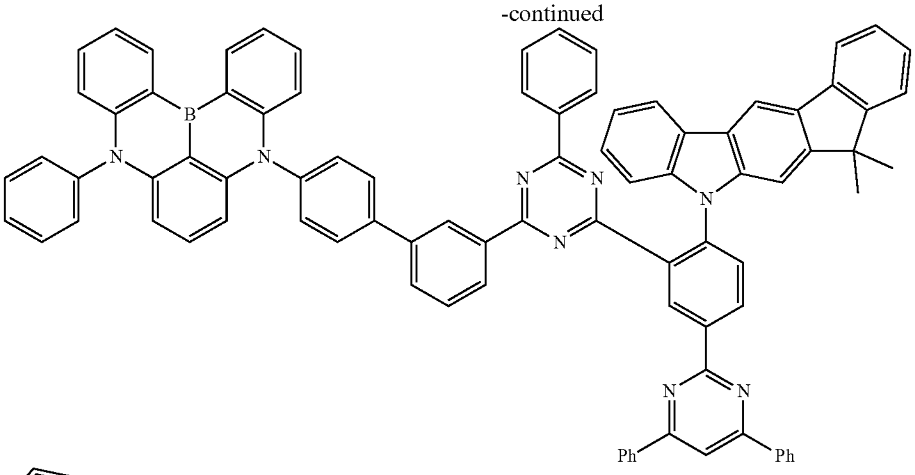
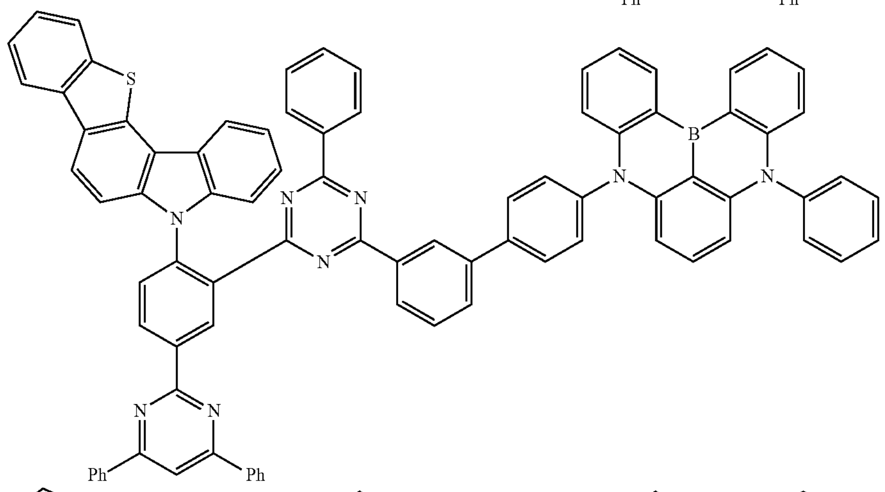
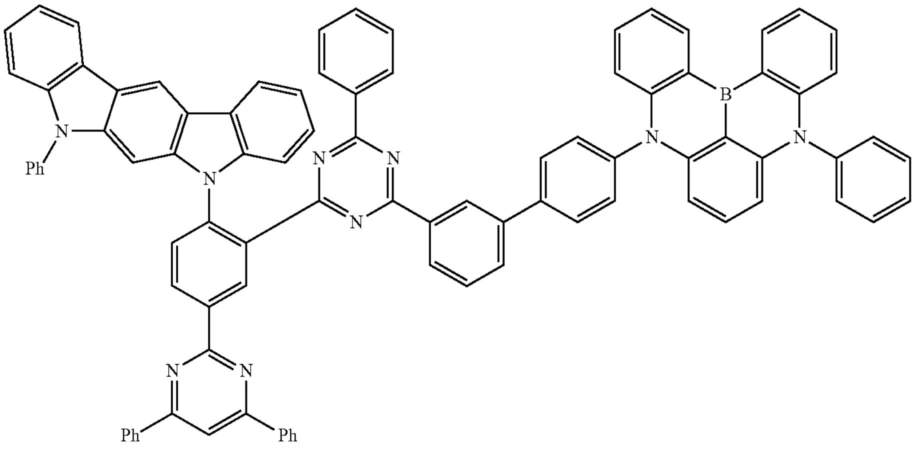
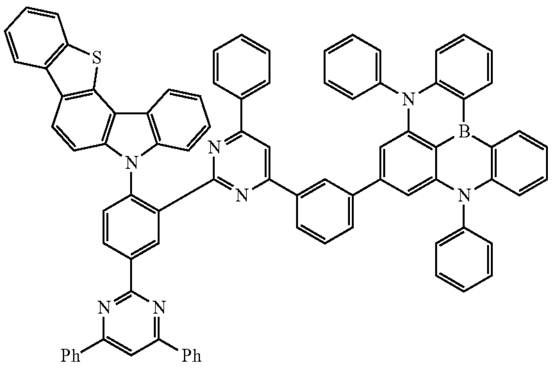
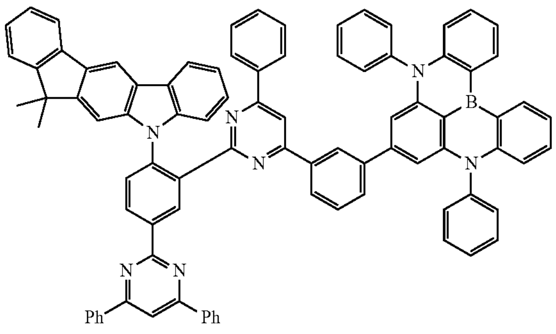

-continued
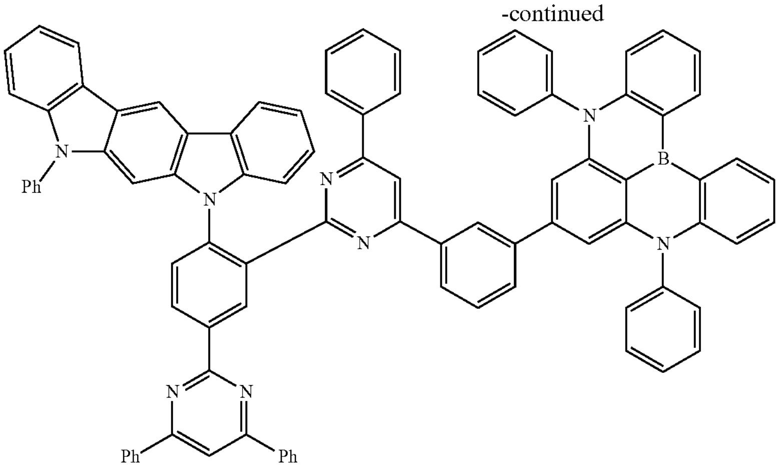
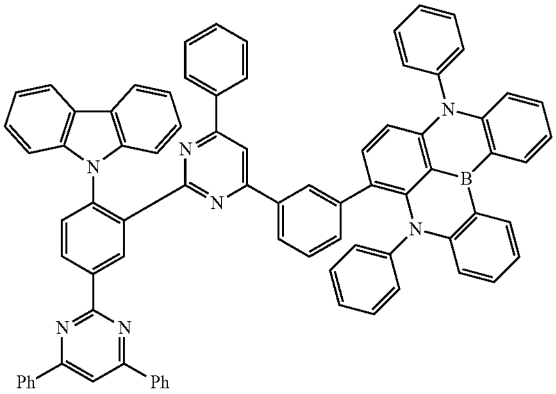
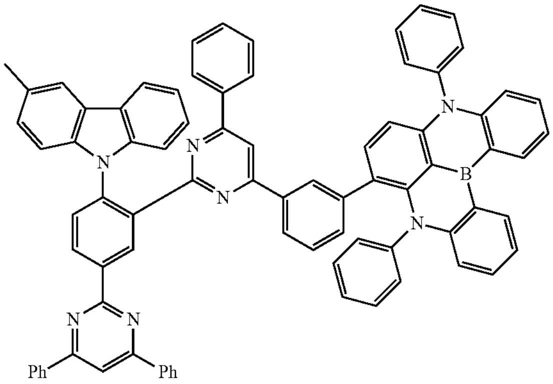
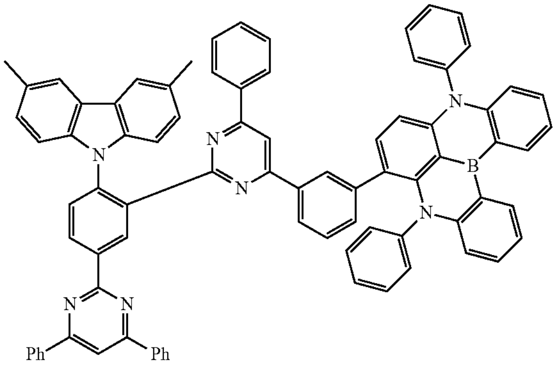
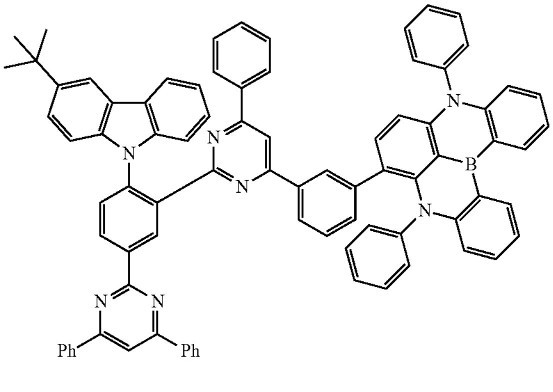
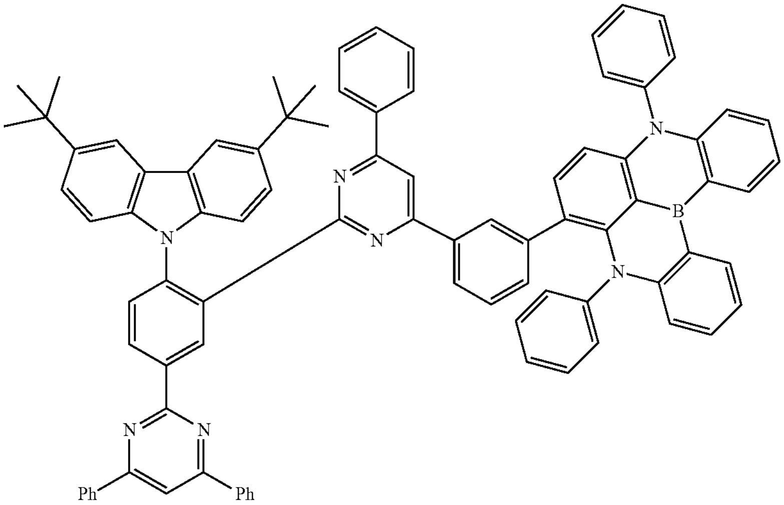

-continued
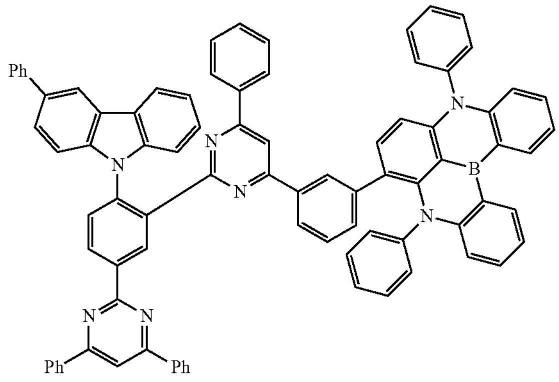
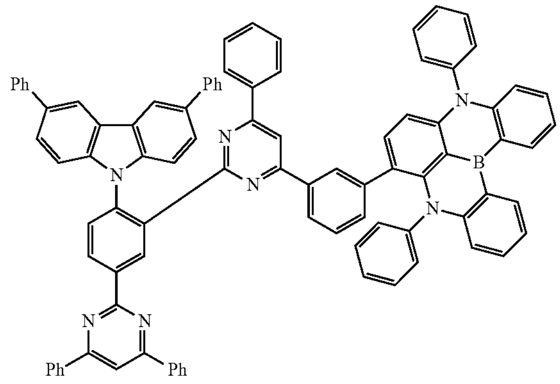
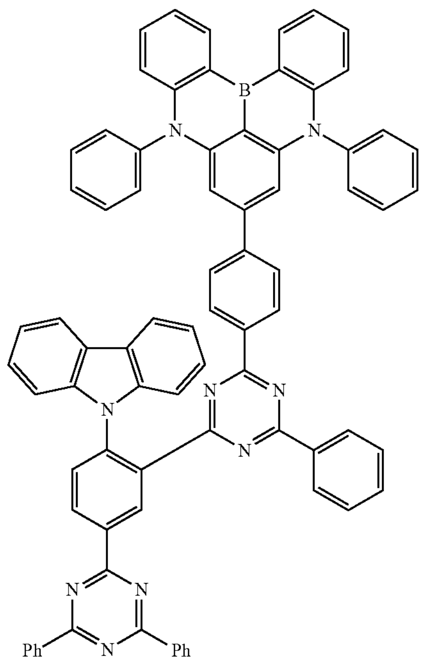
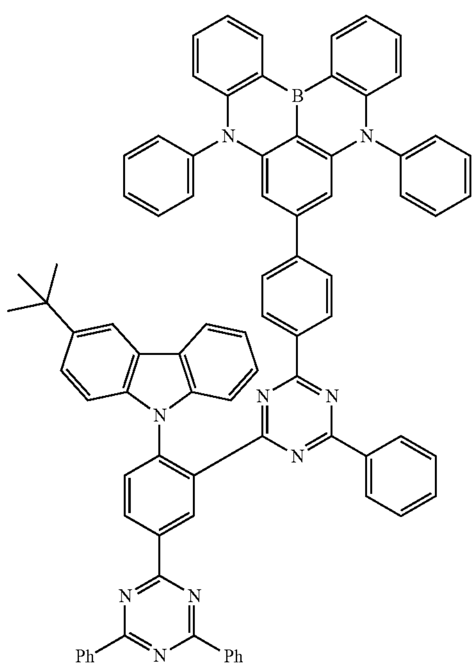
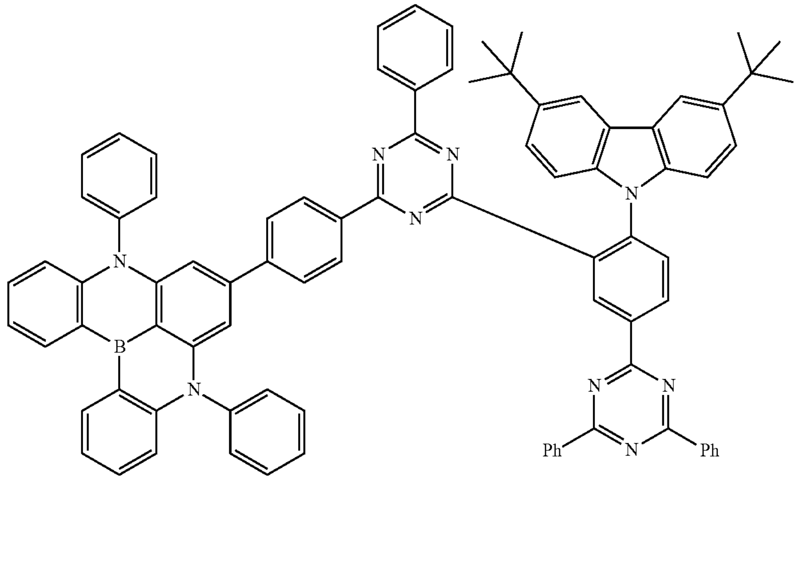

-continued
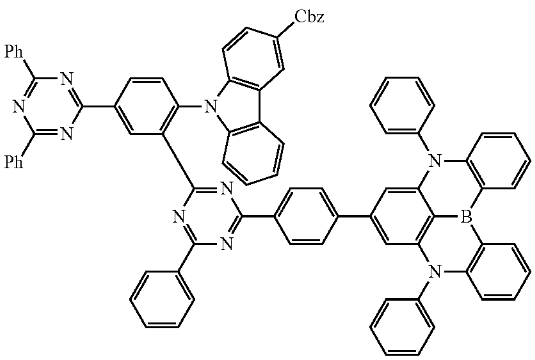
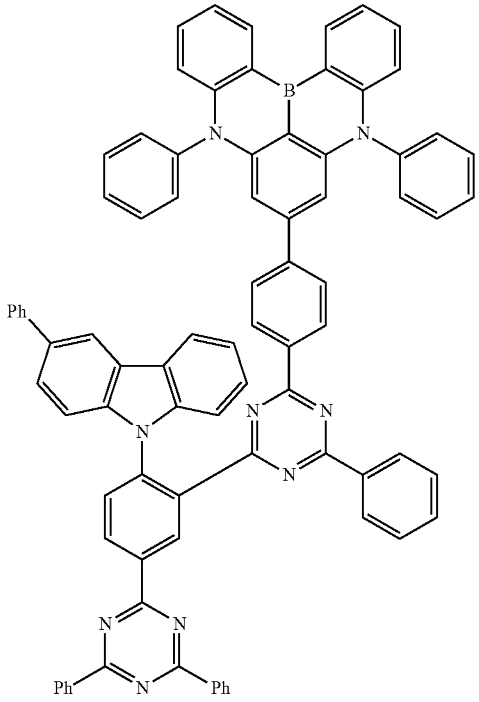
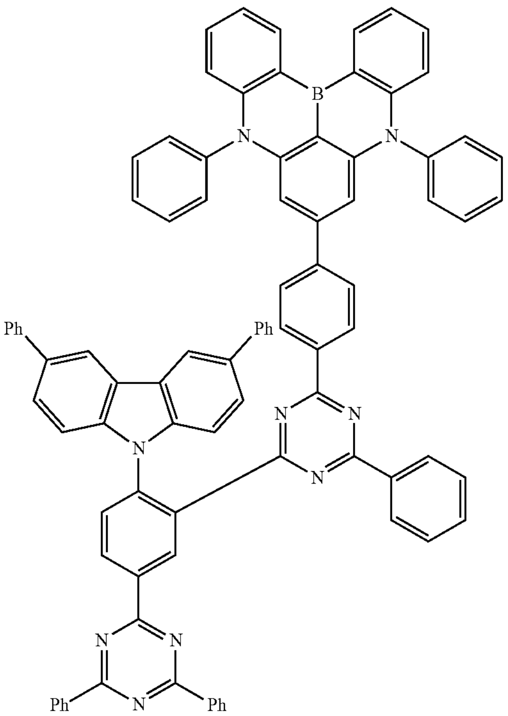
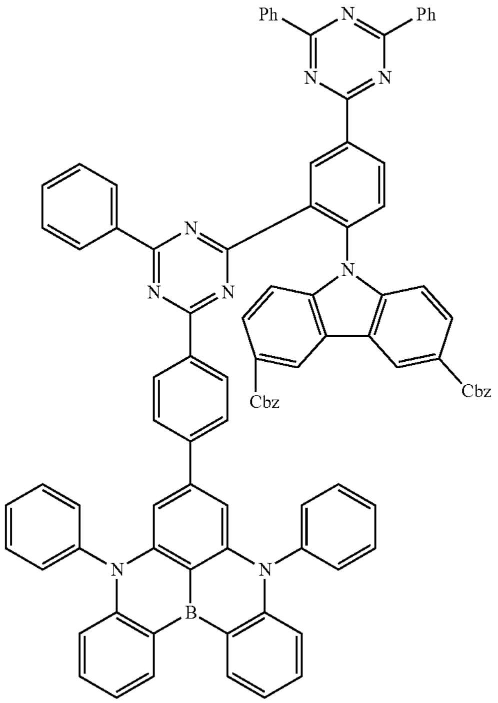

-continued
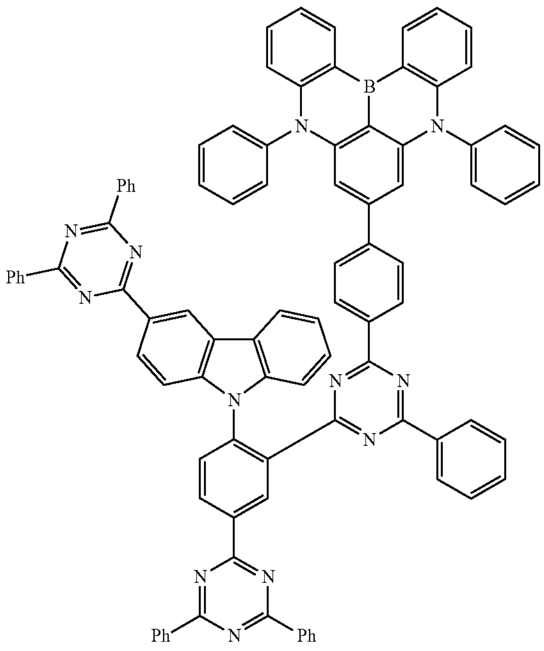
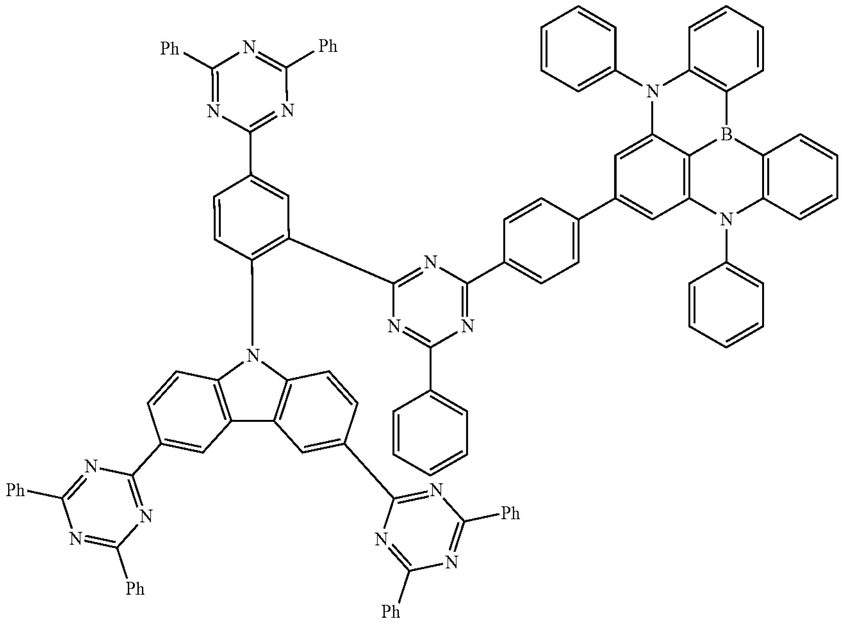

-continued
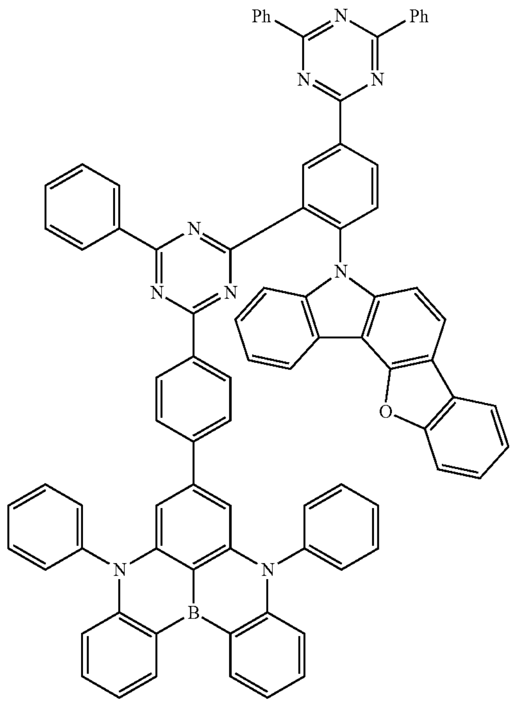
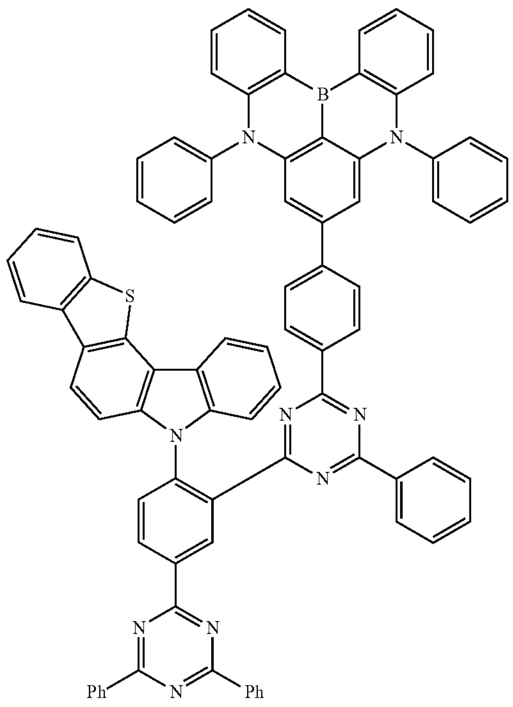
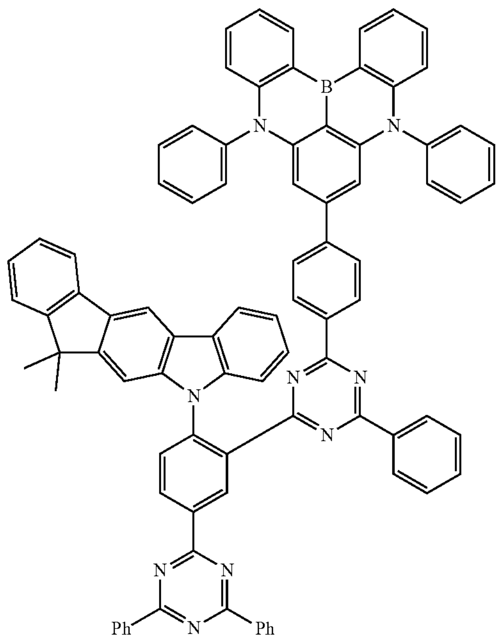
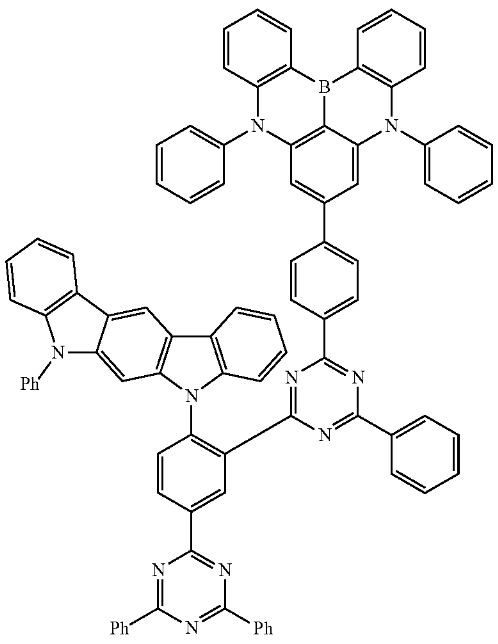

-continued
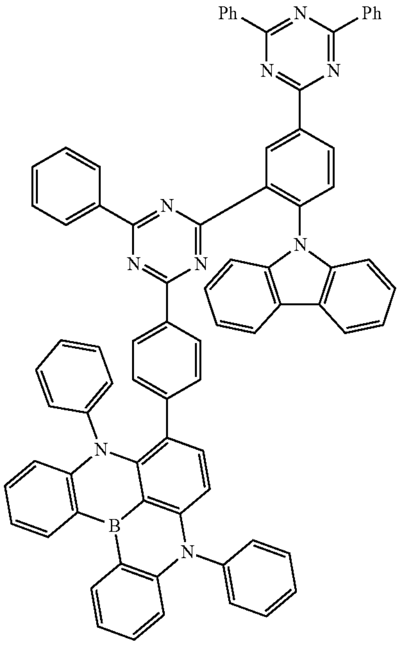
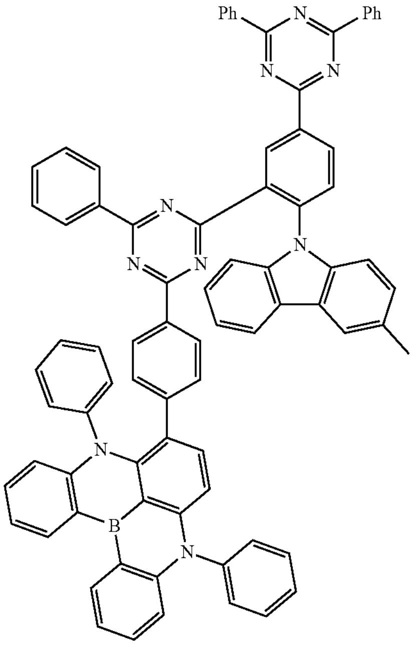
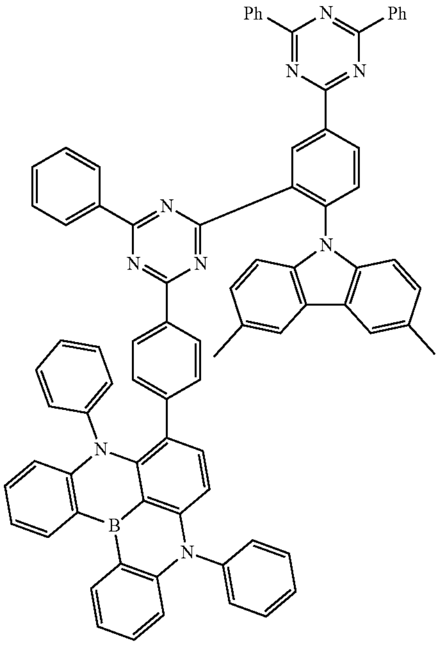

-continued
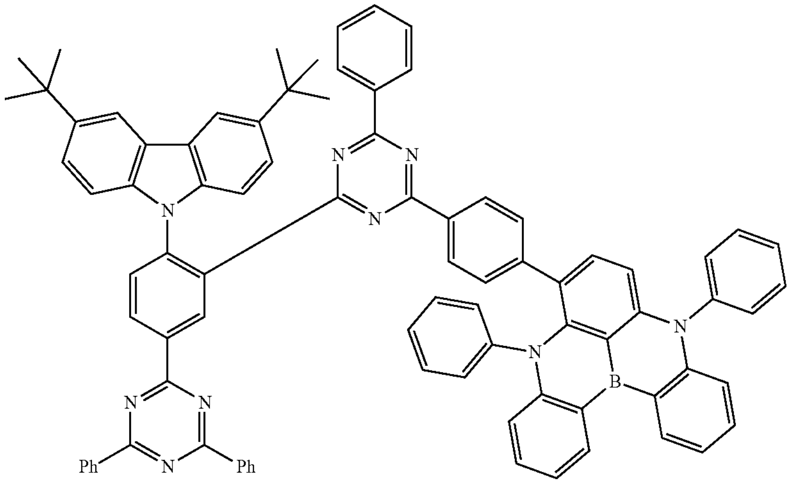
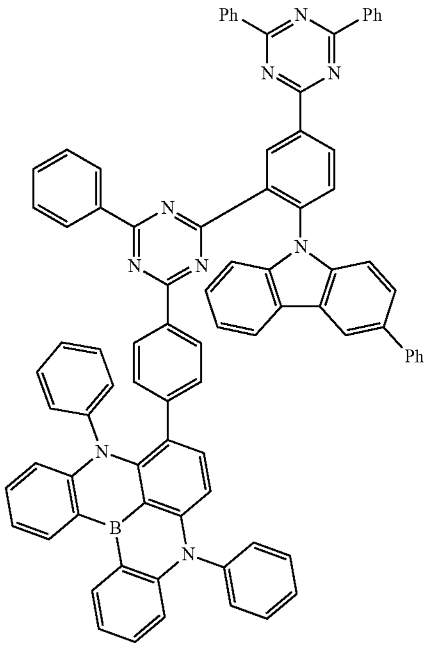
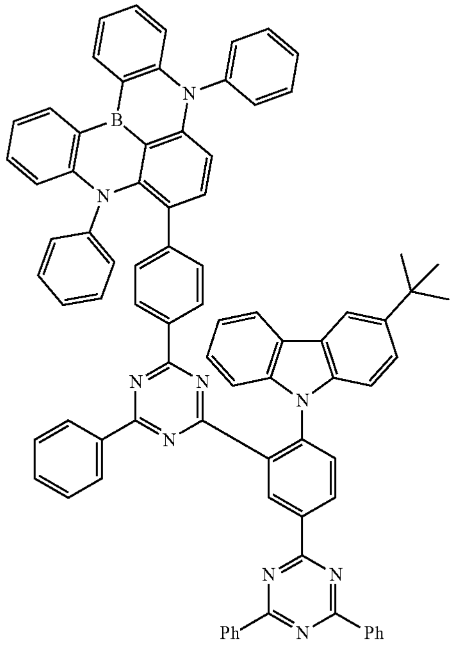
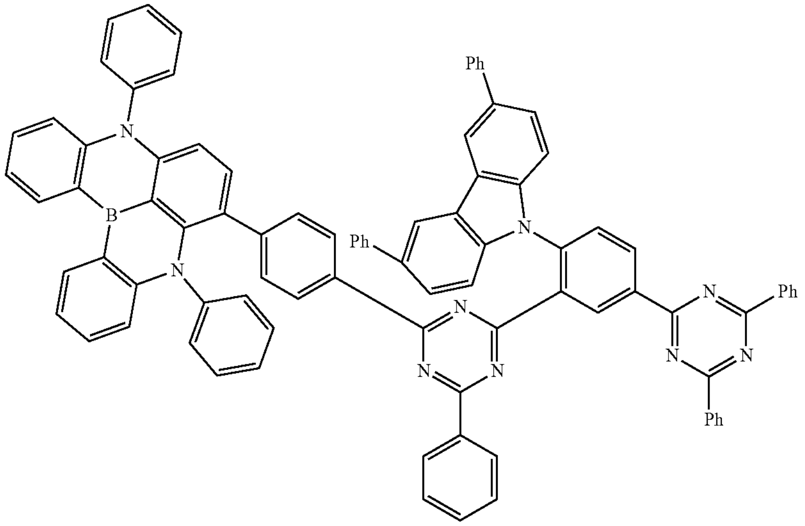

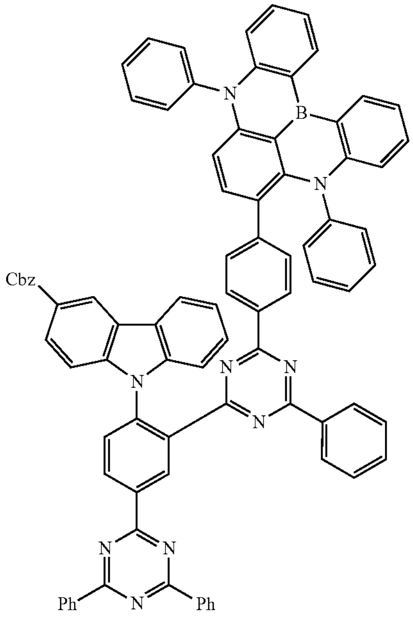
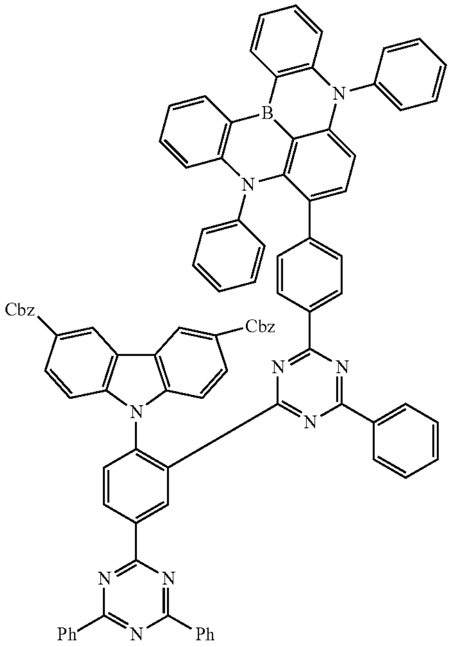
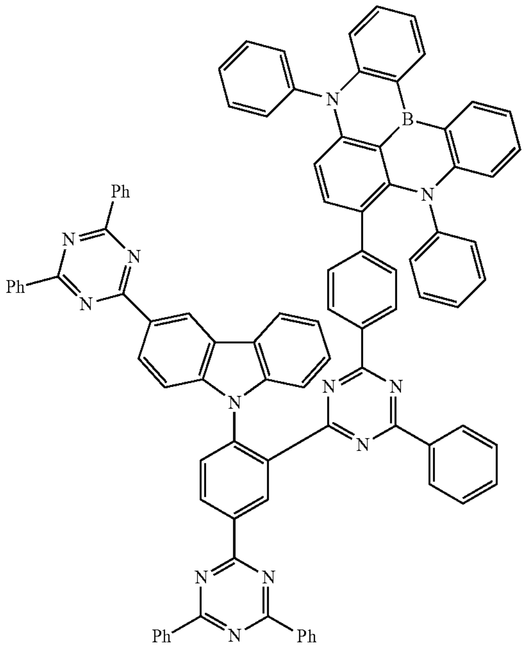

-continued
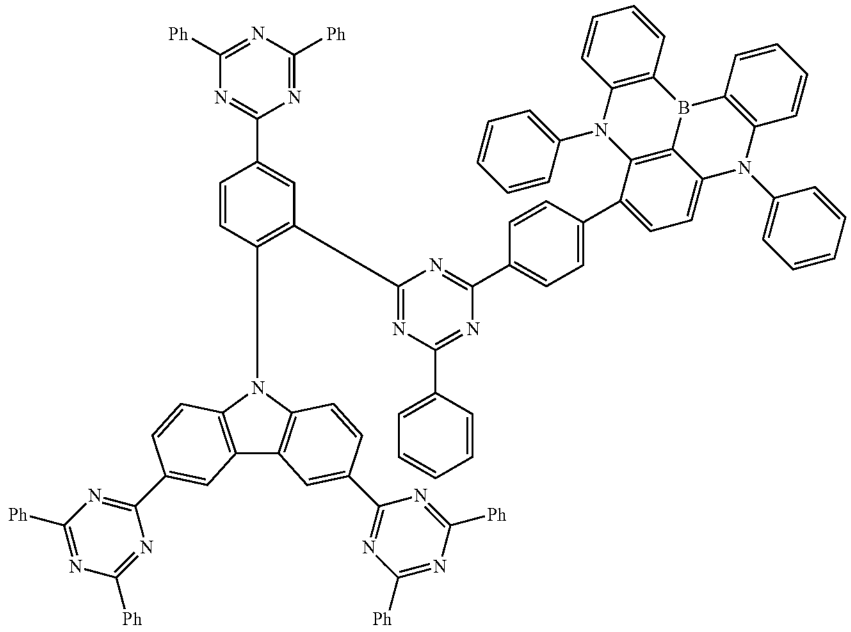 [SMILES: c1ccc(-c2nc(-c3ccccc3)nc(-c3ccc(-n4c5ccc(-c6nc(-c7ccccc7)nc(-c7ccccc7)n6)cc5c5cc(-c6nc(-c7ccccc7)nc(-c7ccccc7)n6)ccc54)c(-c4nc(-c5ccccc5)nc(-c5ccc(-c6ccc7c8c6N(c6ccccc6)c6ccccc6B8c6ccccc6N7c6ccccc6)cc5)n4)c3)n2)cc1]
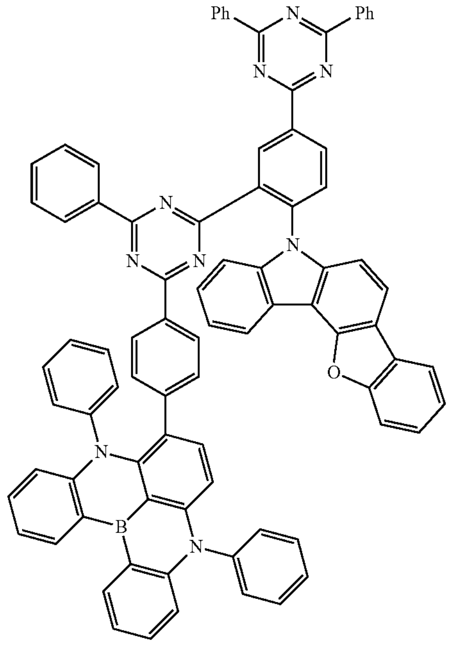
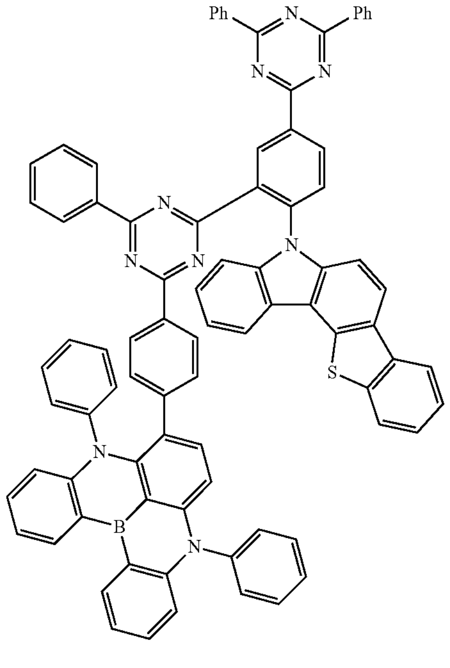

-continued
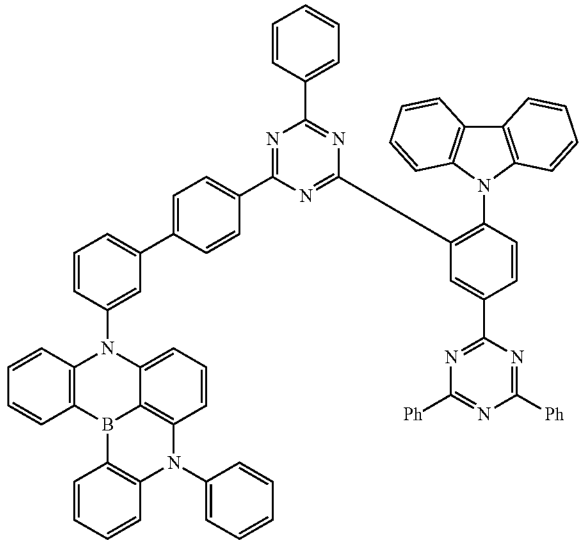
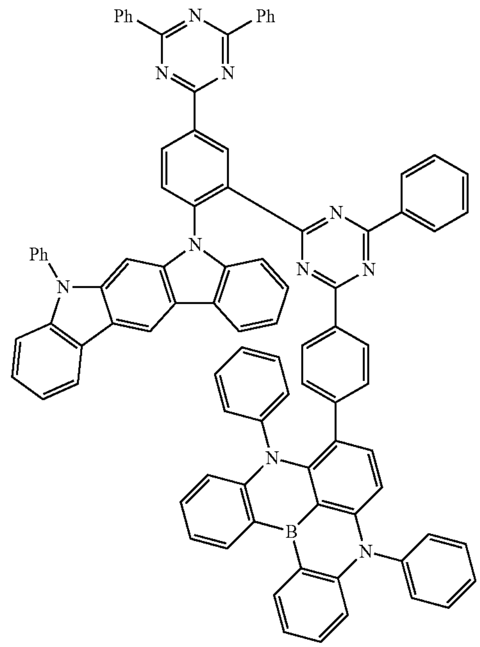
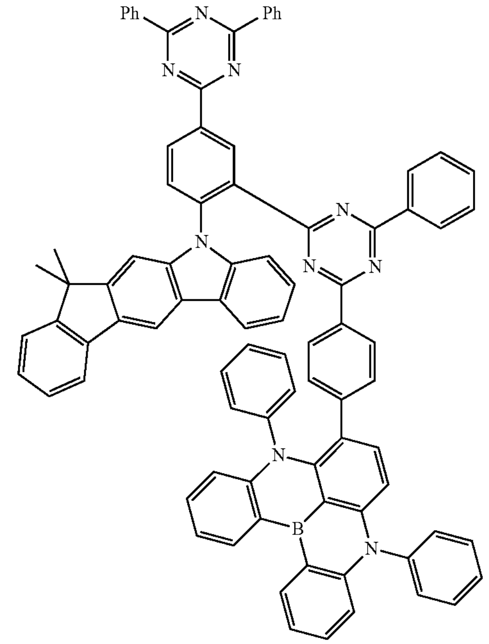
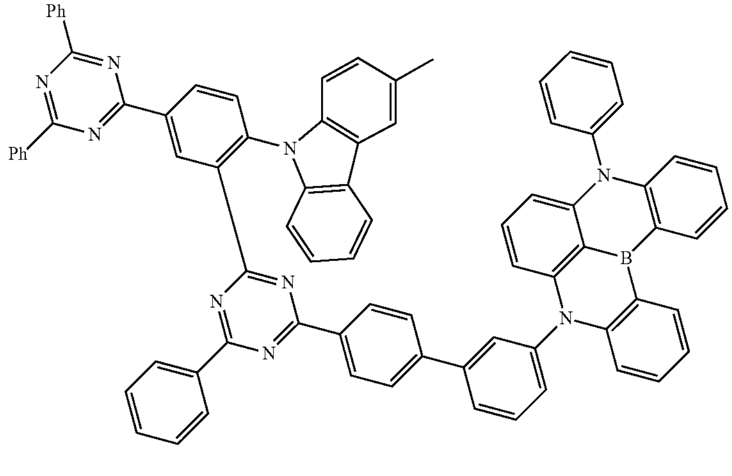

-continued
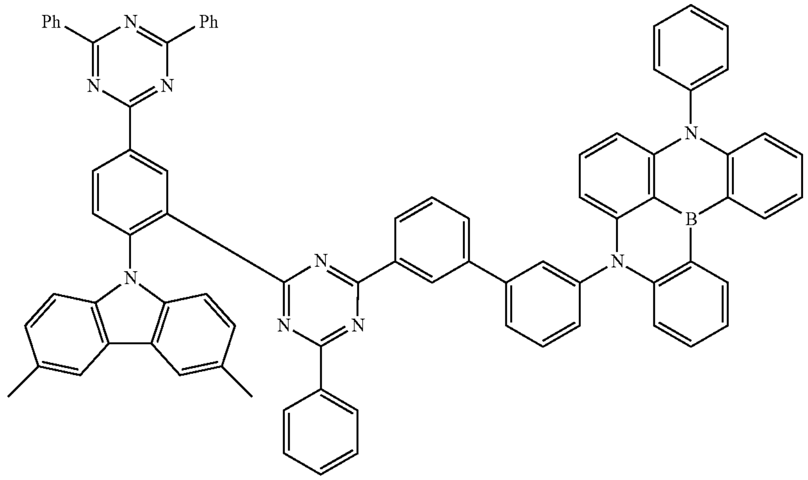
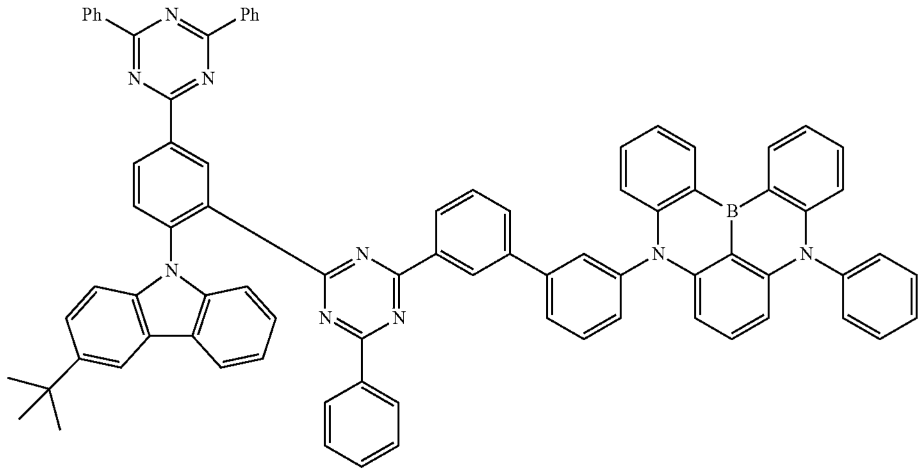
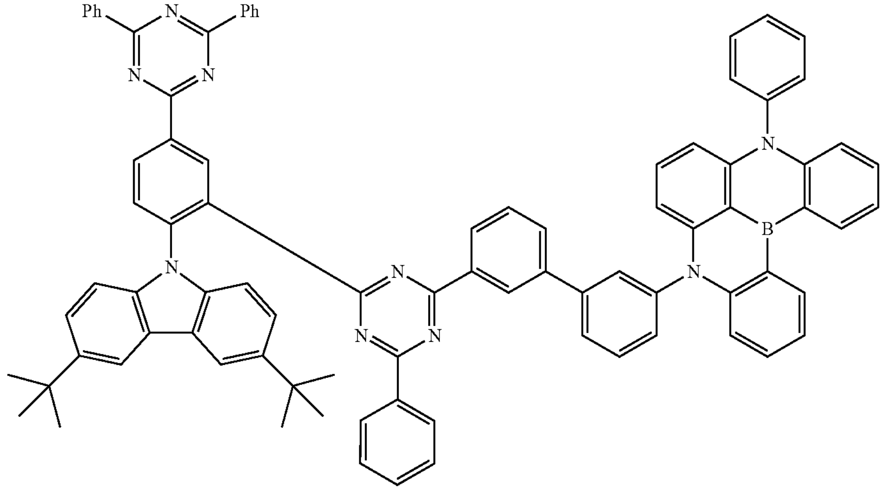

-continued
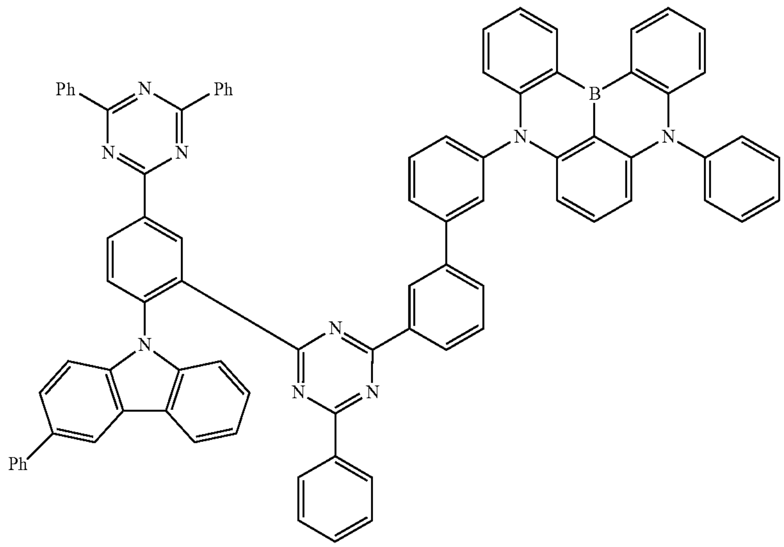
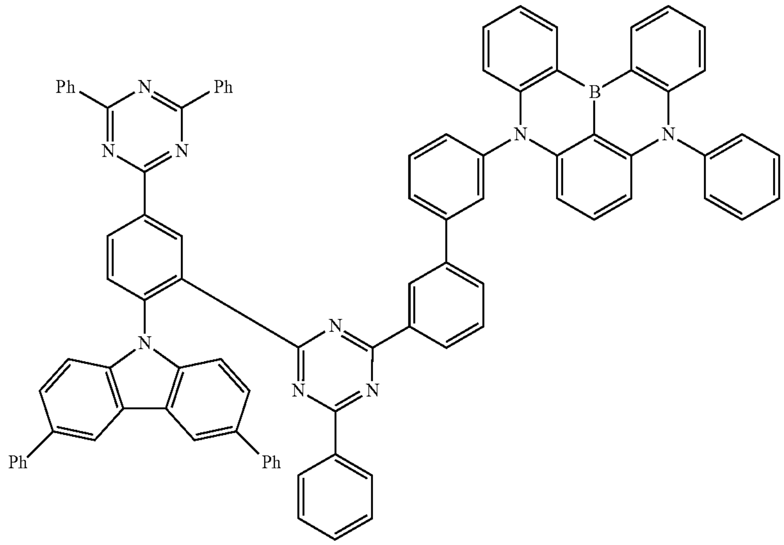
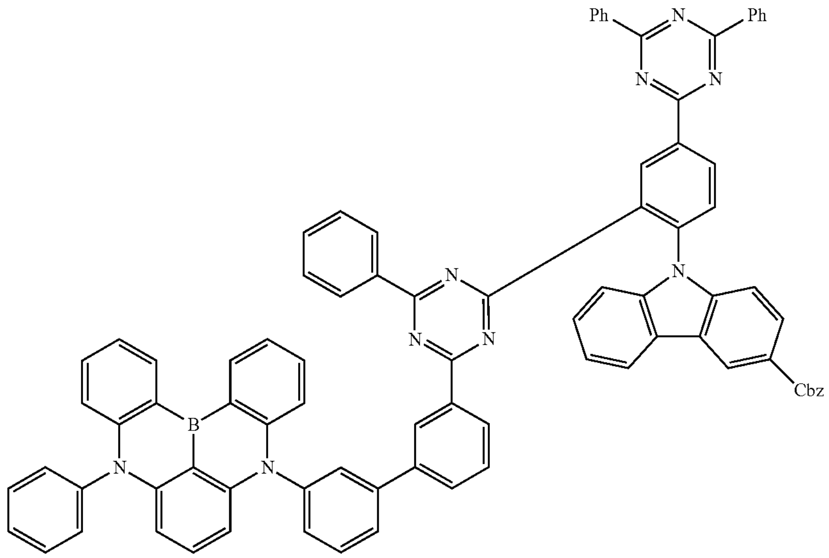

-continued
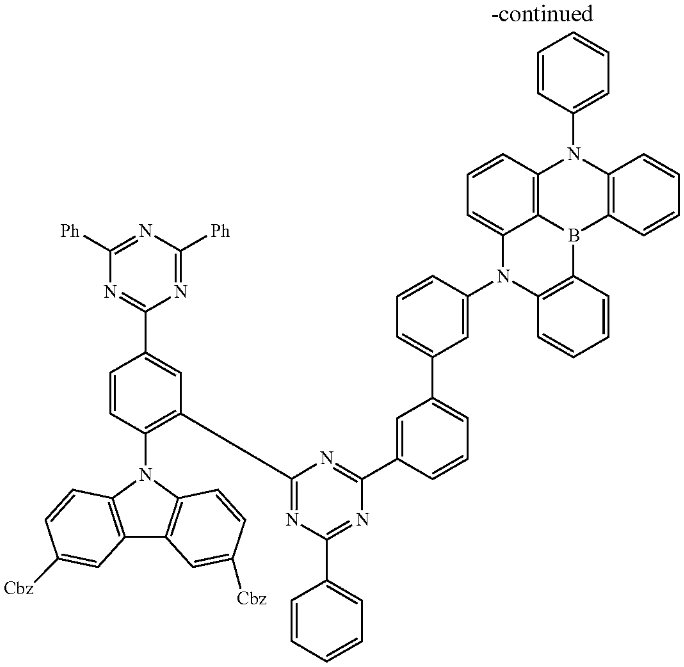
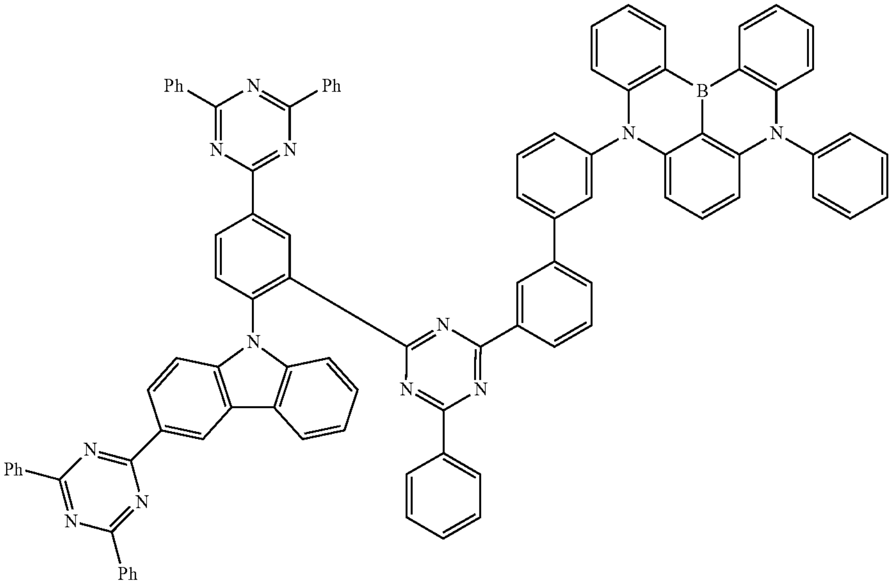
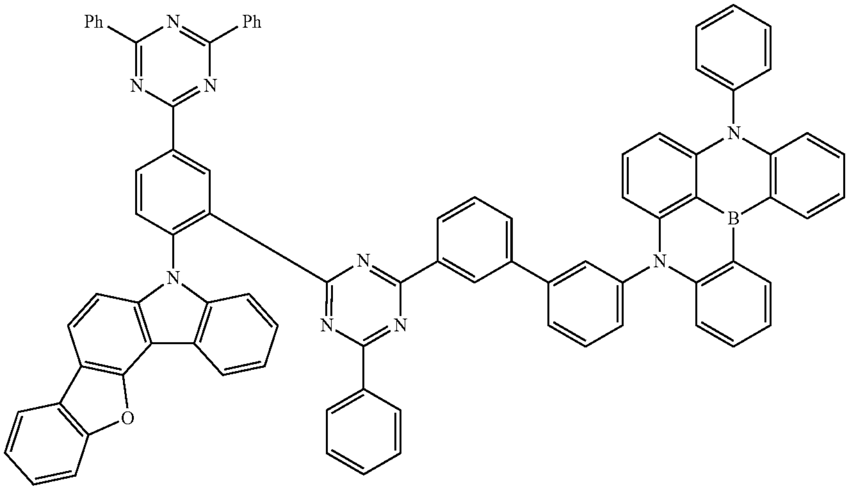

-continued
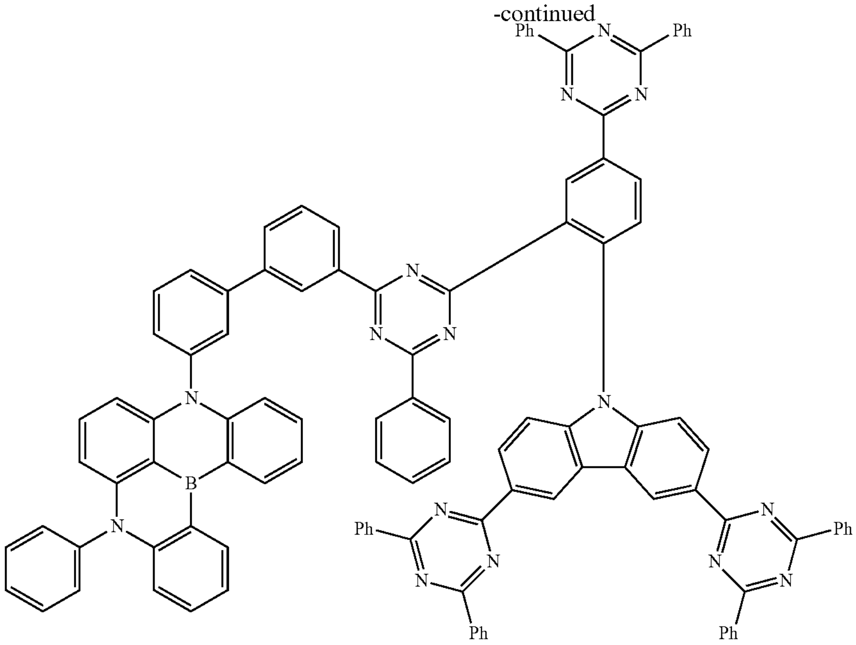
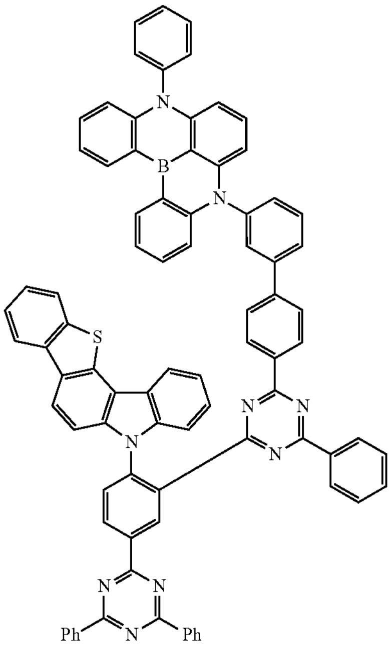
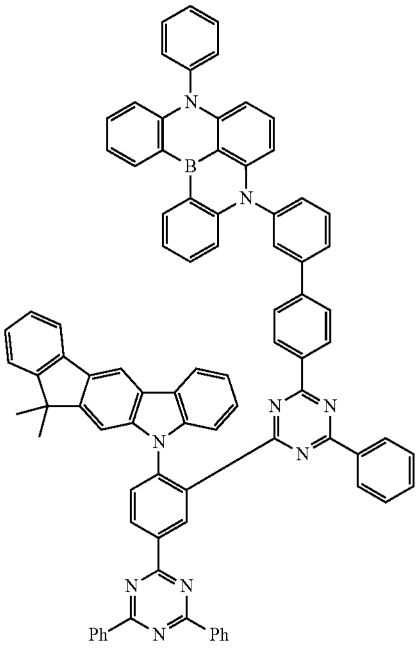

-continued
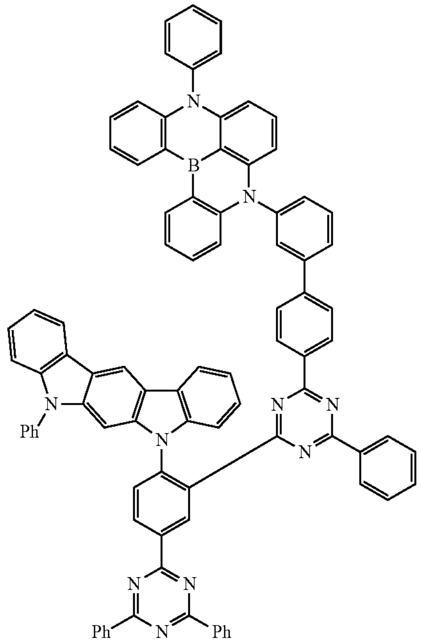
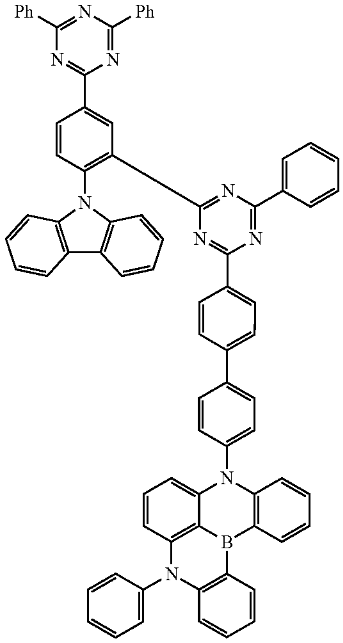
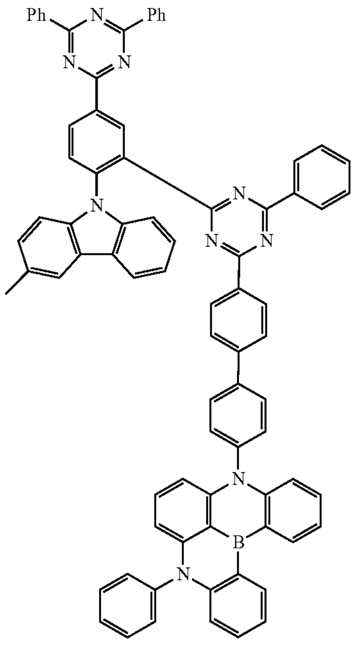
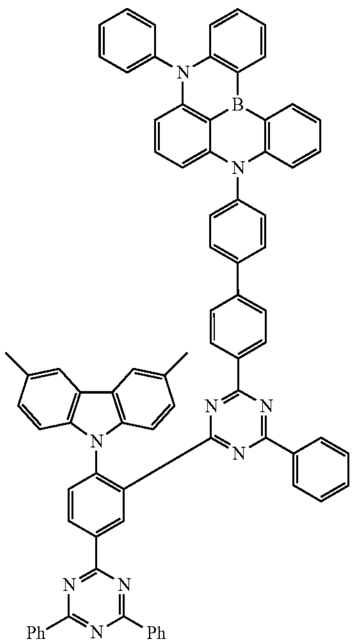

-continued
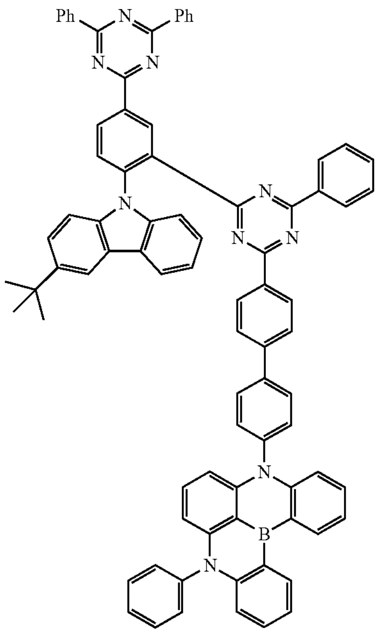
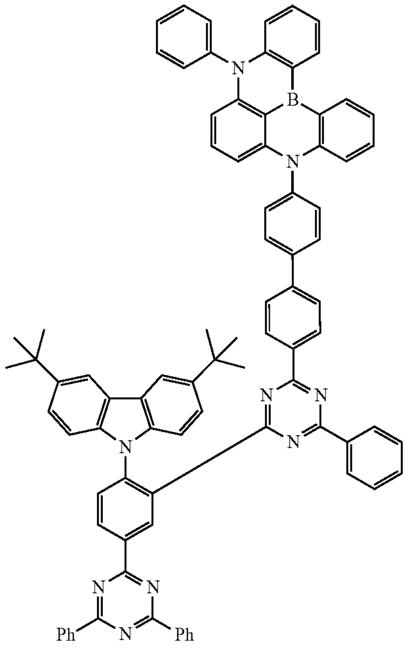
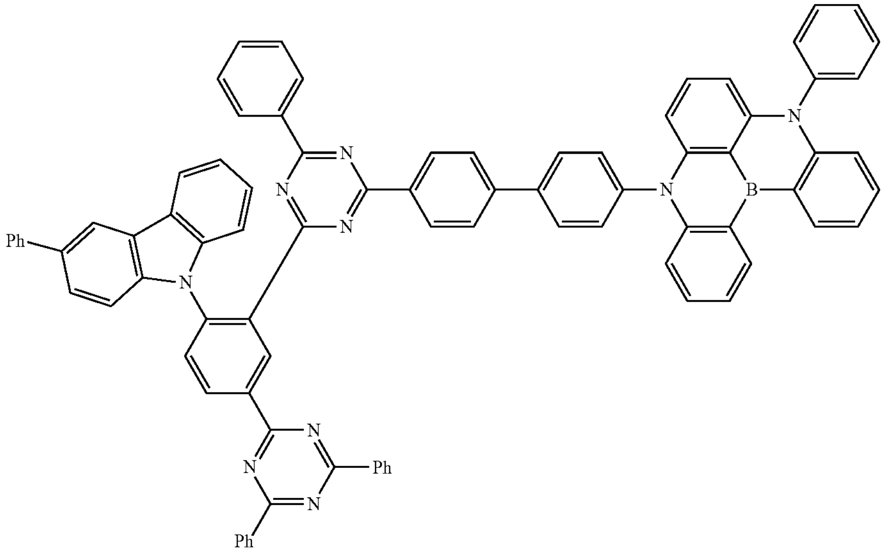
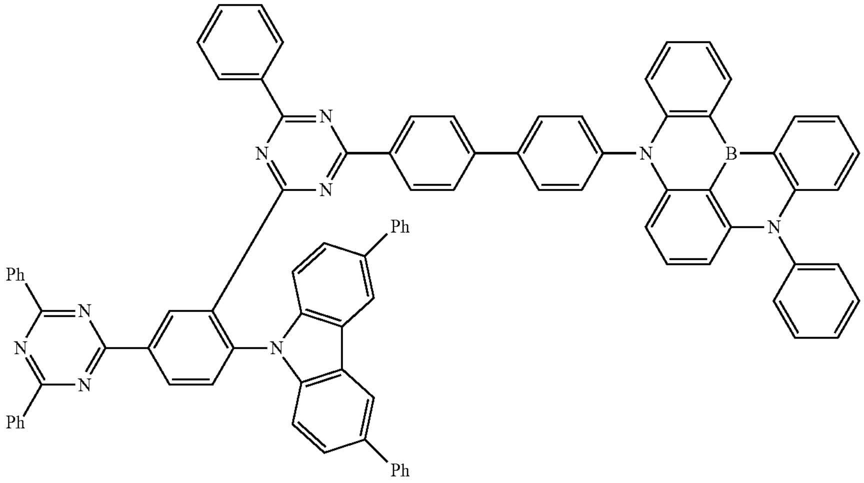

-continued
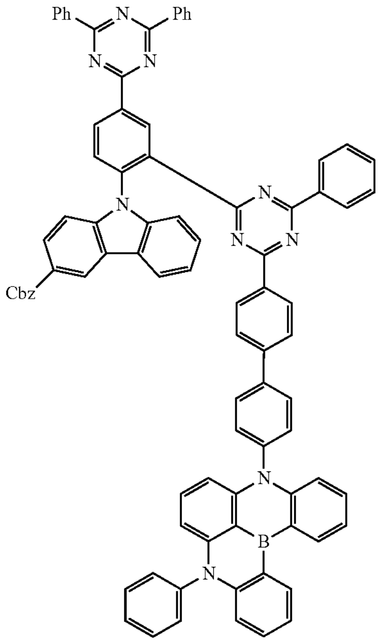
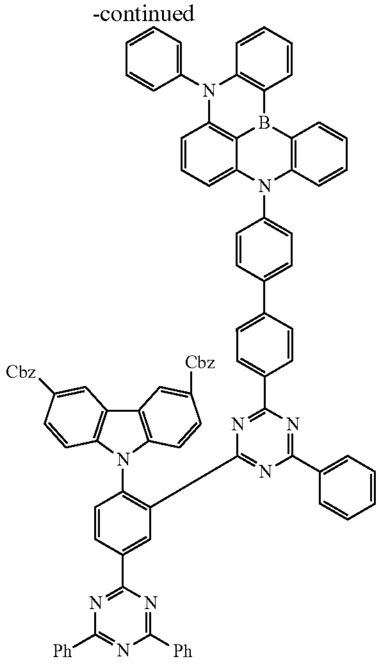
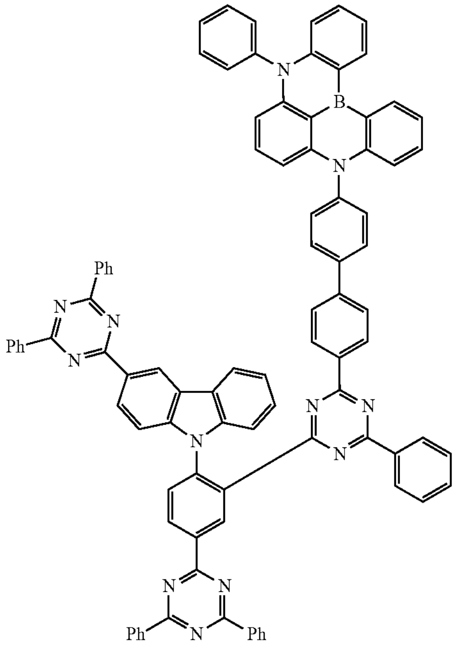

-continued
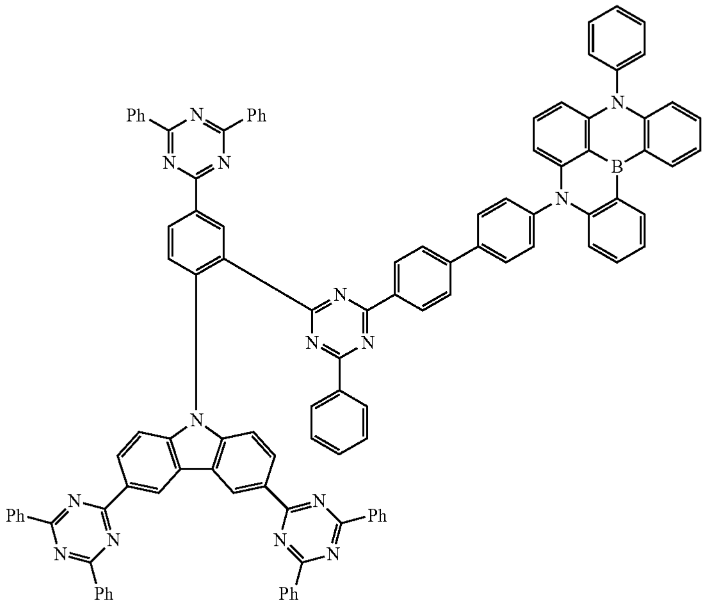
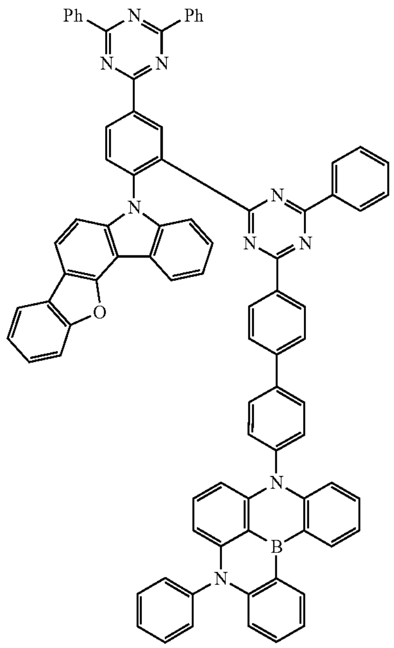
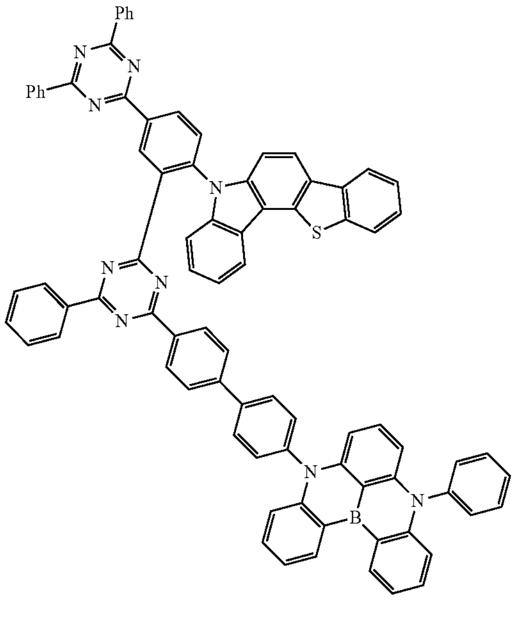
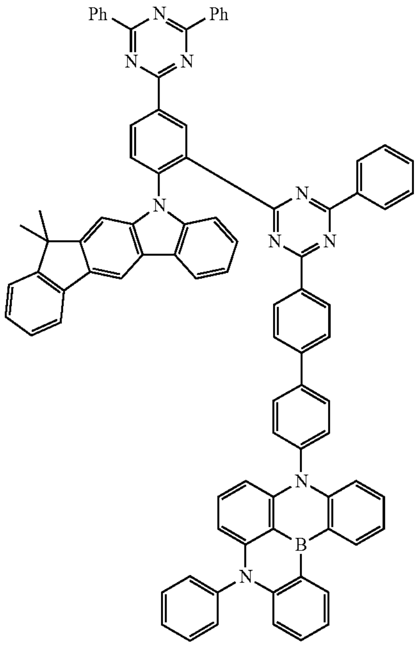

-continued
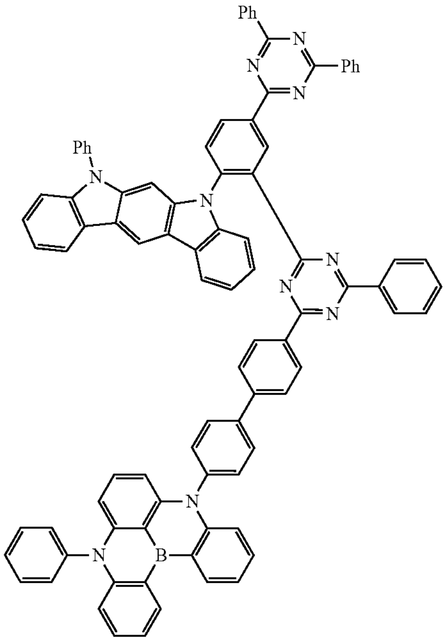
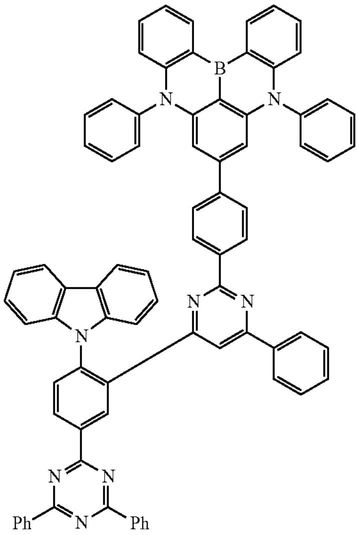
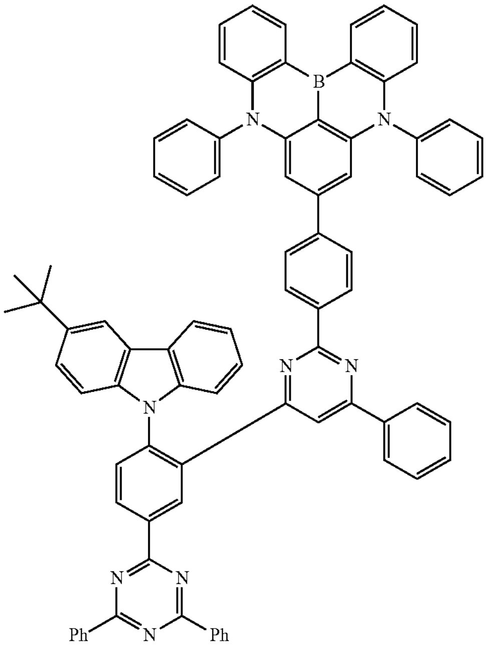

-continued
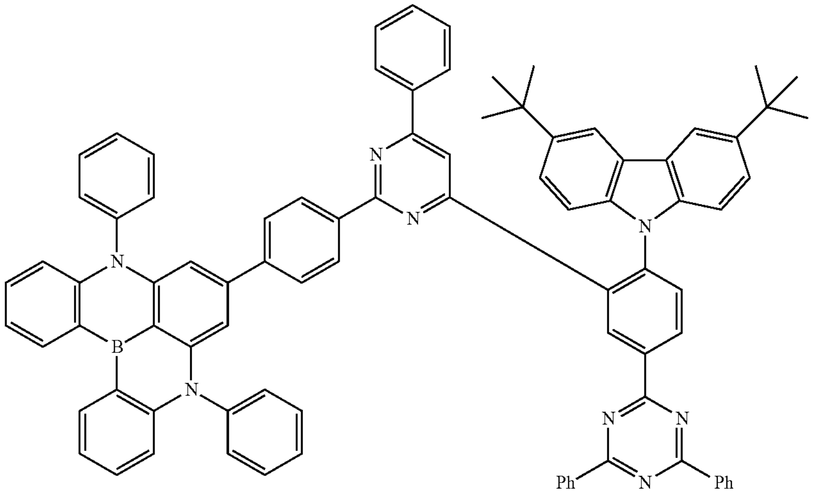
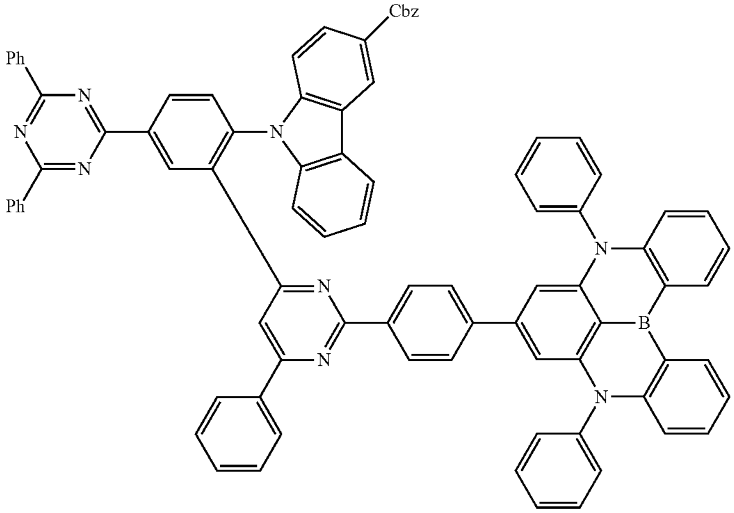
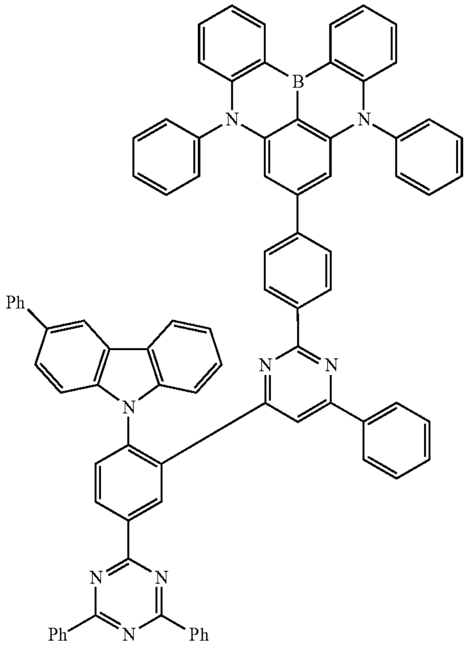
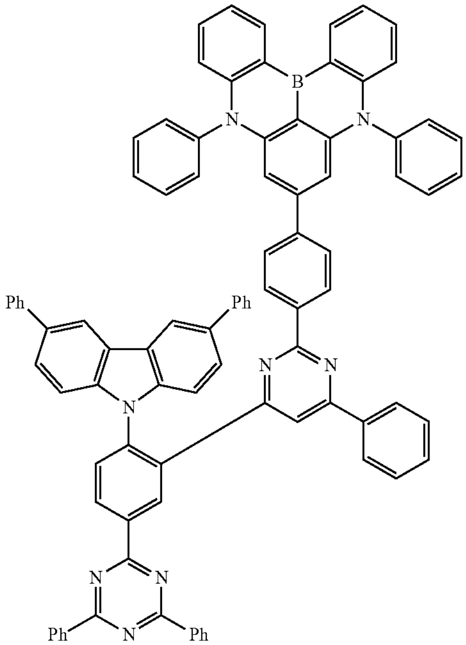

-continued
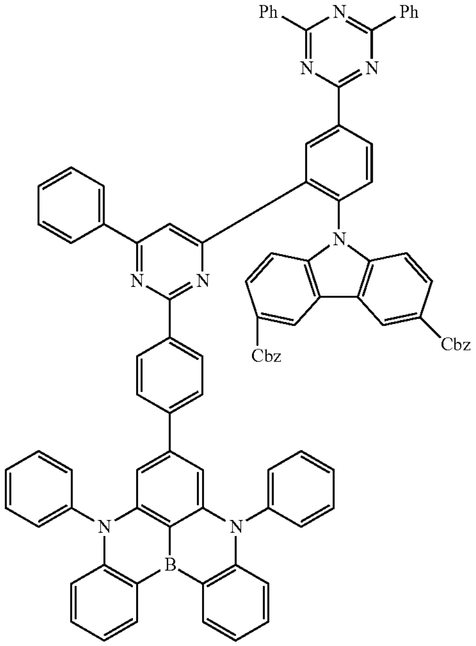
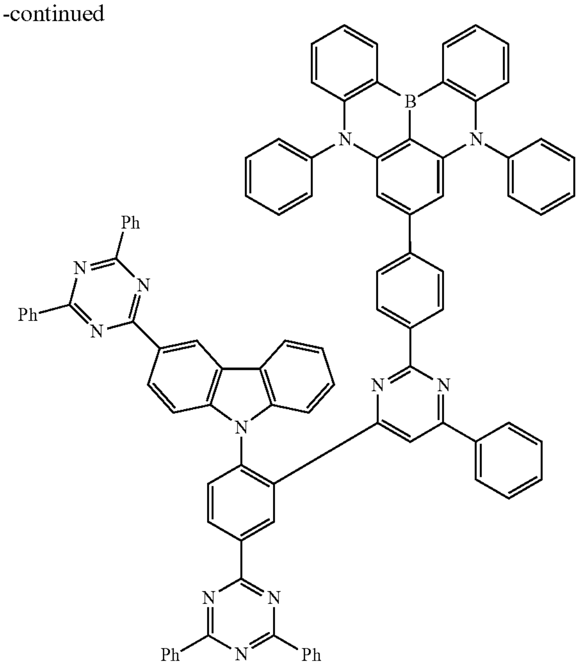
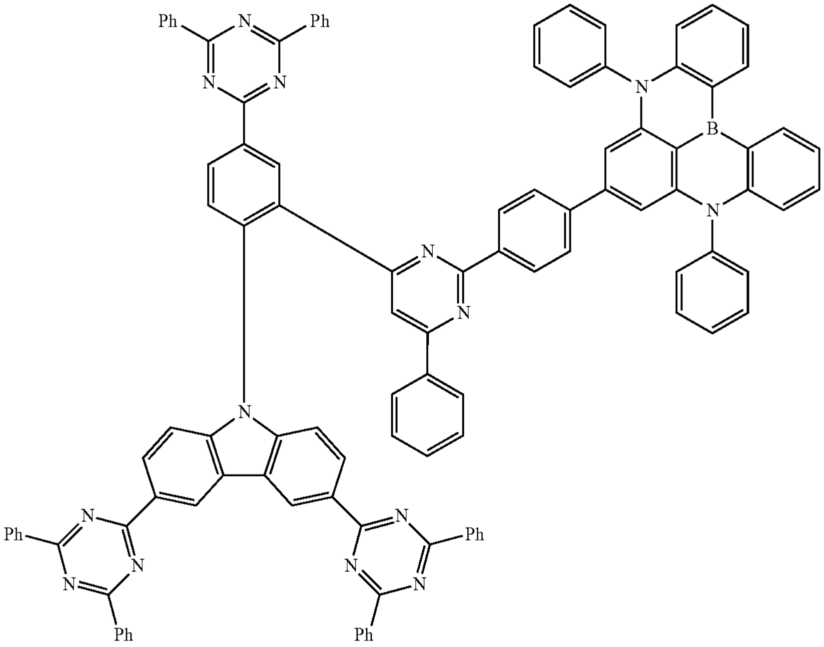

-continued
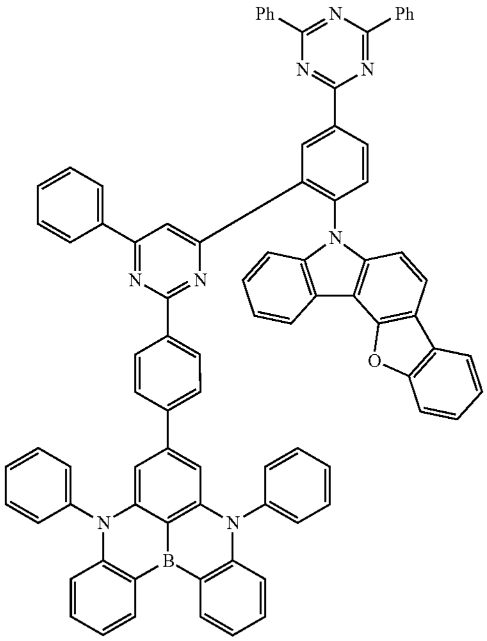
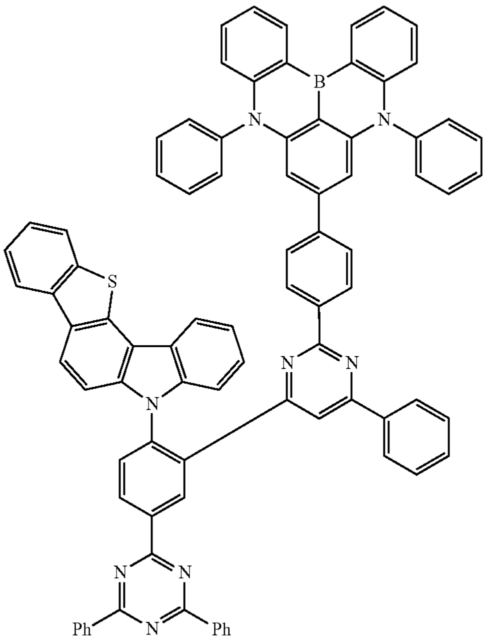
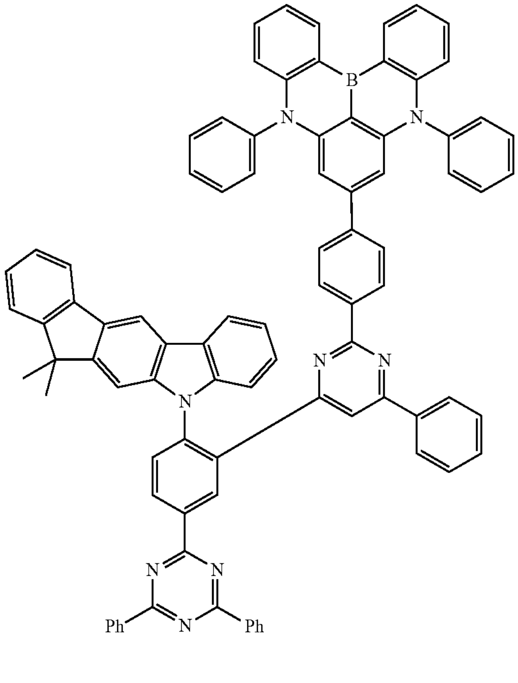
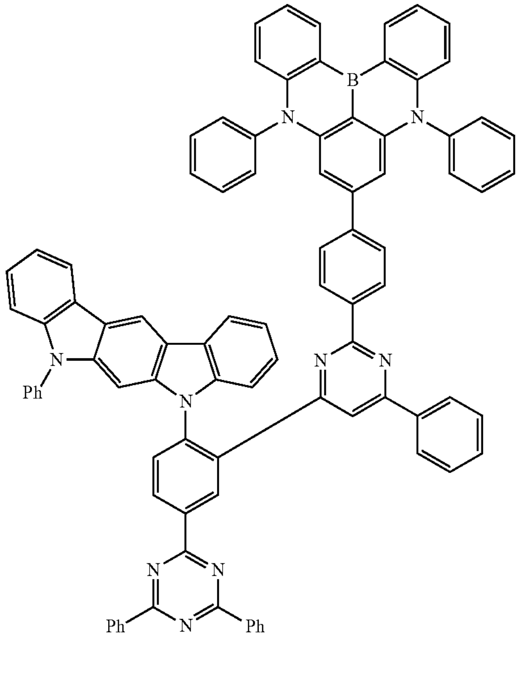

-continued
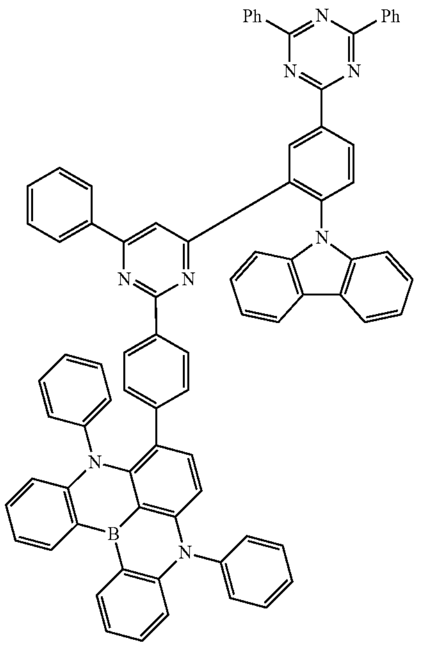
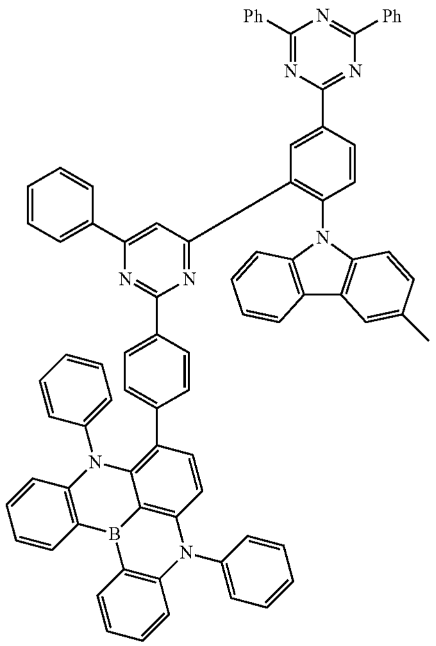
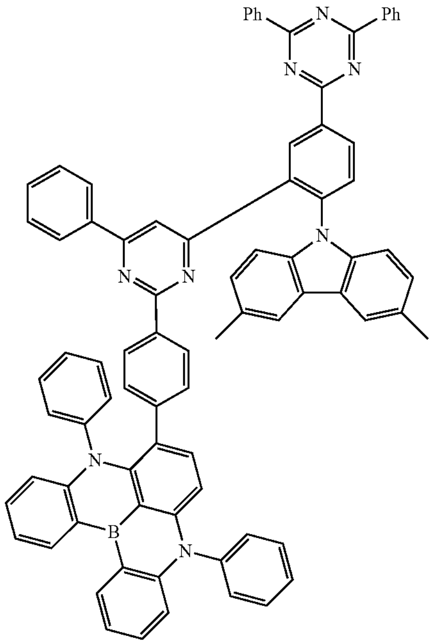

-continued
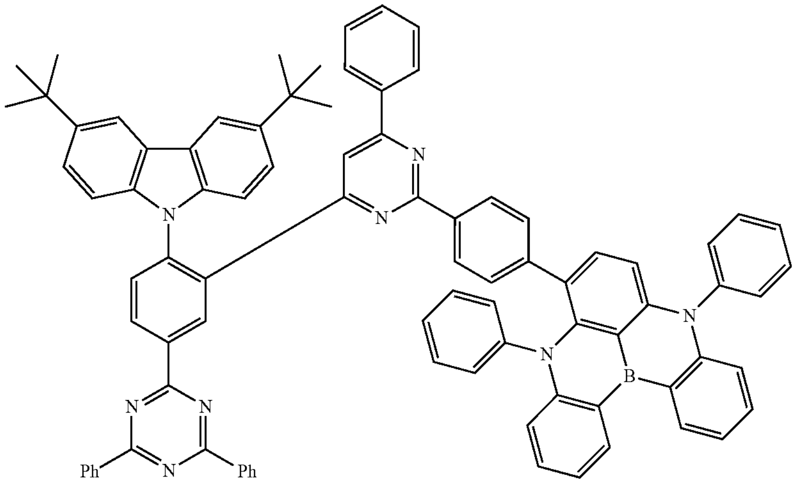
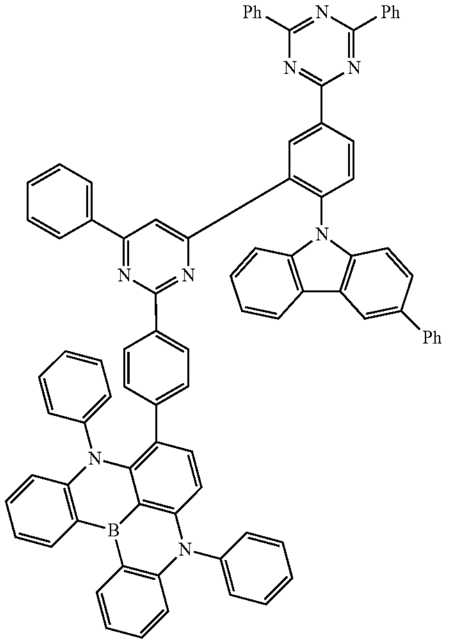
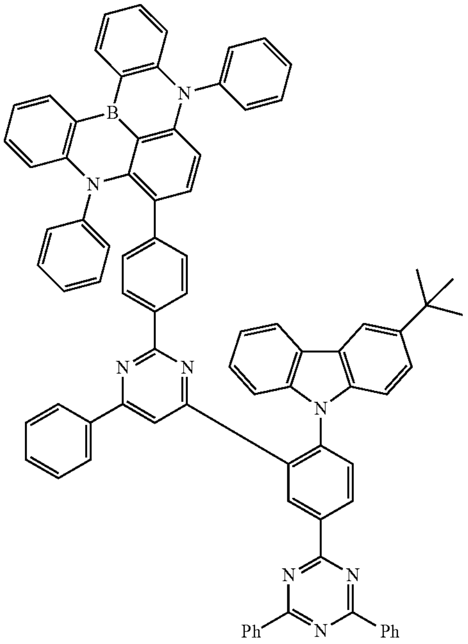
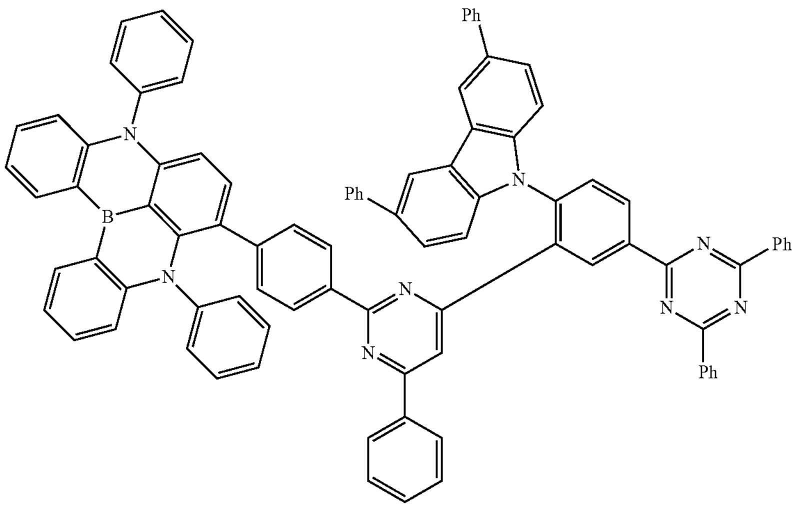

-continued
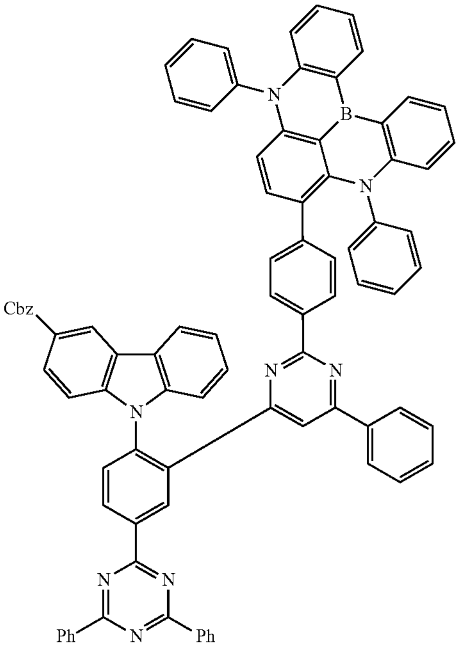
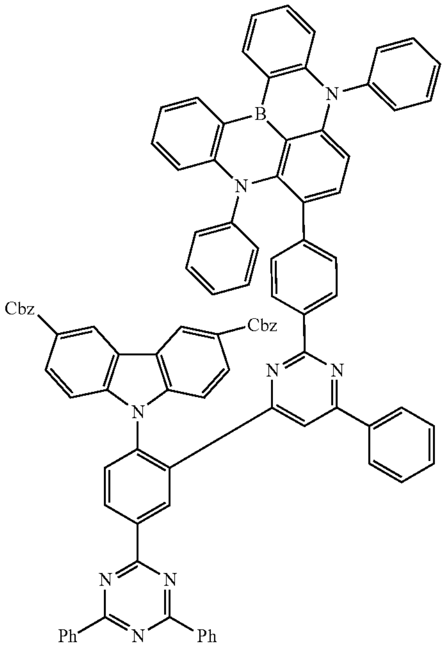
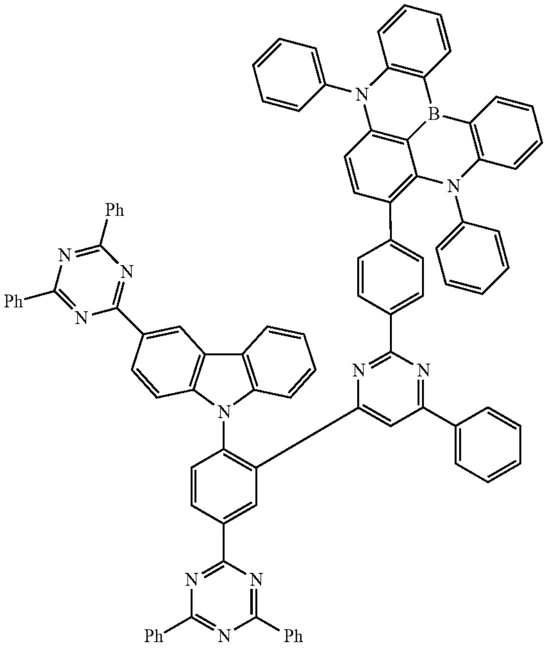

-continued
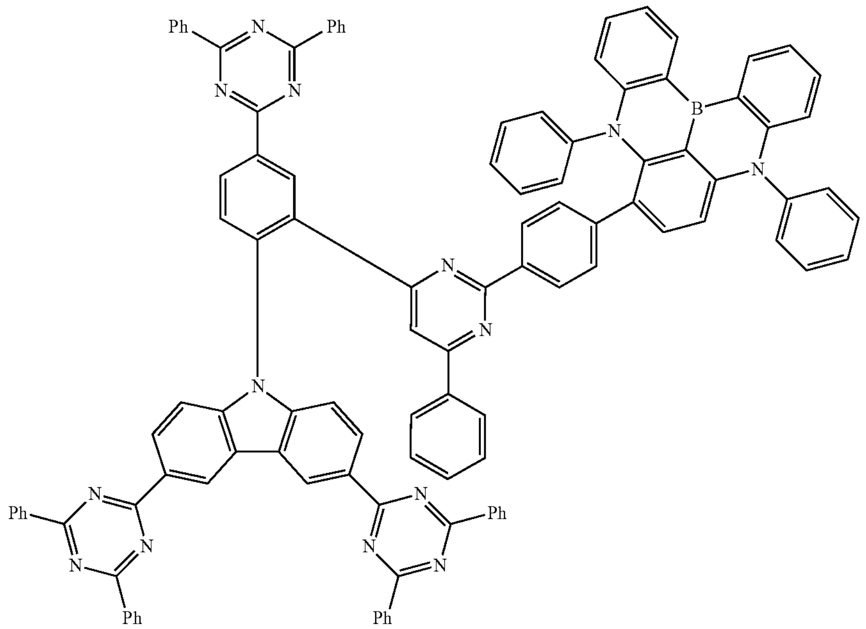
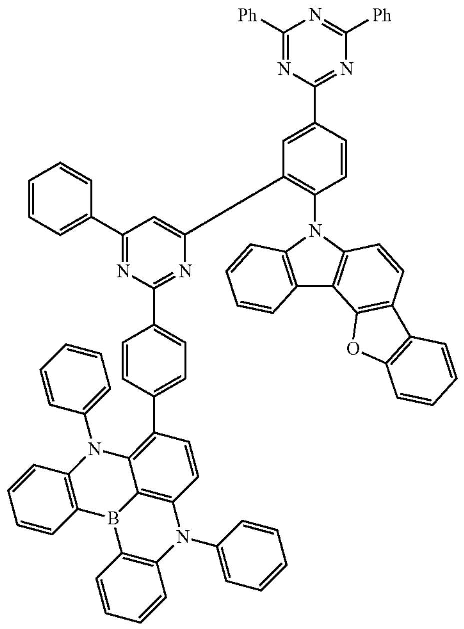
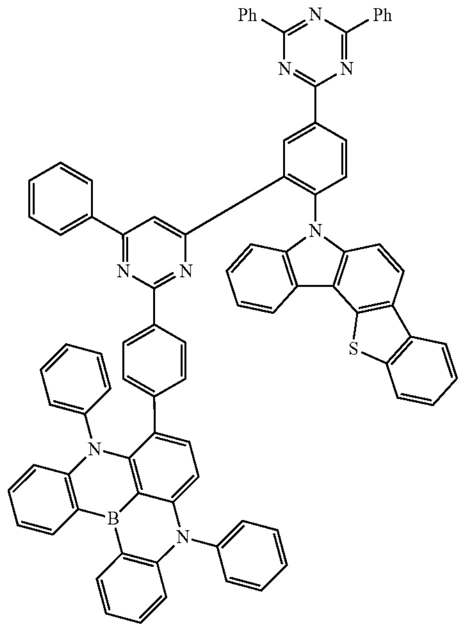

-continued
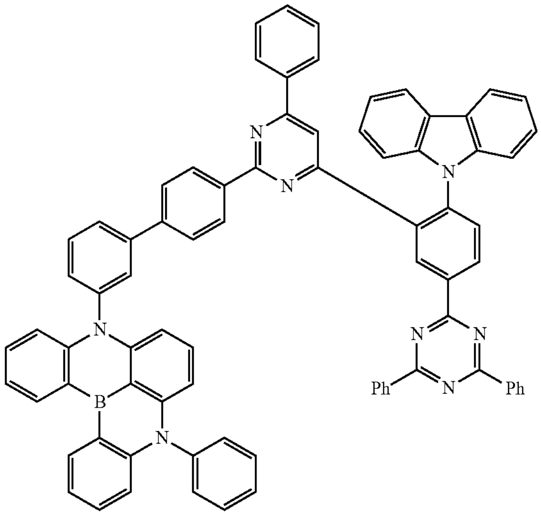
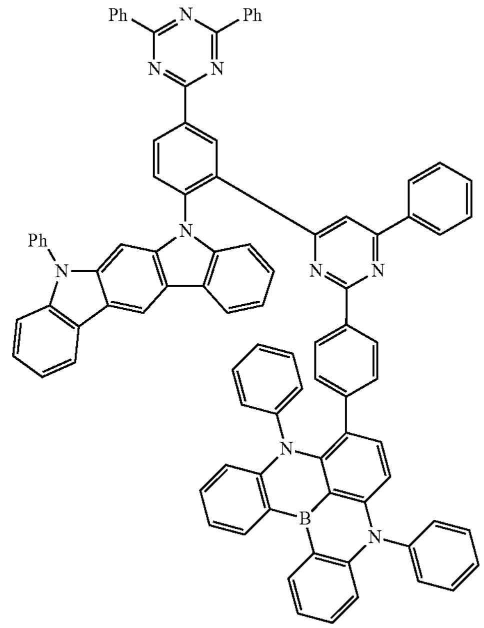
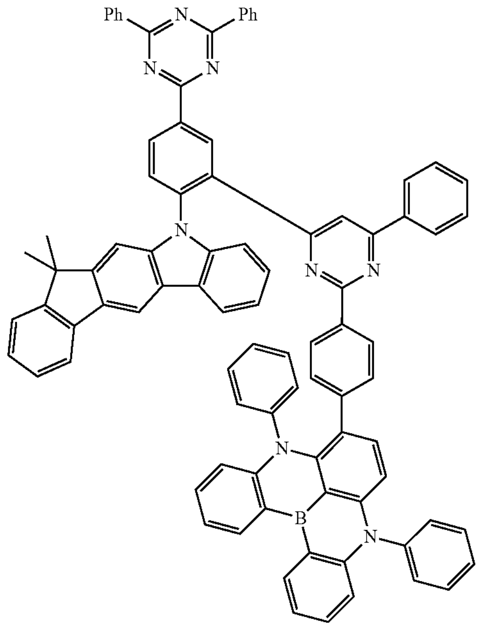
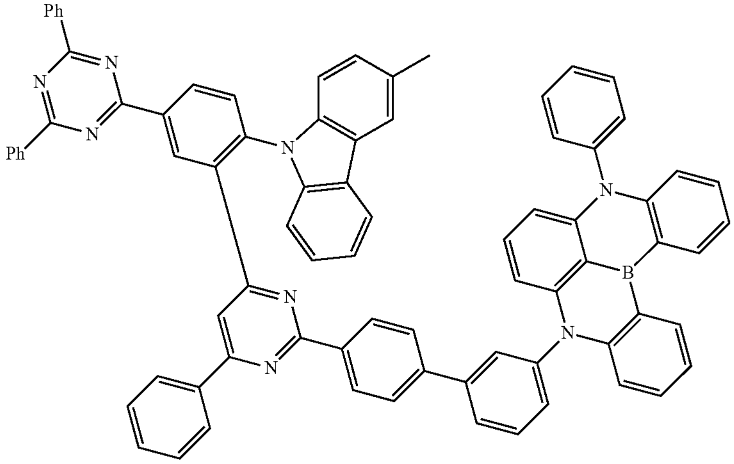

-continued
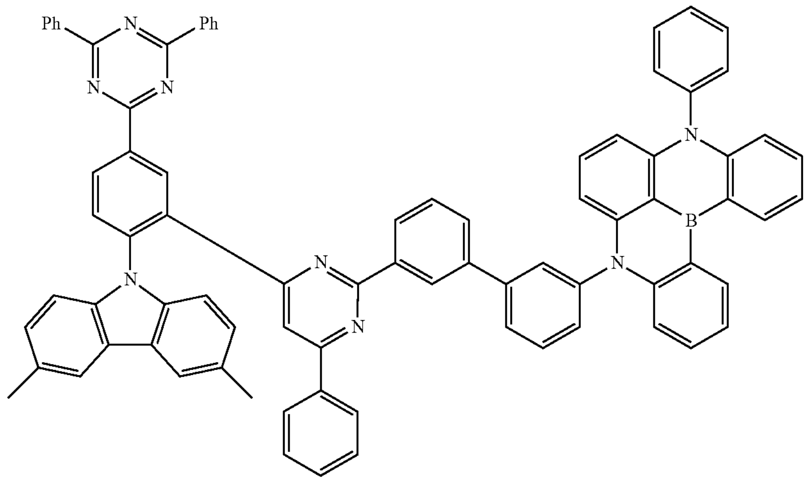
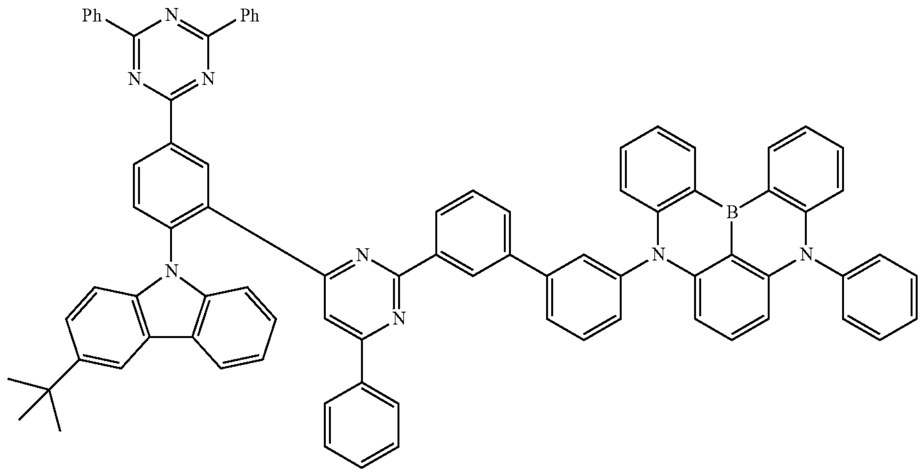
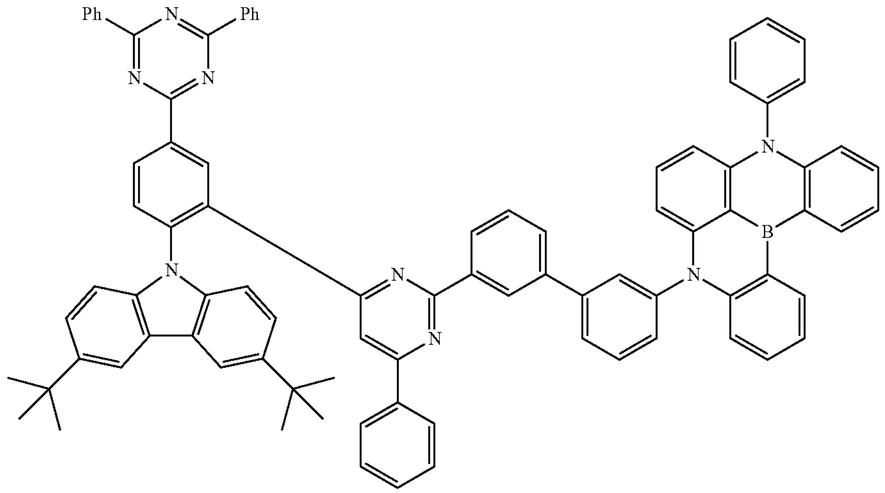

-continued
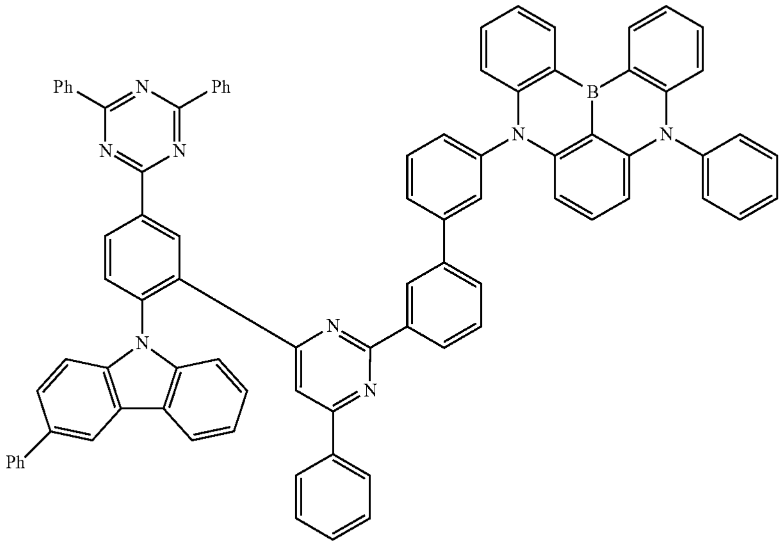
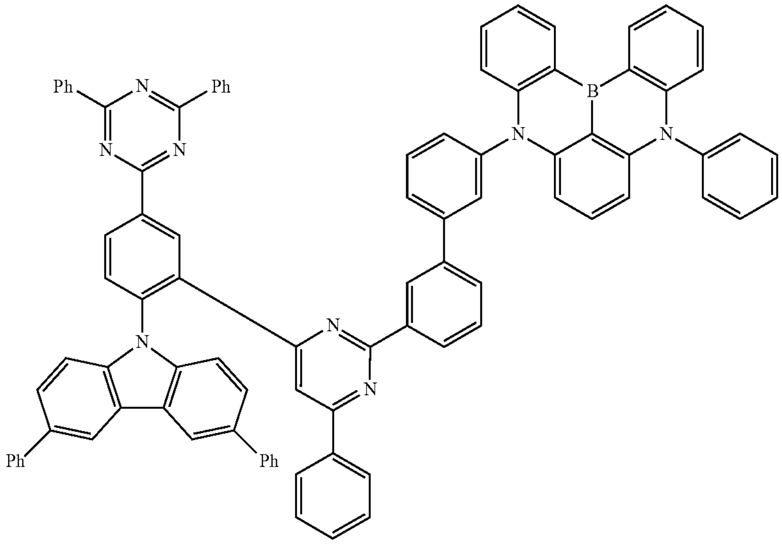
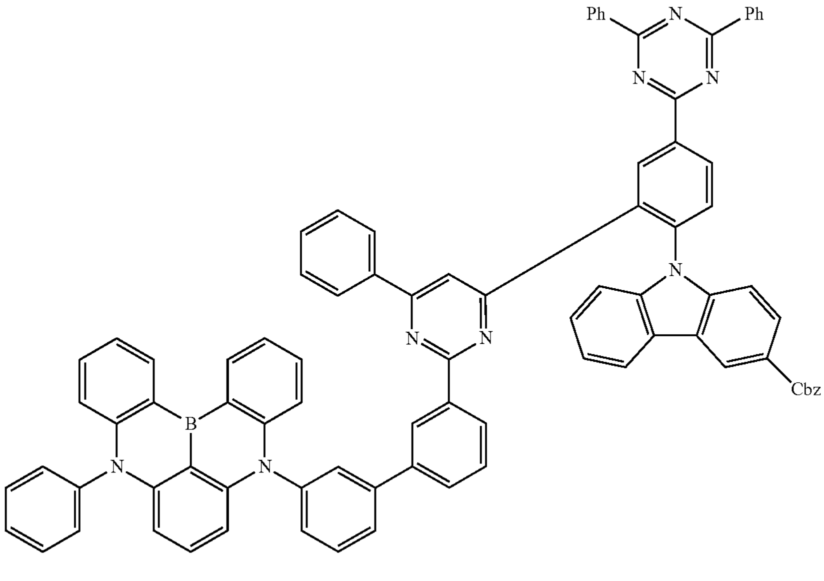

-continued
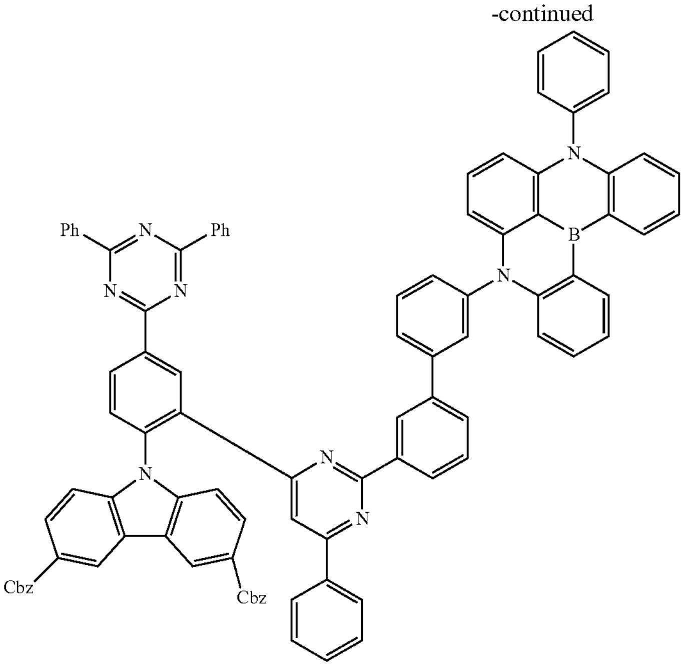
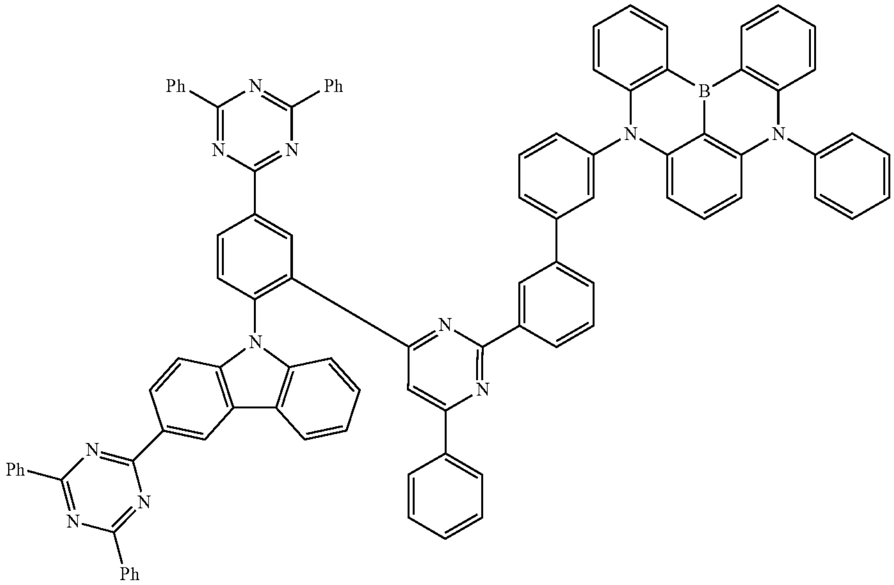
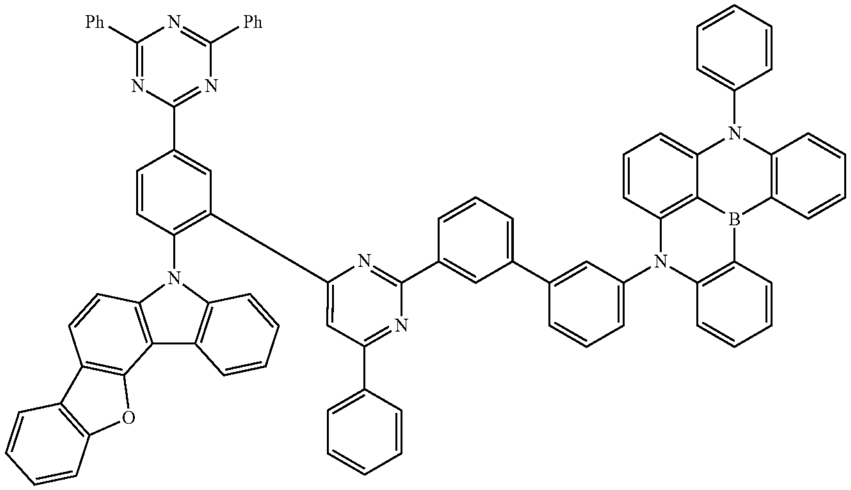

-continued
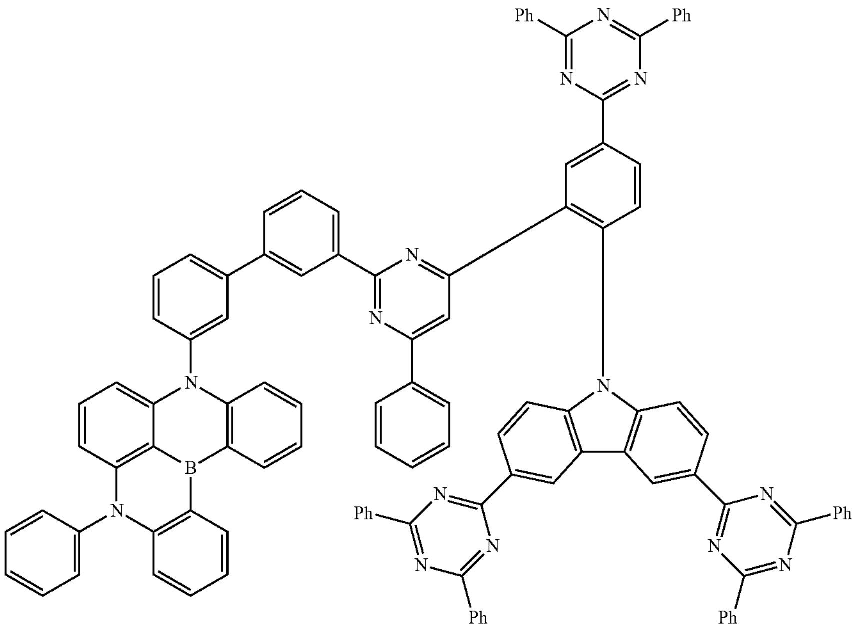
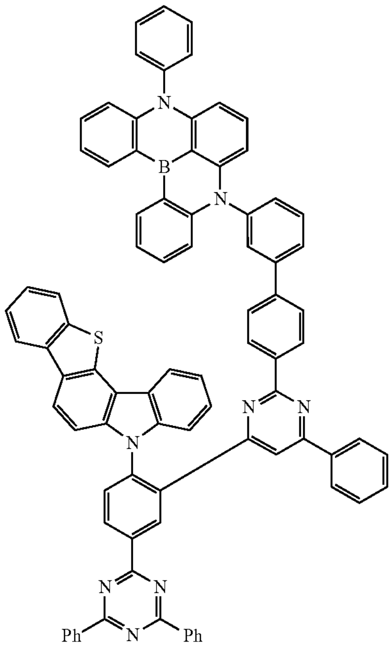
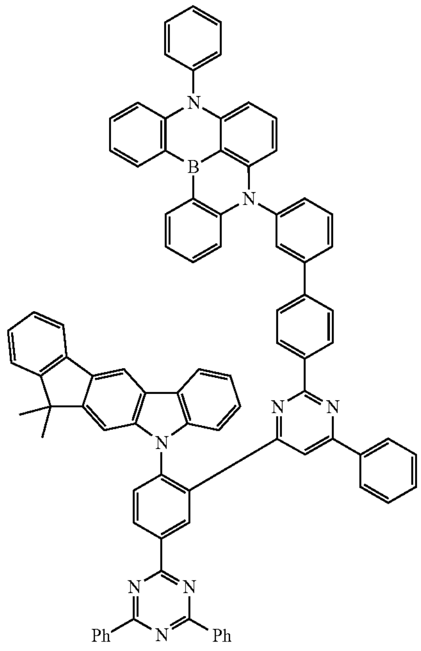

-continued
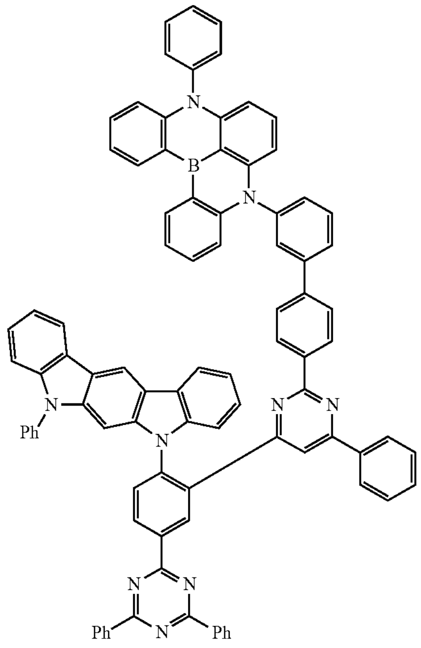
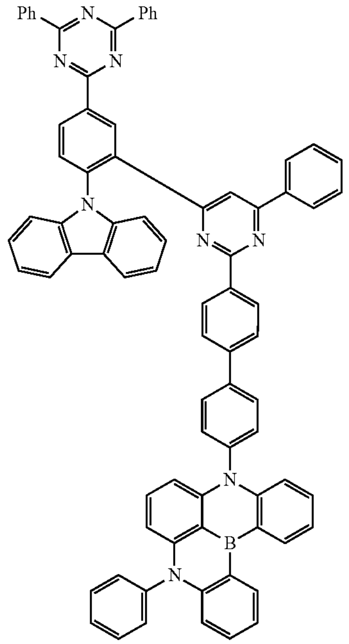
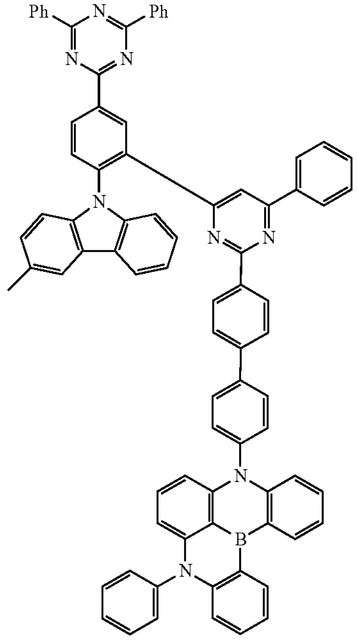
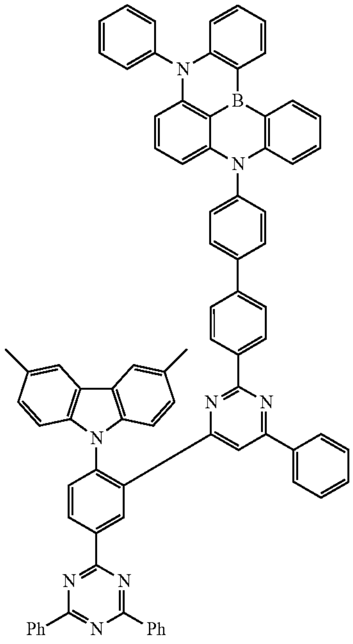

-continued
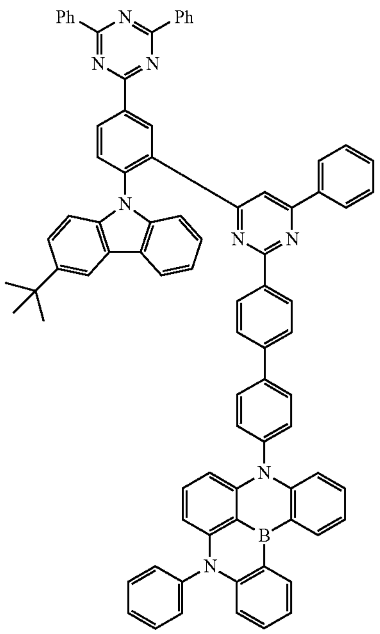
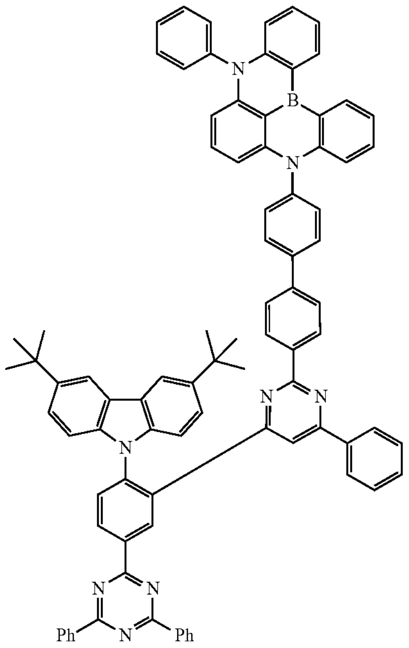
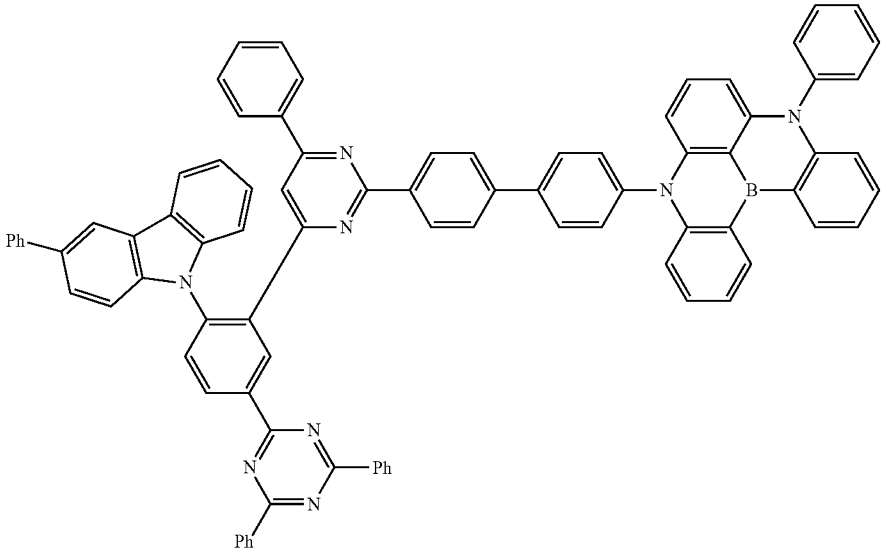
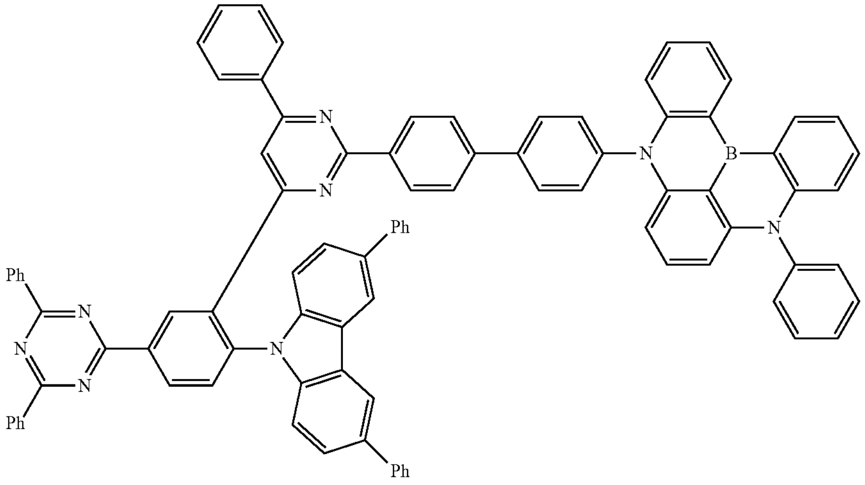

-continued
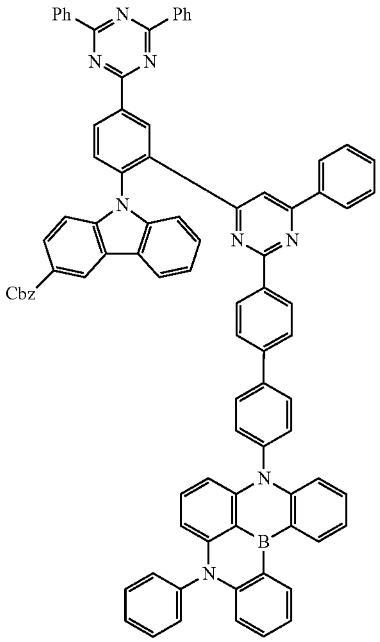
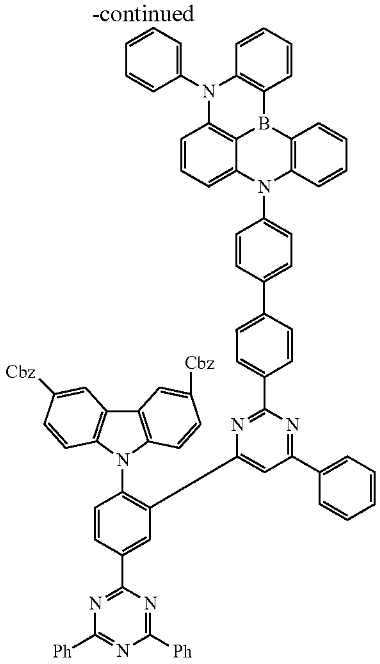
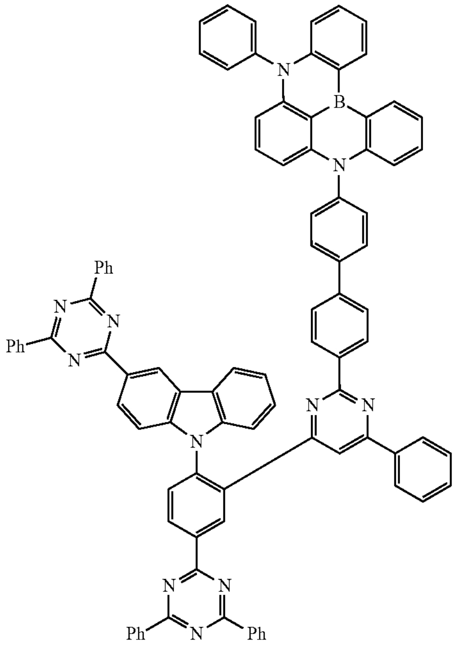

-continued
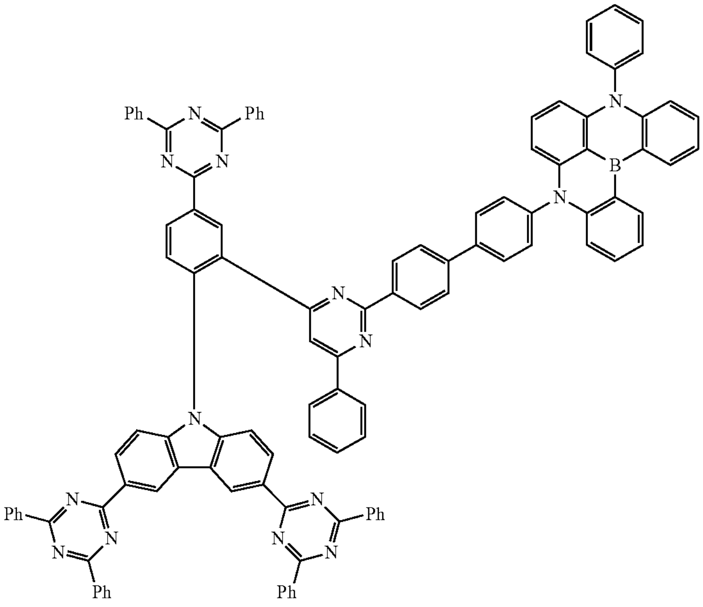
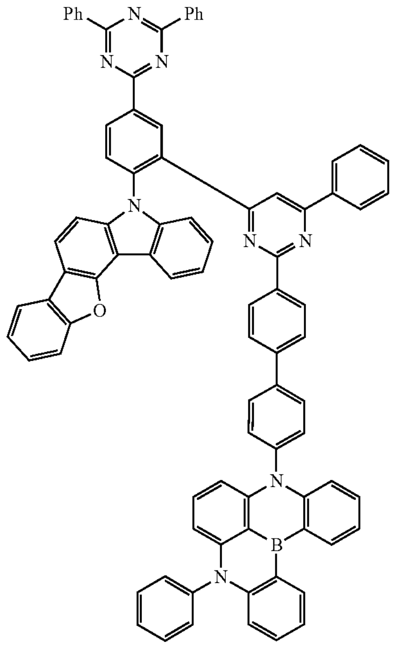
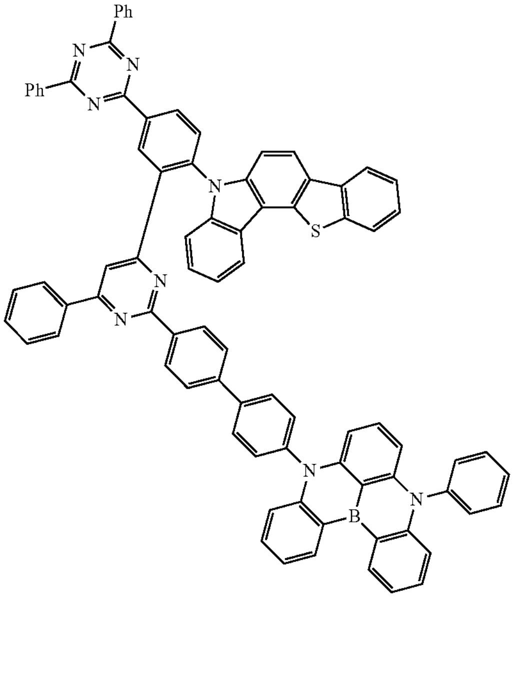
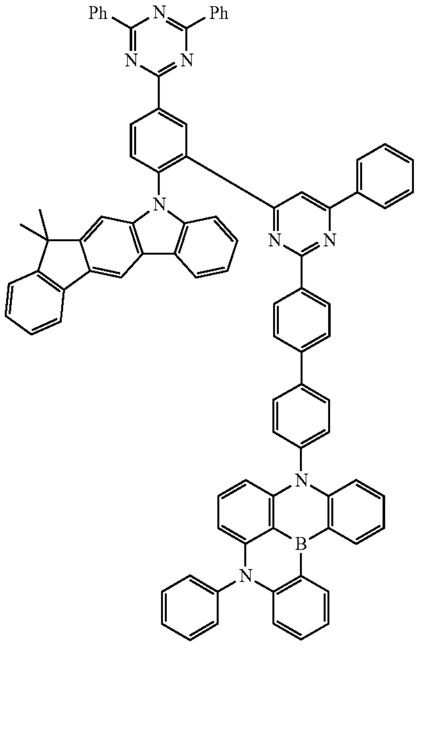

-continued
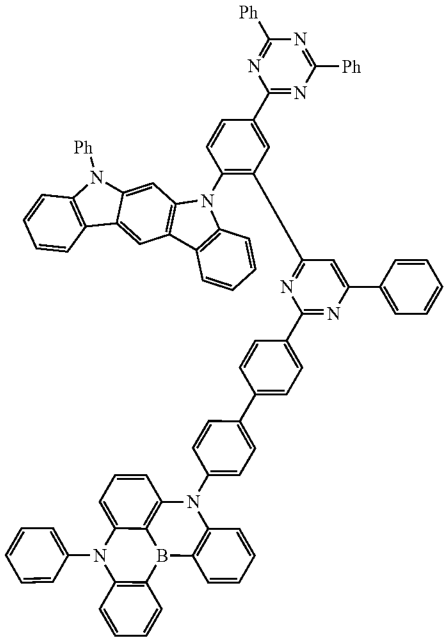
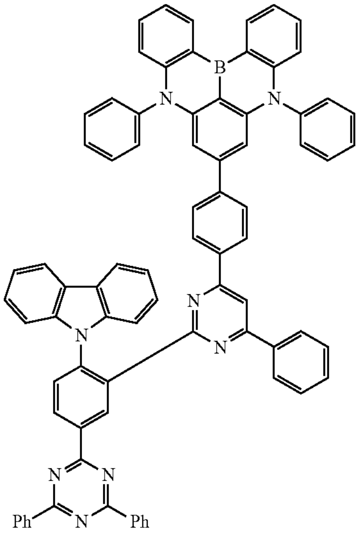
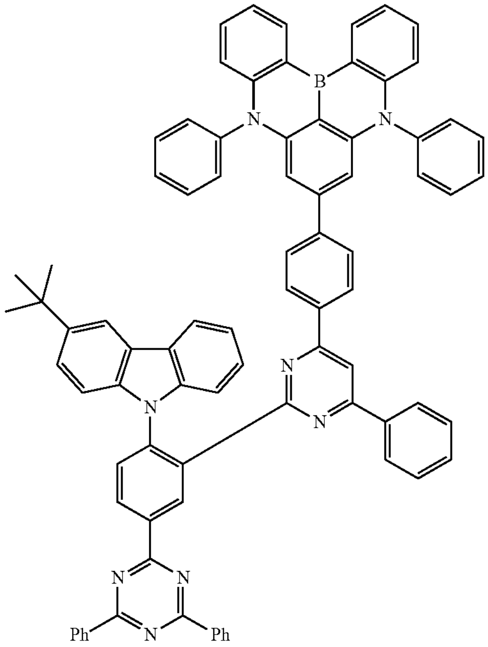

-continued
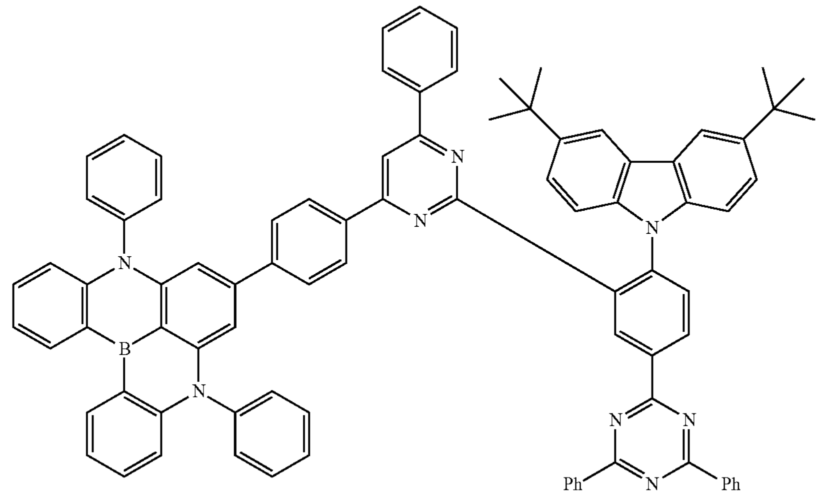
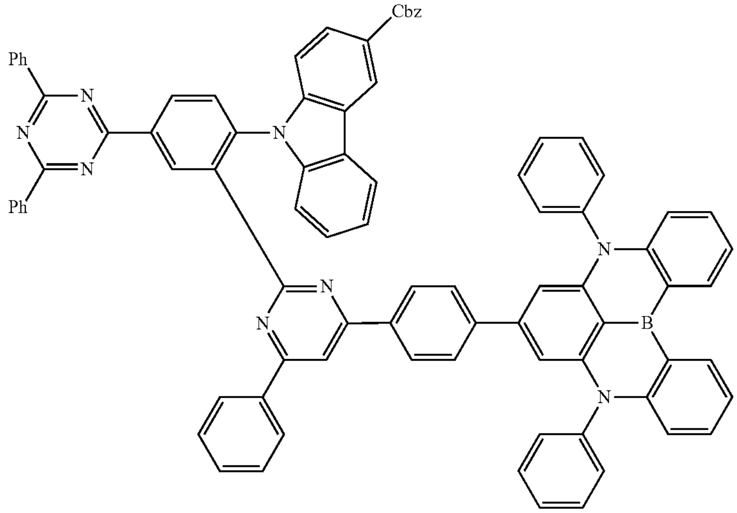
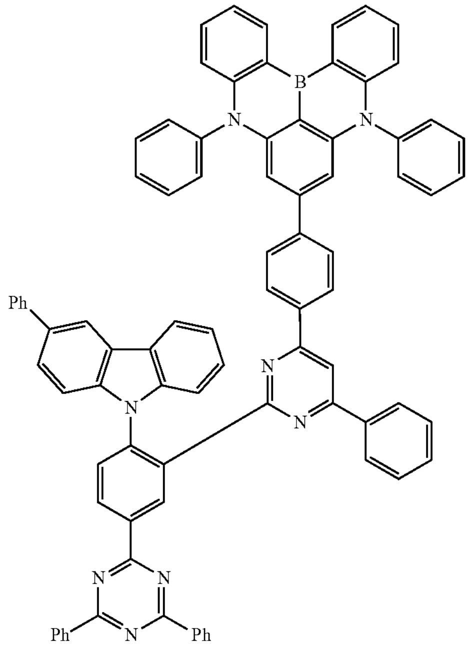
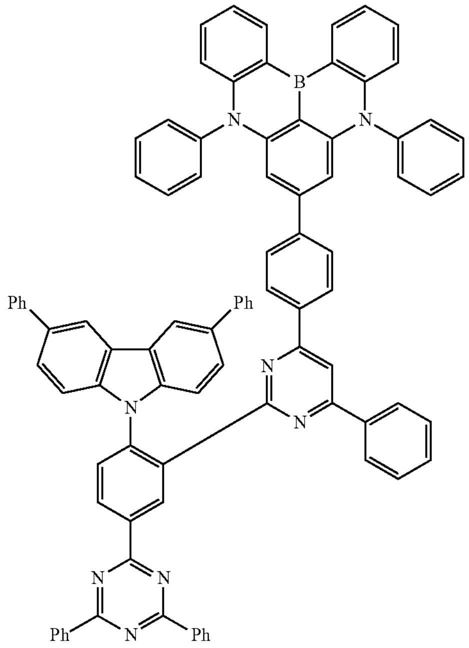

-continued
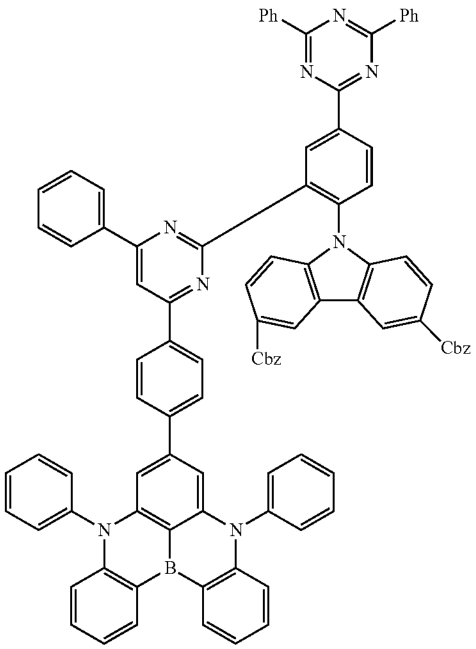
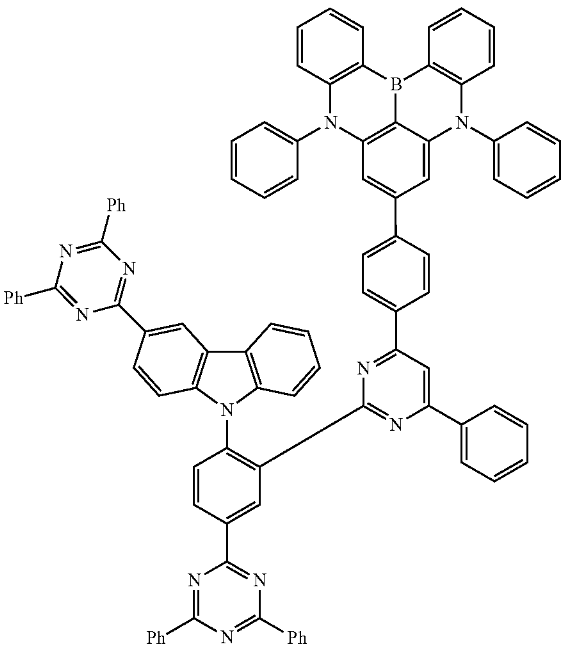
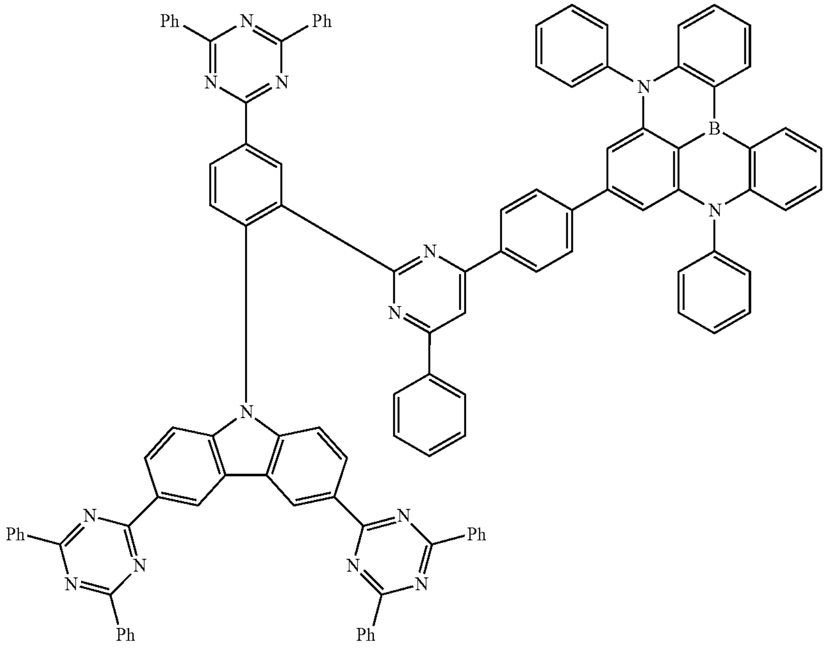

-continued
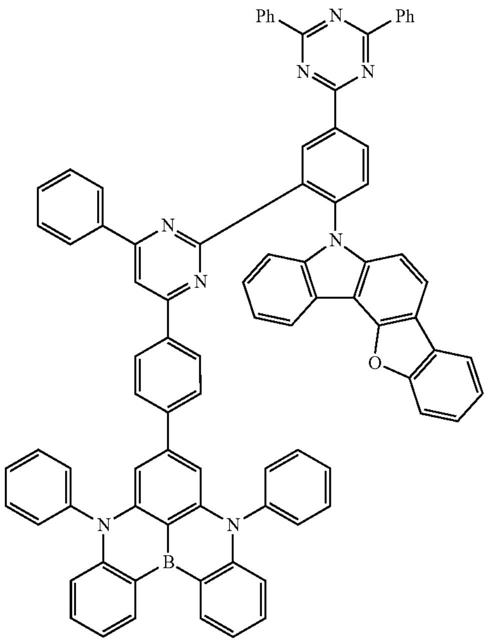
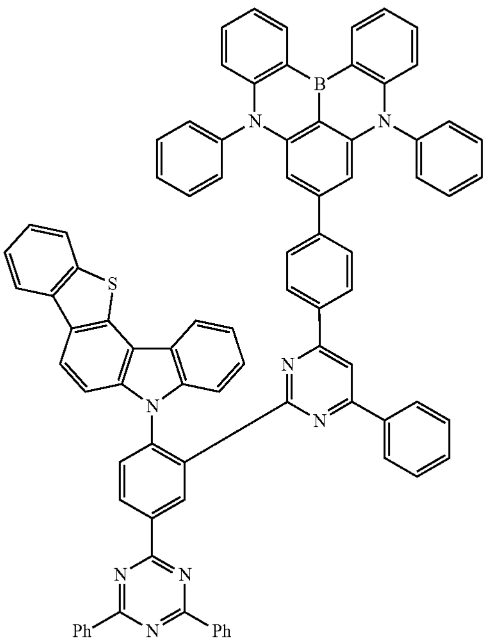
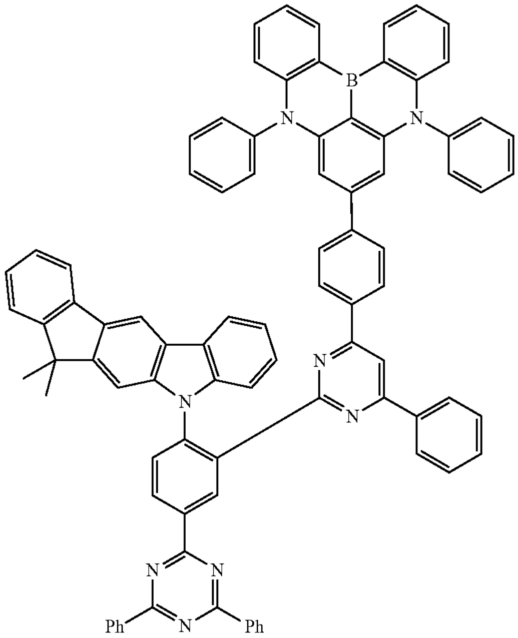
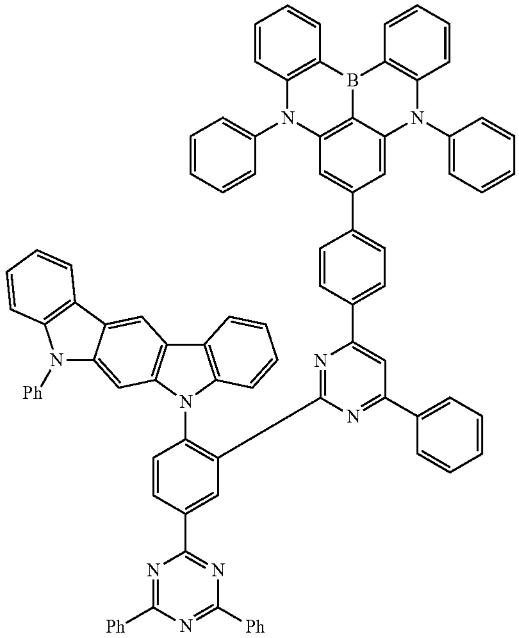

-continued
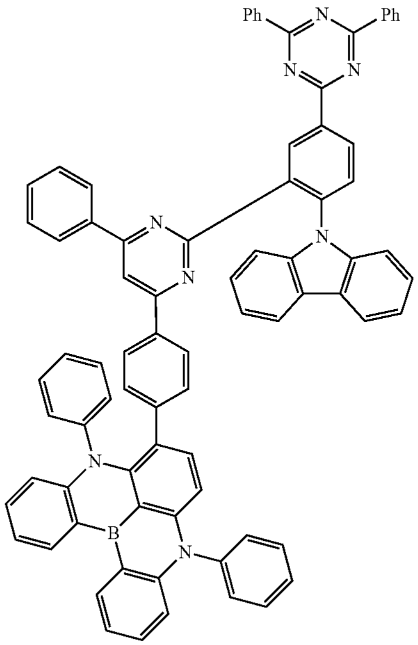
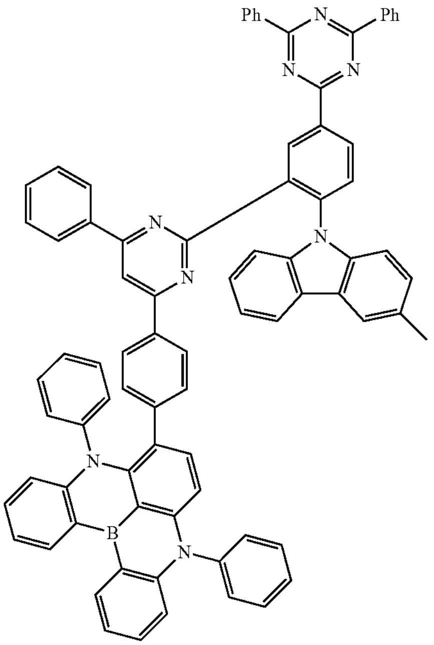
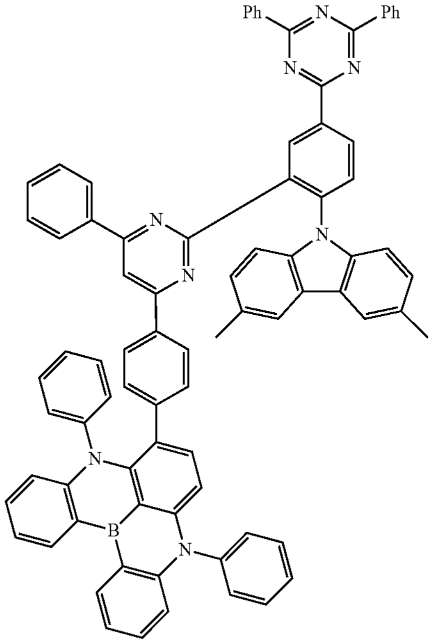

-continued
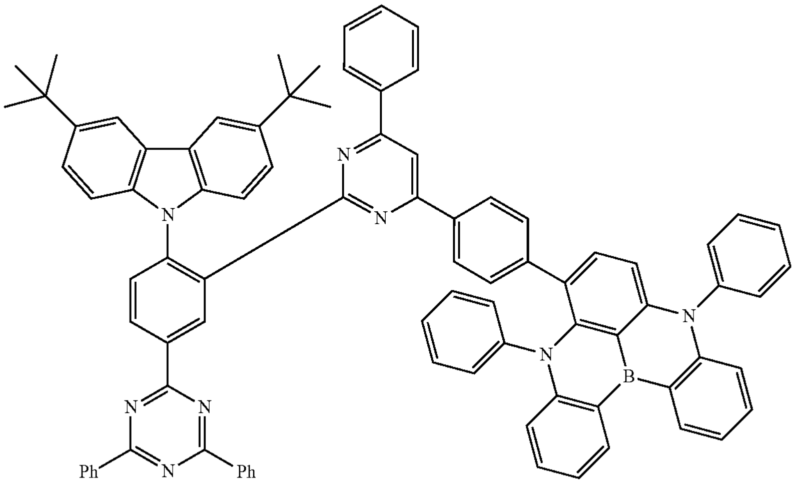
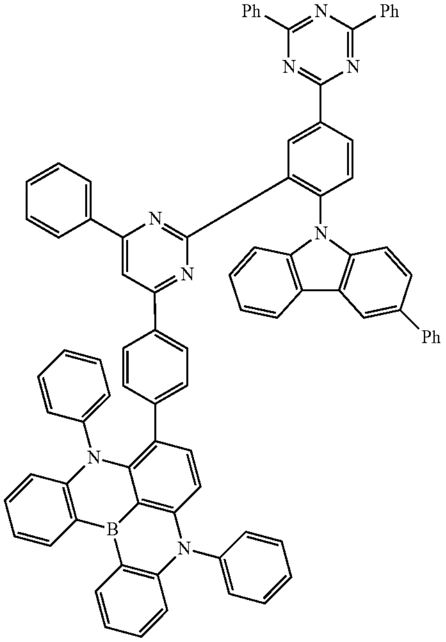
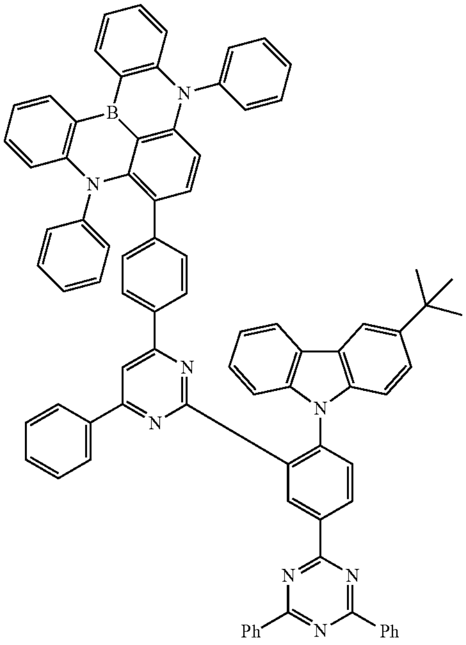
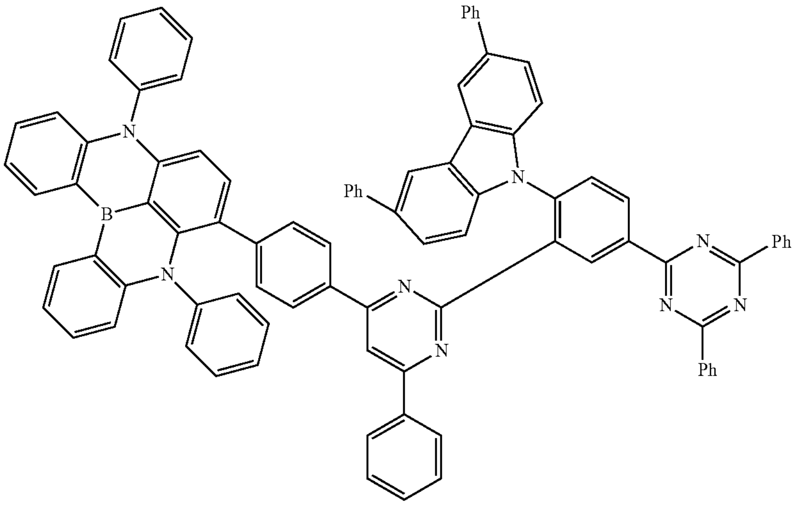

-continued
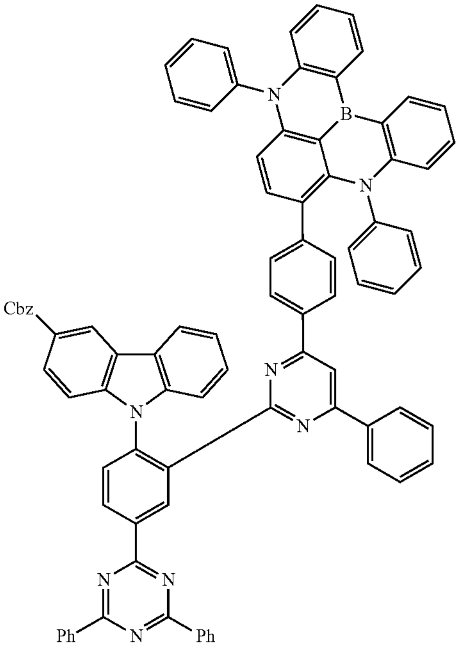
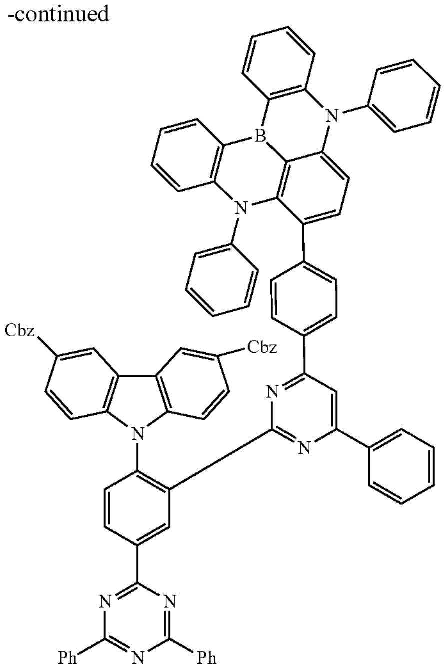
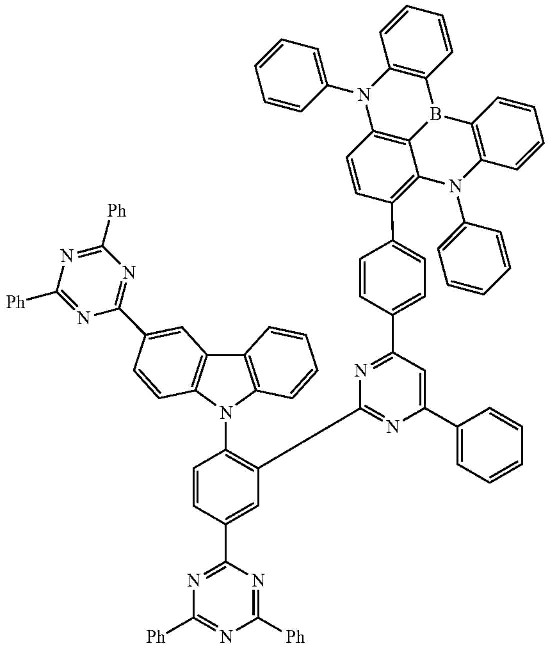

-continued
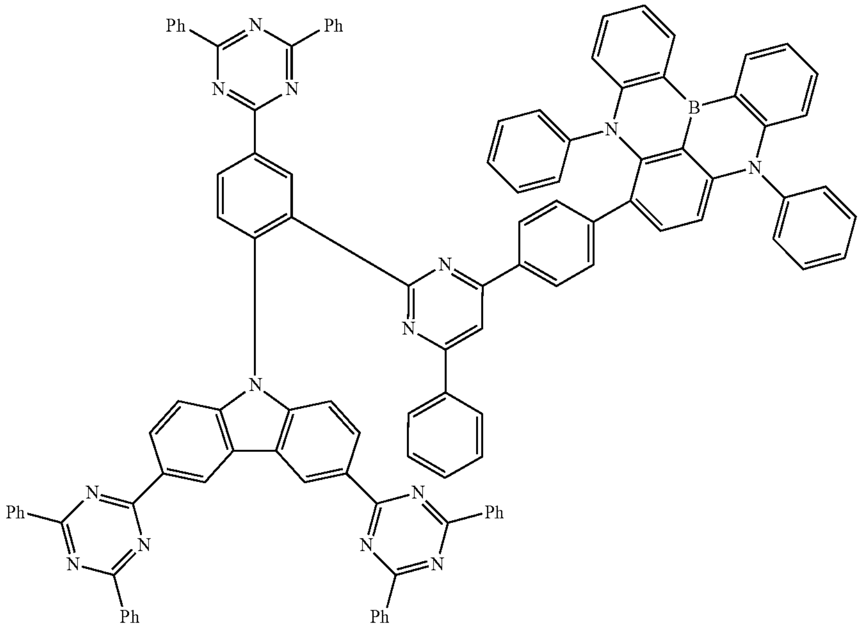
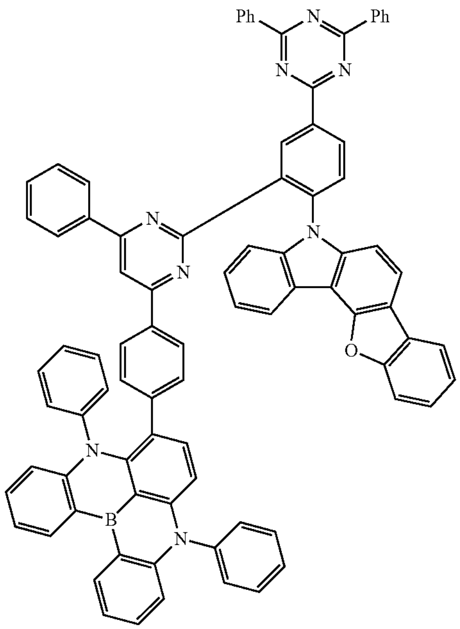
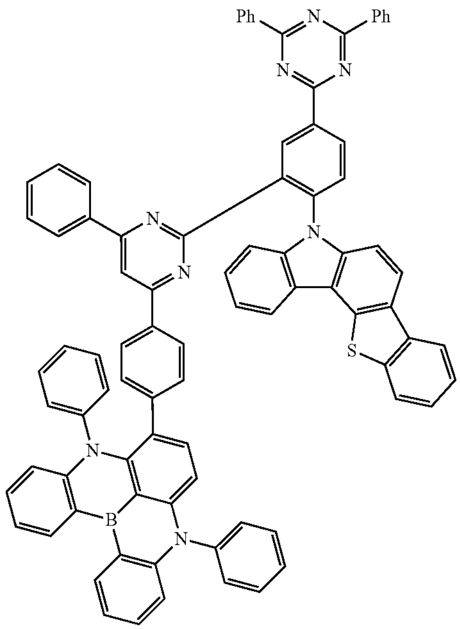

-continued
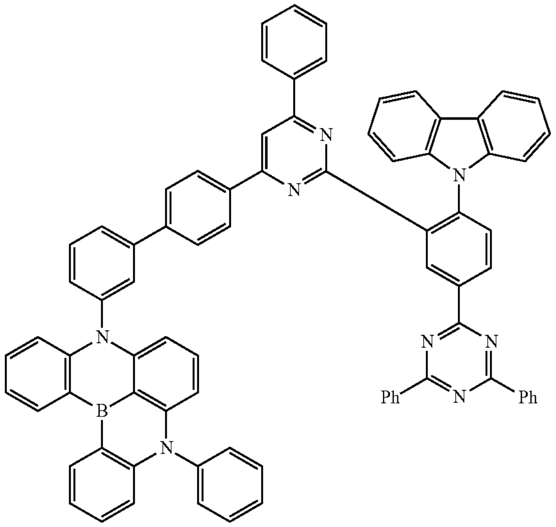
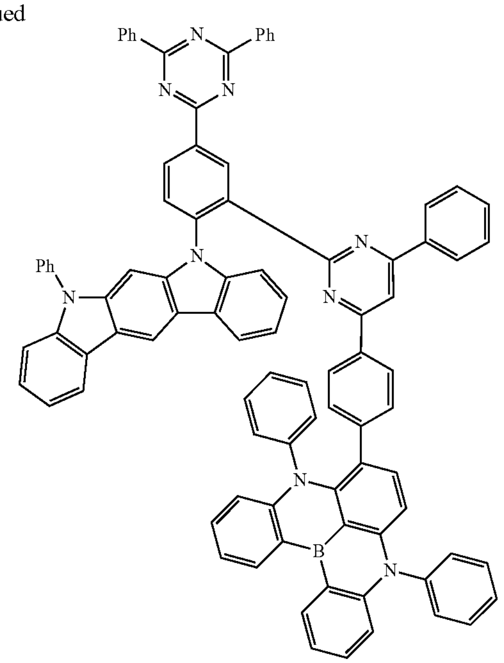
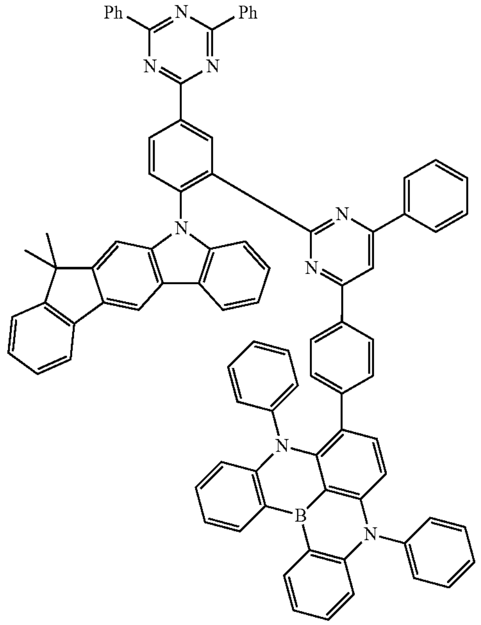
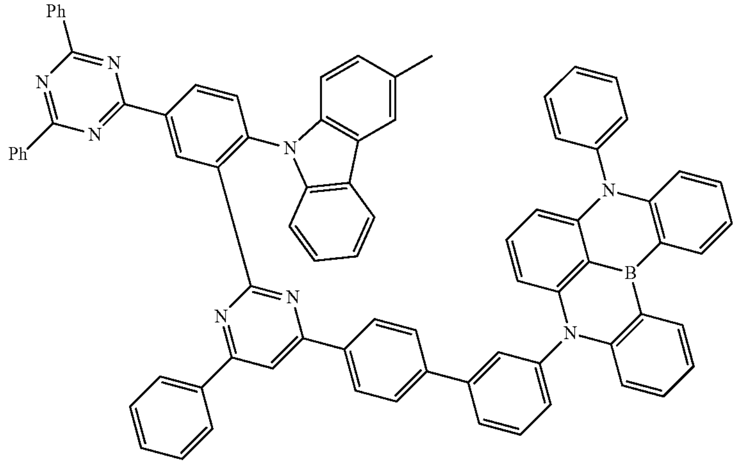

-continued
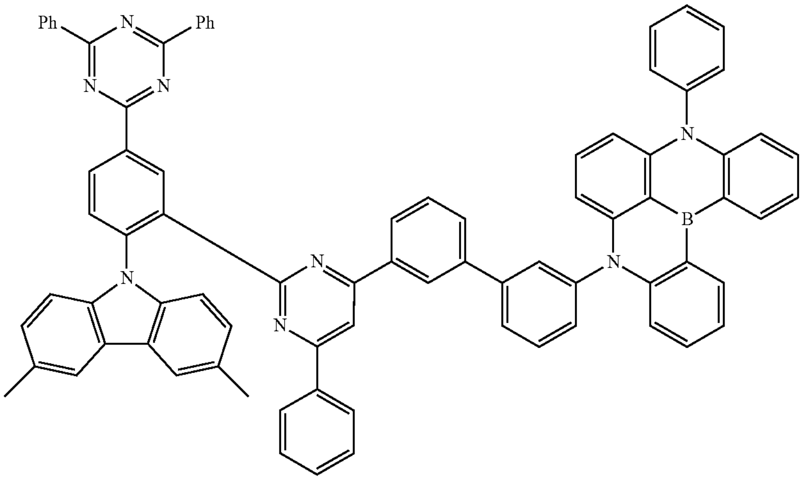
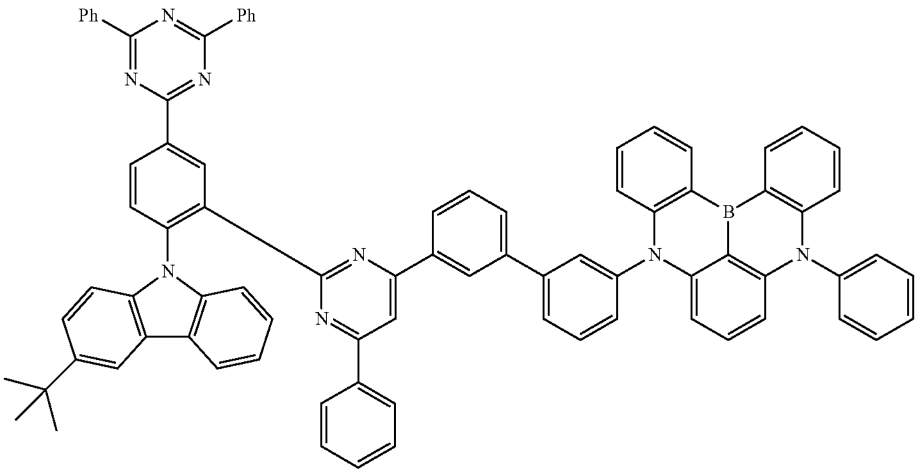
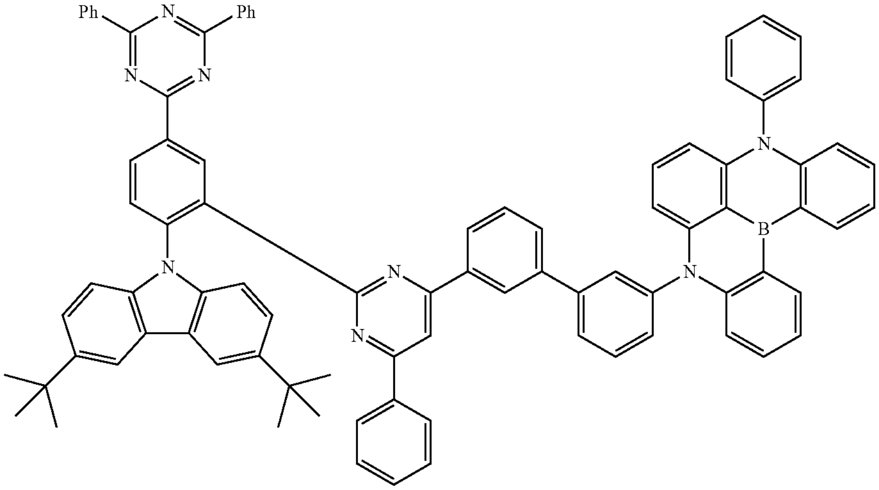

-continued
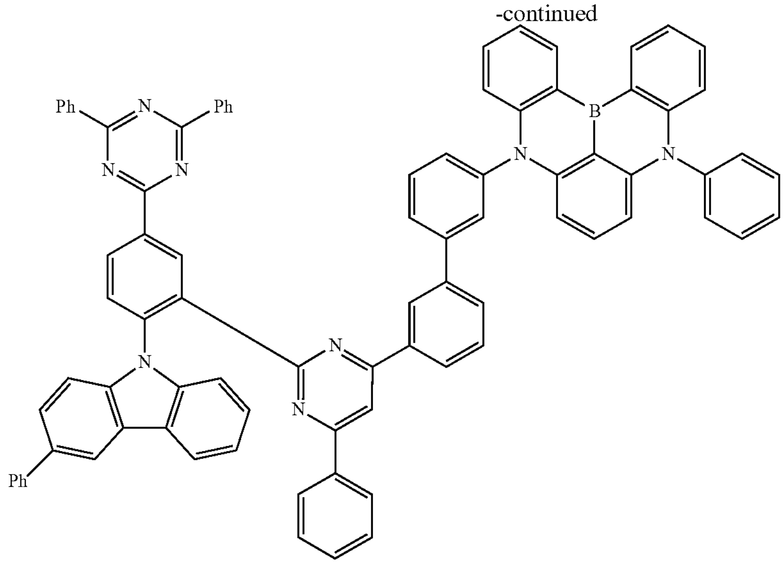
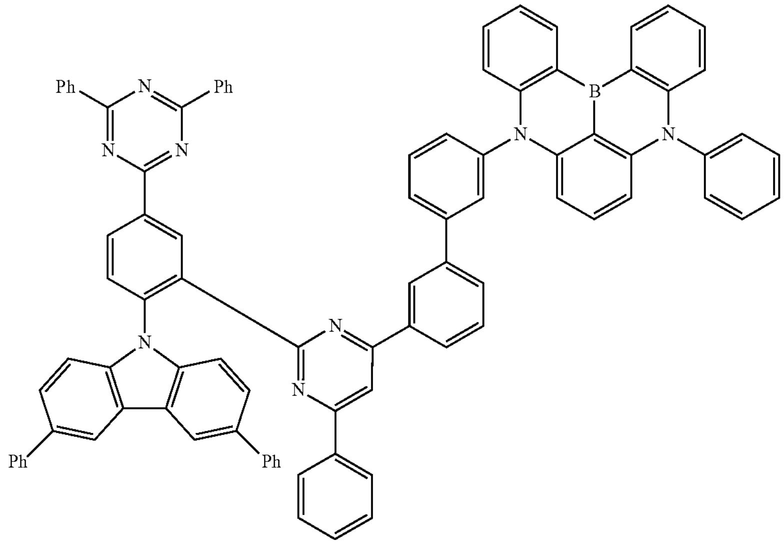
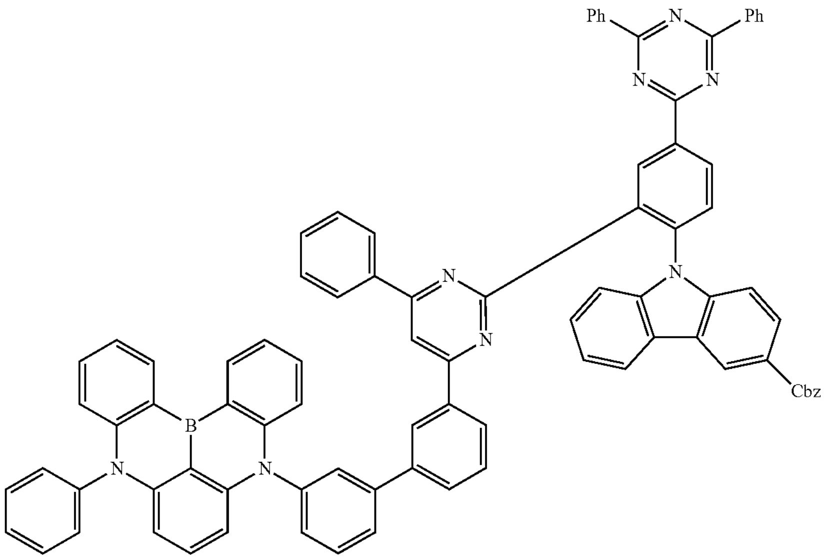

-continued
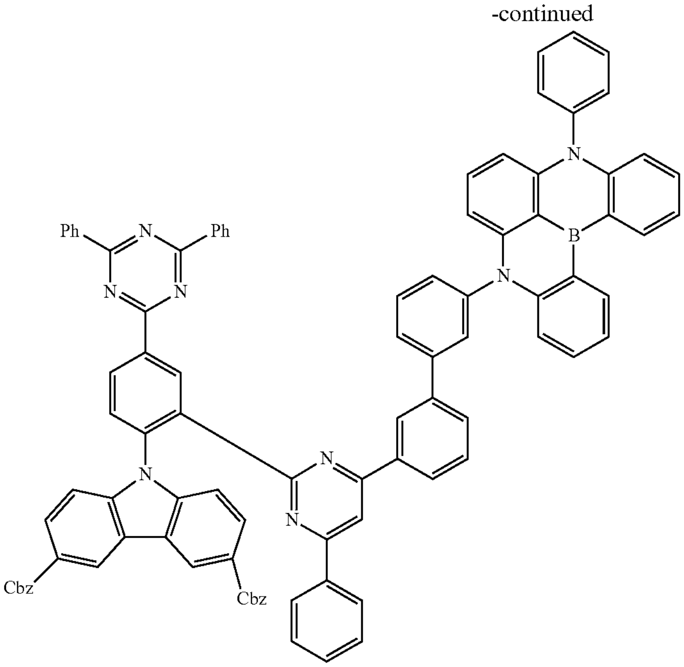
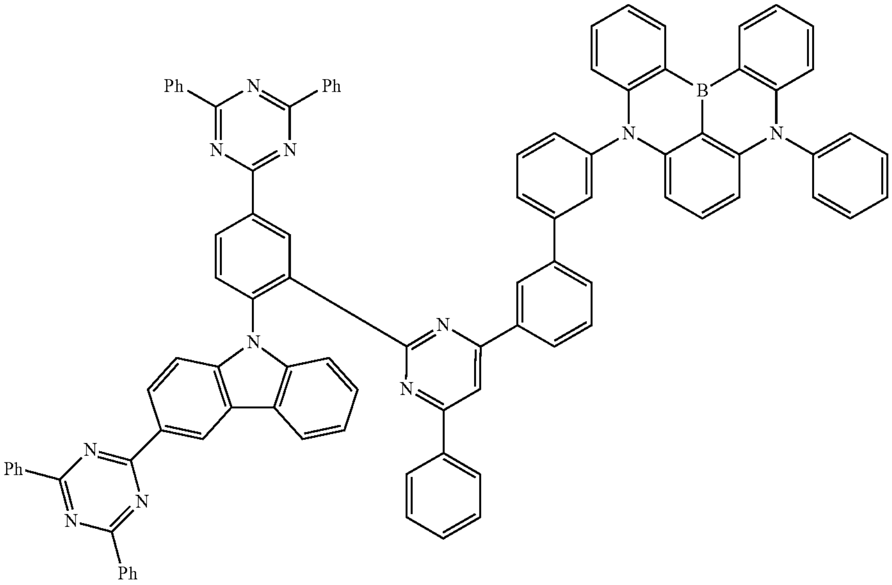
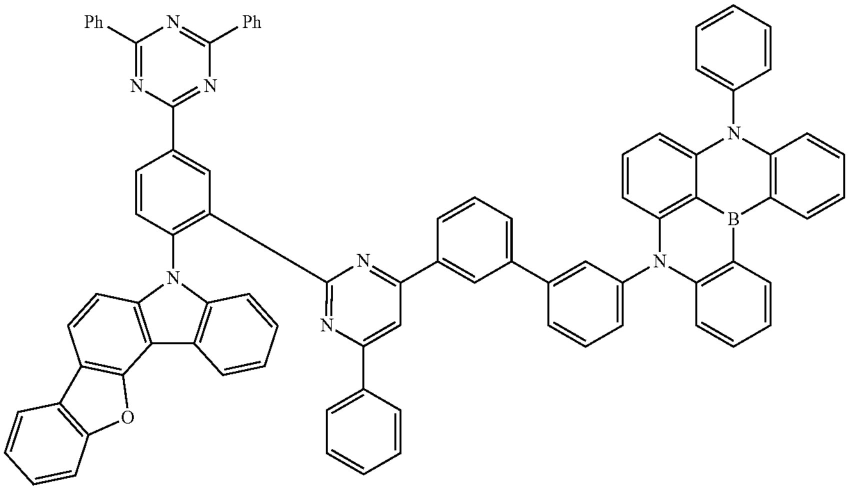

-continued
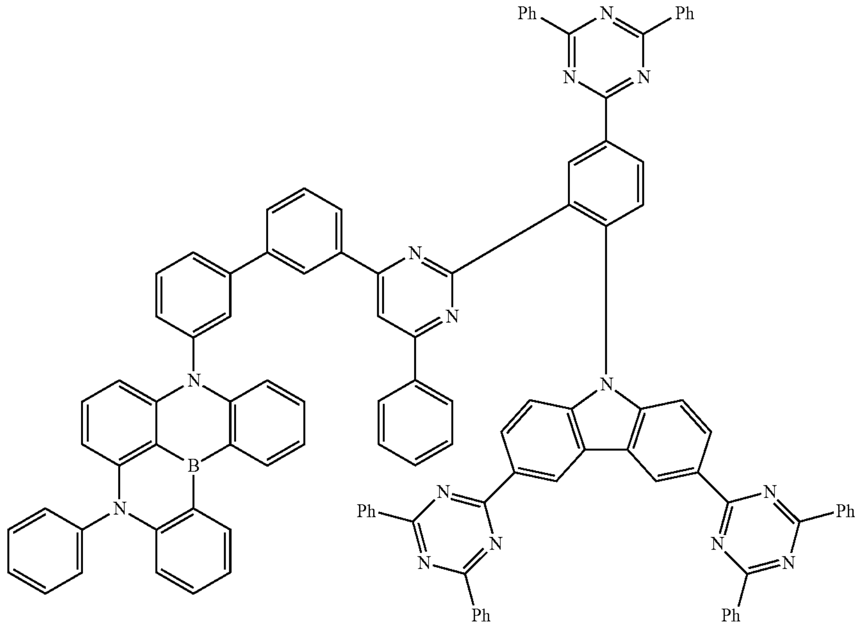
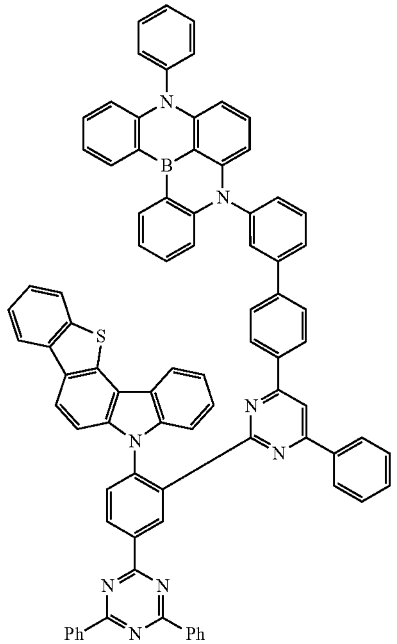
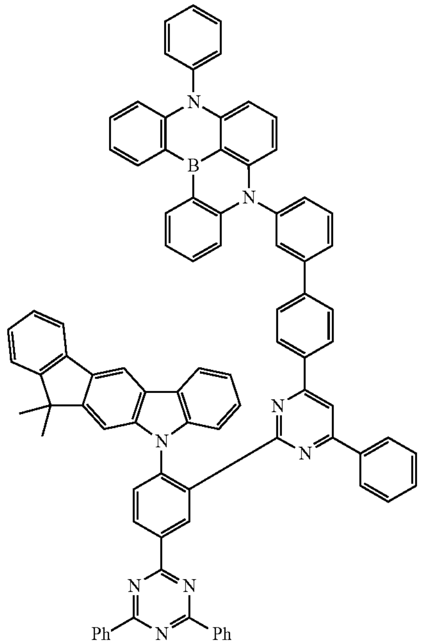

-continued
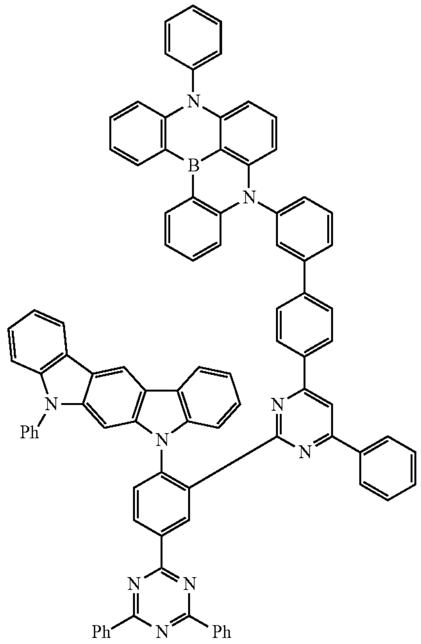
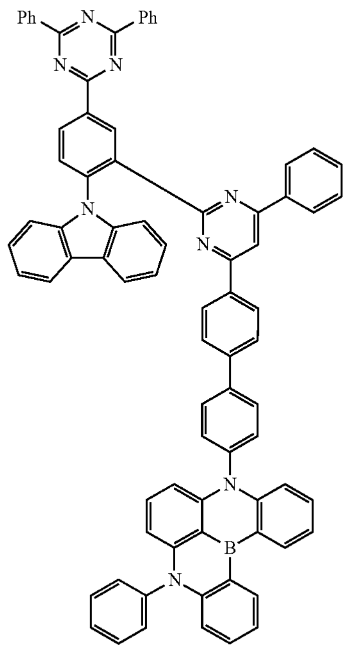
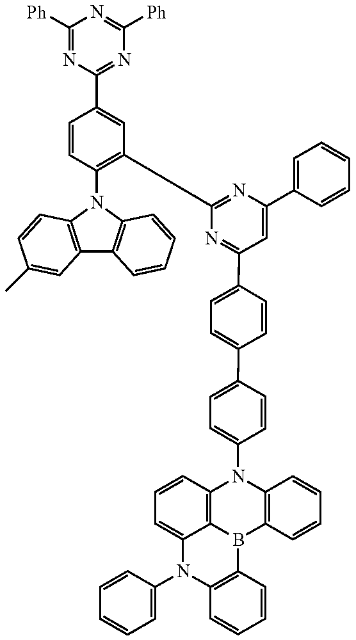
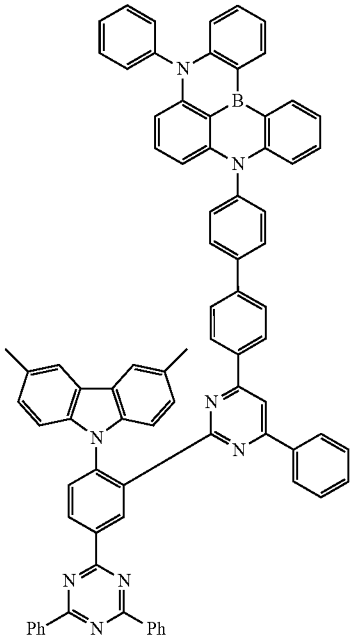

-continued
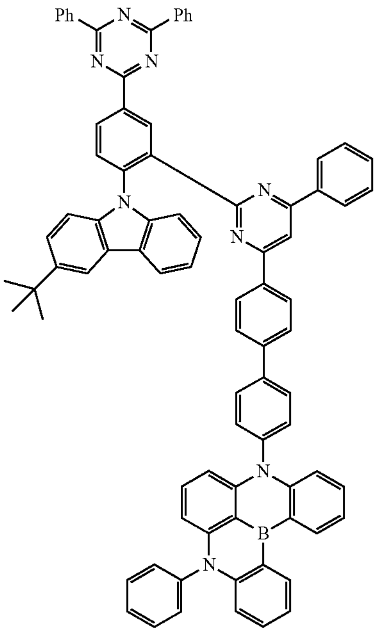
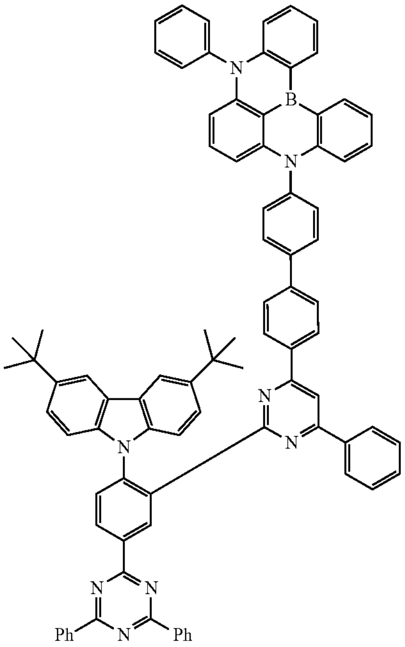
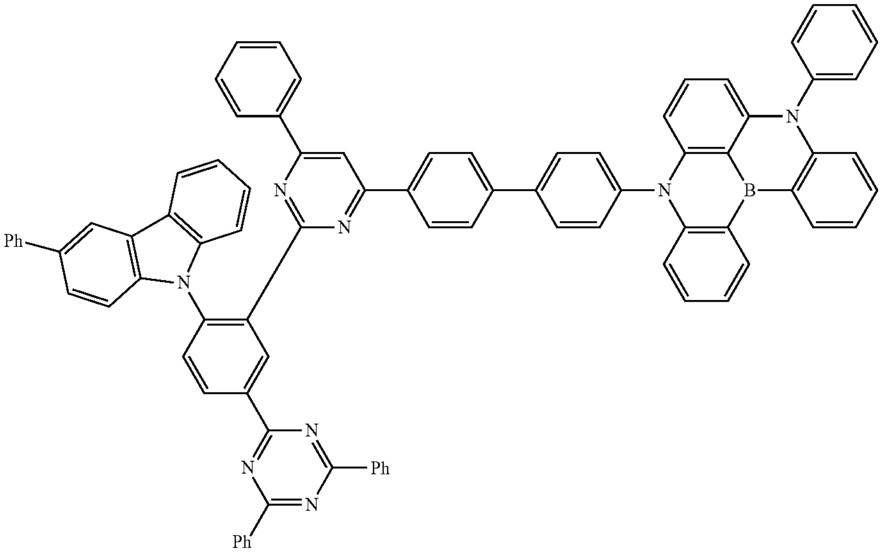
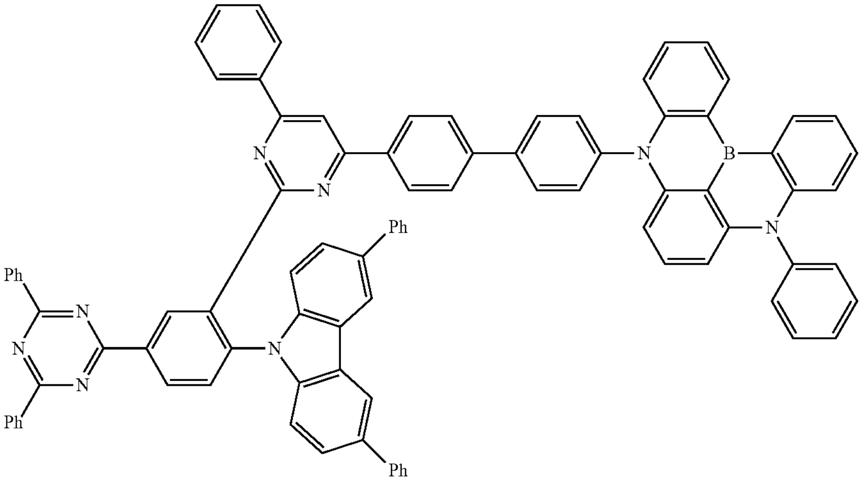

-continued
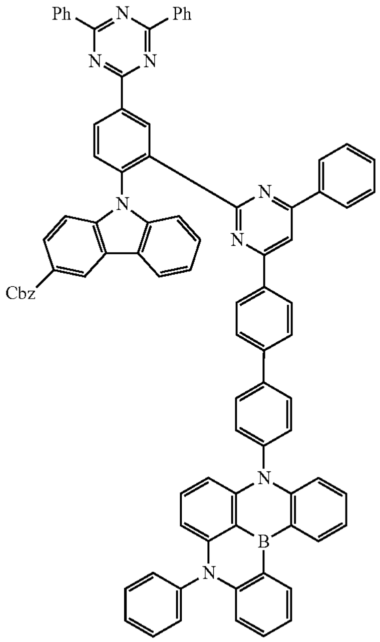
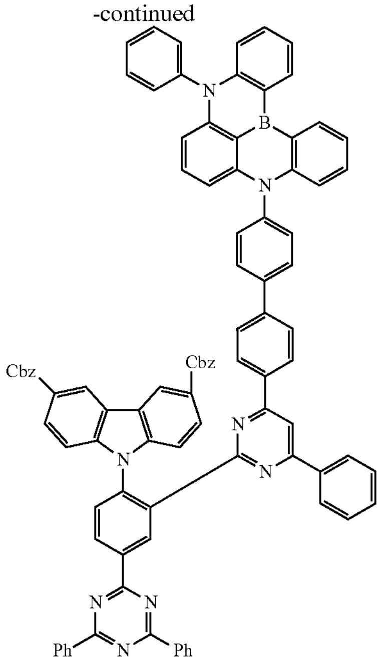
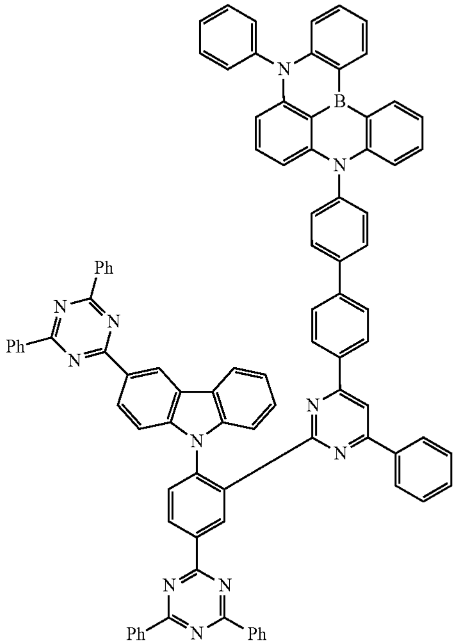

-continued
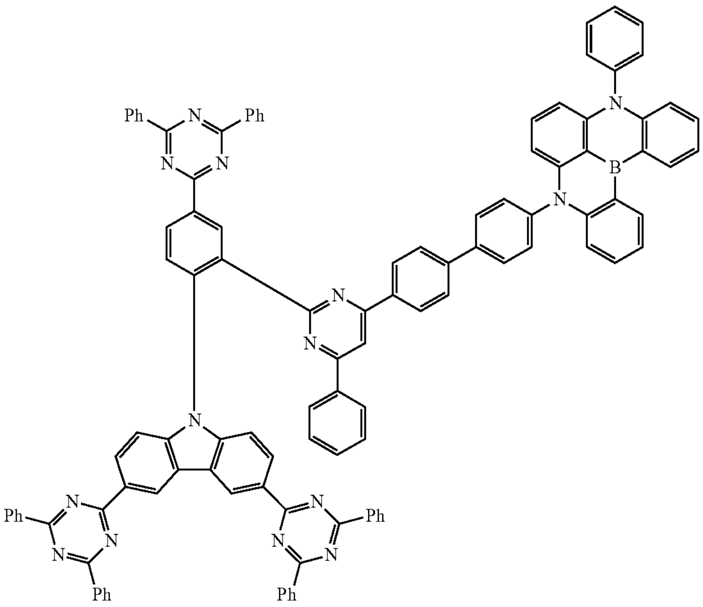
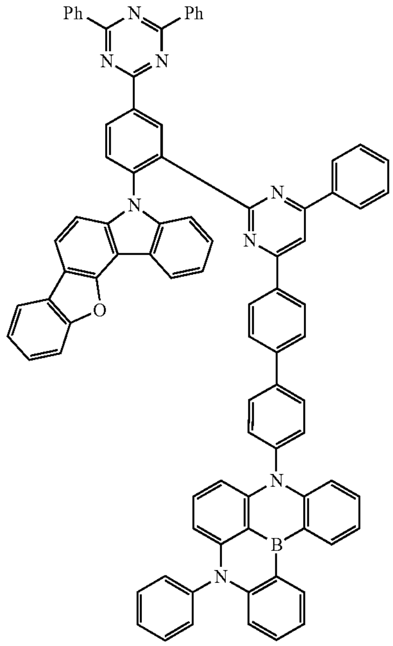
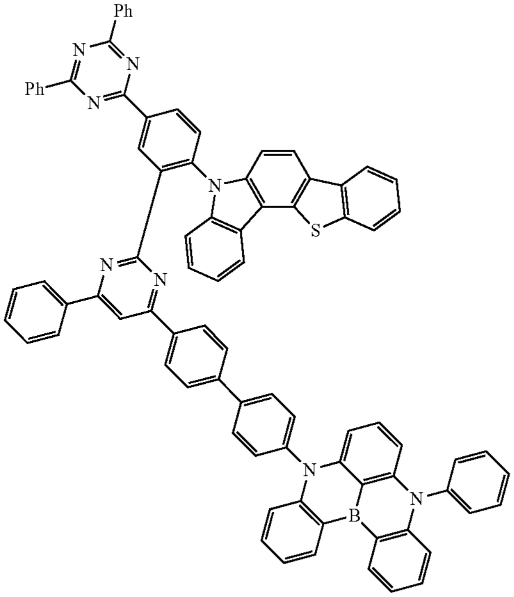
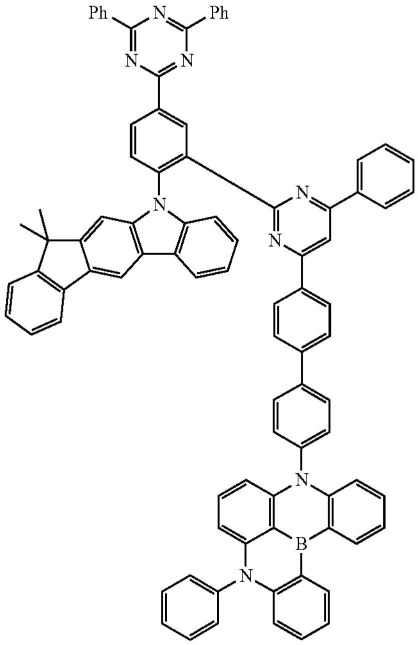

-continued
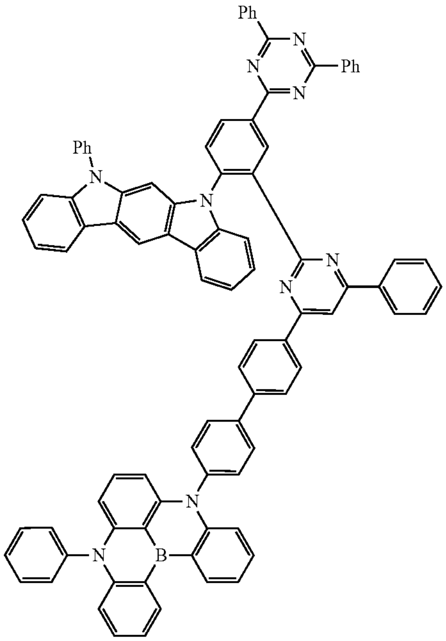
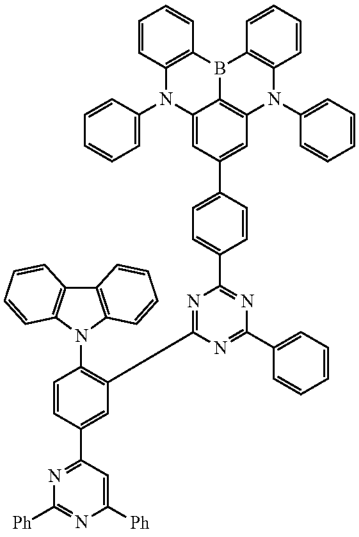
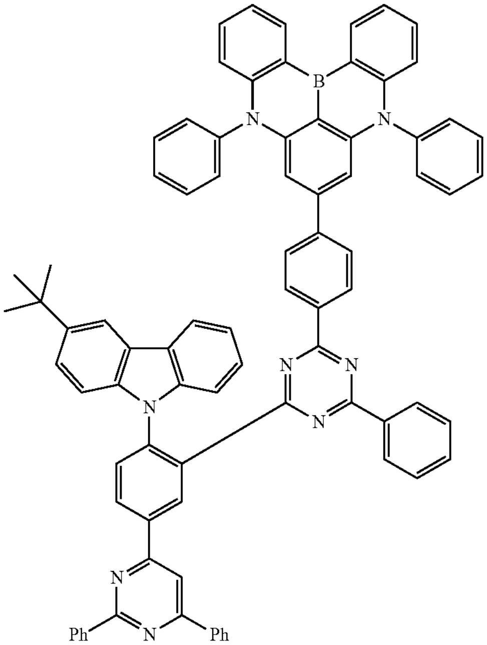

-continued
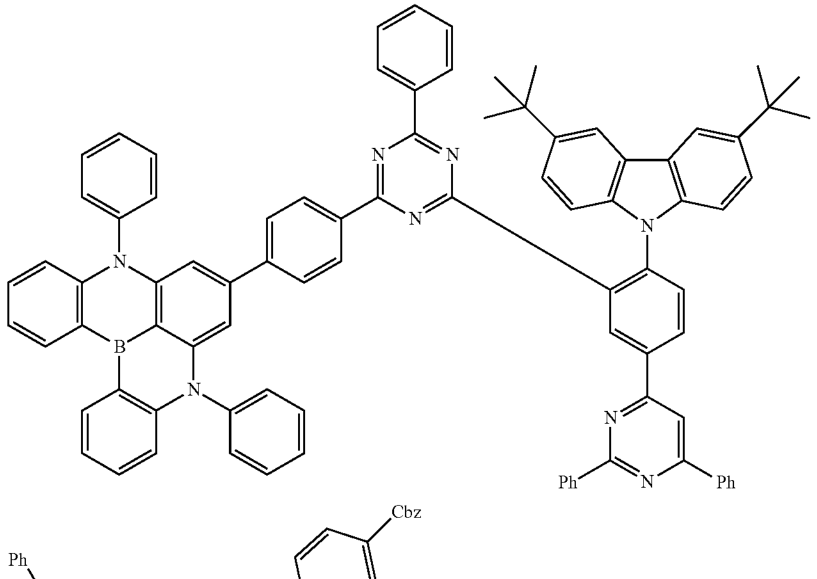
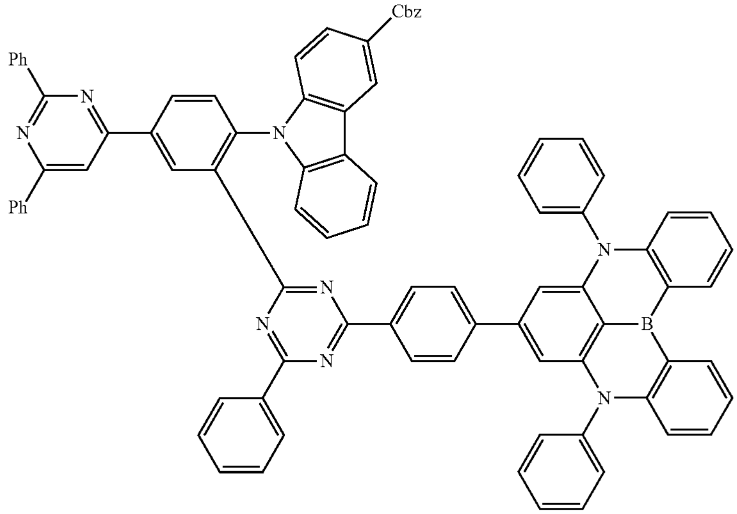
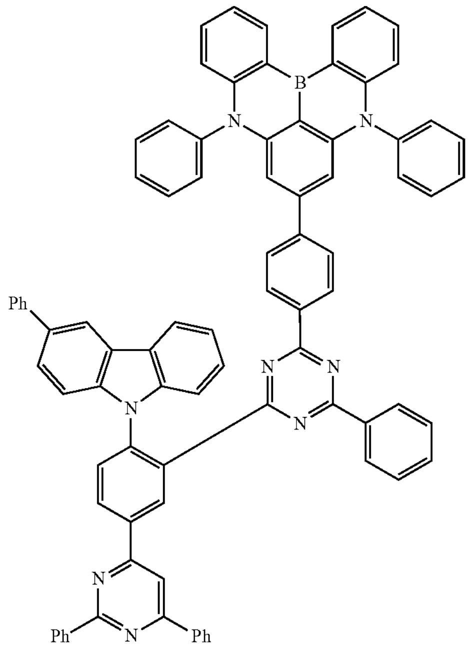
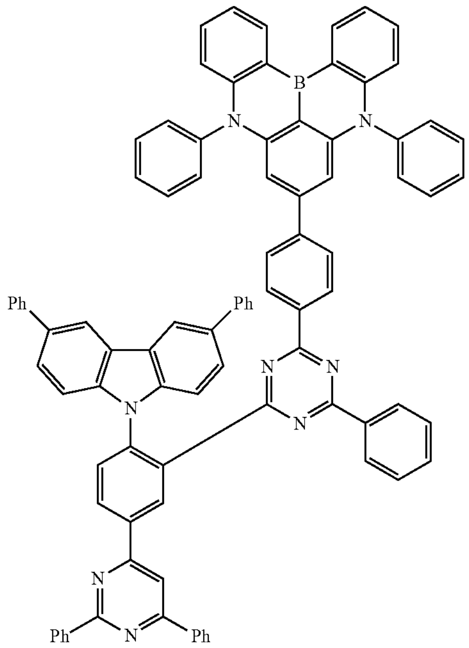

-continued
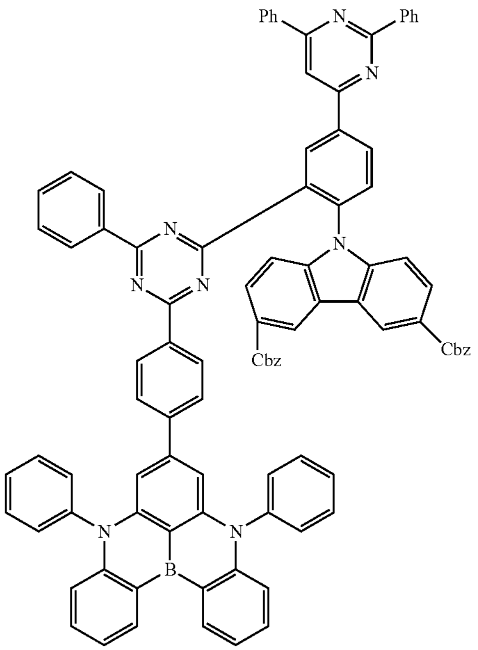
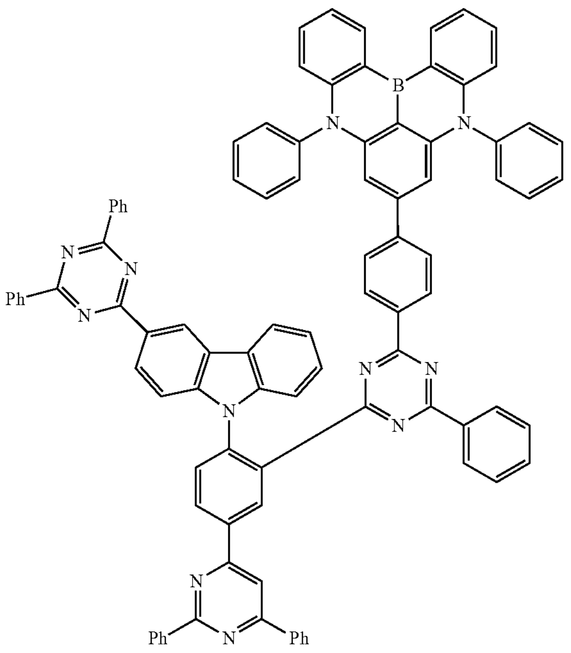
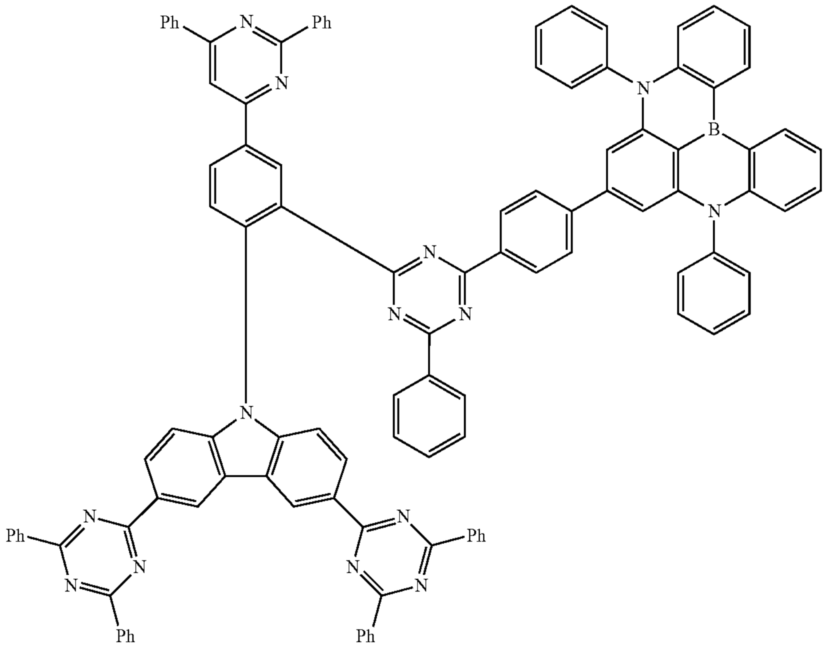

-continued
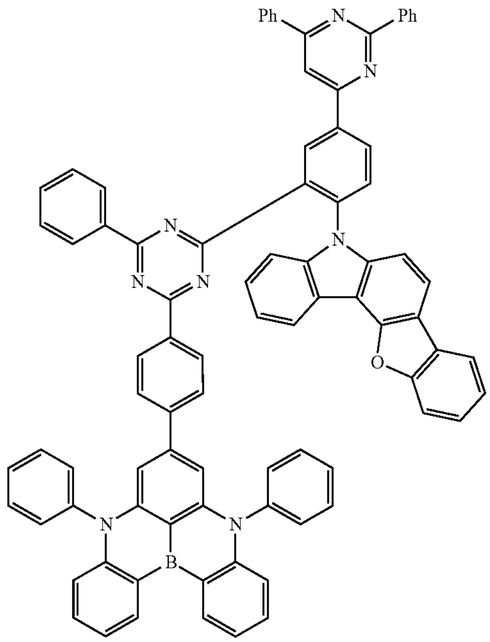
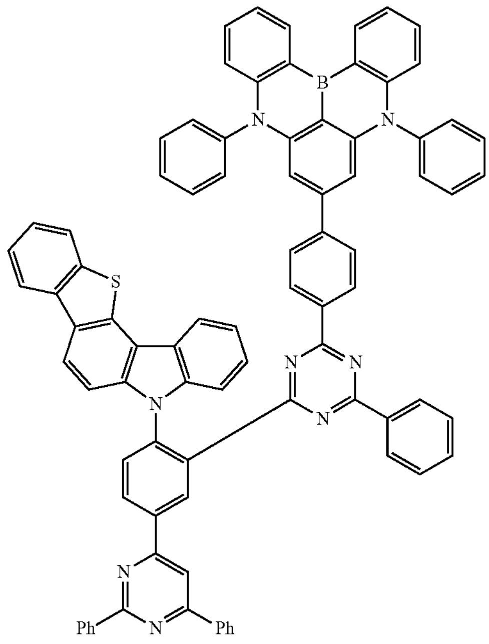
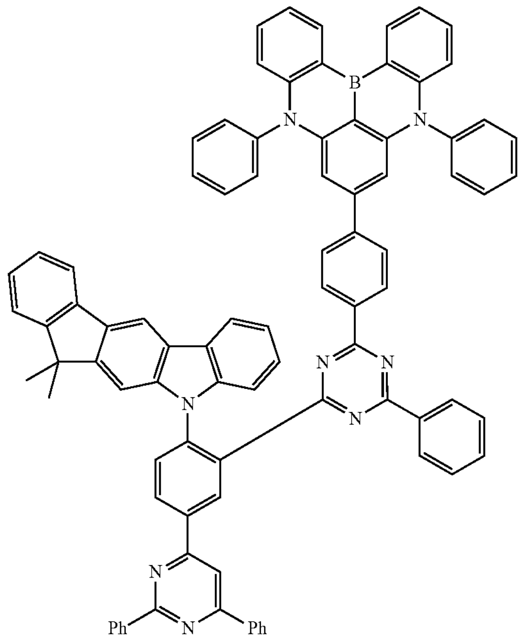

-continued
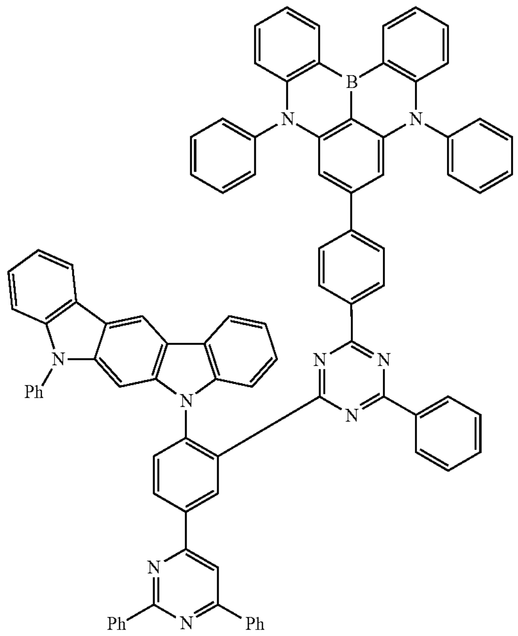
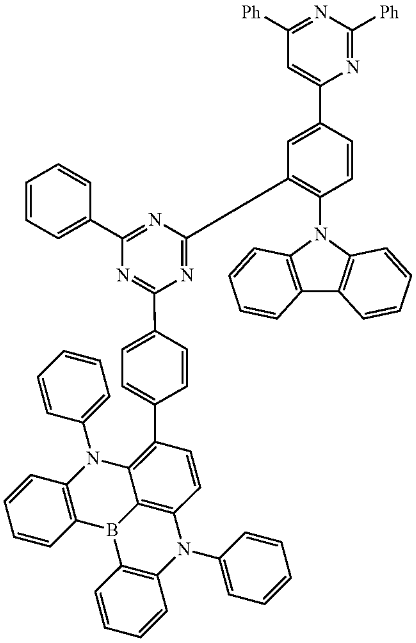
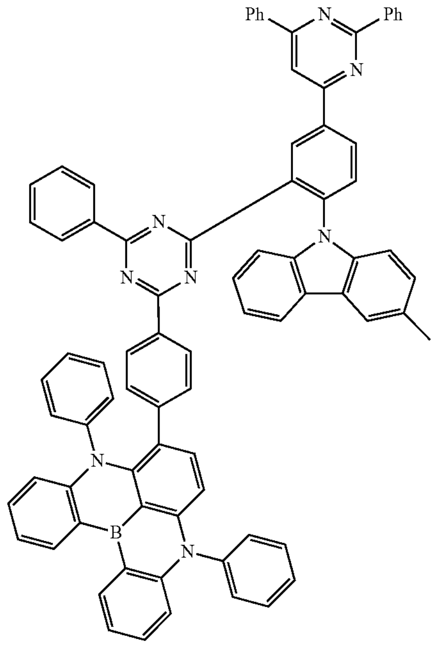
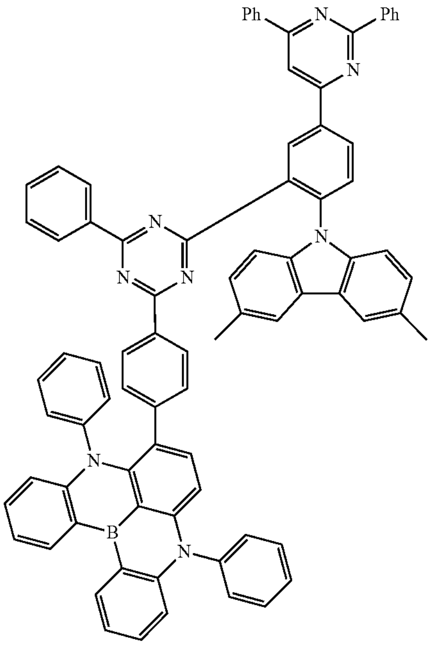

-continued
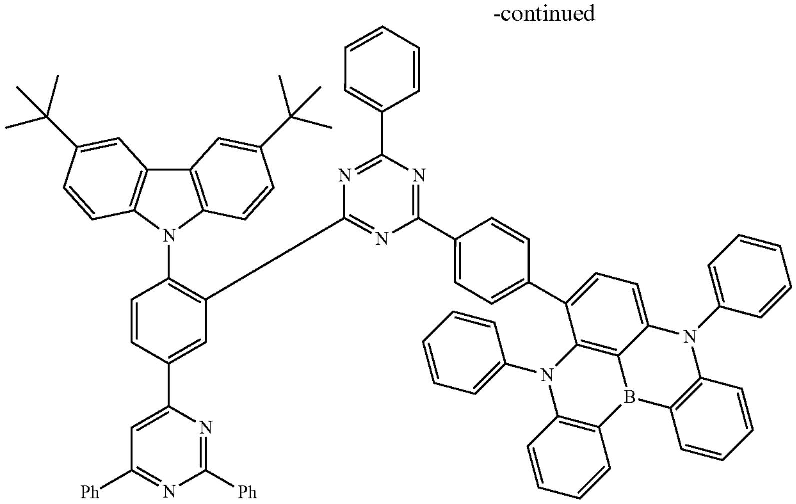
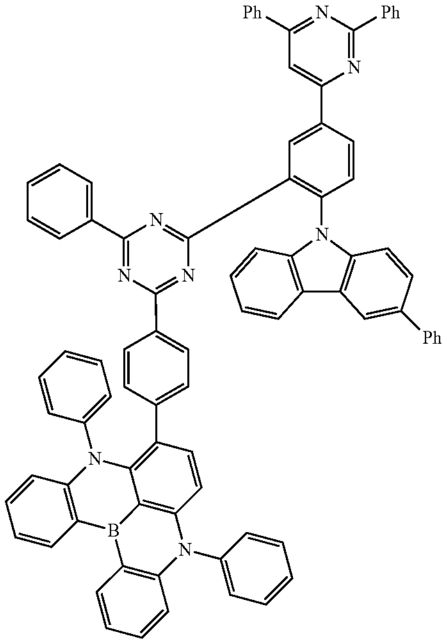
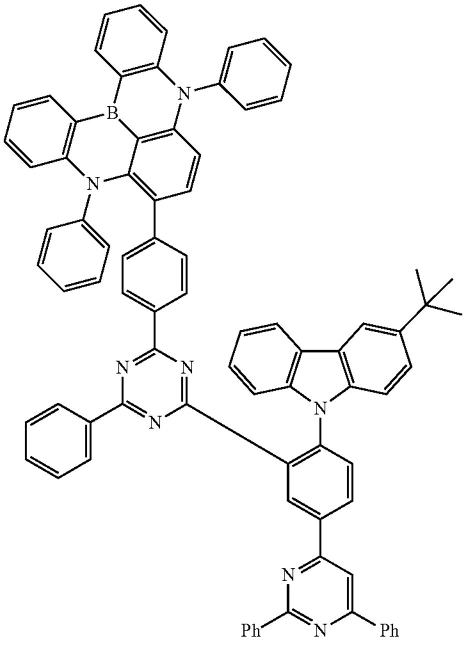
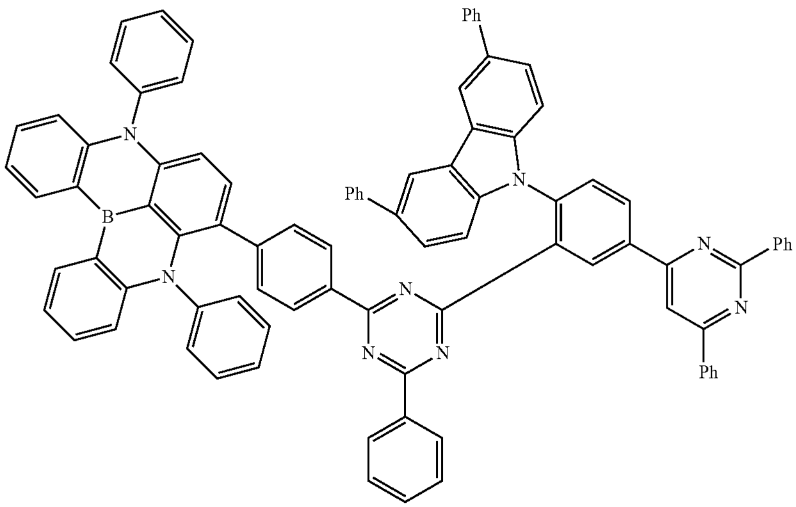

-continued
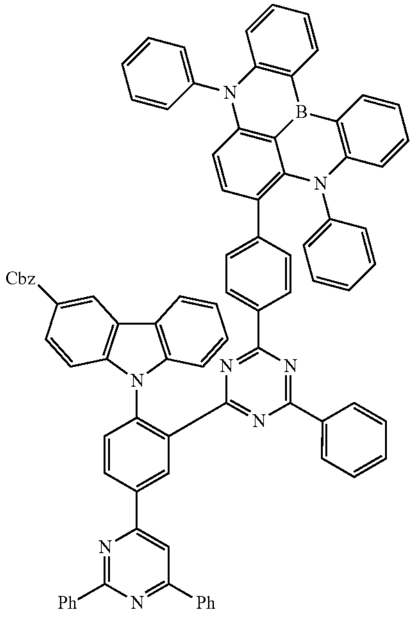
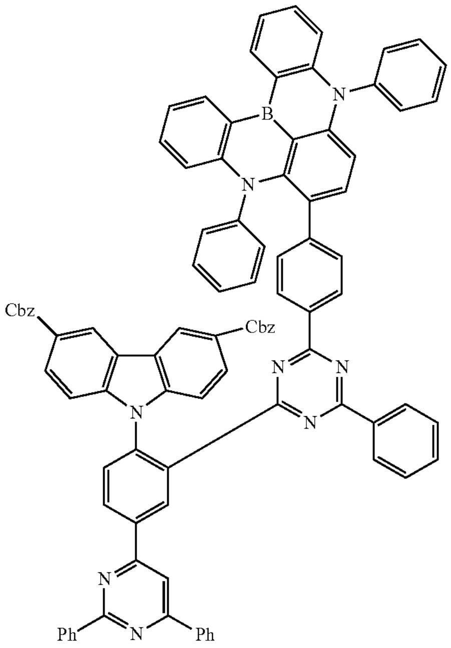
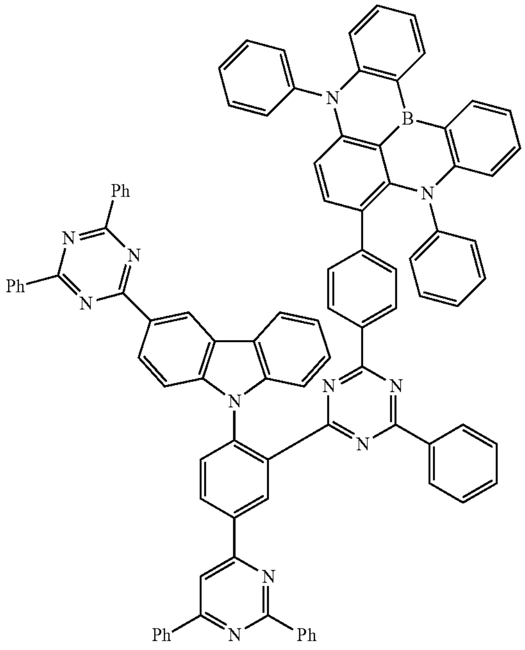

-continued
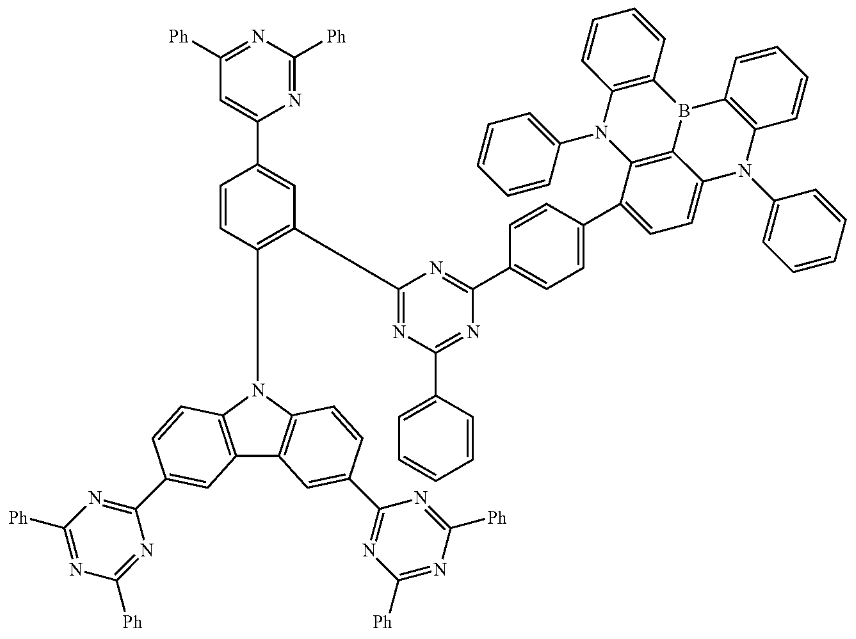 [SMILES: c1ccc(-c2cc(-c3ccc(-n4c5ccc(-c6nc(-c7ccccc7)nc(-c7ccccc7)n6)cc5c5cc(-c6nc(-c7ccccc7)nc(-c7ccccc7)n6)ccc54)c(-c4nc(-c5ccccc5)nc(-c5ccc(-c6ccc7c8c6N(c6ccccc6)c6ccccc6B8c6ccccc6N7c6ccccc6)cc5)n4)c3)nc(-c3ccccc3)n2)cc1]
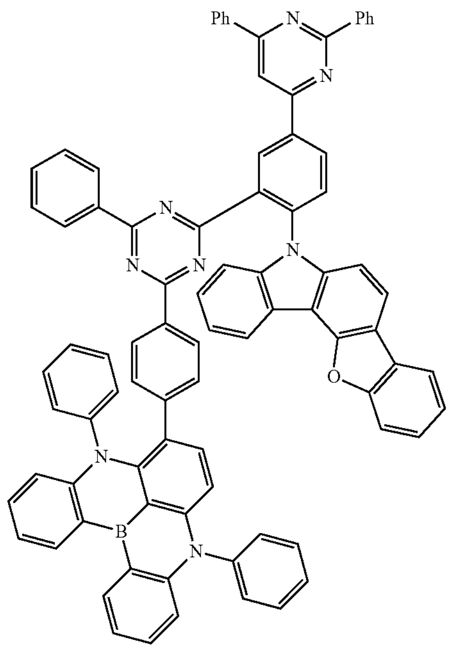
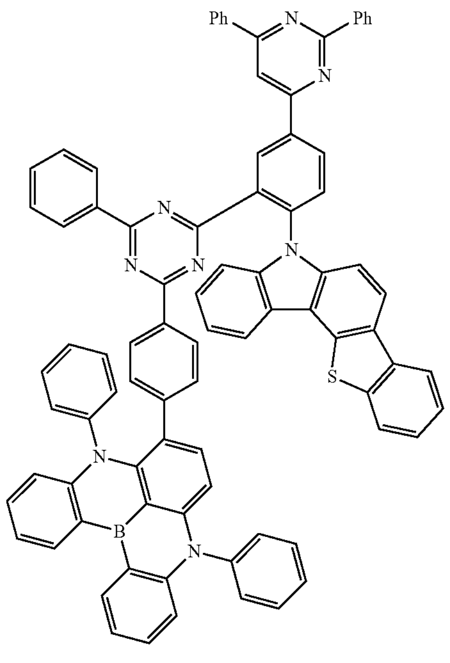

-continued
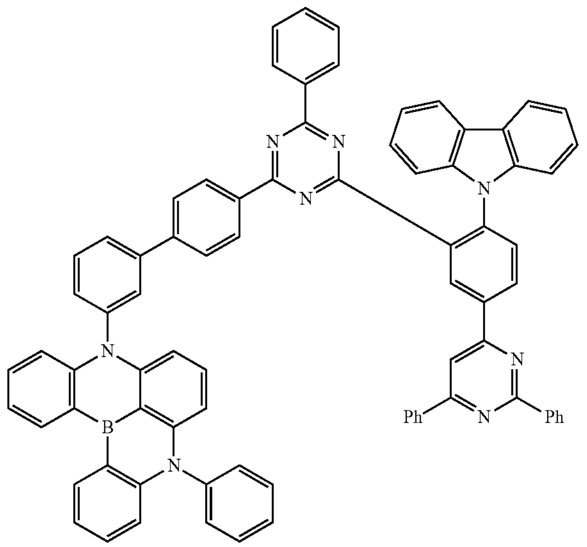
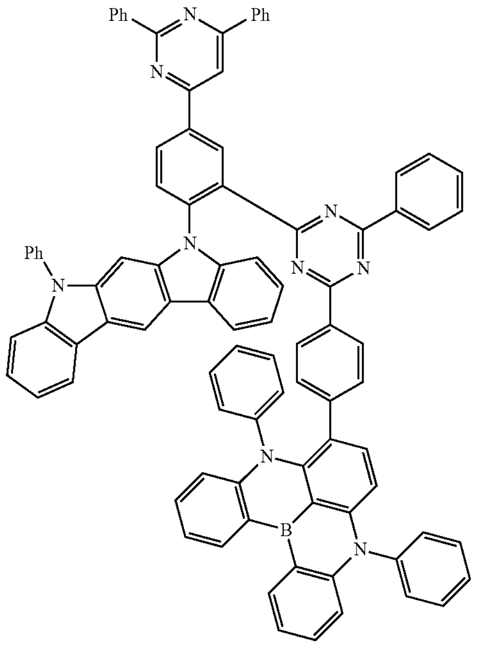
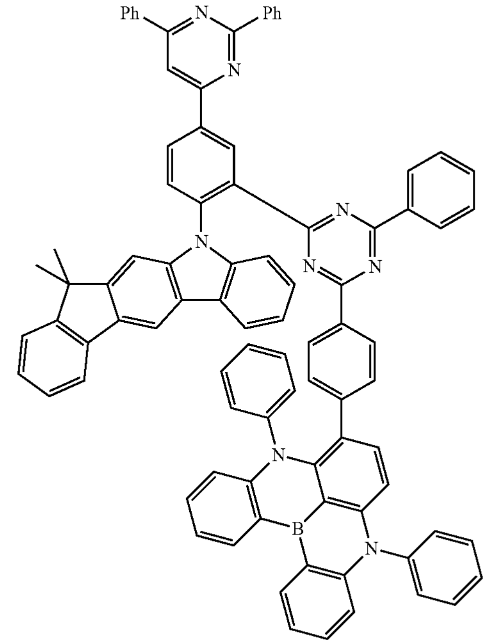
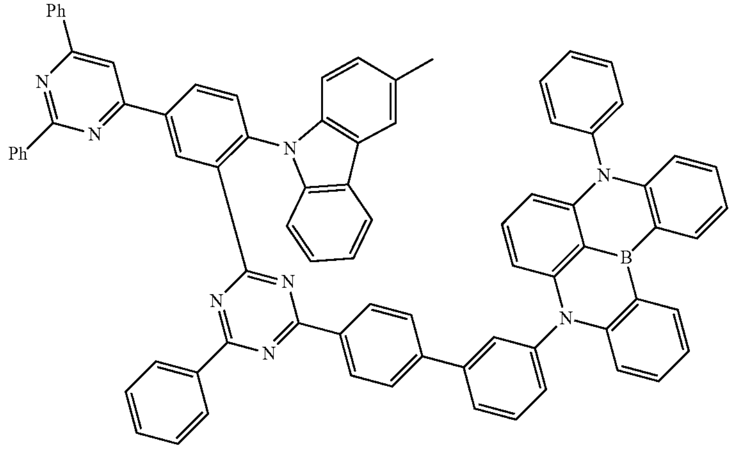

-continued
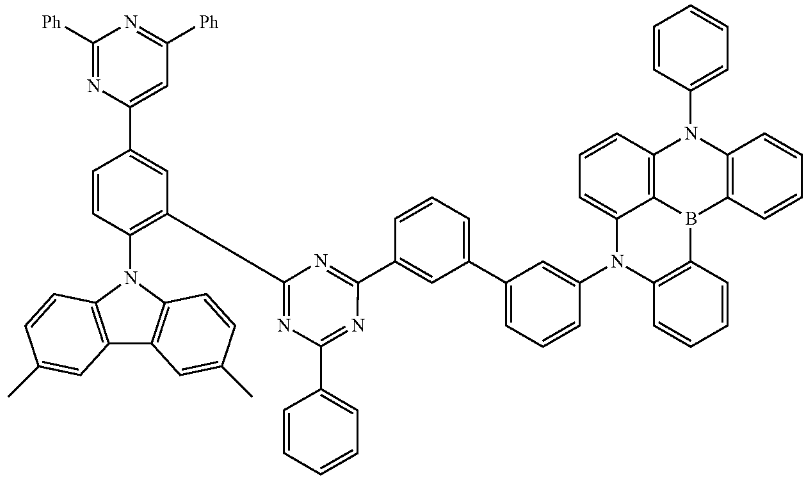
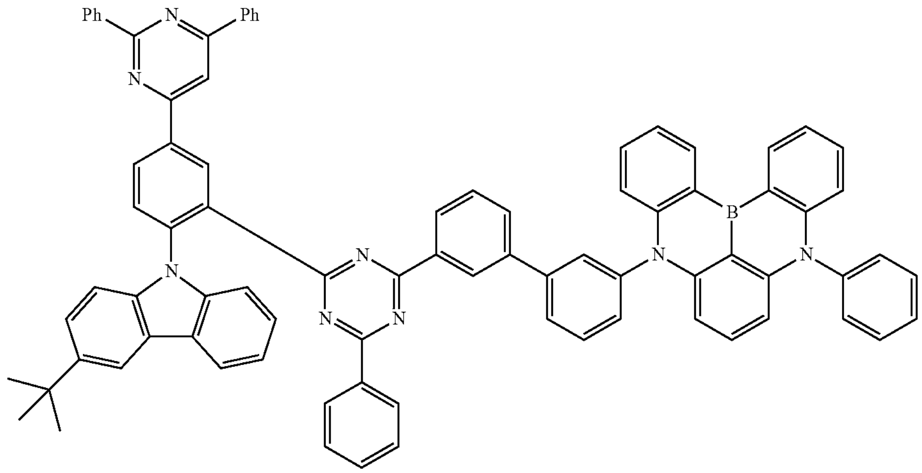
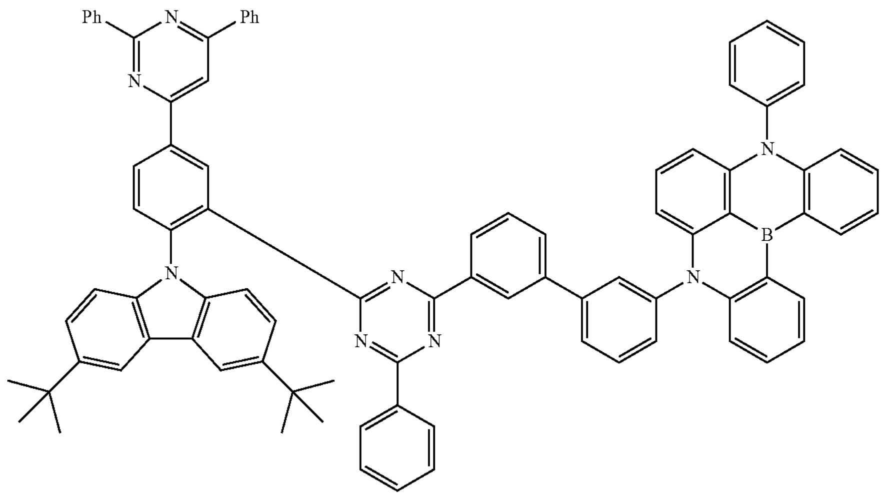

-continued
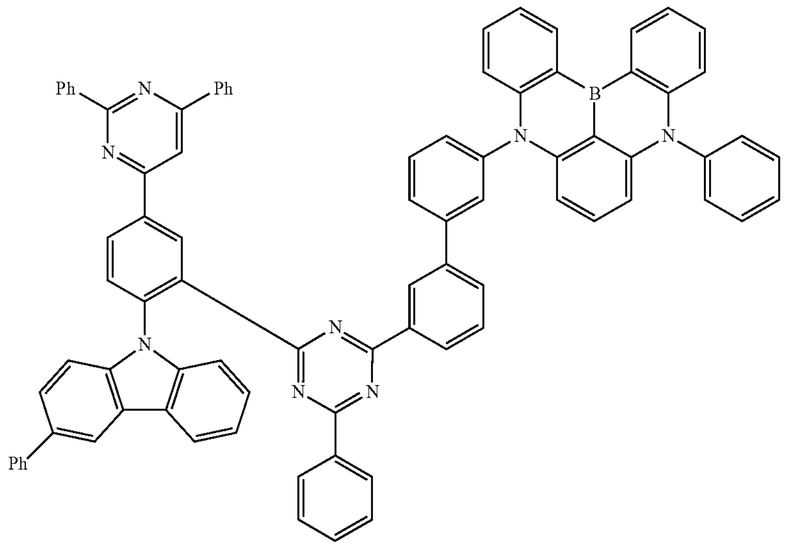
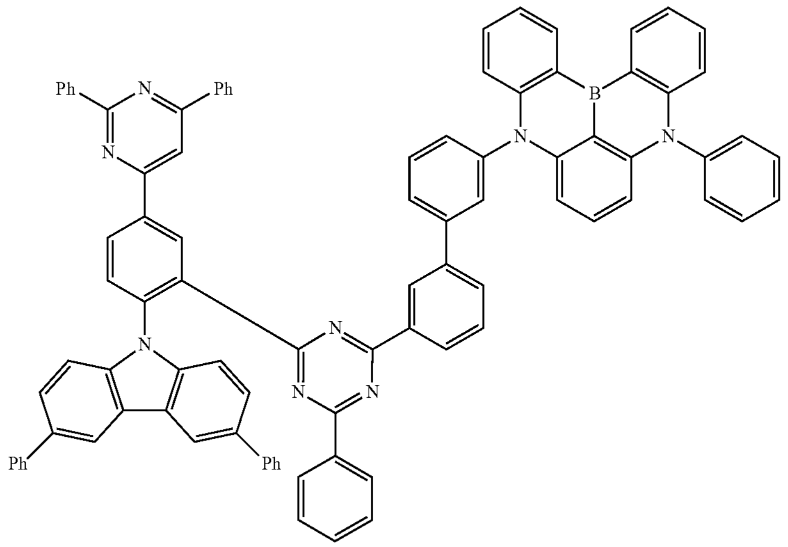
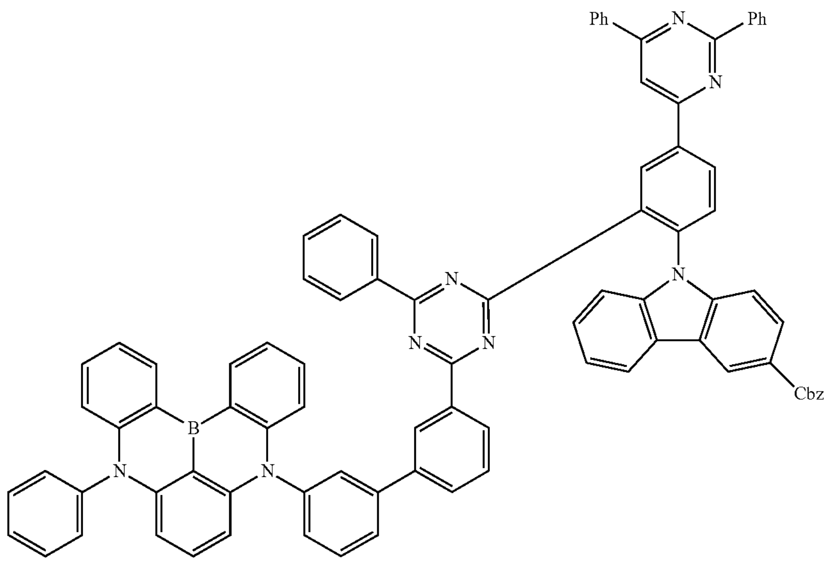

-continued
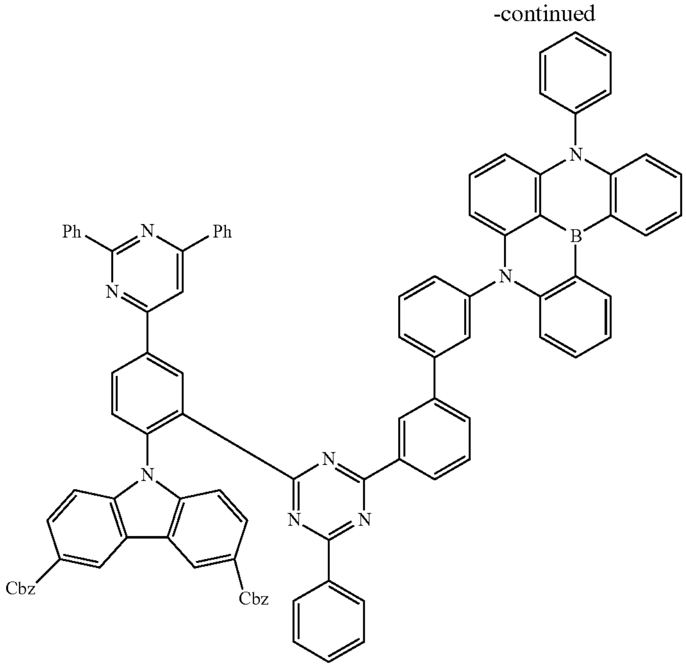
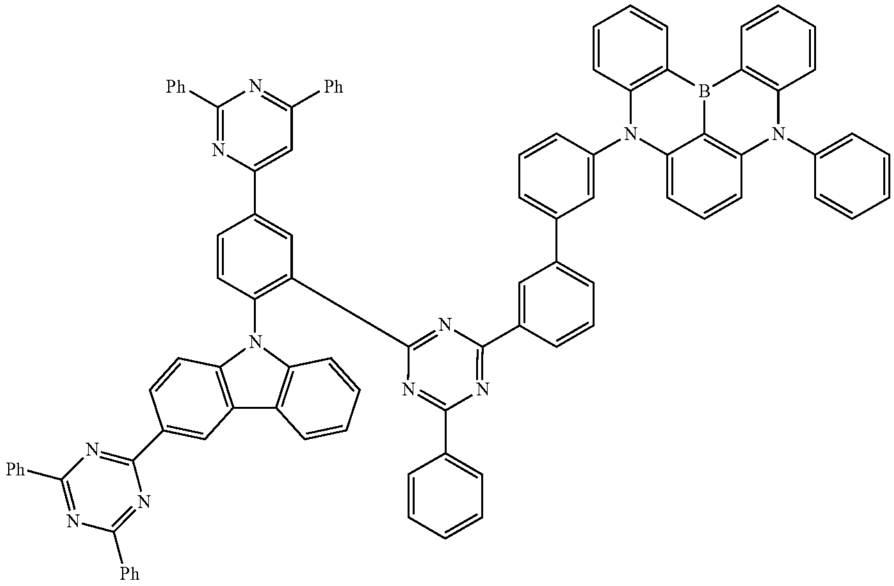
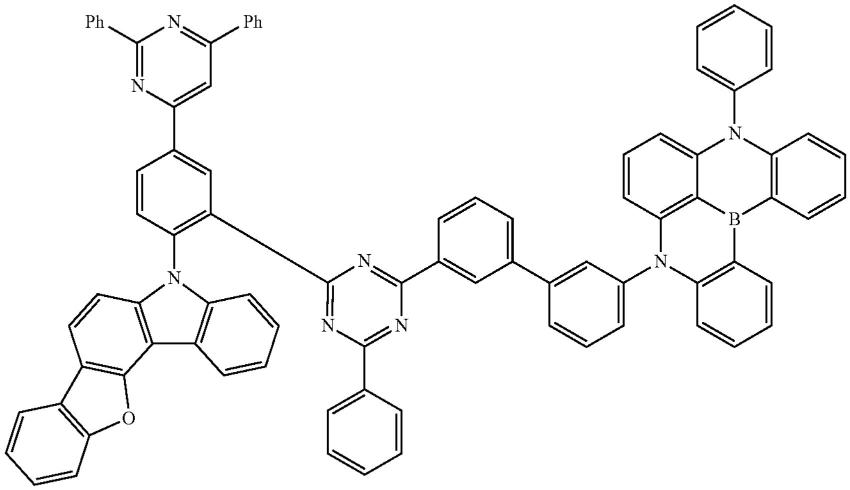

-continued
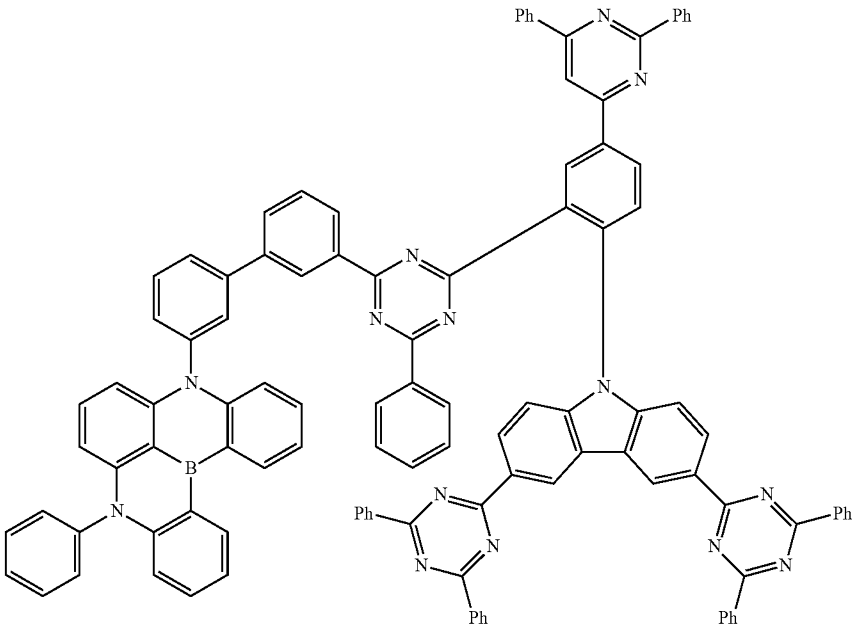
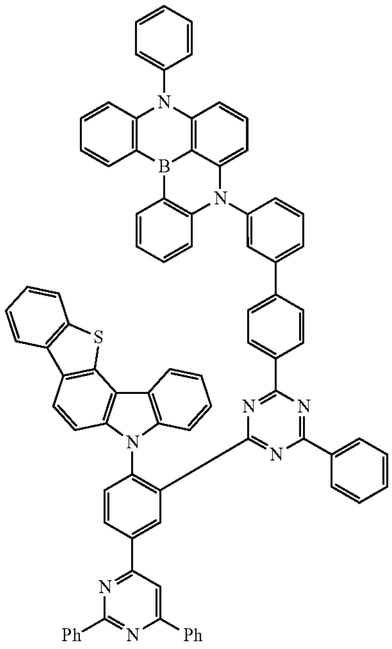
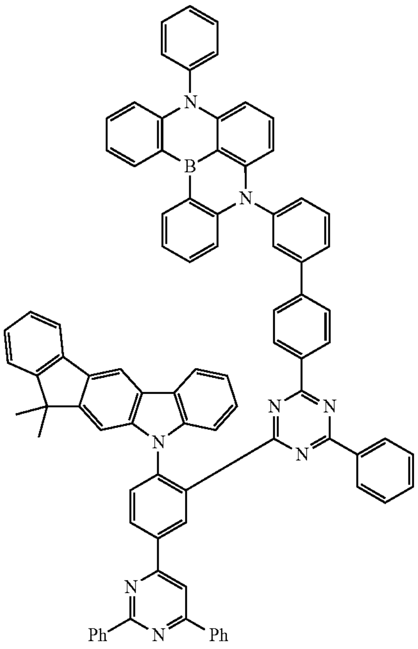

-continued
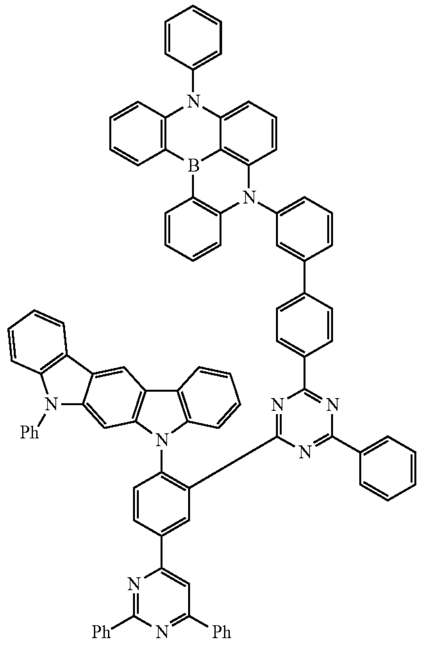
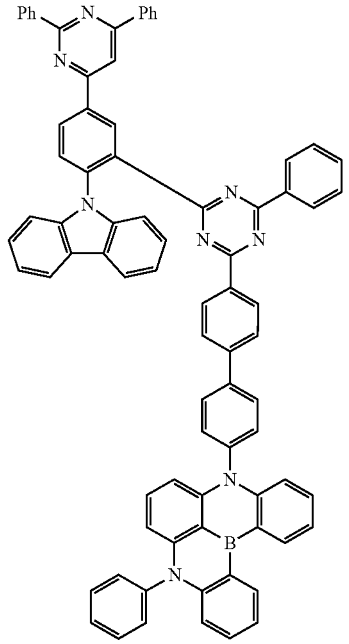
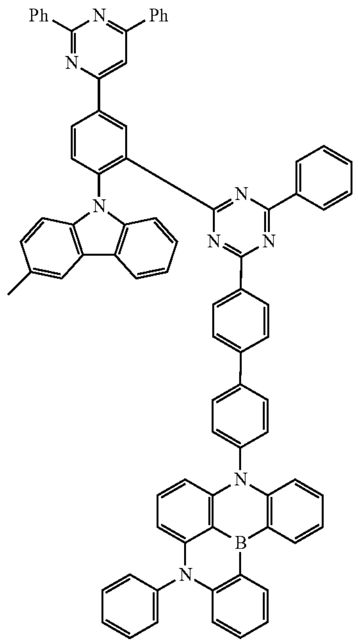
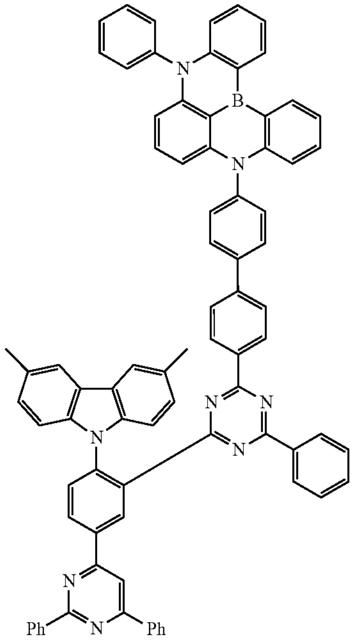

-continued
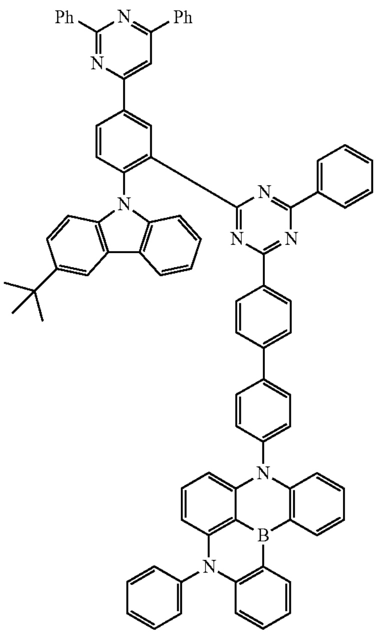
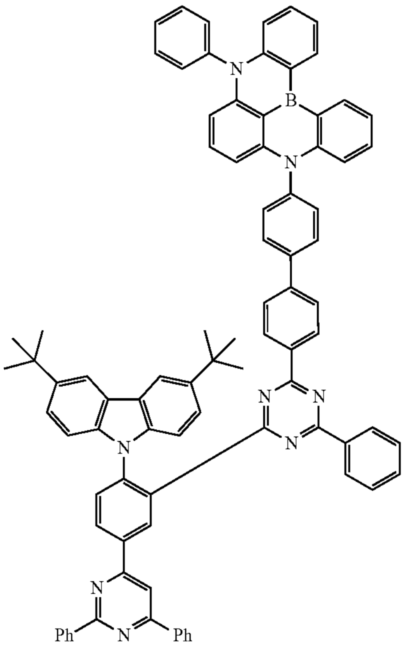
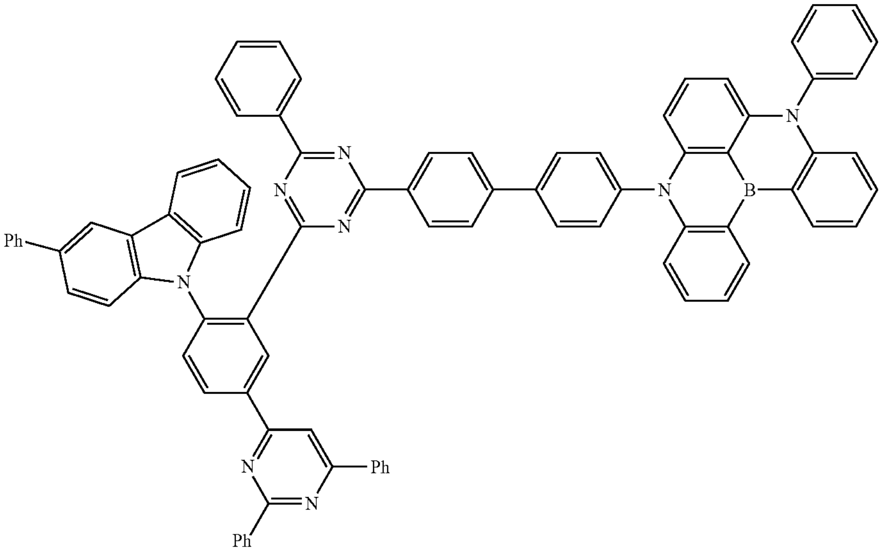
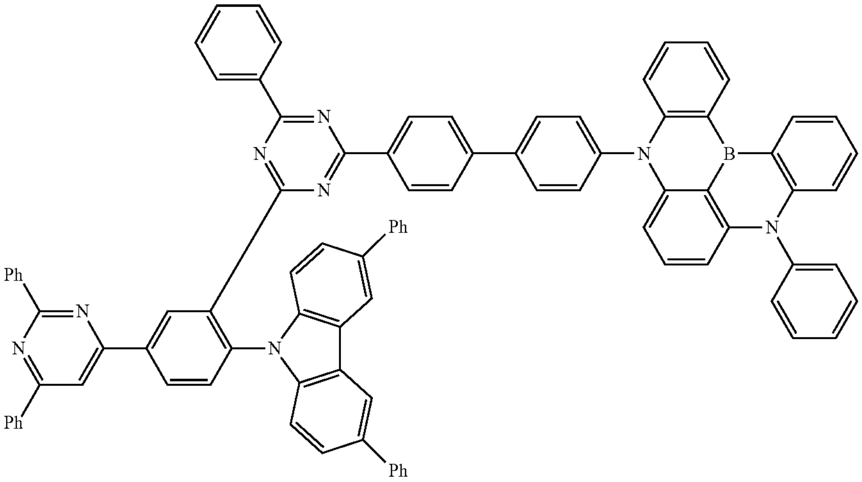

-continued
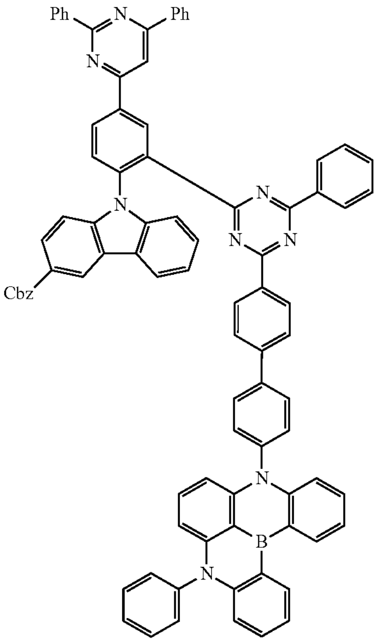
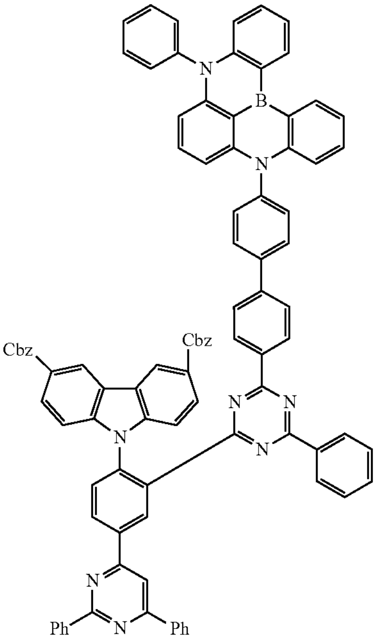
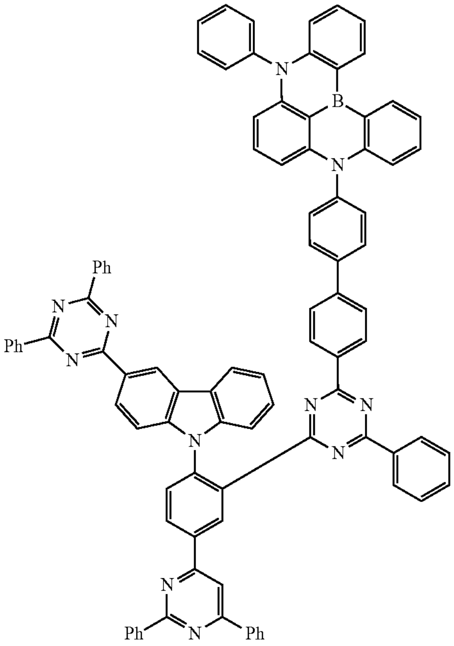

-continued
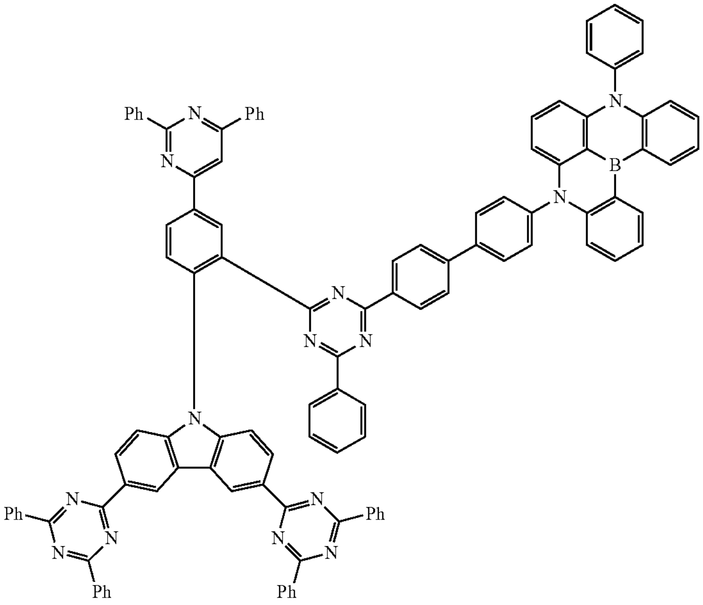
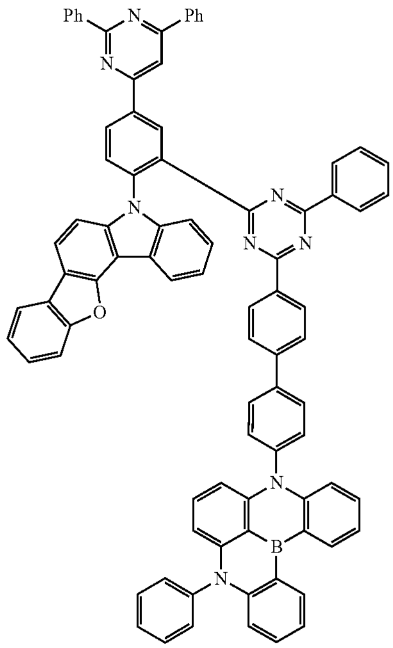
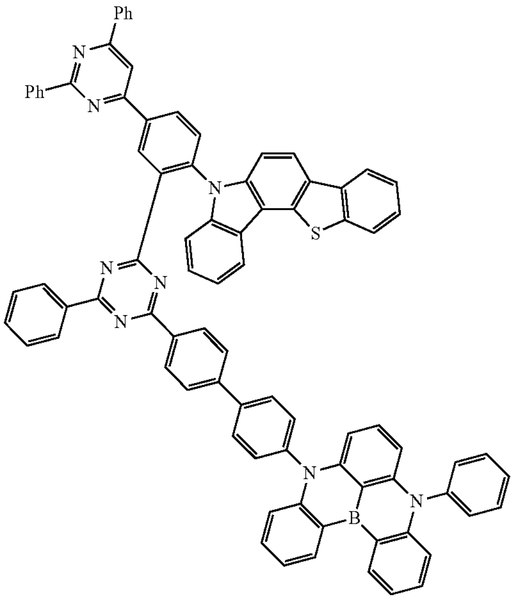
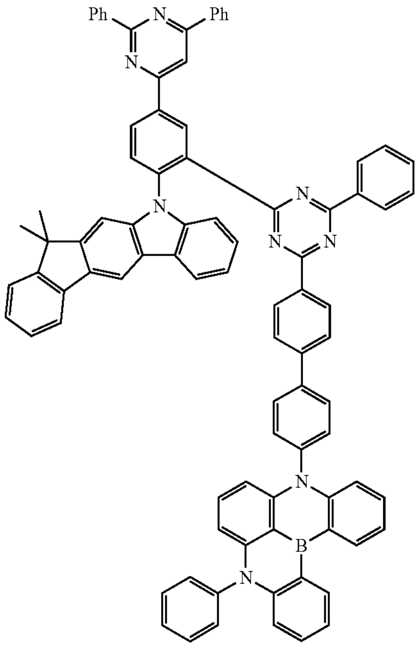

-continued
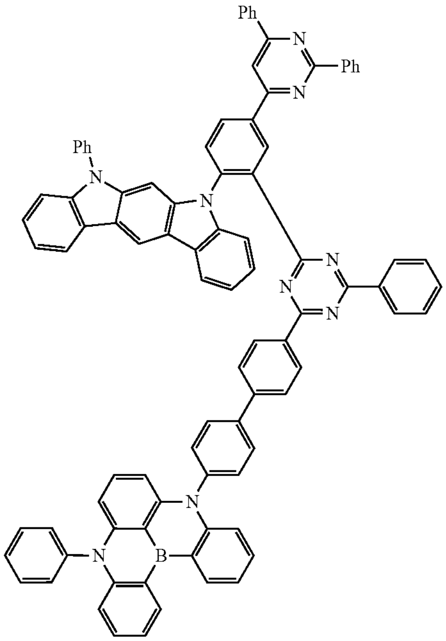
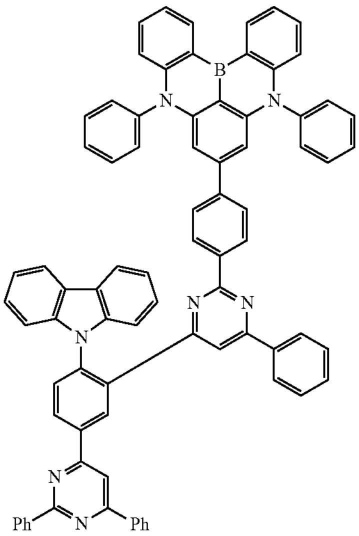
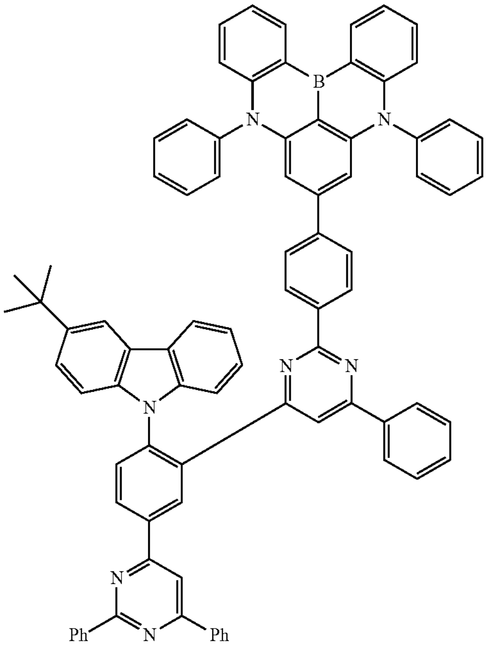

-continued
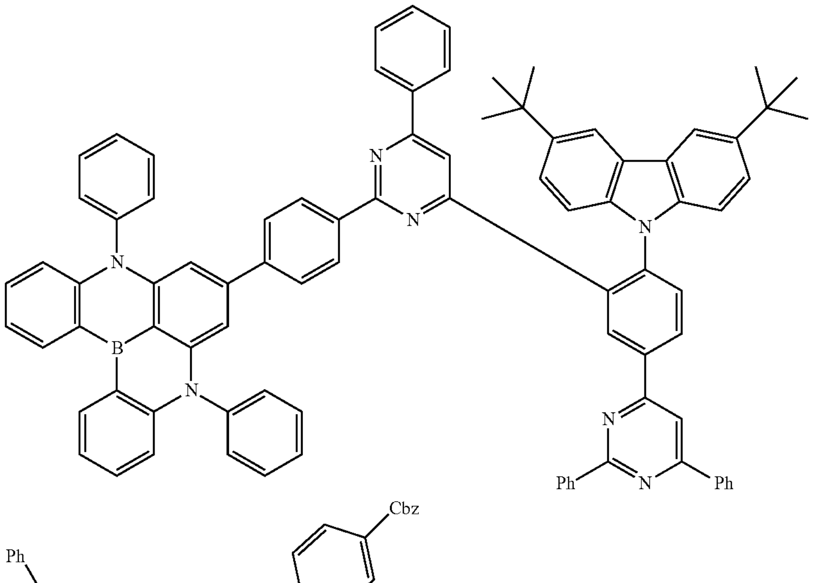
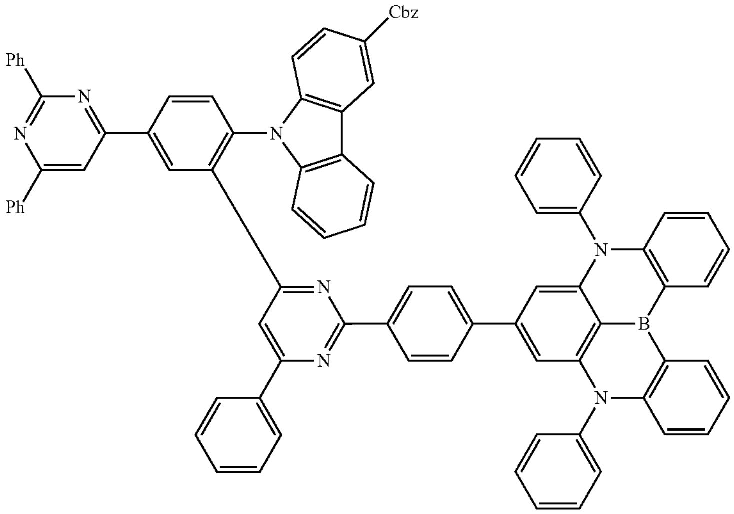
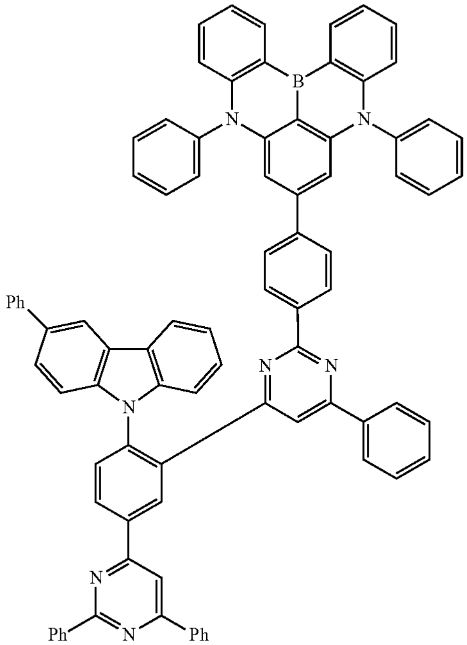
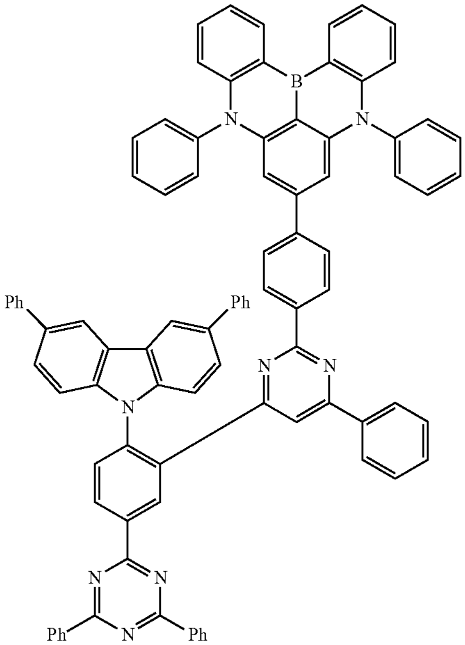

-continued
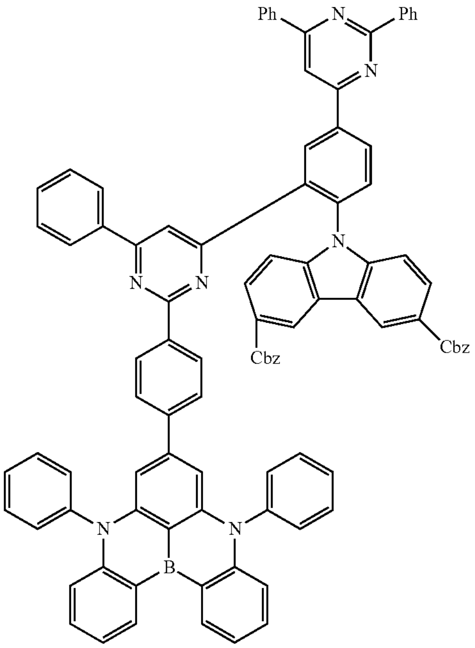
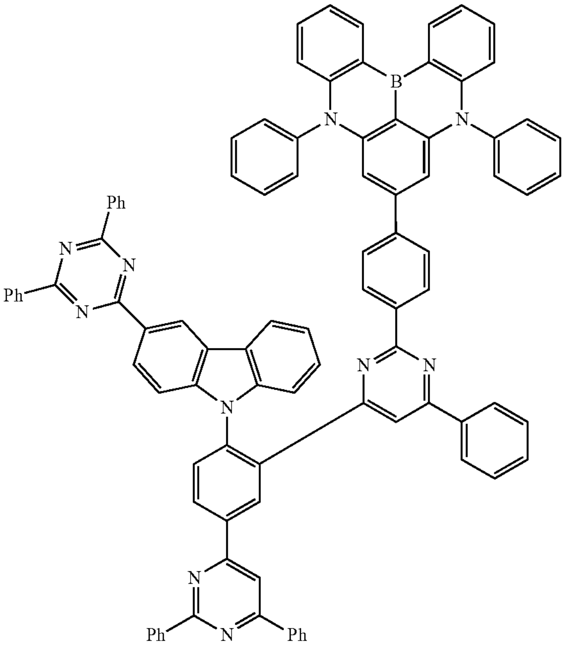
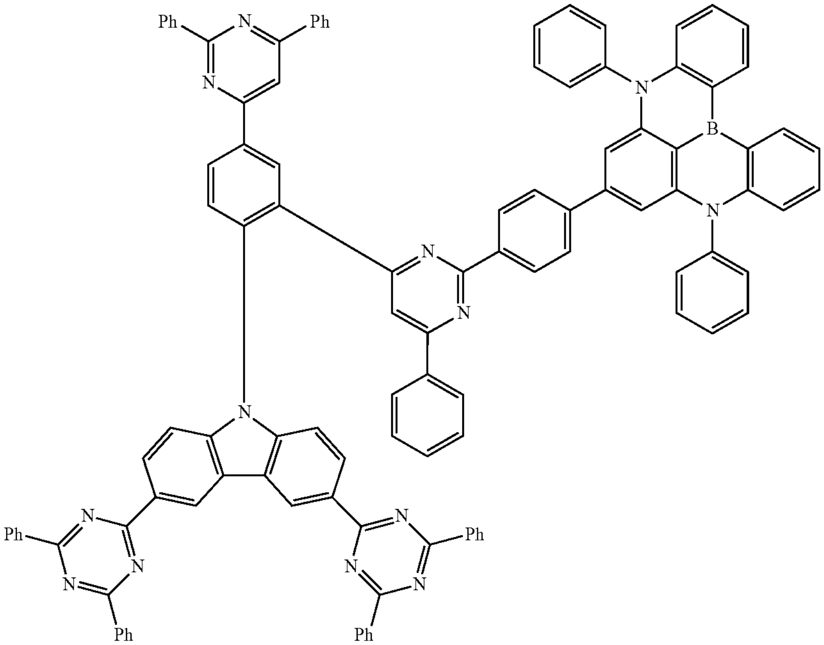

-continued
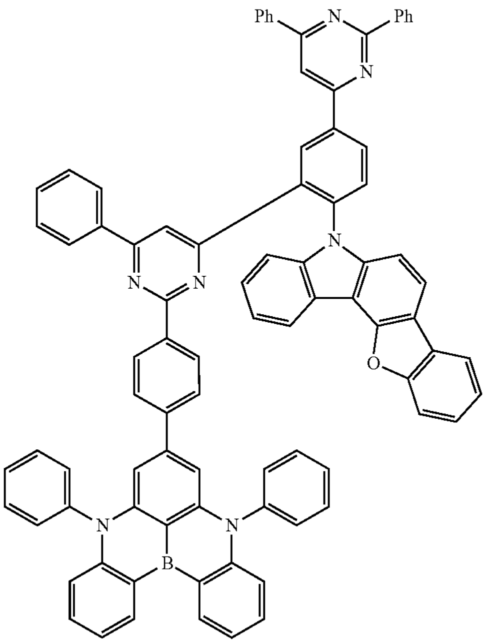
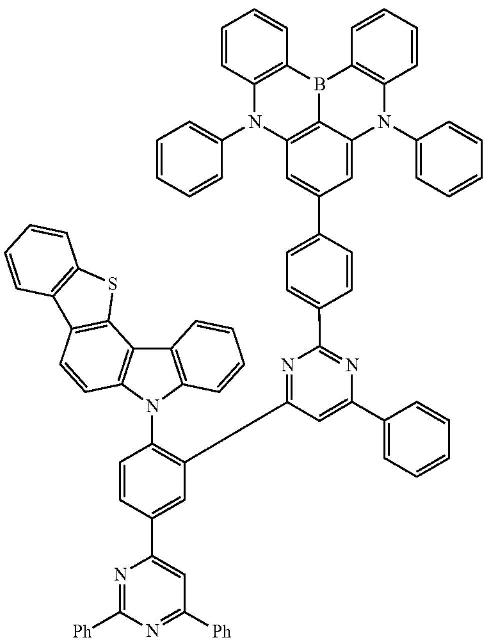
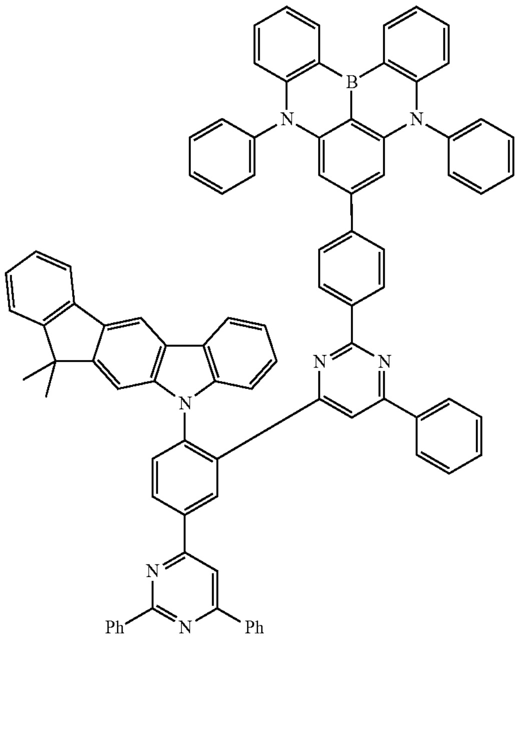
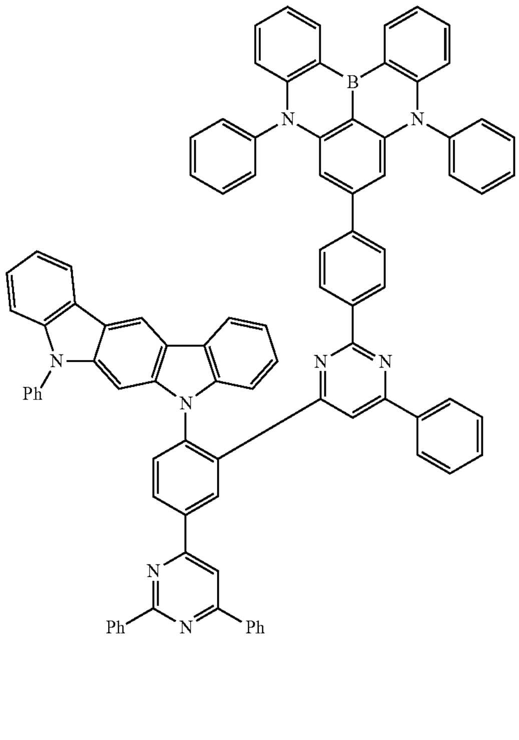

-continued
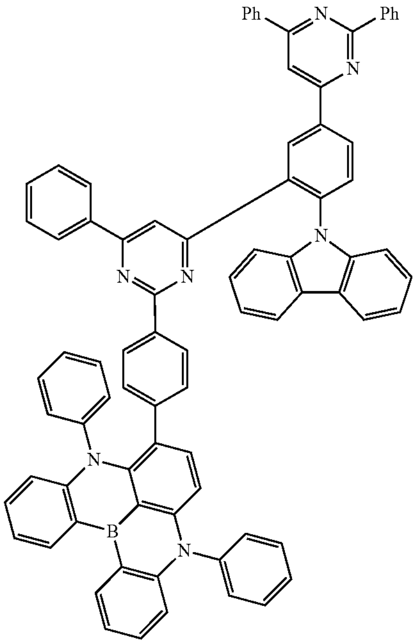
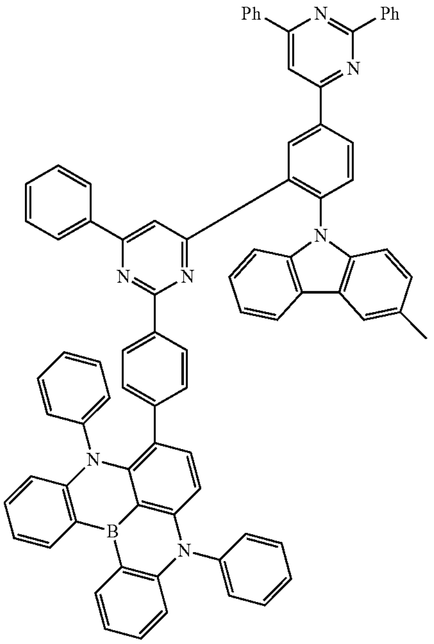
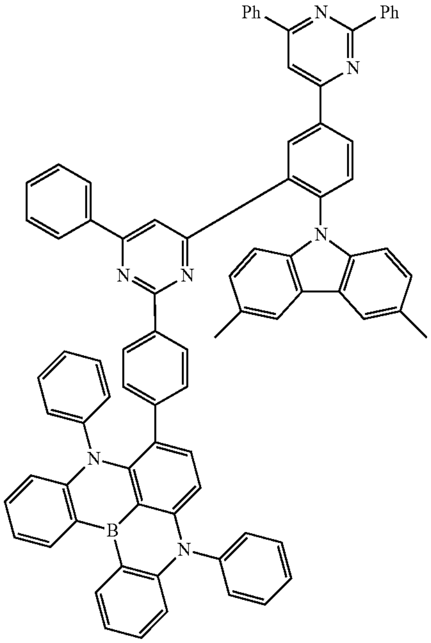

-continued
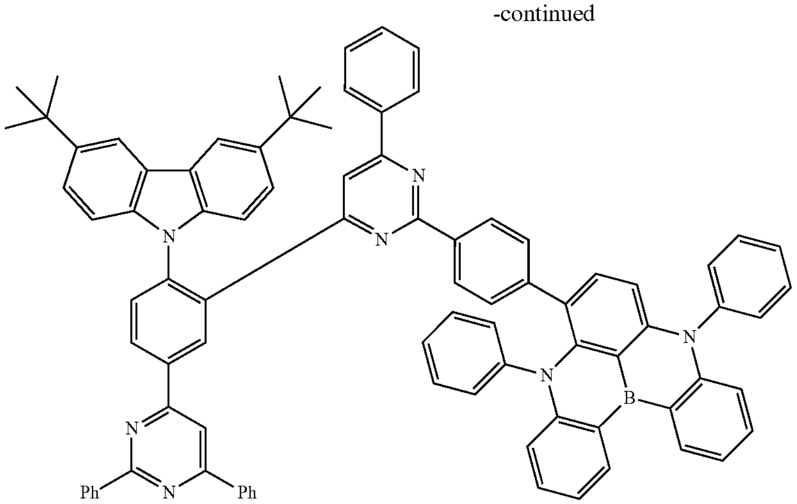
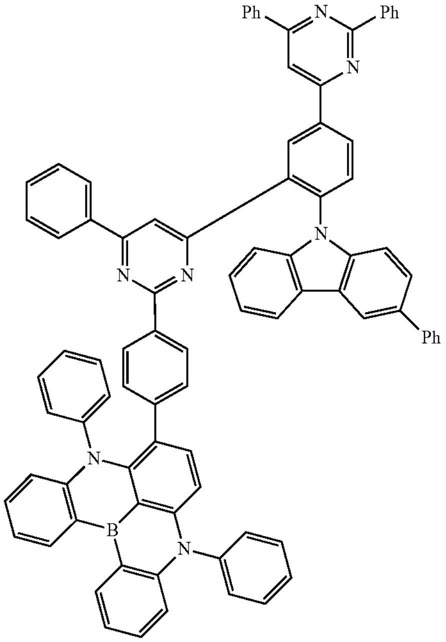
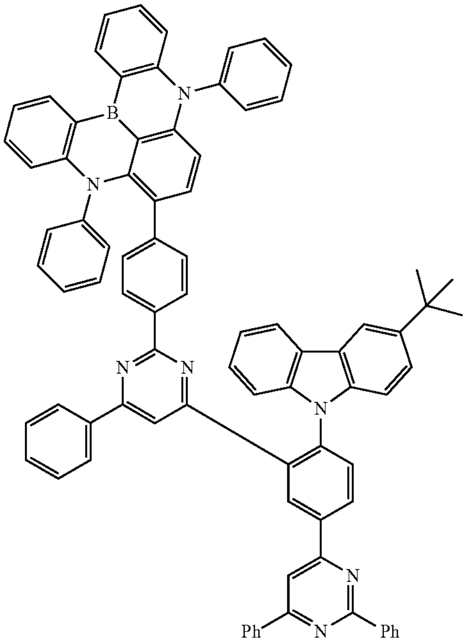
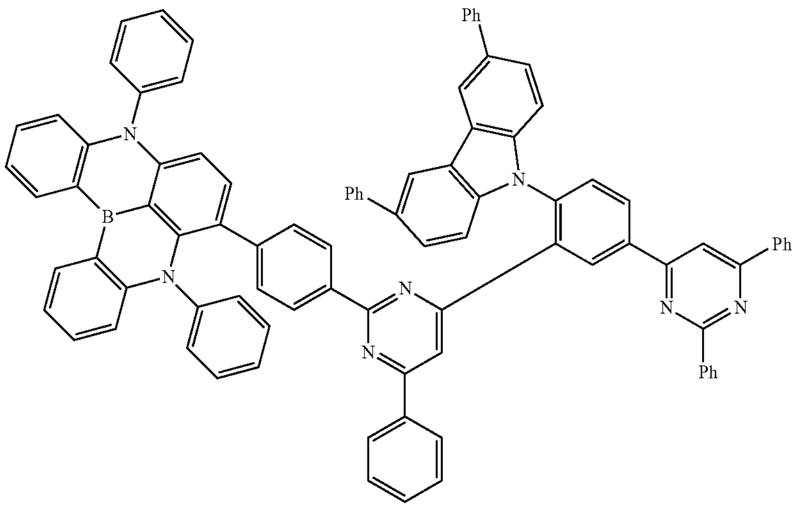

-continued
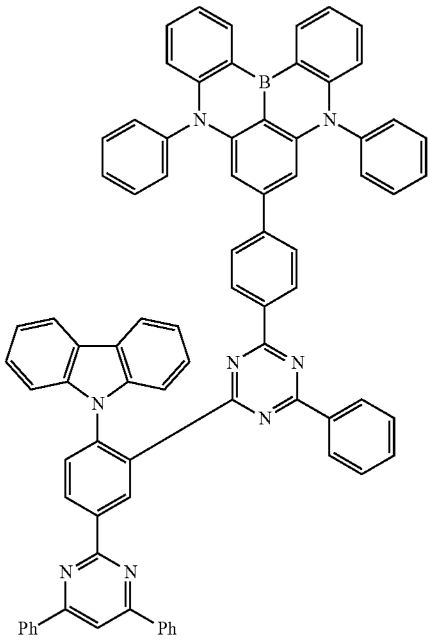
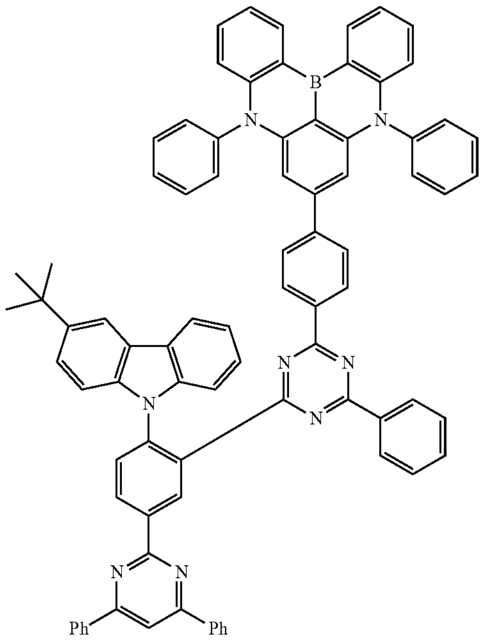
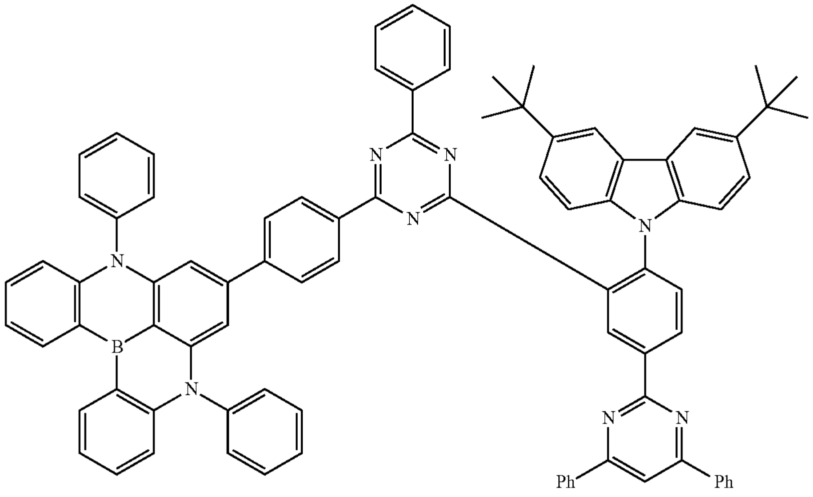
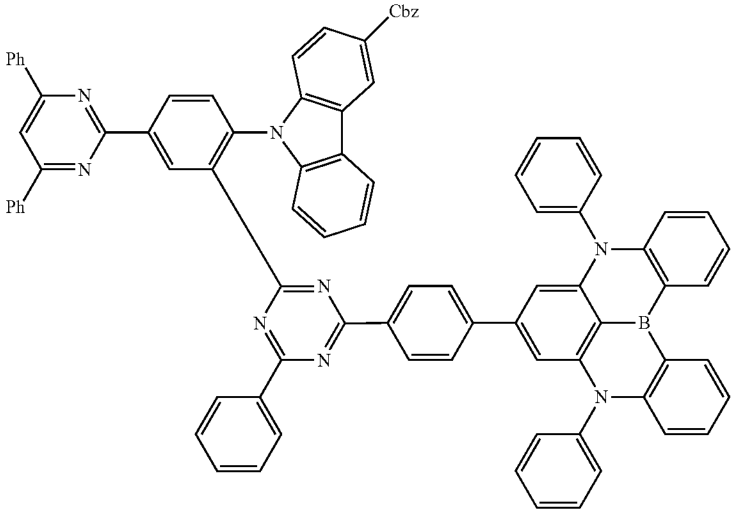

-continued
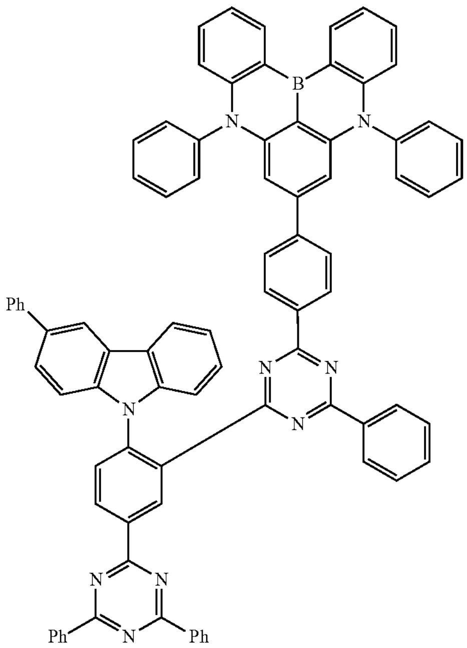
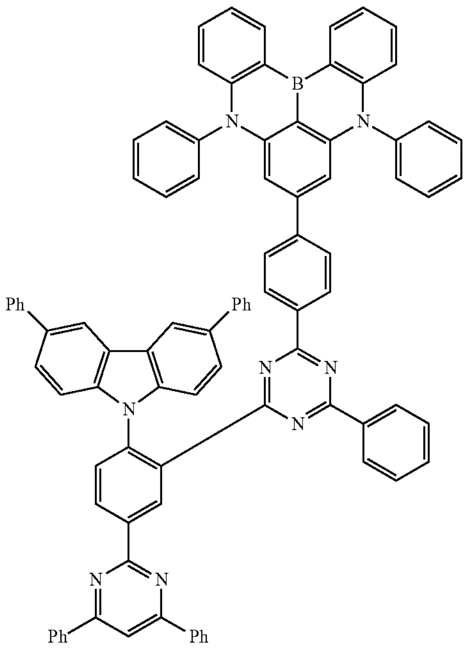
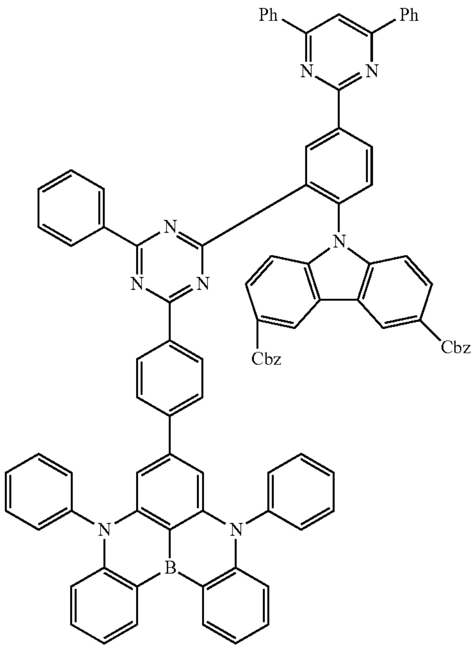
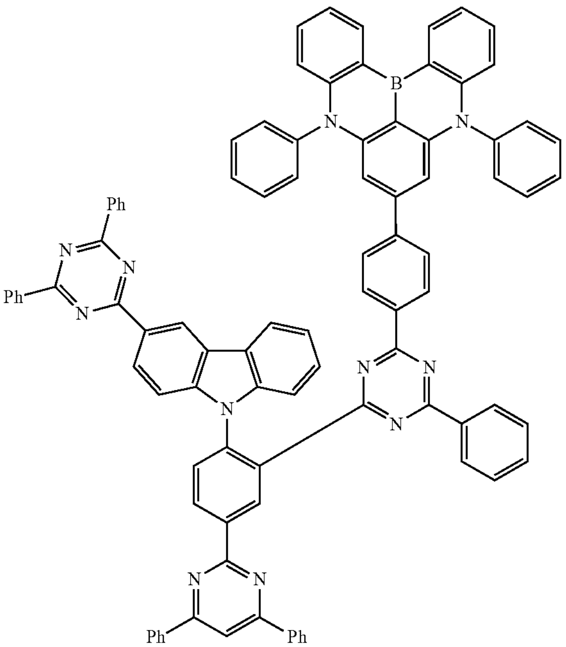

-continued
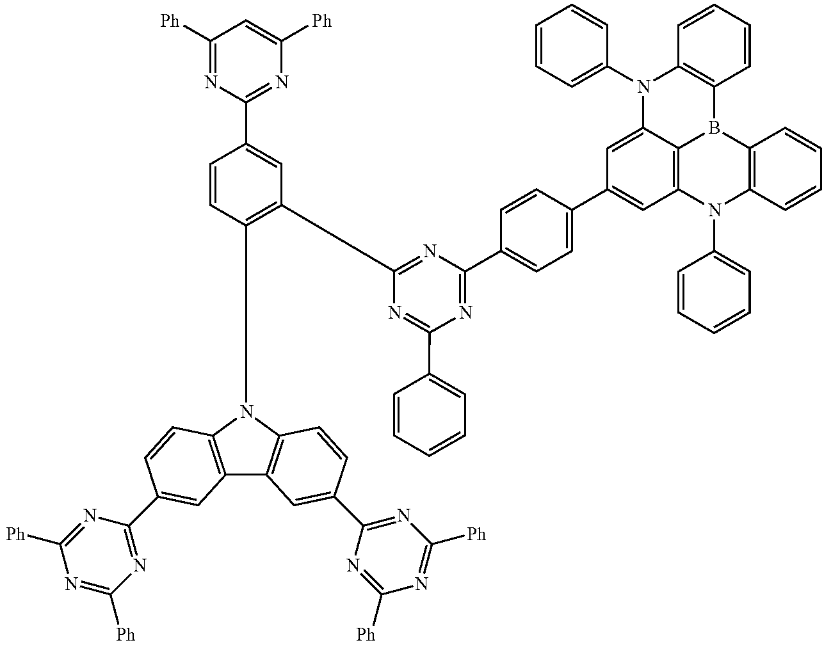
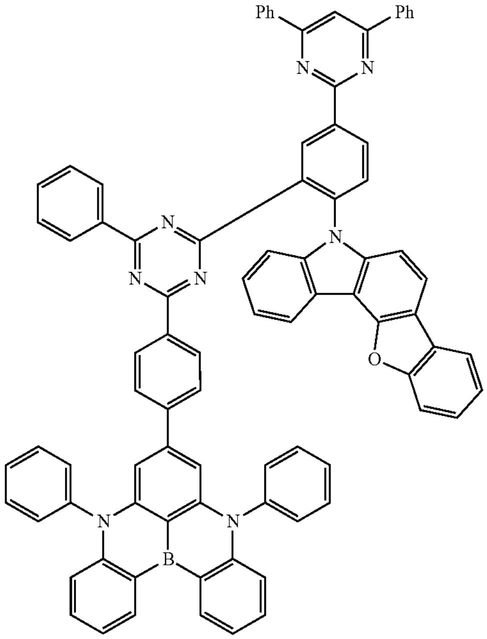
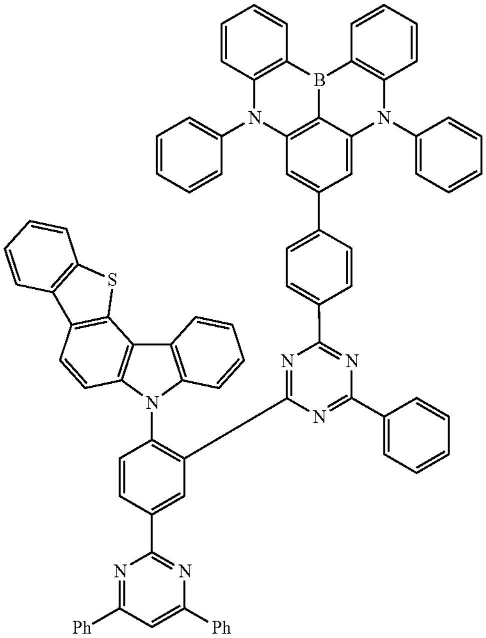

-continued
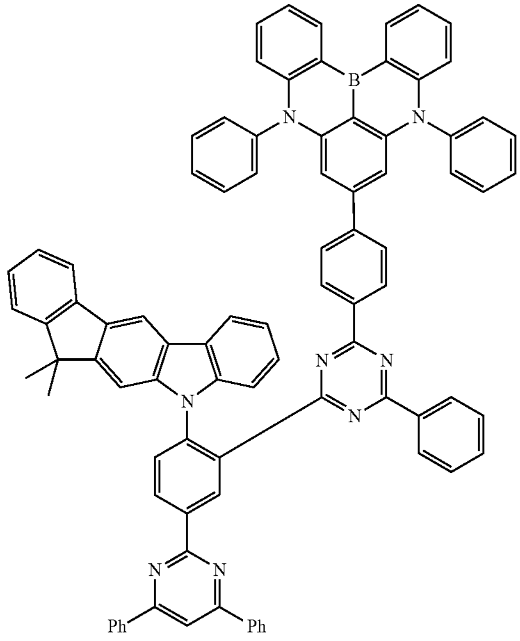
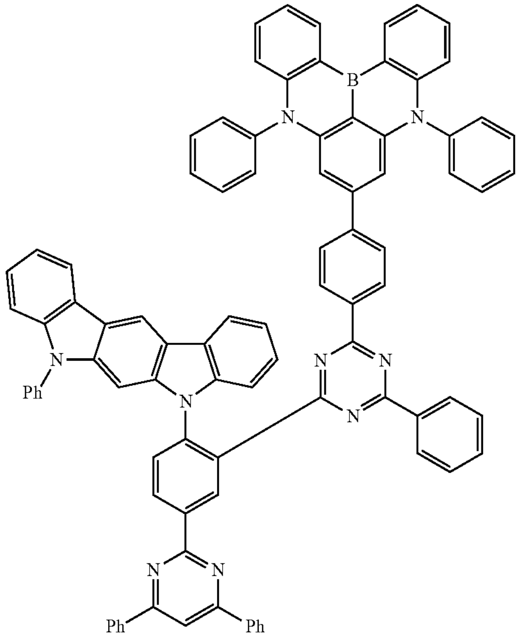
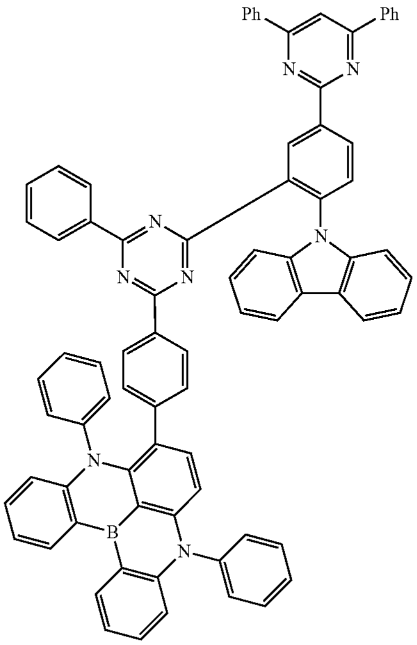
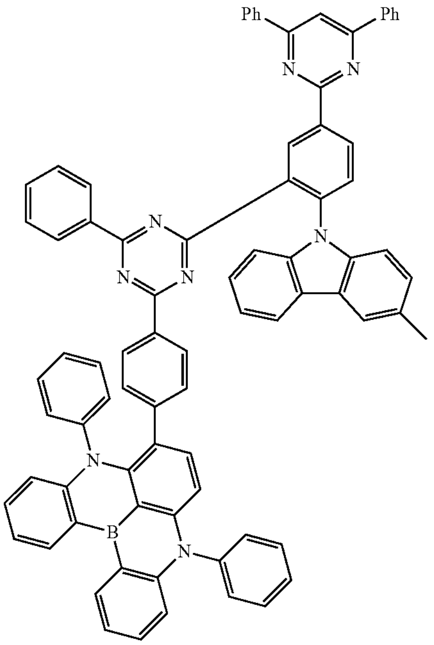

-continued
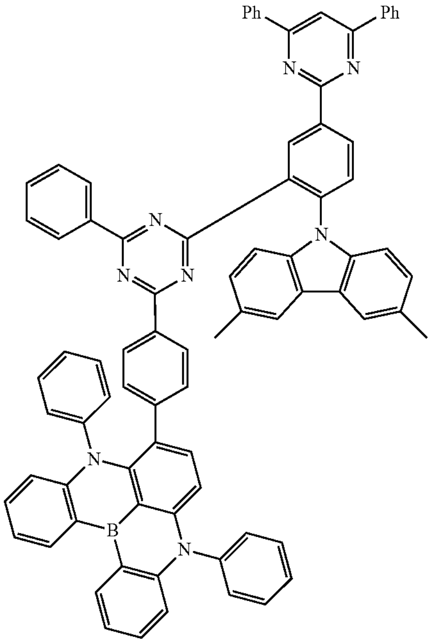
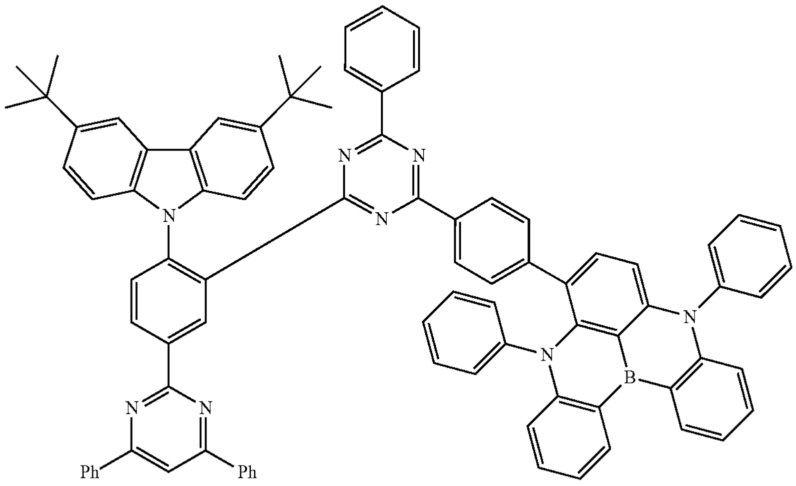

-continued
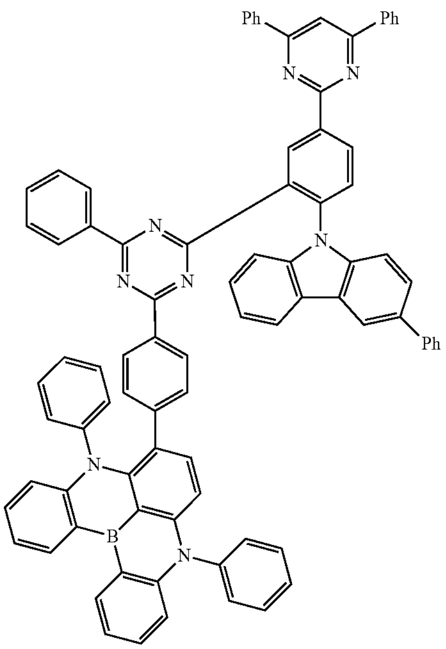
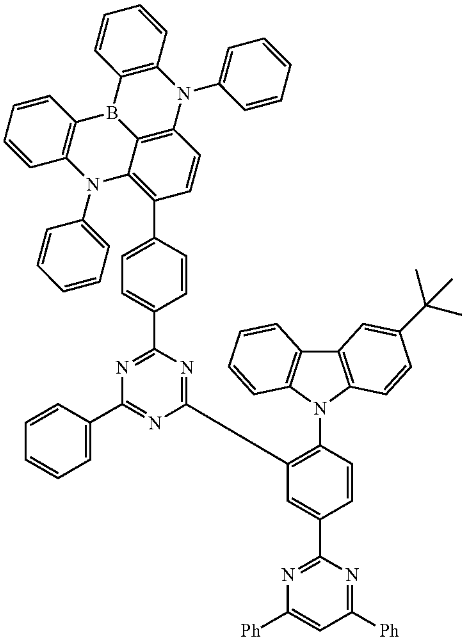
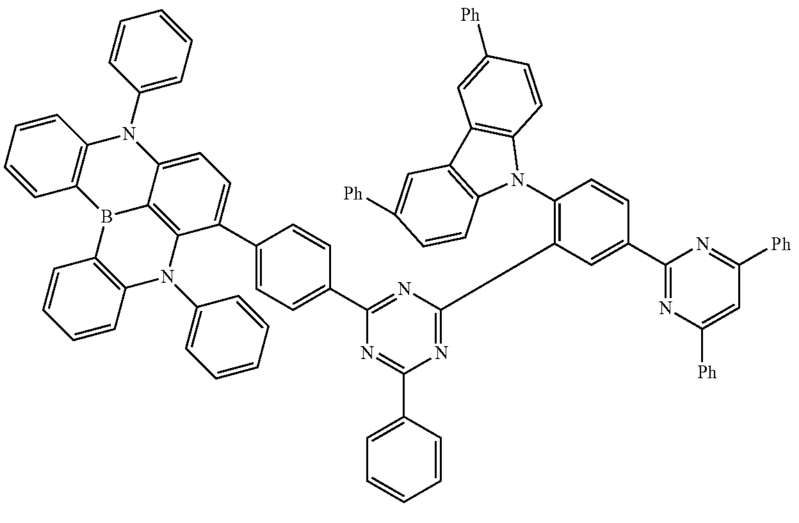

-continued
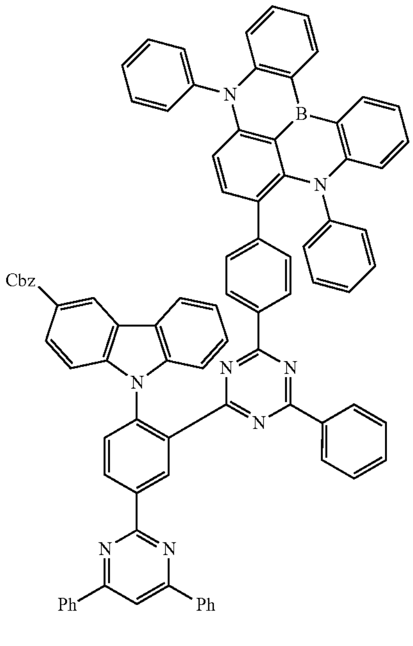
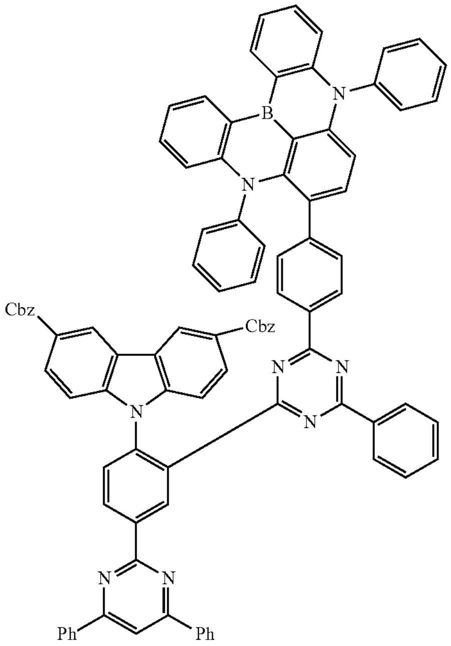
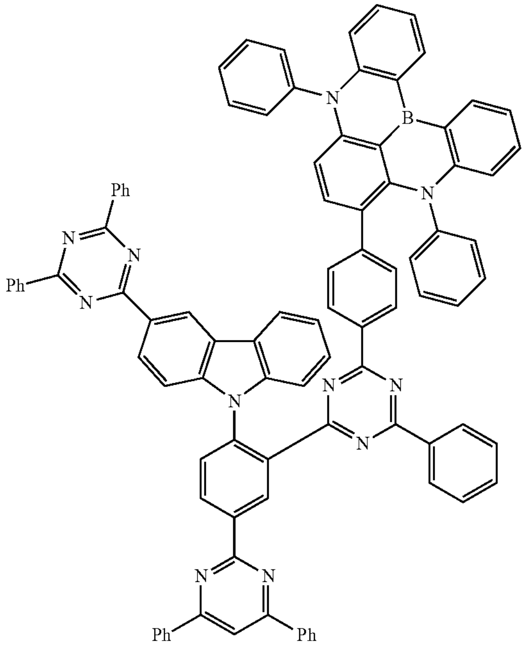

-continued
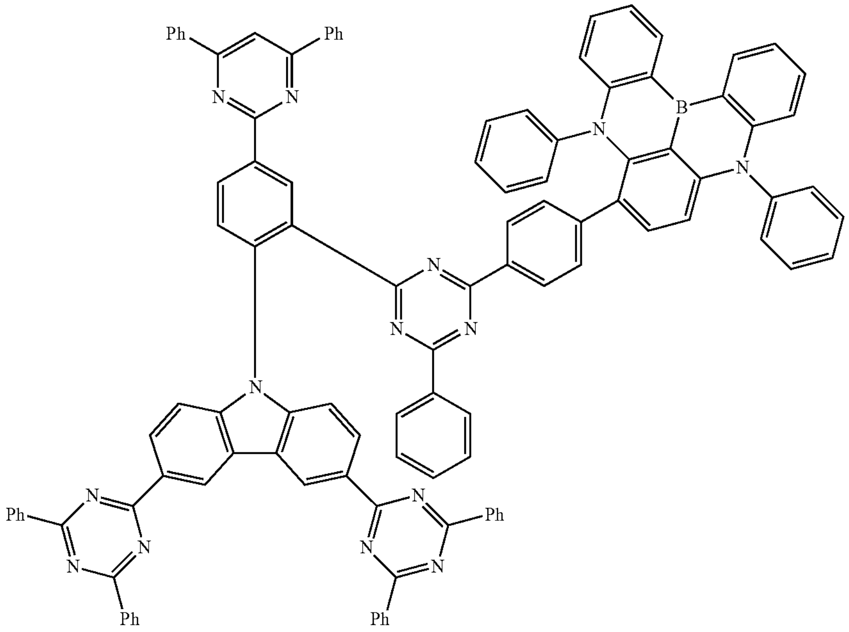 [SMILES: c1ccc(-c2cc(-c3ccccc3)nc(-c3ccc(-n4c5ccc(-c6nc(-c7ccccc7)nc(-c7ccccc7)n6)cc5c5cc(-c6nc(-c7ccccc7)nc(-c7ccccc7)n6)ccc54)c(-c4nc(-c5ccccc5)nc(-c5ccc(-c6ccc7c8c6N(c6ccccc6)c6ccccc6B8c6ccccc6N7c6ccccc6)cc5)n4)c3)n2)cc1]
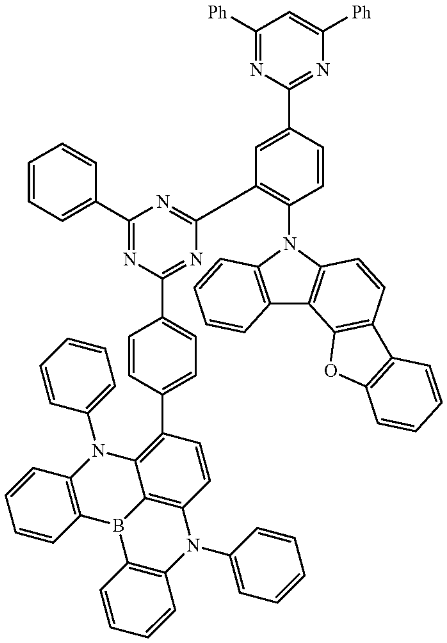
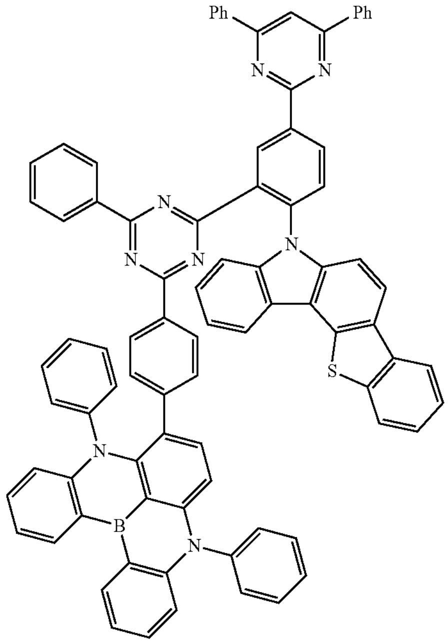

-continued
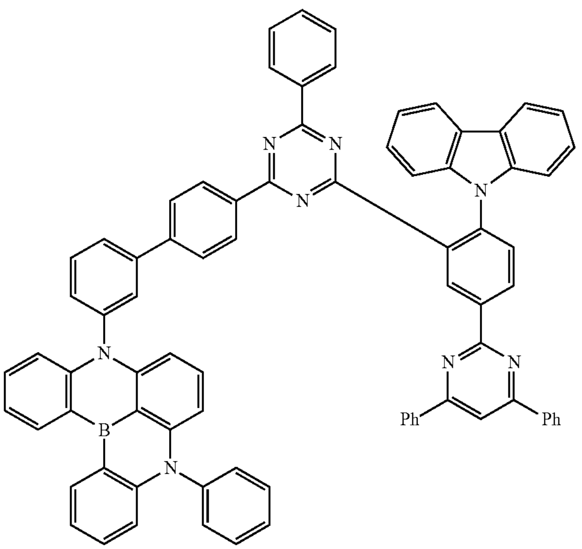
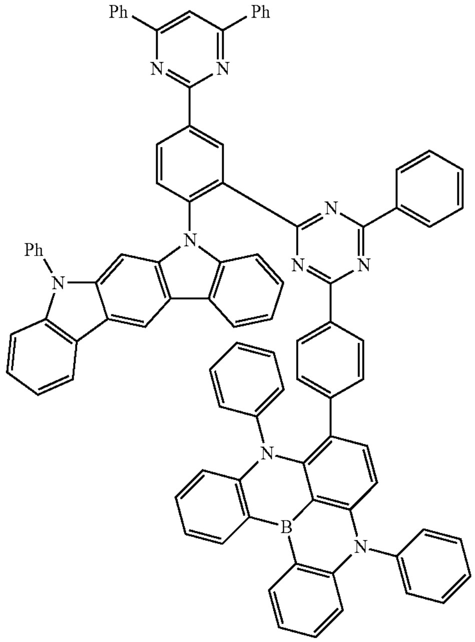
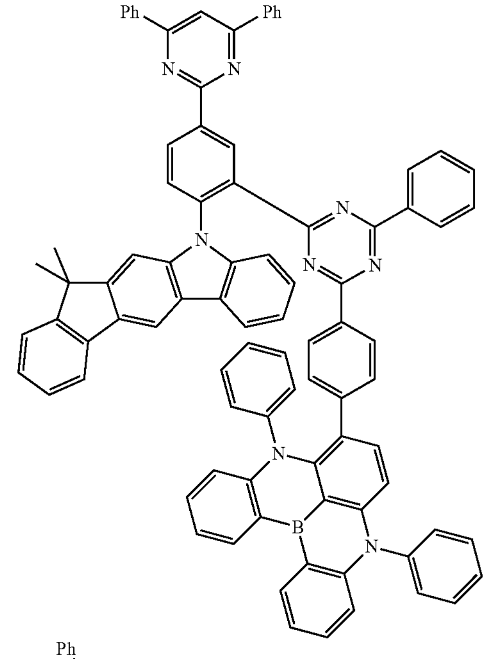
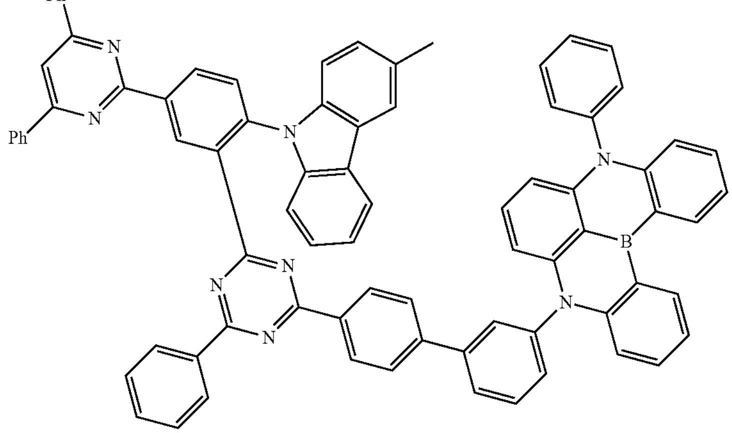

-continued
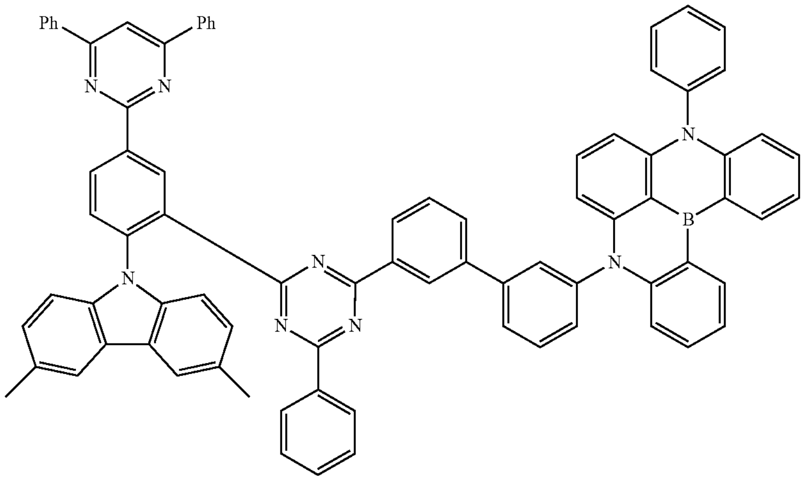
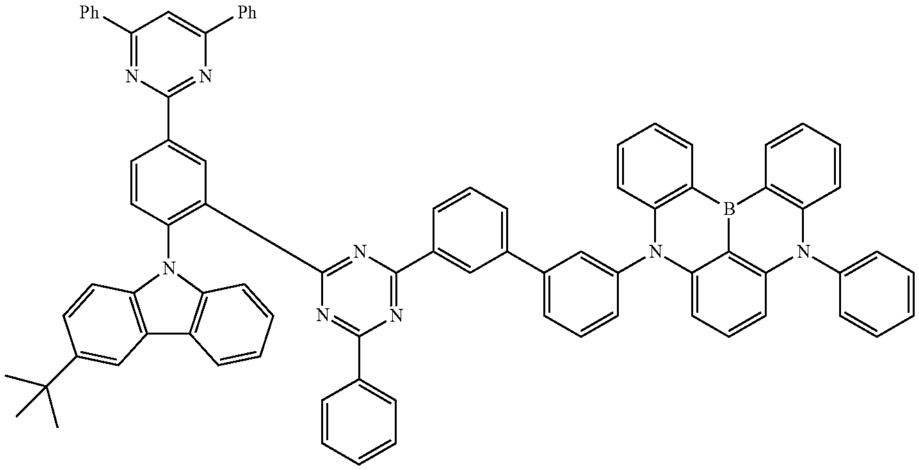
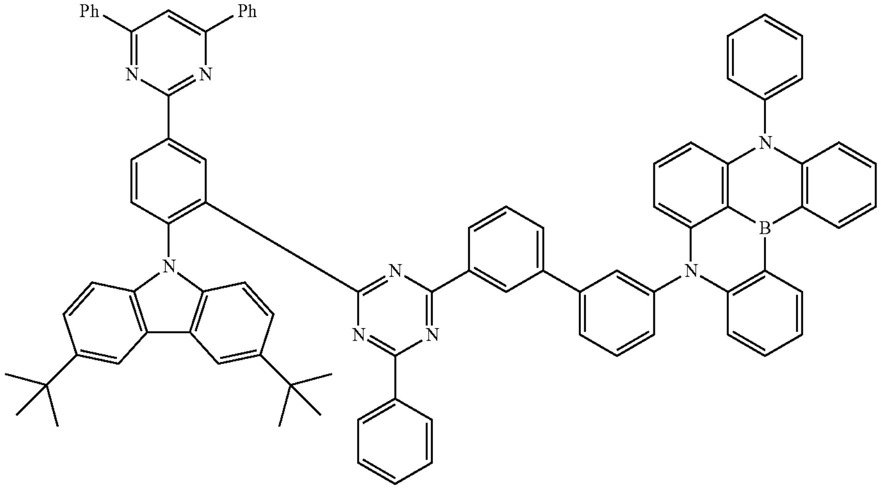

-continued
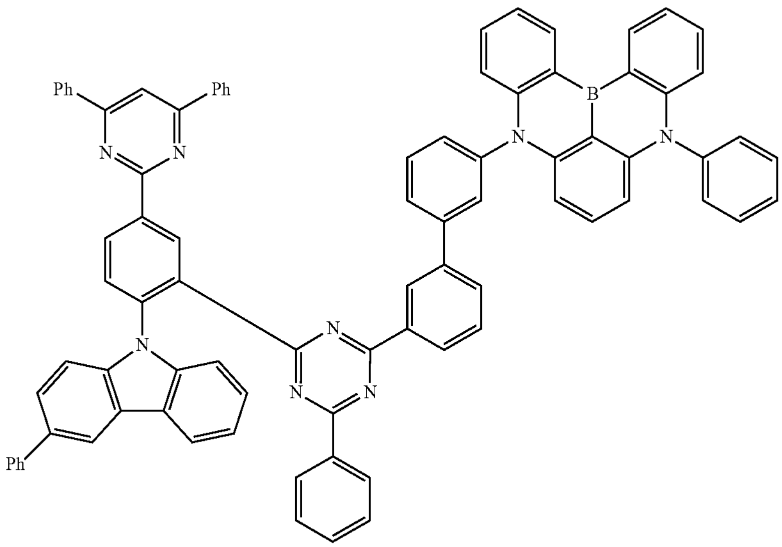
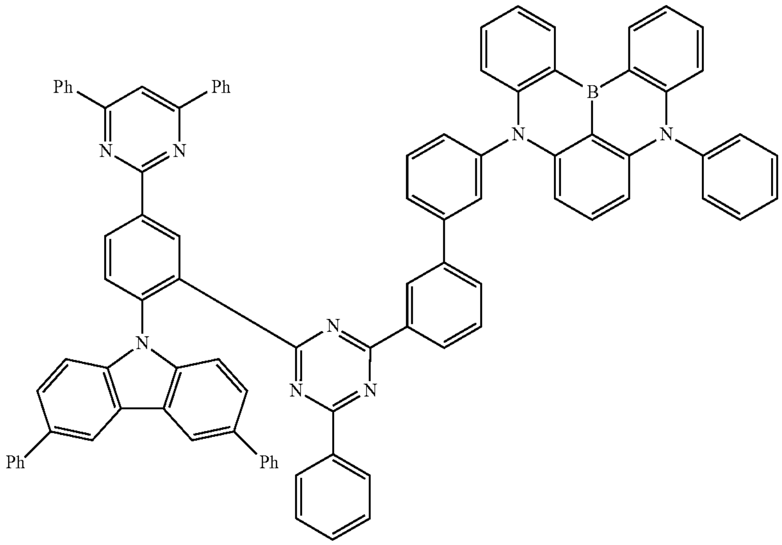
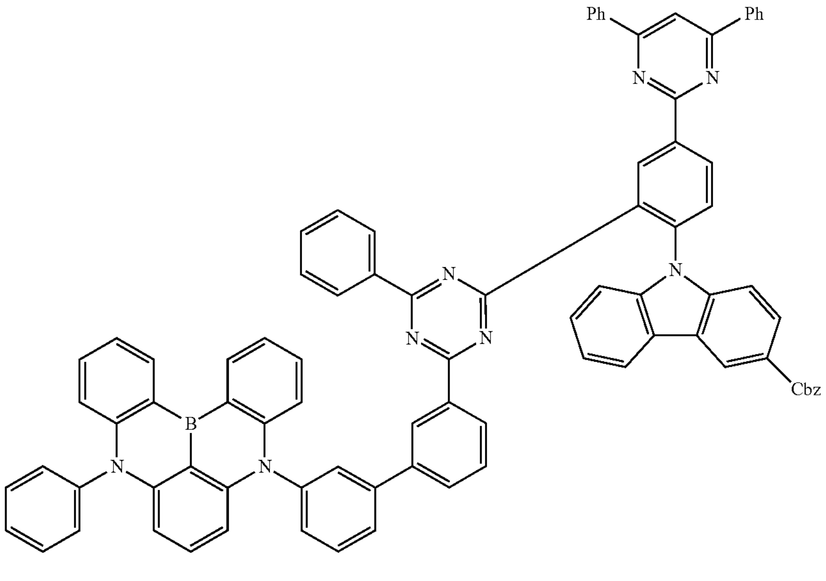

-continued
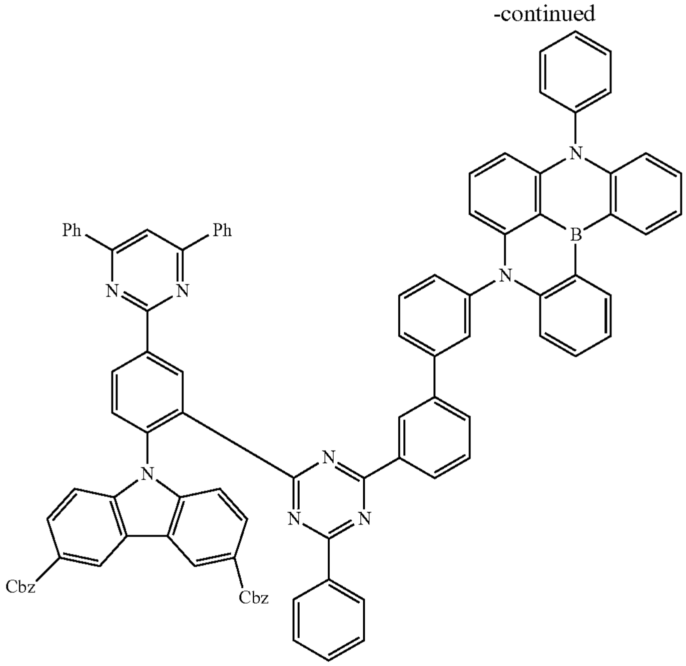
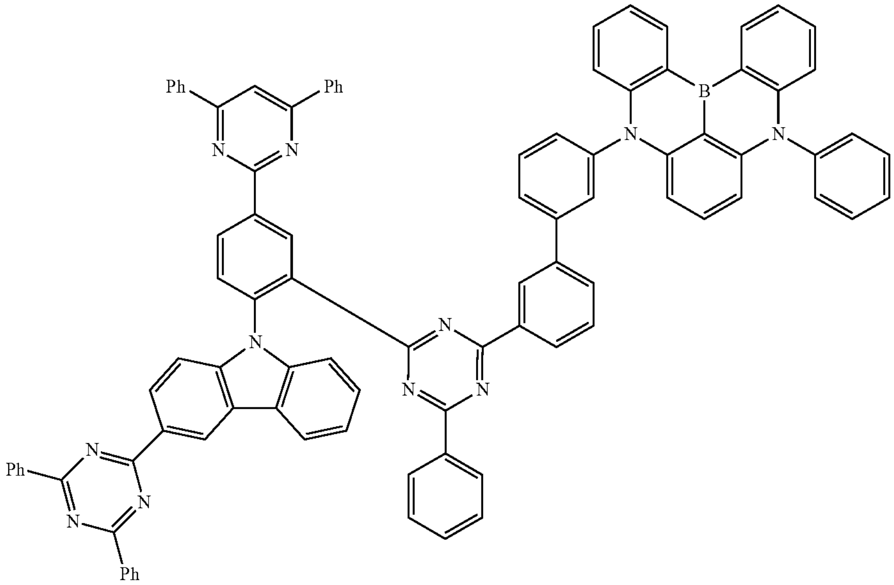
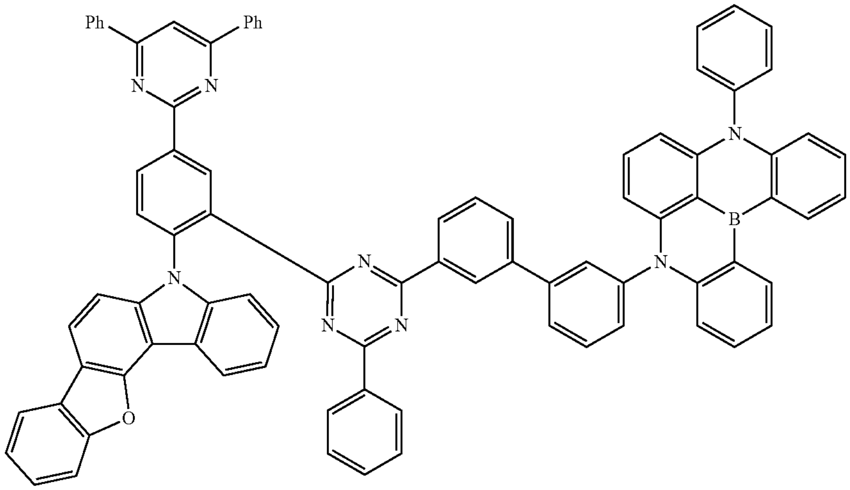

-continued
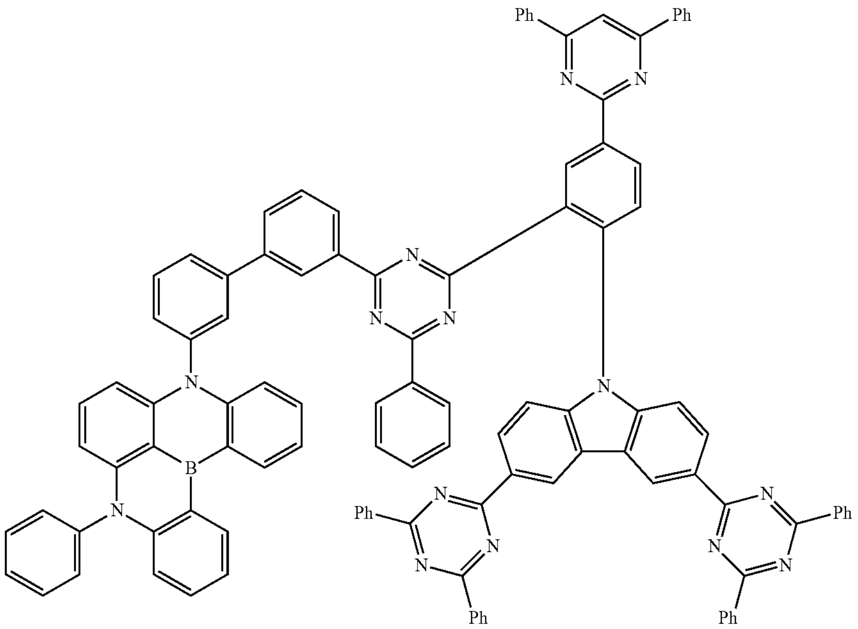
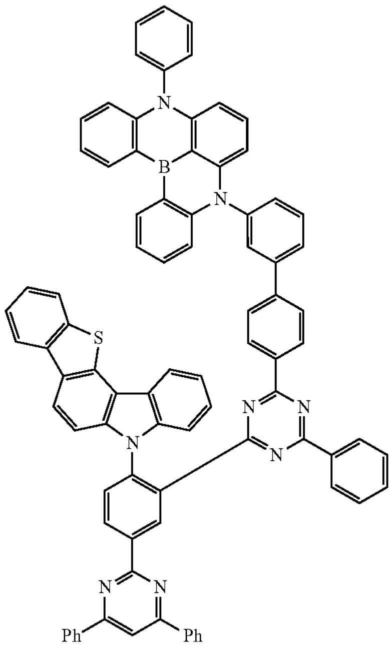
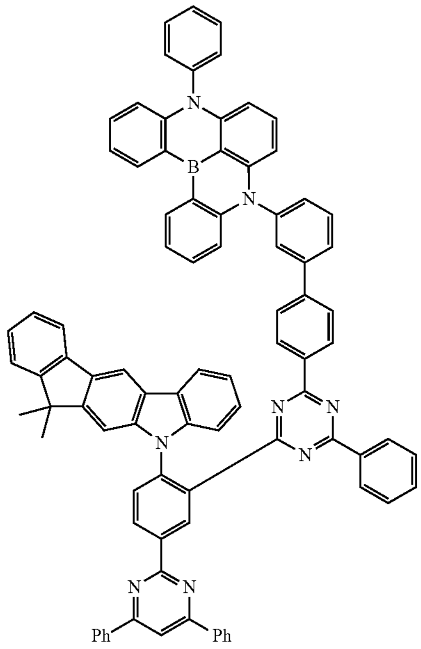

-continued
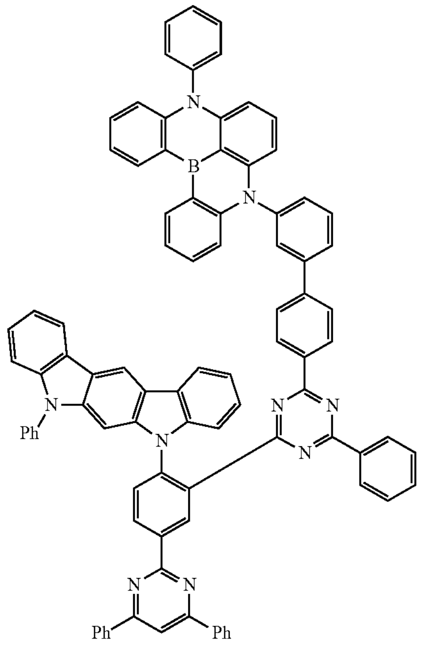
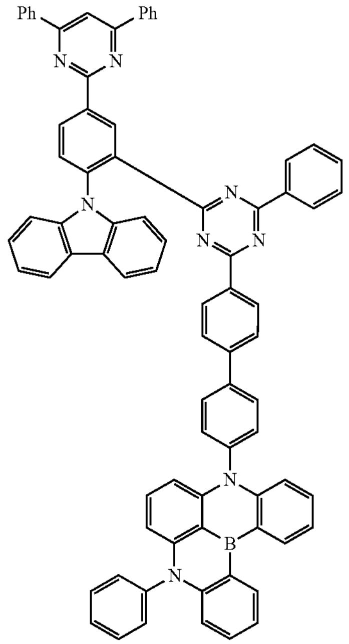
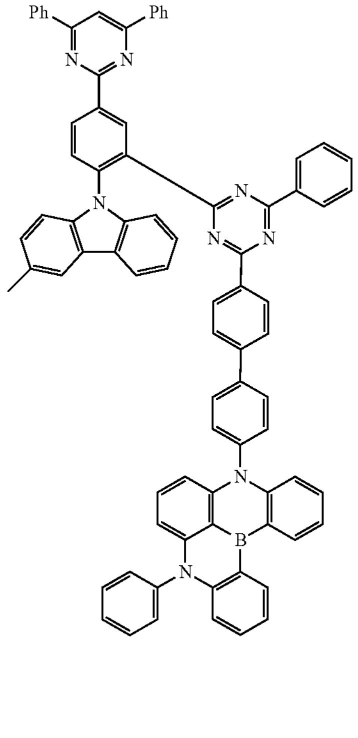
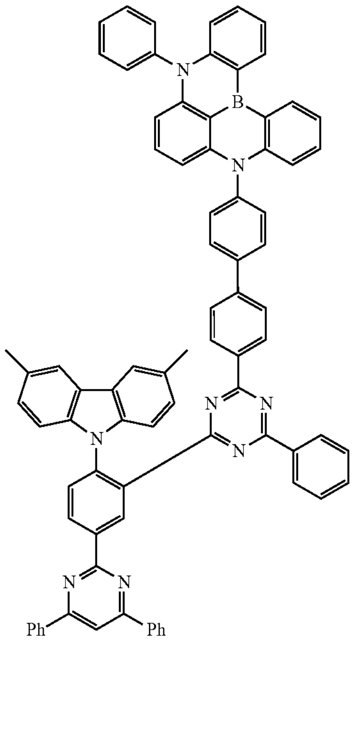

-continued
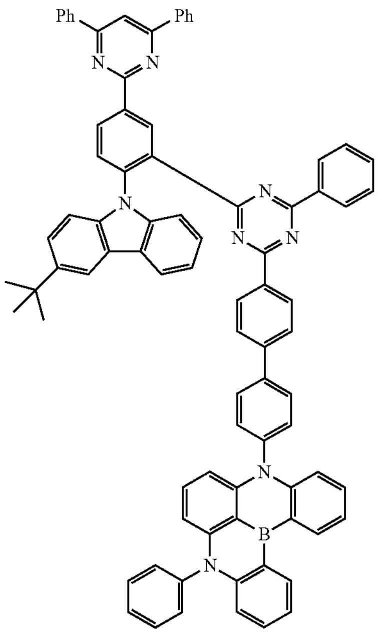
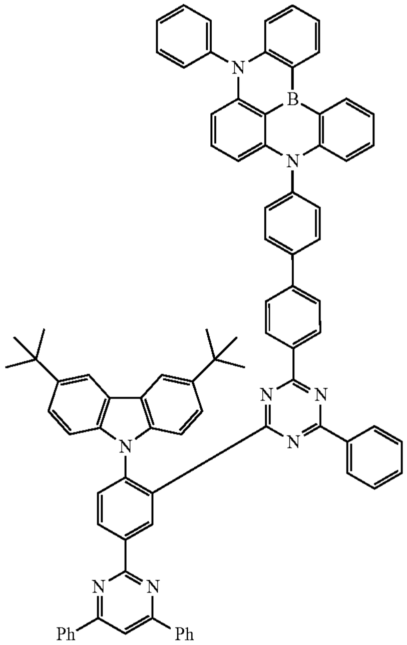
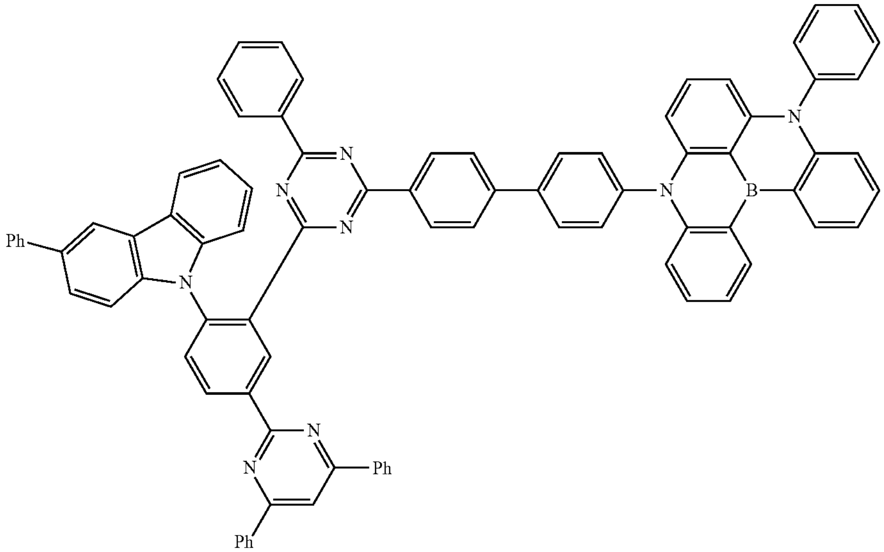
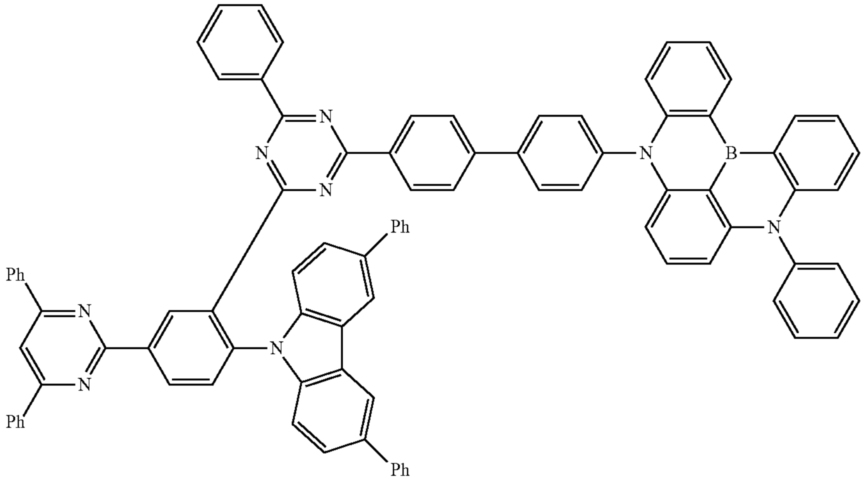

-continued
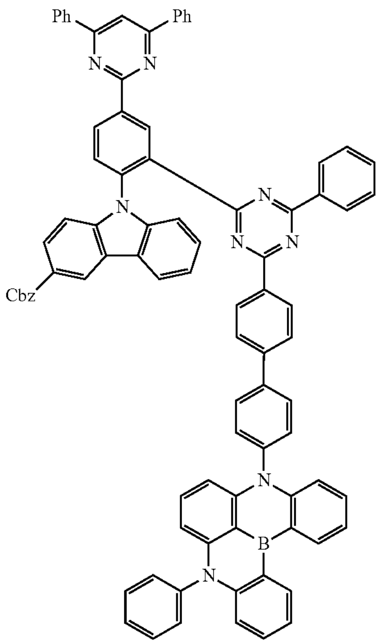
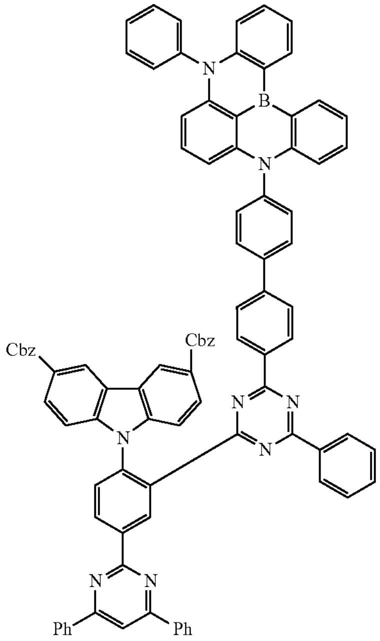
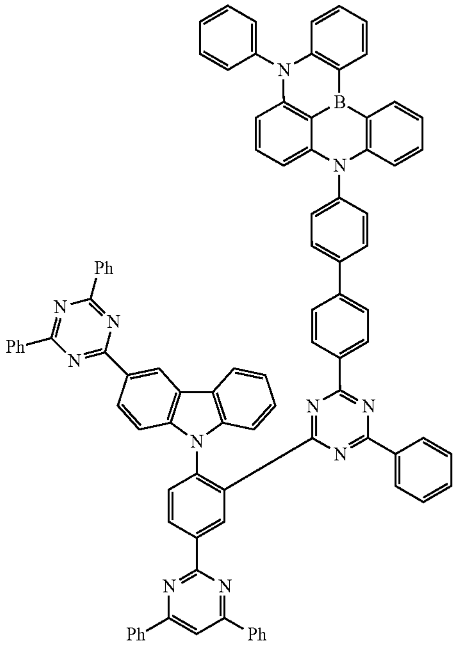

-continued
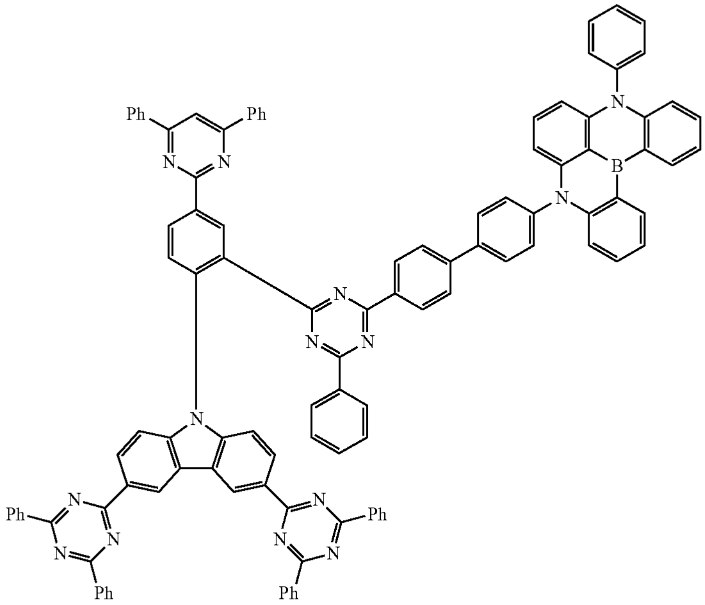
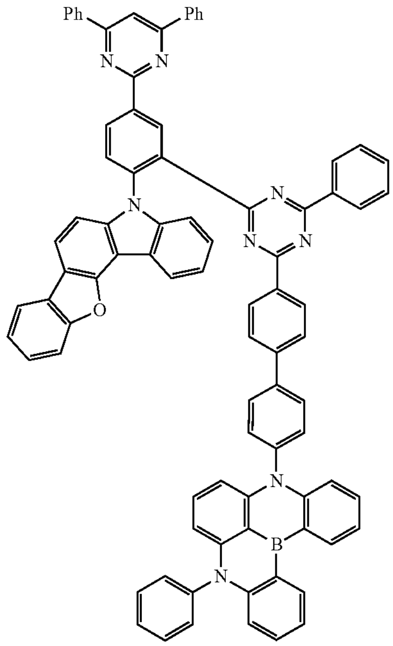
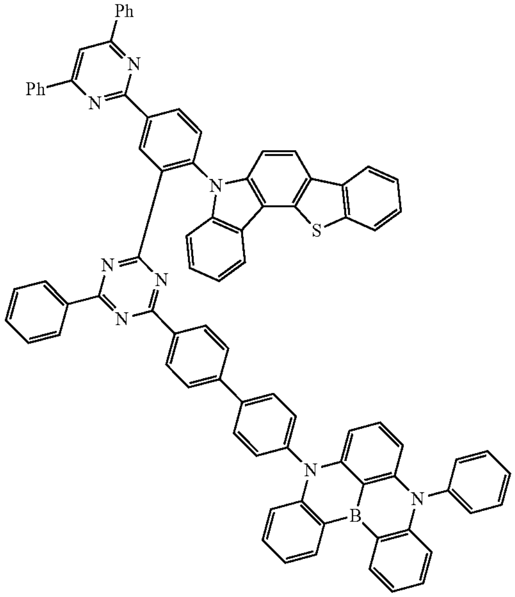
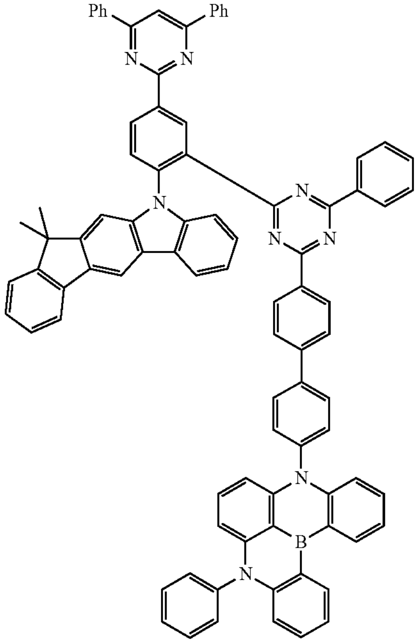

-continued
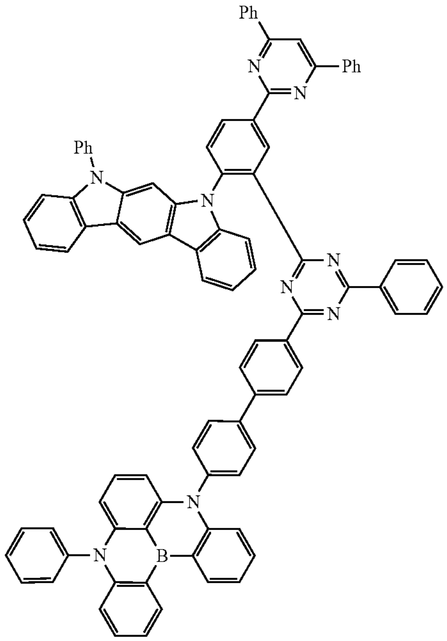
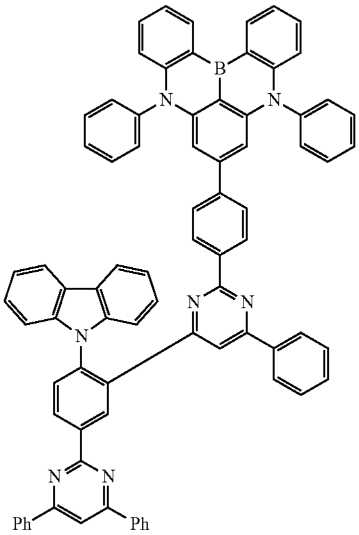
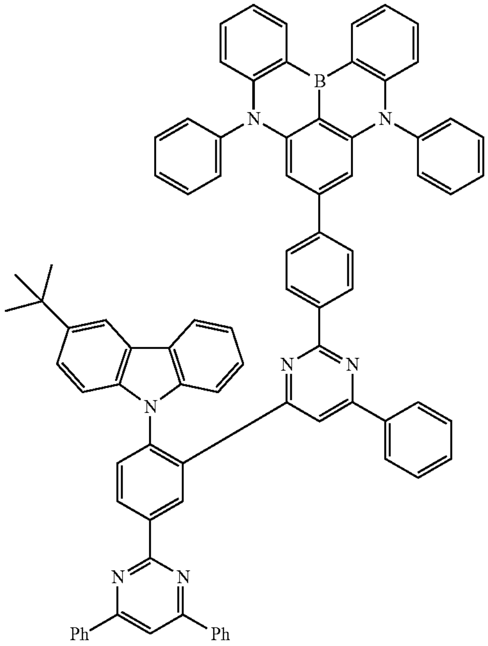

-continued
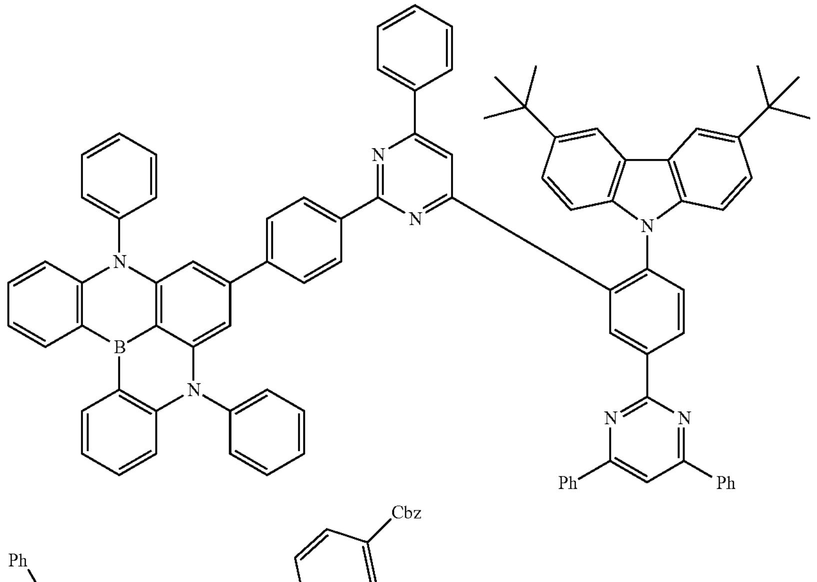
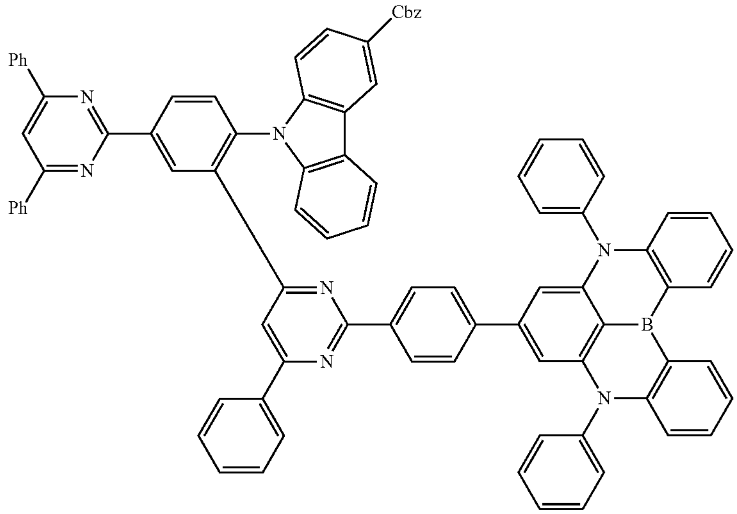
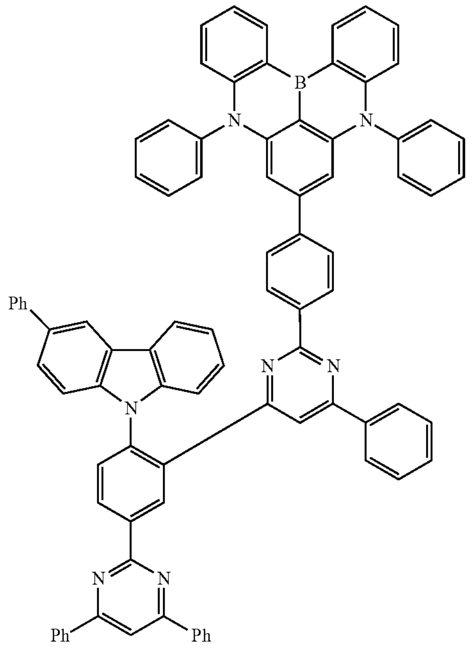
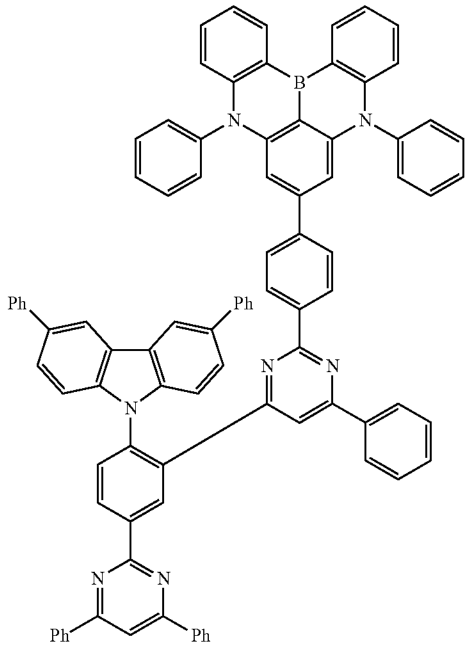

-continued
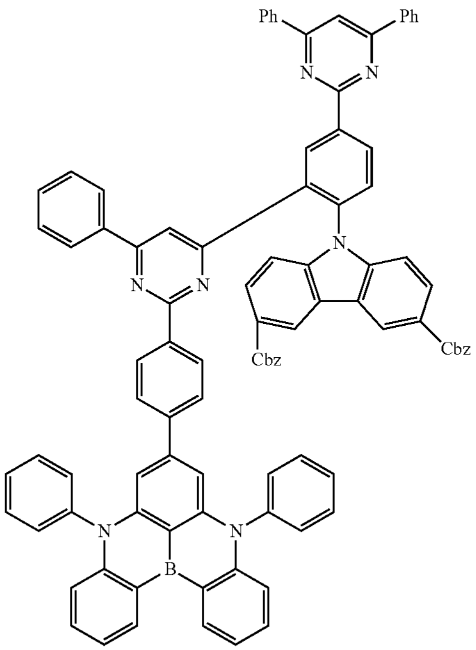
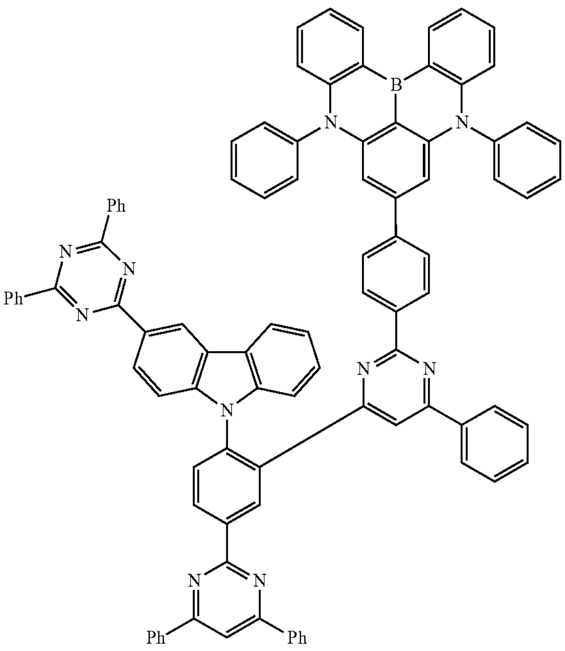
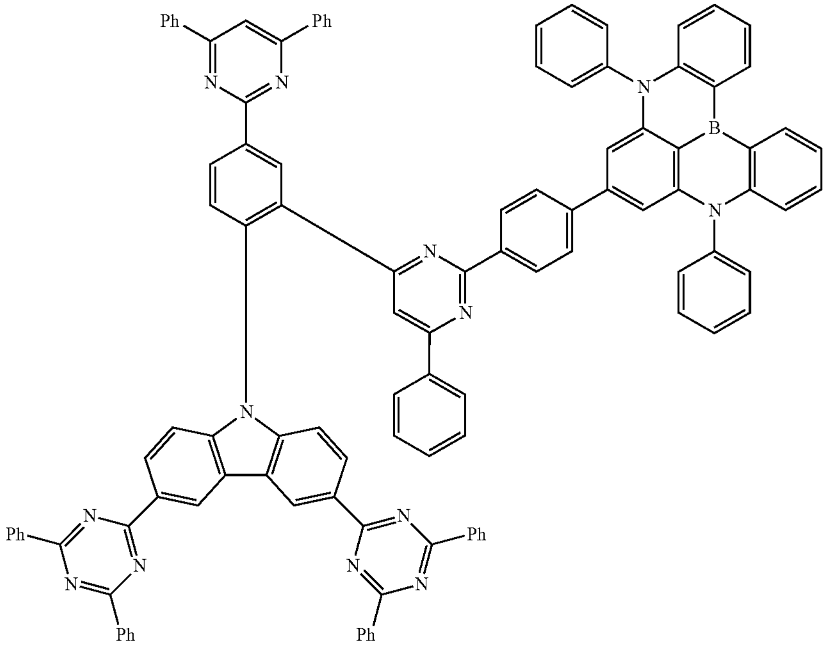

-continued

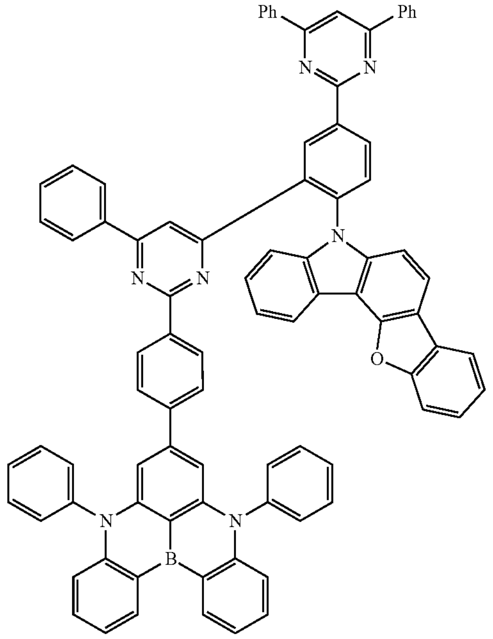

The invention claimed is:

1. An organic molecule represented by Formula A:

Formula A

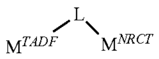

wherein

L represents a divalent bridging unit that links $M^{TADF}$ and $M^{NRCT}$ and is linked to $M^{TADF}$ and to $M^{NRCT}$ via a single bond each, and wherein $M^{TADF}$ consists of a first chemical moiety consisting of a structure according to Formula I, Formula I

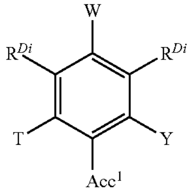

and one second chemical moiety consisting of a structure according to Formula II, Formula II

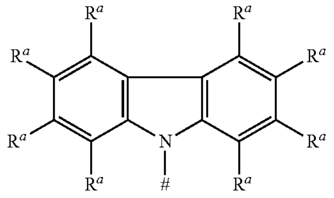

wherein the first chemical moiety is linked to the second chemical moiety via a single bond;

T is selected from the group consisting of:

hydrogen (H), deuterium (D), $R^{TADF1}$, and the binding site of a single bond linking the first chemical moiety to the second chemical moiety, W is selected from the group consisting of:

the binding site of a single bond linking the first chemical moiety to the second chemical moiety, the binding site of a single bond linking the TADF moiety $M^{TADF}$ to the bridging unit L, H, D, and $R^{TADF1}$:

Y is selected from the group consisting of H, D, $R^{TADF1}$, and the binding site of a single bond linking the TADF moiety $M^{TADF}$ to the bridging unit L;

$Acc^1$ is selected from the group consisting of:

triazinyl, which is optionally substituted with one or more substituents $R^6$;

CN, $CF_3$,

Ph, which is optionally substituted with one or more substituents selected from the group consisting of CN, $CF_3$ and F;

pyridyl, which is optionally substituted with one or more substituents $R^6$; and pyrimidyl, which is optionally substituted with one or more substituents $R^6$;

# represents the binding site of a single bond linking the second chemical moieties to the first chemical moiety;

$R^{Di}$ is selected from the group consisting of the binding site of the single bond linking the TADF moiety $M^{TADF}$ to the bridging unit L, H, D, Me, $^{i}$Pr, $^{t}$Bu, $SiPh_3$, CN, $CF_3$, Ph, which is optionally substituted with one or more substituents independently from each other selected from the group consisting of Me, $^{i}$Pr, $^{t}$Bu, and Ph, and a third chemical moiety consisting of a structure of Formula Q:

Formula Q

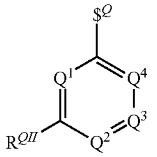

wherein $Q^1$ is selected from the group consisting of N and C—$R^{QI}$;

$Q^2$ is selected from the group consisting of N and C—$R^{QIII}$;

$Q^3$ is selected from the group consisting of N and C—$R^{QIV}$;

$Q^4$ is selected from the group consisting of N and C—$R^{QV}$; and $\$^Q$ represents the binding site of a single bond linking the third chemical moiety to the first chemical moiety;

$R^{QI}$ is selected from the group consisting of:

H,

D,

CN, $CF_3$, $SiPh_3$,

F,

Ph, and a fourth chemical moiety comprising or consisting of a structure of Formula IIQ:

Formula IIQ

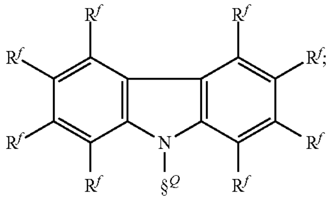

§ $^{Q}$ represents the binding site of a single bond linking the fourth chemical moiety to the third chemical moiety;

$R^{QII}$ is selected from the group consisting of:

the binding site of the single bond linking the TADF moiety $M^{TADF}$ to the bridging unit L, H, D, Me, $^{i}$Pr, $^{t}$Bu, $SiPh_3$, and Ph, which is optionally substituted with one or more substituents independently from each other selected from the group consisting of Me, $^{i}$Pr, $^{t}$Bu, and Ph;

$R^{QIII}$ is selected from the group consisting of the binding site of the single bond linking the TADF moiety $M^{TADF}$ to the bridging unit L,

H,

D,

CN, $CF_3$, $SiPh_3$,

F,

Ph, which is optionally substituted with one or more substituents $R^6$;

triazinyl, which is optionally substituted with one or more substituents $R^6$;

pyridyl, which is optionally substituted with one or more substituents $R^6$; and pyrimidyl, which is optionally substituted with one or more substituents $R^6$;

$R^{QIV}$ is selected from the group consisting of:

the binding site of the single bond linking the TADF moiety $M^{TADF}$ to the bridging unit L,

H,

D,

CN, $CF_3$, $SiPh_3$,

F,

Ph, which is optionally substituted with one or more substituents $R^6$;

triazinyl, which is optionally substituted with one or more substituents $R^6$;

pyridyl, which is optionally substituted with one or more substituents $R^6$; and pyrimidyl, which is optionally substituted with one or more substituents $R^6$;

$R^{QV}$ is selected from the group consisting of:

the binding site of the single bond linking the TADF moiety $M^{TADF}$ to the bridging unit L, H, D, Me, $^{i}$Pr, $^{t}$Bu, $SiPh_3$, and Ph, which is optionally substituted with one or more substituents independently from each other selected from the group consisting of Me, $^{i}$Pr, $^{t}$Bu, and Ph;

wherein in case one $R^{Di}$ represents the third chemical moiety comprising or consisting of a structure of Formula Q, the other $R^{Di}$ is selected from the group consisting of H, D, Me, $^{i}$Pr, $^{t}$Bu, $SiPh_3$, Ph, which is optionally substituted with one or more substituents independently from each other selected from the group consisting of Me, $^{i}$Pr, $^{t}$Bu, and Ph, and the binding site of the single bond linking the TADF moiety $M^{TADF}$ to the bridging unit L;

$R^{TADF1}$ is selected from the group consisting of:

Me, $^{i}$Pr, $^{t}$Bu, $SiPh_3$, and

Ph, which is optionally substituted with one or more substituents independently from each other selected from the group consisting of Me, $^{i}$Pr, $^{t}$Bu, and Ph;

$R^a$ at each occurrence independently from another selected from the group consisting of

H,

D, $N(R^5)_2$, $OR^5$, $Si(R^5)_3$, $B(OR^5)_2$ $OSO_2R^5$ $CF_3$,

CN,

F,

Br,

I, $C_1$-$C_{40}$-alkyl, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_1$-$C_{40}$-alkoxy, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_2$-$C_{40}$-alkenyl, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_2$-$C_{40}$-alkynyl, which is optionally substituted with one or more substituents $R^5$; and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$;

$R^5$ is at each occurrence independently from another selected from the group consisting of H,

D, $N(R^6)_2$, $OR^6$, $Si(R^6)_3$, $B(OR^6)_2$, $OSO_2R^6$, $CF_3$,

CN,

F,

Br,

I, $C_1$-$C_{40}$-alkyl, which is optionally substituted with one or more substituents $R^6$ and wherein one $CH_2$-group or more than one non-adjacent $CH_2$-groups are optionally substituted by $R^6C{=}CR^6$, $C{\equiv}C$, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S or $CONR^6$;

$C_1$-$C_{40}$-alkoxy, which is optionally substituted with one or more substituents $R^6$ and wherein one $CH_2$-group or more than one non-adjacent $CH_2$-groups are optionally substituted by $R^6C{=}CR^6$, $C{\equiv}C$, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S or $CONR^6$;

$C_1$-$C_{40}$-thioalkoxy, which is optionally substituted with one or more substituents $R^6$ and wherein one $CH_2$-group or more than one non-adjacent $CH_2$-groups are optionally substituted by $R^6C{=}CR^6$, $C{\equiv}C$, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S or $CONR^6$;

$C_2$-$C_{40}$-alkenyl, which is optionally substituted with one or more substituents $R^6$ and wherein one $CH_2$-group or more than one non-adjacent $CH_2$-groups are optionally substituted by $R^6C{=}CR^6$, $C{\equiv}C$, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S or $CONR^6$;

$C_2$-$C_{40}$-alkynyl, which is optionally substituted with one or more substituents $R^6$ and wherein one $CH_2$-group or more than one non-adjacent $CH_2$-groups are optionally substituted by $R^6C{=}CR^6$, $C{\equiv}C$, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S or $CONR^6$;

$C_6$-$C_{60}$-aryl, which is optionally substituted with one or more substituents $R^6$; and $C_3$-$C_{57}$-heteroaryl, which is optionally substituted with one or more substituents $R^6$;

$R^6$ is at each occurrence independently from another selected from the group consisting of $C_6$-$C_{18}$-aryl, which is optionally substituted with one or more $C_1$-$C_5$-alkyl substituents;

hydrogen, deuterium,

OPh, $CF_3$,

CN,

F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_3$-$C_{17}$-heteroaryl, which is optionally substituted with one or more $C_1$-$C_5$-alkyl substituents;

$N(C_6$-$C_{18}$-aryl)$(C_6$-$C_{18}$-aryl);

$N(C_3$-$C_{17}$-heteroaryl)$(C_3$-$C_{17}$-heteroaryl); and $N(C_3$-$C_{17}$-heteroaryl)$(C_6$-$C_{18}$-aryl);

wherein two or more of the substituents $R^a$ and/or $R^5$ independently from each other optionally form a mono- or polycyclic, (hetero)aliphatic, (hetero)aromatic and/or benzo-fused ring system with one or more substituents $R^a$ or $R^5$;

$R^f$ is at each occurrence independently from another selected from the group consisting of H,

D, $N(R^{5f})_2$, $OR^{5f}$, $Si(R^{5f})_3$,
$B(OR^{5f})_2$,
$OSO_2R^{5f}$,
$CF_3$,
CN,
F,
Br
I,
$C_1$-$C_{40}$-alkyl,
which is optionally substituted with one or more substituents $R^{5f}$ and
wherein one $CH_2$-group or more than one non-adjacent $CH_2$-groups are optionally substituted by $R^{5f}C{=}CR^{5f}$, C≡C, $Si(R^{5f})_2$, $Ge(R^{5f})_2$, $Sn(R^{5f})_2$, C═O, C═S, C═Se, C═$NR^{5f}$, P(═O)($R^{5f}$), SO, $SO_2$, $NR^{5f}$, O, S or $CONR^{5f}$,
$C_1$-$C_{40}$-alkoxy,
which is optionally substituted with one or more substituents $R^{5f}$ and
wherein one $CH_2$-group or more than one non-adjacent $CH_2$-groups are optionally substituted by $R^{5f}C{=}CR^{5f}$, C≡C, $Si(R^{5f})_2$, $Ge(R^{5f})_2$, $Sn(R^{5f})_2$, C═O, C═S, C═Se, C═$NR^{5f}$, P(═O)($R^{5f}$), SO, $SO_2$, $NR^{5f}$, O, S or $CONR^{5f}$;
$C_1$-$C_{40}$-thioalkoxy,
which is optionally substituted with one or more substituents $R^{5f}$ and
wherein one $CH_2$-group or more than one non-adjacent $CH_2$-groups are optionally substituted by $R^{5}C{=}CR^{5f}$, C≡C, $Si(R^{5f})_2$, $Ge(R^{5f})_2$, $Sn(R^{5f})_2$, C═O, C═S, C═Se, C═$NR^{5f}$, P(═O)($R^{5f}$), SO, $SO_2$, $NR^{5f}$, O, S or $CONR^{5f}$,
$C_2$-$C_{40}$-alkenyl,
which is optionally substituted with one or more substituents $R^{5f}$ and
wherein one $CH_2$-group or more than one non-adjacent $CH_2$-groups are optionally substituted by $R^{5f}C{=}CR^{5f}$, C≡C, $Si(R^{5f})_2$, $Ge(R^{5f})_2$, $Sn(R^{5f})_2$, C═O, C═S, C═Se, C═$NR^{5f}$, P(═O)($R^{5f}$), SO, $SO_2$, $NR^{5f}$, O, S or $CONR^{5f}$,
$C_2$-$C_{40}$-alkynyl,
which is optionally substituted with one or more substituents $R^{5f}$ and
wherein one $CH_2$-group or more than one non-adjacent $CH_2$-groups are optionally substituted by $R^{5f}C{=}CR^{5f}$, C≡C, $Si(R^{5f})_2$, $Ge(R^{5f})_2$, $Sn(R^{5f})_2$, C═O, C═S, C═Se, C═$NR^{5f}$, P(═O)($R^{5f}$), SO, $SO_2$, $NR^{5f}$, O, S or $CONR^{5f}$;
$C_6$-$C_{60}$-aryl,
which is optionally substituted with one or more substituents $R^{5f}$; and
$C_3$-$C_{57}$-heteroaryl,
which is optionally substituted with one or more substituents $R^{5f}$;
$R^{5f}$ is at each occurrence independently from another selected from the group consisting of H,
D,
$N(R^{6f})_2$,
$OR^{6f}$,
$Si(R^{6f})_3$,
$B(OR^{6f})_2$,
$OSO_2R^{6f}$,
$CF_3$,
CN,
F,
Br
I,
$C_1$-$C_{40}$-alkyl,
which is optionally substituted with one or more substituents $R^{6f}$ and
wherein one $CH_2$-group or more than one non-adjacent $CH_2$-groups are optionally substituted by $R^{6f}C{=}CR^{6f}$, C≡C, $Si(R^{6f})_2$, $Ge(R^{6f})_2$, $Sn(R^{6f})_2$, C═O, C═S, C═Se, C═$NR^{6f}$, P(═O)($R^{6f}$), SO, $SO_2$, $NR^{6f}$, O, S or $CONR^{6f}$,
$C_1$-$C_{40}$-alkoxy,
which is optionally substituted with one or more substituents $R^{6f}$ and
wherein one $CH_2$-group or more than one non-adjacent $CH_2$-groups are optionally substituted by $R^{6f}C{=}CR^{6f}$, C≡C, $Si(R^{6f})_2$, $Ge(R^{6f})_2$, $Sn(R^{6f})_2$, C═O, C═S, C═Se, C═$NR^{6f}$, P(═O)($R^{6f}$), SO, $SO_2$, $NR^{6f}$, O, S or $CONR^{6f}$,
$C_1$-$C_{40}$-thioalkoxy,
which is optionally substituted with one or more substituents $R^{6f}$ and
wherein one $CH_2$-group or more than one non-adjacent $CH_2$-groups are optionally substituted by $R^{6f}C{=}CR^{6f}$, C≡C, $Si(R^{6f})_2$, $Ge(R^{6f})_2$, $Sn(R^{6f})_2$, C═O, C═S, C═Se, C═$NR^{6f}$, P(═O)($R^{6f}$), SO, $SO_2$, $NR^{6f}$, O, S or $CONR^{6f}$,
$C_2$-$C_{40}$-alkenyl,
which is optionally substituted with one or more substituents $R^{6f}$ and
wherein one $CH_2$-group or more than one non-adjacent $CH_2$-groups are optionally substituted by $R^{6f}C{=}CR^{6f}$, C≡C, $Si(R^{6f})_2$, $Ge(R^{6f})_2$, $Sn(R^{6f})_2$, C═O, C═S, C═Se, C═$NR^{6f}$, P(═O)($R^{6f}$), SO, $SO_2$, $NR^{6f}$, O, S or $CONR^{6f}$;
$C_2$-$C_{40}$-alkynyl,
which is optionally substituted with one or more substituents $R^{6f}$ and
wherein one $CH_2$-group or more than one non-adjacent $CH_2$-groups are optionally substituted by $R^{6f}C{=}CR^{6f}$, C≡C, $Si(R^{6f})_2$, $Ge(R^{6f})_2$, $Sn(R^{6f})_2$, C═O, C═S, C═Se, C═$NR^{6f}$, P(═O)($R^{6f}$), SO, $SO_2$, $NR^{6f}$, O, S or $CONR^{6f}$;
$C_6$-$C_{60}$-aryl,
which is optionally substituted with one or more substituents $R^{6f}$; and
$C_3$-$C_{57}$-heteroaryl,
which is optionally substituted with one or more substituents $R^{6f}$;
$R^{6f}$ is at each occurrence independently from another selected from the group consisting of H,
D,
OPh,
$CF_3$,
CN,
F,
$C_1$-$C_5$-alkyl,
wherein optionally one or more hydrogen atoms are independently from each other substituted by deuterium, CN, $CF_3$, or F;
$C_1$-$C_5$-alkoxy,
wherein optionally one or more hydrogen atoms are independently from each other substituted by deuterium, CN, $CF_3$, or F;
$C_1$-$C_5$-thioalkoxy,
wherein optionally one or more hydrogen atoms are independently from each other substituted by deuterium, CN, $CF_3$, or F;
$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

N($C_6$-$C_{18}$-aryl)($C_6$-$C_{18}$-aryl);

N($C_3$-$C_{17}$-heteroaryl)($C_3$-$C_{17}$-heteroaryl); and

N($C_3$-$C_{17}$-heteroaryl)($C_6$-$C_{18}$-aryl);

wherein two or more of the substituents $R^f$ and/or $R^{5f}$ independently from each other optionally form a mono- or polycyclic, (hetero)aliphatic, (hetero)aromatic and/or benzo-fused ring system with one or more substituents $R^f$ or $R^{5f}$, wherein $M^{TADF}$ contains exactly one binding site of the single bond linking the TADF moiety $M^{TADF}$ to the bridging unit L and wherein one selected from the group consisting of T, W, and Y represents the binding site of a single bond linking the first chemical moiety and the second chemical moiety, and wherein $M^{NRCT}$ consists of a structure according to Formula NRCT I:

Formula NRCT I

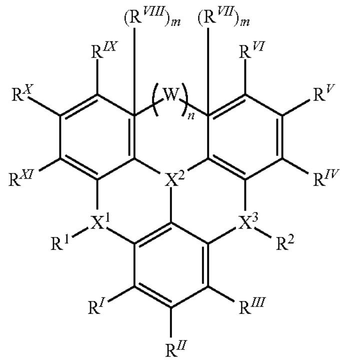

wherein n is 0 or 1;

m=1-n;

$X^1$ is N or B;

$X^2$ is N or B;

$X^3$ is N or B;

W, if present, is selected from the group consisting of $Si(R^{NRCT3})_2$, $C(R^{NRCT3})_2$ and $BR^{NRCT3}$;

each of $R^1$, $R^2$ and $R^{NRCT3}$ is independently from each other selected from the group consisting of:

$C_6$-$C_{60}$-aryl, which is optionally substituted with one or more substituents $R^{NRCT6}$; and $C_1$-$C_5$-alkyl, which is optionally substituted with one or more substituents $R^{NRCT6}$; and $C_3$-$C_{57}$-heteroaryl, which is optionally substituted with one or more substituents $R^{NRCT6}$;

wherein at least one of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is a binding site of a single bond linking the NRCT emitter moiety $M^{NRCT}$ to the bridging unit L;

the further residues $R^I$, $R^{II}$, $R^{III}$, $R^{IV}$, $R^V$, $R^{VI}$, $R^{IX}$, $R^X$, and $R^{XI}$ and, as far as present, $R^{VII}$ and $R^{VIII}$, are each independently from another selected from the group consisting of:

hydrogen, a further binding site of a single bond linking the NRCT emitter moiety $M^{NRCT}$ to the bridging unit L, deuterium, $N(R^{NRCT5})_2$, $OR^{NRCT5}$, $Si(R^{NRCT5})_3$, $B(OR^{NRCT5})_2$, $OSO_2R^{NRCT5}$, $CF_3$,

CN, halogen, $C_1$-$C_{40}$-alkyl, which is optionally substituted with one or more substituents $R^{NRCT5}$ and wherein one $CH_2$-group or more than one non-adjacent $CH_2$-groups are each optionally substituted by $R^{NRCT5}C{=}CR^{NRCT5}$, C≡C, $Si(R^{NRCT5})_2$, $Ge(R^{NRCT5})_2$, $Sn(R^{NRCT5})_2$, C=O, C=S, C=Se, $C{=}NR^{NRCT5}$, $P({=}O)(R^{NRCT5})$, SO, $SO_2$, $NR^{NRCT5}$, O, S or $CONR^{NRCT5}$;

$C_1$-$C_{40}$-alkoxy, which is optionally substituted with one or more substituents $R^{NRCT5}$ and wherein one $CH_2$-group or more than one non-adjacent $CH_2$-groups are each optionally substituted by $R^{NRCT5}C{=}CR^{NRCT5}$, C≡C, $Si(R^{NRCT5})_2$, $Ge(R^{NRCT5})_2$, $Sn(R^{NRCT5})_2$, C=O, C=S, C=Se, $C{=}NR^{NRCT5}$, $P({=}O)(R^{NRCT5})$, SO, $SO_2$, $NR^{NRCT5}$, O, S or $CONR^{NRCT5}$;

$C_1$-$C_{40}$-thioalkoxy, which is optionally substituted with one or more substituents $R^{NRCT5}$ and wherein one $CH_2$-group or more than one non-adjacent $CH_2$-groups are each optionally substituted by $R^{NRCT5}C{=}CR^{NRCT5}$, C≡C, $Si(R^{NRCT5})_2$, $Ge(R^{NRCT5})_2$, $Sn(R^{NRCT5})_2$, C=O, C=S, C=Se, $C{=}NR^{NRCT5}$, $P({=}O)(R^{NRCT5})$, SO, $SO_2$, $NR^{NRCT5}$, O, S or $CONR^{NRCT5}$;

$C_2$-$C_{40}$-alkenyl, which is optionally substituted with one or more substituents $R^{NRCT5}$ and wherein one $CH_2$-group or more than one non-adjacent $CH_2$-groups are each optionally substituted by $R^{NRCT5}C{=}CR^{NRCT5}$, C≡C, $Si(R^{NRCT5})_2$, $Ge(R^{NRCT5})_2$, $Sn(R^{NRCT5})_2$, C=O, C=S, C=Se, $C{=}NR^{NRCT5}$, $P({=}O)(R^{NRCT5})$, SO, $SO_2$, $NR^{NRCT5}$, O, S or $CONR^{NRCT5}$;

$C_2$-$C_{40}$-alkynyl, which is optionally substituted with one or more substituents $R^{NRCT5}$ and wherein one $CH_2$-group or more than one non-adjacent $CH_2$-groups are each optionally substituted by $R^{NRCT5}C{=}CR^{NRCT5}$, C≡C, $Si(R^{NRCT5})_2$, $Ge(R^{NRCT5})_2$, $Sn(R^{NRCT5})_2$, C=O, C=S, C=Se, $C{=}NR^{NRCT5}$, $P({=}O)(R^{NRCT5})$, SO, $SO_2$, $NR^{NRCT5}$, O, S or $CONR^{NRCT5}$;

$C_6$-$C_{60}$-aryl, which is optionally substituted with one or more substituents $R^{NRCT5}$, and $C_3$-$C_{57}$-heteroaryl, which is optionally substituted with one or more substituents $R^{NRCT5}$;

$R^{NRCT5}$ is at each occurrence independently from another selected from the group consisting of: hydrogen, deuterium, OPh, $CF_3$, CN, F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl)$(C_6$-$C_{18}$-aryl), $N(C_3$-$C_{17}$-heteroaryl)$(C_3$-$C_{17}$-heteroaryl); and $N(C_3$-$C_{17}$-heteroaryl)$(C_6$-$C_{18}$-aryl);

$R^{NRCT6}$ is at each occurrence independently from another selected from the group consisting of hydrogen, deuterium, OPh, $CF_3$, CN, F, the binding site of a single bond linking $M^{NRCT}$ to the bridging unit L, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl)$(C_6$-$C_{18}$-aryl), $N(C_3$-$C_{17}$-heteroaryl)$(C_3$-$C_{17}$-heteroaryl); and $N(C_3$-$C_{17}$-heteroaryl)$(C_6$-$C_{18}$-aryl);

wherein two or more of the substituents selected from the group consisting of $R^1$, $R^2$, $R^I$, $R^{II}$, $R^{III}$, $R^{IV}$, $R^V$, $R^{VI}$, $R^{IX}$, $R^X$, and $R^{XI}$ and, as far as present, $R^{VII}$ and $R^{VIII}$ that are positioned adjacent to another may each form a mono- or polycyclic, (hetero)aliphatic, (hetero)aromatic and/or benzo-fused ring system with another, may form a ring system and/or $R^2$ and $R^{IV}$ may form a ring system;

wherein at least one of $X^1$, $X^2$ and $X^3$ is B and at least one of $X^1$, $X^2$ and $X^3$ is N;

and wherein exactly one more of the substituents selected from the group consisting of $R^I$, $R^{II}$, $R^{III}$, $R^{IV}$, $R^V$, $R^{VI}$, $R^{IX}$, $R^X$, and $R^{XI}$ and, as far as present, $R^{VII}$ and $R^{VIII}$ represents the binding site of a single bond linking the NRCT emitter moiety $M^{NRCT}$ to the bridging unit L.

2. The organic molecule according to claim 1, wherein L comprises or consists of one or more consecutively linked divalent moieties selected from the group consisting of $C_6$-$C_{60}$-arylene, which is optionally substituted with one or more substituents $R^L$;

$C_3$-$C_{57}$-heteroarylene, which is optionally substituted with one or more substituents $R^L$;

$R^LSi(R^L_2)$;

$Si(R^L_2)R^L$;

$Si(R^L_2)$; and $R^LSi(R^L_2)R^L$;

wherein $R^L$ is at each occurrence independently from another selected from the group consisting of Ph, which is optionally substituted with one or more substituents independently from each other selected from the group consisting of $C_1$-$C_4$ alkyl, $C_1$-$C_4$ haloalkyl, CN, $CF_3$ and Ph;

pyridinyl or pyridinylene, which is optionally substituted with one or more substituents independently from each other selected from the group consisting of $C_1$-$C_4$ alkyl, $C_1$-$C_4$ haloalkyl, CN, $CF_3$ or Ph;

pyrimidinyl or pyrimidinylene, which is optionally substituted with one or more substituents independently from each other selected from the group consisting of $C_1$-$C_4$ alkyl, $C_1$-$C_4$ haloalkyl, CN, $CF_3$ and Ph;

carbazolyl or carbazolylene, which is optionally substituted with one or more substituents independently from each other selected from the group consisting of $C_1$-$C_4$ alkyl, $C_1$-$C_4$ haloalkyl, CN, $CF_3$ and Ph;

triazinyl or triazinylene, which is optionally substituted with one or more substituents independently from each other selected from the group consisting of Me, $C_1$-$C_4$ alkyl, $C_1$-$C_4$ haloalkyl, CN, $CF_3$ and Ph; and $N(Ph)_2$.

3. The organic molecule according to claim 1, wherein L is selected from the group consisting of:

$C_6$-$C_{60}$-arylene, which is optionally substituted with one or more substituents $R^L$;

$C_3$-$C_{57}$-heteroarylene, which is optionally substituted with one or more substituents $R^L$;

$C_6$-$C_{60}$-arylene-$C_3$-$C_{57}$-heteroarylene, which is optionally substituted with one or more substituents $R^L$;

$C_3$-$C_{57}$-heteroarylene-$C_6$-$C_{60}$-arylene, which is optionally substituted with one or more substituents $R^L$;

$C_6$-$C_{60}$-arylene-$C_6$-$C_{60}$-arylene, which is optionally substituted with one or more substituents $R^L$;

$C_3$-$C_{57}$-heteroarylene-$C_3$-$C_{57}$-heteroarylene, which is optionally substituted with one or more substituents $R^L$;

$C_6$-$C_{60}$-arylene-$C_3$-$C_{57}$-heteroarylene-$C_6$-$C_{60}$-arylene, which is optionally substituted with one or more substituents $R^L$;

$C_3$-$C_{57}$-heteroarylene-$C_6$-$C_{60}$-arylene-$C_3$-$C_{57}$-heteroarylene, which is optionally substituted with one or more substituents $R^L$;

$C_6$-$C_{60}$-arylene-$C_6$-$C_{60}$-arylene-$C_6$-$C_{60}$-arylene, which is optionally substituted with one or more substituents $R^L$;

$C_3$-$C_{57}$-heteroarylene-$C_3$-$C_{57}$-heteroarylene-$C_3$-$C_{57}$-heteroarylene, which is optionally substituted with one or more substituents $R^L$;

$R^LSi(R^L{}_2)$;

$Si(R^L{}_2)R^L$;

$Si(R^L{}_2)$; and $R^LSi(R^L{}_2)R^L$—;

wherein $R^L$ is at each occurrence independently from another selected from the group consisting of:

Ph, which is optionally substituted with one or more substituents independently from each other selected from the group consisting of Me, $^i$Pr, $^t$Bu, CN, $CF_3$ and Ph;

Me, $^i$Pr, $^t$Bu, CN, $CF_3$, pyridinyl or pyridinylene, which is optionally substituted with one or more substituents independently from each other selected from the group consisting of Me, $^i$Pr, $^t$Bu, CN, $CF_3$ and Ph;

pyrimidinyl or pyrimidinylene, which is optionally substituted with one or more substituents independently from each other selected from the group consisting of Me, $^i$Pr, $^t$Bu, CN, $CF_3$ and Ph;

carbazolyl or carbazolylene, which is optionally substituted with one or more substituents independently from each other selected from the group consisting of Me, $^i$Pr, $^t$Bu, CN, $CF_3$ and Ph;

triazinyl or triazinylene, which is optionally substituted with one or more substituents independently from each other selected from the group consisting of Me, $^i$Pr, $^t$Bu, CN, $CF_3$, and Ph;

and $N(Ph)_2$.

4. The organic molecule according to claim 1, wherein L is selected from the group consisting of structures of Formula L1 to L46:

Formula L1

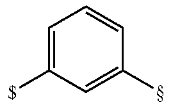

Formula L2

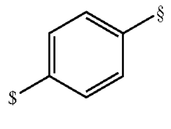

Formula L3

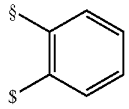

Formula L4

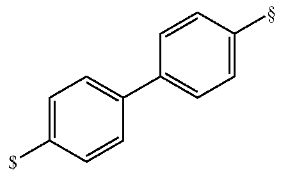

-continued

Formula L5

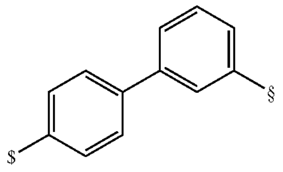

Formula L6

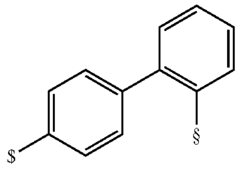

Formula L7

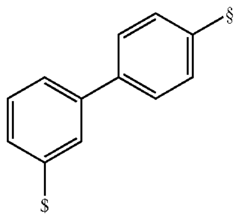

Formula L8

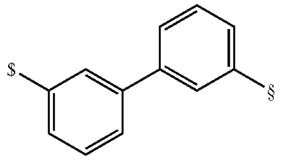

Formula L9

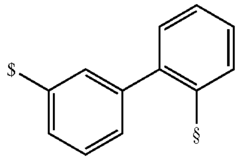

Formula L10

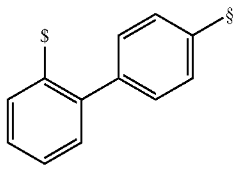

Formula L11

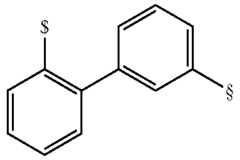

Formula L12

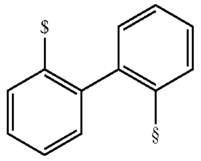

-continued
Formula L13
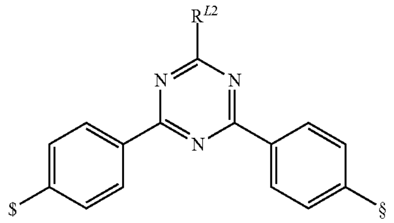
Formula L14
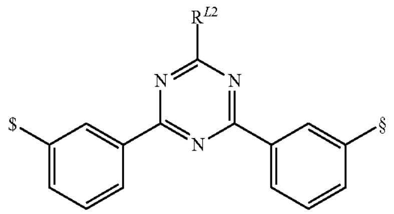
Formula L15
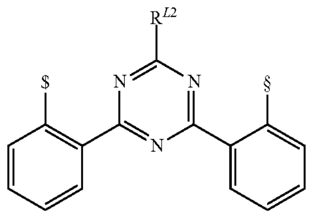
Formula L16
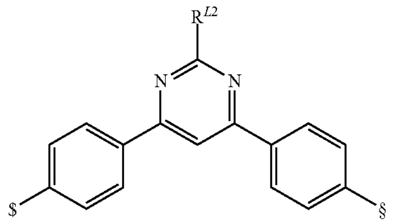
Formula L17
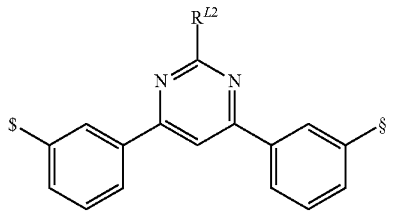
Formula L18
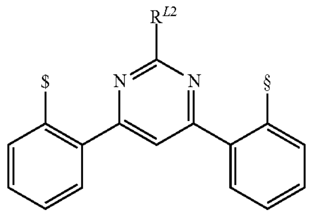
Formula L19
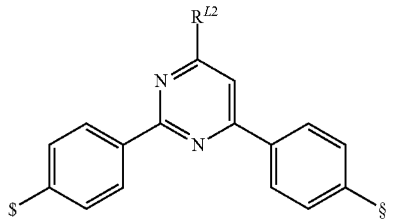
-continued
Formula L20
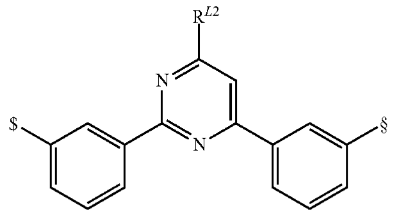
Formula L21
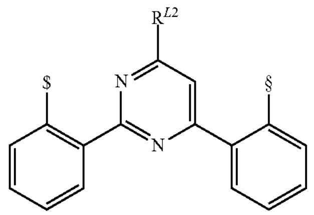
Formula L22
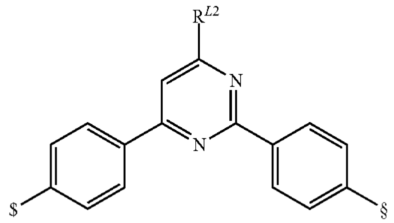
Formula L23
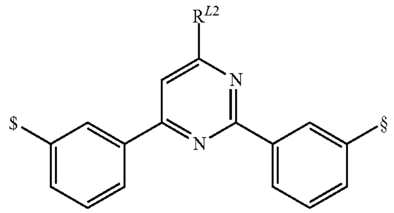
Formula L24
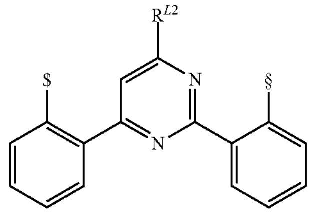
Formula L25
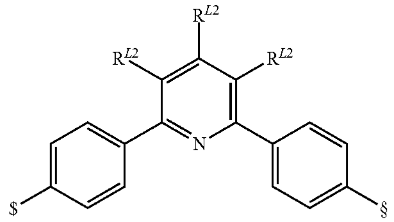
Formula L26
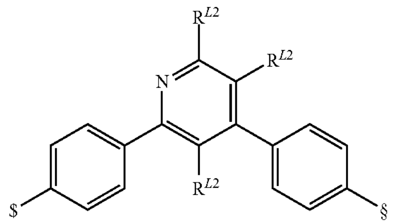

-continued
Formula L27
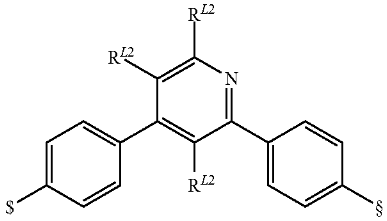
Formula L28
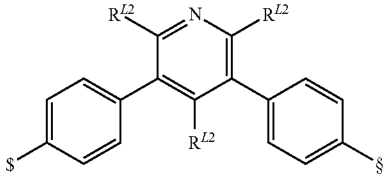
Formula L29
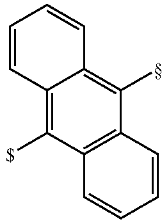
Formula L30
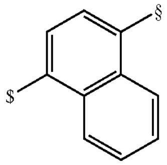
Formula L31
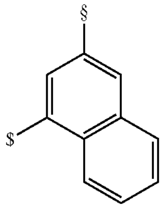
Formula L32
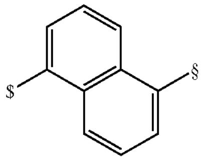
Formula L33
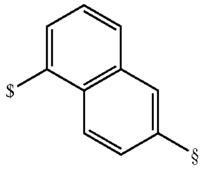
Formula L34
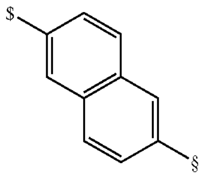
-continued
Formula L35
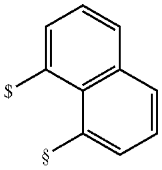
Formula L36
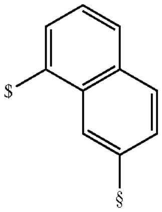
Formula L37
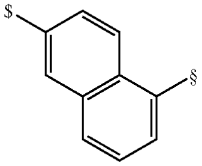
Formula L38
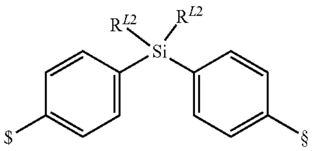
Formula L39
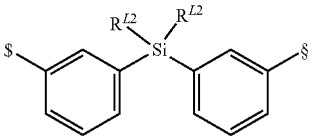
Formula L40
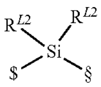
Formula L41
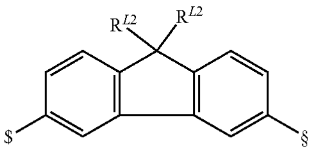
Formula L42
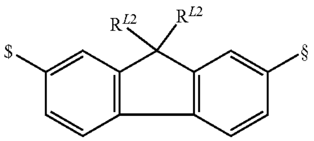
Formula L43
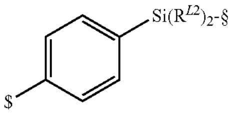
Formula L44
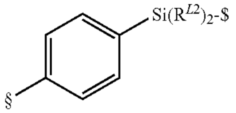

-continued

Formula L45

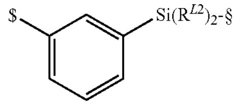

Formula L46

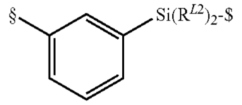

wherein $ represents the binding site of the single bond linking L and $M^{TADF}$ and § represents the binding site of the single bond linking L and $M^{NRCT}$;

and $R^{L2}$ is at each occurrence independently selected from the group consisting of H, deuterium, Me, $^{i}$Pr, $^{t}$Bu, Ph and pyridyl.

5. The organic molecule according to claim 1, wherein $X^1$ and $X^3$ each are N and $X^2$ is B.

6. The organic molecule according to claim 1, wherein $X^1$ and $X^3$ each are B and $X^2$ is N.

7. The organic molecule according to claim 1, wherein n=0.

8. The organic molecule according to claim 1, wherein each of $R^{I}$, $R^{II}$, $R^{III}$, $R^{IV}$, $R^{V}$, $R^{VI}$, $R^{IX}$, $R^{X}$, and $R^{XI}$ and, as far as present, $R^{VII}$ and $R^{VIII}$, is independently from another selected from the group consisting of:

a binding site of the single bond linking the NRCT emitter moiety $M^{NRCT}$ to the bridging unit L;

hydrogen, deuterium, halogen,

Me, $^{i}$Pr, $^{t}$Bu,

CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, carbazolyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$; and $R^1$ and $R^2$ is each independently from each other selected from the group consisting of $C_1$-$C_5$-alkyl, which is optionally substituted with one or more substituents $R^{NRCT6}$;

$C_6$-$C_{30}$-aryl, which is optionally substituted with one or more substituents $R^{NRCT6}$; and $C_3$-$C_{30}$-heteroaryl, which is optionally substituted with one or more substituents $R^{NRCT6}$;

and wherein exactly one more of the substituents selected from the group consisting of $R^{I}$, $R^{II}$, $R^{II}$, $R^{IV}$, $R^{V}$, $R^{VI}$, $R^{IX}$, $R^{X}$, and $R^{XI}$ and, as far as present, $R^{VII}$ and $R^{VIII}$ represents the binding site of a single bond linking the NRCT emitter moiety $M^{NRCT}$ to the bridging unit L.

9. The organic molecule according to claim 1, wherein $R^{I}$ or $R^{II}$ represents the binding site of the single bond linking the NRCT emitter moiety $M^{NRCT}$ to the bridging unit L.

10. The organic molecule according to claim 1, wherein the first chemical moiety consists of a structure of Formula Ia:

Formula Ia

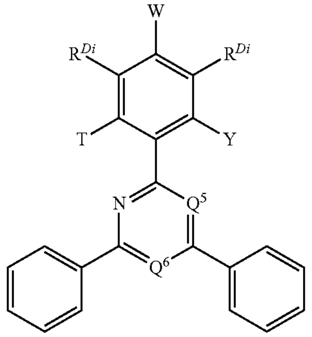

wherein $R^{Di}$, T, W and Y are defined as in claim 1;

$Q^5$ is selected from the group consisting of N and C—H;

$Q^6$ is selected from the group consisting of N and C—H;

wherein at least one of $Q^5$ and $Q^6$ is N; and wherein exactly one substituent selected from the group consisting of T and W represents the binding site of a single bond linking the first chemical moiety and the second chemical moiety.

11. The organic molecule according to claim 1, wherein the second chemical moiety comprises or consists of a structure of Formula IIb:

Formula IIb

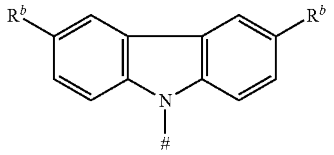

wherein $R^b$ is at each occurrence independently from another selected from the group consisting of hydrogen, deuterium, $N(R^5)_2$, $OR^5$, $Si(R^5)_3$, $B(OR^5)_2$, $OSO_2R^5$, $CF_3$, CN, F, Br, I, $C_1$-$C_{40}$-alkyl, which is optionally substituted with one or more substituents $R^5$ and wherein one $CH_2$-group or more than one non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-alkoxy, which is optionally substituted with one or more substituents $R^5$ and wherein one $CH_2$-group or more than one non-adjacent $CH_2$-groups are optionally substituted by $R^5C{=}CR^5$, $C{\equiv}C$, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_1$-$C_{40}$-thioalkoxy, which is optionally substituted with one or more substituents $R^5$ and wherein one $CH_2$-group or more than one non-adjacent $CH_2$-groups are optionally substituted by $R^5C$═$CR^5$, $C{\equiv}C$, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_2$-$C_{40}$-alkenyl, which is optionally substituted with one or more substituents $R^5$ and wherein one $CH_2$-group or more than one non-adjacent $CH_2$-groups are optionally substituted by $R^5C$═$CR^5$, $C{\equiv}C$, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_2$-$C_{40}$-alkynyl, which is optionally substituted with one or more substituents $R^5$ and wherein one $CH_2$-group or more than one non-adjacent $CH_2$-groups are optionally substituted by $R^5C$═$CR^5$, $C{\equiv}C$, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$.

12. The organic molecule according to claim 1, wherein the second chemical moiety comprises or consists of a structure of formula IIc:

Formula IIc

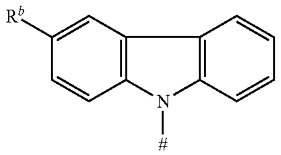

wherein $R^b$ is at each occurrence independently from another selected from the group consisting of hydrogen, deuterium, $N(R^5)_2$, $OR^5$, $Si(R^5)_3$, $B(OR^5)_2$, $OSO_2R^5$, $CF_3$, CN, F, Br, I, $C_1$-$C_{40}$-alkyl, which is optionally substituted with one or more substituents $R^5$ and wherein one $CH_2$-group or more than one non-adjacent $CH_2$-groups are optionally substituted by $R^5C$═$CR^5$, $C{\equiv}C$, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_1$-$C_{40}$-alkoxy, which is optionally substituted with one or more substituents $R^5$ and wherein one $CH_2$-group or more than one non-adjacent $CH_2$-groups are optionally substituted by $R^5C$═$CR^5$, $C{\equiv}C$, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_1$-$C_{40}$-thioalkoxy, which is optionally substituted with one or more substituents $R^5$ and wherein one $CH_2$-group or more than one non-adjacent $CH_2$-groups are optionally substituted by $R^5C$═$CR^5$, $C{\equiv}C$, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_2$-$C_{40}$-alkenyl, which is optionally substituted with one or more substituents $R^5$ and wherein one $CH_2$-group or more than one non-adjacent $CH_2$-groups are optionally substituted by $R^5C$═$CR^5$, $C{\equiv}C$, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_2$-$C_{40}$-alkynyl, which is optionally substituted with one or more substituents $R^5$ and wherein one $CH_2$-group or more than one non-adjacent $CH_2$-groups are optionally substituted by $R^5C$═$CR^5$, $C{\equiv}C$, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$.

13. The organic molecule according to claim 12, wherein $R^b$ is at each occurrence independently from another selected from the group consisting of:

hydrogen, deuterium

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$ and Ph;

pyridinyl, which is optionally substituted with one or more substituents independently from each other selected from the group consisting of Me, $^i$Pr, $^t$Bu, CN, $CF_3$ and Ph;

pyrimidinyl, which is optionally substituted with one or more substituents independently from each other selected from the group consisting of Me, $^i$Pr, $^t$Bu, CN, $CF_3$ and Ph;

carbazolyl, which is optionally substituted with one or more substituents independently from each other selected from the group consisting of Me, $^i$Pr, $^t$Bu, CN, $CF_3$ and Ph;

triazinyl, which is optionally substituted with one or more substituents independently from each other selected from the group consisting of Me, $^i$Pr, $^t$Bu, CN, $CF_3$, and Ph; and $N(Ph)_2$.

14. A composition, comprising:

(a) at least one organic molecule according to claim 1 as an emitter and (b) one or more emitter and/or host compounds, which differ from the organic molecule according to claim 1, and (c) optionally, one or more dyes and/or one or more solvents.

15. The composition according to claim 14, satisfying the Condition A or B, Condition A $E^{HOMO}(H)>E^{HOMO}(E)$, Condition B $E^{LUMO}(H)>E^{LUMO}(E)$, wherein $E^{HOMO}(H)$ represents a highest occupied molecular orbital energy of the host compound, $E^{HOMO}(E)$ represents a highest occupied molecular orbital energy of the emitter, $E^{LUMO}(H)$ represents a lowest unoccupied molecular orbital energy of the host compound, and $E^{LUMO}(E)$ represents a lowest unoccupied molecular orbital energy of the emitter.

16. The composition according to claim 15, comprising one or more further host compound, and satisfying the Condition C or D, Condition C $E^{HOMO}(H)>E^{HOMO}(D)$, Condition D $E^{LUMO}(H)>E^{LUMO}(D)$, wherein $E^{HOMO}(H)$ represents a highest occupied molecular orbital energy of the host compound, $E^{HOMO}(D)$ represents a highest occupied molecular orbital energy of the further host compound, $E^{LUMO}(H)$ represents a lowest unoccupied molecular orbital energy of the host compound, and $E^{LUMO}(D)$ represents a lowest unoccupied molecular orbital energy of the further host compound.

17. An optoelectronic device, comprising:

a substrate, an anode, and a cathode, wherein the anode or the cathode are disposed on the substrate and a light-emitting layer, which is arranged between the anode and the cathode and which comprises the organic molecule according to claim 1.

18. An optoelectronic device, comprising:

a substrate, an anode, and a cathode, wherein the anode or the cathode are disposed on the substrate and a light-emitting layer, which is arranged between the anode and the cathode and which comprises the composition according to claim 16.

19. The organic molecule according to claim 1, wherein $M^{TADF}$ and $M^{NRCT}$ meet Equation 1, $$\lambda_{max}(TADF)<\lambda_{max}(NRCT), \quad \text{Equation 1}$$

wherein $\lambda_{max}(TADF)$ represents an emission maximum of the spectrum of TADF material ($M^{TADF}$-H(hydrogen)), and $\lambda_{max}(NRCT)$ represents an emission maximum of the spectrum of NRCT material ($M^{NRCT}$-H(hydrogen)).

* * * * *